US008536023B2

(12) United States Patent
Or-Bach et al.

(10) Patent No.: US 8,536,023 B2
(45) Date of Patent: Sep. 17, 2013

(54) METHOD OF MANUFACTURING A SEMICONDUCTOR DEVICE AND STRUCTURE

(75) Inventors: Zvi Or-Bach, San Jose, CA (US); Deepak C. Sekar, San Jose, CA (US); Brian Cronquist, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 232 days.

(21) Appl. No.: 12/951,913

(22) Filed: Nov. 22, 2010

(65) Prior Publication Data

US 2012/0220102 A1 Aug. 30, 2012

(51) Int. Cl.
*H01L 21/78* (2006.01)

(52) U.S. Cl.
USPC .. 438/458; 438/464; 257/E21.6; 257/E21.599

(58) Field of Classification Search
None
See application file for complete search history.

(56) References Cited

U.S. PATENT DOCUMENTS

| | | | |
|---|---|---|---|
| 3,007,090 | A | 10/1961 | Rutz |
| 3,819,959 | A | 6/1974 | Chang et al. |
| 4,197,555 | A | 4/1980 | Uehara et al. |
| 4,400,715 | A | 8/1983 | Barbee et al. |
| 4,487,635 | A | 12/1984 | Kugimiya et al. |
| 4,522,657 | A | 6/1985 | Rohatgi et al. |
| 4,612,083 | A | 9/1986 | Yasumoto et al. |
| 4,643,950 | A | 2/1987 | Ogura et al. |
| 4,704,785 | A | 11/1987 | Curran |
| 4,711,858 | A | 12/1987 | Harder et al. |
| 4,721,885 | A | 1/1988 | Brodie |
| 4,732,312 | A | 3/1988 | Kennedy et al. |
| 4,733,288 | A | 3/1988 | Sato |
| 4,829,018 | A | 5/1989 | Wahlstrom |
| 4,854,986 | A | 8/1989 | Raby |
| 4,866,304 | A | 9/1989 | Yu |
| 4,939,568 | A | 7/1990 | Kato et al. |
| 4,956,307 | A | 9/1990 | Pollack et al. |
| 5,012,153 | A | 4/1991 | Atkinson et al. |
| 5,032,007 | A | 7/1991 | Silverstein et al. |
| 5,047,979 | A | 9/1991 | Leung |
| 5,087,585 | A | 2/1992 | Hayashi |
| 5,093,704 | A | 3/1992 | Saito et al. |

(Continued)

FOREIGN PATENT DOCUMENTS

| | | | |
|---|---|---|---|
| EP | 1267594 | A2 | 12/2002 |
| EP | 1909311 | A2 | 4/2008 |
| WO | PCT/US2008/063483 | | 5/2008 |

OTHER PUBLICATIONS

Madan, N., et al., "Leveraging 3D Technology for Improved Reliability," Proceedings of the 40th Annual IEEE/ACM International Symposium on Microarchitecture (MICRO 2007), IEEE Computer Society.

(Continued)

*Primary Examiner* — Benjamin Sandvik
(74) *Attorney, Agent, or Firm* — Tran & Associates

(57) ABSTRACT

A method of manufacturing semiconductor wafers, the method including: providing a donor wafer including a semiconductor substrate; performing a lithography step and processing the donor wafer; and performing at least two subsequent steps of layer transfer out of the donor wafer, each layer transfer step producing a transferred layer, where each of the transferred layers had been affected by the lithography step, and where each of the transferred layer includes a plurality of transistors with side gates, and where the layer transfer includes an ion-cut, the ion-cut including an ion implant thru the transistors.

48 Claims, 385 Drawing Sheets

(56) References Cited

U.S. PATENT DOCUMENTS

| | | | |
|---|---|---|---|
| 5,106,775 | A | 4/1992 | Kaga et al. |
| 5,152,857 | A | 10/1992 | Ito et al. |
| 5,162,879 | A | 11/1992 | Gill |
| 5,217,916 | A | 6/1993 | Anderson et al. |
| 5,250,460 | A | 10/1993 | Yamagata et al. |
| 5,258,643 | A | 11/1993 | Cohen |
| 5,265,047 | A | 11/1993 | Leung et al. |
| 5,266,511 | A | 11/1993 | Takao |
| 5,277,748 | A | 1/1994 | Sakaguchi et al. |
| 5,286,670 | A | 2/1994 | Kang et al. |
| 5,294,556 | A | 3/1994 | Kawamura |
| 5,308,782 | A | 5/1994 | Mazure et al. |
| 5,312,771 | A | 5/1994 | Yonehara |
| 5,317,236 | A | 5/1994 | Zavracky et al. |
| 5,324,980 | A | 6/1994 | Kusunoki |
| 5,355,022 | A | 10/1994 | Sugahara et al. |
| 5,371,037 | A | 12/1994 | Yonehara |
| 5,374,564 | A | 12/1994 | Bruel |
| 5,374,581 | A | 12/1994 | Ichikawa et al. |
| 5,424,560 | A | 6/1995 | Norman et al. |
| 5,475,280 | A | 12/1995 | Jones et al. |
| 5,478,762 | A | 12/1995 | Chao |
| 5,485,031 | A | 1/1996 | Zhang et al. |
| 5,498,978 | A | 3/1996 | Takahashi et al. |
| 5,527,423 | A | 6/1996 | Neville et al. |
| 5,535,342 | A | 7/1996 | Taylor |
| 5,554,870 | A | 9/1996 | Fitch et al. |
| 5,563,084 | A | 10/1996 | Ramm et al. |
| 5,583,349 | A | 12/1996 | Norman et al. |
| 5,583,350 | A | 12/1996 | Norman et al. |
| 5,594,563 | A | 1/1997 | Larson |
| 5,604,137 | A | 2/1997 | Yamazaki et al. |
| 5,617,991 | A | 4/1997 | Pramanick et al. |
| 5,627,106 | A | 5/1997 | Hsu |
| 5,656,548 | A | 8/1997 | Zavracky et al. |
| 5,670,411 | A | 9/1997 | Yonehara |
| 5,681,756 | A | 10/1997 | Norman et al. |
| 5,695,557 | A | 12/1997 | Yamagata et al. |
| 5,701,027 | A | 12/1997 | Gordon et al. |
| 5,707,745 | A | 1/1998 | Forrest et al. |
| 5,714,395 | A | 2/1998 | Bruel |
| 5,721,160 | A | 2/1998 | Forrest et al. |
| 5,737,748 | A | 4/1998 | Shigeeda |
| 5,739,552 | A | 4/1998 | Kimura et al. |
| 5,744,979 | A | 4/1998 | Goetting |
| 5,748,161 | A | 5/1998 | Lebby et al. |
| 5,757,026 | A | 5/1998 | Forrest et al. |
| 5,770,881 | A | 6/1998 | Pelella et al. |
| 5,781,031 | A | 7/1998 | Bertin et al. |
| 5,829,026 | A | 10/1998 | Leung et al. |
| 5,835,396 | A | 11/1998 | Zhang |
| 5,854,123 | A | 12/1998 | Sato et al. |
| 5,861,929 | A | 1/1999 | Spitzer |
| 5,877,070 | A | 3/1999 | Goesele et al. |
| 5,882,987 | A | 3/1999 | Srikrishnan |
| 5,883,525 | A | 3/1999 | Tavana et al. |
| 5,889,903 | A | 3/1999 | Rao |
| 5,893,721 | A | 4/1999 | Huang et al. |
| 5,915,167 | A | 6/1999 | Leedy |
| 5,937,312 | A | 8/1999 | Iyer et al. |
| 5,943,574 | A | 8/1999 | Tehrani et al. |
| 5,952,680 | A | 9/1999 | Strite |
| 5,952,681 | A | 9/1999 | Chen |
| 5,965,875 | A | 10/1999 | Merrill |
| 5,977,579 | A | 11/1999 | Noble |
| 5,977,961 | A | 11/1999 | Rindal |
| 5,980,633 | A | 11/1999 | Yamagata et al. |
| 5,985,742 | A | 11/1999 | Henley et al. |
| 5,998,808 | A | 12/1999 | Matsushita |
| 6,001,693 | A | 12/1999 | Yeouchung et al. |
| 6,009,496 | A | 12/1999 | Tsai |
| 6,020,252 | A | 2/2000 | Aspar et al. |
| 6,020,263 | A | 2/2000 | Shih et al. |
| 6,027,958 | A | 2/2000 | Vu et al. |
| 6,030,700 | A | 2/2000 | Forrest et al. |
| 6,052,498 | A | 4/2000 | Paniccia |
| 6,057,212 | A | 5/2000 | Chan et al. |
| 6,071,795 | A | 6/2000 | Cheung et al. |
| 6,103,597 | A | 8/2000 | Aspar et al. |
| 6,111,260 | A | 8/2000 | Dawson et al. |
| 6,125,217 | A | 9/2000 | Paniccia et al. |
| 6,153,495 | A | 11/2000 | Kub et al. |
| 6,191,007 | B1 | 2/2001 | Matsui et al. |
| 6,222,203 | B1 | 4/2001 | Ishibashi et al. |
| 6,229,161 | B1 | 5/2001 | Nemati et al. |
| 6,242,324 | B1 | 6/2001 | Kub et al. |
| 6,259,623 | B1 | 7/2001 | Takahashi |
| 6,264,805 | B1 | 7/2001 | Forrest et al. |
| 6,281,102 | B1 | 8/2001 | Cao et al. |
| 6,294,018 | B1 | 9/2001 | Hamm et al. |
| 6,306,705 | B1 | 10/2001 | Parekh et al. |
| 6,321,134 | B1 | 11/2001 | Henley et al. |
| 6,322,903 | B1 | 11/2001 | Siniaguine et al. |
| 6,331,468 | B1 | 12/2001 | Aronowitz et al. |
| 6,331,790 | B1 | 12/2001 | Or-Bach et al. |
| 6,353,492 | B2 | 3/2002 | McClelland et al. |
| 6,355,501 | B1 | 3/2002 | Fung et al. |
| 6,358,631 | B1 | 3/2002 | Forrest et al. |
| 6,365,270 | B2 | 4/2002 | Forrest et al. |
| 6,376,337 | B1 | 4/2002 | Wang et al. |
| 6,380,046 | B1 | 4/2002 | Yamazaki |
| 6,392,253 | B1 | 5/2002 | Saxena |
| 6,417,108 | B1 | 7/2002 | Akino et al. |
| 6,420,215 | B1 | 7/2002 | Knall et al. |
| 6,423,614 | B1 | 7/2002 | Doyle |
| 6,429,481 | B1 | 8/2002 | Mo et al. |
| 6,429,484 | B1 | 8/2002 | Yu |
| 6,430,734 | B1 | 8/2002 | Zahar |
| 6,475,869 | B1 | 11/2002 | Yu |
| 6,476,493 | B2 | 11/2002 | Or-Bach et al. |
| 6,479,821 | B1 | 11/2002 | Hawryluk et al. |
| 6,515,511 | B2 | 2/2003 | Sugibayashi et al. |
| 6,526,559 | B2 | 2/2003 | Schiefele et al. |
| 6,528,391 | B1 | 3/2003 | Henley et al. |
| 6,534,352 | B1 | 3/2003 | Kim |
| 6,534,382 | B1 | 3/2003 | Sakaguchi et al. |
| 6,544,837 | B1 | 4/2003 | Divakauni et al. |
| 6,545,314 | B2 | 4/2003 | Forbes et al. |
| 6,555,901 | B1 | 4/2003 | Yoshihara et al. |
| 6,563,139 | B2 | 5/2003 | Hen |
| 6,580,289 | B2 | 6/2003 | Cox |
| 6,600,173 | B2 | 7/2003 | Tiwari |
| 6,624,046 | B1 | 9/2003 | Zavracky et al. |
| 6,627,518 | B1 | 9/2003 | Inoue et al. |
| 6,630,713 | B2 | 10/2003 | Geusic |
| 6,635,552 | B1 | 10/2003 | Gonzalez |
| 6,635,588 | B1 | 10/2003 | Hawryluk et al. |
| 6,638,834 | B2 | 10/2003 | Gonzalez |
| 6,642,744 | B2 | 11/2003 | Or-Bach et al. |
| 6,653,209 | B1 | 11/2003 | Yamagata |
| 6,661,085 | B2 | 12/2003 | Kellar et al. |
| 6,677,204 | B2 | 1/2004 | Cleeves et al. |
| 6,686,253 | B2 | 2/2004 | Or-Bach |
| 6,703,328 | B2 | 3/2004 | Tanaka et al. |
| 6,756,633 | B2 | 6/2004 | Wang et al. |
| 6,756,811 | B2 | 6/2004 | Or-Bach |
| 6,759,282 | B2 | 7/2004 | Campbell et al. |
| 6,762,076 | B2 | 7/2004 | Kim et al. |
| 6,774,010 | B2 | 8/2004 | Chu et al. |
| 6,805,979 | B2 | 10/2004 | Ogura et al. |
| 6,806,171 | B1 | 10/2004 | Ulyashin et al. |
| 6,809,009 | B2 | 10/2004 | Aspar et al. |
| 6,815,781 | B2 | 11/2004 | Vyvoda et al. |
| 6,819,136 | B2 | 11/2004 | Or-Bach |
| 6,821,826 | B1 | 11/2004 | Chan et al. |
| 6,844,243 | B1 | 1/2005 | Gonzalez |
| 6,864,534 | B2 | 3/2005 | Ipposhi et al. |
| 6,875,671 | B2 | 4/2005 | Faris |
| 6,882,572 | B2 | 4/2005 | Wang et al. |
| 6,888,375 | B2 | 5/2005 | Feng et al. |
| 6,917,219 | B2 | 7/2005 | New |
| 6,930,511 | B2 | 8/2005 | Or-Bach |
| 6,943,067 | B2 | 9/2005 | Greenlaw |
| 6,943,407 | B2 | 9/2005 | Ouyang et al. |

| | | | |
|---|---|---|---|
| 6,953,956 B2 | 10/2005 | Or-Bach et al. | |
| 6,967,149 B2 | 11/2005 | Meyer et al. | |
| 6,985,012 B2 | 1/2006 | Or-Bach | |
| 6,989,687 B2 | 1/2006 | Or-Bach | |
| 6,995,430 B2 | 2/2006 | Langdo et al. | |
| 6,995,456 B2 | 2/2006 | Nowak | |
| 7,015,719 B1 | 3/2006 | Feng et al. | |
| 7,016,569 B2 | 3/2006 | Mule et al. | |
| 7,018,875 B2 | 3/2006 | Madurawe | |
| 7,019,557 B2 | 3/2006 | Madurawe | |
| 7,043,106 B2 | 5/2006 | West et al. | |
| 7,052,941 B2 | 5/2006 | Lee | |
| 7,064,579 B2 | 6/2006 | Madurawe | |
| 7,067,396 B2 | 6/2006 | Aspar et al. | |
| 7,068,070 B2 | 6/2006 | Or-Bach | |
| 7,068,072 B2 | 6/2006 | New et al. | |
| 7,078,739 B1 | 7/2006 | Nemati et al. | |
| 7,094,667 B1 | 8/2006 | Bower | |
| 7,098,691 B2 | 8/2006 | Or-Bach et al. | |
| 7,105,390 B2 | 9/2006 | Brask et al. | |
| 7,105,871 B2 | 9/2006 | Or-Bach et al. | |
| 7,109,092 B2 | 9/2006 | Tong | |
| 7,110,629 B2 | 9/2006 | Bjorkman et al. | |
| 7,111,149 B2 | 9/2006 | Eilert | |
| 7,115,945 B2 | 10/2006 | Lee et al. | |
| 7,115,966 B2 | 10/2006 | Ido et al. | |
| 7,141,853 B2 | 11/2006 | Campbell et al. | |
| 7,148,119 B1 | 12/2006 | Sakaguchi et al. | |
| 7,157,787 B2 | 1/2007 | Kim et al. | |
| 7,157,937 B2 | 1/2007 | Apostol et al. | |
| 7,166,520 B1 | 1/2007 | Henley | |
| 7,170,807 B2 | 1/2007 | Fazan et al. | |
| 7,173,369 B2 | 2/2007 | Forrest et al. | |
| 7,180,091 B2 | 2/2007 | Yamazaki et al. | |
| 7,180,379 B1 | 2/2007 | Hopper et al. | |
| 7,189,489 B2 | 3/2007 | Kunimoto et al. | |
| 7,205,204 B2 | 4/2007 | Ogawa et al. | |
| 7,209,384 B1 | 4/2007 | Kim | |
| 7,217,636 B1 | 5/2007 | Atanackovic | |
| 7,223,612 B2 | 5/2007 | Sarma | |
| 7,242,012 B2 | 7/2007 | Leedy | |
| 7,245,002 B2 | 7/2007 | Akino et al. | |
| 7,256,104 B2 | 8/2007 | Ito et al. | |
| 7,259,091 B2 | 8/2007 | Schuehrer et al. | |
| 7,265,421 B2 | 9/2007 | Madurawe | |
| 7,271,420 B2 | 9/2007 | Cao | |
| 7,282,951 B2 | 10/2007 | Huppenthal et al. | |
| 7,296,201 B2 | 11/2007 | Abramovici | |
| 7,304,355 B2 | 12/2007 | Zhang | |
| 7,312,109 B2 | 12/2007 | Madurawe | |
| 7,312,487 B2 | 12/2007 | Alam et al. | |
| 7,335,573 B2 | 2/2008 | Takayama et al. | |
| 7,337,425 B2 | 2/2008 | Kirk | |
| 7,338,884 B2 | 3/2008 | Shimoto et al. | |
| 7,351,644 B2 | 4/2008 | Henley | |
| 7,358,601 B1 | 4/2008 | Plants et al. | |
| 7,362,133 B2 | 4/2008 | Madurawe | |
| 7,369,435 B2 | 5/2008 | Forbes | |
| 7,371,660 B2 | 5/2008 | Henley et al. | |
| 7,378,702 B2 | 5/2008 | Lee | |
| 7,393,722 B1 | 7/2008 | Issaq et al. | |
| 7,419,844 B2 | 9/2008 | Lee et al. | |
| 7,436,027 B2 | 10/2008 | Ogawa et al. | |
| 7,439,773 B2 | 10/2008 | Or-Bach et al. | |
| 7,446,563 B2 | 11/2008 | Madurawe | |
| 7,459,752 B2 | 12/2008 | Doris et al. | |
| 7,459,763 B1 | 12/2008 | Issaq et al. | |
| 7,459,772 B2 | 12/2008 | Speers | |
| 7,463,062 B2 | 12/2008 | Or-Bach et al. | |
| 7,470,142 B2 | 12/2008 | Lee | |
| 7,470,598 B2 | 12/2008 | Lee | |
| 7,476,939 B2 | 1/2009 | Okhonin et al. | |
| 7,477,540 B2 | 1/2009 | Okhonin et al. | |
| 7,485,968 B2 | 2/2009 | Enquist et al. | |
| 7,486,563 B2 | 2/2009 | Waller et al. | |
| 7,488,980 B2 | 2/2009 | Takafuji et al. | |
| 7,492,632 B2 | 2/2009 | Carman | |
| 7,495,473 B2 | 2/2009 | McCollum et al. | |
| 7,498,675 B2 | 3/2009 | Farnworth et al. | |
| 7,499,352 B2 | 3/2009 | Singh | |
| 7,499,358 B2 | 3/2009 | Bauser | |
| 7,508,034 B2 | 3/2009 | Takafuji et al. | |
| 7,514,748 B2 | 4/2009 | Fazan et al. | |
| 7,535,089 B2 | 5/2009 | Fitzgerald | |
| 7,541,616 B2 | 6/2009 | Fazan et al. | |
| 7,547,589 B2 | 6/2009 | Iriguchi | |
| 7,557,367 B2 | 7/2009 | Rogers et al. | |
| 7,563,659 B2 | 7/2009 | Kwon et al. | |
| 7,566,855 B2 | 7/2009 | Olsen et al. | |
| 7,586,778 B2 | 9/2009 | Ho et al. | |
| 7,589,375 B2 | 9/2009 | Jang et al. | |
| 7,608,848 B2 | 10/2009 | Ho et al. | |
| 7,622,367 B1 | 11/2009 | Nuzzo et al. | |
| 7,632,738 B2 | 12/2009 | Lee | |
| 7,633,162 B2 | 12/2009 | Lee | |
| 7,666,723 B2 | 2/2010 | Frank et al. | |
| 7,671,371 B2 | 3/2010 | Lee | |
| 7,671,460 B2 | 3/2010 | Lauxtermann et al. | |
| 7,674,687 B2 | 3/2010 | Henley | |
| 7,687,372 B2 | 3/2010 | Jain | |
| 7,688,619 B2 | 3/2010 | Lung et al. | |
| 7,692,202 B2 | 4/2010 | Bensch | |
| 7,692,448 B2 | 4/2010 | Solomon | |
| 7,692,944 B2 | 4/2010 | Bernstein et al. | |
| 7,697,316 B2 | 4/2010 | Lai et al. | |
| 7,709,932 B2 | 5/2010 | Nemoto et al. | |
| 7,718,508 B2 | 5/2010 | Lee | |
| 7,723,207 B2 | 5/2010 | Alam et al. | |
| 7,728,326 B2 | 6/2010 | Yamazaki et al. | |
| 7,732,301 B1 | 6/2010 | Pinnington et al. | |
| 7,749,884 B2 | 7/2010 | Mathew et al. | |
| 7,759,043 B2 | 7/2010 | Tanabe et al. | |
| 7,768,115 B2 | 8/2010 | Lee et al. | |
| 7,776,715 B2 | 8/2010 | Wells et al. | |
| 7,777,330 B2 | 8/2010 | Pelley et al. | |
| 7,786,460 B2 | 8/2010 | Lung et al. | |
| 7,786,535 B2 | 8/2010 | Abou-Khalil et al. | |
| 7,790,524 B2 | 9/2010 | Abadeer et al. | |
| 7,795,619 B2 | 9/2010 | Hara | |
| 7,799,675 B2 | 9/2010 | Lee | |
| 7,800,099 B2 | 9/2010 | Yamazaki et al. | |
| 7,800,199 B2 | 9/2010 | Oh et al. | |
| 7,846,814 B2 | 12/2010 | Lee | |
| 7,867,822 B2 | 1/2011 | Lee | |
| 7,888,764 B2 | 2/2011 | Lee | |
| 7,915,164 B2 | 3/2011 | Konevecki et al. | |
| 8,014,195 B2 | 9/2011 | Okhonin et al. | |
| 8,031,544 B2 | 10/2011 | Kim et al. | |
| 8,044,464 B2 | 10/2011 | Yamazaki et al. | |
| 8,107,276 B2 | 1/2012 | Breitwisch et al. | |
| 8,129,256 B2 | 3/2012 | Farooq et al. | |
| 8,158,515 B2 | 4/2012 | Farooq et al. | |
| 8,184,463 B2 | 5/2012 | Saen et al. | |
| 8,203,187 B2 | 6/2012 | Lung et al. | |
| 8,208,279 B2 | 6/2012 | Lue | |
| 2001/0000005 A1 | 3/2001 | Forrest et al. | |
| 2001/0014391 A1 | 8/2001 | Forrest et al. | |
| 2002/0024140 A1 | 2/2002 | Nakajima et al. | |
| 2002/0025604 A1 | 2/2002 | Tiwari | |
| 2002/0081823 A1 | 6/2002 | Cheung et al. | |
| 2002/0090758 A1* | 7/2002 | Henley et al. | 438/110 |
| 2002/0141233 A1 | 10/2002 | Hosotani et al. | |
| 2002/0153243 A1 | 10/2002 | Forrest et al. | |
| 2002/0180069 A1 | 12/2002 | Houston | |
| 2002/0190232 A1 | 12/2002 | Chason | |
| 2002/0199110 A1 | 12/2002 | Kean | |
| 2003/0015713 A1 | 1/2003 | Yoo | |
| 2003/0032262 A1 | 2/2003 | Dennison et al. | |
| 2003/0059999 A1 | 3/2003 | Gonzalez | |
| 2003/0060034 A1* | 3/2003 | Beyne et al. | 438/618 |
| 2003/0067043 A1 | 4/2003 | Zhang | |
| 2003/0102079 A1 | 6/2003 | Kalvesten et al. | |
| 2003/0113963 A1 | 6/2003 | Wurzer | |
| 2003/0119279 A1 | 6/2003 | Enquist | |
| 2003/0139011 A1 | 7/2003 | Cleeves et al. | |
| 2003/0157748 A1 | 8/2003 | Kim et al. | |
| 2003/0206036 A1 | 11/2003 | Or-Bach | |
| 2003/0213967 A1 | 11/2003 | Forrest et al. | |

2003/0224582 A1 12/2003 Shimoda et al.
2004/0014299 A1 1/2004 Moriceau et al.
2004/0033676 A1 2/2004 Coronel et al.
2004/0036126 A1 2/2004 Chau et al.
2004/0047539 A1 3/2004 Okubora et al.
2004/0061176 A1 4/2004 Takafuji et al.
2004/0113207 A1 6/2004 Hsu et al.
2004/0150068 A1 8/2004 Leedy
2004/0152272 A1 8/2004 Fladre et al.
2004/0155301 A1 8/2004 Zhang
2004/0156233 A1 8/2004 Bhattacharyya
2004/0166649 A1 8/2004 Bressot et al.
2004/0178819 A1 9/2004 New
2004/0259312 A1 12/2004 Schlosser et al.
2004/0262635 A1 12/2004 Lee
2004/0262772 A1 12/2004 Ramanathan et al.
2005/0003592 A1 1/2005 Jones
2005/0023656 A1 2/2005 Leedy
2005/0067620 A1 3/2005 Chan et al.
2005/0067625 A1 3/2005 Hata
2005/0073060 A1 4/2005 Datta et al.
2005/0098822 A1 5/2005 Mathew
2005/0110041 A1 5/2005 Boutros et al.
2005/0121676 A1* 6/2005 Fried et al. ...................... 257/72
2005/0121789 A1 6/2005 Madurawe
2005/0130351 A1 6/2005 Leedy
2005/0130429 A1 6/2005 Rayssac et al.
2005/0148137 A1* 7/2005 Brask et al. ................... 438/216
2005/0225237 A1 10/2005 Winters
2005/0280061 A1 12/2005 Lee
2005/0280090 A1 12/2005 Anderson et al.
2005/0280154 A1 12/2005 Lee
2005/0280155 A1 12/2005 Lee
2005/0280156 A1 12/2005 Lee
2005/0282019 A1 12/2005 Fukushima et al.
2006/0014331 A1 1/2006 Tang et al.
2006/0024923 A1 2/2006 Sarma et al.
2006/0033110 A1 2/2006 Alam et al.
2006/0033124 A1 2/2006 Or-Bach et al.
2006/0067122 A1 3/2006 Verhoeven
2006/0071322 A1 4/2006 Kitamura
2006/0071332 A1 4/2006 Speers
2006/0083280 A1 4/2006 Tauzin et al.
2006/0113522 A1 6/2006 Lee et al.
2006/0121690 A1 6/2006 Pogge et al.
2006/0179417 A1 8/2006 Madurawe
2006/0181202 A1 8/2006 Liao et al.
2006/0189095 A1* 8/2006 Ghyselen et al. ............. 438/458
2006/0194401 A1 8/2006 Hu et al.
2006/0195729 A1 8/2006 Huppenthal et al.
2006/0207087 A1 9/2006 Jafri et al.
2006/0249859 A1 11/2006 Eiles et al.
2006/0275962 A1 12/2006 Lee
2007/0014508 A1 1/2007 Chen et al.
2007/0035329 A1 2/2007 Madurawe
2007/0063259 A1 3/2007 Derderian et al.
2007/0072391 A1 3/2007 Pocas et al.
2007/0076509 A1 4/2007 Zhang
2007/0077694 A1 4/2007 Lee
2007/0077743 A1* 4/2007 Rao et al. ...................... 438/595
2007/0090416 A1 4/2007 Doyle et al.
2007/0102737 A1 5/2007 Kashiwabara et al.
2007/0108523 A1 5/2007 Ogawa et al.
2007/0111386 A1 5/2007 Kim et al.
2007/0111406 A1* 5/2007 Joshi et al. .................... 438/142
2007/0132049 A1 6/2007 Stipe
2007/0132369 A1 6/2007 Forrest et al.
2007/0135013 A1 6/2007 Faris
2007/0158659 A1 7/2007 Bensce
2007/0187775 A1 8/2007 Okhonin et al.
2007/0190746 A1 8/2007 Ito et al.
2007/0194453 A1 8/2007 Chakraborty et al.
2007/0210336 A1 9/2007 Madurawe
2007/0218622 A1 9/2007 Lee et al.
2007/0228383 A1 10/2007 Bernstein et al.
2007/0252203 A1 11/2007 Zhu et al.
2007/0262457 A1 11/2007 Lin
2007/0275520 A1 11/2007 Suzuki
2007/0281439 A1 12/2007 Bedell et al.
2007/0283298 A1 12/2007 Bernstein et al.
2007/0287224 A1 12/2007 Alam et al.
2008/0032463 A1 2/2008 Lee
2008/0038902 A1 2/2008 Lee
2008/0048327 A1 2/2008 Lee
2008/0099780 A1 5/2008 Tran
2008/0108171 A1* 5/2008 Rogers et al. ................... 438/73
2008/0124845 A1 5/2008 Yu et al.
2008/0128745 A1 6/2008 Mastro et al.
2008/0136455 A1 6/2008 Diamant et al.
2008/0150579 A1 6/2008 Madurawe
2008/0160431 A1 7/2008 Scott et al.
2008/0160726 A1 7/2008 Lim et al.
2008/0179678 A1 7/2008 Dyer et al.
2008/0191312 A1 8/2008 Oh et al.
2008/0194068 A1 8/2008 Temmler et al.
2008/0203452 A1 8/2008 Moon et al.
2008/0213982 A1* 9/2008 Park et al. ..................... 438/480
2008/0220558 A1 9/2008 Zehavi et al.
2008/0220565 A1 9/2008 Hsu et al.
2008/0224260 A1 9/2008 Schmit et al.
2008/0237591 A1 10/2008 Leedy
2008/0251862 A1 10/2008 Fonash et al.
2008/0254561 A2 10/2008 Yoo
2008/0254572 A1 10/2008 Leedy
2008/0261378 A1 10/2008 Yao et al.
2008/0272492 A1 11/2008 Tsang
2008/0277778 A1 11/2008 Furman et al.
2008/0283875 A1 11/2008 Mukasa et al.
2008/0284611 A1 11/2008 Leedy
2008/0296681 A1 12/2008 Georgakos et al.
2008/0315351 A1 12/2008 Kakehata
2009/0001469 A1 1/2009 Yoshida et al.
2009/0001504 A1 1/2009 Takei et al.
2009/0016716 A1 1/2009 Ishida
2009/0032899 A1 2/2009 Irie
2009/0039918 A1 2/2009 Madurawe
2009/0052827 A1 2/2009 Durfee et al.
2009/0055789 A1 2/2009 McIlrath
2009/0061572 A1 3/2009 Hareland et al.
2009/0064058 A1 3/2009 McIlrath
2009/0066365 A1 3/2009 Solomon
2009/0066366 A1 3/2009 Solomon
2009/0070727 A1 3/2009 Solomon
2009/0079000 A1 3/2009 Yamazaki et al.
2009/0081848 A1 3/2009 Erokhin
2009/0087759 A1 4/2009 Matsumoto et al.
2009/0096009 A1 4/2009 Dong et al.
2009/0096024 A1 4/2009 Shingu et al.
2009/0115042 A1 5/2009 Koyanagi
2009/0128189 A1 5/2009 Madurawe et al.
2009/0134397 A1 5/2009 Yokoi et al.
2009/0144669 A1 6/2009 Bose et al.
2009/0144678 A1 6/2009 Bose et al.
2009/0146172 A1 6/2009 Pumyea
2009/0159870 A1 6/2009 Lin et al.
2009/0160482 A1 6/2009 Karp et al.
2009/0161401 A1 6/2009 Bilger et al.
2009/0179268 A1 7/2009 Abou-Khalil et al.
2009/0194152 A1 8/2009 Liu et al.
2009/0194768 A1 8/2009 Leedy
2009/0204933 A1 8/2009 Rezgui
2009/0212317 A1 8/2009 Kolodin et al.
2009/0218627 A1 9/2009 Zhu
2009/0221110 A1 9/2009 Lee et al.
2009/0224364 A1 9/2009 Oh et al.
2009/0234331 A1 9/2009 Langereis et al.
2009/0242893 A1 10/2009 Tomiyasu
2009/0250686 A1 10/2009 Sato et al.
2009/0262583 A1 10/2009 Lue
2009/0263942 A1 10/2009 Ohnuma et al.
2009/0267233 A1 10/2009 Lee
2009/0272989 A1 11/2009 Shum et al.
2009/0290434 A1 11/2009 Kurjanowicz
2009/0302387 A1 12/2009 Joshi et al.
2009/0302394 A1 12/2009 Fujita
2009/0309152 A1 12/2009 Knoefler et al.
2009/0321830 A1 12/2009 Maly
2009/0321853 A1 12/2009 Cheng

| | | | | |
|---|---|---|---|---|
| 2009/0321948 | A1 | 12/2009 | Wang et al. | |
| 2009/0325343 | A1 | 12/2009 | Lee | |
| 2010/0001282 | A1 | 1/2010 | Mieno | |
| 2010/0025766 | A1 | 2/2010 | Nuttinck et al. | |
| 2010/0031217 | A1 | 2/2010 | Sinha et al. | |
| 2010/0038743 | A1 | 2/2010 | Lee | |
| 2010/0052134 | A1 | 3/2010 | Werner et al. | |
| 2010/0058580 | A1 | 3/2010 | Yazdani | |
| 2010/0081232 | A1 | 4/2010 | Furman et al. | |
| 2010/0112753 | A1 | 5/2010 | Lee | |
| 2010/0112810 | A1 | 5/2010 | Lee et al. | |
| 2010/0123202 | A1 | 5/2010 | Hofmann | |
| 2010/0133695 | A1 | 6/2010 | Lee | |
| 2010/0133704 | A1 | 6/2010 | Marimuthu et al. | |
| 2010/0137143 | A1 | 6/2010 | Rothberg et al. | |
| 2010/0190334 | A1 | 7/2010 | Lee | |
| 2010/0193884 | A1 | 8/2010 | Park et al. | |
| 2010/0193964 | A1 | 8/2010 | Farooq et al. | |
| 2010/0224915 | A1* | 9/2010 | Kawashima et al. | 257/288 |
| 2010/0276662 | A1* | 11/2010 | Colinge | 257/9 |
| 2010/0307572 | A1 | 12/2010 | Bedell et al. | |
| 2010/0308211 | A1 | 12/2010 | Cho et al. | |
| 2010/0308863 | A1 | 12/2010 | Gliese et al. | |
| 2011/0001172 | A1 | 1/2011 | Lee | |
| 2011/0003438 | A1 | 1/2011 | Lee | |
| 2011/0024724 | A1 | 2/2011 | Frolov et al. | |
| 2011/0026263 | A1 | 2/2011 | Xu | |
| 2011/0037052 | A1 | 2/2011 | Schmidt et al. | |
| 2011/0042696 | A1 | 2/2011 | Smith et al. | |
| 2011/0050125 | A1 | 3/2011 | Medendorp et al. | |
| 2011/0053332 | A1 | 3/2011 | Lee | |
| 2011/0101537 | A1 | 5/2011 | Barth et al. | |
| 2011/0102014 | A1 | 5/2011 | Madurawe | |
| 2011/0143506 | A1 | 6/2011 | Lee | |
| 2011/0147791 | A1 | 6/2011 | Norman et al. | |
| 2011/0221022 | A1 | 9/2011 | Toda | |
| 2011/0241082 | A1 | 10/2011 | Bernstein et al. | |
| 2011/0284992 | A1 | 11/2011 | Zhu | |
| 2011/0286283 | A1 | 11/2011 | Lung et al. | |
| 2012/0001184 | A1 | 1/2012 | Ha et al. | |
| 2012/0003815 | A1 | 1/2012 | Lee | |
| 2012/0013013 | A1 | 1/2012 | Sadaka et al. | |
| 2012/0074466 | A1 | 3/2012 | Setiadi et al. | |
| 2012/0181654 | A1 | 7/2012 | Lue | |
| 2012/0182801 | A1 | 7/2012 | Lue | |
| 2012/0241919 | A1* | 9/2012 | Mitani | 257/623 |

OTHER PUBLICATIONS

Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional ICs, Having Four Stacked Active Device Layers," IEDM 1989, paper 34.6, pp. 837-840.
Agarwal, A., et al., "Efficient production of silicon-on-insulator films by co-implantation of He+ with H+'" Applied Physics Letters, vol. 72, No. 9, Mar. 1998, pp. 1086-1088.
Cook III, G. O., et al., "Overview of transient liquid phase and partial transient liquid phase bonding," Journal of Material Science, vol. 46, 2011, pp. 5305-5323.
Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.
Gaillardon, P-E., et al., "Can We Go Towards True 3-D Architectures?," DAC 2011, paper 58, pp. 282-283.
Subbarao, M., et al., "Depth from Defocus: A Spatial Domain Approach," International Journal of Computer Vision, vol. 13, No. 3, pp. 271-294 (1994).
Subbarao, M., et al., "Focused Image Recovery from Two Defocused Images Recorded with Different Camera Settings," IEEE Transactions on Image Processing, vol. 4, No. 12, Dec. 1995, pp. 1613-1628.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).
Gawlik, G., et al., "GaAs on Si: towards a low-temperature "smart-cut" technology", Vacuum, vol. 70, pp. 103-107 (2003).
Weldon, M. K., et al., "Mechanism of Silicon Exfoliation Induced by Hydrogen/Helium Co-implantation," Applied Physics Letters, vol. 73, No. 25, pp. 3721-3723 (1998).
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunities in 3D CMOS Sequential Integration," 2011 IEEE International Electron Devices Meeting, paper 7.3, Dec. 2011, pp. 151-154.
Miller, D.A.B., "Optical interconnects to electronic chips," Applied Optics, vol. 49, No. 25, Sep. 1, 2010, pp. F59-F70.
Yun, C. H., et al., "Transfer of patterned ion-cut silicon layers", Applied Physics Letters, vol. 73, No. 19, Nov. 1998, pp. 2772-2774.
En, W. G., et al., "The Genesis Process: A New SOI wafer fabrication method", Proceedings 1998 IEEE International SOI Conference, Oct. 1998, pp. 163-164.
U.S. Appl. No. 12/901,890, filed Oct. 11, 2010, Or-Bach et al.
U.S. Appl. No. 12/897,538, filed Oct. 4, 2010, Widijaja, et al.
U.S. Appl. No. 12/900,379, filed Apr. 21, 2011, Or-Bach, et al.
U.S. Appl. No. 12/904,119, filed Oct. 13, 2010, Or-Bach, et al.
U.S. Appl. No. 12/577,532, filed Oct. 12, 2009, Or-Bach et al.
U.S. Appl. No. 12/423,214, Apr. 14, 2009, Or-Bach.
U.S. Appl. No. 12/706,520, Feb. 16, 2010, Or-Bach et al.
U.S. Appl. No. 12/792,673, Jun. 02, 2010, Or-Bach et al.
U.S. Appl. No. 12/797,493, Jun. 9, 2010, Or-Bach.
U.S. Appl. No. 12/847,911, Jun. 30, 2010, Or-Bach et al.
U.S. Appl. No. 12/849,272, Aug. 3, 2010, Or-Bach et al.
U.S. Appl. No. 12/859,665, Aug. 19, 2010, Or-Bach et al.
U.S. Appl. No. 12/901,902, Oct. 11, 2010, Or-Bach et al.
U.S. Appl. No. 12/949,617, Nov. 18, 2010, Or-Bach et al.
U.S. Appl. No. 12/970,602, Dec. 16, 2010, Or-Bach et al.
U.S. Appl. No. 13/016,313, Jan. 28, 2011, Or-Bach et al.
U.S. Appl. No. 13/073,188, Mar. 28, 2011, Or-Bach et al.
U.S. Appl. No. 13/073,268, Mar. 28, 2011, Or-Bach et al.
U.S. Appl. No. 13/083,802, Apr. 11, 2011, Or-Bach et al.
U.S. Appl. No. 12/894,235, Sep. 30, 2010, Cronquist et al.
U.S. Appl. No. 12/904,114, Oct. 13, 2010, Or-Bach et al.
U.S. Appl. No. 12/963,659, Dec. 9, 2010, Or-Bach et al.
U.S. Appl. No. 13/041,404, Mar. 6, 2011, Or-Bach et al.
U.S. Appl. No. 12/951,913, Nov. 22, 2010, Or-Bach et al.
U.S. Appl. No. 13/099,010, May. 2, 2011, Or-Bach et al.
U.S. Appl. No. 12/903,862, Oct. 13, 2010, Or-Bach et al.
U.S. Appl. No. 12/903,847, Oct. 13, 2010, Or-Bach et al.
U.S. Appl. No. 12/904,103, Oct. 13, 2010, Or-Bach et al.
U.S. Appl. No. 12/894,252, Sep. 30, 2010, Or-Bach et al.
U.S. Appl. No. 12/904,108, Oct. 13, 2010, Or-Bach et al.
U.S. Appl. No. 12/941,073, Nov. 7, 2010, Or-Bach.
U.S. Appl. No. 12/941,074, Nov. 7, 2010, Or-Bach et al.
U.S. Appl. No. 12/951,924, Nov. 22, 2010, Or-Bach et al.
U.S. Appl. No. 13/041,406, Mar. 6, 2011, Or-Bach et al.
U.S. Appl. No. 13/098,997, May 2, 2011, Or-Bach et al.
U.S. Appl. No. 12/901,124, Oct. 13, 2010, Or-Bach et al.
U.S. Appl. No. 13/041,405, Mar. 6, 2011, Or-Bach et al.
Colinge, J. P., et al., "Nanowire transistors without Junctions", Nature Nanotechnology, Feb. 21, 2010, pp. 1-5.

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11- 12, Jun. 10-12, 2003.
Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.
Abramovici, Breuer and Friedman, Digital Systems Testing and Testable Design, Computer Science Press, 1990, pp. 432-447.
Topol, A.W., et al., "Enabling SOI-Based Assembly Technology for Three-Dimensional (3D) Integrated Circuits (ICs)," IEDM Tech. Digest, Dec. 5, 2005, pp. 363-366.
Demeester, P. et al., "Epitaxial lift-off and its applications," Semicond. Sci. Technol., 1993, pp. 1124-1135, vol. 8.
Moon, J., et al., "GaAs Photovoltaics and optoelectronics using releasable multilayer epitaxial assemblies", Nature, vol. 465, May 20, 2010, pp. 329-334.
Yonehara, T., et al., "ELTRAN: SOI-Epi Wafer by Epitaxial Layer transfer from porous Silicon", the 198th Electrochemical Society Meeting, abstract No. 438 (2000).
Yonehara, T. et al., "Eltran®, Novel SOI Wafer Technology," JSAP International, Jul. 2001, pp. 10-16, No. 4.
Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.
Bangsaruntip, S., et al., "High performance and highly uniform gate-all-around silicon nanowire MOSFETs with wire size dependent scaling," Electron Devices Meeting (IEDM), 2009 IEEE International, vol., No., pp. 297-300, Dec. 7-9, 2009.
Bakir and Meindl, "Integrated Interconnect Technologies for 3D Nanoelectronic Systems", Artech House, 2009, Chapter 13, pp. 389-419.
Tanaka, H., et al., "Bit Cost Scalable Technology with Punch and Plug Process for Ultra High Density Flash Memory," VLSI Technology, 2007 IEEE Symposium on , vol., No., pp. 14-15, Jun. 12-14, 2007.
Burr, G. W., et al., "Overview of candidate device technologies for storage-class memory," IBM Journal of Research and Development, vol. 52, No. 4.5, pp. 449-464, Jul. 2008.
Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.
Bez, R., et al., "Introduction to Flash memory," Proceedings IEEE, 91(4), 489-502 (2003).
Kim, W., et al., "Multi-layered Vertical Gate NAND Flash overcoming stacking limit for terabit density storage", Symposium on VLSI Technology Digest of Technical Papers, 2009, pp. 188-189.
Auth, C., et al., "45nm High-k + Metal Gate Strain-Enhanced Transistors," Symposium on VLSI Technology Digest of Technical Papers, 2008, pp. 128-129.
Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.
Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.
Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.
Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H. et al., "NiSi Salicide Technology for Scaled CMOS," Microelectronic ' Engineering, 60 (2002), pp. 157-169.
Froment, B., et al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, ctr_024377.
Davis, J.A., et al., "Interconnect Limits on Gigascale Integration(GSI) in the 21st Century", Proc. IEEE, vol. 89, No. 3, pp. 305-324, Mar. 2001.
Dicioccio, L, et al., "Direct bonding for wafer level 3D integration", ICICDT 2010, pp. 110-113.
Shino, T., et al., "Floating Body RAM Technology and its Scalability to 32nm Node and Beyond," Electron Devices Meeting, 2006, IEDM '06, International , vol., No., pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, pp. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.V., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Rajendran, B., et al., "Electrical Integrity of MOS Devices in Laser Annealed 3D IC Structures", proceedings VMIC 2004.
Rajendran, B., "Sequential 3D IC Fabrication: Challenges and Prospects", Proceedings of VMIC 2006.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers. 2004 Symposium on , vol., No., pp. 228-229, Jun. 15-17, 2004.

Vengurlekar, A., et al., "Mechanism of Dopant Activation Enhancement in Shallow Junctions by Hydrogen", Proceedings of the Materials Research Society, vol. 864, Spring 2005, E9.28.1-6.
Hui, K. N., et al., "Design of vertically-stacked polychromatic light-emitting diodes," Optics Express, Jun. 8, 2009, pp. 9873-9878, vol. 17, No. 12.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Flamand, G. et al., "Towards Highly Efficient 4-Terminal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Wierer, J.J. et al., "High-power AlGalnN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, <http://www.embeddeinternetdesign.com/design/225402094>.
Ohsawa, et al., "Autonomous Refresh of Floating Body Cell (FBC)", International Electron Device Meeting, 2008, pp. 801-804.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-76.
Chen, W., et al., "InP Layer Transfer with Masked Implantation," Electrochemical and Solid-State Letters, Issue 12, No. 4, Apr. 2009, H149-150.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Moon, S.W. et al., "Fabrication and Packaging of Microbump Interconnections for 3D TSV," IEEE International Conference on 3D System Integration (3DIC), Sep. 28-30, 2009, pp. 1-5.
Franzon, P.D. et al., "Design and CAD for 3D Integrated Circuits," 45th ACM/IEEE Design, Automation Conference (DAC), Jun. 8-13, 2008, pp. 668-673.
Brebner, G., "Tooling up for Reconfigurable System Design," IEE Colloquium on Reconfigurable Systems, 1999, Ref. No. 1999/061, pp. 2/1-2/4.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," pp. 407-410.
Lu, N.C.C., et al, "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.

Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, V.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, 5.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Sellathamby, C.V., et al., "Non-contact wafer probe using wireless probe cards", (2005) Proceedings—International Test Conference, 2005, pp. 447-452.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bona, S. et al., "CELONCEL: Effective Design Technique for 3-D Monolithic Integration targeting High Performance Integrated Circuits", *Asia pacific DAC* 2011, paper 4A-4.
Choudhury, D., "3D Integration Technologies for Emerging Microsystems", IEEE IMS 2010.
Lee, Y.-J., et. al, "3D 65nm CMOS with 320° C. Microwave Dopant Activation", IEDM 2010.
Crnogorac, F., et al., "Semiconductor crystal islands for three-dimensional integration", J. Vac. Sci. Technol, B 28(6), Nov./Dec. 2010, C6P53-58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.

Brillouet, M., "Emerging Technologies on Silicon", IEDM 2004, pp. 17-24.
Jung, S.-M., et al., "Highly Area Efficient and Cost Effective Double Stacked S3(Stacked Single-crystal Si) Peripheral CMOS SSTFT and SRAM Cell Technology for 512M bit density Sram", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.
Meindl, J. D., "Beyond Moore'S Law: The Interconnect Era", IEEE Computing in Science & Engineering, Jan./Feb. 2003, pp. 20-24.
Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., "Three Dimensionally Stacked NAND Flash Memory Technology Using Stacking Single Crystal Si Layers on ILD and TANOS Structure for Beyond 30nm Node", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm 53( Stacked Single-crystal Si ) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221 for 512M bit density SRAM, IEDM 2003, pp. 265-268.
Steen, S.E., et al., "Overlay as the key to drive wafer scale 3D integration", Microelectronic Engineering 84 (2007) 1412-1415.
Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Long, J., et al., "Quantitative Studies of Impact of 3D IC Design on Repeater Usage", VMIC 2008.
Gutmann, Rj., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L, et al., "Engineered Substrates for Future More Moore and More Than Moore Integrated Devices",IEDM 2010, paper 2.6.1, pp. 42-45.
Kim, K., "From the Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.
Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/ Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, Jul. 19, 2006, San Francisco.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer•processing", CS Mantech Conference, May 14-17, 2007 Austin, Texas, pp. 33-36.
Golshani, N., et al "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Raiendran, B., et al., "Thermal Simulation of laser Annealing for 3D Integration", Proceedings VMIC 2003.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, Jd., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, dtco-25-04-aust.3d.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain Mosfet Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with DopantSegregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET Sonos Device for Multi-functional SoC Applications", 2008 IEDM, pp. 223-226.
Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.
Agoura Technologies white paper, "Wire Grid Polarizers: a New High Contrast Polarizer Technology for Liquid Crystal Displays", 2008, pp. 1-12.
Unipixel Displays, Inc. white paper, "Time Multi-plexed Optical Shutter (TMOS) Displays", Jun. 2007, pp. 1-49.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Azevedo, I. L., et al., "The Transition to Solid-State Lighting", Proc. IEEE, vol. 97, No. 3, Mar. 2009, pp. 481-510.
Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.
Tong, Q.-Y., et al., "A "smarter-cut" approach to low temperature silicon layer transfer", Applied Physics Letters, vol. 72, No. 1, Jan. 5, 1998, pp. 49-51.
Sadaka, M., et al., "Building Blocks for wafer level 3D integration", electroiq Aug. 18, 2010.
Tong, Q.-Y., et al., "Low Temperature Si Layer Splitting", Proceedings 1997 IEEE International SOI Conference, Oct. 1997, pp. 126-127.
Nguyen, P., et al., "Systematic study of the splitting kinetic of H/He co-implanted substrate", SOI Conference, 2003, pp. 132-134.
Ma, X., et al., "A high-quality SOI structure fabricated by low-temperature technology with B+/H+ co-implantation and plasma bonding", Semiconductor Science and Technology, vol. 21, 2006, pp. 959-963.
Yu, C.Y., et al., "Low-temperature fabrication and characterization of Ge-on-insulator insulator structures", Applied Physics Letters, vol. 89, 101913-1 to 101913-2 (2006).
Li, Y. A et al., "Surface Roughness of Hydrogen Ion Cut Low Temperature Bonded Thin Film Layers", Japan Journal of Applied Physics, vol. 39 (2000), Part 1, No. 1, pp. 275-276.
Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.
Aspar, B., et al., "Transfer of structured and patterned thin silicon films using the Smart-Cut process", Electronics Letters, Oct. 10, 1996, vol. 32, No. 21, pp. 1985-1986.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Uchikoga, S., et al., "Low temperature poly-Si TFT-LCD by excimer laser anneal," Thin Solid Films, vol. 383 (2001), pp. 19-24.
He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, S.D., et al., "Advanced source/drain engineering for box-shaped ultra shallow junction formation using laser annealing and pre-amorphization implantation in sub-100-nm SOI CMOS" IEEE Trans. Electron Devices, vol. 49, No. 10, pp. 1748-1754, Oct. 2002.
Ahn, J., et al., "High-quality Mosfet's with ultrathin LPCVD gate SiO2," IEEE Electron Device Lett., vol. 13, No. 4, pp. 186-188, Apr. 1992.
Kim, J., et al., "A Stacked Memory Device on Logic 3D Technology for Ultra-high-density Data Storage," Nanotechnology, vol. 22, 254006 (2011).
Yang, M., et al., "High Performance CMOS Fabricated on Hybrid Substrate with Different Crystal Orientation," Proceedings IEDM 2003.
Lee, K. W., et al., "Three-dimensional shared memory fabricated using wafer stacking technology," IEDM Tech. Dig., 2000, pp. 165-168.
Yin, H., et al., "Scalable 3-D finlike poly-Si TFT and its nonvolatile memory application," IEEE Trans. Electron Devices, vol. 55, No. 2, pp. 578-584, Feb. 2008.
Chen, H. Y., et al., "HfOx Based Vertical Resistive Random Access Memory for Cost Effective 3D Cross-Point Architecture without Cell Selector," Proceedings IEDM 2012, pp. 497-499.

* cited by examiner

| Part of Transistor | Technology used for Construction | Process Temperatures |
|---|---|---|
| Single Crystal Silicon | Layer transfer with Ion-Cut Process | <400°C |
| Gate Dielectrics and Gate Electrodes | Atomic Layer Deposition (ALD) or Chemical Vapor Deposition (CVD) | <400°C |
| Source and Drain Regions | Ion implantation followed by Anneal | >400°C, typically in 700°C-1200°C range |

Doping does not change between silicon region forming source 608, drain 610 and region under gate 612. Every region contains heavily doped silicon.

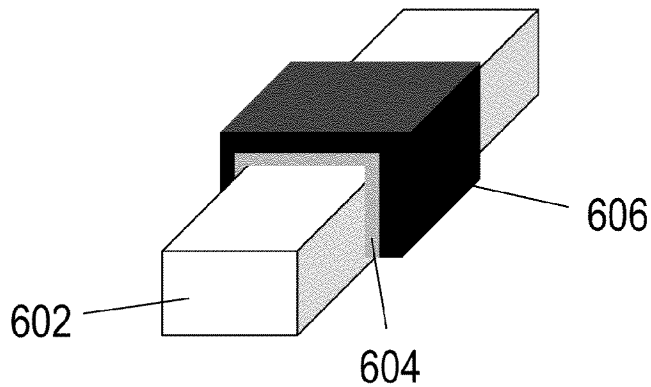
Doping does not change between silicon region forming source, drain and region under gate. Every region contains heavily doped silicon.
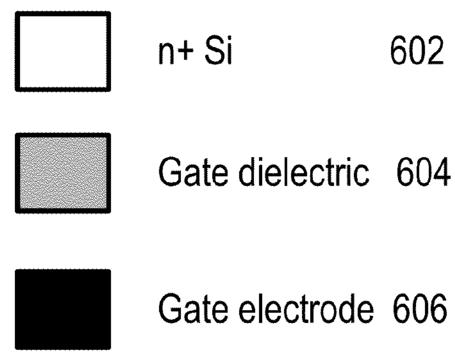
Fig. 6C Angle Alpha can be between 90° and 180°.

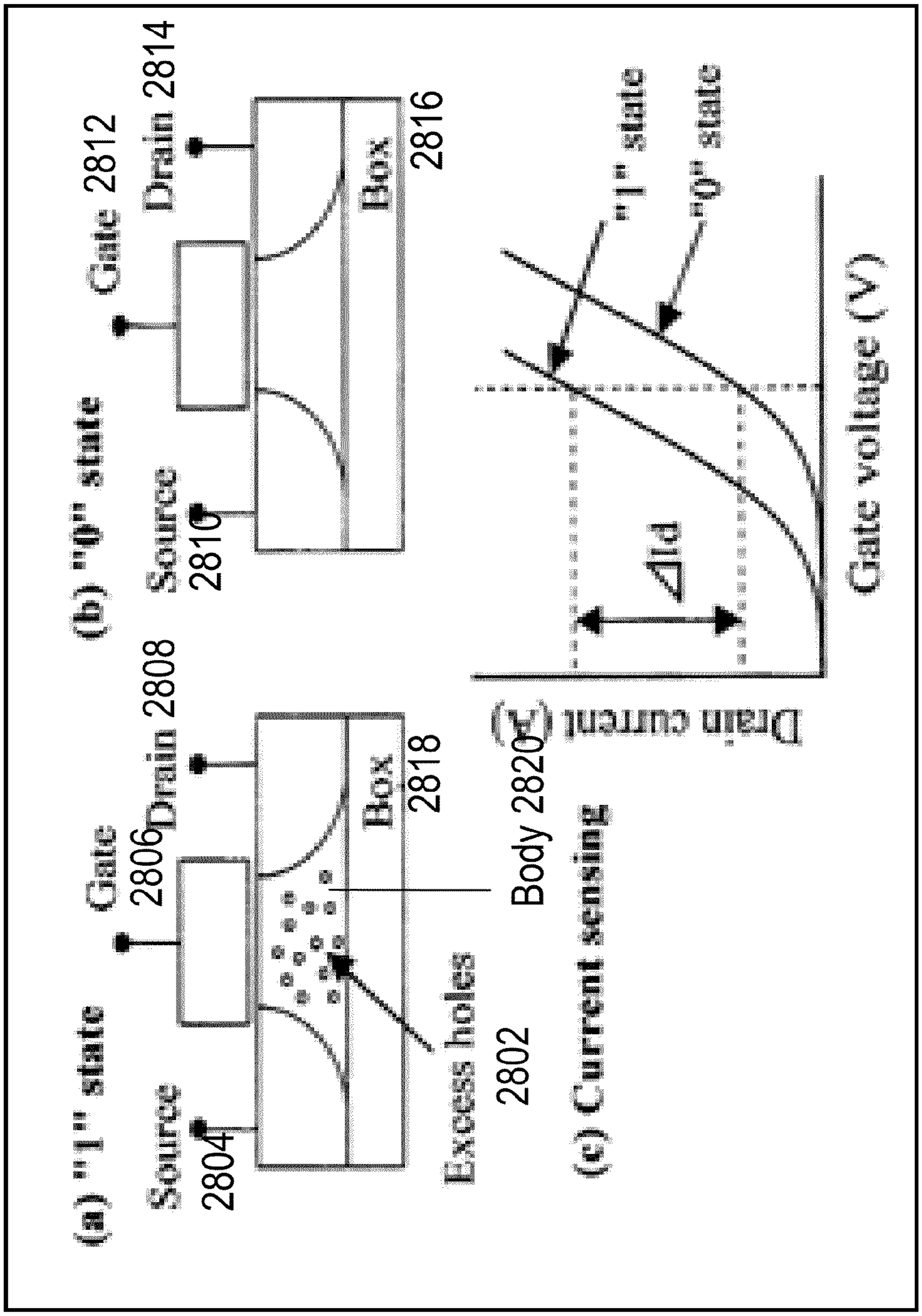
Figure 28: Basics of Floating-body DRAM (prior art)

Architecture from "Multi-layered Vertical Gate NAND Flash overcoming stacking limit for terabit density storage", Symposium on VLSI Technology, 2009 by W. Kim, S. Choi, et al.
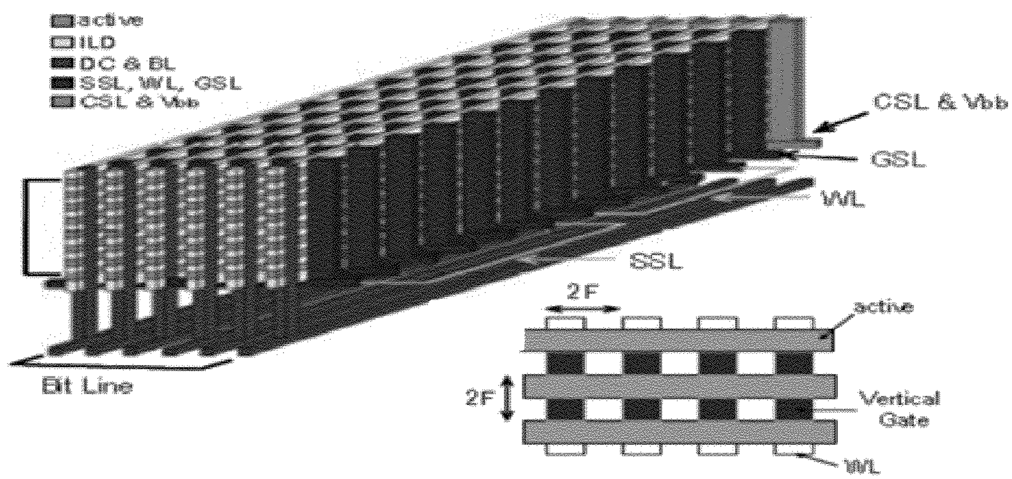
Architecture from "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al.
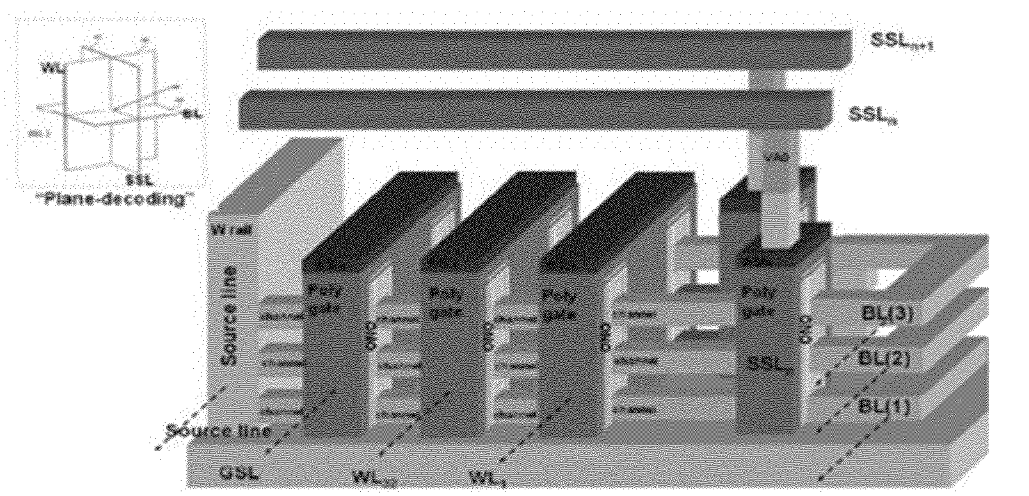
Fig. 38D

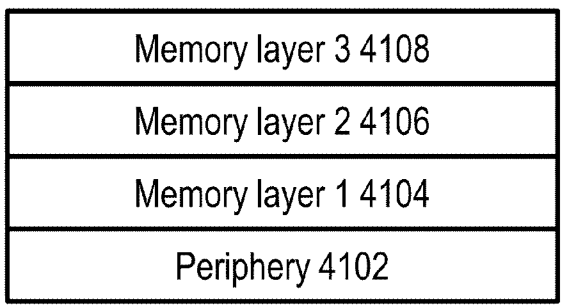
Fig. 41A: Periphery-on-bottom architecture
Used for Fig. 28-40
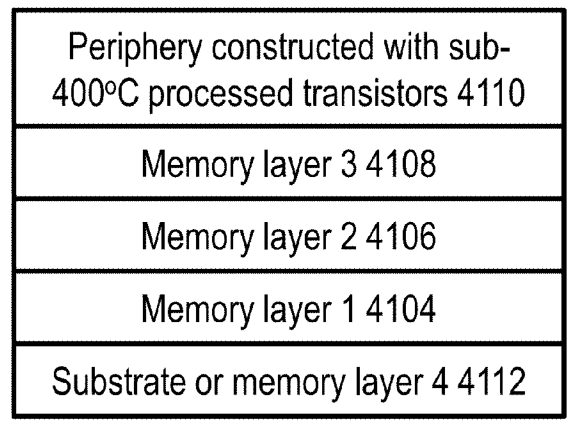
Fig. 41B: Periphery-on-top architecture
An alternative

METHOD OF MANUFACTURING A SEMICONDUCTOR DEVICE AND STRUCTURE

This application claims priority of co-pending U.S. patent application Ser. Nos. 12/577,532, 12/706,520, 12/792,673, 12/847,911, 12/859,665, 12/903,862 and 12/900,379 the contents of which are incorporated by reference.

BACKGROUND OF THE INVENTION

1. Field of the Invention

This invention describes applications of monolithic 3D integration to semiconductor chips performing logic and memory functions.

2. Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

3D stacking of semiconductor chips is one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

- Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer is constructed using Temperatures higher than 700° C., it can damage the Bottom Wiring Layer.
- Due to the above mentioned problem with forming transistor layers above wiring layers at temperatures lower than 400° C., the semiconductor industry has largely explored alternative architectures for 3D stacking In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer is large and the number of these Contacts is small. In fact, prototypes of 3D stacked chips today utilize as few as 10,000 connections between two layers, compared to billions of connections within a layer. This low connectivity between layers is because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs is not easy. This places a restriction on lateral dimensions of TSVs, which in turn impacts TSV density and contact density to another stacked layer. Therefore, connectivity between two wafers is limited.

It is highly desirable to circumvent these issues and build 3D stacked semiconductor chips with a high-density of connections between layers. To achieve this goal, it is sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

U.S. Pat. No. 7,052,941 from Sang-Yun Lee ("S-Y Lee") describes methods to construct vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it is difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," *IEDM Tech. Digest, p.* 363 (2005) by A. W. Topol, D. C. La Tulipe, L. Shi, et al. ("Topol"). A process flow is utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors is produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration", International Electron Devices Meeting, 2009 by A. Hubert, et al ("Hubert"). However, the approach described by Hubert has some challenges including use of difficult-to-manufacture nanowire transistors, higher defect densities due to formation of Si and SiGe layers atop each other, high temperature processing for long times, difficult manufacturing, etc.

It is clear based on the background art mentioned above that invention of novel technologies for 3D stacked chips will be useful.

BRIEF DESCRIPTION OF THE DRAWINGS

FIG. 6A-D show different types of junction-less transistors (JLT) that could be utilized for 3D stacking applications.

FIG. 28 show floating-body DRAM as described in prior art.

FIG. 38A-D show a fewer-masks per layer 3D horizontally-oriented charge-trap memory.

FIG. 41A-B show periphery on top of memory layers.

DETAILED DESCRIPTION

Embodiments of the present invention are now described with reference to FIGS. 1-52, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

Section 1: Construction of 3D Stacked Semiconductor Circuits and Chips with Processing Temperatures Below 400° C.

This section of the document describes a technology to construct single-crystal silicon transistors atop wiring layers with less than 400° C. processing temperatures. This allows construction of 3D stacked semiconductor chips with high density of connections between different layers, because the top-level transistors are formed well-aligned to bottom-level wiring and transistor layers. Since the top-level transistor layers are very thin (preferably less than 200 nm), alignment can be done through these thin silicon and oxide layers to features in the bottom-level.

Figure 1:
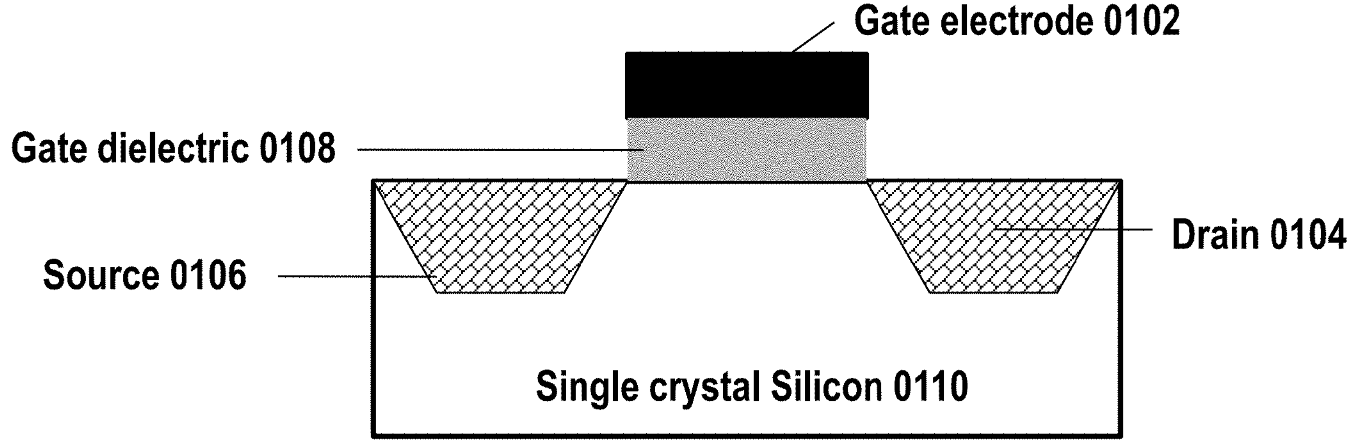
FIG. 1 shows process temperatures required for constructing different parts of a single-crystal silicon transistor.

FIG. 1 shows different parts of a standard transistor used in Complementary Metal Oxide Semiconductor (CMOS) logic and SRAM circuits. The transistor is constructed out of single crystal silicon material and may include a source 0106, a drain 0104, a gate electrode 0102 and a gate dielectric 0108. Single crystal silicon layers 0110 can be formed atop wiring layers at less than 400° C. using an "ion-cut process." Further details of the ion-cut process will be described in FIG. 2A-E. Note that the terms smart-cut, smart-cleave and nano-cleave are used interchangeably with the term ion-cut in this document. Gate dielectrics can be grown or deposited above silicon at less than 400° C. using a Chemical Vapor Deposition (CVD) process, an Atomic Layer Deposition (ALD) process or a plasma-enhanced thermal oxidation process. Gate electrodes can be deposited using CVD or ALD at sub-400° C. temperatures as well. The only part of the transistor that requires temperatures greater than 400° C. for processing is the source-drain region, which receive ion implantation which needs to be activated. It is clear based on FIG. 1 that novel transistors for 3D integrated circuits that do not need high-temperature source-drain region processing will be useful (to get a high density of inter-layer connections).

Figure 2A:
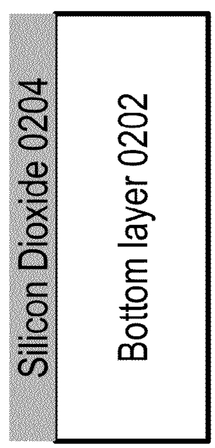
FIG. 2A-E depict a layer transfer flow using ion-cut in which a top layer of doped Si is layer transferred atop a generic bottom layer.

FIG. 2A-E describes an ion-cut flow for layer transferring a single crystal silicon layer atop any generic bottom layer 0202. The bottom layer 0202 can be a single crystal silicon layer. Alternatively, it can be a wafer having transistors with wiring layers above it. This process of ion-cut based layer transfer may include several steps, as described in the following sequence:

Step (A): A silicon dioxide layer 0204 is deposited above the generic bottom layer 0202. FIG. 2A illustrates the structure after Step (A) is completed.

Figure 2B:
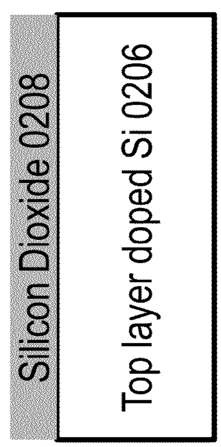

Step (B): The top layer of doped or undoped silicon 206 to be transferred atop the bottom layer is processed and an oxide layer 0208 is deposited or grown above it. FIG. 2B illustrates the structure after Step (B) is completed.

Figure 2C:
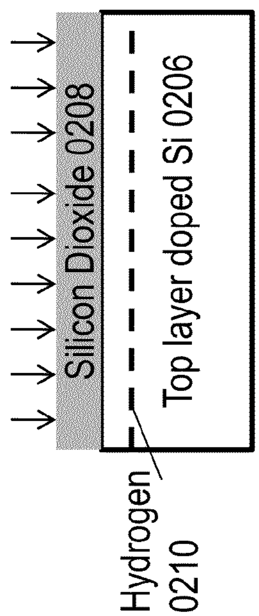

Step (C): Hydrogen is implanted into the top layer silicon 0206 with the peak at a certain depth to create the plane 0210. Alternatively, another atomic species such as helium or boron can be implanted or co-implanted. FIG. 2C illustrates the structure after Step (C) is completed.

Figure 2D:
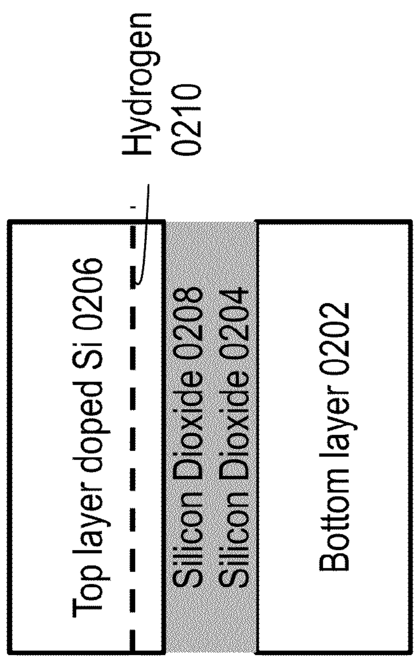

Step (D): The top layer wafer shown after Step (C) is flipped and bonded atop the bottom layer wafer using oxide-to-oxide bonding. FIG. 2D illustrates the structure after Step (D) is completed.

Figure 2E:
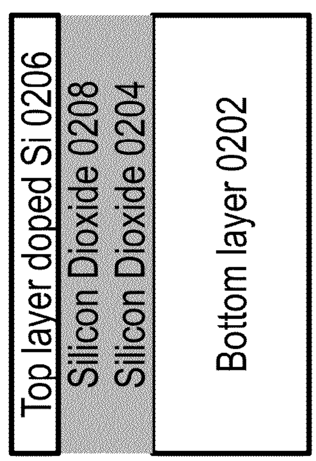

Step (E): A cleave operation is performed at the hydrogen plane 0210 using an anneal. Alternatively, a sideways mechanical force may be used. Further details of this cleave process are described in "Frontiers of silicon-on-insulator," J. Appl. Phys. 93, 4955-4978 (2003) by G. K. Celler and S. Cristoloveanu ("Celler") and "Mechanically induced Si layer transfer in hydrogen-implanted Si wafers," Appl. Phys. Lett., vol. 76, pp. 2370-2372, 2000 by K. Henttinen, I. Suni, and S. S. Lau ("Hentinnen"). Following this, a Chemical-Mechanical-Polish (CMP) is done. FIG. 2E illustrates the structure after Step (E) is completed.

Figure 3A:
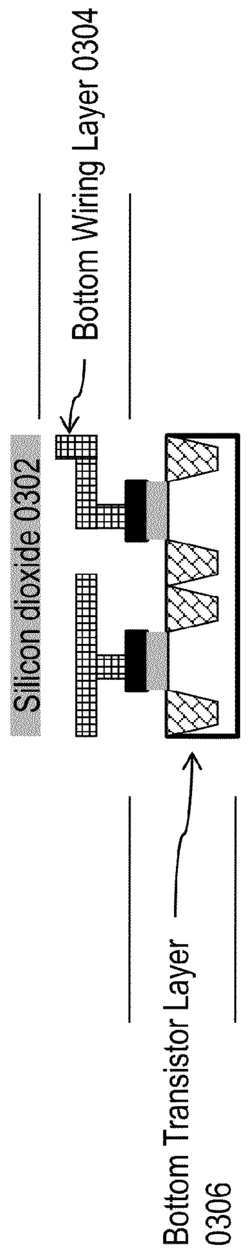
FIG. 3A-E show process flow for forming a 3D stacked IC using layer transfer which requires >400° C. processing for source-drain region construction.

A possible flow for constructing 3D stacked semiconductor chips with standard transistors is shown in FIG. 3A-E. The process flow may comprise several steps in the following sequence:

Step (A): The bottom wafer of the 3D stack is processed with a bottom transistor layer 0306 and a bottom wiring layer 0304. A silicon dioxide layer 0302 is deposited above the bottom transistor layer 0306 and the bottom wiring layer 0304. FIG. 3A illustrates the structure after Step (A) is completed.

Figure 3B:
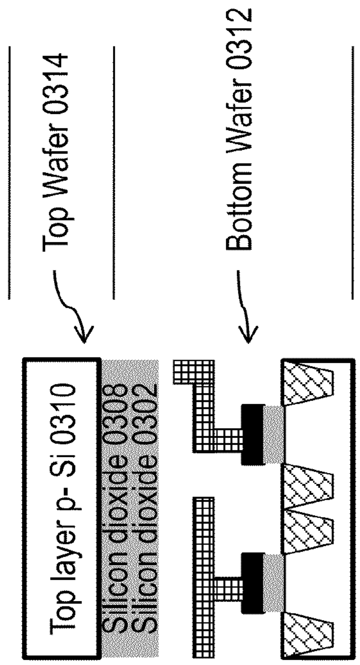

Step (B): Using a procedure similar to FIG. 2A-E, a top layer of p− or n− doped Silicon 0310 is transferred atop the bottom wafer. FIG. 3B illustrates the structure after Step (B) is completed.

Figure 3C:
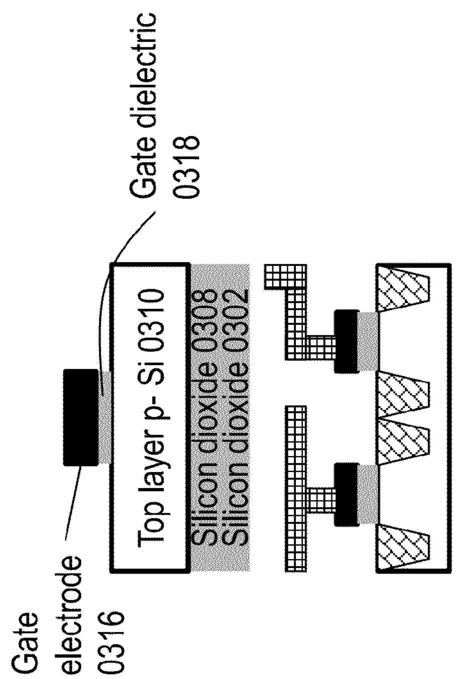

Step (C) Isolation regions (between adjacent transistors) on the top wafer are formed using a standard shallow trench isolation (STI) process. After this, a gate dielectric 0318 and a gate electrode 0316 are deposited, patterned and etched. FIG. 3C illustrates the structure after Step (C) is completed.

Figure 3D:
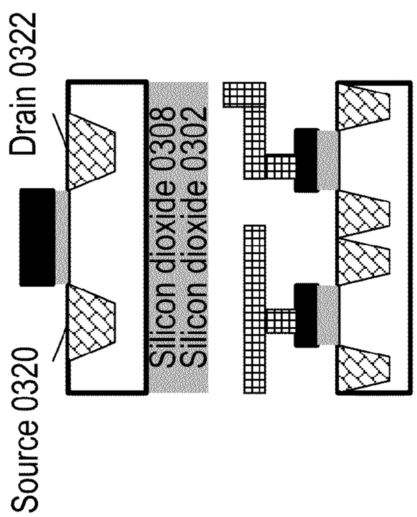

Step (D): Source 0320 and drain 0322 regions are ion implanted. FIG. 3D illustrates the structure after Step (D) is completed.

Figure 3E:
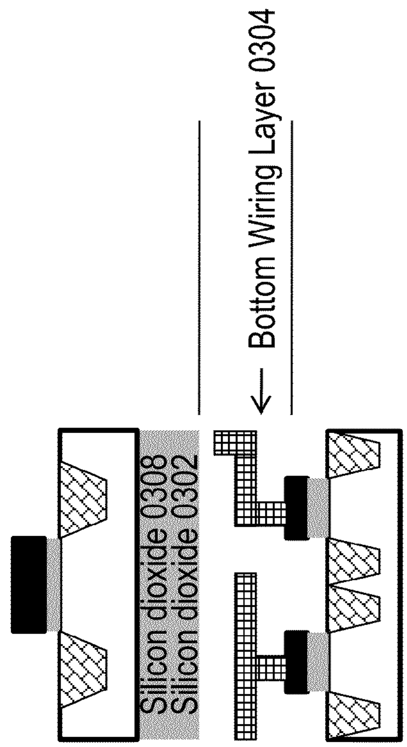

Step (E): The top layer of transistors is annealed at high temperatures, typically in between 700° C. and 1200° C. This is done to activate dopants in implanted regions. Following this, contacts are made and further processing occurs. FIG. 3E illustrates the structure after Step (E) is completed.

The challenge with following this flow to construct 3D integrated circuits with aluminum or copper wiring is apparent from FIG. 3A-E. During Step (E), temperatures above 700° C. are utilized for constructing the top layer of transistors. This can damage copper or aluminum wiring in the bottom wiring layer 0304. It is therefore apparent from FIG. 3A-E that forming source-drain regions and activating implanted dopants forms the primary concern with fabricating transistors with a low-temperature (sub-400° C.) process.

Section 1.1: Junction-Less Transistors as a Building Block for 3D Stacked Chips

One method to solve the issue of high-temperature source-drain junction processing is to make transistors without junctions i.e. Junction-Less Transistors (JLTs). An embodiment of this invention uses JLTs as a building block for 3D stacked semiconductor circuits and chips.

Figure 4:
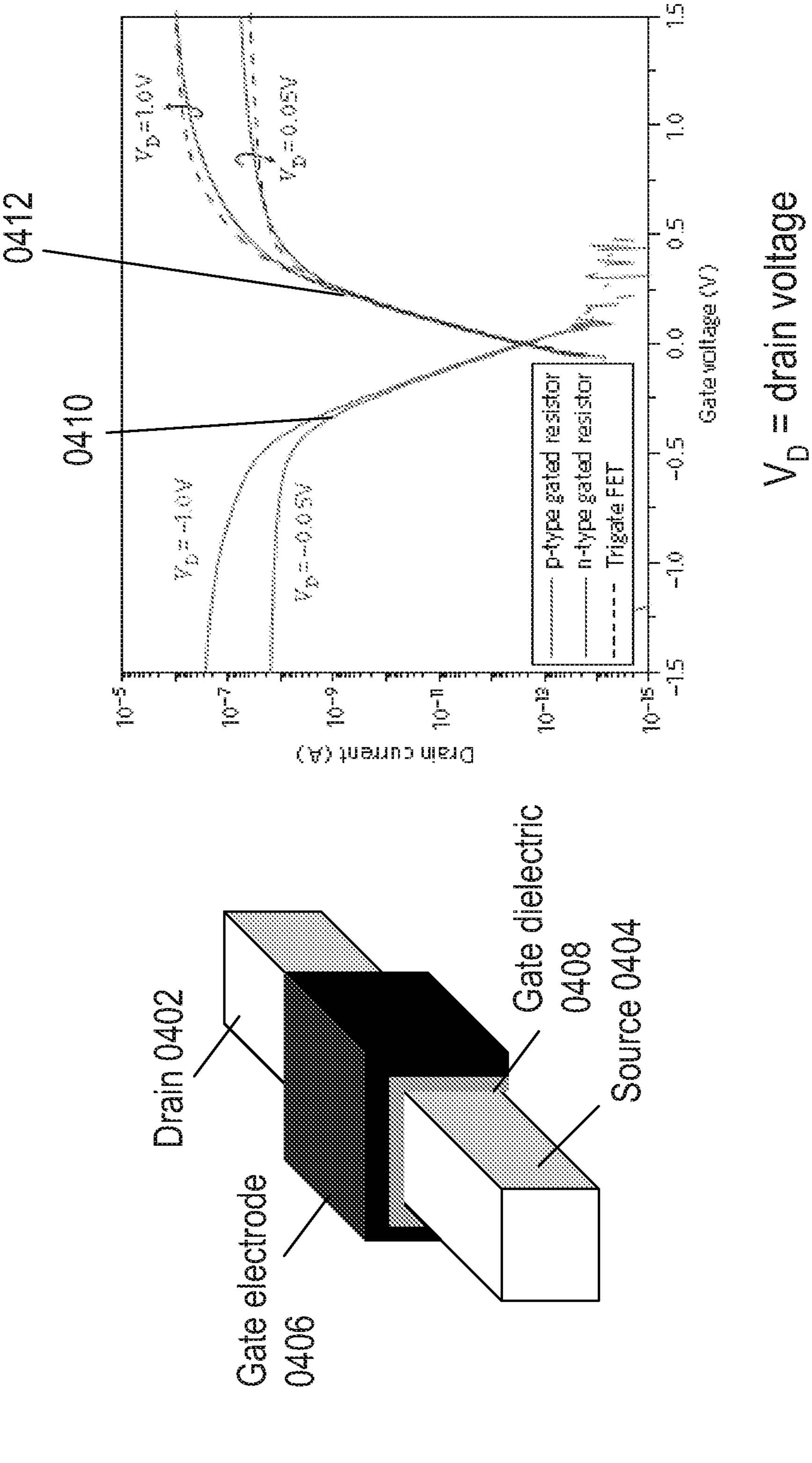
FIG. 4 shows a junctionless transistor as a switch for logic applications (prior art).

FIG. 4 shows a schematic of a junction-less transistor (JLT) also referred to as a gated resistor or nano-wire. A heavily doped silicon layer (typically above $1\times10^{19}/cm^3$, but can be lower as well) forms source 0404, drain 0402 as well as channel region of a JLT. A gate electrode 0406 and a gate dielectric 0408 are present over the channel region of the JLT. The JLT has a very small channel area (typically less than 20 nm on one side), so the gate can deplete the channel of charge carriers at 0V and turn it off. I-V curves of n channel (0412) and p channel (0410) junctionless transistors are shown in FIG. 4 as well. These indicate that the JLT can show comparable performance to a tri-gate transistor that is commonly researched by transistor developers. Further details of the JLT can be found in "Junctionless multigate field-effect transistor," Appl. Phys. Lett., vol. 94, pp. 053511 2009 by C.-W. Lee, A. Afzalian, N. Dehdashti Akhavan, R. Yan, I. Ferain and J. P. Colinge ("C-W. Lee"). Contents of this publication are incorporated herein by reference.

Figure 5A:
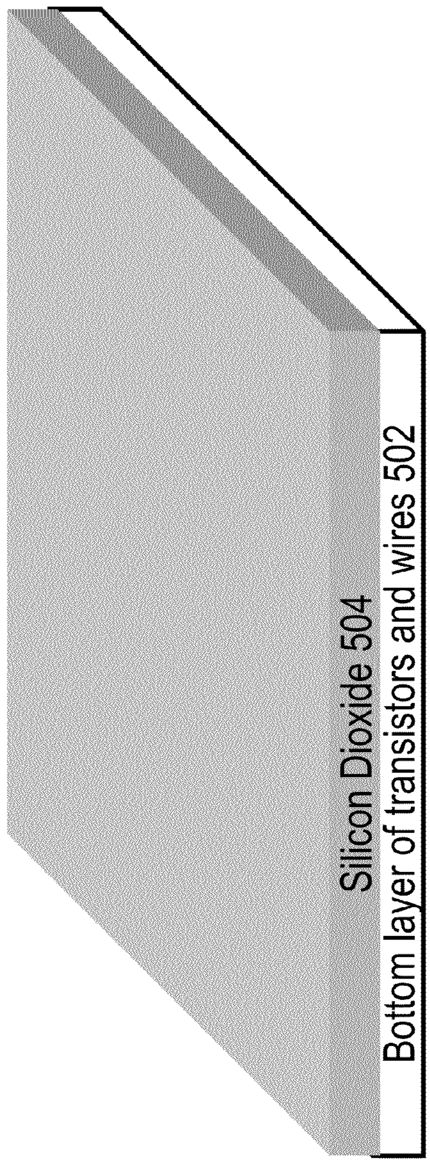
FIG. 5A-F show a process flow for constructing 3D stacked logic chips using junctionless transistors as switches.

FIG. 5A-F describes a process flow for constructing 3D stacked circuits and chips using JLTs as a building block. The process flow may comprise several steps, as described in the following sequence:

Step (A): The bottom layer of the 3D stack is processed with transistors and wires. This is indicated in the figure as bottom layer of transistors and wires 502. Above this, a silicon dioxide layer 504 is deposited. FIG. 5A shows the structure after Step (A) is completed.

Figure 5B:
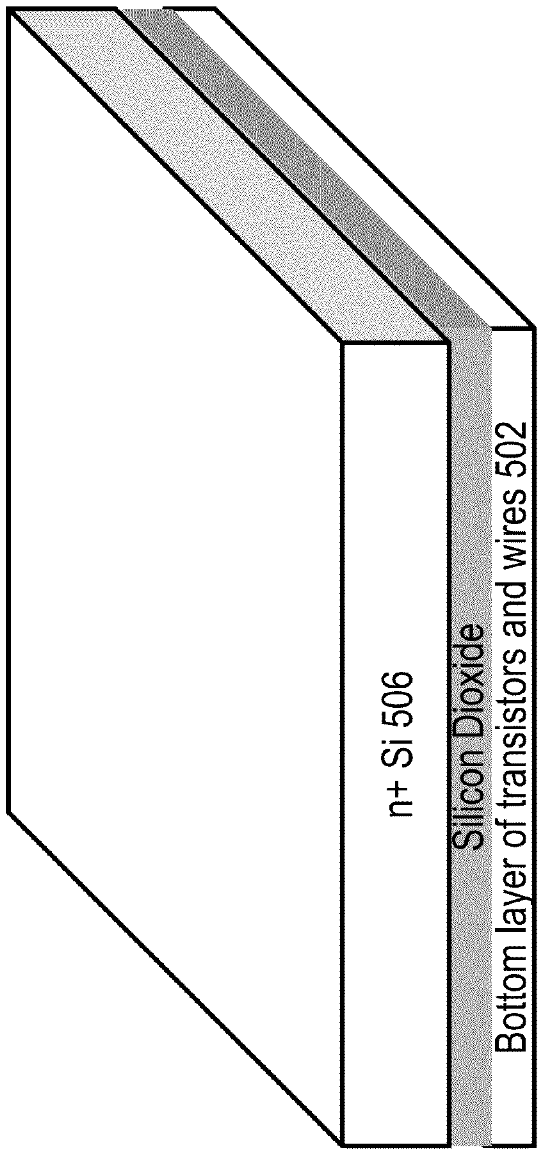

Step (B): A layer of n+Si 506 is transferred atop the structure shown after Step (A). It starts by taking a donor wafer which is already n+ doped and activated. Alternatively, the process can start by implanting a silicon wafer and activating at high temperature forming an n+ activated layer. Then, H+ ions are implanted for ion-cut within the n+ layer. Following this, a layer-transfer is performed. The process as shown in FIG. 2A-E is utilized for transferring and ion-cut of the layer forming the structure of FIG. 5A. FIG. 5B illustrates the structure after Step (B) is completed.

Figure 5C:
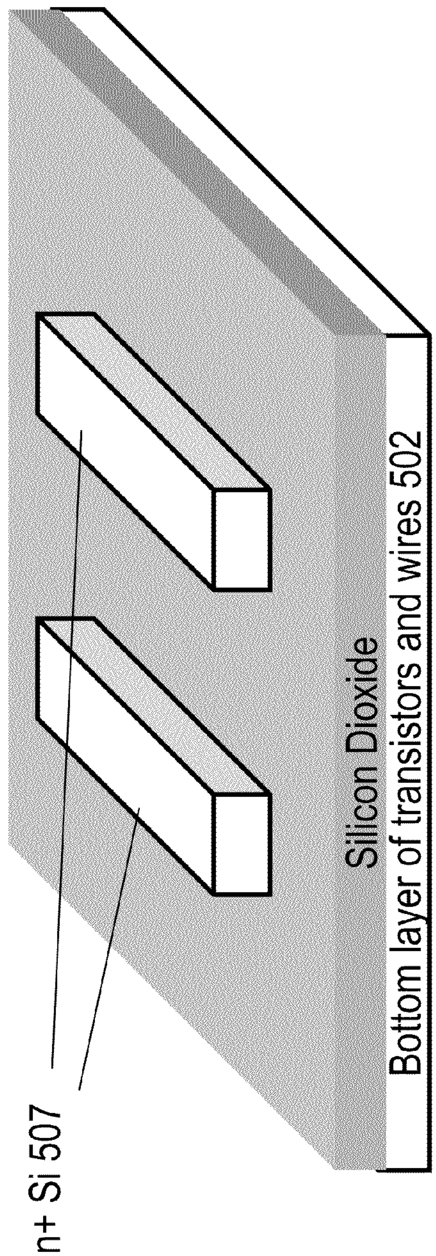

Step (C): Using lithography (litho) and etch, the n+Si layer is defined and is present only in regions where transistors are to be constructed. These transistors are aligned to the underlying alignment marks embedded in bottom layer 502. FIG. 5C illustrates the structure after Step (C) is completed, showing structures of the gate dielectric material 511 and gate electrode material 509 as well as structures of the n+ silicon region 507 after Step (C).

Figure 5D:
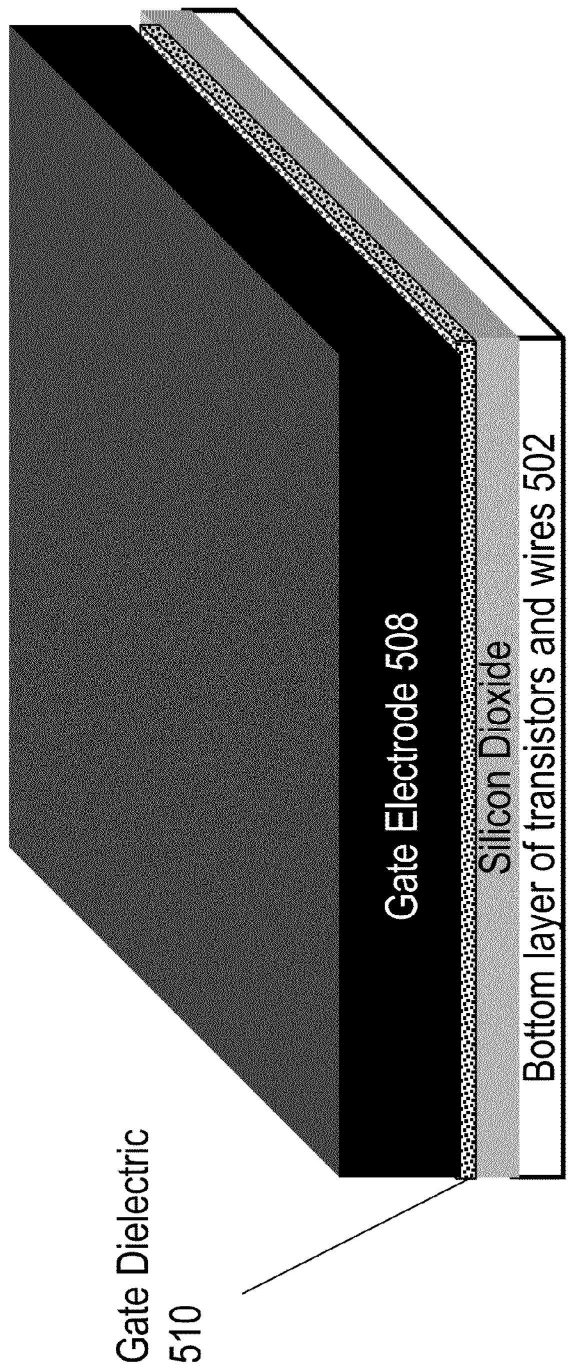

Step (D): The gate dielectric material 510 and the gate electrode material 508 are deposited, following which a CMP process is utilized for planarization. The gate dielectric material 510 could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. FIG. 5D illustrates the structure after Step (D) is completed.

Figure 5E:
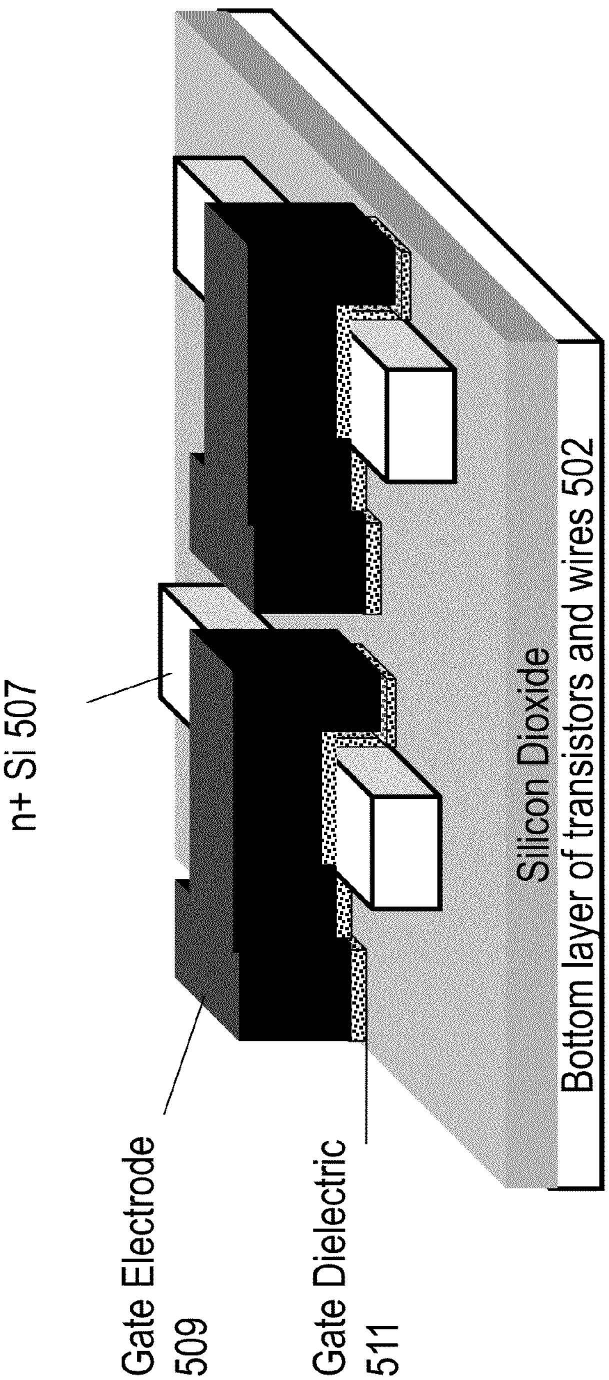

Step (E): Litho and etch are conducted to leave the gate dielectric material and the gate electrode material only in regions where gates are to be formed. FIG. 5E illustrates the structure after Step (E) is completed. Final structures of the gate dielectric material 511 and gate electrode material 509 are shown.

Figure 5F:
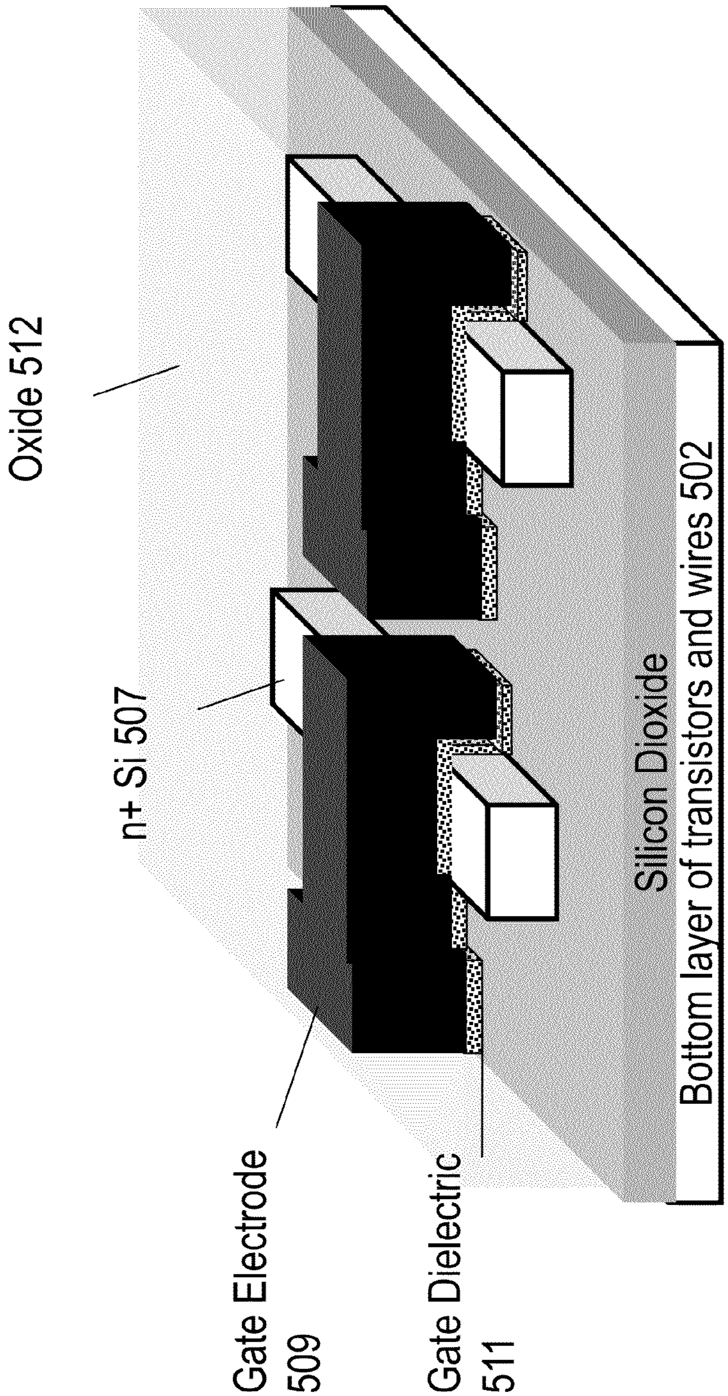

Step (F): An oxide layer is deposited and polished with CMP. This oxide region serves to isolate adjacent transistors. Following this, rest of the process flow continues, where contact and wiring layers could be formed. FIG. 5F illustrates the structure after Step (F) is completed. Note that top-level transistors are formed well-aligned to bottom-level wiring and transistor layers. Since the top-level transistor layers are made very thin (preferably less than 200 nm), the lithography equipment can see through these thin silicon layers and align to features at the bottom-level. While the process flow shown in FIG. 5A-F gives the key steps involved in forming a JLT for 3D stacked circuits and chips, it is conceivable to one skilled in the art that changes to the process can be made. For example, process steps and additional materials/regions to add strain to junctionless transistors can be added or a p+ silicon layer could be used. Furthermore, more than two layers of chips or circuits can be 3D stacked.

Figure 6A:
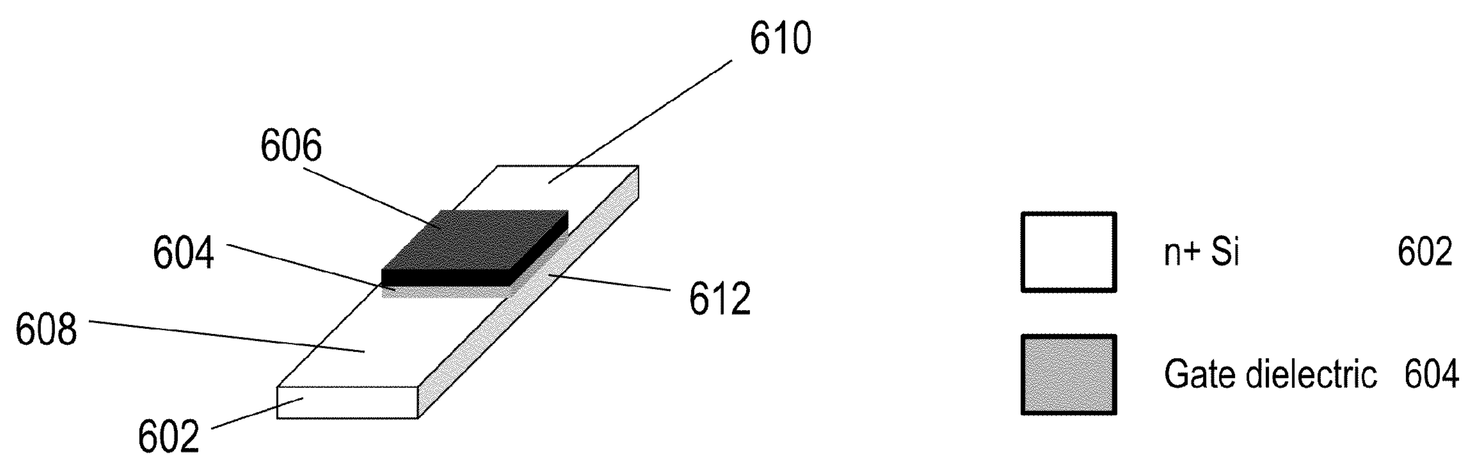
Figure 6B:
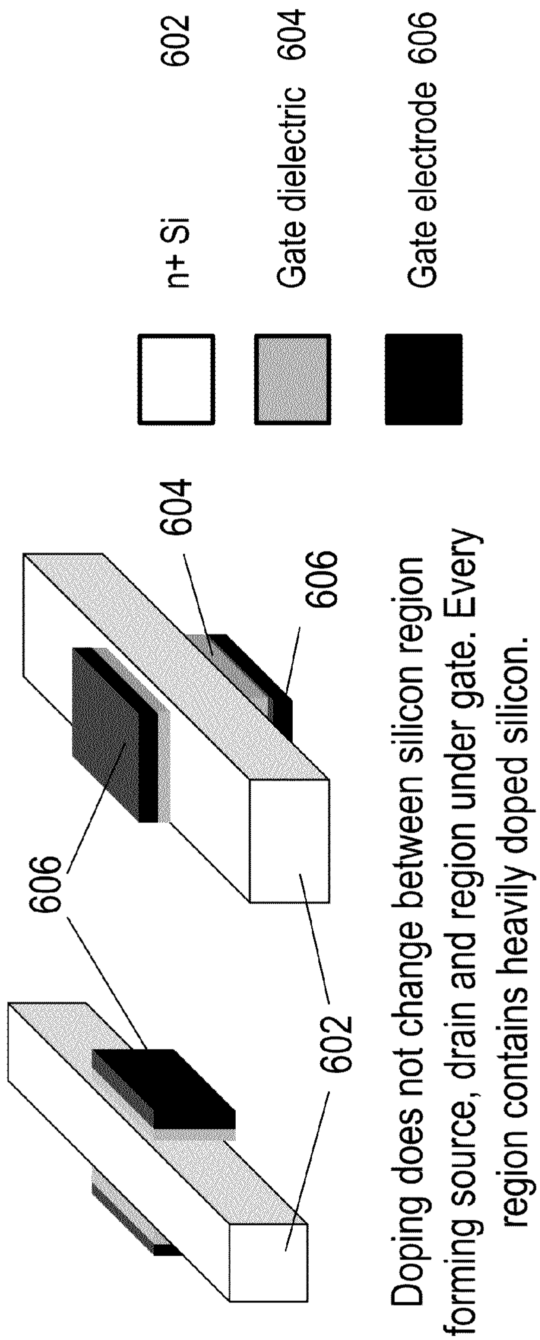
Figure 6D:
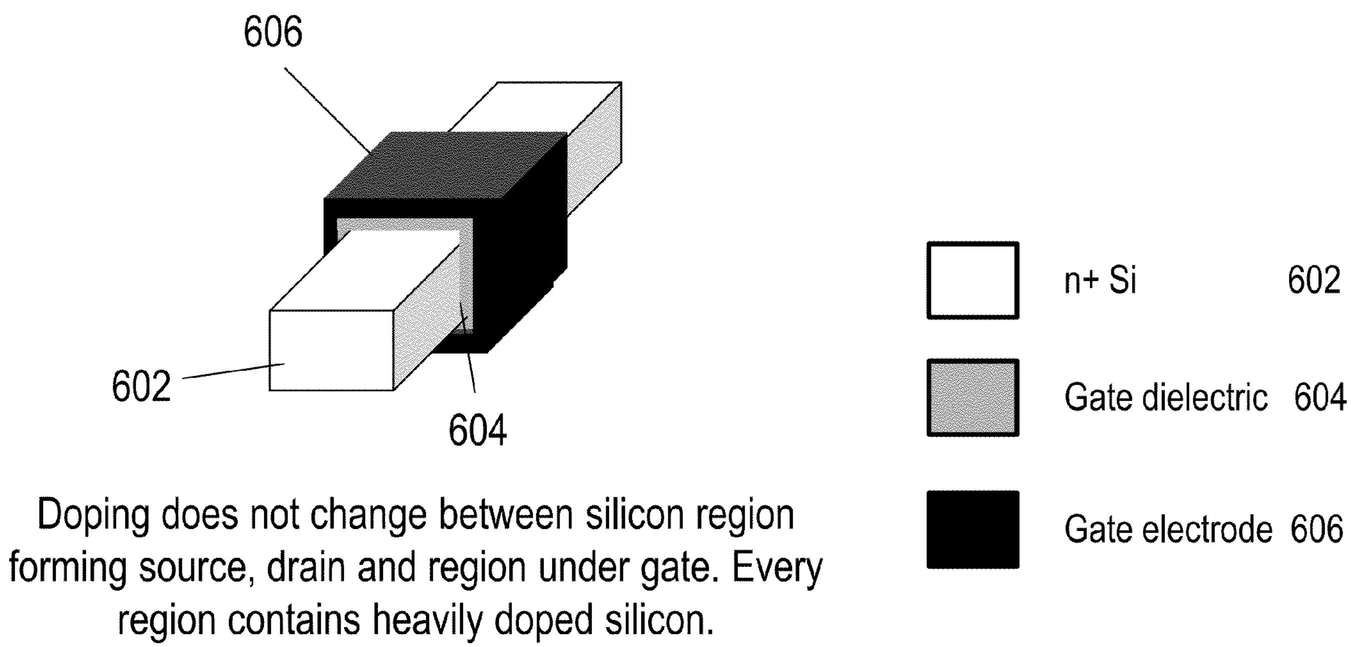

FIG. 6A-D shows that JLTs that can be 3D stacked fall into four categories based on the number of gates they use: One-side gated JLTs as shown in FIG. 6A, two-side gated JLTs as shown in FIG. 6B, three-side gated JLTs as shown in FIG. 6C, and gate-all-around JLTs as shown in FIG. 6D. The JLT shown in FIG. 5A-F falls into the three-side gated JLT category. As the number of JLT gates increases, the gate gets more control of the channel, thereby reducing leakage of the JLT at 0V. Furthermore, the enhanced gate control can be traded-off for higher doping (which improves contact resistance to source-drain regions) or bigger JLT cross-sectional areas (which is easier from a process integration standpoint). However, adding more gates typically increases process complexity.

Figure 7A:
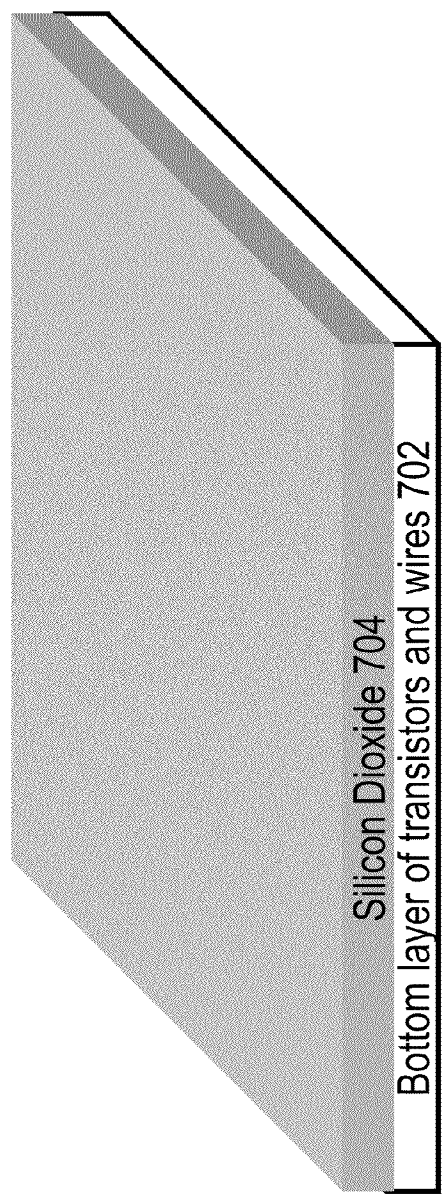
FIG. 7A-F show a process flow for constructing 3D stacked logic chips using one-side gated junctionless transistors as switches.

FIG. 7A-F describes a process flow for using one-side gated JLTs as building blocks of 3D stacked circuits and chips. The process flow may include several steps as described in the following sequence:

Step (A): The bottom layer of the two chip 3D stack is processed with transistors and wires. This is indicated in the figure as bottom layer of transistors and wires 702. Above this, a silicon dioxide layer 704 is deposited. FIG. 7A illustrates the structure after Step (A) is completed.

Figure 7B:
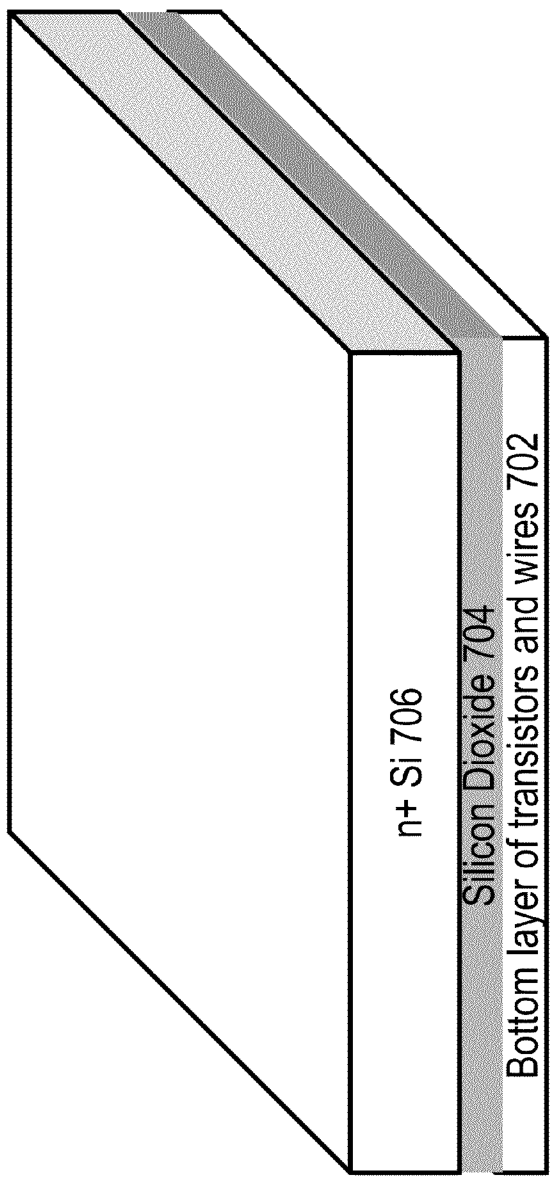

Step (B): A layer of n+Si 706 is transferred atop the structure shown after Step (A). The process shown in FIG. 2A-E is utilized for this purpose as was presented with respect to FIG. 5. FIG. 7B illustrates the structure after Step (B) is completed.

Figure 7C:
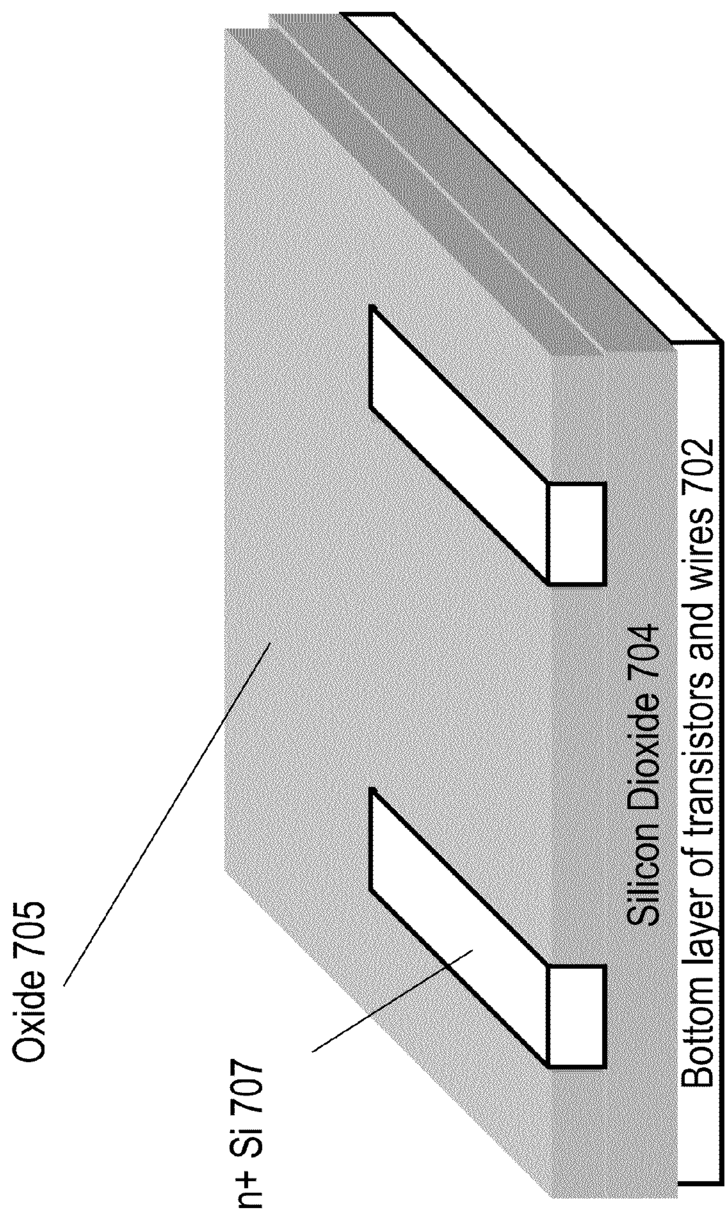

Step (C): Using lithography (litho) and etch, the n+Si layer 706 is defined and is present only in regions where transistors are to be constructed. An oxide 705 is deposited (for isolation purposes) with a standard shallow-trench-isolation process. The n+Si structure remaining after Step (C) is indicated as n+Si 707. FIG. 7C illustrates the structure after Step (C) is completed.

Figure 7D:
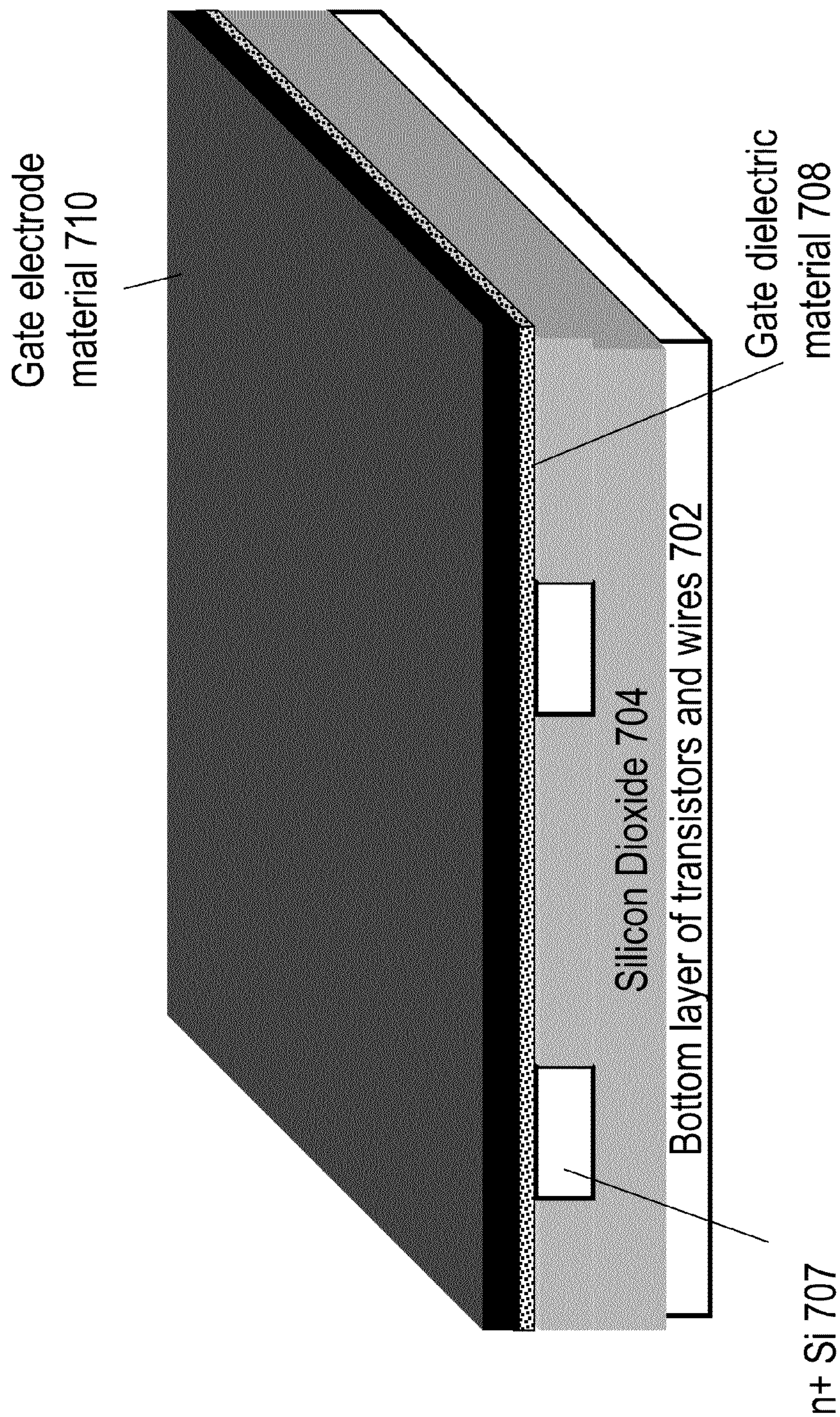

Step (D): The gate dielectric material 708 and the gate electrode material 710 are deposited. The gate dielectric material 708 could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. FIG. 7D illustrates the structure after Step (D) is completed.

Figure 7E:
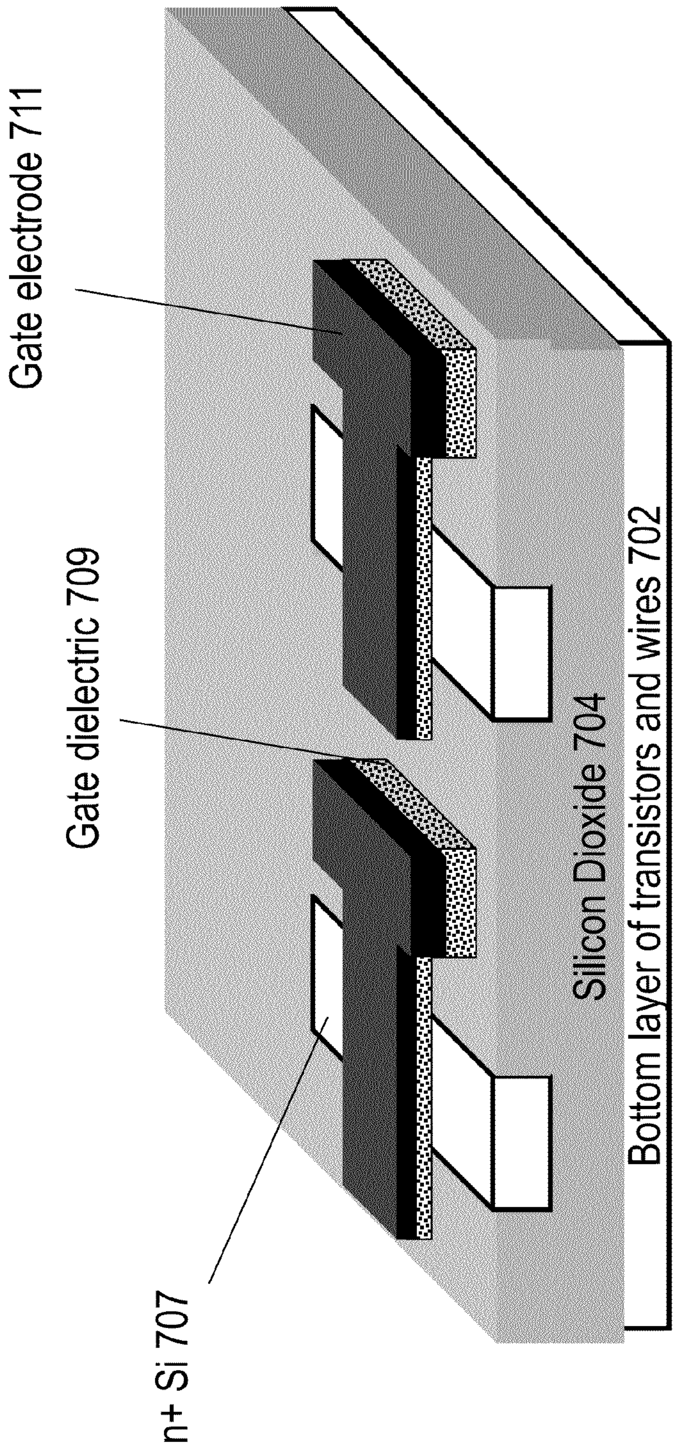

Step (E): Litho and etch are conducted to leave the gate dielectric material 708 and the gate electrode material 710 only in regions where gates are to be formed. It is clear based on the schematic that the gate is present on just one side of the JLT. Structures remaining after Step (E) are gate dielectric 709 and gate electrode 711. FIG. 7E illustrates the structure after Step (E) is completed.

Figure 7F:
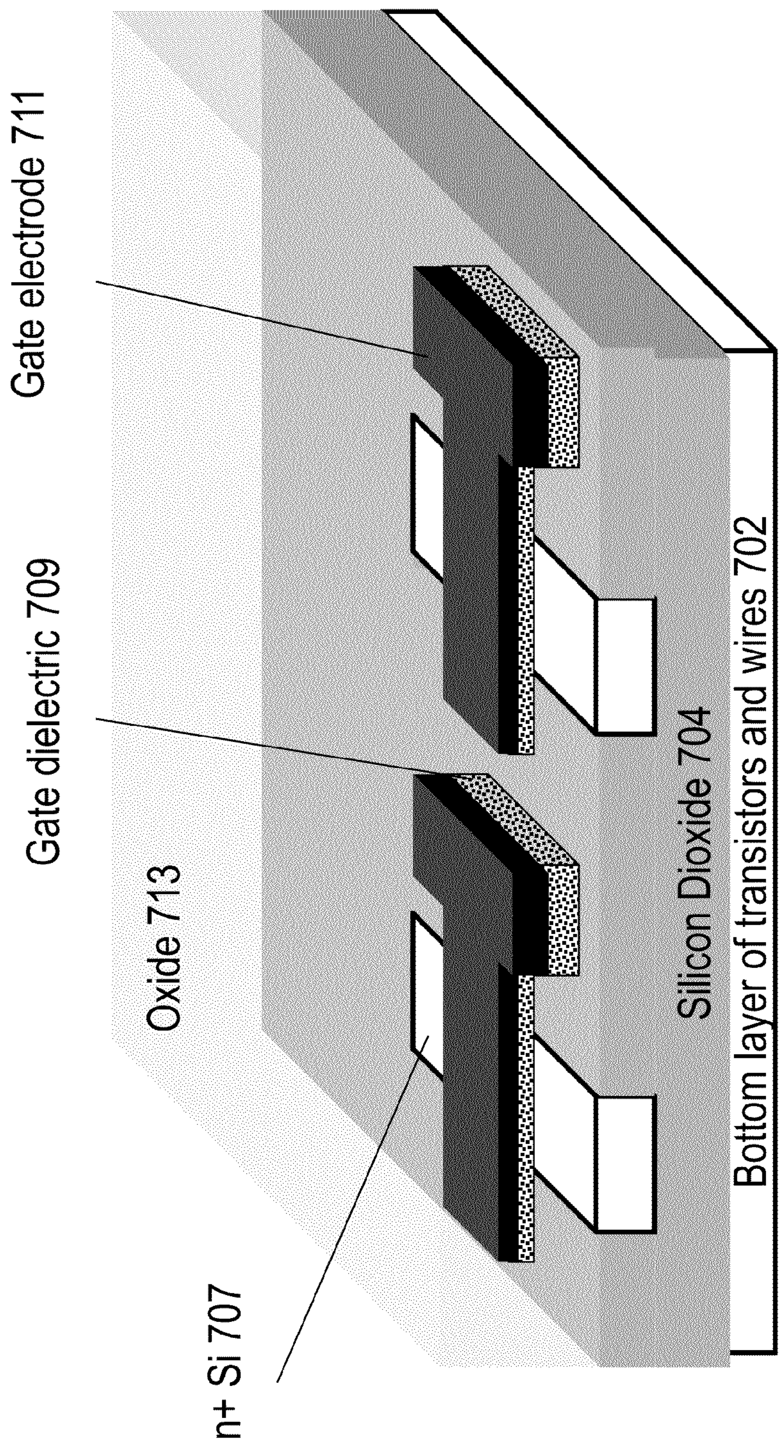

Step (F): An oxide layer 713 is deposited and polished with CMP. FIG. 7F illustrates the structure after Step (F) is completed. Following this, rest of the process flow continues, with contact and wiring layers being formed.

Note that top-level transistors are formed well-aligned to bottom-level wiring and transistor layers. Since the top-level transistor layers are made very thin (preferably less than 200 nm), the lithography equipment can see through these thin silicon layers and align to features at the bottom-level. While the process flow shown in FIG. 7A-F illustrates several steps involved in forming a one-side gated JLT for 3D stacked circuits and chips, it is conceivable to one skilled in the art that changes to the process can be made. For example, process steps and additional materials/regions to add strain to junction-less transistors can be added. Furthermore, more than two layers of chips or circuits can be 3D stacked.

Figure 8A:
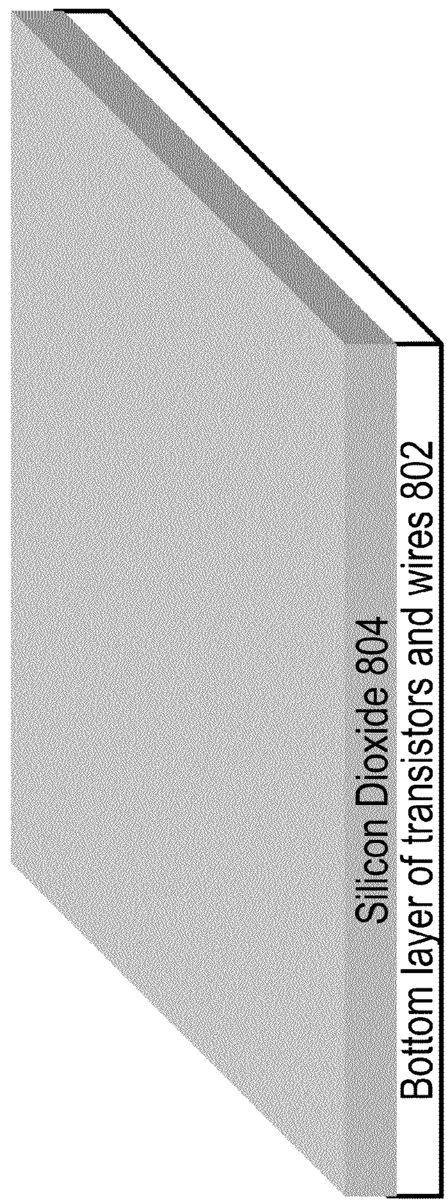
FIG. 8A-E show a process flow for constructing 3D stacked logic chips using two-side gated junctionless transistors as switches.

FIG. 8A-E describes a process flow for forming 3D stacked circuits and chips using two side gated JLTs. The process flow may include several steps, as described in the following sequence:

Step (A): The bottom layer of the 2 chip 3D stack is processed with transistors and wires. This is indicated in the figure as bottom layer of transistors and wires 802. Above this, a silicon dioxide layer 804 is deposited. FIG. 8A shows the structure after Step (A) is completed.

Figure 8B:
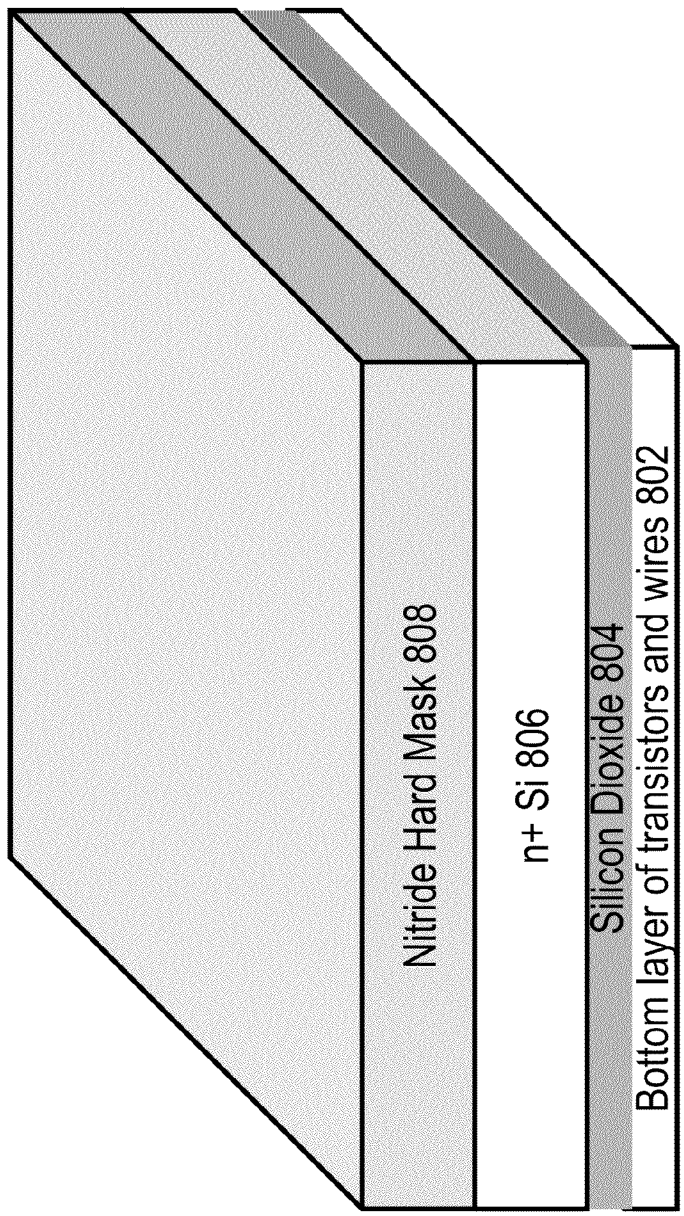

Step (B): A layer of n+Si 806 is transferred atop the structure shown after Step (A). The process shown in FIG. 2A-E is utilized for this purpose as was presented with respect to FIG. 5A-F. A nitride (or oxide) layer 808 is deposited to function as a hard mask for later processing. FIG. 8B illustrates the structure after Step (B) is completed.

Figure 8C:
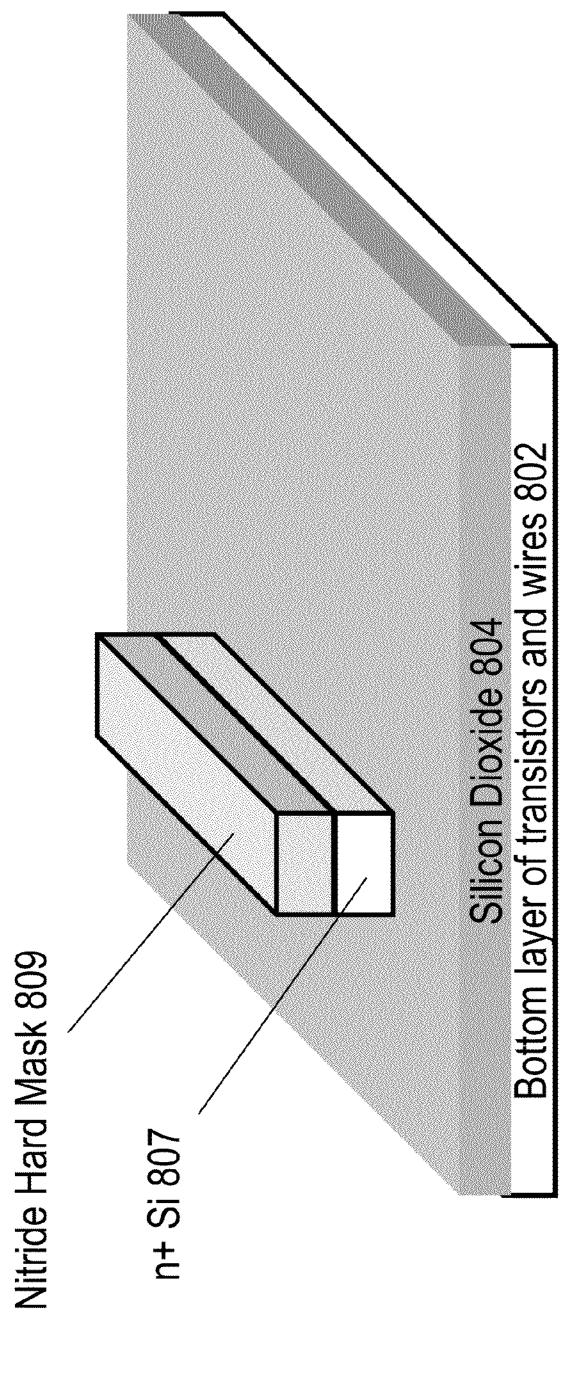

Step (C): Using lithography (litho) and etch, the nitride layer 808 and n+Si layer 806 are defined and are present only in regions where transistors are to be constructed. The nitride and n+Si structures remaining after Step (C) are indicated as nitride hard mask 809 and n+Si 807. FIG. 8C illustrates the structure after Step (C) is completed.

Figure 8D:
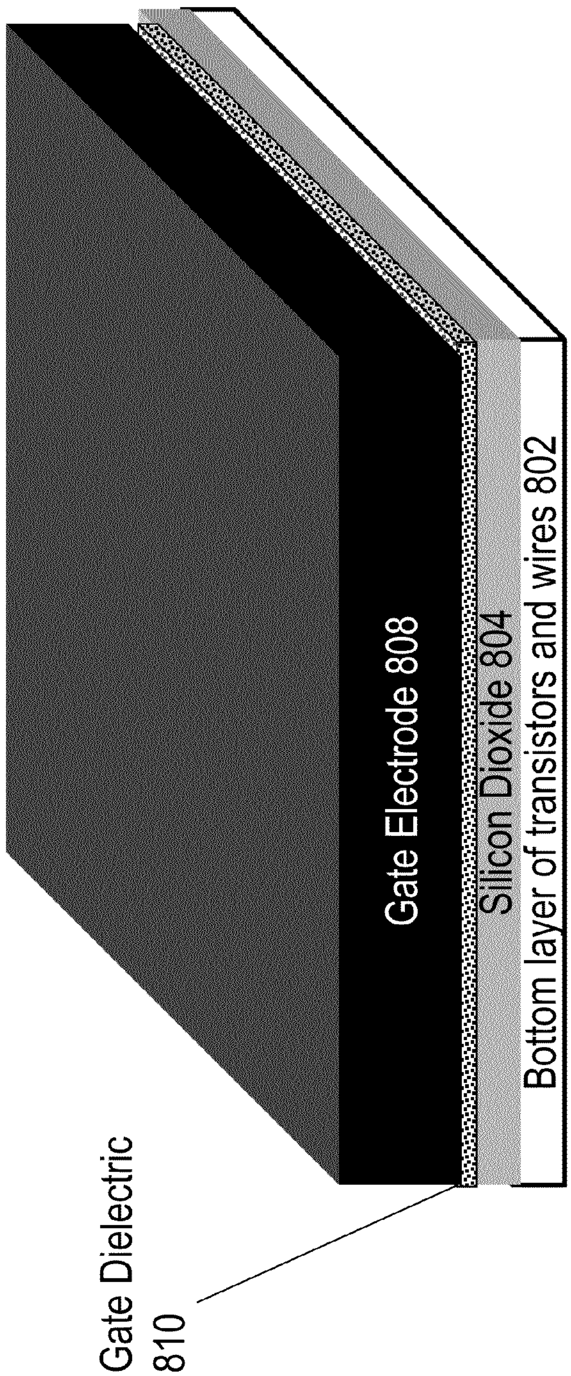

Step (D): The gate dielectric material 810 and the gate electrode material 808 are deposited. The gate dielectric material 810 could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. FIG. 8D illustrates the structure after Step (D) is completed.

Figure 8E:
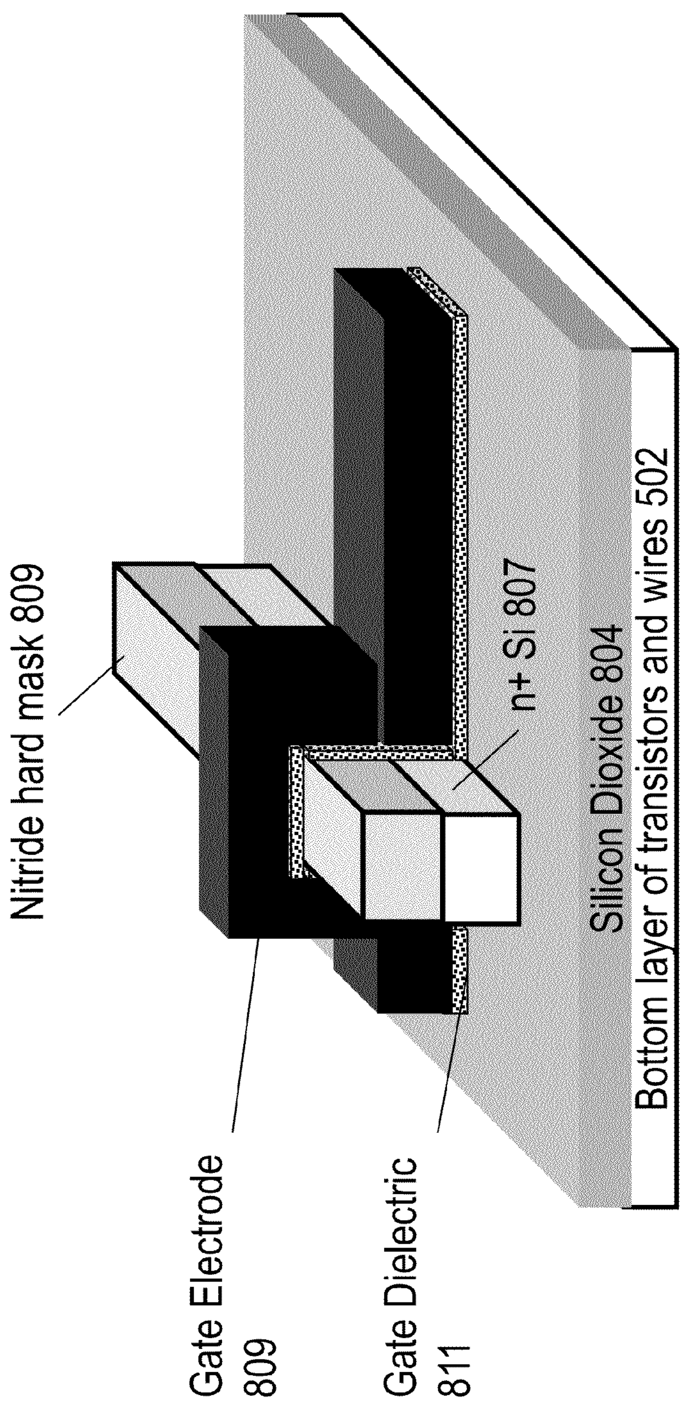

Step (E): Litho and etch are conducted to leave the gate dielectric material 810 and the gate electrode material 808 only in regions where gates are to be formed. Structures remaining after Step (E) are gate dielectric 811 and gate electrode 809. FIG. 8E illustrates the structure after Step (E) is completed.

Note that top-level transistors are formed well-aligned to bottom-level wiring and transistor layers. Since the top-level transistor layers are made very thin (preferably less than 200 nm), the lithography equipment can see through these thin silicon layers and align to features at the bottom-level. While the process flow shown in FIG. 8A-E gives the key steps involved in forming a two side gated JLT for 3D stacked circuits and chips, it is conceivable to one skilled in the art that changes to the process can be made. For example, process steps and additional materials/regions to add strain to junction-less transistors can be added. Furthermore, more than two layers of chips or circuits can be 3D stacked. An important note in respect to the JLT devices been presented is that the layer transferred used for the construction is usually thin layer of less than 200 nm and in many applications even less than 40 nm. This is achieved by the depth of the implant of the H+ layer used for the ion-cut and by following this by thinning using etch and/or CMP.

Figure 9A:
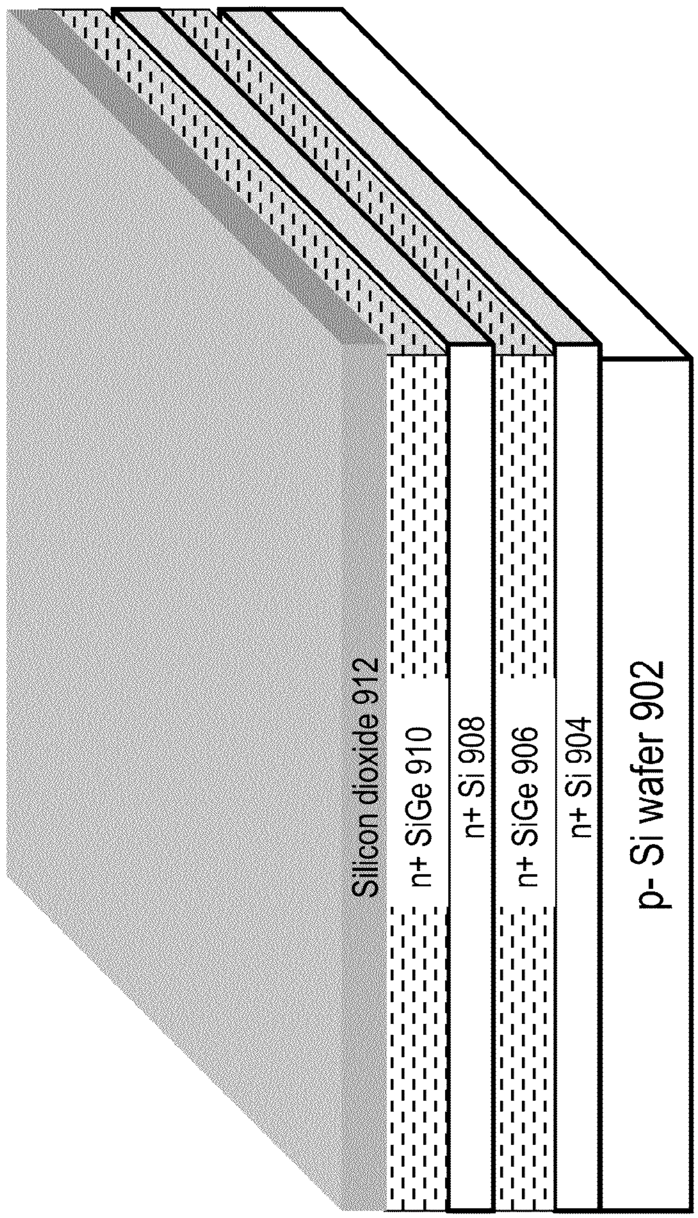
FIG. 9A-V show process flows for constructing 3D stacked logic chips using four-side gated junctionless transistors as switches.

FIG. 9A-J describes a process flow for forming four-side gated JLTs in 3D stacked circuits and chips. Four-side gated JLTs can also be referred to as gate-all around JLTs or silicon nanowire JLTs. They offer excellent electrostatic control of the channel and provide high-quality I-V curves with low leakage and high drive currents. The process flow in FIG. 9A-J may include several steps in the following sequence:

Step (A): On a p− Si wafer 902, multiple n+Si layers 904 and 908 and multiple n+ SiGe layers 906 and 910 are epitaxially grown. The Si and SiGe layers are carefully engineered in terms of thickness and stoichiometry to keep defect density due to lattice mismatch between Si and SiGe low. Some techniques for achieving this include keeping thickness of SiGe layers below the critical thickness for forming defects. A silicon dioxide layer 912 is deposited above the stack. FIG. 9A illustrates the structure after Step (A) is completed.

Figure 9B:
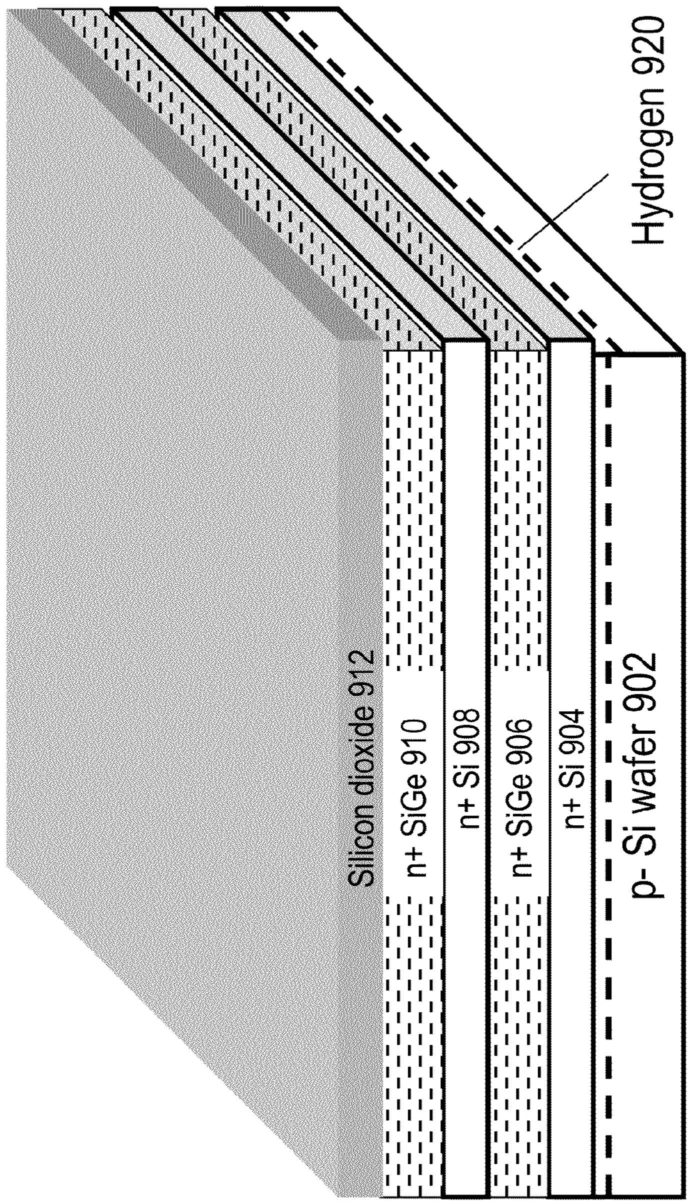

Step (B): Hydrogen is implanted at a certain depth in the p− wafer, to form a cleave plane 920 after bonding to bottom wafer of the two-chip stack. Alternatively, some other atomic species such as He can be used. FIG. 9B illustrates the structure after Step (B) is completed.

Figure 9C:
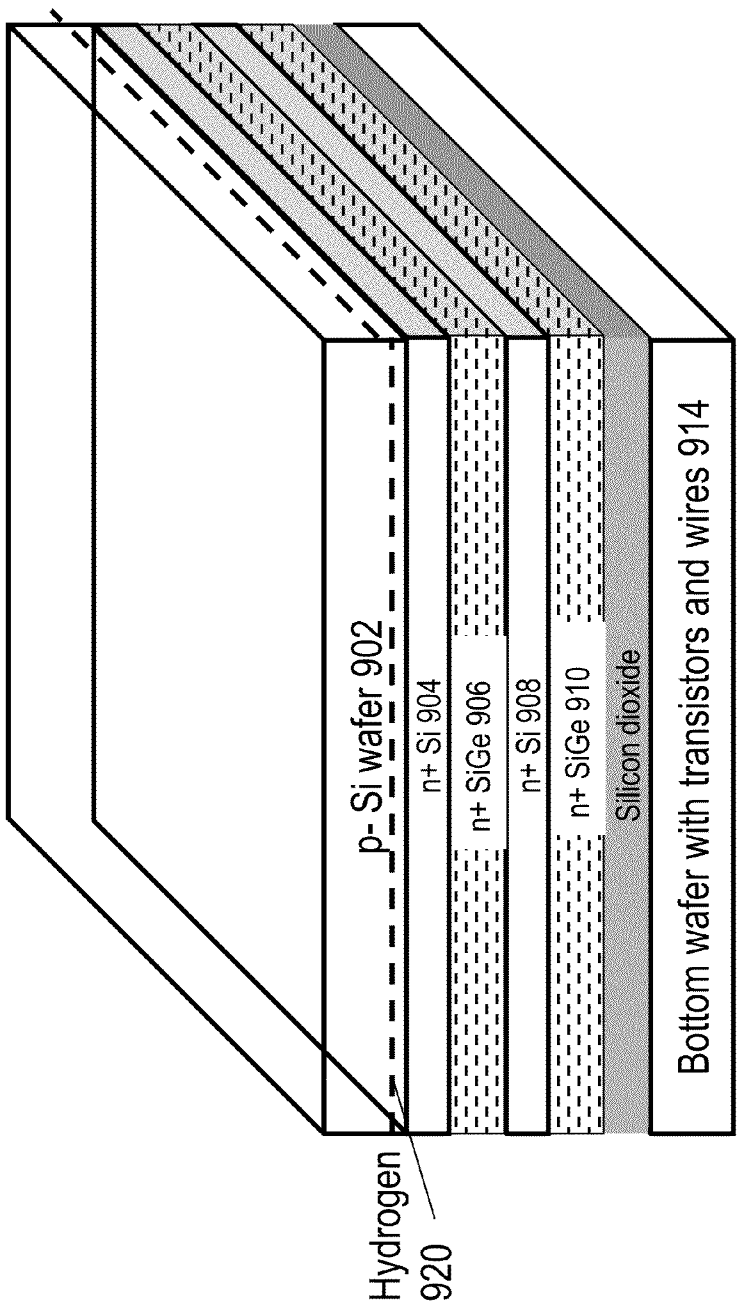

Step (C): The structure after Step (B) is flipped and bonded to another wafer on which bottom layers of transistors and wires 914 are constructed. Bonding occurs with an oxide-to-oxide bonding process. FIG. 9C illustrates the structure after Step (C) is completed.

Figure 9D:
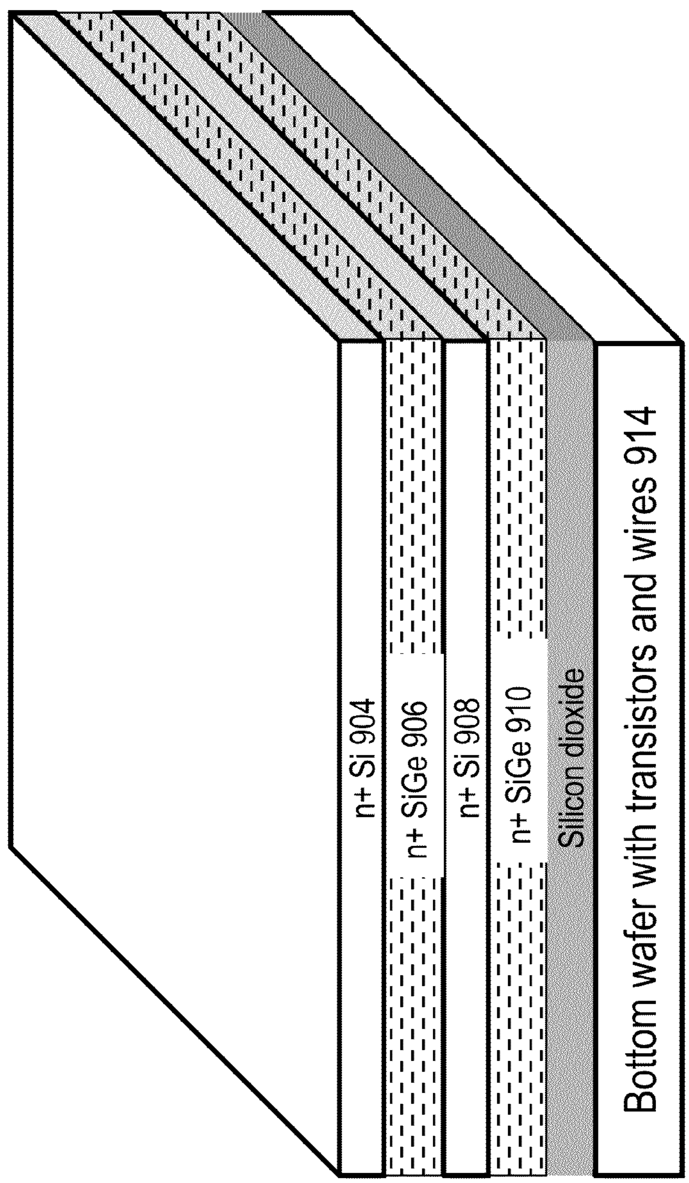

Step (D): A cleave process occurs at the hydrogen plane using a sideways mechanical force. Alternatively, an anneal could be used for cleaving purposes. A CMP process is conducted till one reaches the n+ Si layer 904. FIG. 9D illustrates the structure after Step (D) is completed.

Figure 9E:
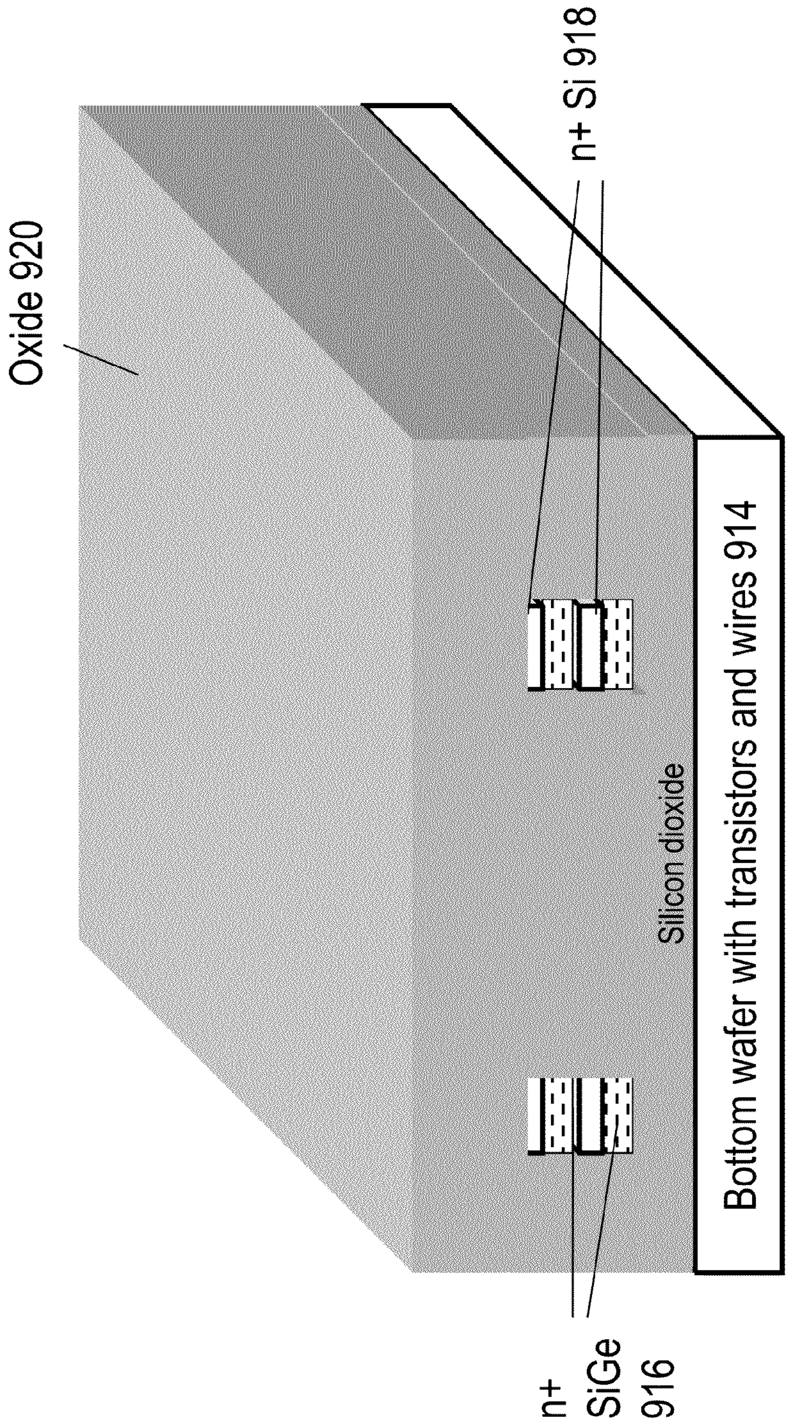

Step (E): Using litho and etch, Si 918 and SiGe 916 regions are defined to be in locations where transistors are required. Oxide 920 is deposited to form isolation regions and to cover the Si/SiGe regions 916 and 918. A CMP process is conducted. FIG. 9E illustrates the structure after Step (E) is completed.

Figure 9F:
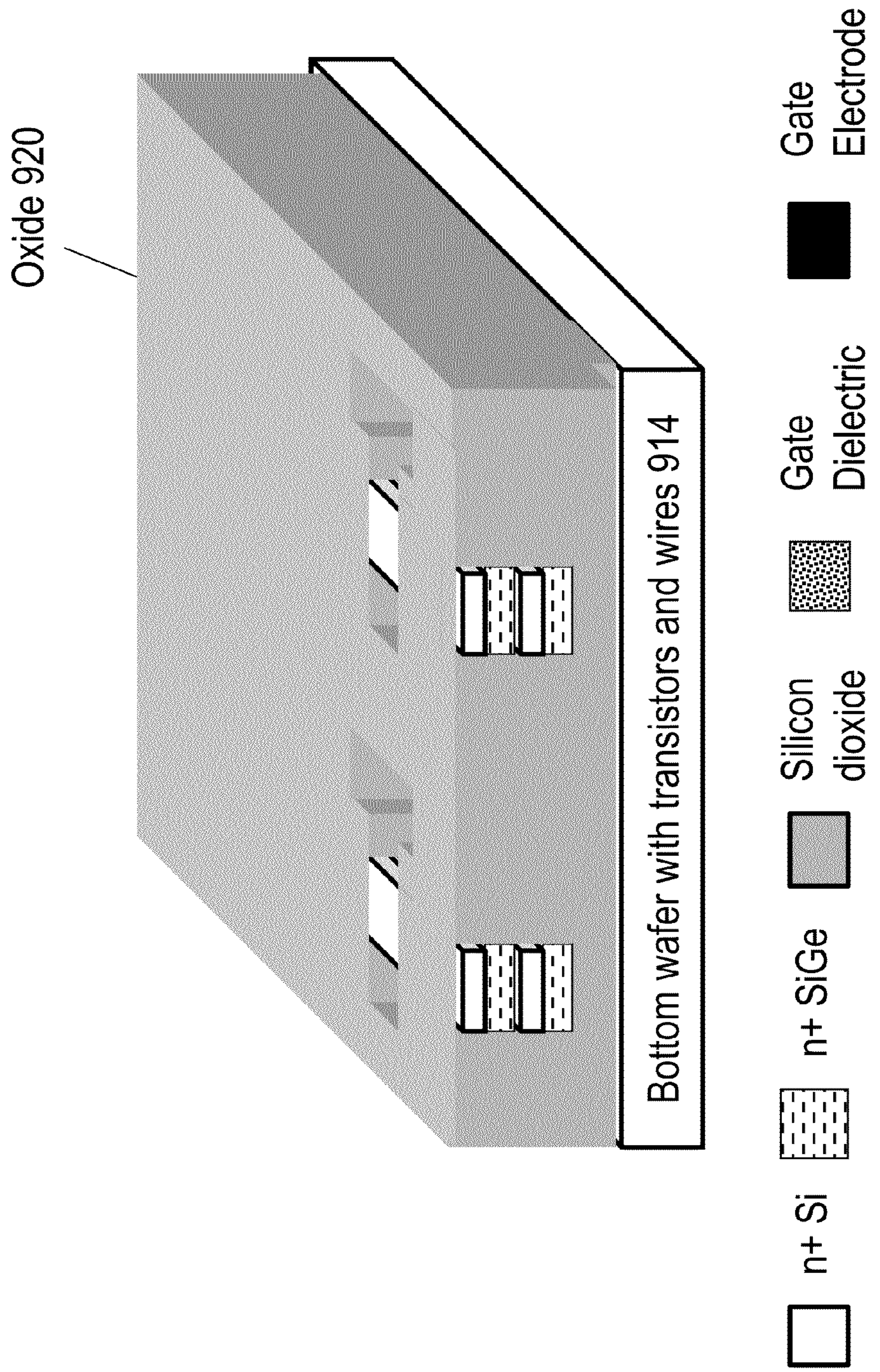

Step (F): Using litho and etch, Oxide regions 920 are removed in locations where a gate needs to be present. It is clear that Si regions 918 and SiGe regions 916 are exposed in the channel region of the MT. FIG. 9F illustrates the structure after Step (F) is completed.

Figure 9G:
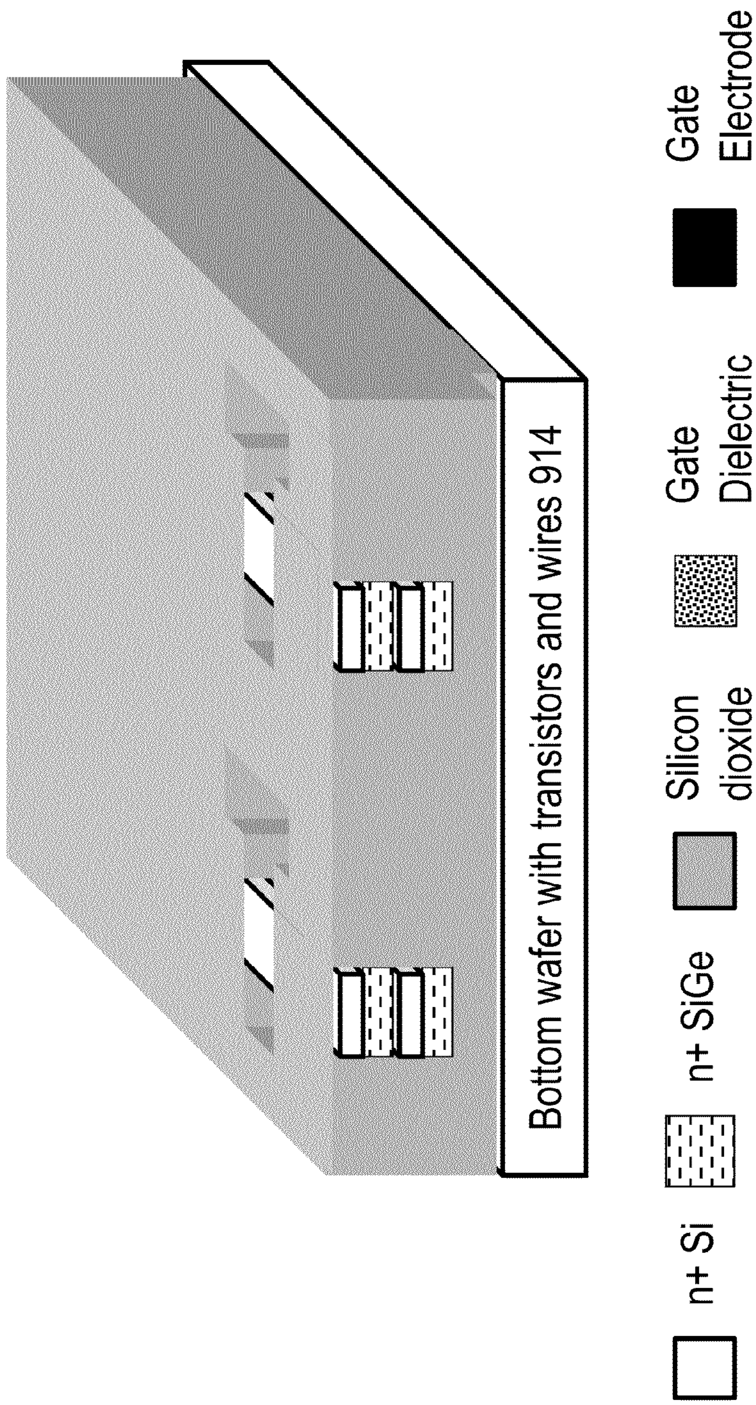

Step (G): SiGe regions 916 in channel of the JLT are etched using an etching recipe that does not attack Si regions 918. Such etching recipes are described in "High performance 5 nm radius twin silicon nanowire MOSFET(TSNWFET): Fabrication on bulk Si wafer, characteristics, and reliability," in *Proc. IEDM Tech. Dig.,* 2005, pp. 717-720 by S. D. Suk, S.-Y. Lee, S.-M. Kim, et al. ("Suk"). FIG. 9G illustrates the structure after Step (G) is completed.

Figure 9H:
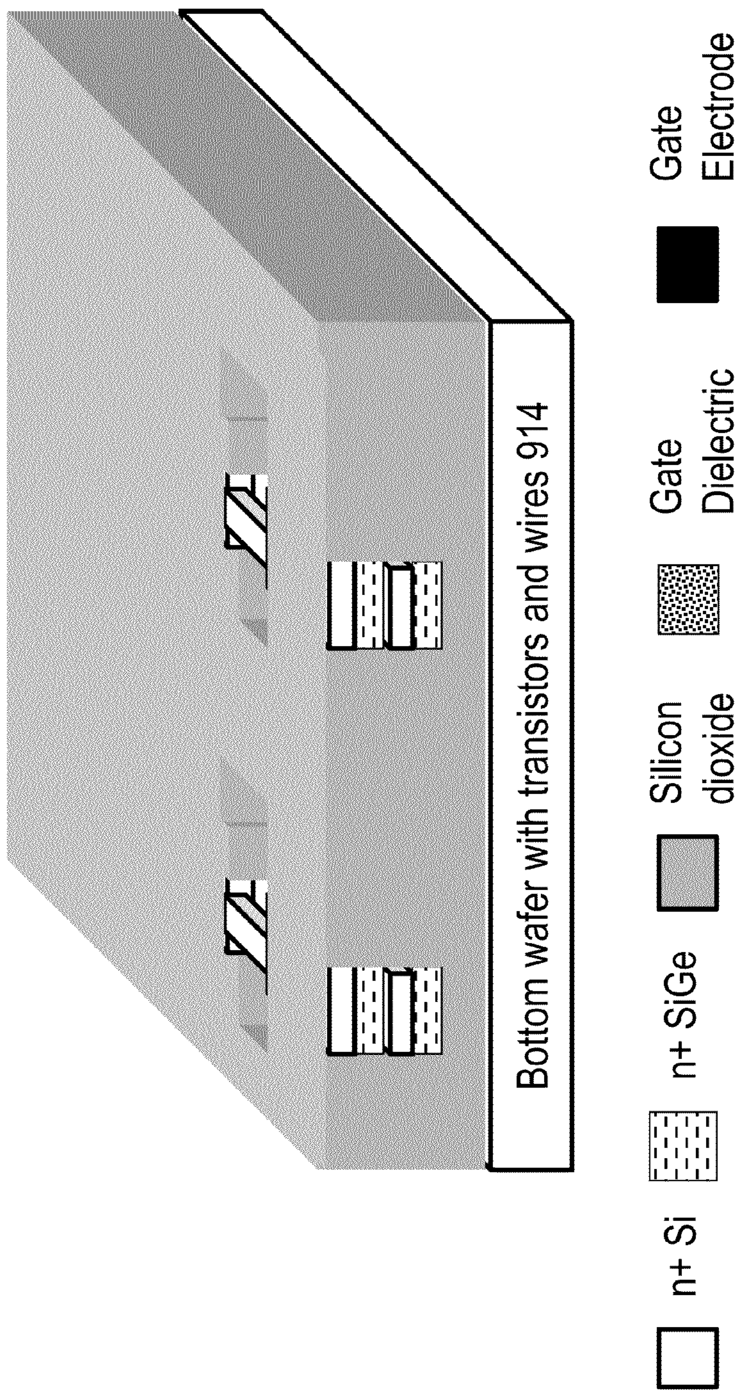

Step (H): This is an optional step where a hydrogen anneal can be utilized to reduce surface roughness of fabricated nanowires. The hydrogen anneal can also reduce thickness of nanowires. Following the hydrogen anneal, another optional step of oxidation (using plasma enhanced thermal oxidation) and etch-back of the produced silicon dioxide can be used. This process thins down the silicon nanowire further. FIG. 9H illustrates the structure after Step (H) is completed.

Step (I): Gate dielectric and gate electrode regions are deposited or grown. Examples of gate dielectrics include hafnium oxide, silicon dioxide, etc. Examples of gate electrodes include polysilicon, TiN, TaN, etc. A CMP is conducted after gate electrode deposition. Following this, rest of the process flow for forming transistors, contacts and wires for the top layer continues.

Figure 9I:
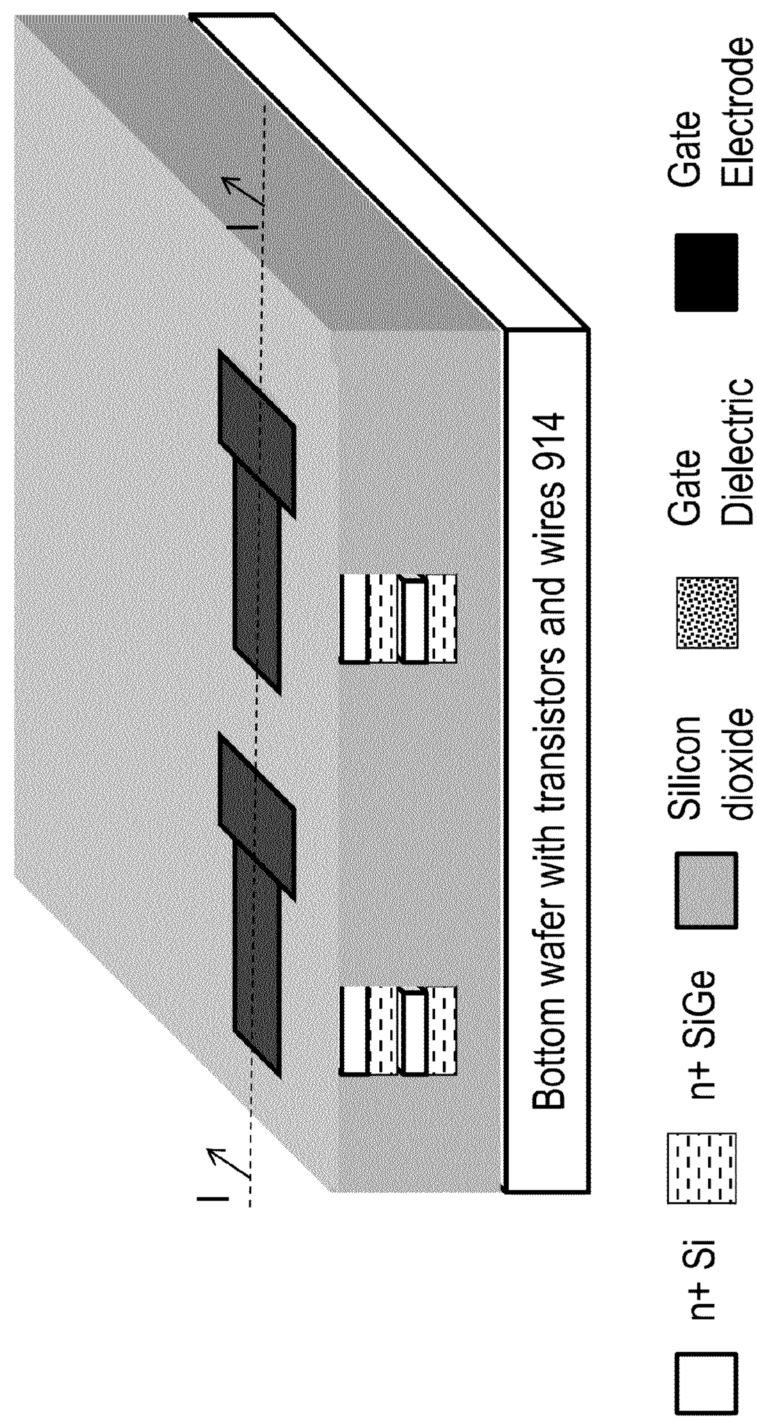

FIG. 9I illustrates the structure after Step (I) is completed.

Figure 9J:
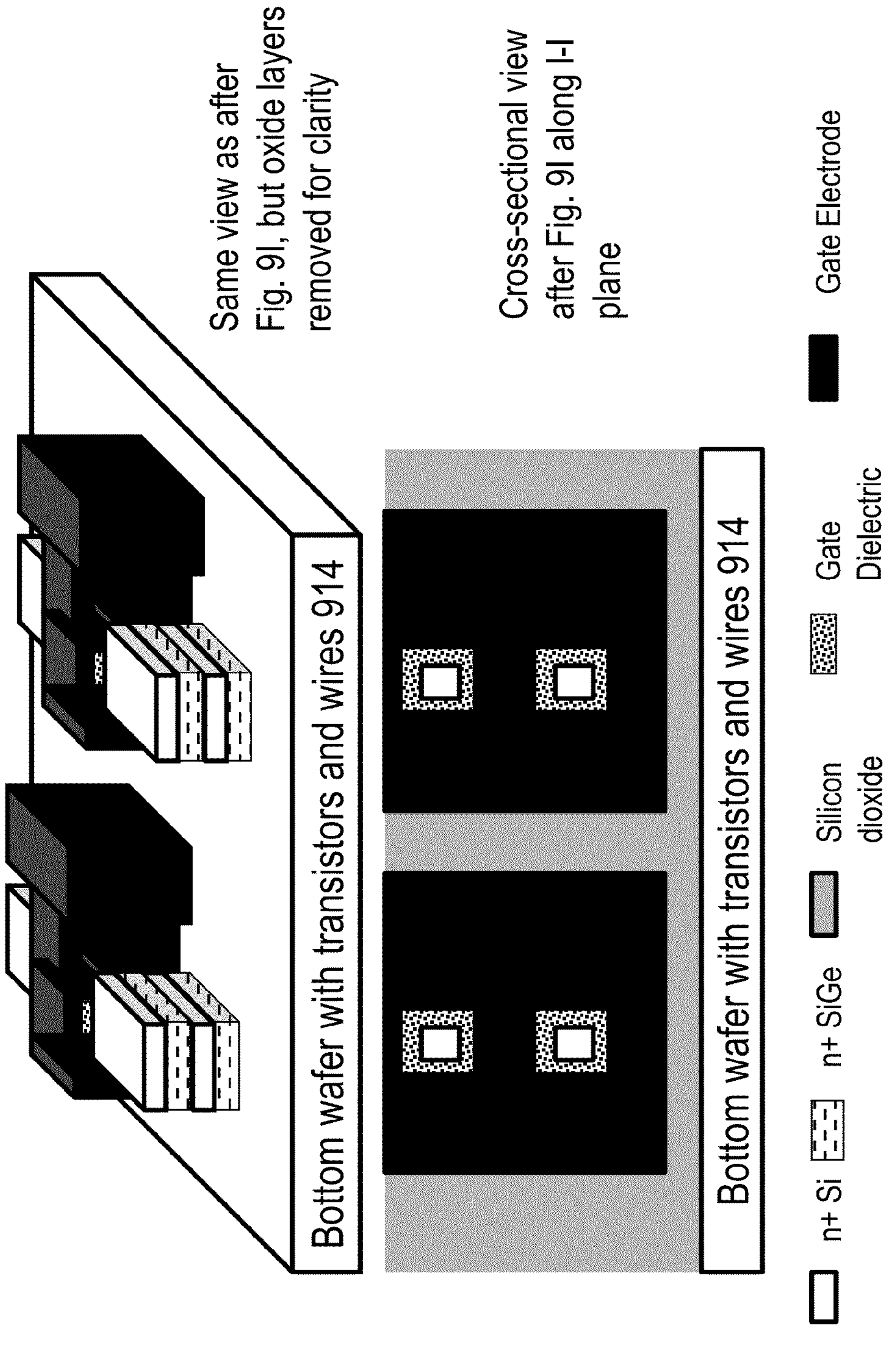

FIG. 9J shows a cross-sectional view of structures after Step (I). It is clear that two nanowires are present for each transistor in the figure. It is possible to have one nanowire per transistor or more than two nanowires per transistor by changing the number of stacked Si/SiGe layers. Note that top-level transistors are formed well-aligned to bottom-level wiring and transistor layers. Since the top-level transistor layers are very thin (preferably less than 200 nm), the top transistors can be aligned to features in the bottom-level. While the process flow shown in FIG. 9A-J gives the key steps involved in forming a four-side gated JLT with 3D stacked components, it is conceivable to one skilled in the art that changes to the process can be made. For example, process steps and additional materials/regions to add strain to junctionless transistors can be added. Furthermore, more than two layers of chips or circuits can be 3D stacked. Also, there are many methods to construct silicon nanowire transistors and these are described in "High performance and highly uniform gate-all-around silicon nanowire MOSFETs with wire size dependent scaling," *Electron Devices Meeting* (*IEDM*), 2009 *IEEE International*, vol., no., pp. 1-4, 7-9 Dec. 2009 by Bangsaruntip, S.; Cohen, G. M.; Majumdar, A.; et al. ("Bangsaruntip") and in "High performance 5 nm radius twin silicon nanowire MOSFET(TSNWFET): Fabrication on bulk Si wafer, characteristics, and reliability," in *Proc. IEDM Tech. Dig.,* 2005, pp. 717-720 by S. D. Suk, S.-Y. Lee, S.-M. Kim, et al. ("Suk"). Contents of these publications are incorporated herein by reference. Techniques described in these publications can be utilized for fabricating four-side gated JLTs without junctions as well.

FIG. 9K-V describes an alternative process flow for forming four-side gated JLTs in 3D stacked circuits and chips. It may include several steps as described in the following sequence.

Figure 9K:
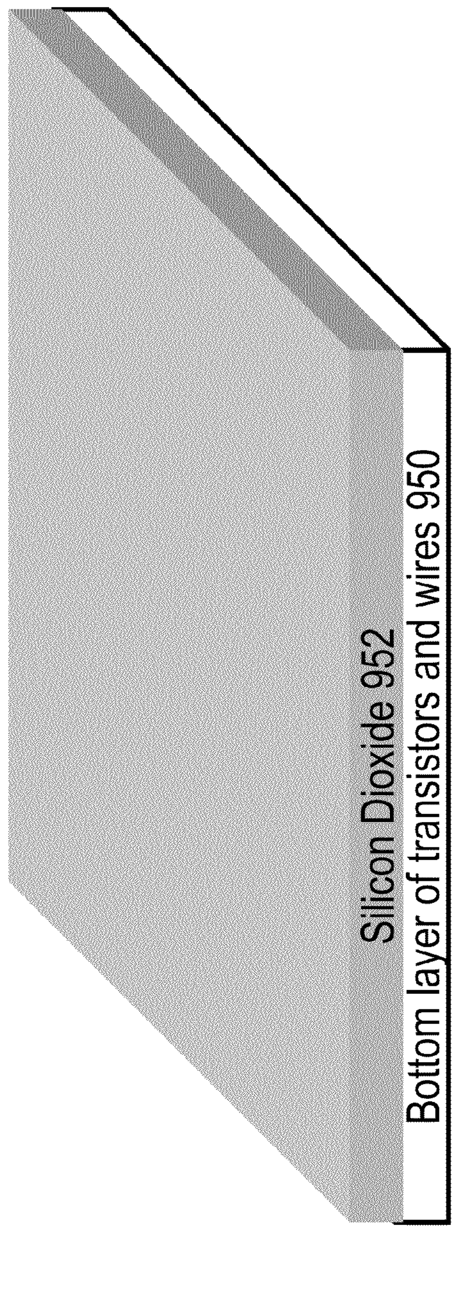

Step (A): The bottom layer of the 2 chip 3D stack is processed with transistors and wires. This is indicated in the figure as bottom layer of transistors and wires 950. Above this, a silicon dioxide layer 952 is deposited. FIG. 9K illustrates the structure after Step (A) is completed.

Figure 9L:
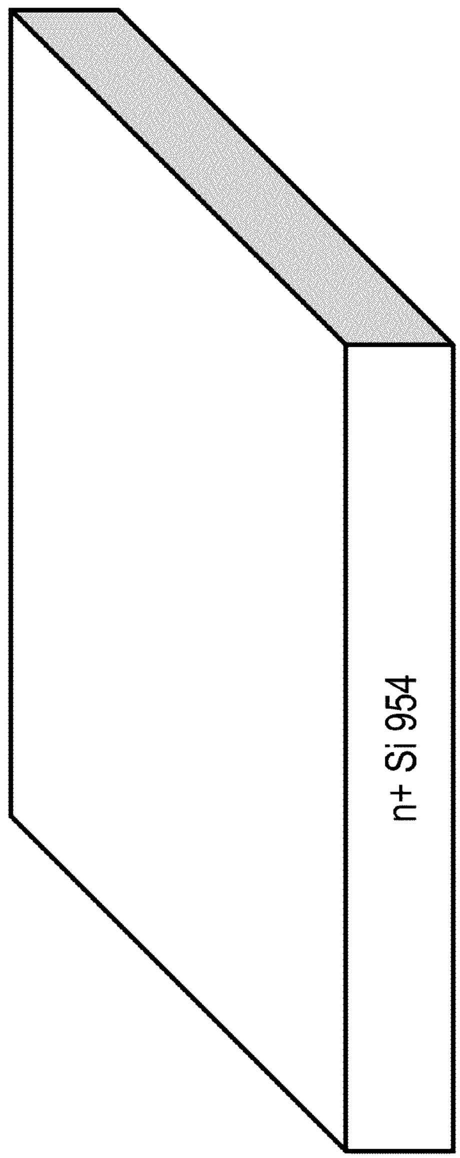

Step (B): A n+ Si wafer 954 that has its dopants activated is now taken. Alternatively, a p− Si wafer that has n+ dopants implanted and activated can be used. FIG. 9L shows the structure after Step (B) is completed.

Figure 9M:
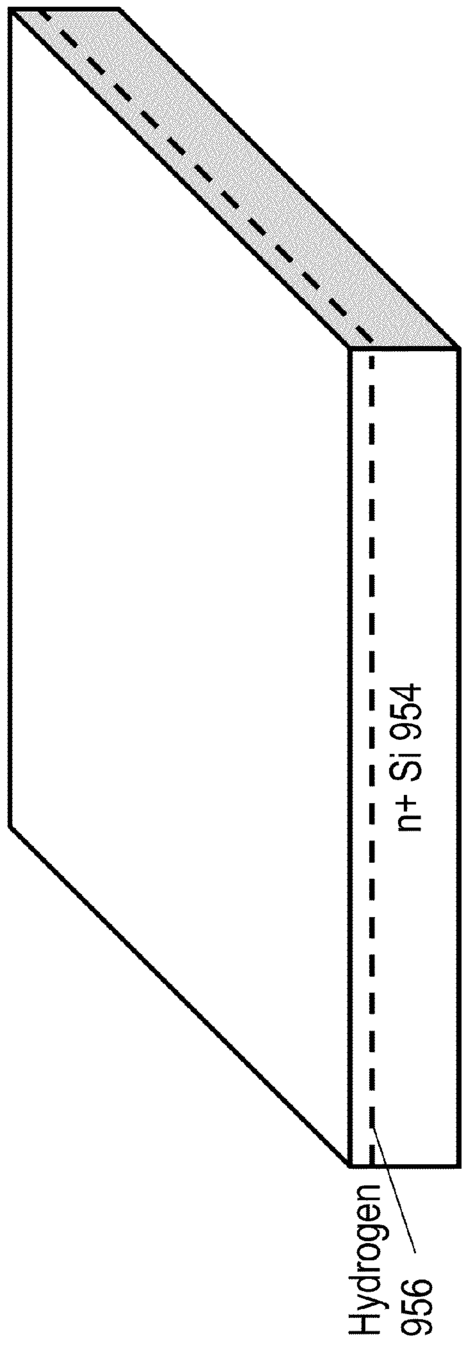

Step (C): Hydrogen ions are implanted into the n+ Si wafer 954 at a certain depth. FIG. 9M shows the structure after Step (C) is completed. The plane of hydrogen ions is indicated as Hydrogen 954.

Figure 9N:
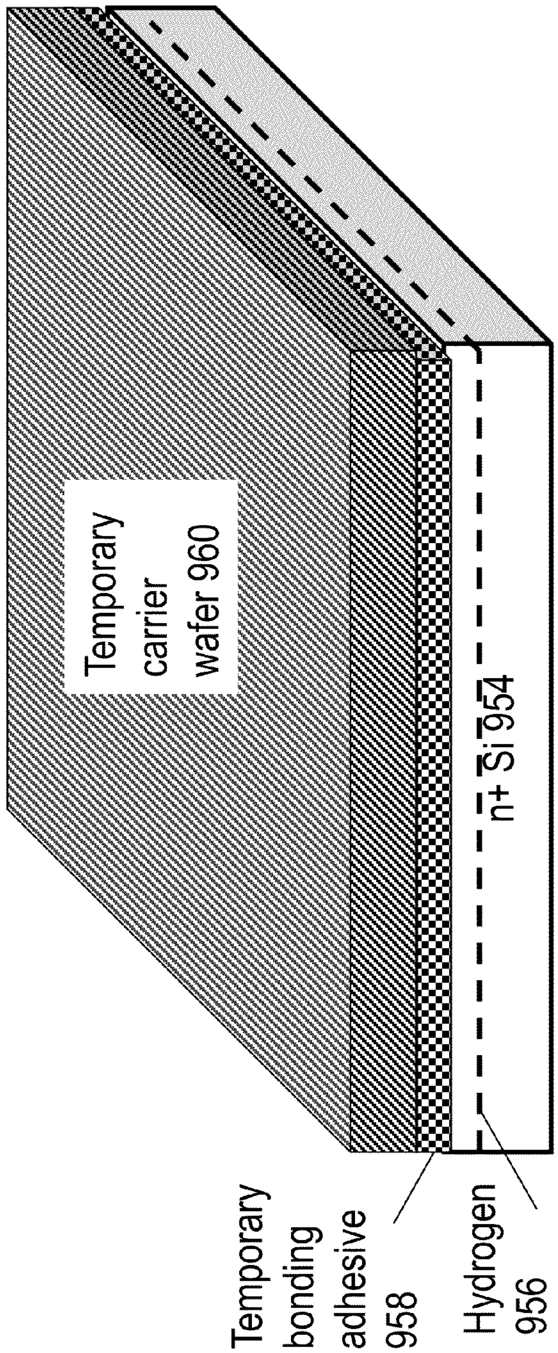

Step (D): The wafer after step (C) is bonded to a temporary carrier wafer 960 using a temporary bonding adhesive 958. This temporary carrier wafer 960 could be constructed of glass. Alternatively, it could be constructed of silicon. The temporary bonding adhesive 958 could be a polymer material, such as a polyimide. FIG. 9N illustrates the structure after Step (D) is completed.

Figure 9O:
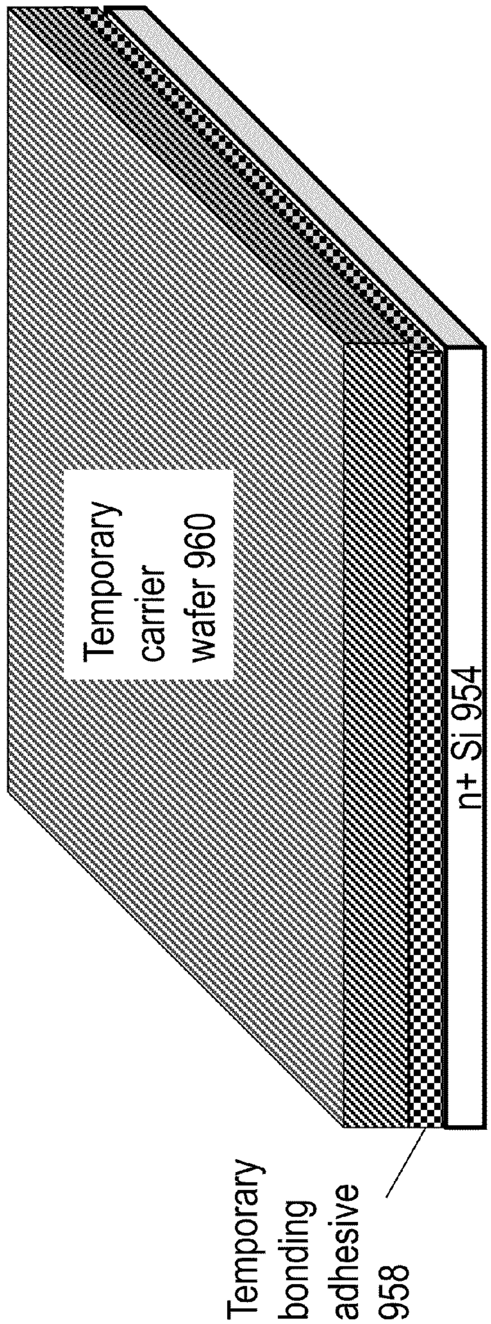

Step (E): A anneal or a sideways mechanical force is utilized to cleave the wafer at the hydrogen plane 954. A CMP process is then conducted. FIG. 9O shows the structure after Step (E) is completed.

Figure 9P:
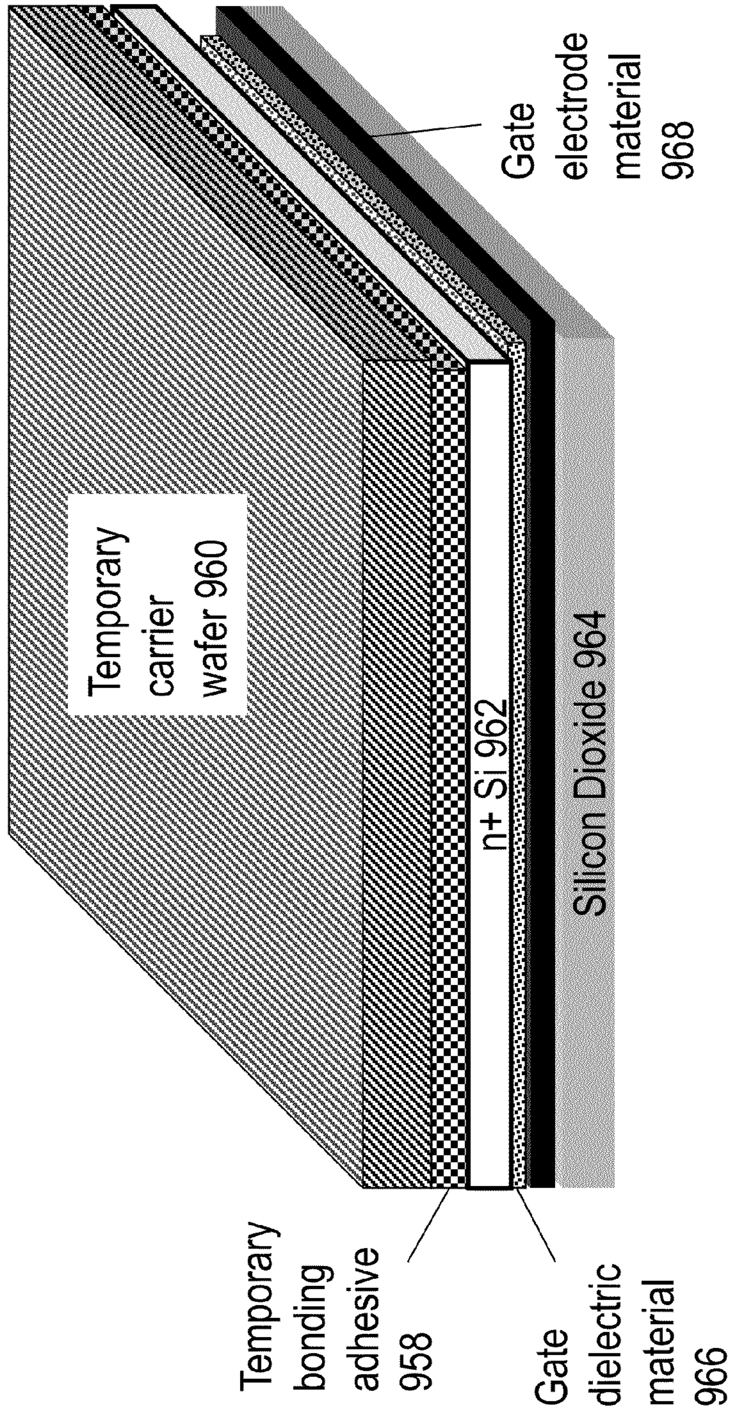

Step (F): Layers of gate dielectric material 966, gate electrode material 968 and silicon oxide 964 are deposited onto the bottom of the wafer shown in Step (E). FIG. 9P illustrates the structure after Step (F) is completed.

Figure 9Q:
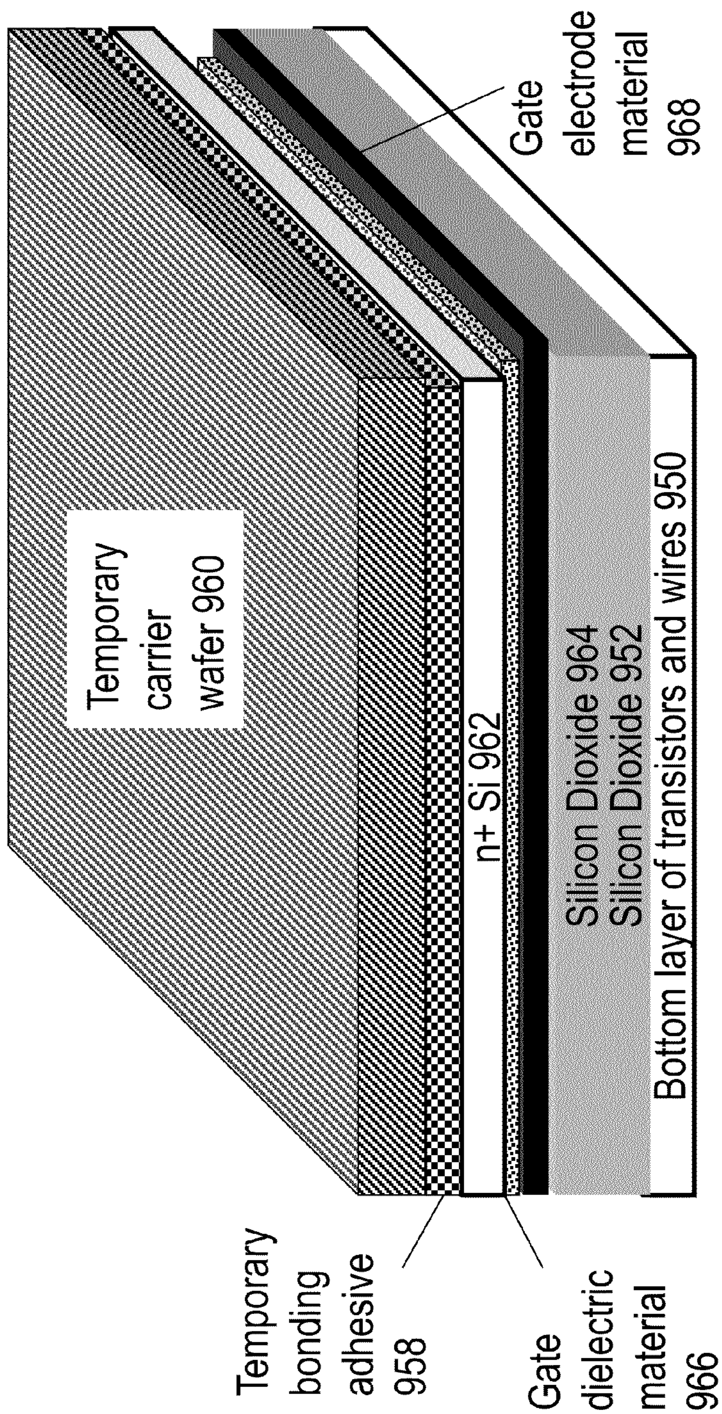

Step (G): The wafer is then bonded to the bottom layer of wires and transistors 950 using oxide-to-oxide bonding. FIG. 9Q illustrates the structure after Step (G) is completed.

Figure 9R:
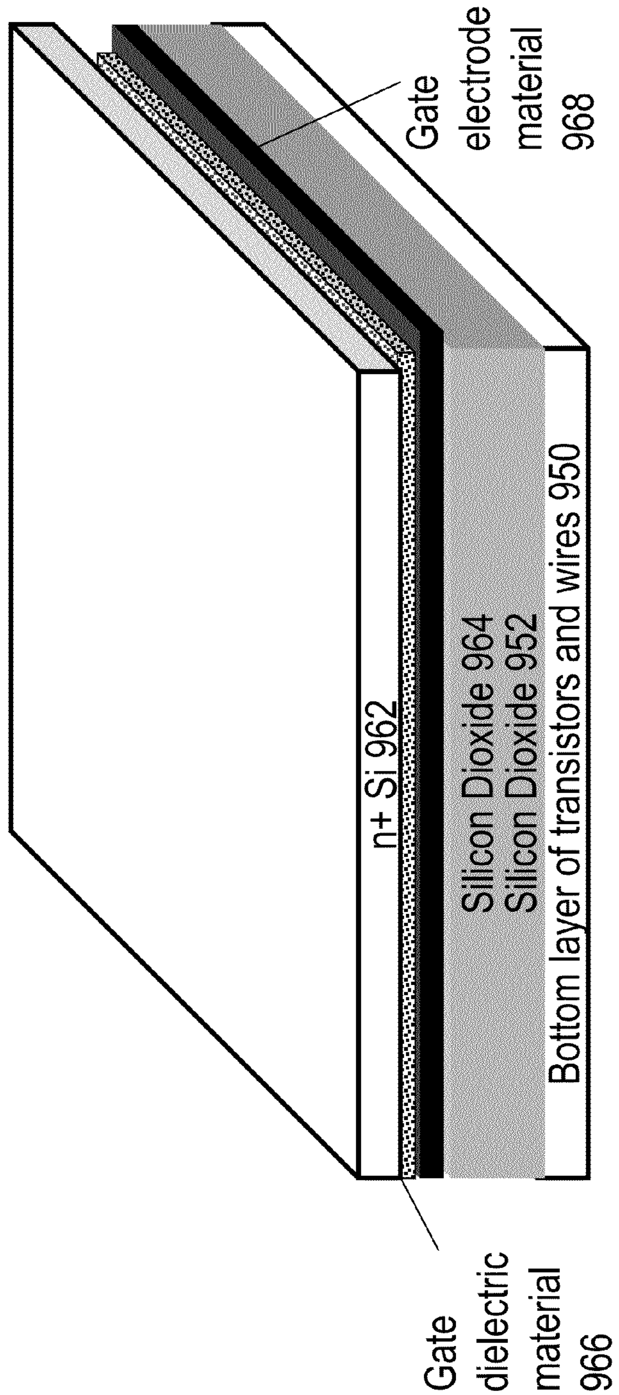

Step (H): The temporary carrier wafer 960 is then removed by shining a laser onto the temporary bonding adhesive 958 through the temporary carrier wafer 960 (which could be constructed of glass). Alternatively, an anneal could be used to remove the temporary bonding adhesive 958. FIG. 9R illustrates the structure after Step (H) is completed.

Figure 9S:
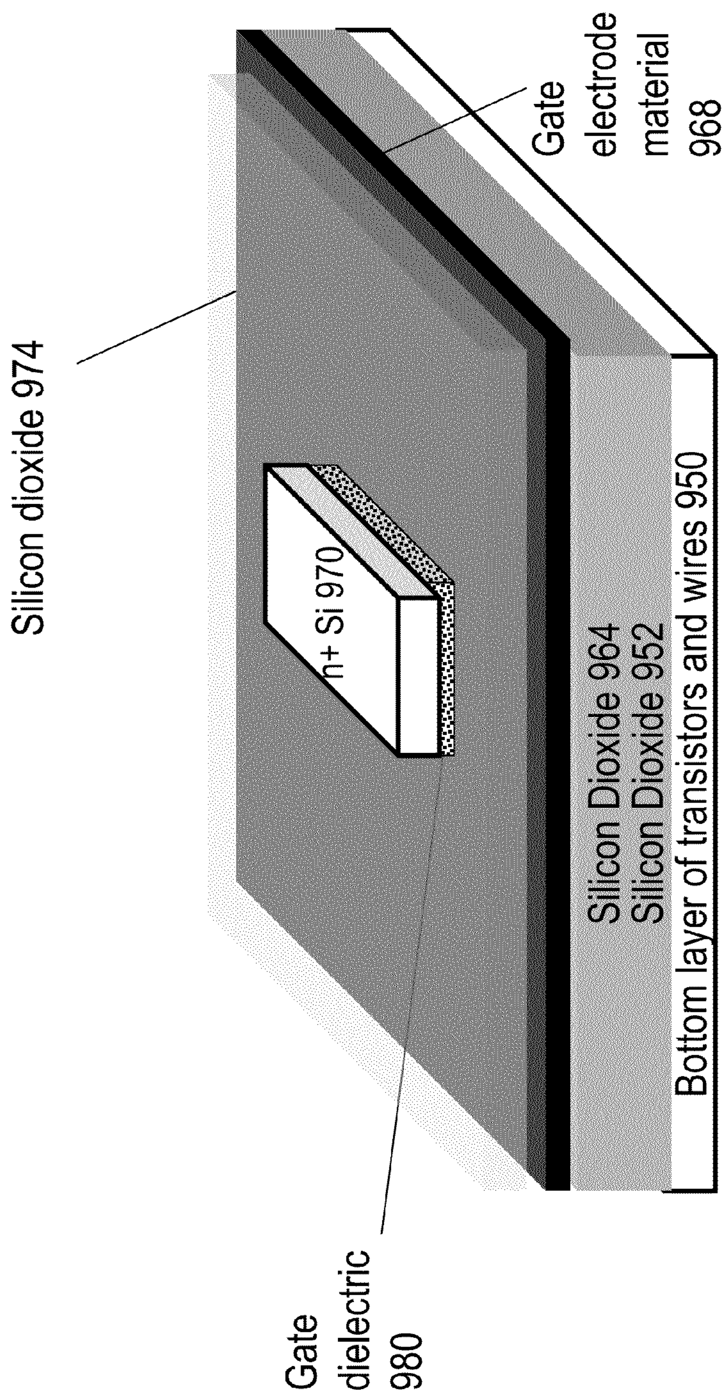

Step (I): The layer of n+ Si 962 and gate dielectric material 966 are patterned and etched using a lithography and etch step. FIG. 9S illustrates the structure after this step. The patterned layer of n+ Si 970 and the patterned gate dielectric for the back gate (gate dielectric 980) are shown. Oxide is deposited and polished by CMP to planarize the surface and form a region of silicon dioxide 974.

Figure 9T:
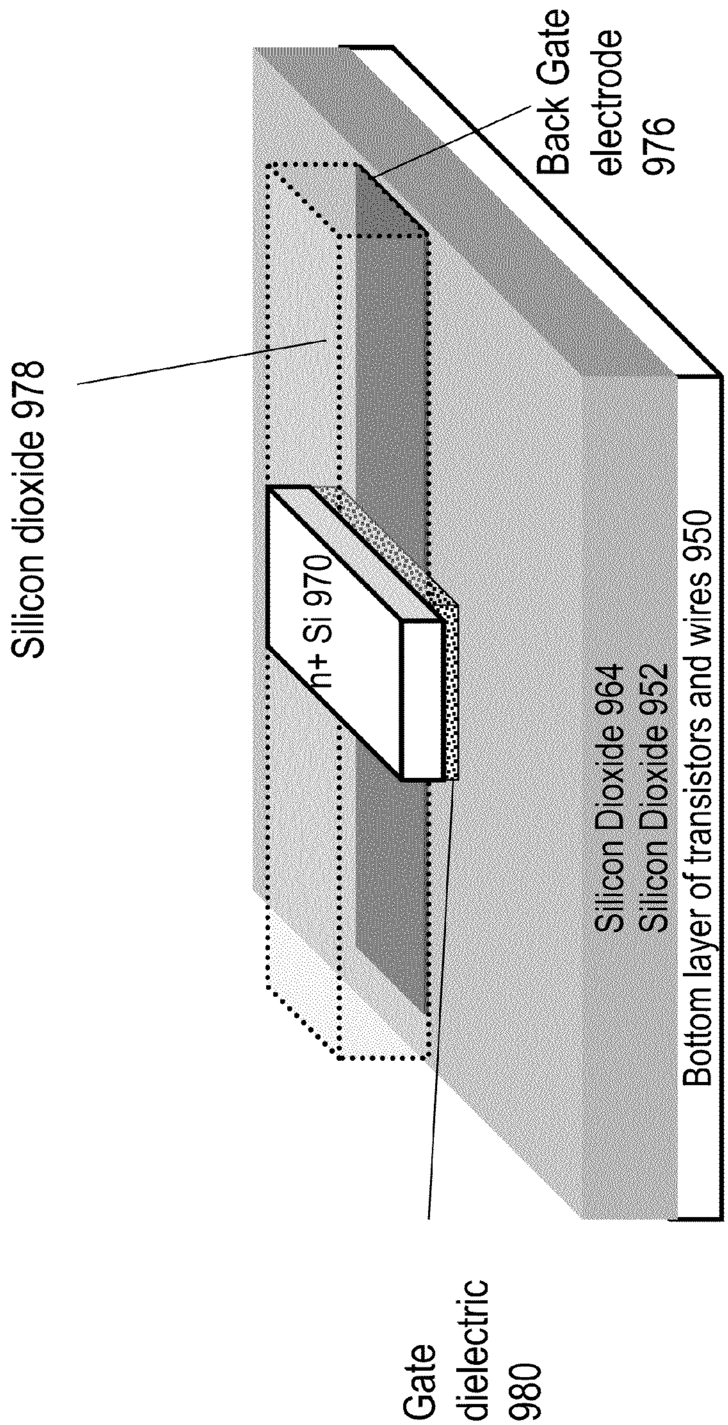

Step (J): The oxide layer 974 and gate electrode material 968 are patterned and etched to form a region of silicon dioxide 978 and back gate electrode 976. FIG. 9T illustrates the structure after this step.

Figure 9U:
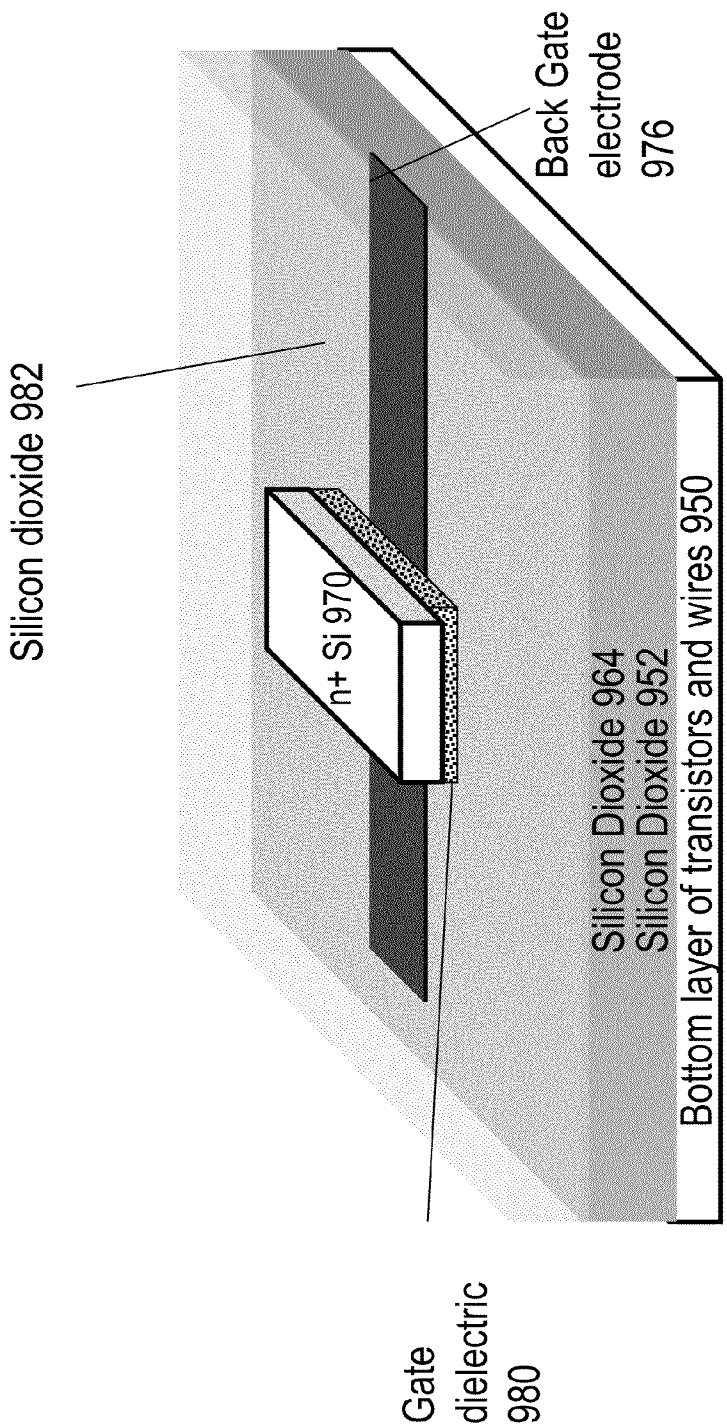

Step (K): A silicon dioxide layer is deposited. The surface is then planarized with CMP to form the region of silicon dioxide 982. FIG. 9U illustrates the structure after this step.

Figure 9V:
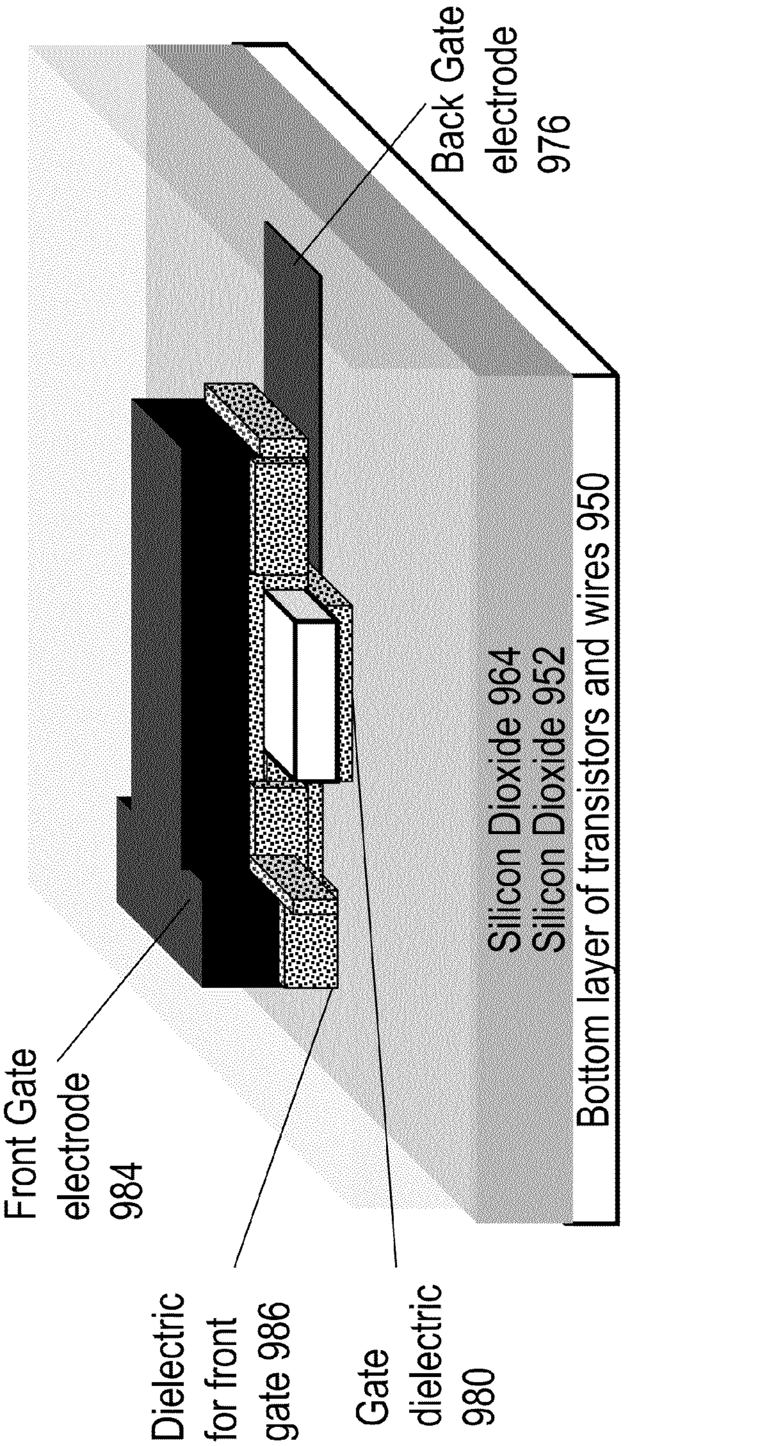

Step (L): Trenches are etched in the region of silicon dioxide 982. A thin layer of gate dielectric and a thicker layer of gate electrode are then deposited and planarized. Following this, a lithography and etch step are performed to etch the gate dielectric and gate electrode. FIG. 9V illustrates the structure after these steps. The device structure after these process steps may include a front gate electrode 984 and a dielectric for the front gate 986. Contacts can be made to the front gate electrode 984 and back gate electrode 976 after oxide deposition and planarization. Note that top-level transistors are formed well-aligned to bottom-level wiring and transistor layers. While the process flow shown in FIG. 9K-V shows several steps involved in forming a four-side gated JLT with 3D stacked components, it is conceivable to one skilled in the art that changes to the process can be made. For example, process steps and additional materials/regions to add strain to junction-less transistors can be added.

All the types of embodiments of this invention described in Section 1.1 utilize single crystal silicon or monocrystalline silicon transistors. Thicknesses of layer transferred regions of silicon are <2 um, and many times can be <1 um or <0.4 um or even <0.2 um. Interconnect (wiring) layers are preferably constructed substantially of copper or aluminum or some other high conductivity material.

Section 1.2: Recessed Channel Transistors as a Building Block for 3D Stacked Circuits and Chips Another method to solve the issue of high-temperature source-drain junction processing is an innovative use of recessed channel inversion-mode transistors as a building block for 3D stacked semiconductor circuits and chips. The transistor structures described in this section can be considered horizontally-oriented transistors where current flow occurs between horizontally-oriented source and drain regions. The term planar transistor can also be used for the same in this document. The recessed channel transistors in this section are defined by a process including a step of etch to form the transistor channel. 3D stacked semiconductor circuits and chips using recessed channel transistors preferably have interconnect (wiring) layers including copper or aluminum or a material with higher conductivity.

Figure 10A:
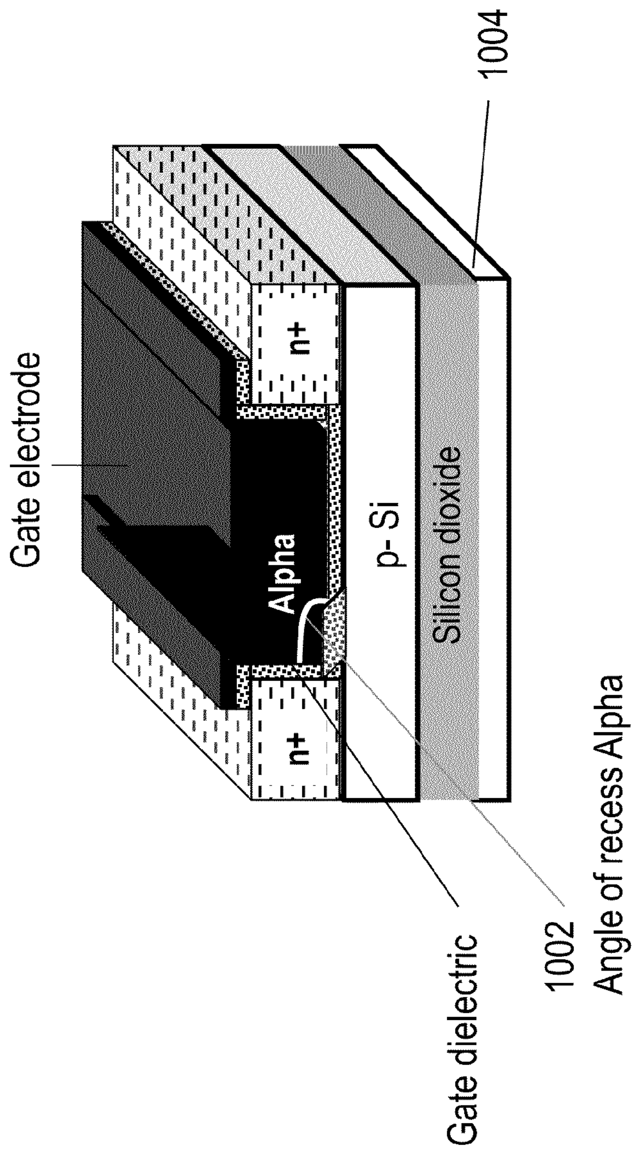
FIG. 10A-D show types of recessed channel transistors.
Figure 10B:
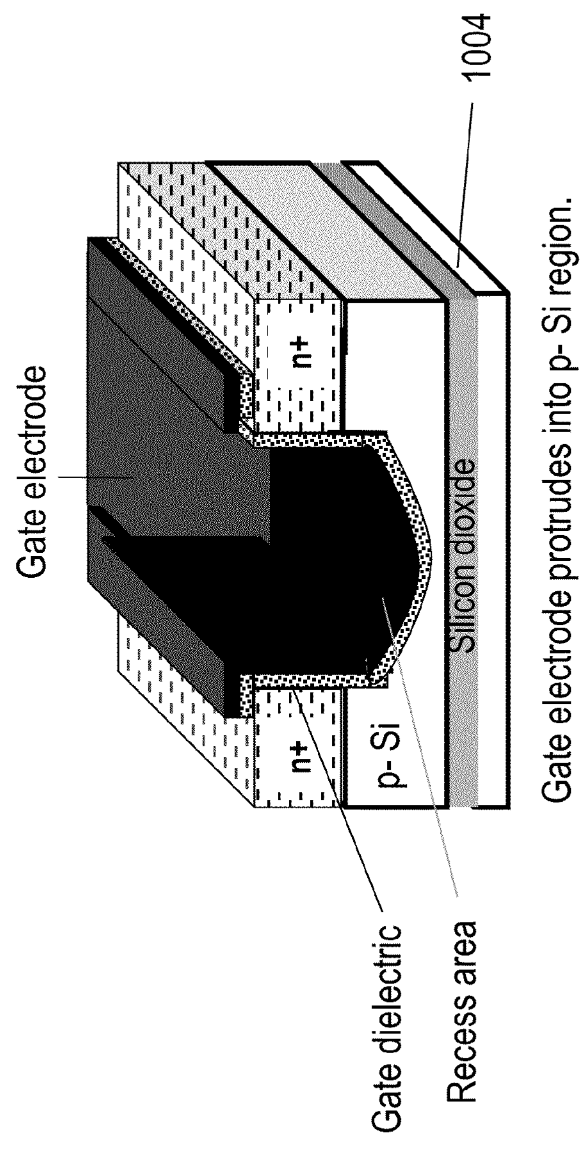
Figure 10C:
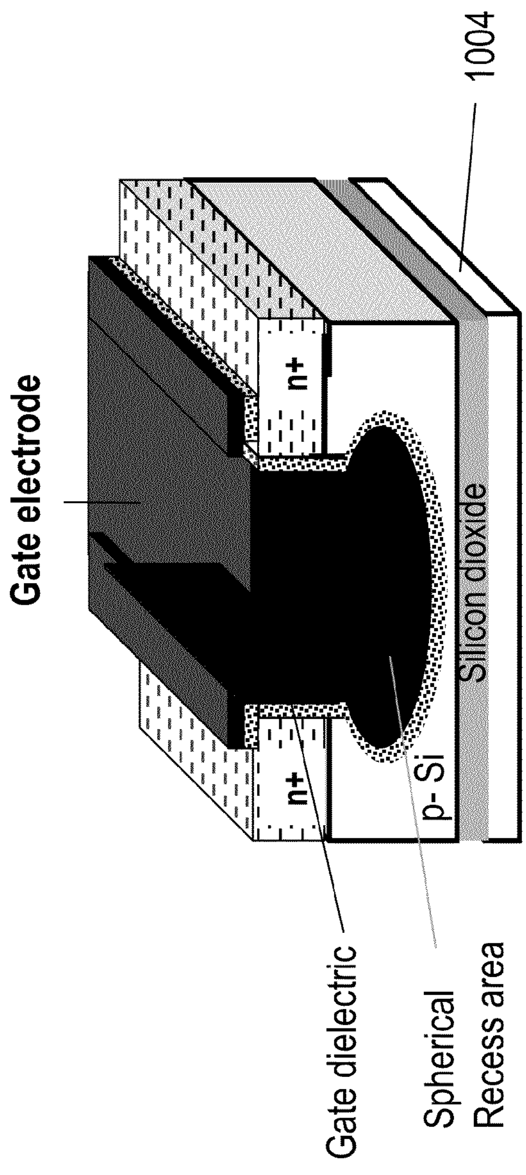
Figure 10D:
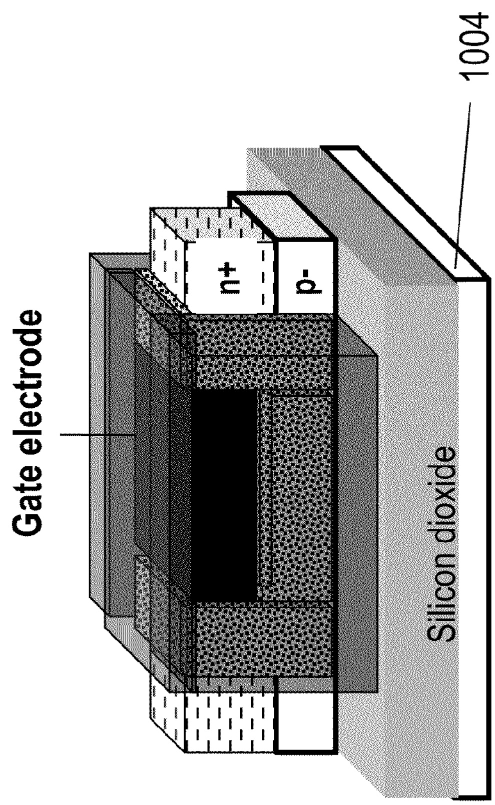

FIG. 10A-D shows different types of recessed channel inversion-mode transistors constructed atop a bottom layer of transistors and wires 1004. FIG. 10A depicts a standard recessed channel transistor where the recess is made up to the p− region. The angle of the recess, Alpha 1002, can be anywhere in between 90° and 180°. A standard recessed channel transistor where angle Alpha>90° can also be referred to as a V-shape transistor or V-groove transistor. FIG. 10B depicts a RCAT (Recessed Channel Array Transistor) where part of the p− region is consumed by the recess. FIG. 10C depicts a S-RCAT (Spherical RCAT) where the recess in the p− region is spherical in shape. FIG. 10D depicts a recessed channel Finfet.

Figure 11A:
FIG. 11A-F shows a procedure for layer transfer of silicon regions needed for recessed channel transistors.

FIG. 11A-F shows a procedure for layer transfer of silicon regions required for recessed channel transistors. Silicon regions that are layer transferred are <2 um in thickness, and can be thinner than 1 um or even 0.4 um. The process flow in FIG. 11A-F may include several steps as described in the following sequence:

Step (A): A silicon dioxide layer 1104 is deposited above the generic bottom layer 1102. FIG. 11A illustrates the structure after Step (A).

Figure 11B:
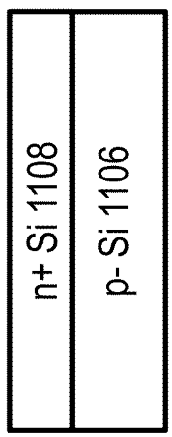

Step (B): A wafer of p−Si 1106 is implanted with n+ near its surface to form a layer of n+ Si 1108. FIG. 11B illustrates the structure after Step (B).

Figure 11C:
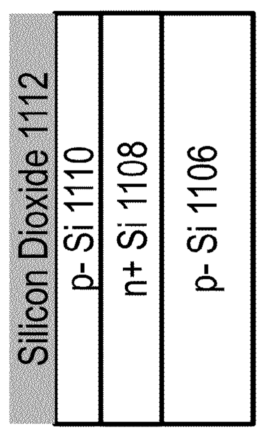

Step (C): A layer of p− Si 1110 is epitaxially grown atop the layer of n+ Si 1108. A layer of silicon dioxide 1112 is deposited atop the layer of p− Si 1110. An anneal (such as a rapid thermal anneal RTA or spike anneal or laser anneal) is conducted to activate dopants. Note that the terms laser anneal and optical anneal are used interchangeably in this document. FIG. 11C illustrates the structure after Step (C). Alternatively, the n+ Si layer 1108 and p− Si layer 1110 can be formed by a buried layer implant of n+ Si in the p− Si wafer 1106.

Figure 11D:
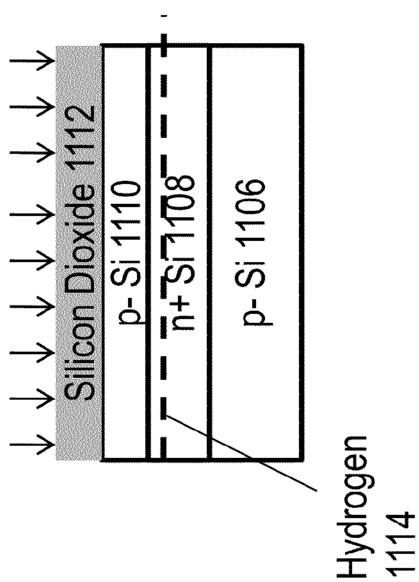

Step (D): Hydrogen H+ is implanted into the n+ Si layer 1108 at a certain depth 1114. Alternatively, another atomic species such as helium can be implanted. FIG. 11D illustrates the structure after Step (D).

Figure 11E:
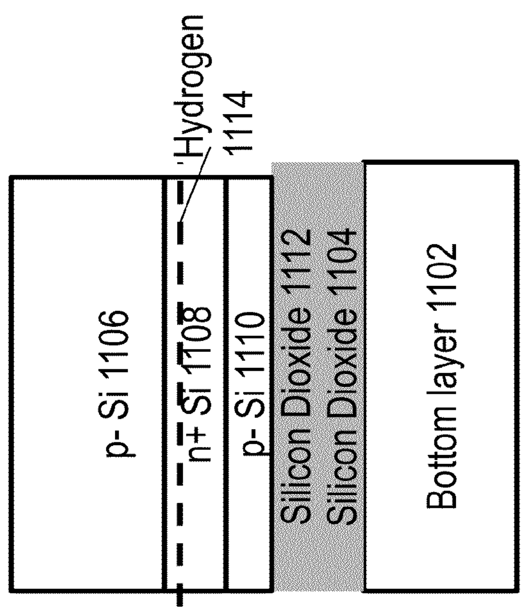

Step (E): The top layer wafer shown after Step (D) is flipped and bonded atop the bottom layer wafer using oxide-to-oxide bonding. FIG. 11E illustrates the structure after Step (E).

Figure 11F:
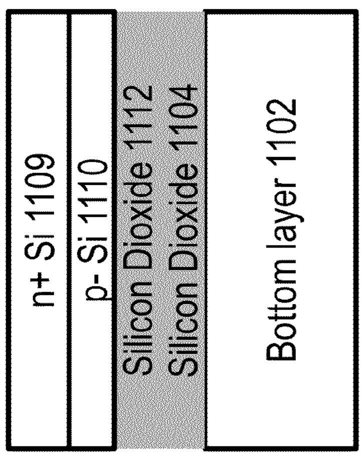

Step (F): A cleave operation is performed at the hydrogen plane 1114 using an anneal. Alternatively, a sideways mechanical force may be used. Following this, a Chemical-Mechanical-Polish (CMP) is done. It should be noted that the layer-transfer including the bonding and the cleaving could be done without exceeding 400° C. This is the case in various alternatives of this invention. FIG. 11F illustrates the structure after Step (F).

Figure 12A:
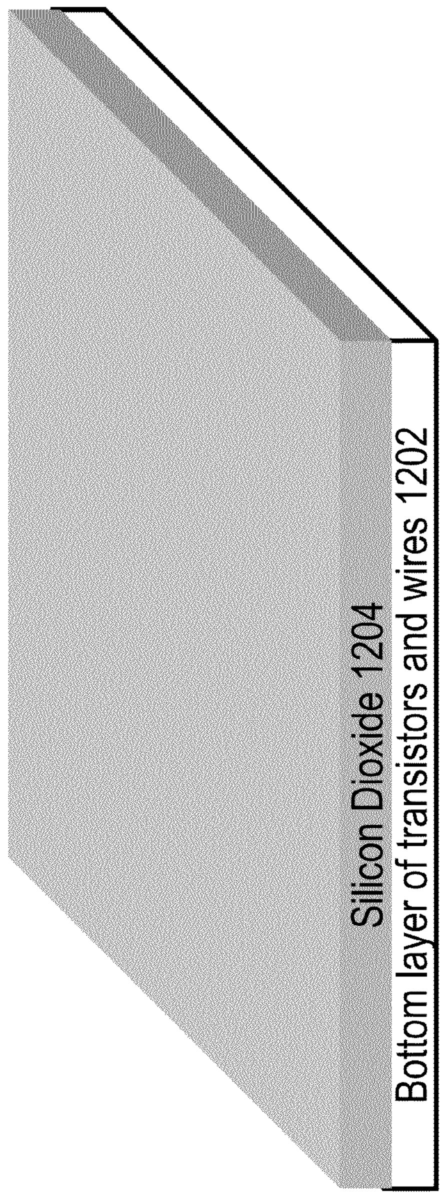
FIG. 12A-F show a process flow for constructing 3D stacked logic chips using standard recessed channel transistors.

FIG. 12A-F describes a process flow for forming 3D stacked circuits and chips using standard recessed channel inversion-mode transistors. The process flow in FIG. 12A-F may include several steps as described in the following sequence:

Step (A): The bottom layer of the 2 chip 3D stack is processed with transistors and wires. This is indicated in the figure as bottom layer of transistors and wires 1202. Above this, a silicon dioxide layer 1204 is deposited. FIG. 12A illustrates the structure after Step (A).

Figure 12B:
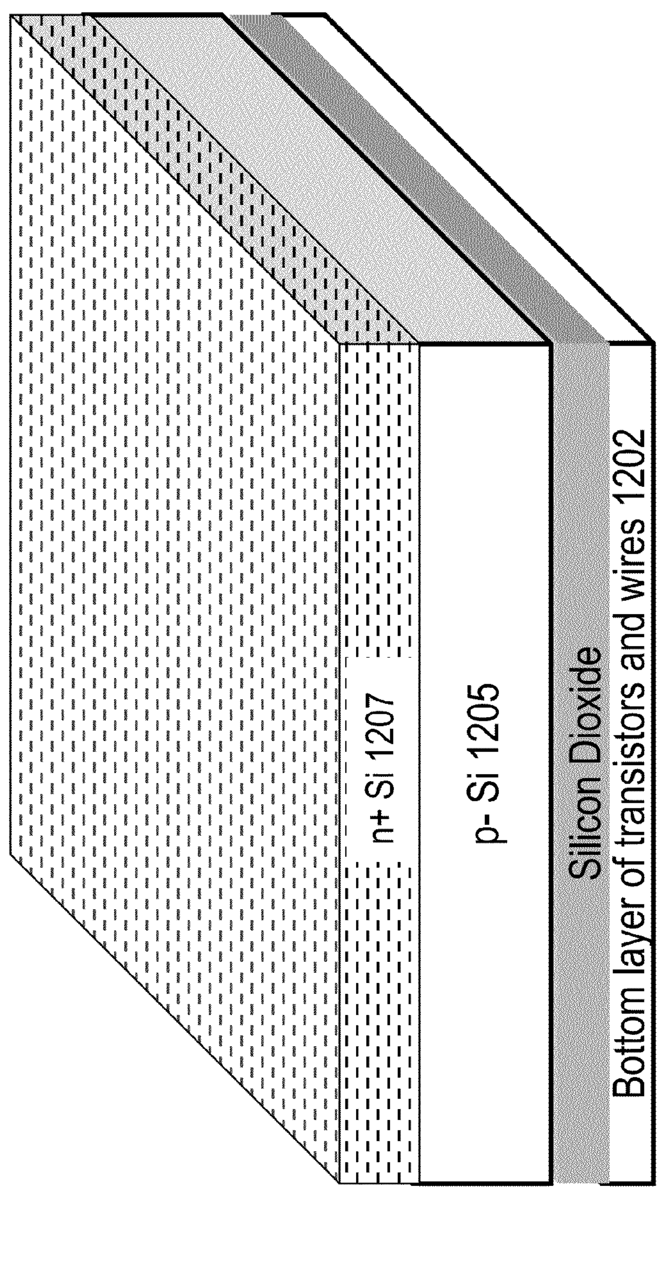

Step (B): Using the procedure shown in FIG. 11A-F, a p− Si layer 1205 and n+ Si layer 1207 are transferred atop the structure shown after Step (A). FIG. 12B illustrates the structure after Step (B).

Figure 12C:
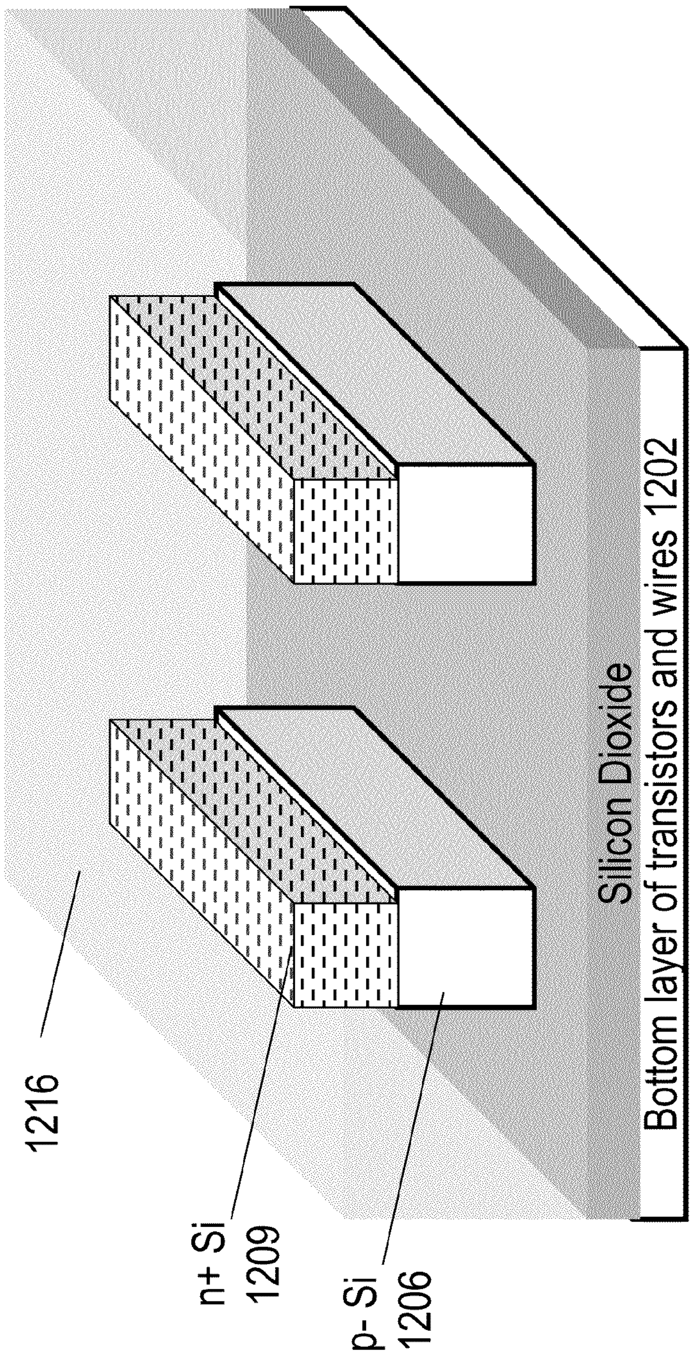

Step (C): The stack shown after Step (A) is patterned lithographically and etched such that silicon regions are present only in regions where transistors are to be formed. Using a standard shallow trench isolation (STI) process, isolation regions in between transistor regions are formed. These oxide regions are indicated as 1216. FIG. 12C illustrates the structure after Step (C). Regions of n+ Si 1209 and p− Si 1206 are left after this step.

Figure 12D:
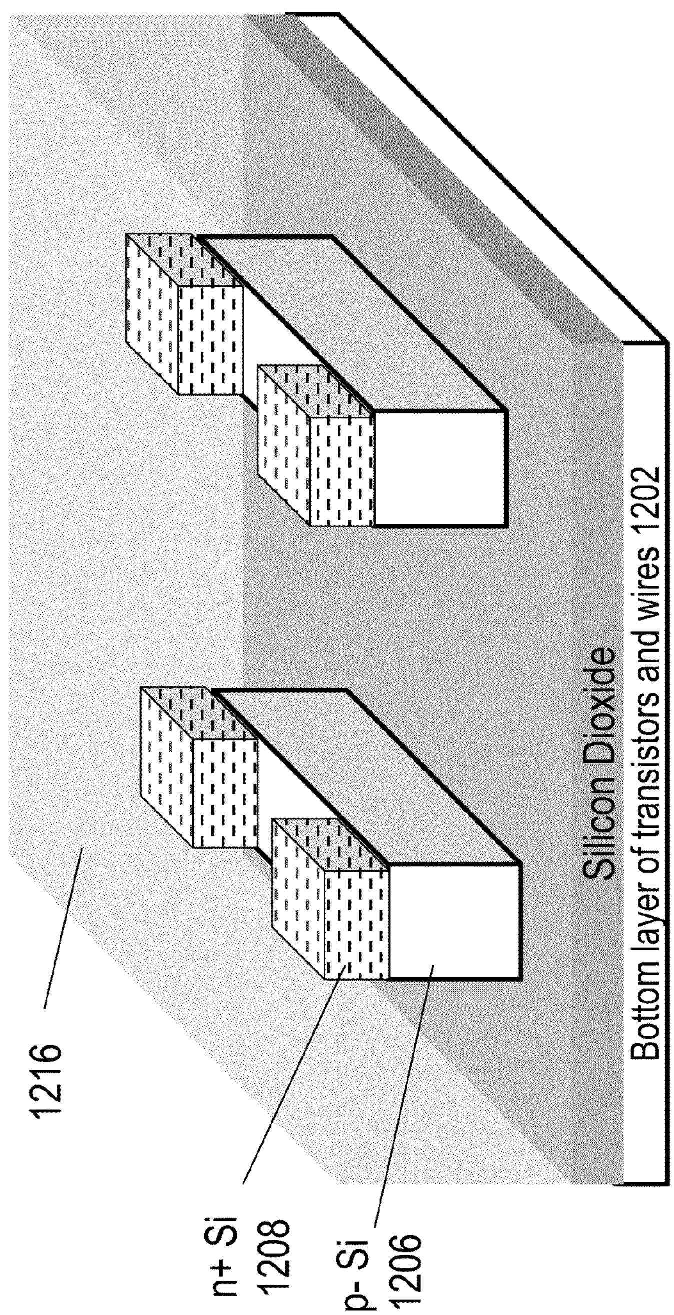

Step (D): Using litho and etch, a recessed channel is formed by etching away the n+ Si region 1209 where gates need to be formed. Little or none of the p− Si region 1206 is removed. FIG. 12D illustrates the structure after Step (D).

Figure 12E:
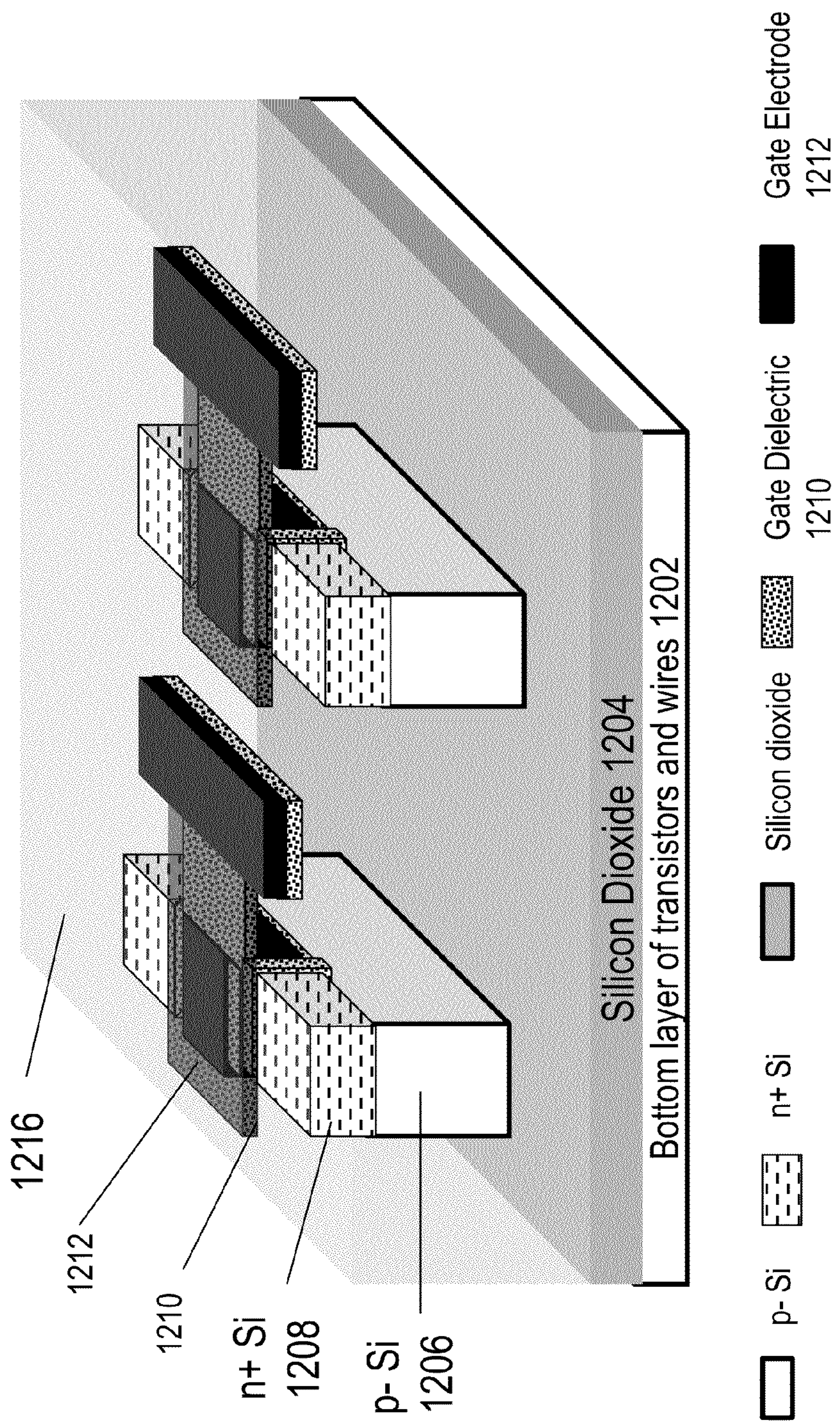

Step (E): The gate dielectric material and the gate electrode material are deposited, following which a CMP process is utilized for planarization. The gate dielectric material could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. Litho and etch are conducted to leave the gate dielectric material 1210 and the gate electrode material 1212 only in regions where gates are to be formed. FIG. 12E illustrates the structure after Step (E).

Figure 12F:
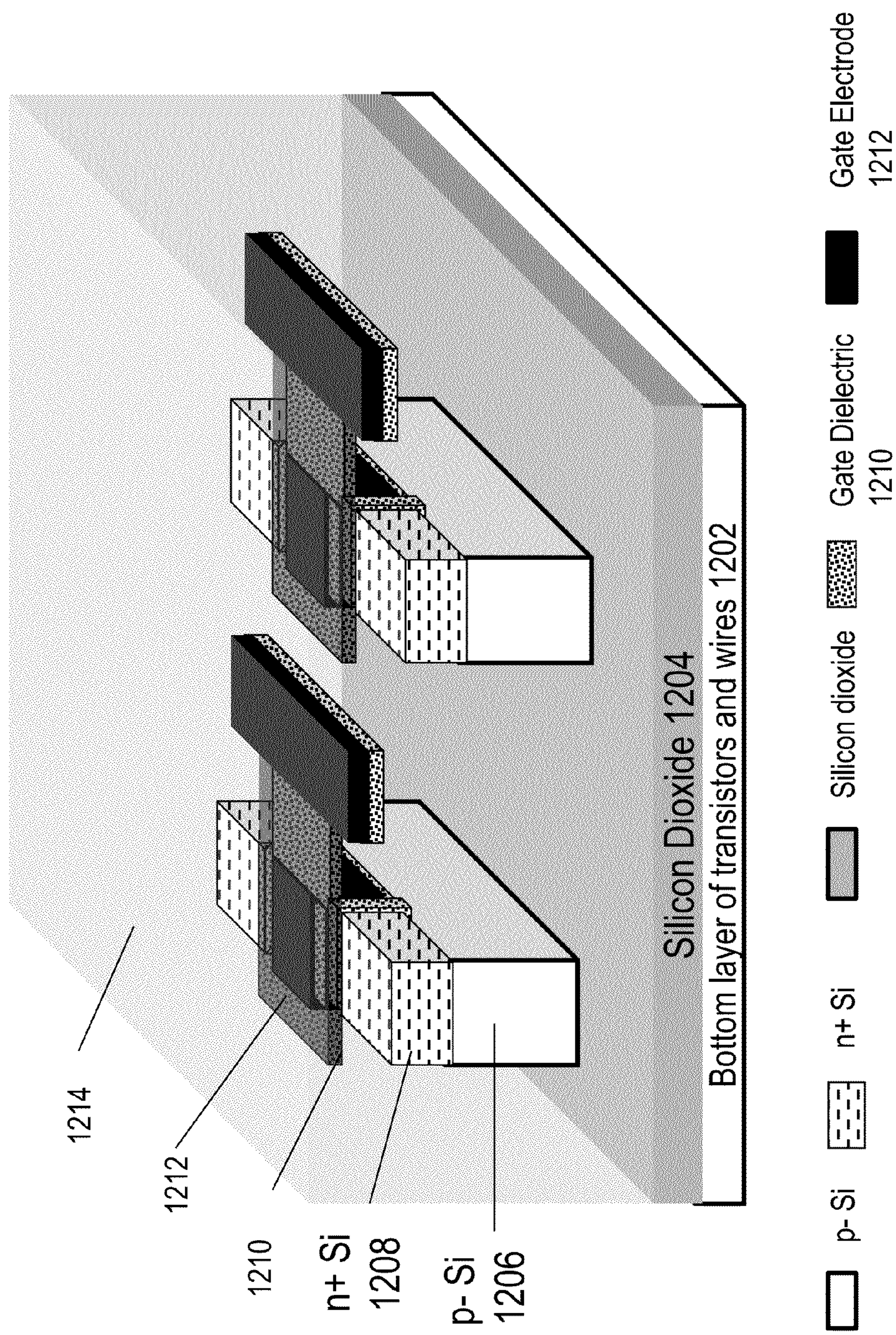

Step (F): An oxide layer 1214 is deposited and polished with CMP. Following this, rest of the process flow continues, with contact and wiring layers being formed. FIG. 12F illustrates the structure after Step (F).

It is apparent based on the process flow shown in FIG. 12A-F that no process step requiring greater than 400° C. is required after stacking the top layer of transistors above the bottom layer of transistors and wires. While the process flow shown in FIG. 12A-F gives the key steps involved in forming a standard recessed channel transistor for 3D stacked circuits and chips, it is conceivable to one skilled in the art that changes to the process can be made. For example, process steps and additional materials/regions to add strain to the standard recessed channel transistors can be added. Furthermore, more than two layers of chips or circuits can be 3D stacked. Note that top-level transistors are formed well-aligned to bottom-level wiring and transistor layers. This, in turn, is due to top-level transistor layers being very thin (preferably less than 200 nm). One can see through these thin silicon layers and align to features at the bottom-level.

Figure 13A:
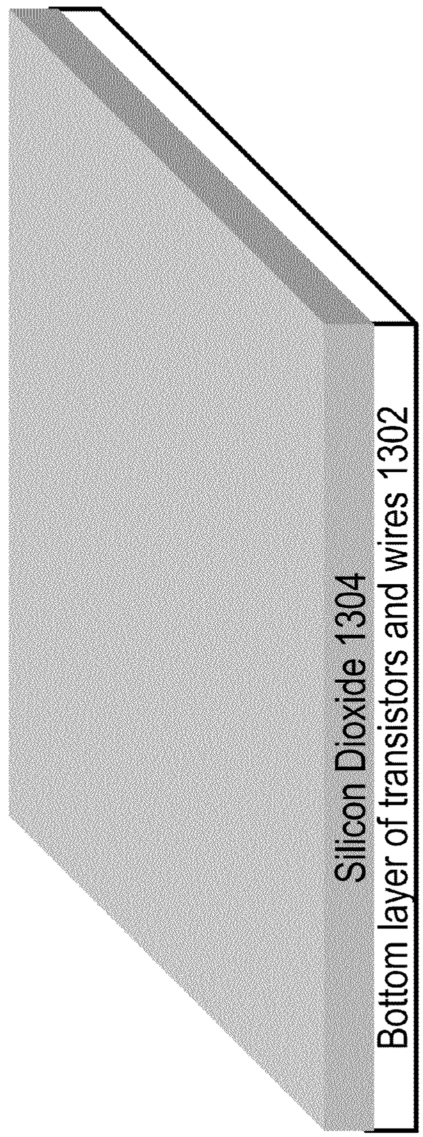
FIG. 13A-F show a process flow for constructing 3D stacked logic chips using RCATs.

FIG. 13A-F depicts a process flow for constructing 3D stacked logic circuits and chips using RCATs (recessed channel array transistors). These types of devices are typically used for constructing 2D DRAM chips. These devices can also be utilized for forming 3D stacked circuits and chips with no process steps performed at greater than 400° C. (after wafer to wafer bonding). The process flow in FIG. 13A-F may include several steps in the following sequence:

Step (A): The bottom layer of the 2 chip 3D stack is processed with transistors and wires. This is indicated in the figure as bottom layer of transistors and wires 1302. Above this, a silicon dioxide layer 1304 is deposited. FIG. 13A illustrates the structure after Step (A).

Figure 13B:
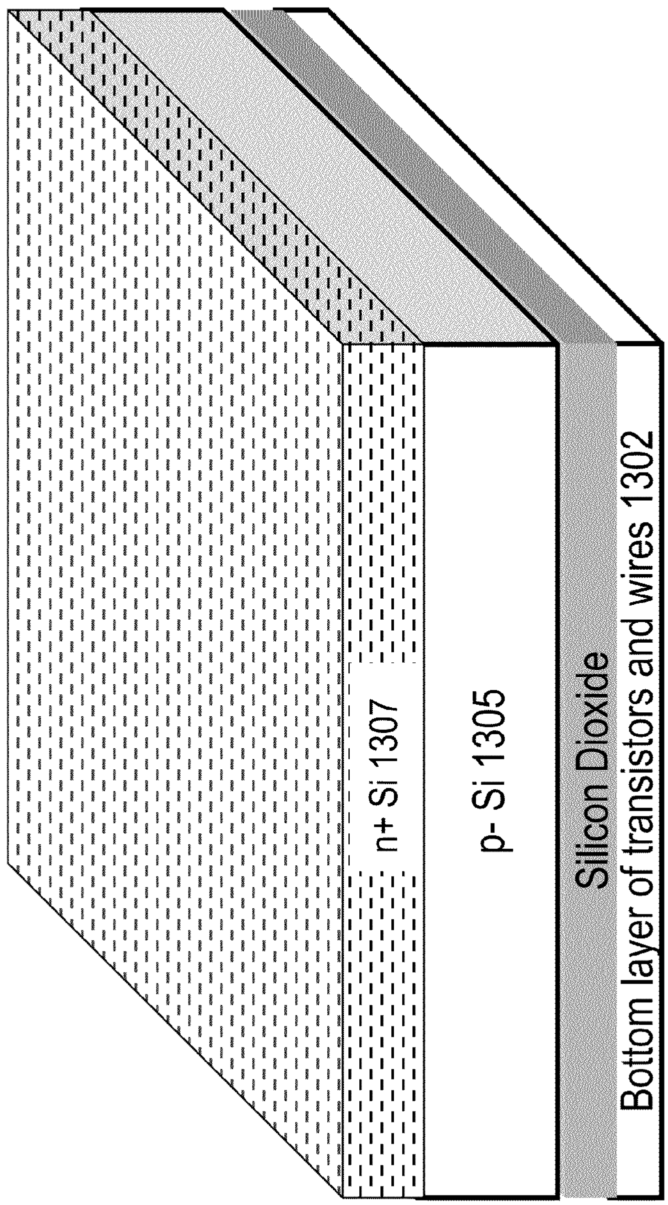

Step (B): Using the procedure shown in FIG. 11A-F, a p− Si layer 1305 and n+ Si layer 1307 are transferred atop the structure shown after Step (A). FIG. 13B illustrates the structure after Step (B).

Figure 13C:
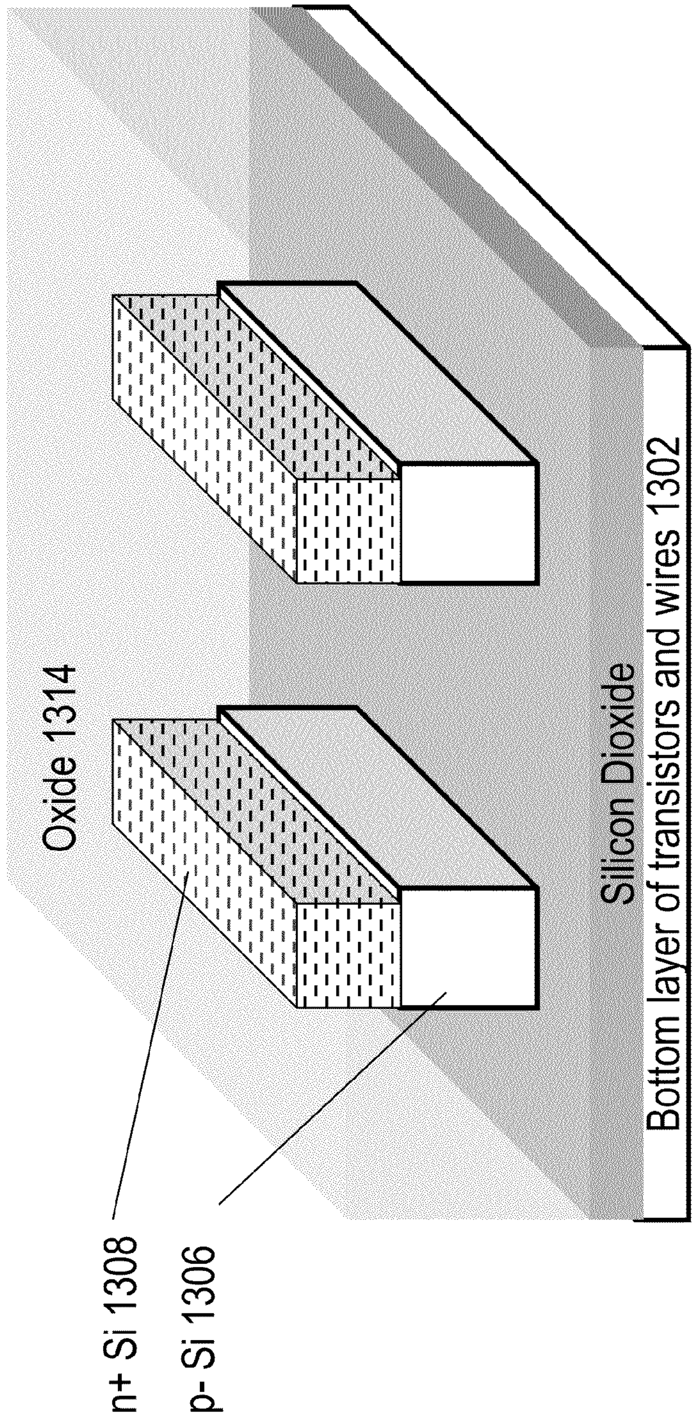

Step (C): The stack shown after Step (A) is patterned lithographically and etched such that silicon regions are present only in regions where transistors are to be formed. Using a standard shallow trench isolation (STI) process, isolation regions in between transistor regions are formed. FIG. 13C illustrates the structure after Step (C). n+ Si regions after this step are indicated as n+ Si 1308 and p− Si regions after this step are indicated as p− Si 1306. Oxide regions are indicated as Oxide 1314.

Figure 13D:
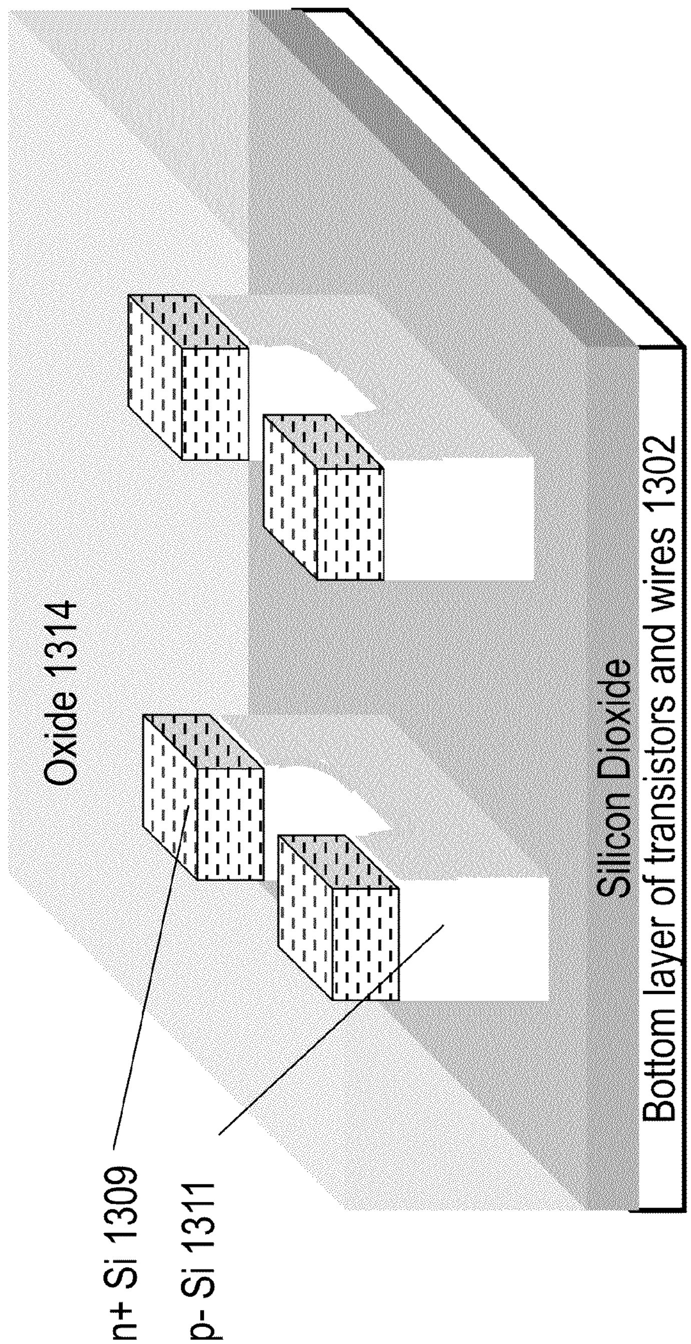
Figure 13E:
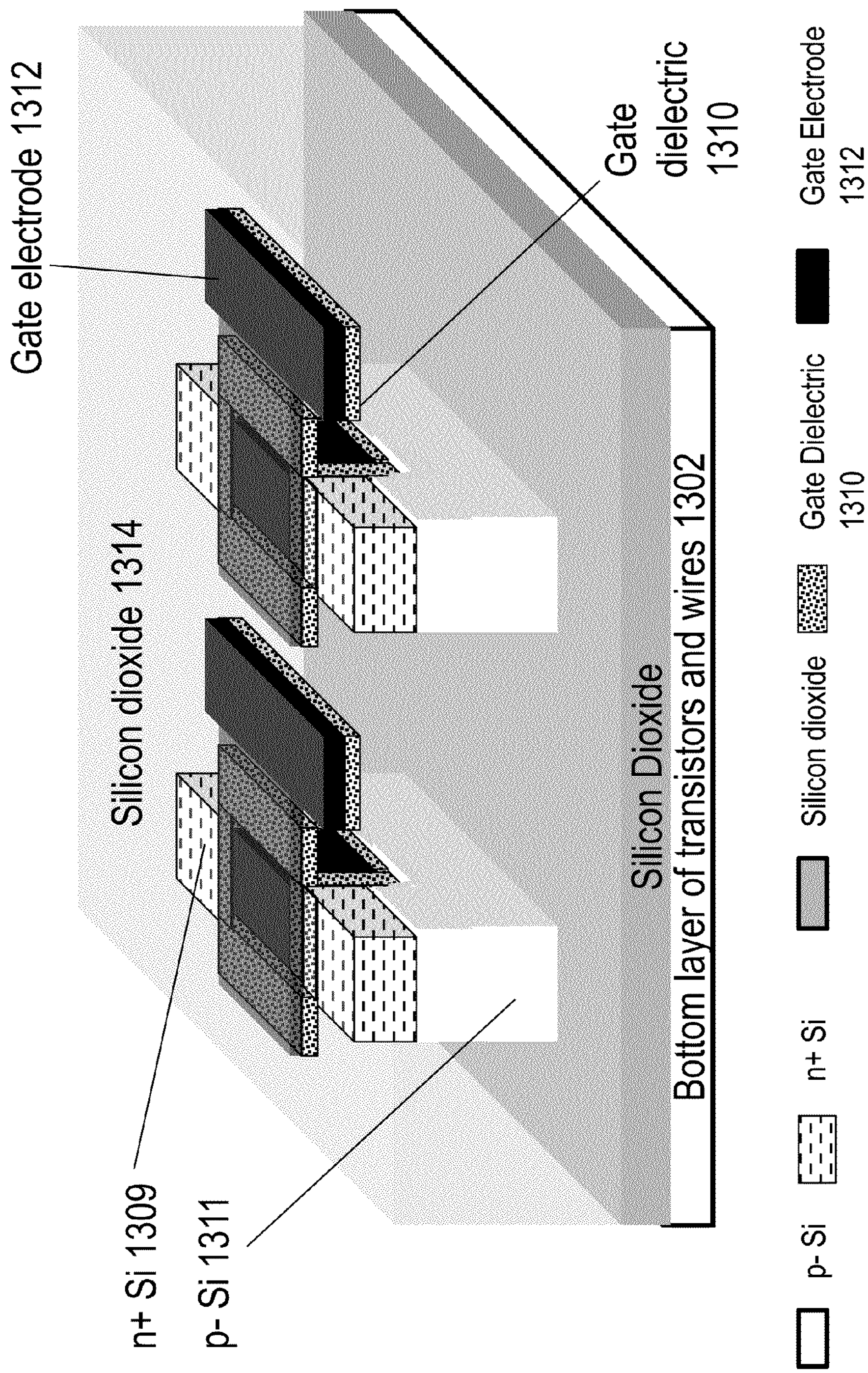

Step (D): Using litho and etch, a recessed channel is formed by etching away the n+ Si region 1308 and p− Si region 1306 where gates need to be formed. A chemical dry etch process is described in "The breakthrough in data retention time of DRAM using Recess-Channel-Array Transistor (RCAT) for 88 nm feature size and beyond," *VLSI Technology,* 2003. *Digest of Technical Papers*. 2003 *Symposium on*, vol., no., pp. 11-12, 10-12 Jun. 2003 by Kim, J. Y.; Lee, C. S.; Kim, S. E., et al. ("J. Y. Kim"). A variation of this process from J. Y. Kim can be utilized for rounding corners, removing damaged silicon, etc after the etch. Furthermore, Silicon Dioxide can be formed using a plasma-enhanced thermal oxidation process, this oxide can be etched-back as well to reduce damage from etching silicon. FIG. 13D illustrates the structure after Step (D). n+ Si regions after this step are indicated as n+ Si 1309 and p− Si regions after this step are indicated as p− Si 1311, Step (E): The gate dielectric material and the gate electrode material are deposited, following which a CMP process is utilized for planarization. The gate dielectric material could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. Litho and etch are conducted to leave the gate dielectric material 1310 and the gate electrode material 1312 only in regions where gates are to be formed. FIG. 13E illustrates the structure after Step (E).

Figure 13F:
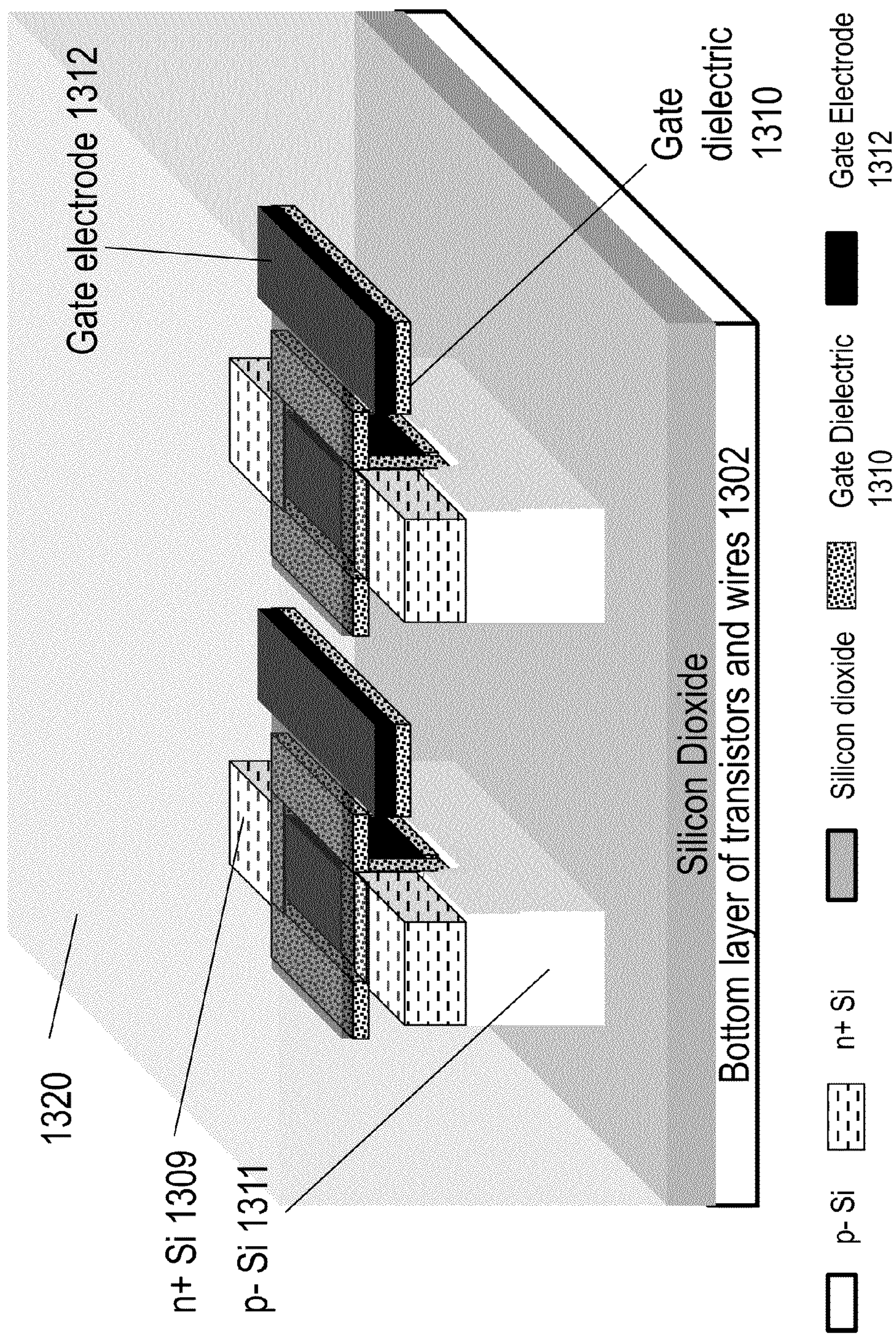

Step (F): An oxide layer 1320 is deposited and polished with CMP. Following this, rest of the process flow continues, with contact and wiring layers being formed. FIG. 13F illustrates the structure after Step (F).

It is apparent based on the process flow shown in FIG. 13A-F that no process step at greater than 400° C. is required after stacking the top layer of transistors above the bottom layer of transistors and wires. While the process flow shown in FIG. 13A-F gives several steps involved in forming a RCATs for 3D stacked circuits and chips, it is conceivable to one skilled in the art that changes to the process can be made. For example, process steps and additional materials/regions to add strain to RCATs can be added. Furthermore, more than two layers of chips or circuits can be 3D stacked. Note that top-level transistors are formed well-aligned to bottom-level wiring and transistor layers. This, in turn, is due to top-level transistor layers being very thin (preferably less than 200 nm). One can look through these thin silicon layers and align to features at the bottom-level. Due to their extensive use in the DRAM industry, several technologies exist to optimize RCAT processes and devices. These are described in "The breakthrough in data retention time of DRAM using Recess-Channel-Array Transistor (RCAT) for 88 nm feature size and beyond," *VLSI Technology,* 2003. *Digest of Technical Papers*. 2003 *Symposium on*, vol., no., pp. 11-12, 10-12 Jun. 2003 by Kim, J. Y.; Lee, C. S.; Kim, S. E., et al. ("J. Y. Kim"), "The excellent scalability of the RCAT (recess-channel-array-transistor) technology for sub-70 nm DRAM feature size and beyond," *VLSI Technology,* 2005. (*VLSI-TSA-Tech*). 2005 *IEEE VLSI-TSA International Symposium on*, vol., no., pp. 33-34, 25-27 Apr. 2005 by Kim, J. Y.; Woo, D. S.; Oh, H. J., et al. ("Kim") and "Implementation of HfSiON gate dielectric for sub-60 nm DRAM dual gate oxide with recess channel array transistor (RCAT) and tungsten gate," *Electron Devices Meeting,* 2004. *IEEE International*, vol., no., pp. 515-518, 13-15 Dec. 2004 by Seong Geon Park; Beom Jun Jin; Hye Lan Lee, et al. ("S. G. Park"). It is conceivable to one skilled in the art that RCAT process and device optimization outlined by J. Y. Kim, Kim, S. G. Park and others can be applied to 3D stacked circuits and chips using RCATs as a building block.

While FIG. 13A-F showed the process flow for constructing RCATs for 3D stacked chips and circuits, the process flow for S-RCATs shown in FIG. 10C is not very different. The main difference for a S-RCAT process flow is the silicon etch in Step (D) of FIG. 13A-F. A S-RCAT etch is more sophisticated, and an oxide spacer is used on the sidewalls along with an isotropic dry etch process. Further details of a S-RCAT etch and process are given in "S-RCAT (sphere-shaped-recess-channel-array transistor) technology for 70 nm DRAM feature size and beyond," *Digest of Technical Papers.* 2005 *Symposium on VLSI Technology,* 2005 pp. 34-35, 14-16 Jun. 2005 by Kim, J. V.; Oh, H. J.; Woo, D. S., et al. ("J. V. Kim") and "High-density low-power-operating DRAM device adopting $6F^2$ cell scheme with novel S-RCAT structure on 80 nm feature size and beyond," *Solid-State Device Research Conference,* 2005. *ESSDERC* 2005. *Proceedings of* 35*th European*, vol., no., pp. 177-180, 12-16 Sep. 2005 by Oh, H. J.; Kim, J. Y.; Kim, J. H, et al. ("Oh"). The contents of the above publications are incorporated herein by reference.

The recessed channel Finfet shown in FIG. 10D can be constructed using a simple variation of the process flow shown in FIG. 13A-F. A recessed channel Finfet technology and its processing details are described in "Highly Scalable Saddle-Fin (S-Fin) Transistor for Sub-50 nm DRAM Technology," *VLSI Technology,* 2006. *Digest of Technical Papers*. 2006 *Symposium on*, vol., no., pp. 32-33 by Sung-Woong Chung; Sang-Don Lee; Se-Aug Jang, et al. ("S-W Chung") and "A Proposal on an Optimized Device Structure With Experimental Studies on Recent Devices for the DRAM Cell Transistor," *Electron Devices, IEEE Transactions on*, vol. 54, no. 12, pp. 3325-3335, December 2007 by Myoung Jin Lee; Seonghoon Jin; Chang-Ki Baek, et al. ("M. J. Lee"). Contents of these publications are incorporated herein by reference.

Figure 68A:
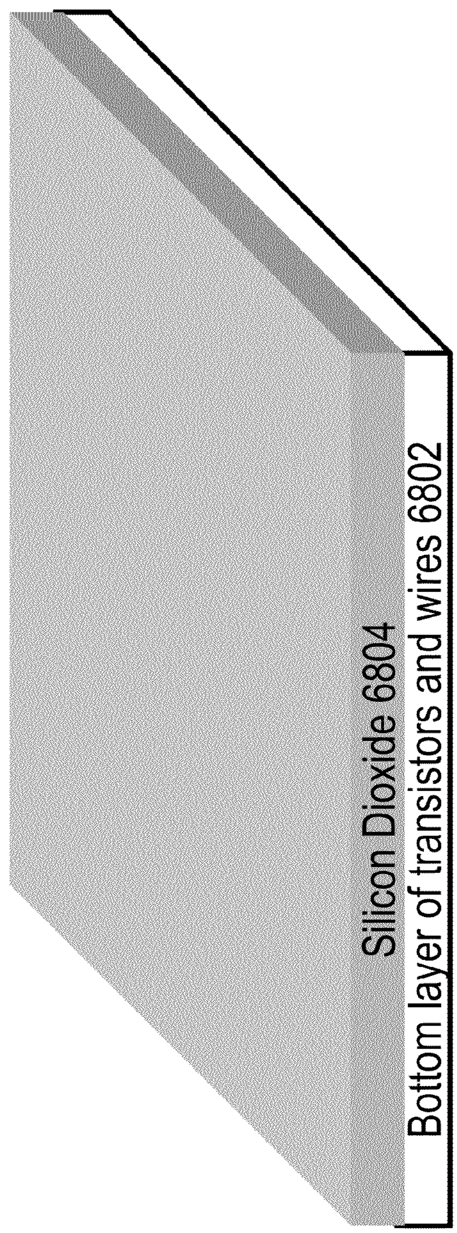
FIG. 68A-E illustrates a technique to construct 3D stacked trench MOSFETs.

FIG. 68A-E depicts a process flow for constructing 3D stacked logic circuits and chips using trench MOSFETs. These types of devices are typically used in power semiconductor applications. These devices can also be utilized for forming 3D stacked circuits and chips with no process steps performed at greater than 400° C. (after wafer to wafer bonding). The process flow in FIG. 68A-E may include several steps in the following sequence:

Step (A): The bottom layer of the 2 chip 3D stack may be processed with transistors and wires. This is indicated in the figure as bottom layer of transistors and wires 6802. Above this, a silicon dioxide layer 6804 may be deposited. FIG. 68A illustrates the structure after Step (A).

Figure 68B:
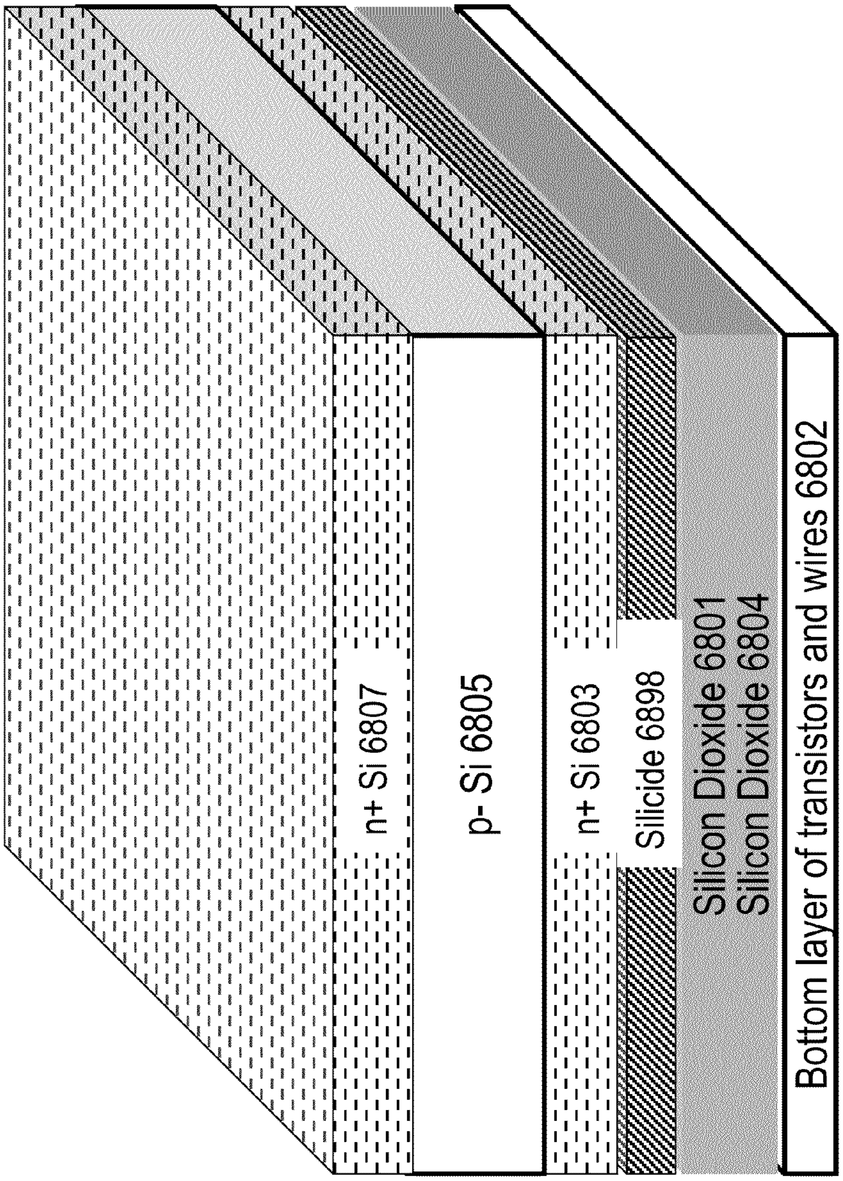

Step (B): Using the procedure similar to the one shown in FIG. 11A-F, a p− Si layer 6805, two n+ Si regions 6803 and 6807 and a silicide region 6898 may be transferred atop the structure shown after Step (A). 6801 represents a silicon oxide region. FIG. 68B illustrates the structure after Step (B).

Figure 68C:
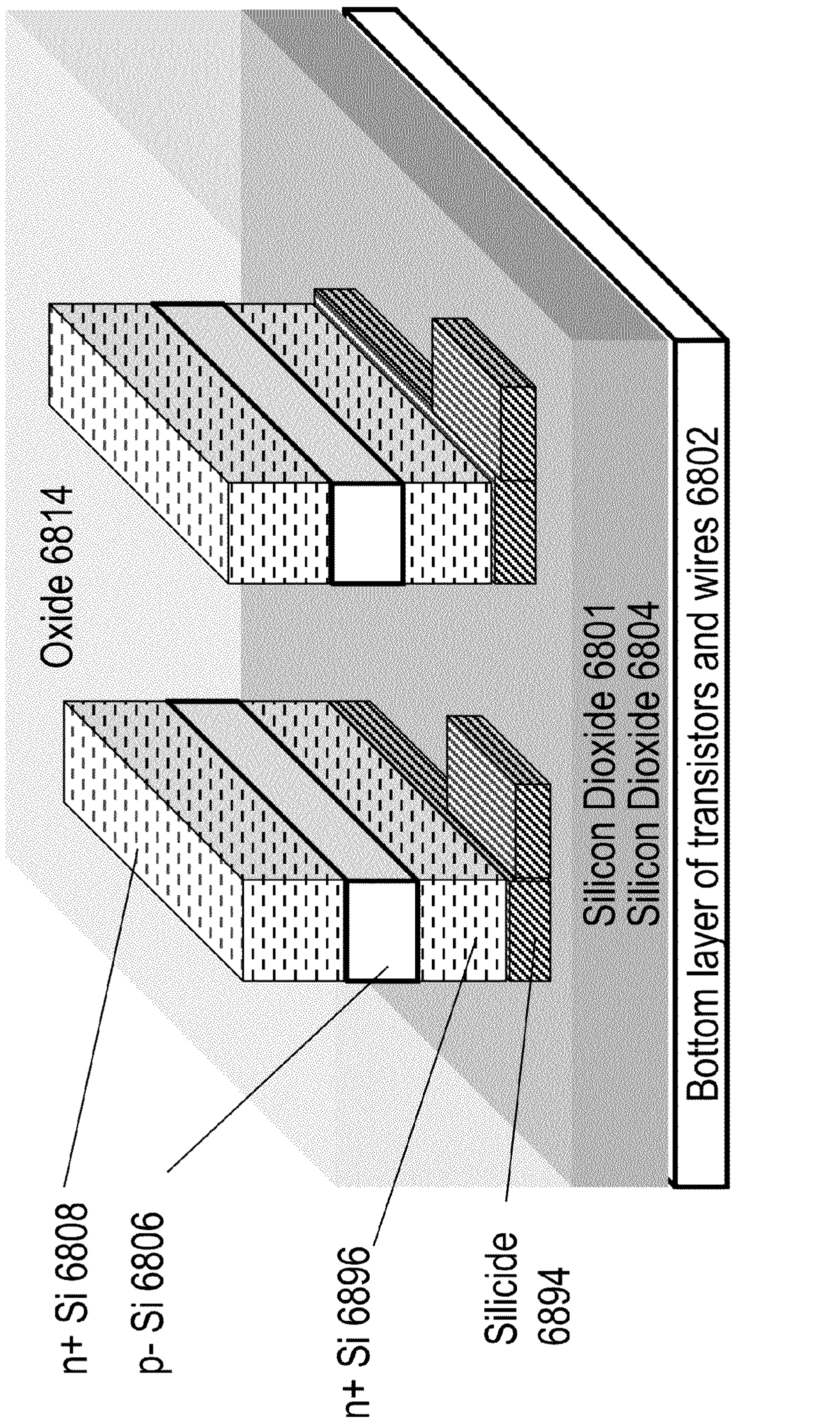

Step (C): The stack shown after Step (B) may be patterned lithographically and etched such that silicon and silicide regions may be present only in regions where transistors and contacts are to be formed. Using a shallow trench isolation (STI) process, isolation regions in between transistor regions may be formed. FIG. 68C illustrates the structure after Step (C). n+ Si regions after this step are indicated as n+ Si 6808 and 6896 and p− Si regions after this step are indicated as p− Si 6806. Oxide regions are indicated as Oxide 6814. Silicide regions after this step are indicated as 6894.

Figure 68D:
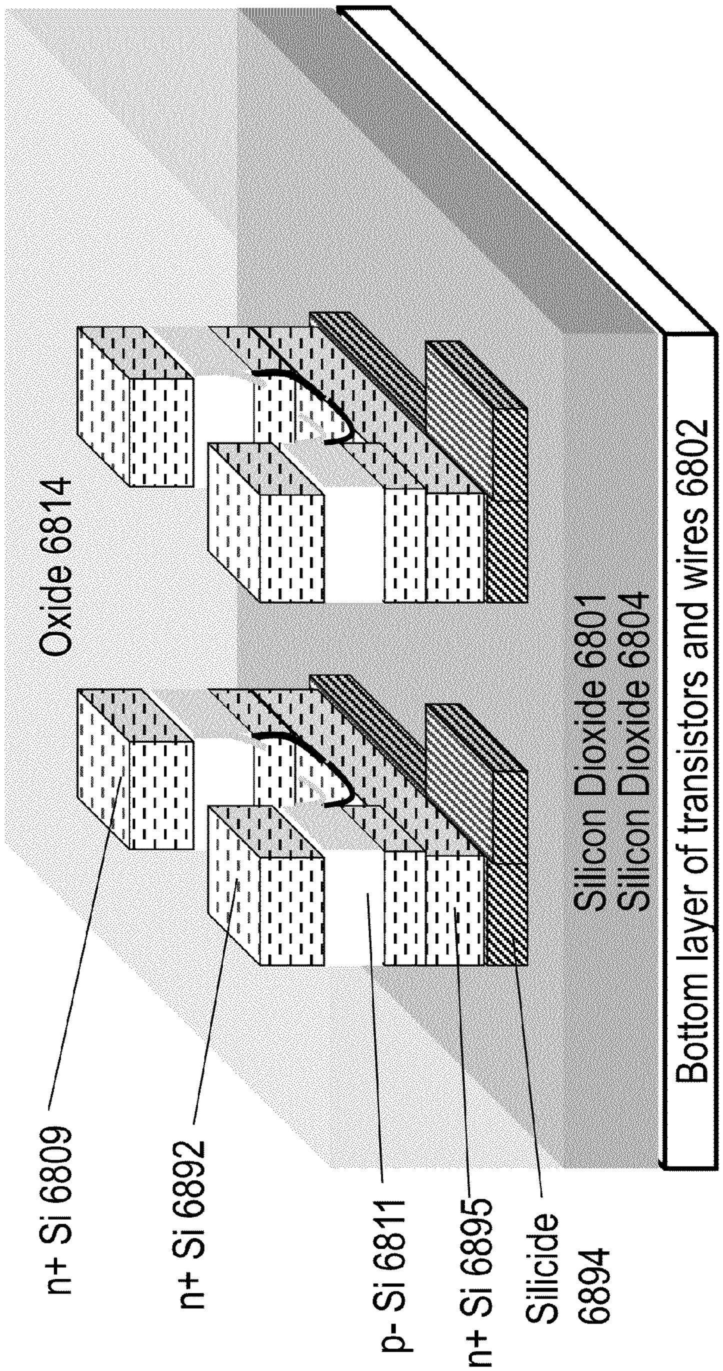

Step (D): Using litho and etch, a trench may be formed by etching away the n+ Si region 6808 and p− Si region 6806 (from FIG. 68C) where gates need to be formed. The angle of the etch may be varied such that either a U shaped trench or a V shaped trench is formed. A chemical dry etch process is described in "The breakthrough in data retention time of DRAM using Recess-Channel-Array Transistor (RCAT) for 88 nm feature size and beyond," *VLSI Technology,* 2003. *Digest of Technical Papers*. 2003 *Symposium on*, vol., no., pp. 11-12, 10-12 Jun. 2003 by Kim, J. Y.; Lee, C. S.; Kim, S. E., et al. ("J. Y. Kim"). A variation of this process from J. Y. Kim can be utilized for rounding corners, removing damaged silicon, etc after the etch. Furthermore, Silicon Dioxide can be formed using a plasma-enhanced thermal oxidation process, this oxide can be etched-back as well to reduce damage from etching silicon. FIG. 68D illustrates the structure after Step (D). n+ Si regions after this step are indicated as 6809, 6892 and 6895 and p− Si regions after this step are indicated as p− Si 6811.

Figure 68E:
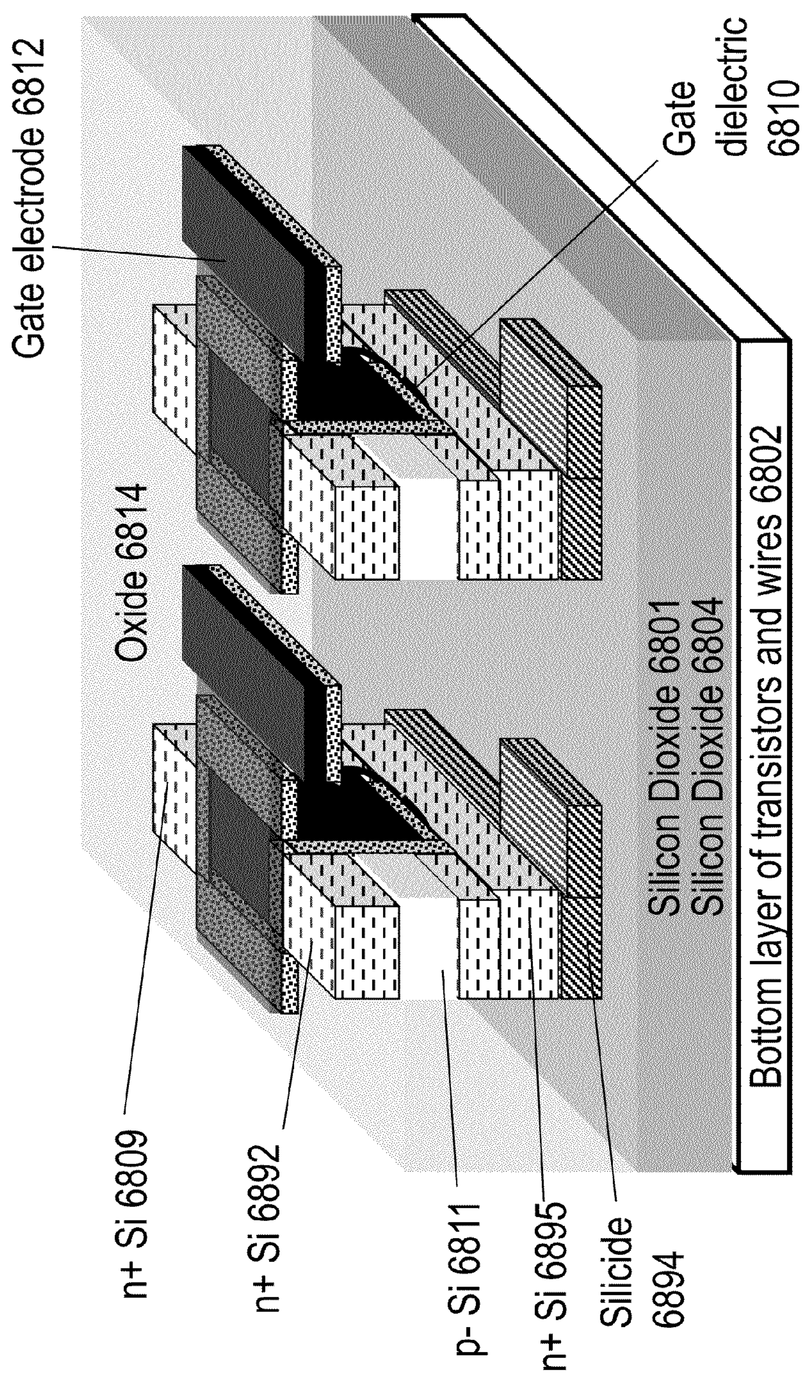

Step (E): The gate dielectric material and the gate electrode material may be deposited, following which a CMP process may be utilized for planarization. The gate dielectric material could be hafnium oxide. Alternatively, silicon dioxide can be used. Other types of gate dielectric materials such as Zirconium oxide can be utilized as well. The gate electrode material could be Titanium Nitride. Alternatively, other materials such as TaN, W, Ru, TiAlN, polysilicon could be used. Litho and etch may be conducted to leave the gate dielectric material 6810 and the gate electrode material 6812 only in regions where gates are to be formed. FIG. 68E illustrates the structure after Step (E). In the transistor shown in FIG. 68E, n+ Si regions 6809 and 6892 may be drain regions of the MOSFET, p− Si regions 6811 may be channel regions and n+ Si region 6895 may be a source region of the MOSFET. Alternatively, n+ Si regions 6809 and 6892 may be source regions of the MOSFET and n+ Si region 6895 may be a drain region of the MOSFET. Following this, rest of the process flow continues, with contact and wiring layers being formed.

It is apparent based on the process flow shown in FIG. 68A-E that no process step at greater than 400° C. is required after stacking the top layer of transistors above the bottom layer of transistors and wires. While the process flow shown in FIG. 68A-E gives several steps involved in forming a trench MOSFET for 3D stacked circuits and chips, it is conceivable to one skilled in the art that changes to the process can be made.

Section 1.3: Improvements and Alternatives

Various methods, technologies and procedures to improve devices shown in Section 1.1 and Section 1.2 are given in this section. Single crystal silicon (this term used interchangeably with monocrystalline silicon) is used for constructing transistors in Section 1.3. Thickness of layer transferred silicon is typically <2 um or <1 um or could be even less than 0.2 um, unless stated otherwise. Interconnect (wiring) layers are constructed substantially of copper or aluminum or some other higher conductivity material. The term planar transistor or horizontally oriented transistor could be used to describe any constructed transistor where source and drain regions are in the same horizontal plane and current flows between them.

Section 1.3.1: Construction of CMOS Circuits with Sub-400° C. Processed Transistors FIG. 14A-I show procedures for constructing CMOS circuits using sub-400° C. processed transistors (i.e. junction-less transistors and recessed channel transistors) described thus far in this document. When doing layer transfer for junction-less transistors and recessed channel transistors, it is easy to construct just nMOS transistors in a layer or just pMOS transistors in a layer. However, constructing CMOS circuits requires both nMOS transistors and pMOS transistors, so it requires additional ideas.

Figure 14A:
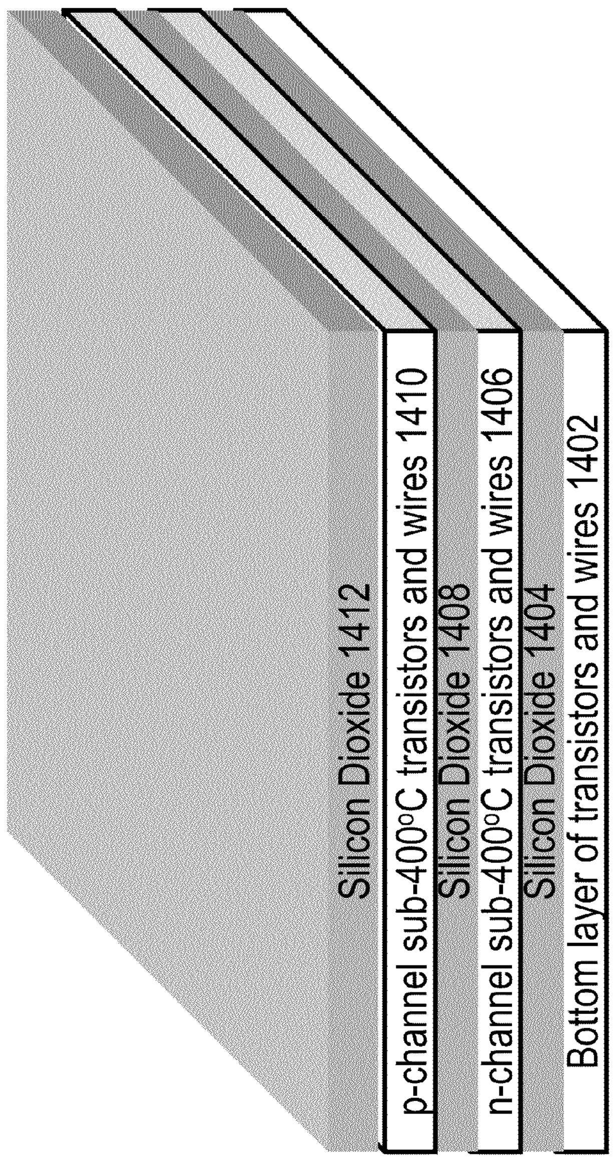
FIG. 14A-I show construction of CMOS circuits using sub-400° C. transistors (e.g., junctionless transistors or recessed channel transistors).

FIG. 14A shows one procedure for forming CMOS circuits. nMOS and pMOS layers of CMOS circuits are stacked atop each other. A layer of n-channel sub-400° C. transistors (with none or one or more wiring layers) 1406 is first formed over a bottom layer of transistors and wires 1402. Following this, a layer of p-channel sub-400° C. transistors (with none or one or more wiring layers) 1410 is formed. This structure is important since CMOS circuits typically require both n-channel and p-channel transistors. A high density of connections exist between different layers 1402, 1406 and 1410. The p-channel wafer 1410 could have its own optimized crystal structure that improves mobility of p-channel transistors while the n-channel wafer 1406 could have its own optimized crystal structure that improves mobility of n-channel transistors. For example, it is known that mobility of p-channel transistors is maximum in the (110) plane while the mobility of n-channel transistors is maximum in the (100) plane. The wafers 1410 and 1406 could have these optimized crystal structures.

Figure 14B:
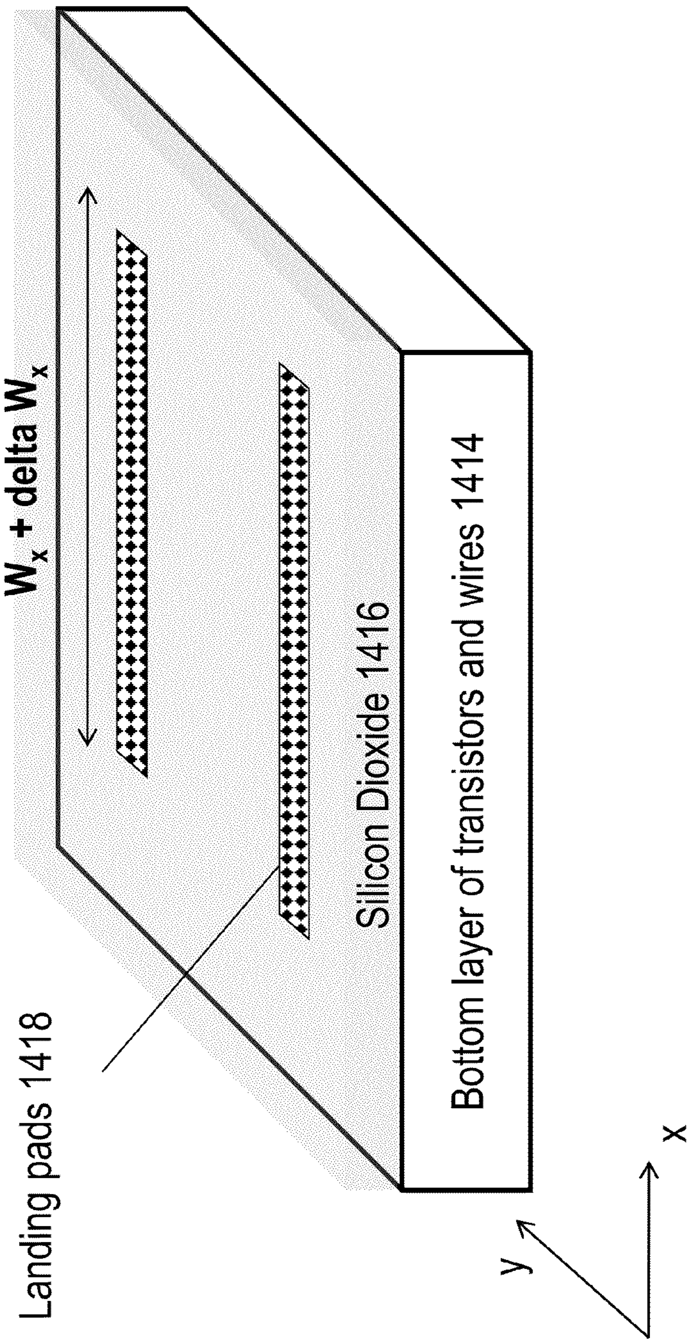

FIG. 14B-F shows another procedure for forming CMOS circuits that utilizes junction-less transistors and repeating layouts in one direction. The procedure may include several steps, in the following sequence:

Step (1): A bottom layer of transistors and wires 1414 is first constructed above which a layer of landing pads 1418 is constructed. A layer of silicon dioxide 1416 is then constructed atop the layer of landing pads 1418. Size of the landing pads 1418 is $W_x$+delta ($W_x$) in the X direction, where $W_x$ is the distance of one repeat of the repeating pattern in the (to be constructed) top layer. delta($W_x$) is an offset added to account for some overlap into the adjacent region of the repeating pattern and some margin for rotational (angular) misalignment within one chip (IC). Size of the landing pads 1418 is F or 2F plus a margin for rotational misalignment within one chip (IC) or higher in the Y direction, where F is the minimum feature size. Note that the terms landing pad and metal strip are used interchangeably in this document. FIG. 14B is a drawing illustration after Step (1).

Step (2): A top layer having regions of n+ Si 1424 and p+ Si 1422 repeating over-and-over again is constructed atop a p−

Figure 14C:
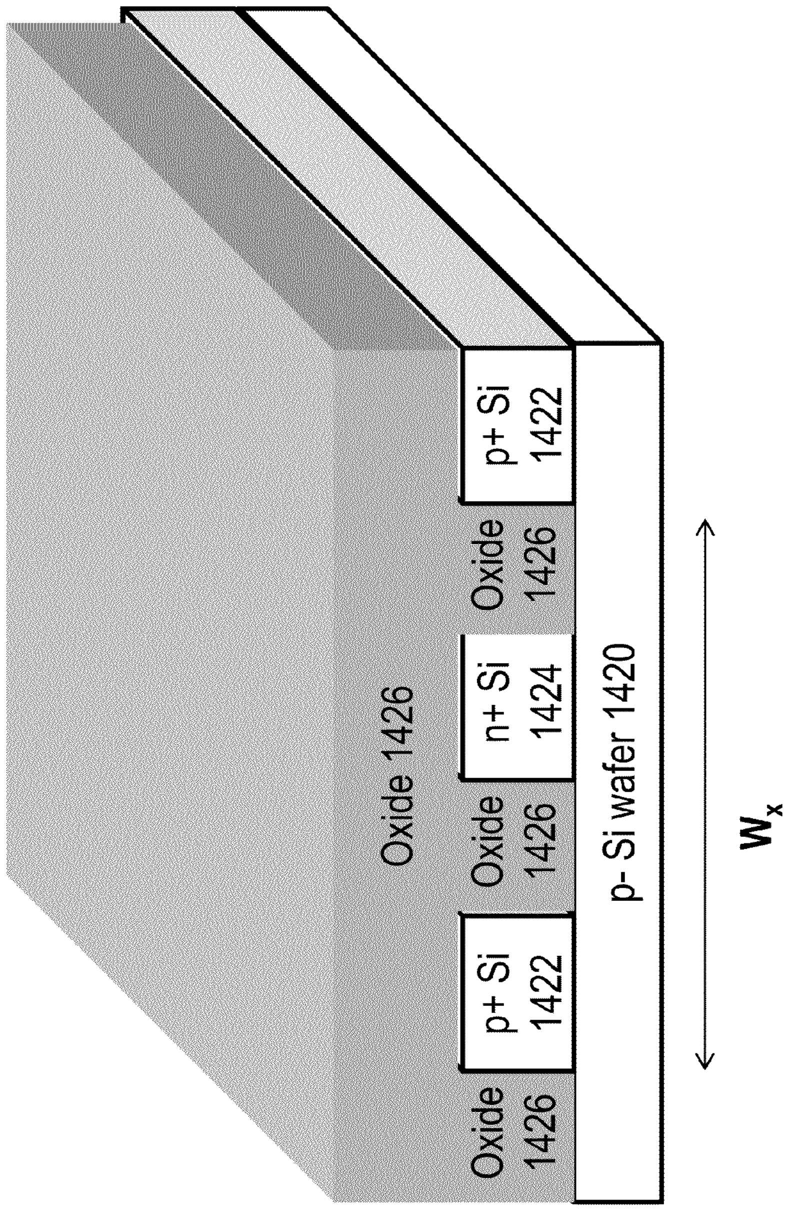

Si wafer 1420. The pattern repeats in the X direction with a repeat distance denoted by $W_x$. In the Y direction, there is no pattern at all; the wafer is completely uniform in that direction. This ensures misalignment in the Y direction does not impact device and circuit construction, except for any rotational misalignment causing difference between the left and right side of one IC. A maximum rotational (angular) misalignment of 0.5 um over a 200 mm wafer results in maximum misalignment within one 10 by 10 mm IC of 25 nm in both X and Y direction. Total misalignment in the X direction is much larger, which is addressed in this invention as shown in the following steps. FIG. 14C shows a drawing illustration after Step (2).

Step (3): The top layer shown in Step (2) receives an H+ implant to create the cleaving plane in the p− silicon region and is flipped and bonded atop the bottom layer shown in Step (1). A procedure similar to the one shown in FIG. 2A-E is utilized for this purpose. Note that the top layer shown in Step (2) has had its dopants activated with an anneal before layer transfer. The top layer is cleaved and the remaining p− region is etched or polished (CMP) away until only the N+ and P+ stripes remain. During the bonding process, a misalignment can occur in X and Y directions, while the angular alignment is typically small. This is because the misalignment is due to factors like wafer bow, wafer expansion due to thermal differences between bonded wafers, etc; these issues do not typically cause angular alignment problems, while they impact alignment in X and Y directions.

Figure 14D:
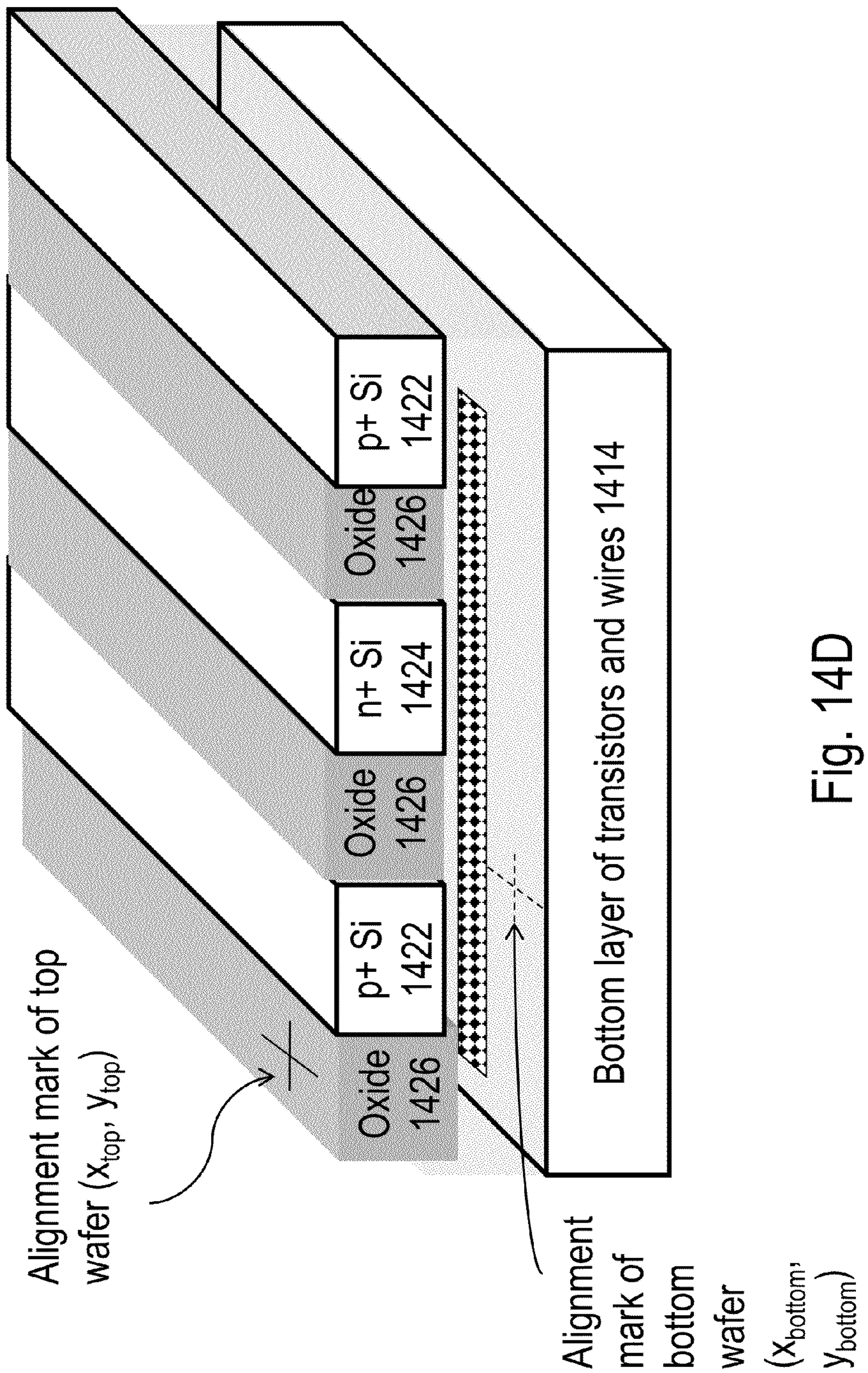

Since the width of the landing pads is slightly wider than the width of the repeating n and p pattern in the X-direction and there's no pattern in the Y direction, the circuitry in the top layer can shifted left or right and up or down until the layer-to-layer contacts within the top circuitry are placed on top of the appropriate landing pad. This is further explained below: Let us assume that after the bonding process, co-ordinates of alignment mark of the top wafer are ($x_{top}$, $y_{top}$) while co-ordinates of alignment mark of the bottom wafer are ($x_{bottom}$, $y_{bottom}$). FIG. 14D shows a drawing illustration after Step (3).

Figure 14E:
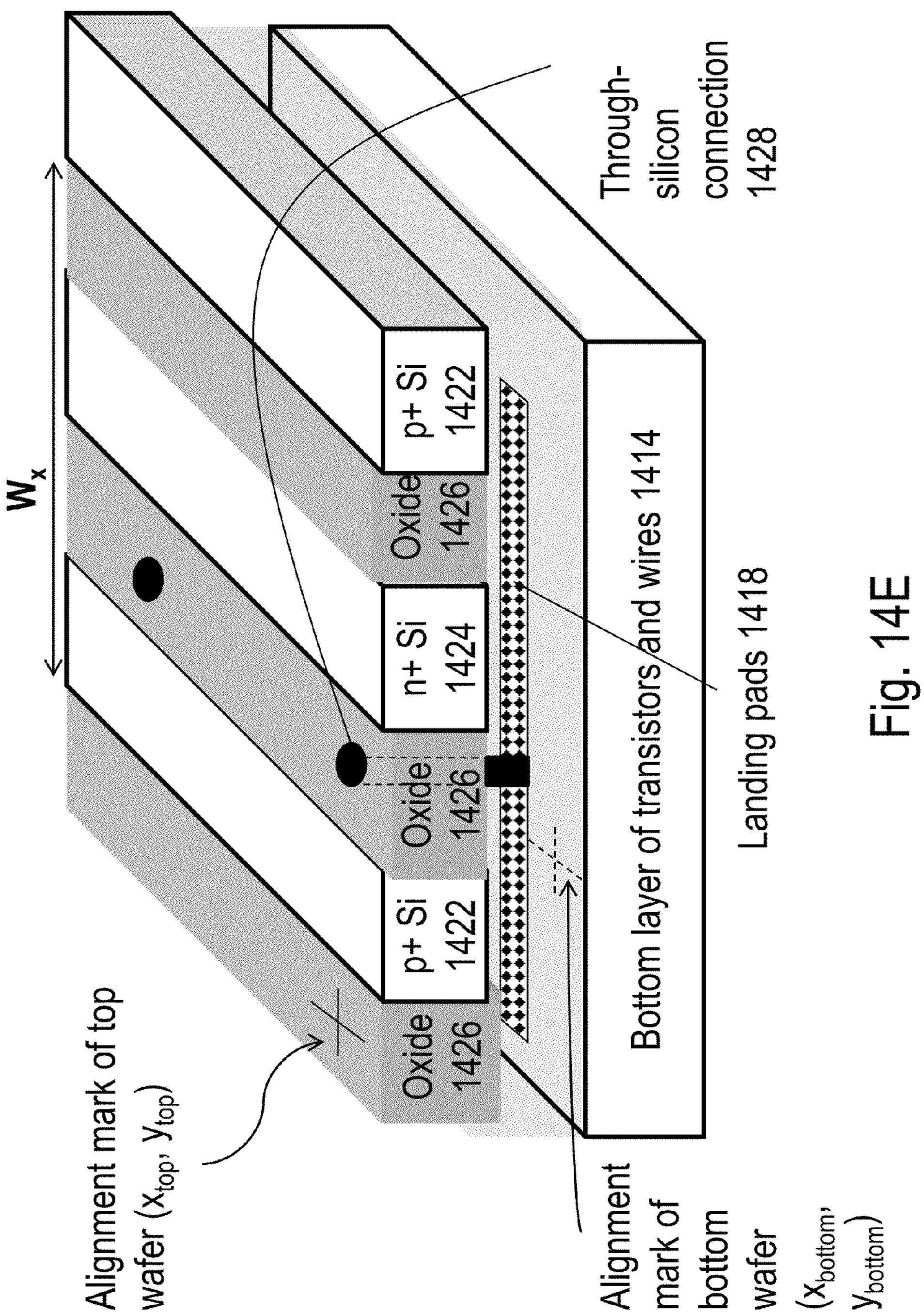

Step (4): A virtual alignment mark is created by the lithography tool. X co-ordinate of this virtual alignment mark is at the location ($x_{top}$+(an integer k)*$W_x$). The integer k is chosen such that modulus or absolute value of ($x_{top}$+(integer k)*$W_x$−$x_{bottom}$)<=$W_x$/2. This guarantees that the X co-ordinate of the virtual alignment mark is within a repeat distance (or within the same section of width $W_x$) of the X alignment mark of the bottom wafer. Y co-ordinate of this virtual alignment mark is $y_{bottom}$ (since silicon thickness of the top layer is thin, the lithography tool can see the alignment mark of the bottom wafer and compute this quantity). Though-silicon connections 1428 are now constructed with alignment mark of this mask aligned to the virtual alignment mark. The terms through via or through silicon vias can be used interchangeably with the term through-silicon connections in this document. Since the X co-ordinate of the virtual alignment mark is within the same ((p+)-oxide-(n+)-oxide) repeating pattern (of length $W_x$) as the bottom wafer X alignment mark, the through-silicon connection 1428 always falls on the bottom landing pad 1418 (the bottom landing pad length is $W_x$ added to delta ($W_x$), and this spans the entire length of the repeating pattern in the X direction). FIG. 14E is a drawing illustration after Step (4).

Figure 14F:
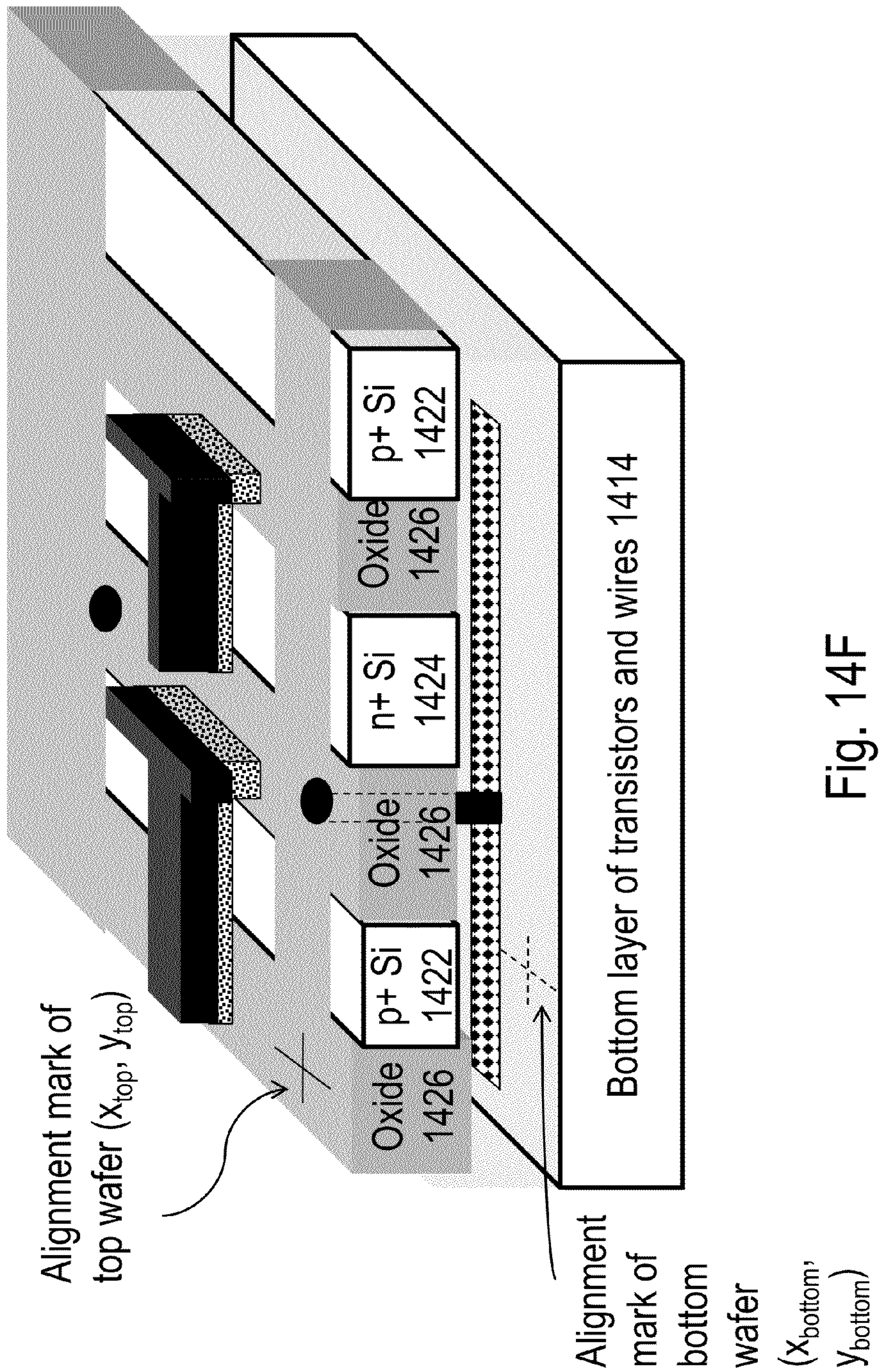

Step (5): n channel and p channel junctionless transistors are constructed aligned to the virtual alignment mark. FIG. 14F is a drawing illustration after Step (5).

From steps (1) to (5), it is clear that 3D stacked semiconductor circuits and chips can be constructed with misalignment tolerance techniques. Essentially, a combination of 3 key ideas—repeating patterns in one direction of length $W_x$, landing pads of length ($W_x$+delta ($W_x$)) and creation of virtual alignment marks—are used such that even if misalignment occurs, through silicon connections fall on their respective landing pads. While the explanation in FIG. 14B-F is shown for a junction-less transistor, similar procedures can also be used for recessed channel transistors. Thickness of the transferred single crystal silicon or monocrystalline silicon layer is less than 2 um, and can be even lower than 1 um or 0.4 um or 0.2 um.

Figure 14G:
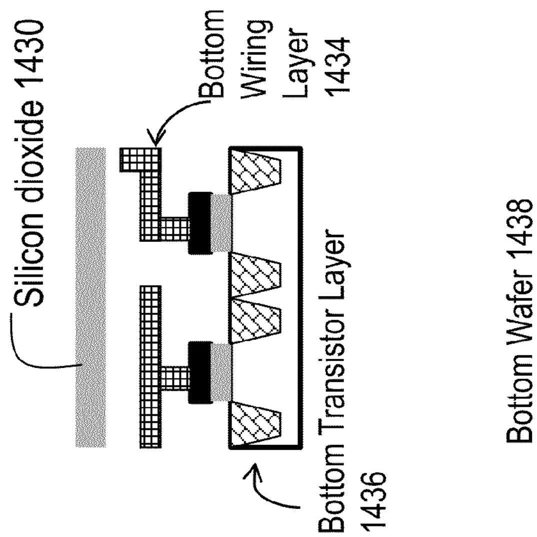
Figure 14H:
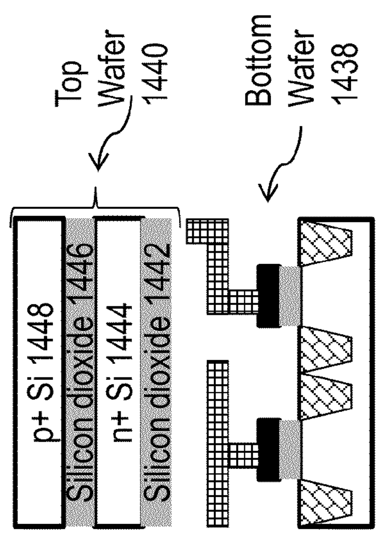
Figure 14I:
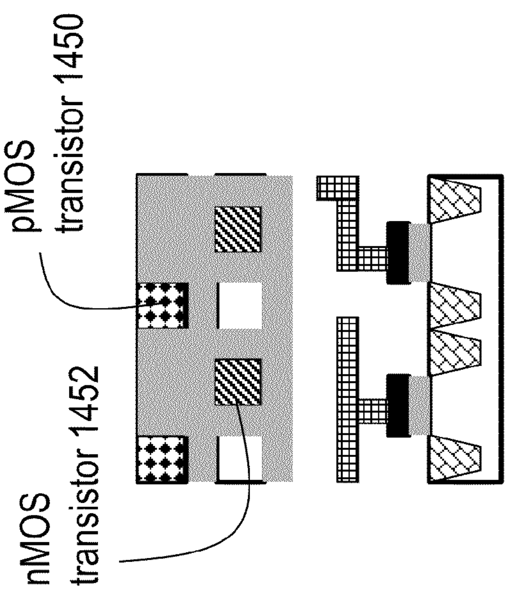

FIG. 14G-I shows yet another procedure for forming CMOS circuits with processing temperatures below 400° C. such as the junction-less transistor and recessed channel transistors. While the explanation in FIG. 14G-I is shown for a junction-less transistor, similar procedures can also be used for recessed channel transistors. The procedure may include several steps as described in the following sequence:

Step (A): A bottom wafer 1438 is processed with a bottom transistor layer 1436 and a bottom wiring layer 1434. A layer of silicon oxide 1430 is deposited above it. FIG. 14G is a drawing illustration after Step (A).

Step (B): Using a procedure similar to FIG. 2A-E (as was presented in FIG. 5A-F), layers of n+ Si 1444 and p+ Si 1448 are transferred above the bottom wafer 1438 one after another. The top wafer 1440 therefore include a bilayer of n+ and p+ Si. FIG. 14H is a drawing illustration after Step (B).

Step (C): p-channel junctionless transistors 1450 of the CMOS circuit can be formed on the p+ Si layer 1448 with standard procedures. For n-channel junction-less transistors 1452 of the CMOS circuit, one needs to etch through the p+ layer 1448 to reach the n+ Si layer 1444. Transistors are then constructed on the n+ Si 1444. Due to depth-of-focus issues associated with lithography, one requires separate lithography steps while constructing different parts of re-channel and p-channel transistors. FIG. 14I is a drawing illustration after Step (C).

Section 1.3.2: Accurate Transfer of Thin Layers of Silicon with Ion-Cut

Figure 15A:
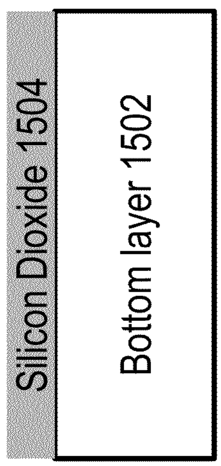
FIG. 15A-F show a procedure for accurate layer transfer of thin silicon regions.

It is often desirable to transfer very thin layers of silicon (<100 nm) atop a bottom layer of transistors and wires using the ion-cut technique. For example, for the process flow in FIG. 11A-F, it may be desirable to have very thin layers (<100 nm) of n+Si 1109. In that scenario, implanting hydrogen and cleaving the n+ region may not give the exact thickness of n+ Si desirable for device operation. An improved process for addressing this issue is shown in FIG. 15A-F. The process flow in FIG. 15A-F may include several steps as described in the following sequence:

Step (A): A silicon dioxide layer 1504 is deposited above the generic bottom layer 1502. FIG. 15A illustrates the structure after Step (A).

Figure 15B:
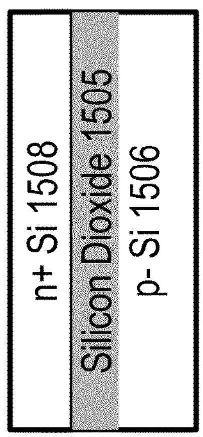

Step (B): An SOI wafer 1506 is implanted with n+ near its surface to form a n+ Si layer 1508. The buried oxide (BOX) of the SOI wafer is silicon dioxide 1505. FIG. 15B illustrates the structure after Step (B).

Step (C): A p− Si layer 1510 is epitaxially grown atop the n+ Si layer 1508. A silicon dioxide layer 1512 is deposited atop the p− Si layer 1510. An anneal (such as a rapid thermal anneal RTA or spike anneal or laser anneal) is conducted to activate dopants. Alternatively, the n+ Si layer 1508 and p− Si layer 1510 can be formed by a buried layer implant of n+ Si in a p− SOI wafer.

Figure 15C:
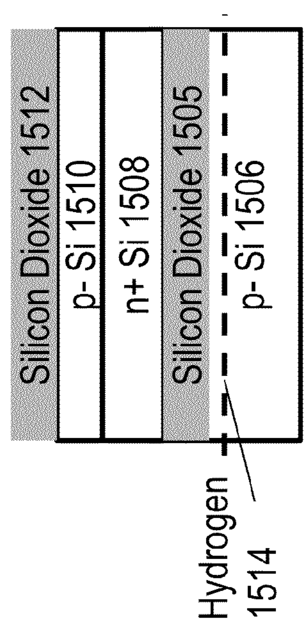

Hydrogen is then implanted into the p− Si layer 1506 at a certain depth 1514. Alternatively, another atomic species such as helium can be implanted or co-implanted. FIG. 15C illustrates the structure after Step (C).

Figure 15D:
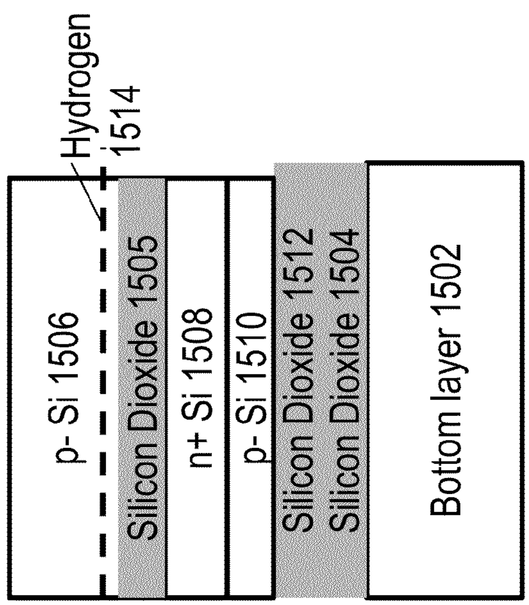

Step (D): The top layer wafer shown after Step (C) is flipped and bonded atop the bottom layer wafer using oxide-to-oxide bonding. FIG. 15D illustrates the structure after Step (D).

Figure 15E:

Step (E): A cleave operation is performed at the hydrogen plane 1514 using an anneal. Alternatively, a sideways mechanical force may be used. Following this, an etching process that etches Si but does not etch silicon dioxide is utilized to remove the p− Si layer 1506 remaining after cleave. The buried oxide (BOX) 1505 acts as an etch stop. FIG. 15E illustrates the structure after Step (E).

Figure 15F:
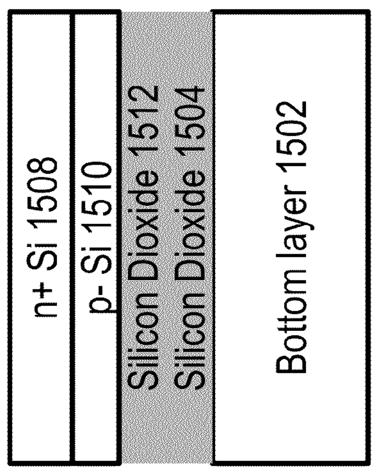

Step (F): Once the etch stop 1505 is reached, an etch or CMP process is utilized to etch the silicon dioxide layer 1505 till the n+ silicon layer 1508 is reached. The etch process for Step (F) is preferentially chosen so that it etches silicon dioxide but does not attack Silicon. FIG. 15F illustrates the structure after Step (F).

It is clear from the process shown in FIG. 15A-F that one can get excellent control of the n+ layer 1508's thickness after layer transfer.

Figure 16A:
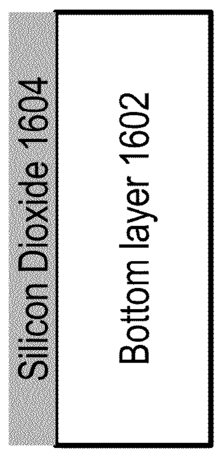
FIG. 16A-F show an alternative procedure for accurate layer transfer of thin silicon regions.

While the process shown in FIG. 15A-F results in accurate layer transfer of thin regions, it has some drawbacks. SOI wafers are typically quite costly, and utilizing an SOI wafer just for having an etch stop layer may not always be economically viable. In that case, an alternative process shown in FIG. 16A-F could be utilized. The process flow in FIG. 16A-F may include several steps as described in the following sequence:

Step (A): A silicon dioxide layer 1604 is deposited above the generic bottom layer 1602. FIG. 16A illustrates the structure after Step (A).

Figure 16B:
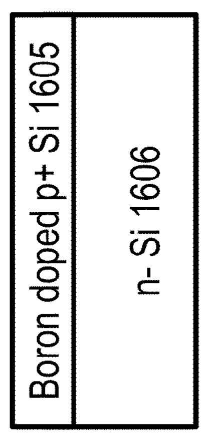

Step (B): A n− Si wafer 1606 is implanted with boron doped p+ Si near its surface to form a p+ Si layer 1605. The p+ layer is doped above 1E20/cm$^3$, and preferably above 1E21/cm$^3$. It may be possible to use a p− Si layer instead of the p+ Si layer 1605 as well, and still achieve similar results. A p− Si wafer can be utilized instead of the n− Si wafer 1606 as well. FIG. 16B illustrates the structure after Step (B).

Step (C): A n+ Si layer 1608 and a p− Si layer 1610 are epitaxially grown atop the p+ Si layer 1605. A silicon dioxide layer 1612 is deposited atop the p− Si layer 1610. An anneal (such as a rapid thermal anneal RTA or spike anneal or laser anneal) is conducted to activate dopants. Alternatively, the p+ Si layer 1605, the n+ Si layer 1608 and the p− Si layer 1610 can be formed by a series of implants on a n− Si wafer 1606.

Figure 16C:
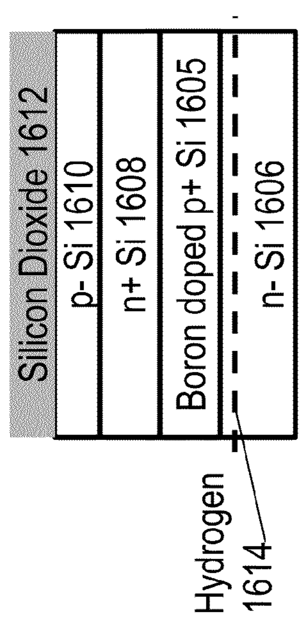

Hydrogen is then implanted into the p− Si layer 1606 at a certain depth 1614. Alternatively, another atomic species such as helium can be implanted. FIG. 16C illustrates the structure after Step (C).

Figure 16D:
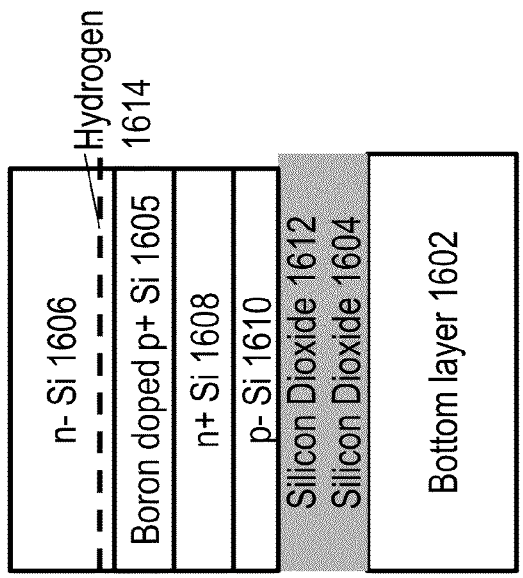

Step (D): The top layer wafer shown after Step (C) is flipped and bonded atop the bottom layer wafer using oxide-to-oxide bonding. FIG. 16D illustrates the structure after Step (D).

Figure 16E:
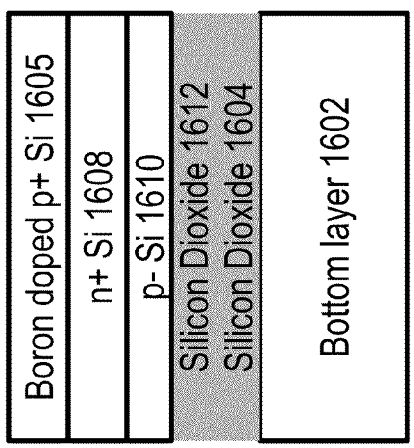

Step (E): A cleave operation is performed at the hydrogen plane 1614 using an anneal. Alternatively, a sideways mechanical force may be used. Following this, an etching process that etches the n− Si layer 1606 but does not etch the p+ Si etch stop layer 1605 is utilized to etch through the n− Si layer 1606 remaining after cleave. Examples of etching agents that etch n− Si or p− Si but do not attack p+ Si doped above 1E20/cm$^3$ include KOH, EDP (ethylenediamine/pyrocatechol/water) and hydrazine. FIG. 16E illustrates the structure after Step (E).

Figure 16F:
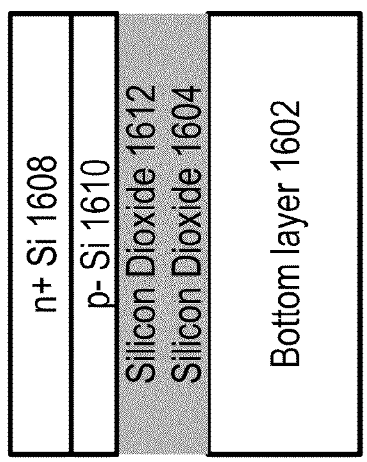

Step (F): Once the etch stop 1605 is reached, an etch or CMP process is utilized to etch the p+ Si layer 1605 till the n+ silicon layer 1608 is reached. FIG. 16F illustrates the structure after Step (F).

It is clear from the process shown in FIG. 16A-F that one can get excellent control of the n+ layer 1608's thickness after layer transfer.

While silicon dioxide and p+ Si were utilized as etch stop layers in FIG. 15A-F and FIG. 16A-F respectively, other etch stop layers such as SiGe could be utilized. An etch stop layer of SiGe can be incorporated in the middle of the structure shown in FIG. 16A-F using an epitaxy process.

Figure 17A:
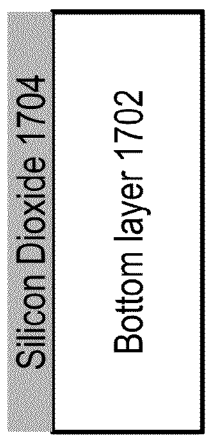
FIG. 17A-E show an alternative procedure for low-temperature layer transfer with ion-cut.

Section 1.3.3: Alternative Low-Temperature (Sub-300° C.) Ion-Cut Process for Sub-400° C. Processed Transistors An alternative low-temperature ion-cut process is described in FIG. 17A-E. The process flow in FIG. 17A-E may include several steps as described in the following sequence:

Step (A): A silicon dioxide layer 1704 is deposited above the generic bottom layer 1702. FIG. 17A illustrates the structure after Step (A).

Figure 17B:
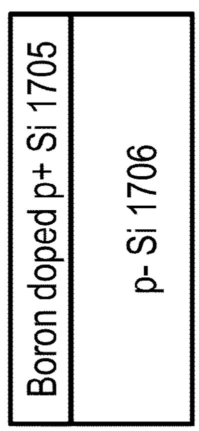

Step (B): A p− Si wafer 1706 is implanted with boron doped p+ Si near its surface to form a p+ Si layer 1705. A n− Si wafer can be utilized instead of the p− Si wafer 1606 as well. FIG. 17B illustrates the structure after Step (B).

Step (C): A n+ Si layer 1708 and a p− Si layer 1710 are epitaxially grown atop the p+ Si layer 1705. A silicon dioxide layer 1712 is grown or deposited atop the p− Si layer 1710. An anneal (such as a rapid thermal anneal RTA or spike anneal or laser anneal) is conducted to activate dopants.

Alternatively, the p+ Si layer 1705, the n+ Si layer 1708 and the p− Si layer 1710 can be formed by a series of implants on a p− Si wafer 1706.

Figure 17C:
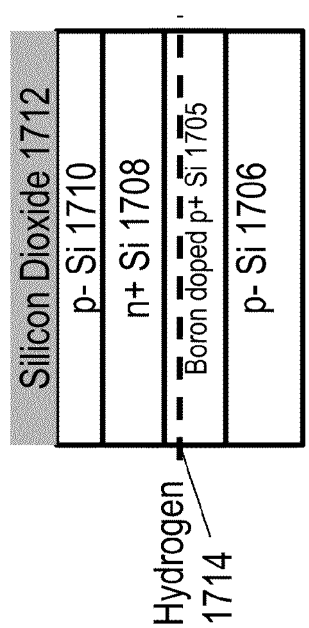

Hydrogen is then implanted into the p− Si layer 1706 at a certain depth 1714. Alternatively, another atomic species such as helium can be (co-)implanted. FIG. 17C illustrates the structure after Step (C).

Figure 17D:
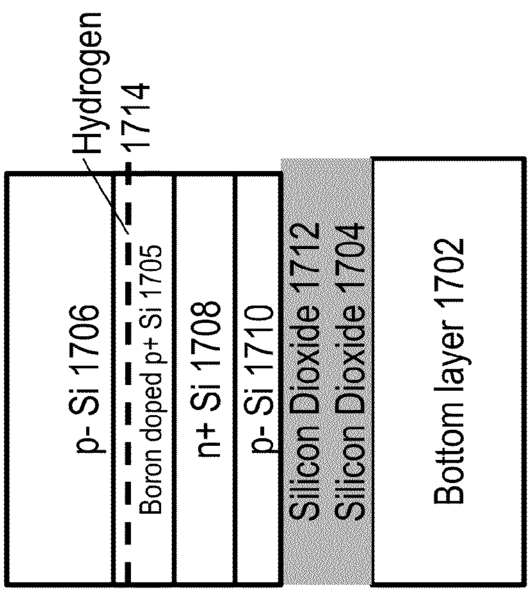

Step (D): The top layer wafer shown after Step (C) is flipped and bonded atop the bottom layer wafer using oxide-to-oxide bonding. FIG. 17D illustrates the structure after Step (D).

Figure 17E:
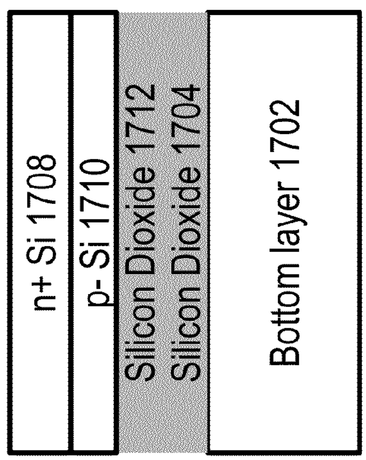

Step (E): A cleave operation is performed at the hydrogen plane 1714 using a sub-300° C. anneal. Alternatively, a sideways mechanical force may be used. An etch or CMP process is utilized to etch the p+ Si layer 1705 till the n+ silicon layer 1708 is reached. FIG. 17E illustrates the structure after Step (E).

The purpose of hydrogen implantation into the p+ Si region 1705 is because p+ regions heavily doped with boron are known to require lower anneal temperature required for ion-cut. Further details of this technology/process are given in "Cold ion-cutting of hydrogen implanted Si, Nuclear Instruments and Methods in Physics Research Section B: Beam Interactions with Materials and Atoms", Volume 190, Issues 1-4, May 2002, Pages 761-766, ISSN 0168-583X by K. Henttinen, T. Suni, A. Nurmela, et al. ("Hentinnen and Suni"). The contents of these publications are incorporated herein by reference.

Section 1.3.4: Alternative Procedures for Layer Transfer

While ion-cut has been described in previous sections as the method for layer transfer, several other procedures exist that fulfill the same objective. These include:

Lift-off or laser lift-off: Background information for this technology is given in "Epitaxial lift-off and its applications", 1993 Semicond. Sci. Technol. 8 1124 by P Demeester et al. ("Demeester").

Porous-Si approaches such as ELTRAN: Background information for this technology is given in "Eltran, Novel SOI Wafer Technology", JSAP International, Number 4, July 2001 by T. Yonehara and K. Sakaguchi ("Yonehara") and also in "Frontiers of silicon-on-insulator," J. Appl. Phys. 93, 4955-4978, 2003 by G. K. Celler and S. Cristoloveanu ("Celler").

Time-controlled etch-back to thin an initial substrate, Polishing, Etch-stop layer controlled etch-back to thin an initial substrate: Background information on these technologies is given in Celler and in U.S. Pat. No. 6,806,171.

Rubber-stamp based layer transfer: Background information on this technology is given in "Solar cells sliced and diced", 19 May 2010, Nature News.

The above publications giving background information on various layer transfer procedures are incorporated herein by reference. It is obvious to one skilled in the art that one can form 3D integrated circuits and chips as described in this document with layer transfer schemes described in these publications.

Figure 18A:
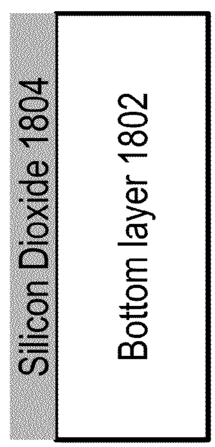
FIG. 18A-F show a procedure for layer transfer using an etch-stop layer controlled etch-back.

FIG. 18A-F shows a procedure using etch-stop layer controlled etch-back for layer transfer. The process flow in FIG. 18A-F may include several steps in the following sequence:

Step (A): A silicon dioxide layer 1804 is deposited above the generic bottom layer 1802. FIG. 18A illustrates the structure after Step (A).

Figure 18B:
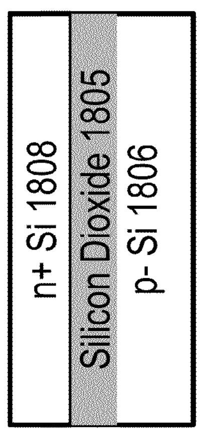

Step (B): A SOI wafer 1806 is implanted with n+ near its surface to form a n+ Si layer 1808. The buried oxide (BOX) of the SOI wafer is silicon dioxide 1805. FIG. 18B illustrates the structure after Step (B).

Figure 18C:

Step (C): A p− Si layer 1810 is epitaxially grown atop the n+ Si layer 1808. A silicon dioxide layer 1812 is grown/deposited atop the p− Si layer 1810. An anneal (such as a rapid thermal anneal RTA or spike anneal or laser anneal) is conducted to activate dopants. FIG. 18C illustrates the structure after Step (C).

Alternatively, the n+ Si layer 1808 and p− Si layer 1810 can be formed by a buried layer implant of n+ Si in a p− SOI wafer.

Figure 18D:
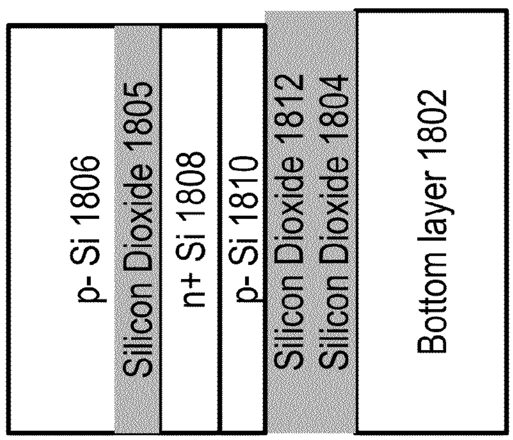

Step (D): The top layer wafer shown after Step (C) is flipped and bonded atop the bottom layer wafer using oxide-to-oxide bonding. FIG. 18D illustrates the structure after Step (D).

Figure 18E:
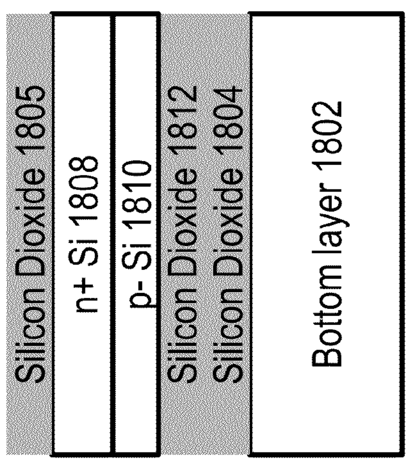

Step (E): An etch process that etches Si but does not etch silicon dioxide is utilized to etch through the p− Si layer 1806. The buried oxide (BOX) of silicon dioxide 1805 therefore acts as an etch stop. FIG. 18E illustrates the structure after Step (E).

Figure 18F:
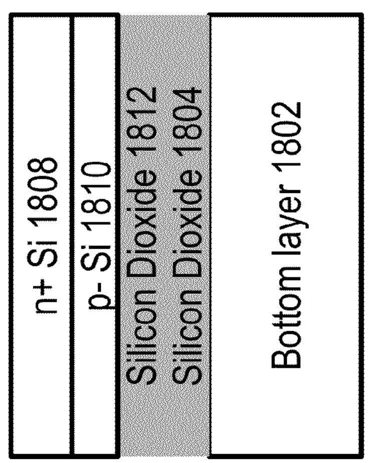

Step (F): Once the etch stop 1805 is reached, an etch or CMP process is utilized to etch the silicon dioxide layer 1805 till the n+ silicon layer 1808 is reached. The etch process for Step (F) is preferentially chosen so that it etches silicon dioxide but does not attack Silicon. FIG. 18F illustrates the structure after Step (F).

At the end of the process shown in FIG. 18A-F, the desired regions are layer transferred atop the bottom layer 1802. While FIG. 18A-F shows an etch-stop layer controlled etch-back using a silicon dioxide etch stop layer, other etch stop layers such as SiGe or p+ Si can be utilized in alternative process flows.

Figure 19:
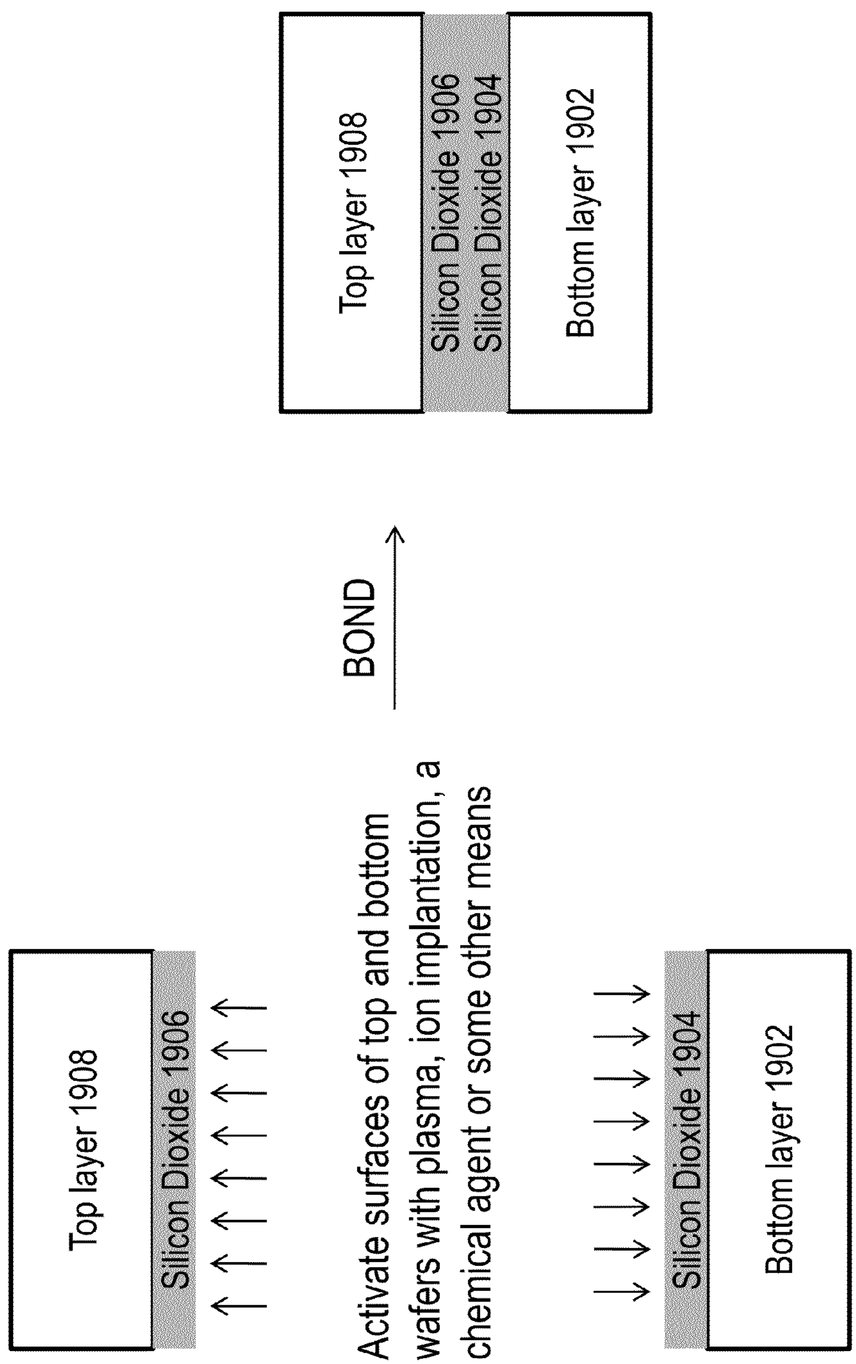
FIG. 19 show a surface-activated bonding for low-temperature sub-400° C. processing.

FIG. 19 shows various methods one can use to bond a top layer wafer 1908 to a bottom wafer 1902. Oxide-oxide bonding of a layer of silicon dioxide 1906 and a layer of silicon dioxide 1904 is used. Before bonding, various methods can be utilized to activate surfaces of the layer of silicon dioxide 1906 and the layer of silicon dioxide 1904. A plasma-activated bonding process such as the procedure described in US Patent 20090081848 or the procedure described in "Plasma-activated wafer bonding: the new low-temperature tool for MEMS fabrication", Proc. SPIE 6589, 65890T (2007), DOI: 10.1117/12.721937 by V. Dragoi, G. Mittendorfer, C. Thanner, and P. Lindner ("Dragoi") can be used. Alternatively, an ion implantation process such as the one described in US Patent 20090081848 or elsewhere can be used. Alternatively, a wet chemical treatment can be utilized for activation. Other methods to perform oxide-to-oxide bonding can also be utilized. While oxide-to-oxide bonding has been described as a method to bond together different layers of the 3D stack, other methods of bonding such as metal-to-metal bonding can also be utilized.

Figure 20A:
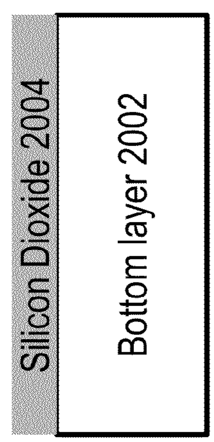
FIG. 20A-E show description of Ge or III-V semiconductor Layer Transfer Flow using Ion-Cut.

FIG. 20A-E depict layer transfer of a Germanium or a III-V semiconductor layer to form part of a 3D integrated circuit or chip or system. These layers could be utilized for forming optical components or form forming better quality (higher-performance or lower-power) transistors. FIG. 20A-E describes an ion-cut flow for layer transferring a single crystal Germanium or III-V semiconductor layer 2007 atop any generic bottom layer 2002. The bottom layer 2002 can be a single crystal silicon layer or some other semiconductor layer. Alternatively, it can be a wafer having transistors with wiring layers above it. This process of ion-cut based layer transfer may include several steps as described in the following sequence:

Step (A): A silicon dioxide layer 2004 is deposited above the generic bottom layer 2002. FIG. 20A illustrates the structure after Step (A).

Figure 20B:
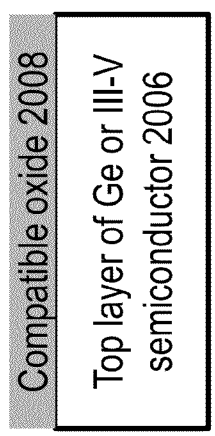

Step (B): The layer to be transferred atop the bottom layer (top layer of doped germanium or III-V semiconductor 2006) is processed and a compatible oxide layer 2008 is deposited above it. FIG. 20B illustrates the structure after Step (B).

Figure 20C:
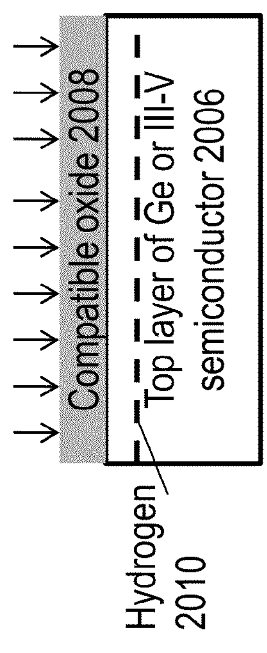

Step (C): Hydrogen is implanted into the Top layer doped Germanium or III-V semiconductor 2006 at a certain depth 2010. Alternatively, another atomic species such as helium can be (co-) implanted. FIG. 20C illustrates the structure after Step (C).

Figure 20D:
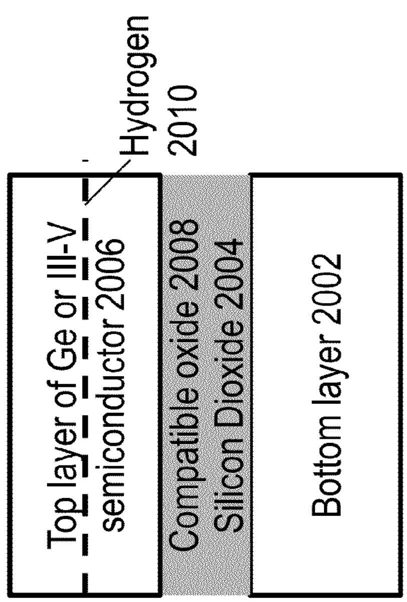

Step (D): The top layer wafer shown after Step (C) is flipped and bonded atop the bottom layer wafer using oxide-to-oxide bonding. FIG. 20D illustrates the structure after Step (D).

Figure 20E:
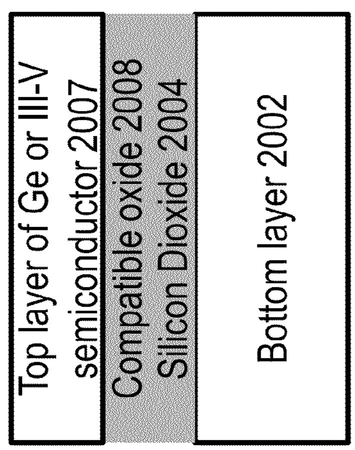

Step (E): A cleave operation is performed at the hydrogen plane 2010 using an anneal or a mechanical force. Following this, a Chemical-Mechanical-Polish (CMP) is done. FIG. 20E illustrates the structure after Step (E).

Section 1.3.5: Laser Anneal Procedure for 3D Stacked Components and Chips

Figure 21A:
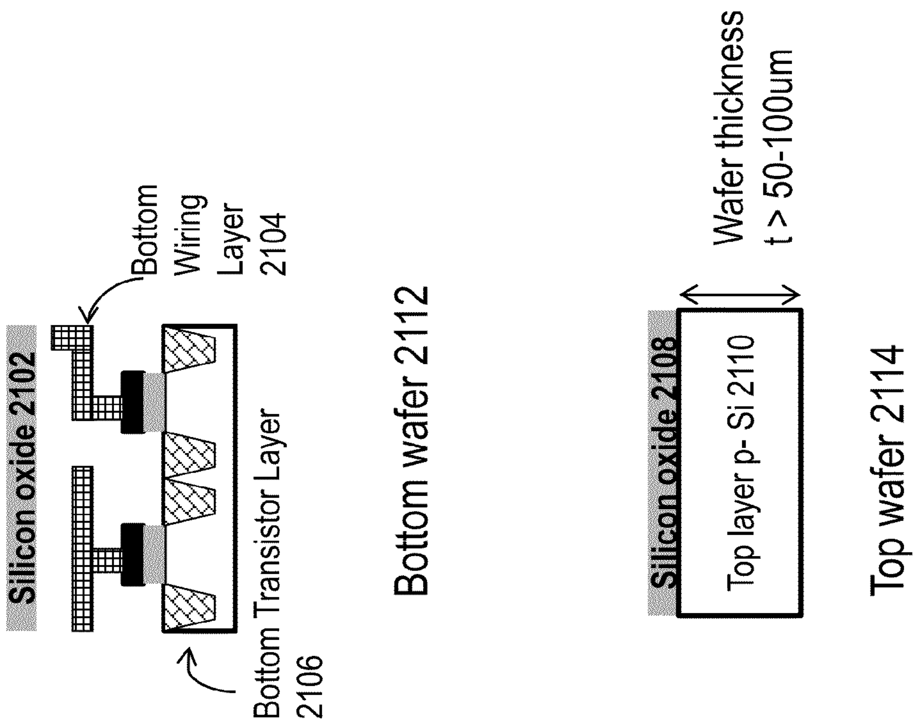
FIG. 21A-C show laser-anneal based 3D chips (prior art).
Figure 21B:
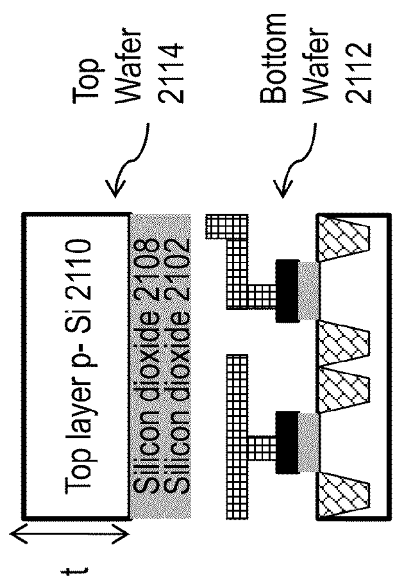
Figure 21C:
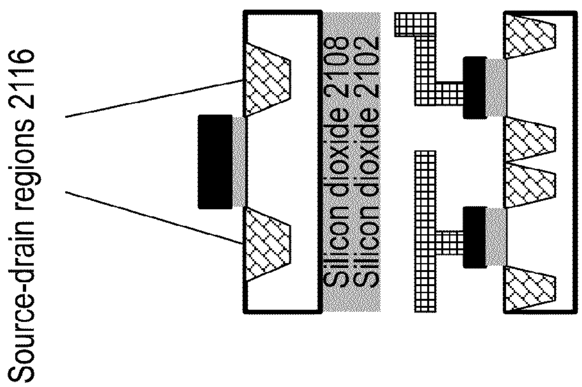

FIG. 21A-C describes a prior art process flow for constructing 3D stacked circuits and chips using laser anneal techniques. Note that the terms laser anneal and optical anneal are utilized interchangeably in this document. This procedure is described in "Electrical Integrity of MOS Devices in Laser Annealed 3D IC Structures" in the proceedings of VMIC 2004 by B. Rajendran, R. S. Shenoy, M. O. Thompson & R. F. W. Pease. The process may include several steps as described in the following sequence:

Step (A): The bottom wafer 2112 is processed with transistor and wiring layers. The top wafer may include a layer of silicon 2110 with an oxide layer above it. The thickness of the silicon layer 2110, t, is typically >50 um. FIG. 21A illustrates the structure after Step (A).

Step (B): The top wafer 2114 is flipped and bonded to the bottom wafer 2112. It can be readily seen that the thickness of the top layer is >50 um. Due to this high thickness, and due to the fact that the aspect ratio (height to width ratio) of through-silicon connections is limited to <100:1, it can be seen that the minimum width of through-silicon connections possible with this procedure is 50 um/100=500 nm. This is much higher than dimensions of horizontal wiring on a chip. FIG. 21B illustrates the structure after Step (B).

Step (C): Transistors are then built on the top wafer 2114 and a laser anneal is utilized to activate dopants in the top silicon layer. Due to the characteristics of a laser anneal, the temperature in the top layer 2114 will be much higher than the temperature in the bottom layer 2112. FIG. 21C illustrates the structure after Step (C).

An alternative procedure described in prior art is the SOI-based layer transfer (shown in FIG. 18A-F) followed by a laser anneal. This process is described in "Sequential 3D IC Fabrication: Challenges and Prospects", by Bipin Rajendran in VMIC 2006.

An alternative procedure for laser anneal of layer transferred silicon is shown in FIG. 22A-E. The process may include several steps as described in the following sequence.

Figure 22A:
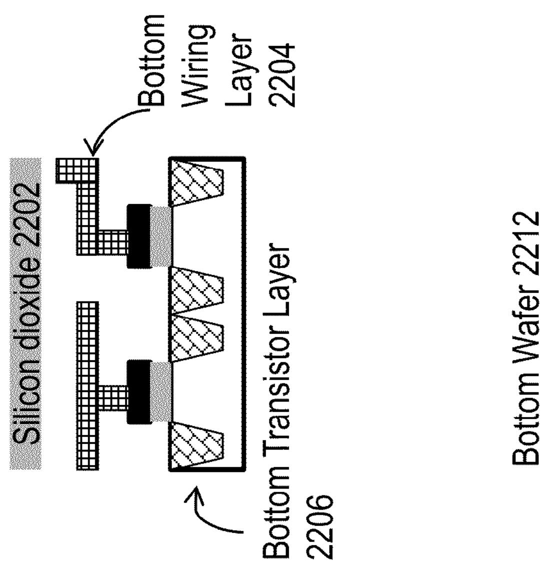
FIG. 22A-E show a laser-anneal based layer transfer process.

Step (A): A bottom wafer 2212 is processed with transistor, wiring and silicon dioxide layers. FIG. 22A illustrates the structure after Step (A).

Figure 22B:
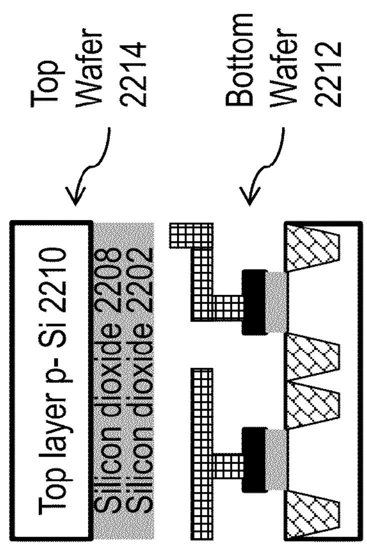

Step (B): A top layer of silicon 2210 is layer transferred atop it using procedures similar to FIG. 2. FIG. 22B illustrates the structure after Step (B).

Figure 22C:
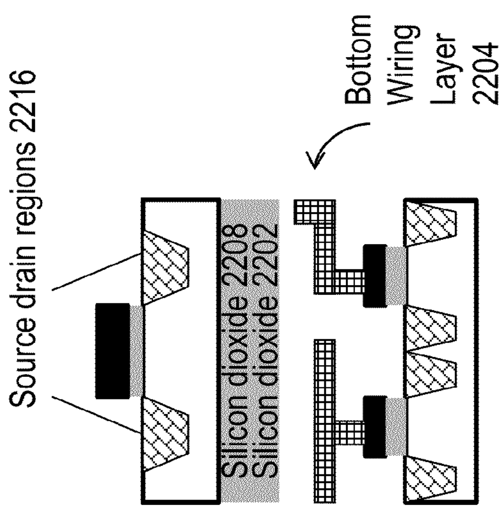

Step (C): Transistors are formed on the top layer of silicon 2210 and a laser anneal is done to activate dopants in source-drain regions 2216. Fabrication of the rest of the integrated circuit flow including contacts and wiring layers may then proceed. FIG. 22C illustrates the structure after Step (C).

Figure 22D:
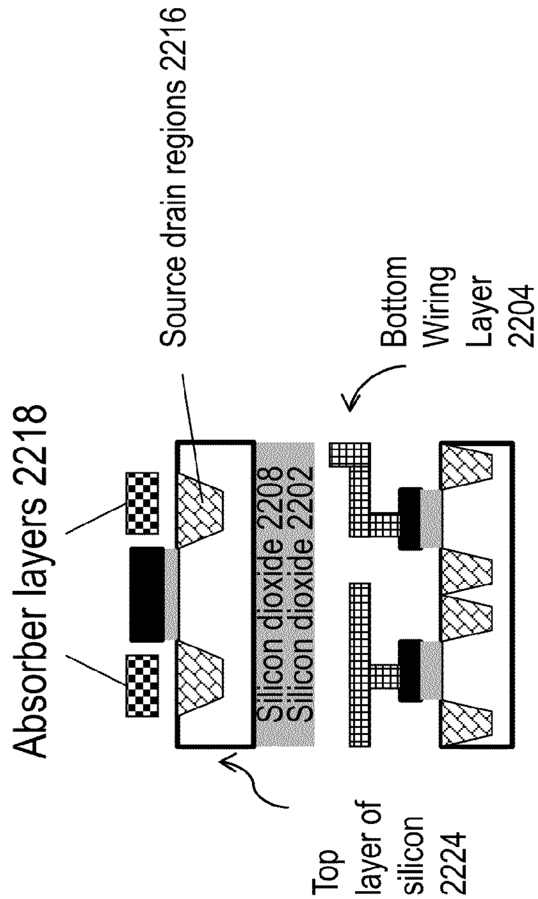
Figure 22E:
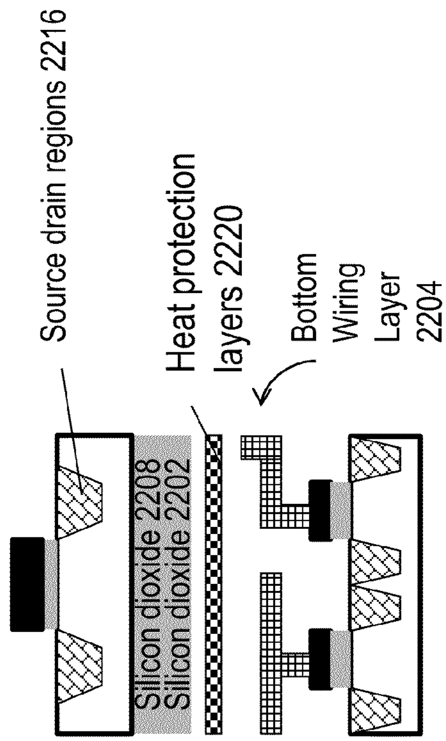

FIG. 22(D) shows that absorber layers 2218 may be used to efficiently heat the top layer of silicon 2224 while ensuring temperatures at the bottom wiring layer 2204 are low (<500° C.). FIG. 22(E) shows that one could use heat protection layers 2220 situated in between the top and bottom layers of silicon to keep temperatures at the bottom wiring layer 2204 low (<500° C.). These heat protection layers could be constructed of optimized materials that reflect laser radiation and reduce heat conducted to the bottom wiring layer. The terms heat protection layer and shield can be used interchangeably in this document.

Figure 23A:
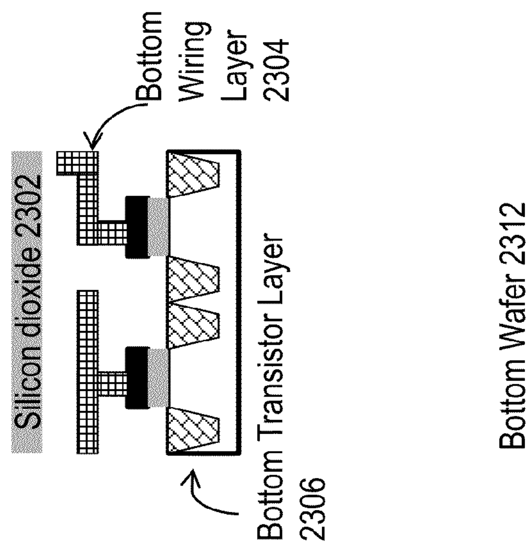
FIG. 23A-C show window for alignment of top wafer to bottom wafer.
Figure 23B:
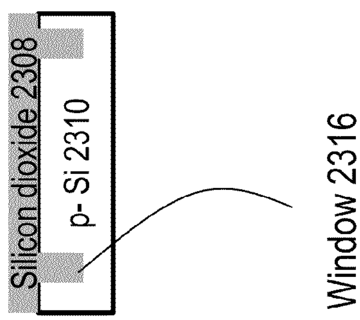
Figure 23C:
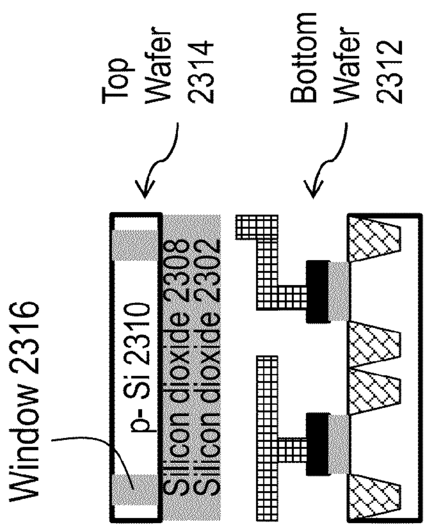

Most of the figures described thus far in this document assumed the transferred top layer of silicon is very thin (preferably <200 nm). This enables light to penetrate the silicon and allows features on the bottom wafer to be observed. However, that is not always the case. FIG. 23A-C shows a process flow for constructing 3D stacked chips and circuits when the thickness of the transferred/stacked piece of silicon is so high that light does not penetrate the transferred piece of silicon to observe the alignment marks on the bottom wafer. The process to allow for alignment to the bottom wafer may include several steps as described in the following sequence.

Step (A): A bottom wafer 2312 is processed to form a bottom transistor layer 2306 and a bottom wiring layer 2304. A layer of silicon oxide 2302 is deposited above it. FIG. 23A illustrates the structure after Step (A).

Step (B): A wafer of p− Si 2310 has an oxide layer 2306 deposited or grown above it. Using lithography, a window pattern is etched into the p− Si 2310 and is filled with oxide. A step of CMP is done. This window pattern will be used in Step (C) to allow light to penetrate through the top layer of silicon to align to circuits on the bottom wafer 2312. The window size is chosen based on misalignment tolerance of the alignment scheme used while bonding the top wafer to the bottom wafer in Step (C). Furthermore, some alignment marks also exist in the wafer of p− Si 2310. FIG. 23B illustrates the structure after Step (B).

Step (C): A portion of the p− Si 2310 from Step (B) is transferred atop the bottom wafer 2312 using procedures similar to FIG. 2A-E. It can be observed that the window 2316 can be used for aligning features constructed on the top wafer 2314 to features on the bottom wafer 2312. Thus, the thickness of the top wafer 2314 can be chosen without constraints. FIG. 23C illustrates the structure after Step (C).

Figure 24A:
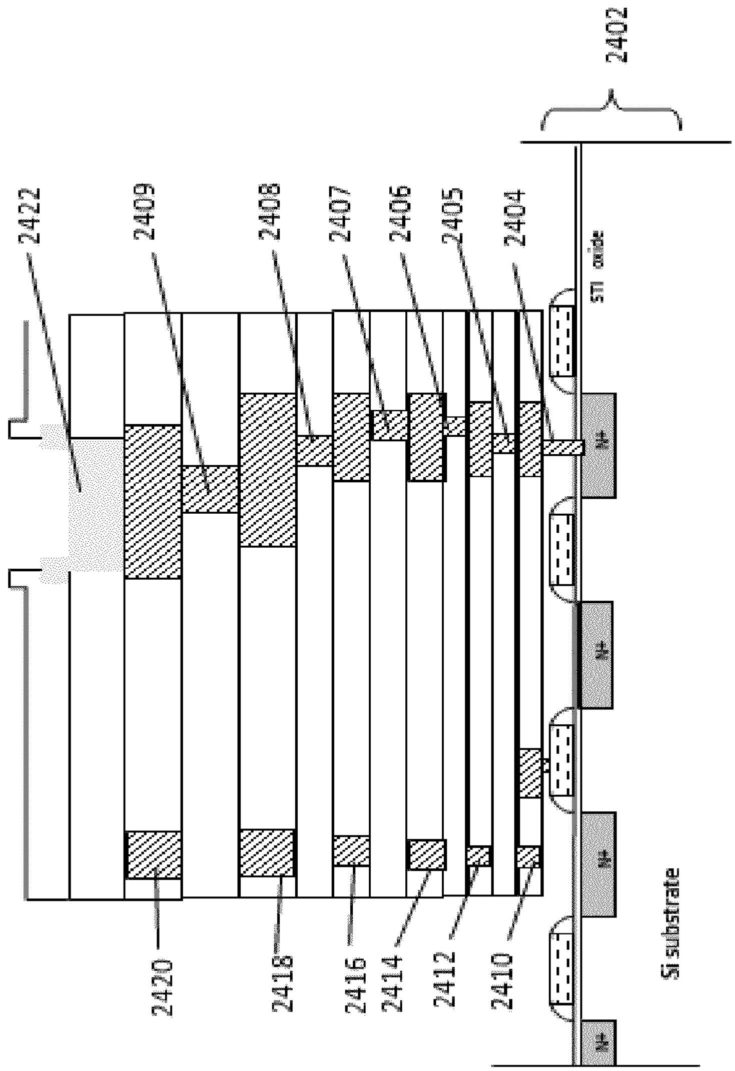
FIG. 24A-B show a metallization scheme for monolithic 3D integrated circuits and chips.

Additionally, when circuit cells are built on two or more layers of thin silicon, and enjoy the dense vertical through silicon via interconnections, the metallization layer scheme to take advantage of this dense 3D technology may be improved as follows. FIG. 24A illustrates the prior art of silicon integrated circuit metallization schemes. The conventional transistor silicon layer 2402 is connected to the first metal layer 2410 thru the contact 2404. The dimensions of this interconnect pair of contact and metal lines generally are at the minimum line resolution of the lithography and etch capability for that technology process node. Traditionally, this is called a "1X" design rule metal layer. Usually, the next metal layer is also at the "1X" design rule, the metal line 2412 and via below 2405 and via above 2406 that connects metals 2412 with 2410 or with 2414 where desired. Then the next few layers are often constructed at twice the minimum lithographic and etch capability and called '2X' metal layers, and have thicker metal for current carrying capability. These are illustrated with metal line 2414 paired with via 2407 and metal line 2416 paired with via 2408 in FIG. 24A. Accordingly, the metal via pairs of 2418 with 2409, and 2420 with bond pad opening 2422, represent the '4X' metallization layers where the planar and thickness dimensions are again larger and thicker than the 2X and 1X layers. The precise number of 1X or 2X or 4X layers may vary depending on interconnection needs and other requirements; however, the general flow is that of increasingly larger metal line, metal space, and via dimensions as the metal layers are farther from the silicon transistors and closer to the bond pads.

Figure 24B:
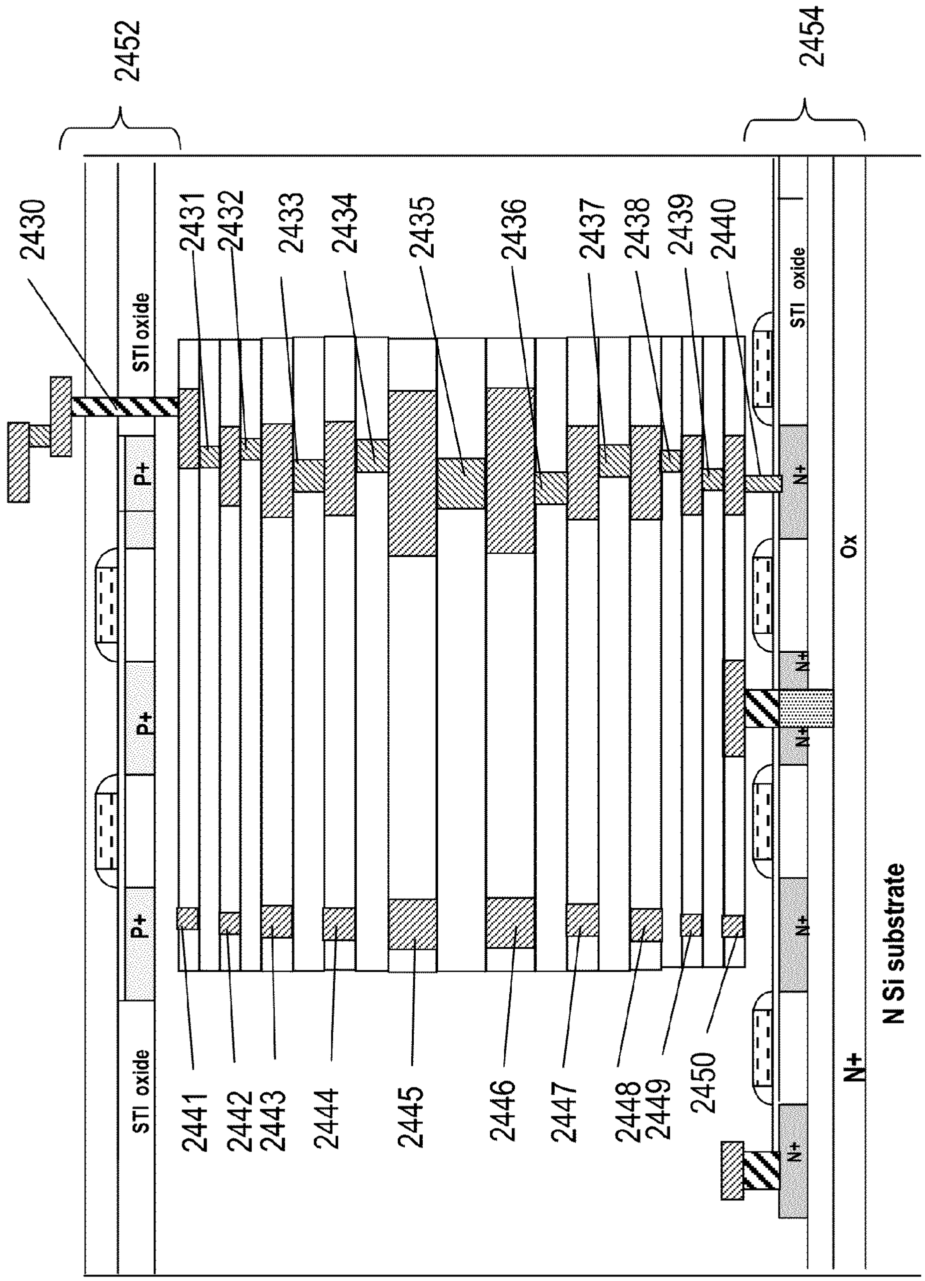

The metallization layer scheme may be improved for 3D circuits as illustrated in FIG. 24B. The first crystallized silicon device layer 2454 is illustrated as the NMOS silicon transistor layer from the above 3D library cells, but may also be a conventional logic transistor silicon substrate or layer. The '1X' metal layers 2450 and 2449 are connected with contact 2440 to the silicon transistors and vias 2438 and 2439 to each other or metal line 2448. The 2X layer pairs metal 2448 with via 2437 and metal 2447 with via 2436. The 4X metal layer 2446 is paired with via 2435 and metal 2445, also at 4X. However, now via 2434 is constructed in 2X design rules to enable metal line 2444 to be at 2X. Metal line 2443 and via 2433 are also at 2X design rules and thicknesses. Vias 2432 and 2431 are paired with metal lines 2442 and 2441 at the 1X minimum design rule dimensions and thickness. The thru silicon via 2430 of the illustrated PMOS layer transferred silicon 2452 may then be constructed at the 1X minimum design rules and provide for maximum density of the top layer. The precise numbers of 1X or 2X or 4X layers may vary depending on circuit area and current carrying metallization requirements and tradeoffs. The layer transferred top transistor layer 2452 may be any of the low temperature devices illustrated herein.

Figure 43A:
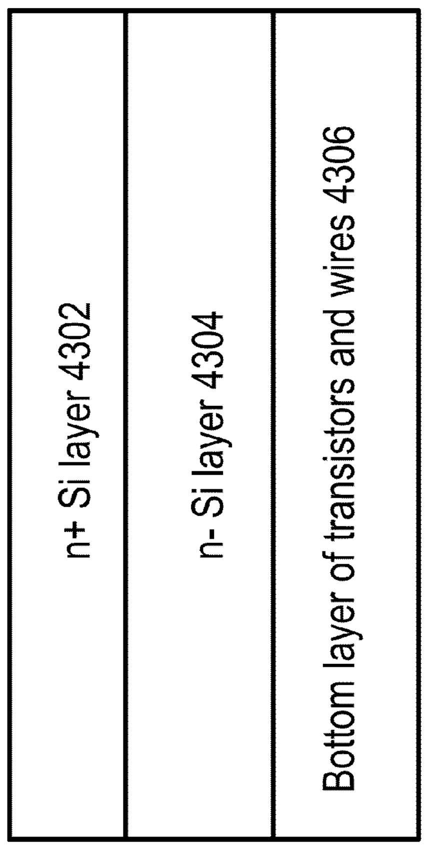
FIG. 43A-F depict an implementation of laser anneals for JFET devices.
Figure 43B:
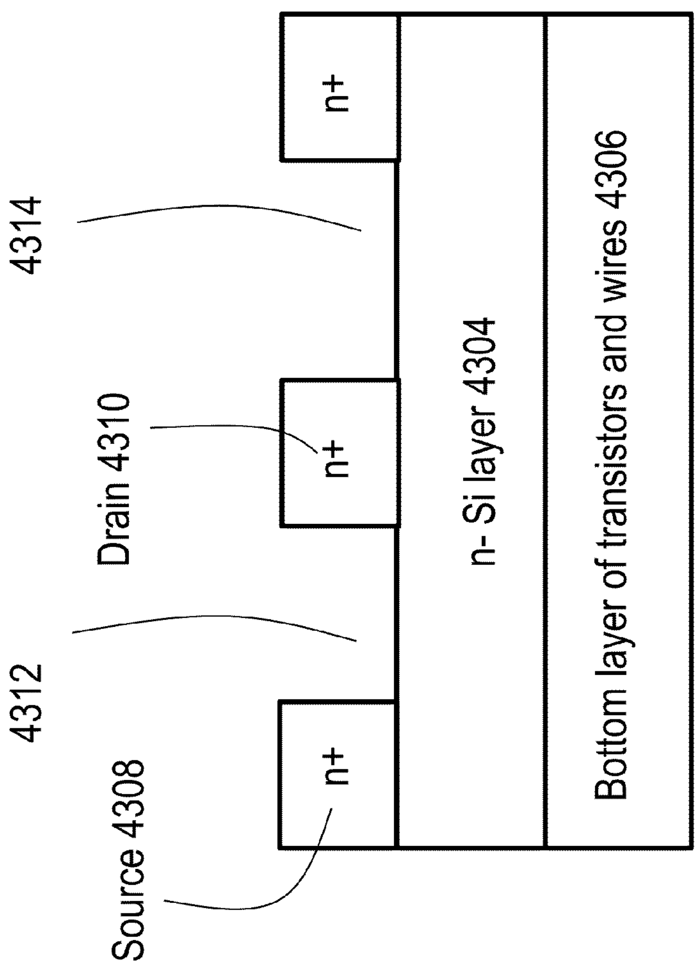
Figure 43C:
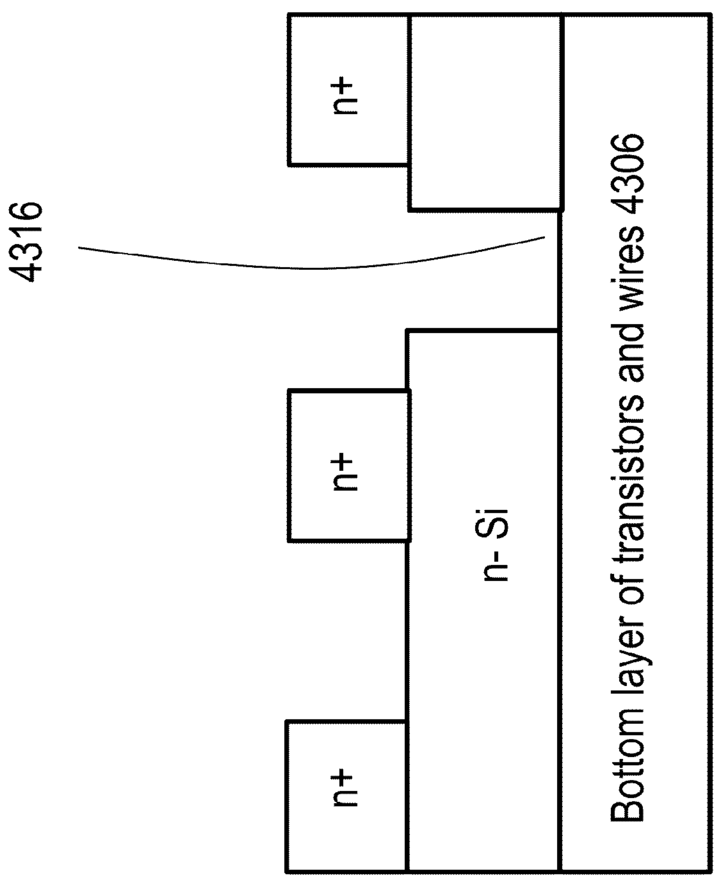
Figure 43D:
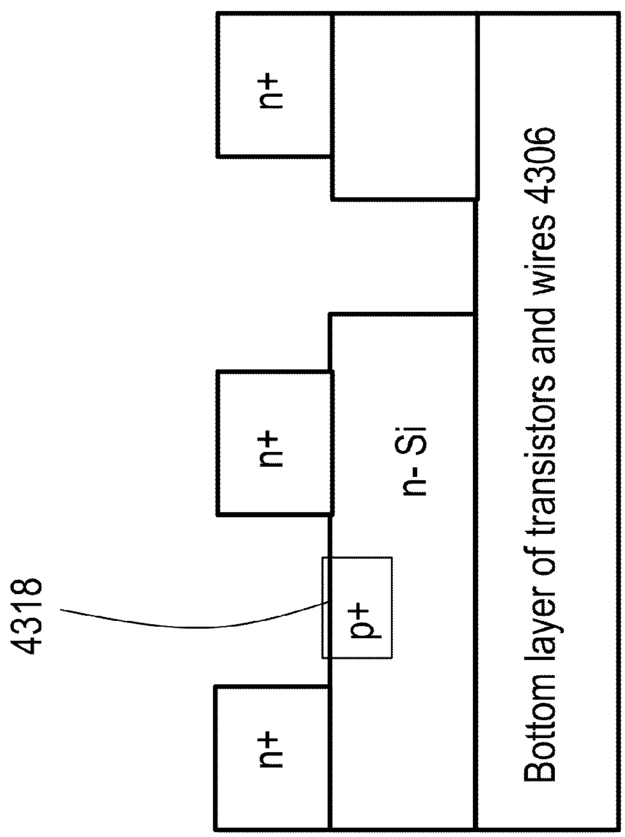
Figure 43E:
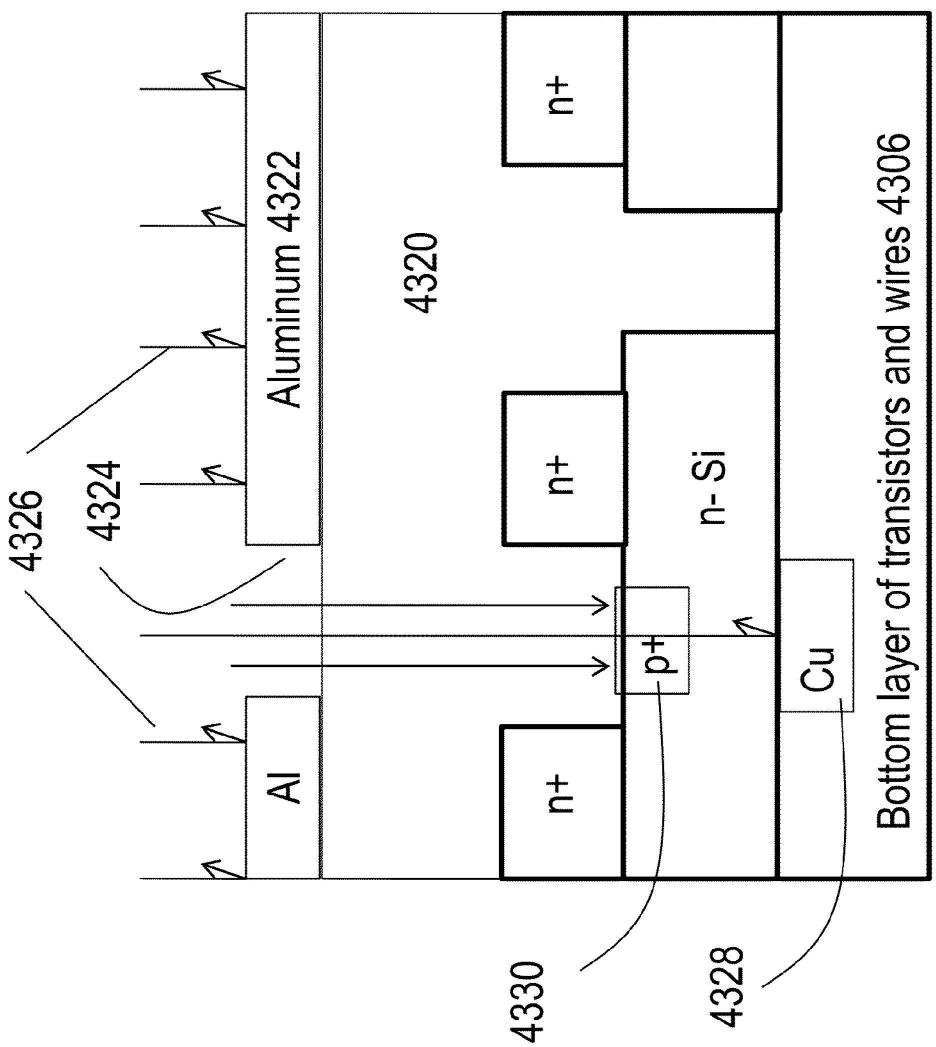
Figure 43F:
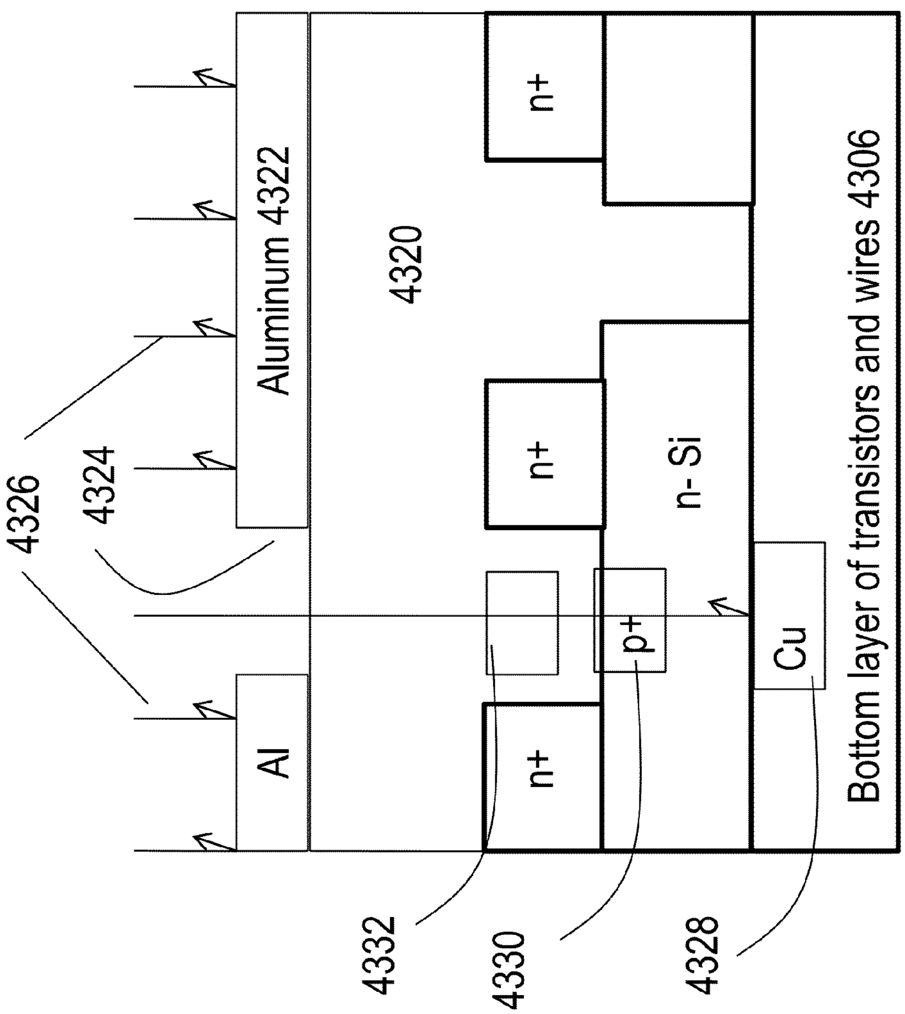

FIGS. 43A-G illustrate the formation of Junction Gate Field Effect Transistor (JFET) top transistors. FIG. 43A illustrates the structure after n− Si layer 4304 and n+ Si layer 4302 are transferred on top of a bottom layer of transistors and wires 4306. This is done using procedures similar to those shown in FIG. 11A-F. Then the top transistor source 4308 and drain 4310 are defined by etching away the n+ from the region designated for gates 4312 and the isolation region between transistors 4314. This step is aligned to the bottom layer of transistors and wires 4306 so the formed transistors could be properly connected to the underlying bottom layer of transistors and wires 4306. Then an additional masking and etch step is performed to remove the n− layer between transistors, shown as 4316, thus providing better transistor isolation as illustrated in FIG. 43C. FIG. 43D illustrates an optional formation of shallow p+ region 4318 for the JFET gate formation. In this option there might be a need for laser or other optical energy transfer anneal to activate the p+. FIG. 43E illustrates how to utilize the laser anneal and minimize the heat transfer to the bottom layer of transistors and wires 4306. After the thick oxide deposition 4320, a layer of Aluminum 4322, or other light reflecting material, is applied as a reflective layer. An opening 4324 in the reflective layer is masked and etched, allowing the laser light 4326 to heat the p+ implanted area 4330, and reflecting the majority of the laser energy 4326 away from layer 4306. Normally, the open area 4324 is less than 10% of the total wafer area. Additionally, a copper layer 4328, or, alternatively, a reflective Aluminum layer or other reflective material, may be formed in the layer 4306 that will additionally reflect any of the laser energy 4326 that might travel to layer 4306. This same reflective & open laser anneal technique might be utilized on any of the other illustrated structures to enable implant activation for transistors in the second layer transfer process flow. In addition, absorptive materials may, alone or in combination with reflective materials, also be utilized in the above laser or other optical energy transfer anneal techniques. A photonic energy absorbing layer 4332, such as amorphous carbon of an appropriate thickness, may be deposited or sputtered at low temperature over the area that needs to be laser heated, and then masked and etched as appropriate, as shown in FIG. 43F. This allows the minimum laser energy to be employed to effectively heat the area to be implant activated, and thereby minimizes the heat stress on the reflective layers 4322 & 4328 and the base layer 4306. The laser reflecting layer 4322 can then be etched or polished away and contacts can be made to various terminals of the transistor. This flow enables the formation of fully crystallized top JFET transistors that could be connected to the underlying multi-metal layer semiconductor device without exposing the underlying device to high temperature.

Section 2: Construction of 3D Stacked Semiconductor Circuits and Chips where Replacement Gate High-k/Metal Gate Transistors can be Used. Misalignment-Tolerance Techniques are Utilized to Get High Density of Connections.

Section 1 described the formation of 3D stacked semiconductor circuits and chips with sub-400° C. processing temperatures to build transistors and high density of vertical connections. In this section an alternative method is explained, in which a transistor is built with any replacement gate (or gate-last) scheme that is utilized widely in the industry. This method allows for high temperatures (above 400 C) to build the transistors. This method utilizes a combination of three concepts:

- Replacement gate (or gate-last) high k/metal gate fabrication
- Face-up layer transfer using a carrier wafer
- Misalignment tolerance techniques that utilize regular or repeating layouts. In these repeating layouts, transistors could be arranged in substantially parallel bands.

A very high density of vertical connections is possible with this method. Single crystal silicon (or monocrystalline silicon) layers that are transferred are less than 2 um thick, or could even be thinner than 0.4 um or 0.2 um.

Figure 25A:
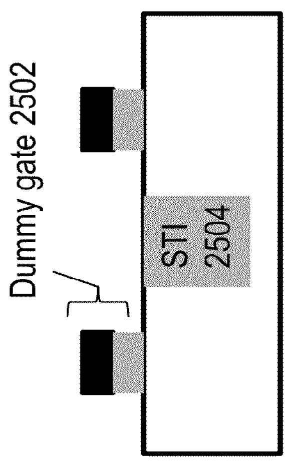
FIG. 25A-F show a process flow for 3D integrated circuits with gate-last high-k metal gate transistors and face-up layer transfer.

The method mentioned in the previous paragraph is described in FIG. 25A-F. The procedure may include several steps as described in the following sequence:

Step (A): After creating isolation regions using a shallow-trench-isolation (STI) process 2504, dummy gates 2502 are constructed with silicon dioxide and poly silicon. The term “dummy gates” is used since these gates will be replaced by high k gate dielectrics and metal gates later in the process flow, according to the standard replacement gate (or gate-last) process. Further details of replacement gate processes are described in “A 45 nm Logic Technology with High-k+Metal Gate Transistors, Strained Silicon, 9 Cu Interconnect Layers, 193 nm Dry Patterning, and 100% Pb-free Packaging,” IEDM Tech. Dig., pp. 247-250, 2007 by K. Mistry, et al. and “Ultralow-EOT (5 Å) Gate-First and Gate-Last High Performance CMOS Achieved by Gate-Electrode Optimization,” IEDM Tech. Dig., pp. 663-666, 2009 by L. Ragnarsson, et al. FIG. 25A illustrates the structure after Step (A).

Figure 25B:
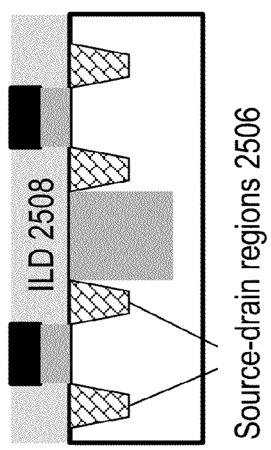

Step (B): Rest of the transistor fabrication flow proceeds with formation of source-drain regions 2506, strain enhancement layers to improve mobility, high temperature anneal to activate source-drain regions 2506, formation of inter-layer dielectric (ILD) 2508, etc. FIG. 25B illustrates the structure after Step (B).

Figure 25C:
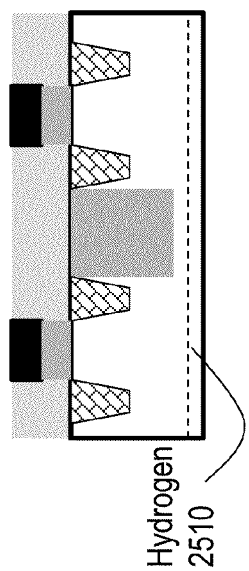

Step (C): Hydrogen is implanted into the wafer at the dotted line regions indicated by 2510. FIG. 25C illustrates the structure after Step (C).

Figure 25D:
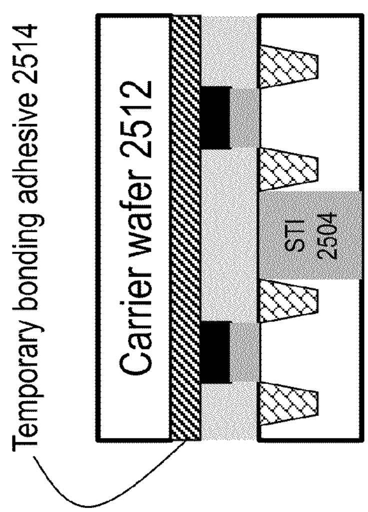

Step (D): The wafer after step (C) is bonded to a temporary carrier wafer 2512 using a temporary bonding adhesive 2514. This temporary carrier wafer 2512 could be constructed of glass. Alternatively, it could be constructed of silicon. The temporary bonding adhesive 2514 could be a polymer material, such as a polyimide. A anneal or a sideways mechanical force is utilized to cleave the wafer at the hydrogen plane 2510. A CMP process is then conducted. FIG. 25D illustrates the structure after Step (D).

Figure 25E:
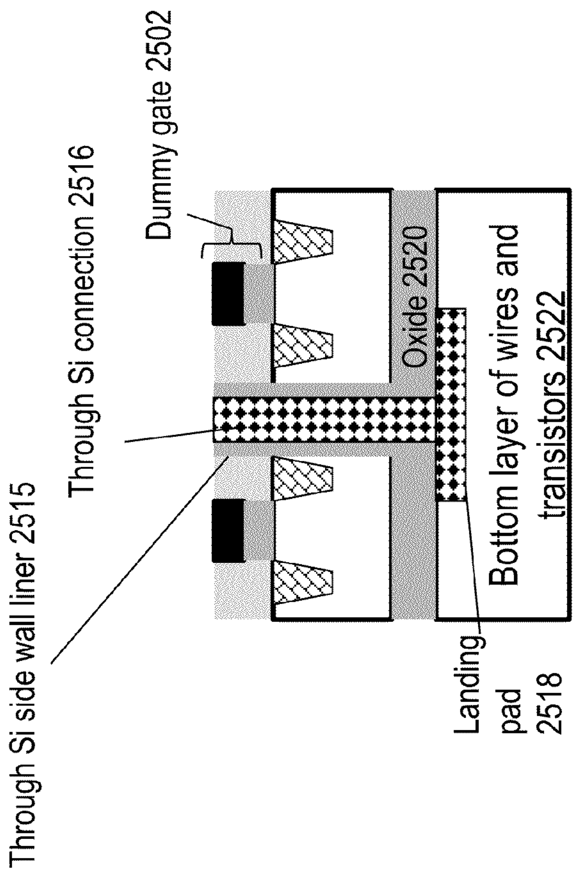

Step (E): An oxide layer is deposited onto the bottom of the wafer shown in Step (D). The wafer is then bonded to the bottom layer of wires and transistors 2522 using oxide-to-oxide bonding. The bottom layer of wires and transistors 2522 could also be called a base wafer. The temporary carrier wafer 2512 is then removed by shining a laser onto the temporary bonding adhesive 2514 through the temporary carrier wafer 2512 (which could be constructed of glass). Alternatively, an anneal could be used to remove the temporary bonding adhesive 2514. Through-silicon connections 2516 with a non-conducting (e.g. oxide) liner 2515 to the landing pads 2518 in the base wafer could be constructed at a very high density using special alignment methods to be described in FIG. 26A-D and FIG. 27A-F. FIG. 25E illustrates the structure after Step (E).

Figure 25F:
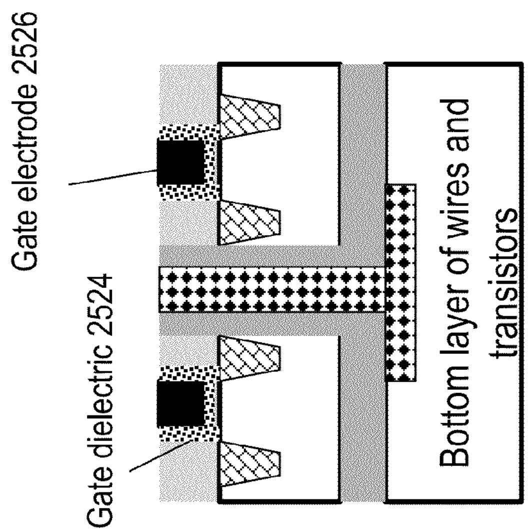

Step (F): Dummy gates 2502 are etched away, followed by the construction of a replacement with high k gate dielectrics 2524 and metal gates 2526. Essentially, partially-formed high performance transistors are layer transferred atop the base wafer (may also be called target wafer) followed by the completion of the transistor processing with a low (sub 400° C.) process. FIG. 25F illustrates the structure after Step (F). The remainder of the transistor, contact and wiring layers are then constructed.

It will be obvious to someone skilled in the art that alternative versions of this flow are possible with various methods to attach temporary carriers and with various versions of the gate-last process flow.

Figure 26A:
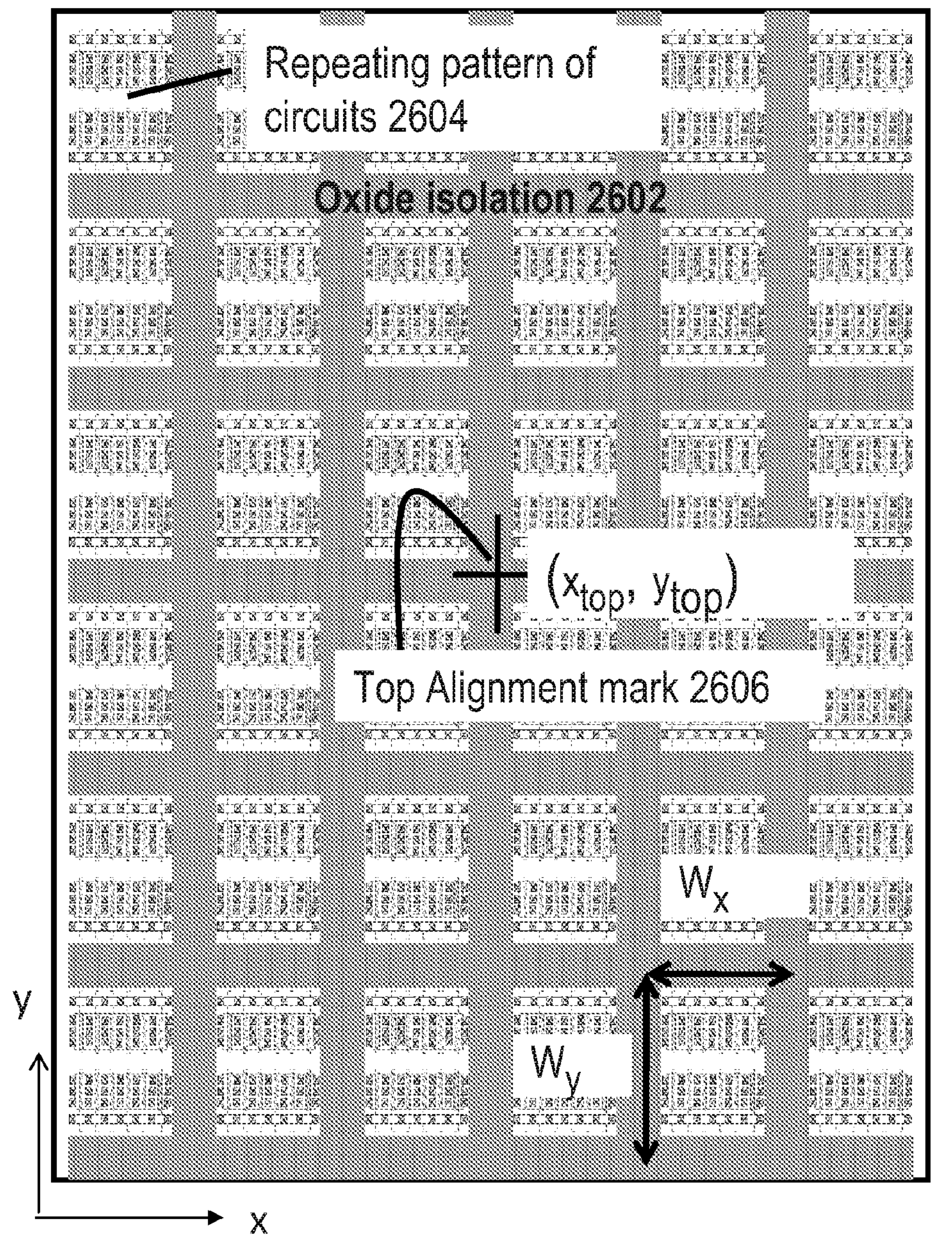
FIG. 26A-D show an alignment scheme for repeating pattern in X and Y directions.

FIG. 26A-D describes an alignment method for forming CMOS circuits with a high density of connections between 3D stacked layers. The alignment method may include moving the top layer masks left or right and up or down until all the through-layer contacts are on top of their corresponding landing pads. This is done in several steps in the following sequence:

FIG. 26A illustrates the top wafer. A repeating pattern of circuits 2604 in the top wafer in both X and Y directions is used. Oxide isolation regions 2602 in between adjacent (identical) repeating structures are used. Each (identical) repeating structure has X dimension=$W_x$ and Y dimension=$W_y$, and this includes oxide isolation region thickness. The alignment mark in the top layer 2606 is located at ($x_{top}$, $y_{top}$).

Figure 26B:
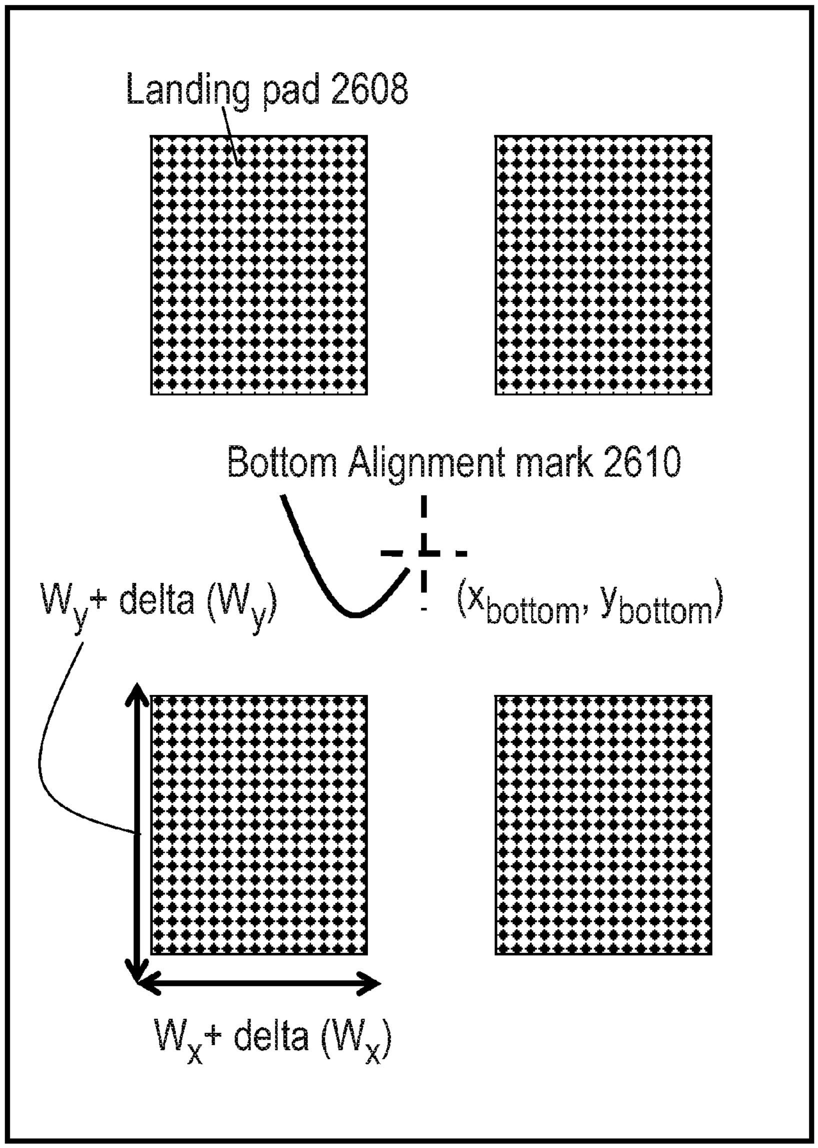

FIG. 26B illustrates the bottom wafer. The bottom wafer has a transistor layer and multiple layers of wiring. The top-most wiring layer has a landing pad structure, where repeating landing pads 2608 of X dimension $W_x$+delta($W_x$) and Y dimension $W_y$+delta($W_y$) are used. delta($W_y$) and delta($W_y$) are quantities that are added to compensate for alignment offsets, and are small compared to $W_x$ and $W_y$ respectively. Alignment mark for the bottom wafer 2610 is located at ($x_{bottom}$, $y_{bottom}$). Note that the terms landing pad and metal strip are utilized interchangeably in this document.

Figure 26C:
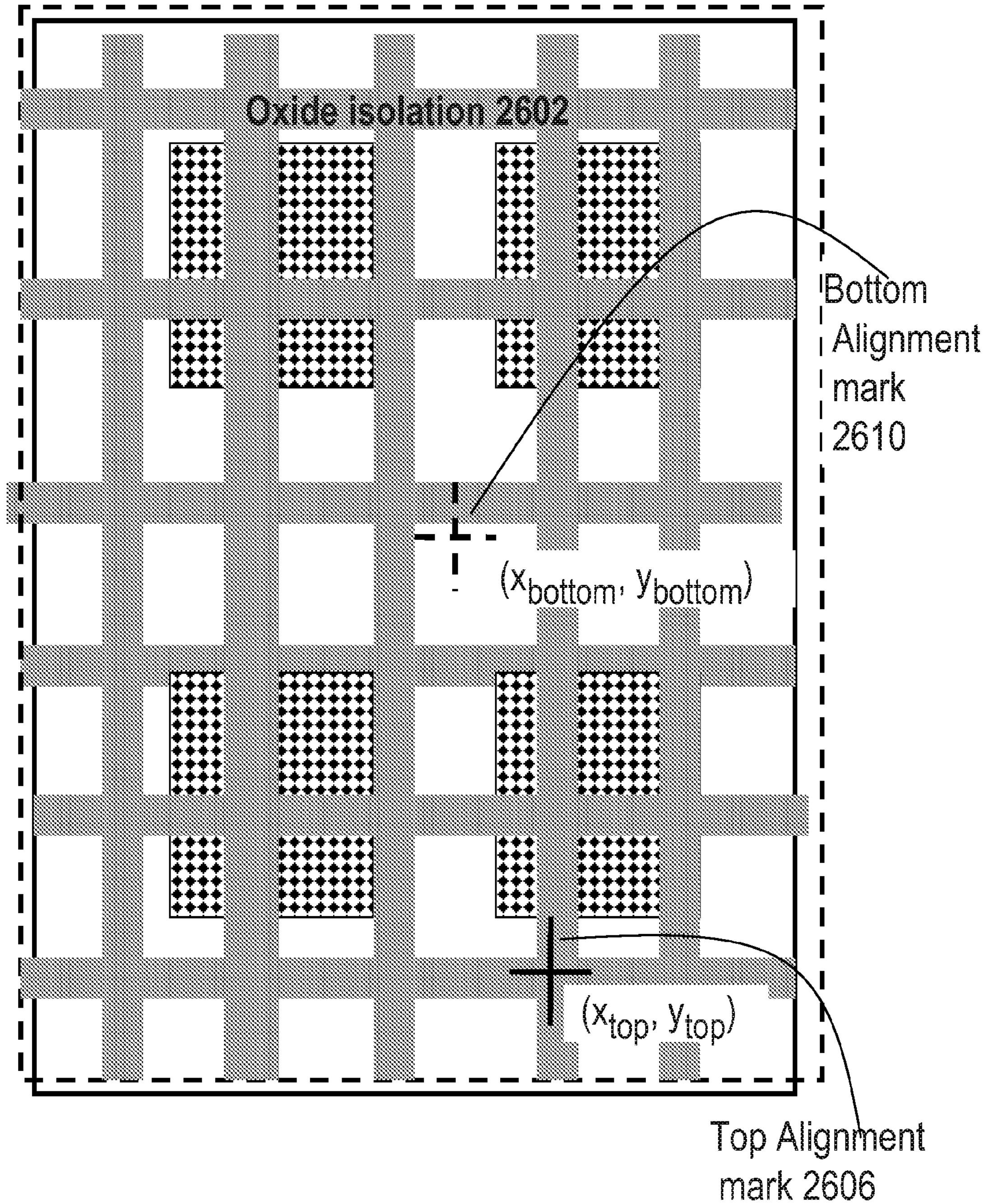
Figure 26D:
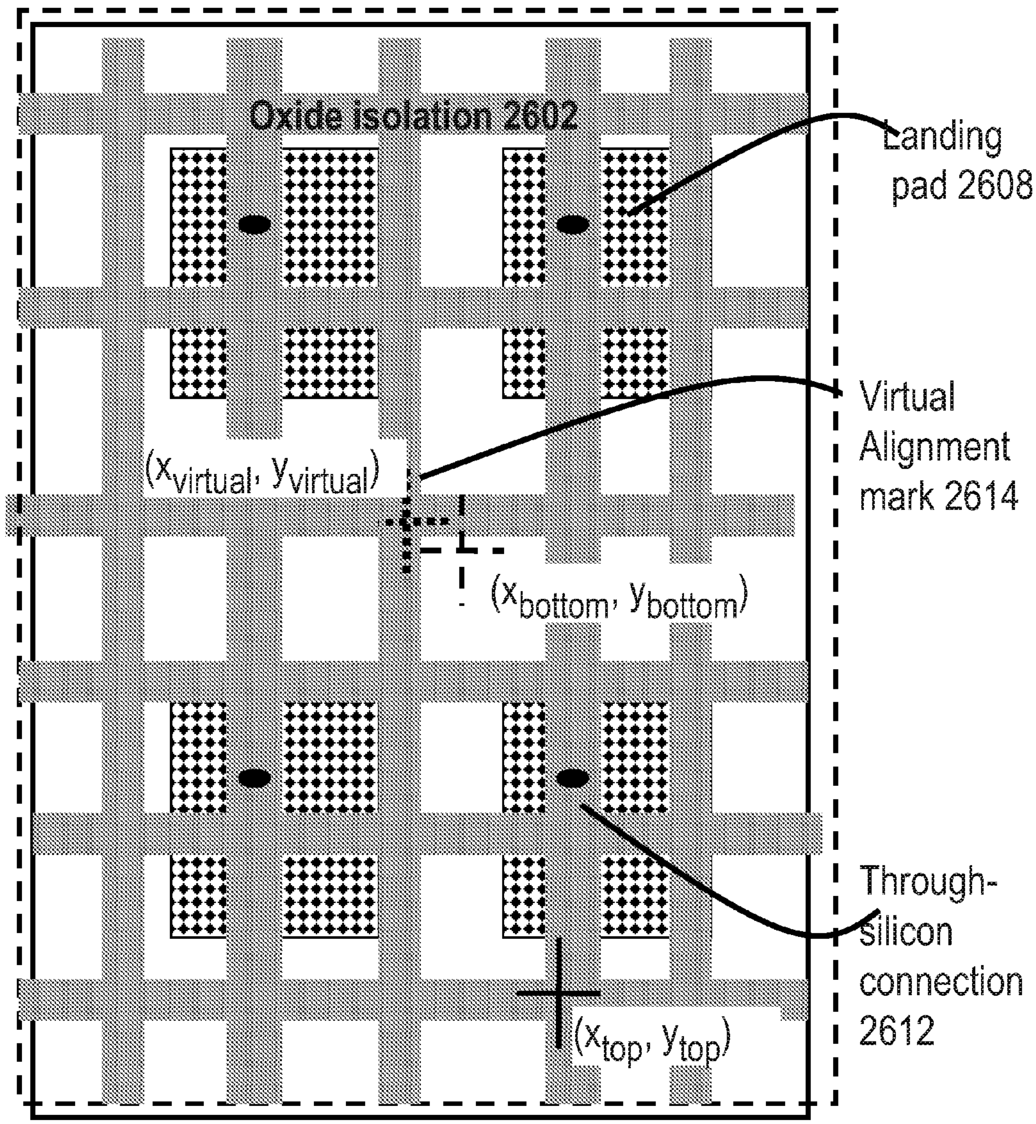

After bonding the top and bottom wafers atop each other as described in FIG. 25A-F, the wafers look as shown in FIG. 26C. Note that the circuit regions 2604 in between oxide isolation regions 2602 are not shown for easy illustration and understanding. It can be seen the top alignment mark 2606 and bottom alignment mark 2610 are misaligned to each other. As previously described in the description of FIG. 14B, rotational or angular alignment between the top and bottom wafers is small and margin for this is provided by the offsets delta($W_x$) and delta($W_y$). Since the landing pad dimensions are larger than the length of the repeating pattern in both X and Y direction, the top layer-to-layer contact (and other masks) are shifted left or right and up or down until this contact is on top of the corresponding landing pad. This method is further described below:

Next step in the process is described with FIG. 26D. A virtual alignment mark is created by the lithography tool. X co-ordinate of this virtual alignment mark is at the location ($x_{top}$+(an integer k)*$W_x$). The integer k is chosen such that modulus or absolute value of ($x_{top}$+(integer k)*$W_x$−$x_{bottom}$) <=$W_x$/2. This guarantees that the X co-ordinate of the virtual alignment mark is within a repeat distance of the X alignment mark of the bottom wafer. Y co-ordinate of this virtual alignment mark is at the location ($y_{top}$+(an integer h)*$W_y$). The integer h is chosen such that modulus or absolute value of ($y_{top}$+(integer h)*$W_y$−$y_{bottom}$)<=$W_y$/2. This guarantees that the Y co-ordinate of the virtual alignment mark is within a repeat distance of the Y alignment mark of the bottom wafer. Since silicon thickness of the top layer is thin, the lithography tool can observe the alignment mark of the bottom wafer. Though-silicon connections 2612 are now constructed with alignment mark of this mask aligned to the virtual alignment mark. Since the X and Y co-ordinates of the virtual alignment mark are within the same area of the layout (of dimensions $W_x$ and $W_y$) as the bottom wafer X and Y alignment marks, the through-silicon connection 2612 always falls on the bottom landing pad 2608 (the bottom landing pad dimensions are $W_x$ added to delta ($W_x$) and $W_y$ added to delta ($W_y$)).

Figure 27A:
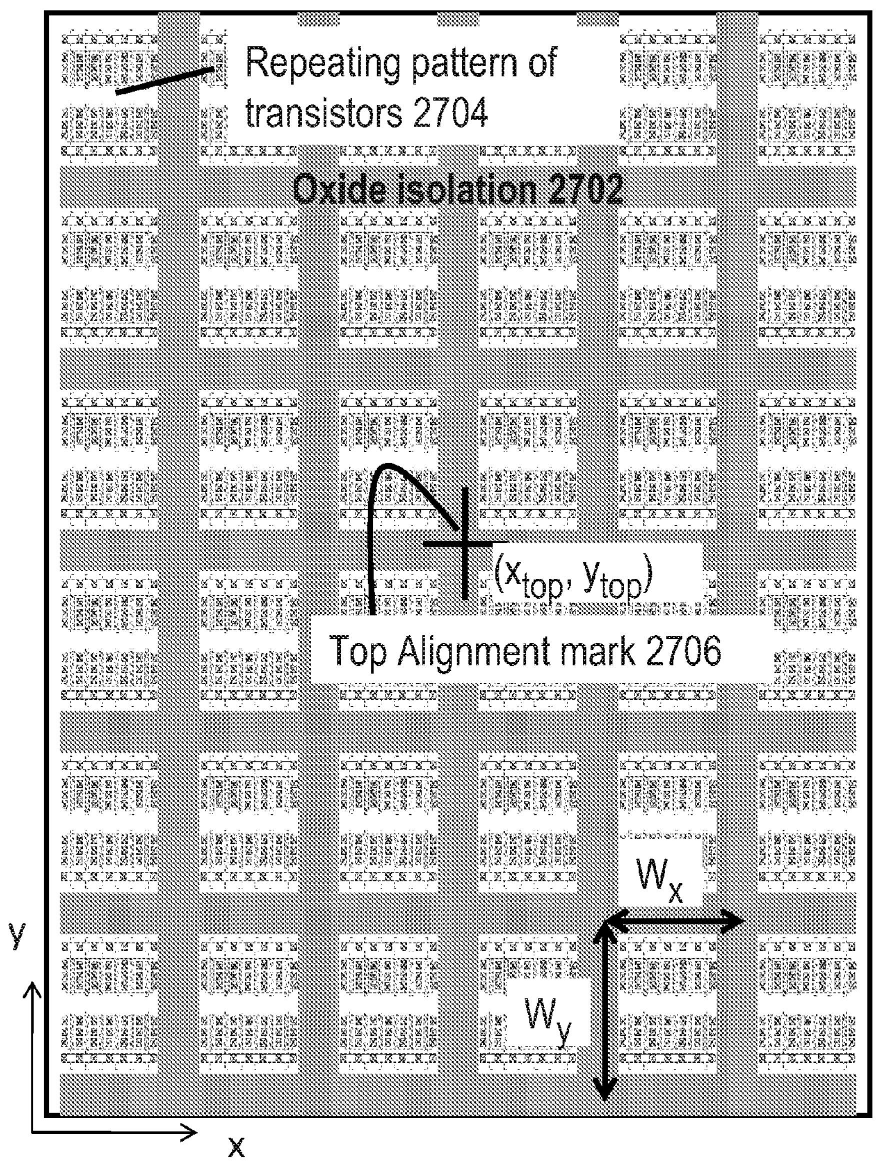
FIG. 27A-F show an alternative alignment scheme for repeating pattern in X and Y directions.

FIG. 27A-F show an alternative alignment method for forming CMOS circuits with a high density of connections between 3D stacked layers. The alignment method may include several steps in the following sequence:

FIG. 27A describes the top wafer. A repeating pattern of circuits 2704 in the top wafer in both X and Y directions is used. Oxide isolation regions 2702 in between adjacent (identical) repeating structures are used. Each (identical) repeating structure has X dimension=$W_x$ and Y dimension=$W_y$, and this includes oxide isolation region thickness. The alignment mark in the top layer 2706 is located at ($x_{top}$, $y_{top}$).

Figure 27B:
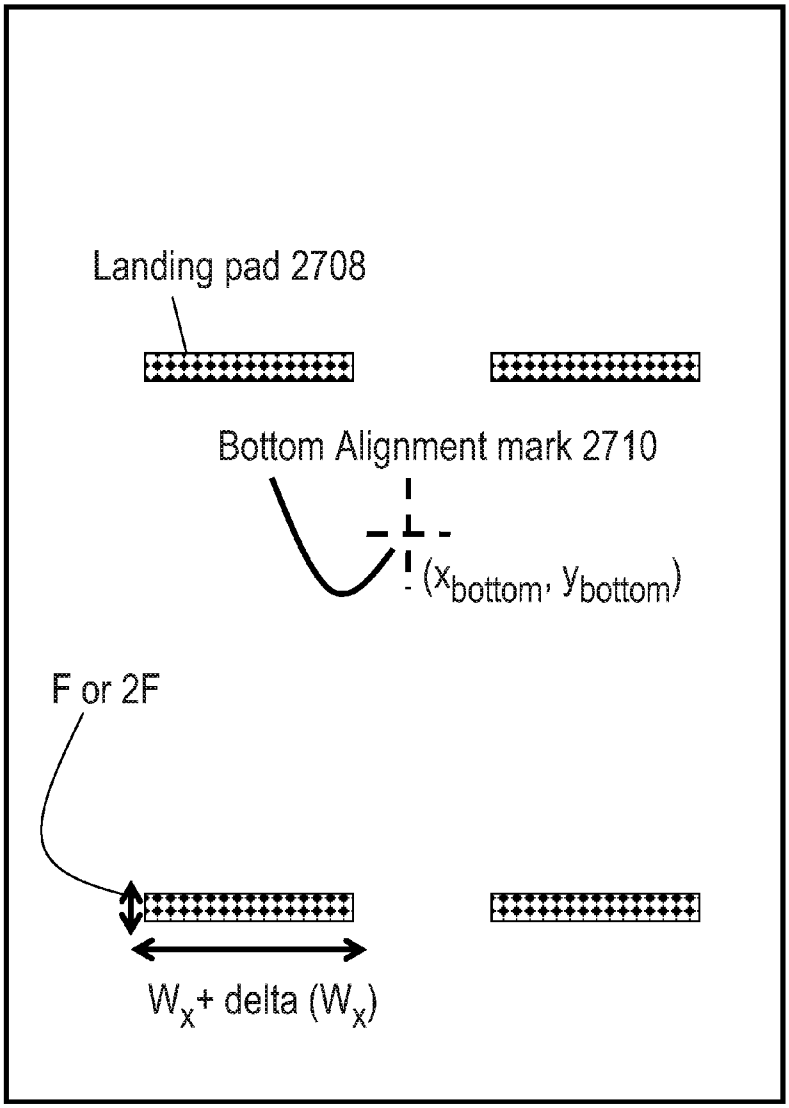

FIG. 27B describes the bottom wafer. The bottom wafer has a transistor layer and multiple layers of wiring. The top-most wiring layer has a landing pad structure, where repeating landing pads 2708 of X dimension $W_x$+delta($W_x$) and Y dimension F or 2F are used. delta($W_x$) is a quantity that is added to compensate for alignment offsets, and are smaller compared to W. Alignment mark for the bottom wafer 2710 is located at ($x_{bottom}$, $y_{bottom}$).

Figure 27C:
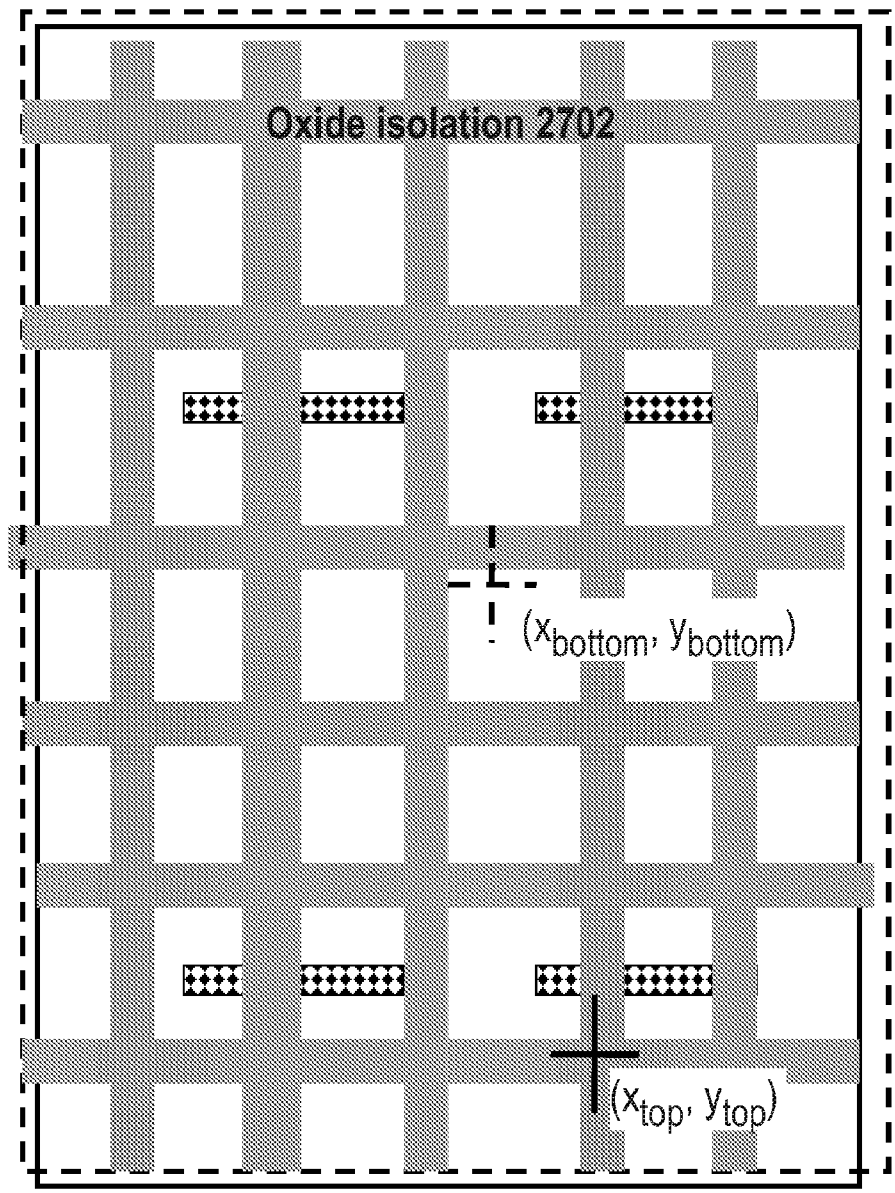

After bonding the top and bottom wafers atop each other as described in FIG. 25A-F, the wafers look as shown in FIG. 27C. Note that the circuit regions 2704 in between oxide isolation regions 2702 are not shown for easy illustration and understanding. It can be seen the top alignment mark 2706 and bottom alignment mark 2710 are misaligned to each other. As previously described in the description of FIG. 14B, angular alignment between the top and bottom wafers is small and margin for this is provided by the offsets delta($W_x$) and delta($W_y$).

Figure 27D:
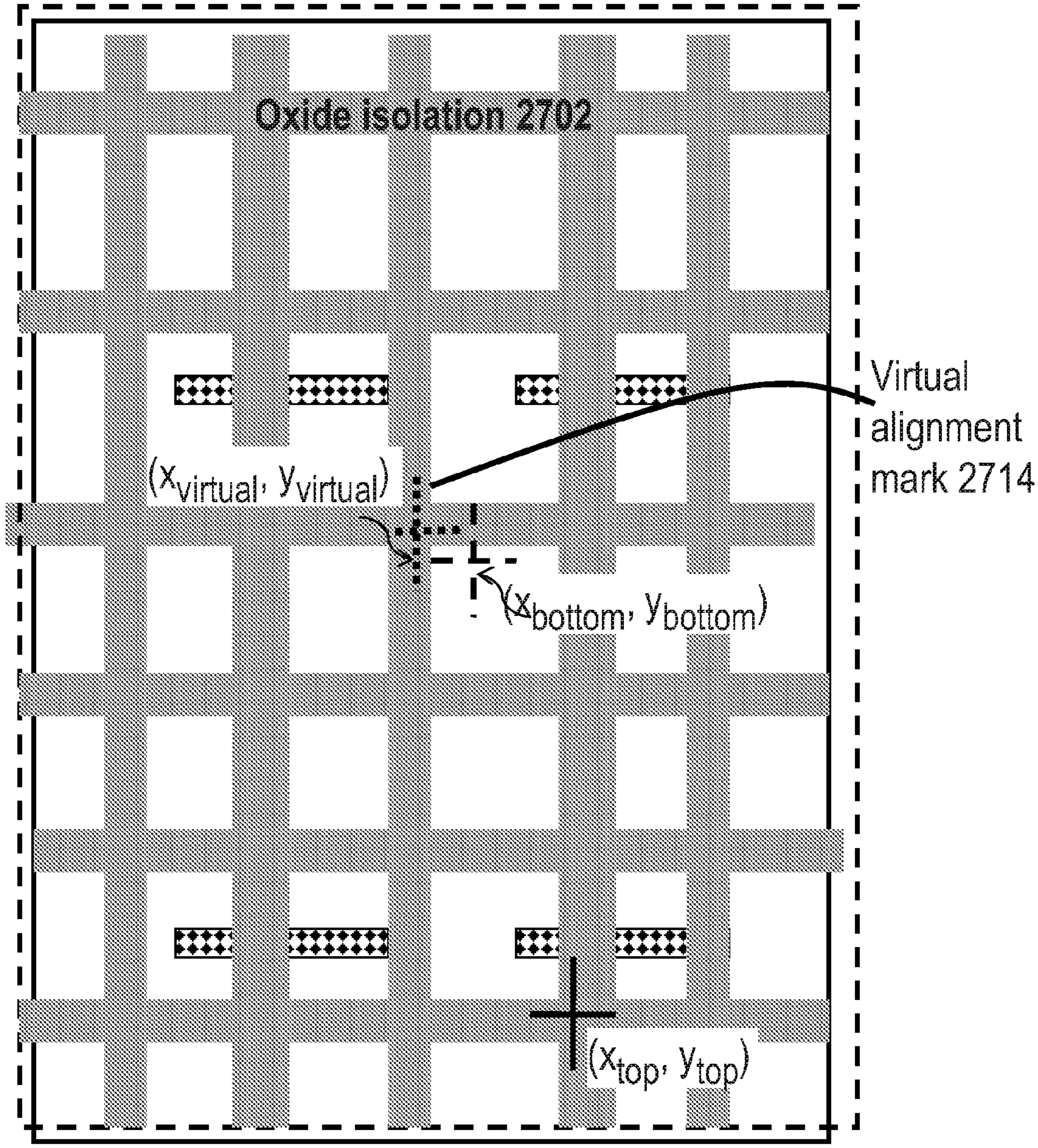

FIG. 27D illustrates the alignment method during/after the next step. A virtual alignment mark is created by the lithography tool. X co-ordinate of this virtual alignment mark is at the location ($x_{top}$+(an integer k)*$W_x$). The integer k is chosen such that modulus or absolute value of ($x_{top}$+(integer k)*$W_x$−$x_{bottom}$)<=$W_x$/2. This guarantees that the X co-ordinate of the virtual alignment mark is within a repeat distance of the X alignment mark of the bottom wafer. Y co-ordinate of this virtual alignment mark is at the location ($y_{top}$+(an integer h)*$W_y$). The integer h is chosen such that modulus or absolute value of ($y_{top}$+(integer*$W_y$−$y_{bottom}$)<=$W_y$/2. This guarantees that the Y co-ordinate of the virtual alignment mark is within a repeat distance of the Y alignment mark of the bottom wafer. Since silicon thickness of the top layer is thin, the lithography tool can observe the alignment mark of the bottom wafer. The virtual alignment mark is at the location ($x_{virtual}$, $y_{virtual}$) where $x_{virtual}$ and $y_{virtual}$ are obtained as described earlier in this paragraph.

Figure 27E:
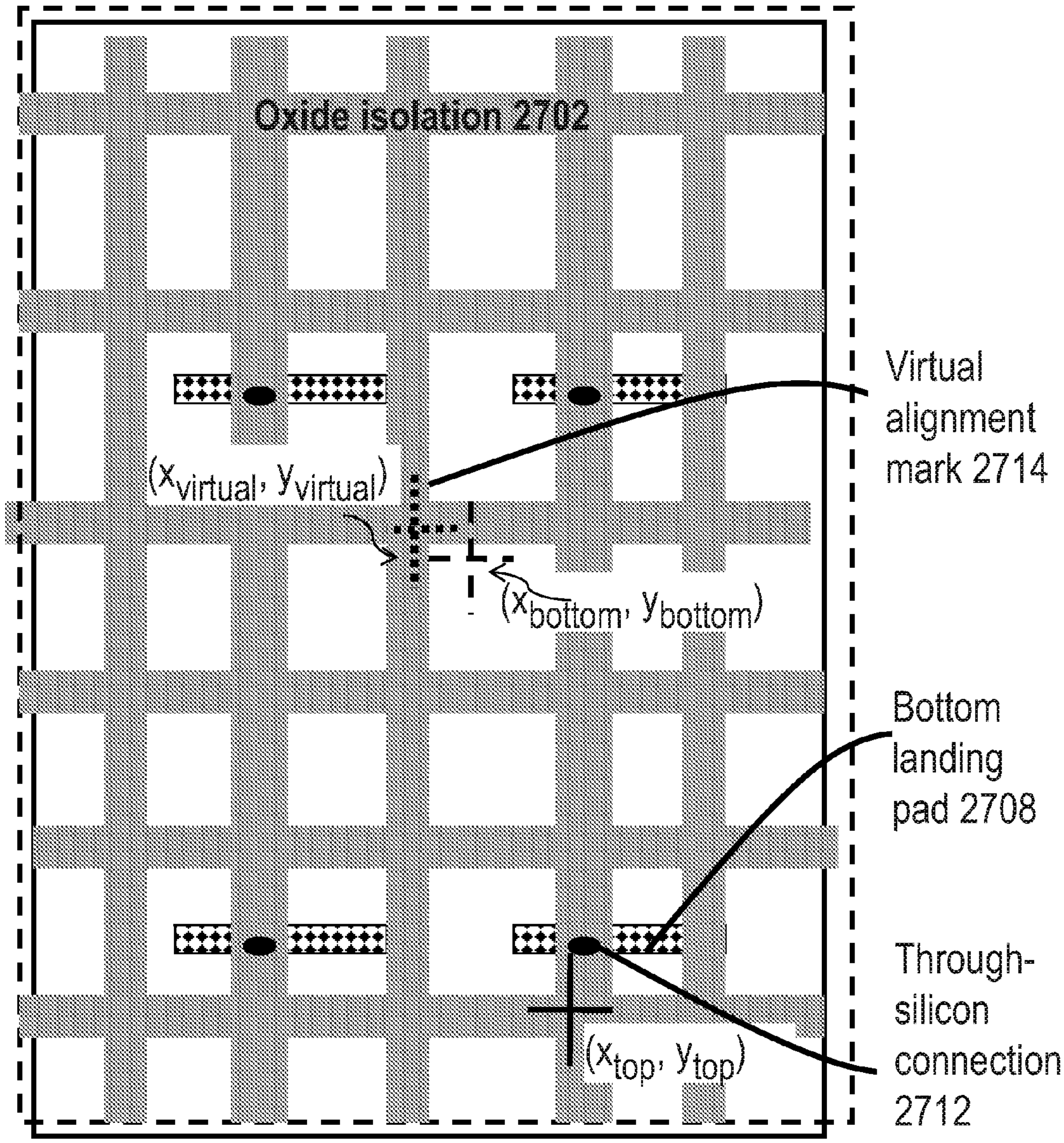
Figure 27F:
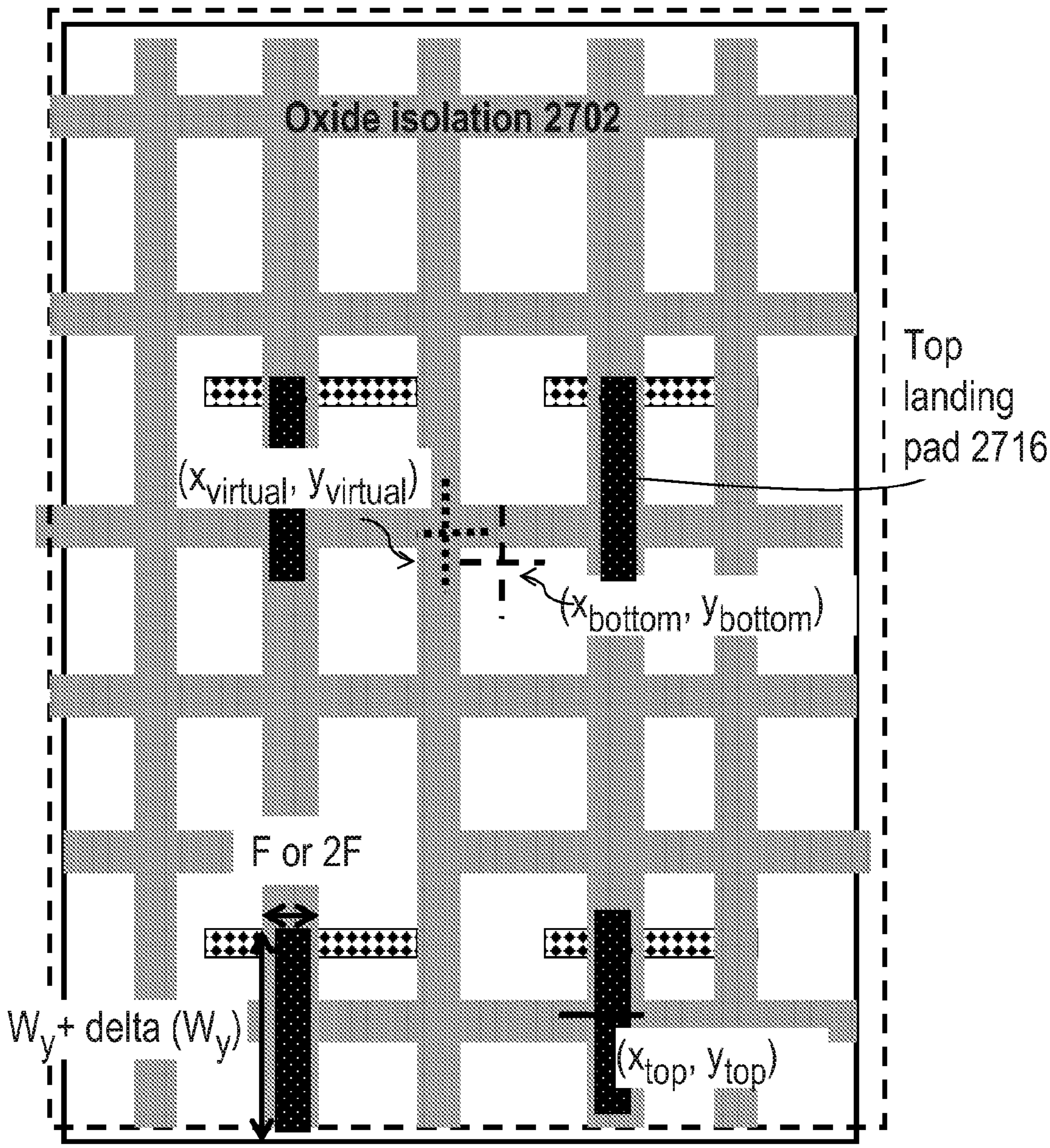

FIG. 27E illustrates the alignment method during/after the next step. Though-silicon connections 2712 are now constructed with alignment mark of this mask aligned to ($x_{virtual}$, $y_{bottom}$). Since the X co-ordinate of the virtual alignment mark is within the same section of the layout in the X direction (of dimension $W_x$) as the bottom wafer X alignment mark, the through-silicon connection 2712 always falls on the bottom landing pad 2708 (the bottom landing pad dimension is $W_x$ added to delta ($W_x$)). The Y co-ordinate of the through silicon connections 2712 is aligned to $y_{bottom}$, the Y co-ordinate of the bottom wafer alignment mark as described previously. FIG. 27F shows a drawing illustration during/after the next step. A top landing pad 2716 is then constructed with X dimension F or 2F and Y dimension $W_y$+delta($W_y$). This mask is formed with alignment mark aligned to ($x_{bottom}$, $y_{virtual}$). Essentially, it can be seen that the top landing pad 2716 compensates for misalignment in the Y direction, while the bottom landing pad 2708 compensates for misalignment in the X direction.

The alignment scheme shown in FIG. 27A-F can give a higher density of connections between two layers than the alignment scheme shown in FIG. 26A-D. The connection paths between two transistors located on two layers therefore may include: a first landing pad or metal strip substantially parallel to a certain axis, a through via and a second landing pad or metal strip substantially perpendicular to a certain axis. Features are formed using virtual alignment marks whose positions depend on misalignment during bonding. Also, through-silicon connections in FIG. 26A-D have relatively high capacitance due to the size of the landing pads. It will be apparent to one skilled in the art that variations of this process flow are possible (e.g., different versions of regular layouts could be used along with replacement gate processes to get a high density of connections between 3D stacked circuits and chips).

Figure 44A:
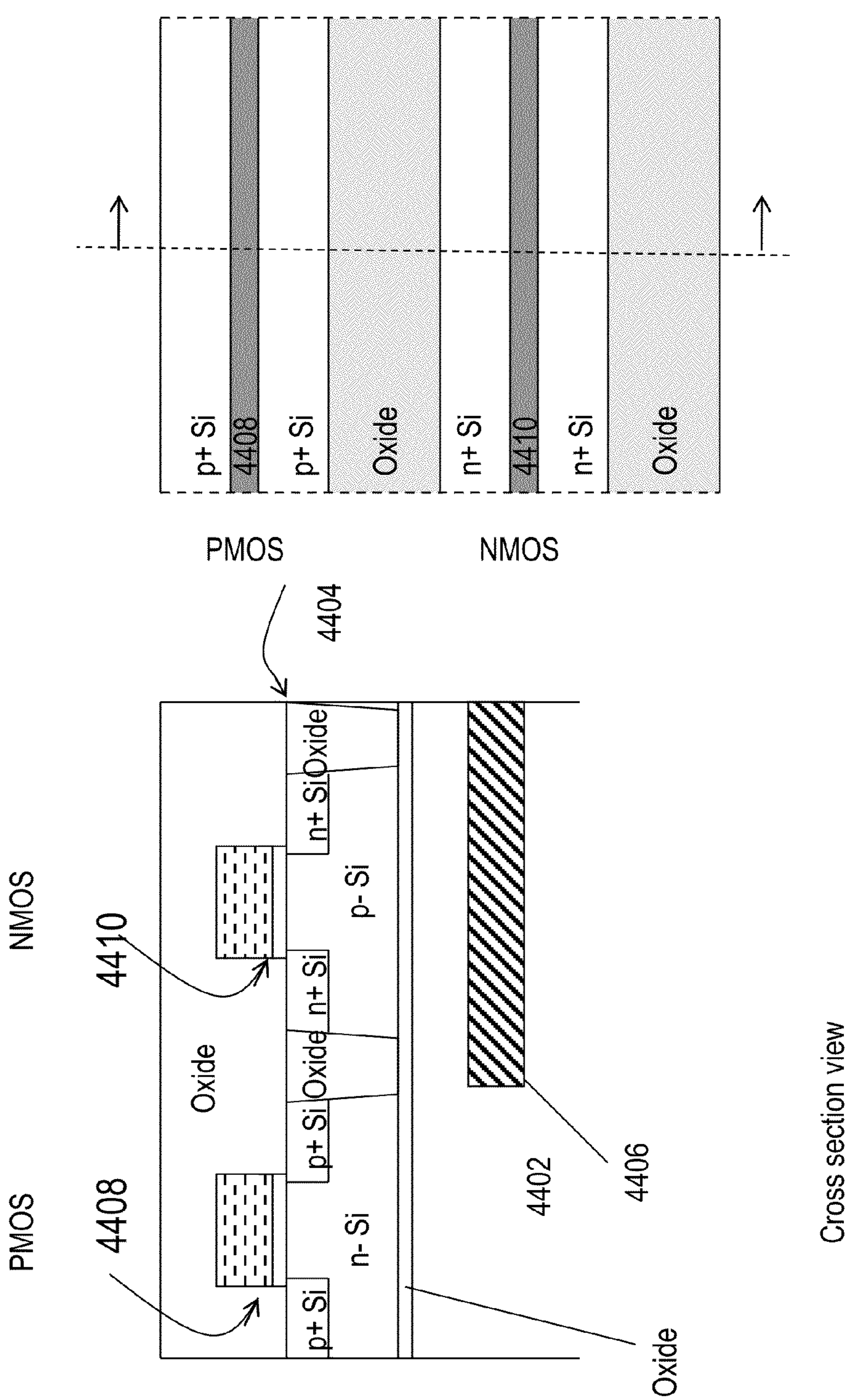
FIG. 44A-D depict a process flow for constructing 3D integrated chips and circuits with misalignment tolerance techniques and repeating pattern in one direction.

FIG. 44A-D and FIG. 45A-D show an alternative procedure for forming CMOS circuits with a high density of connections between stacked layers. The process utilizes a repeating pattern in one direction for the top layer of transistors. The procedure may include several steps in the following sequence:

Step (A): Using procedures similar to FIG. 25A-F, a top layer of transistors 4404 is transferred atop a bottom layer of transistors and wires 4402. Landing pads 4406 are utilized on the bottom layer of transistors and wires 4402. Dummy gates 4408 and 4410 are utilized for nMOS and pMOS. The key difference between the structures shown in FIG. 25A-F and this structure is the layout of oxide isolation regions between transistors. FIG. 44A illustrates the structure after Step (A).

Figure 44B:
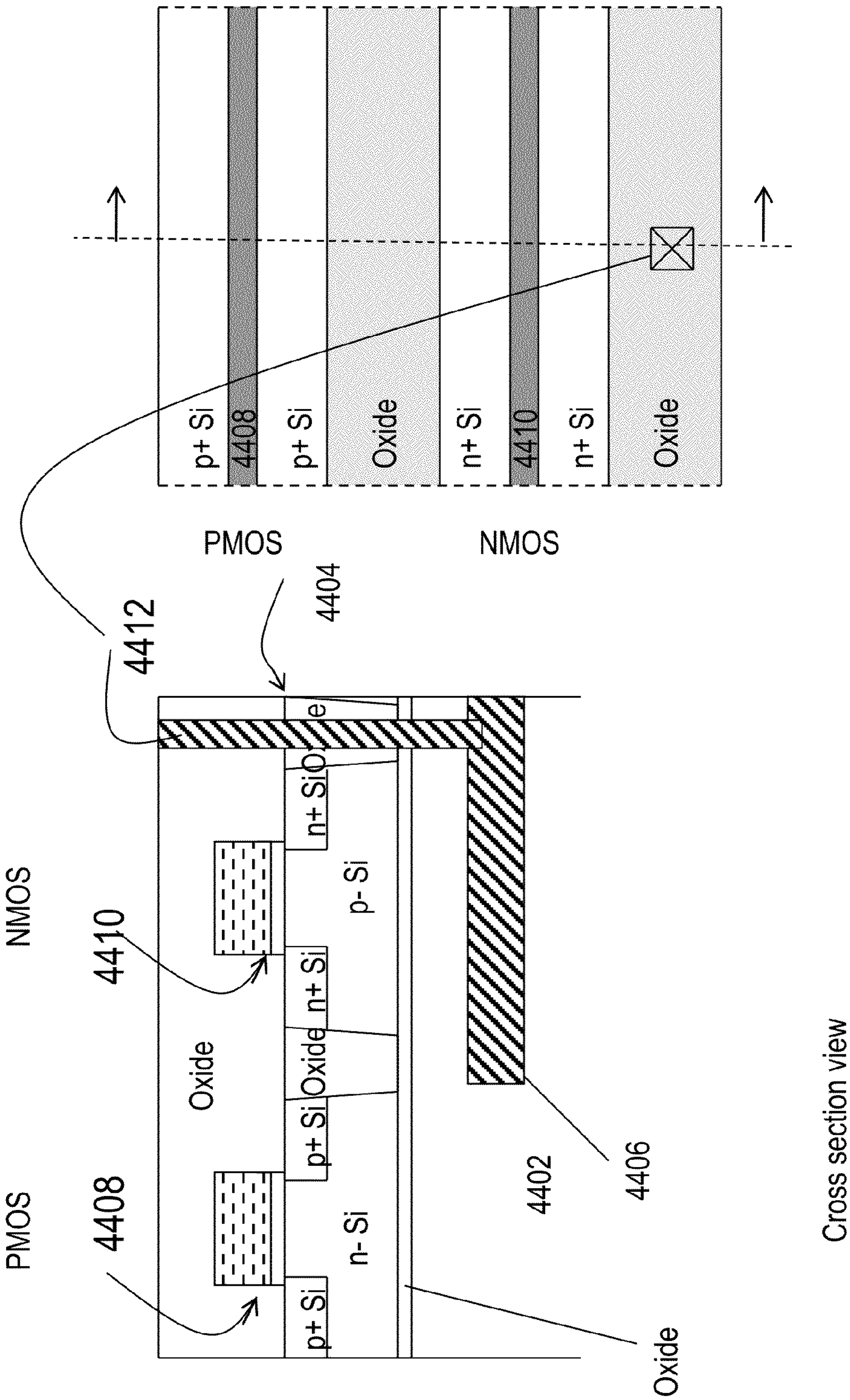

Step (B): Through-silicon connections 4412 are formed well-aligned to the bottom layer of transistors and wires 4402. Alignment schemes to be described in FIG. 45A-F are utilized for this purpose. All features constructed in future steps are also formed well-aligned to the bottom layer of transistors and wires 4402. FIG. 44B illustrates the structure after Step (B).

Figure 44C:
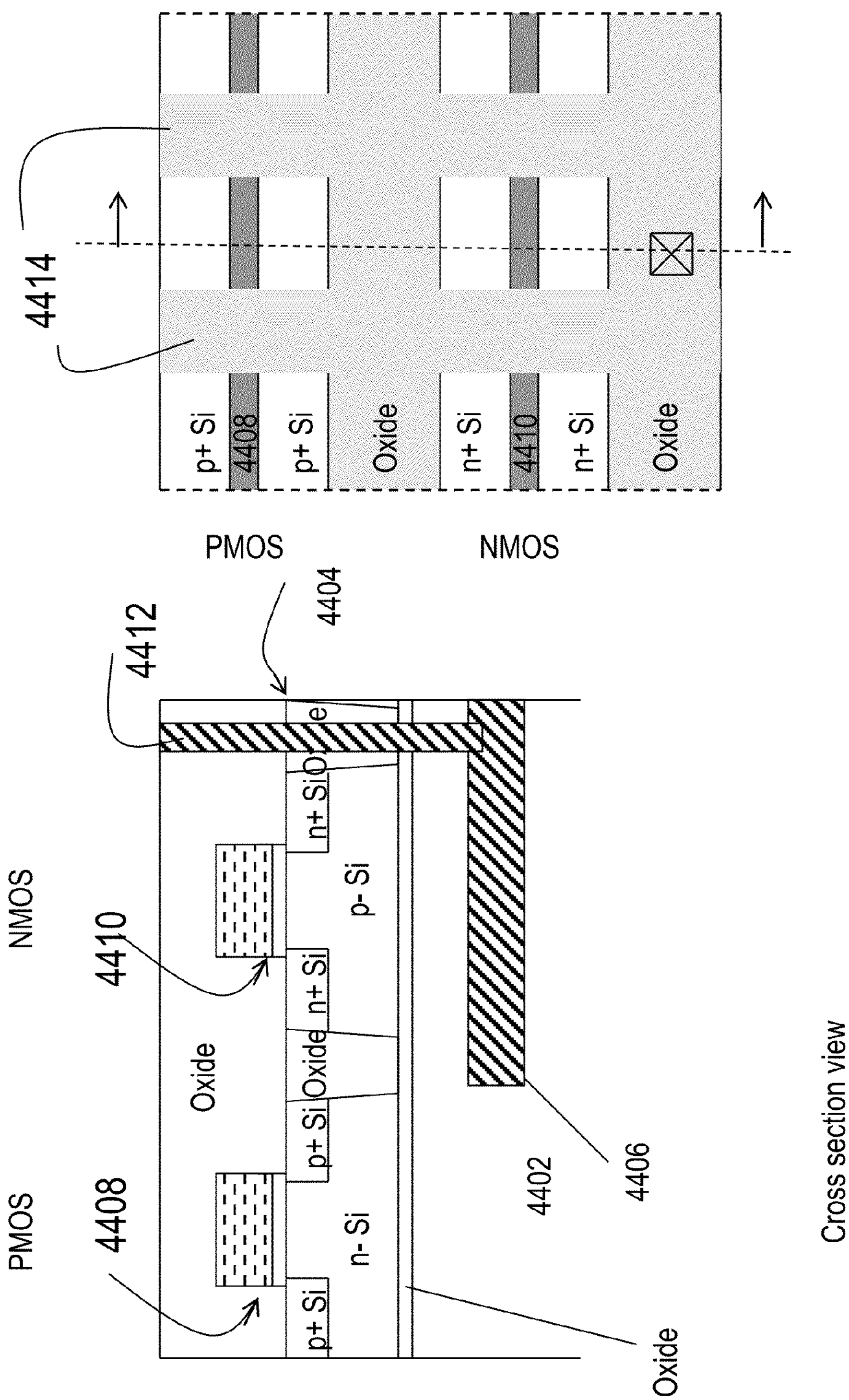

Step (C): Oxide isolation regions 4414 are formed between adjacent transistors to be defined. These isolation regions are formed by lithography and etch of gate and silicon regions and then fill with oxide. FIG. 44C illustrates the structure after Step (C).

Figure 44D:
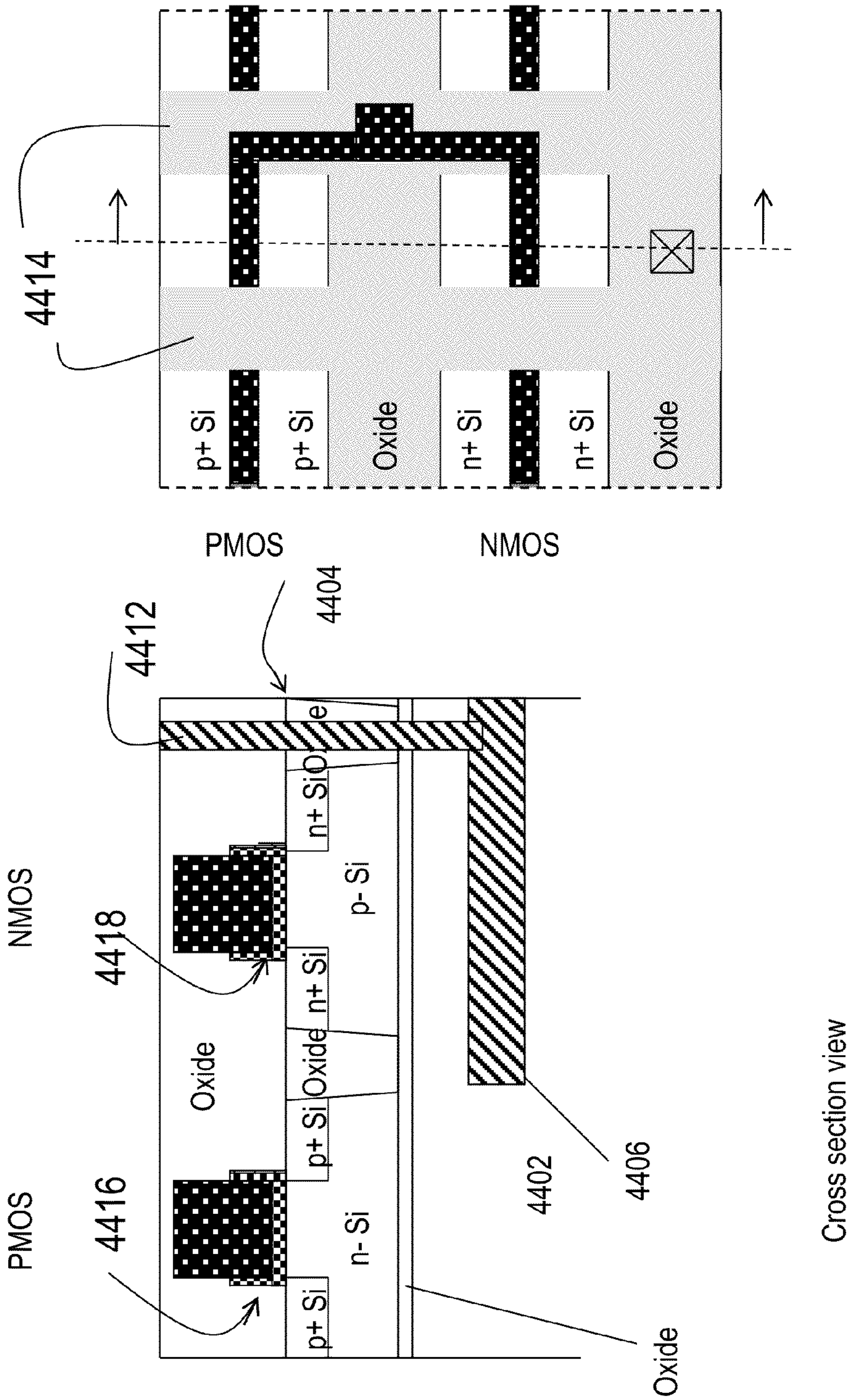

Step (D): The dummy gates 4408 and 4410 are etched away and replaced with replacement gates 4416 and 4418. These replacement gates are patterned and defined to form gate contacts as well. FIG. 44D illustrates the structure after Step (D). Following this, other process steps in the fabrication flow proceed as usual.

Figure 45A:
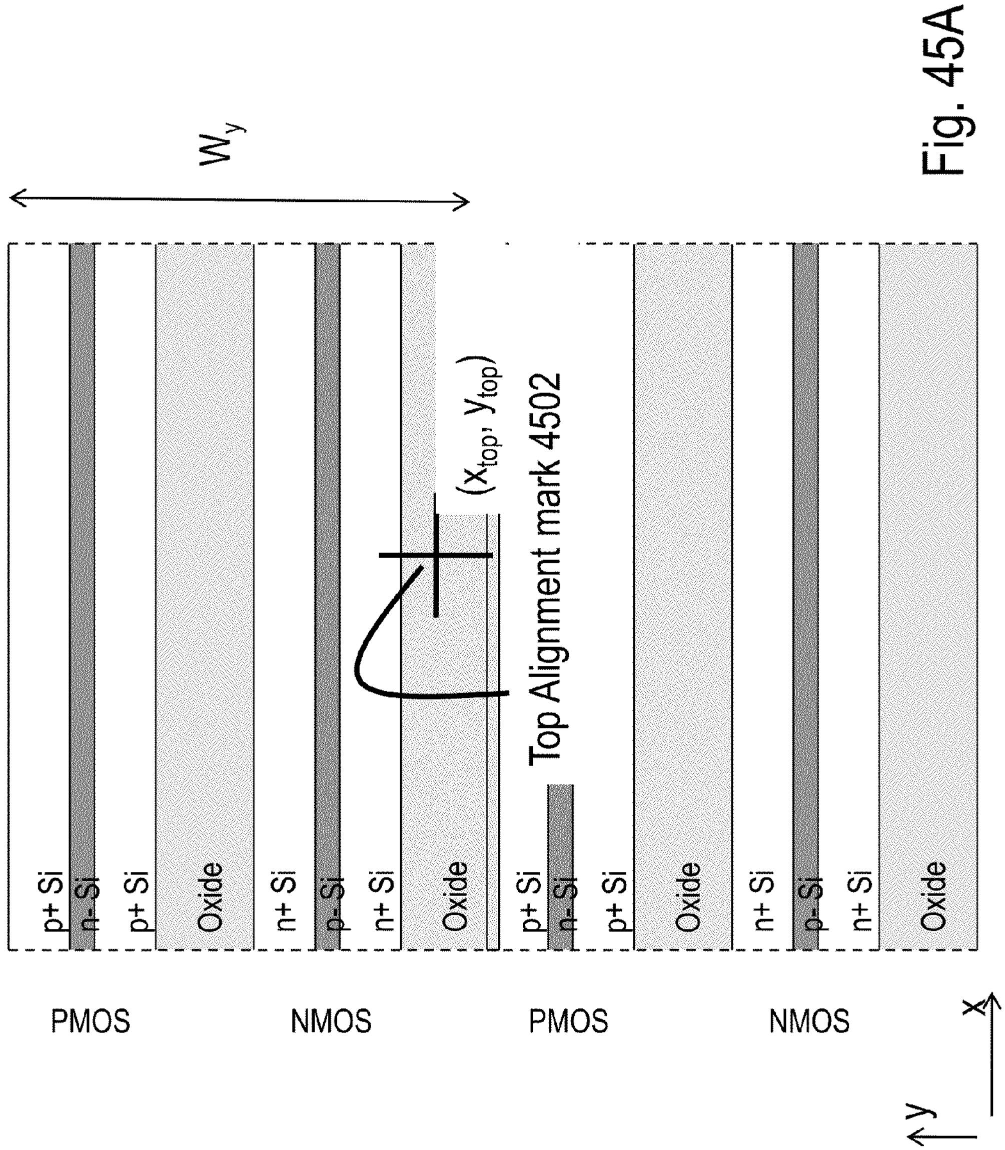
FIG. 45A-D show a misalignment tolerance technique for constructing 3D integrated chips and circuits with repeating pattern in one direction.

FIG. 45A-D describe alignment schemes for the structures shown in FIG. 44A-D. FIG. 45A describes the top wafer. A repeating pattern of features in the top wafer in Y direction is used. Each (identical) repeating structure has Y dimension=$W_y$, and this includes oxide isolation region thickness. The alignment mark in the top layer 4502 is located at ($x_{top}$, $y_{top}$).

Figure 45B:
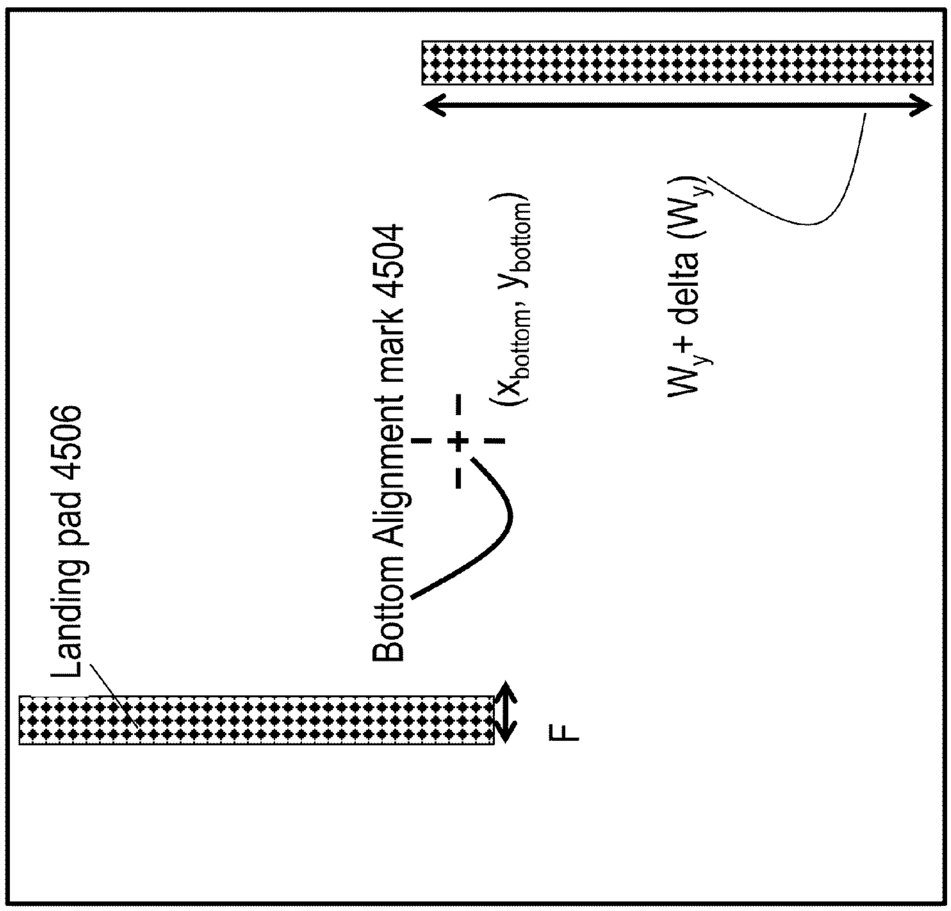

FIG. 45B describes the bottom wafer. The bottom wafer has a transistor layer and multiple layers of wiring. The top-most wiring layer has a landing pad structure, where repeating landing pads 4506 of X dimension F or 2F and Y dimension $W_y$+delta($W_y$) are used. delta($W_y$) is a quantity that is added to compensate for alignment offsets, and is smaller compared to $W_y$. Alignment mark for the bottom wafer 4504 is located at ($x_{bottom}$, $y_{bottom}$).

Figure 45C:
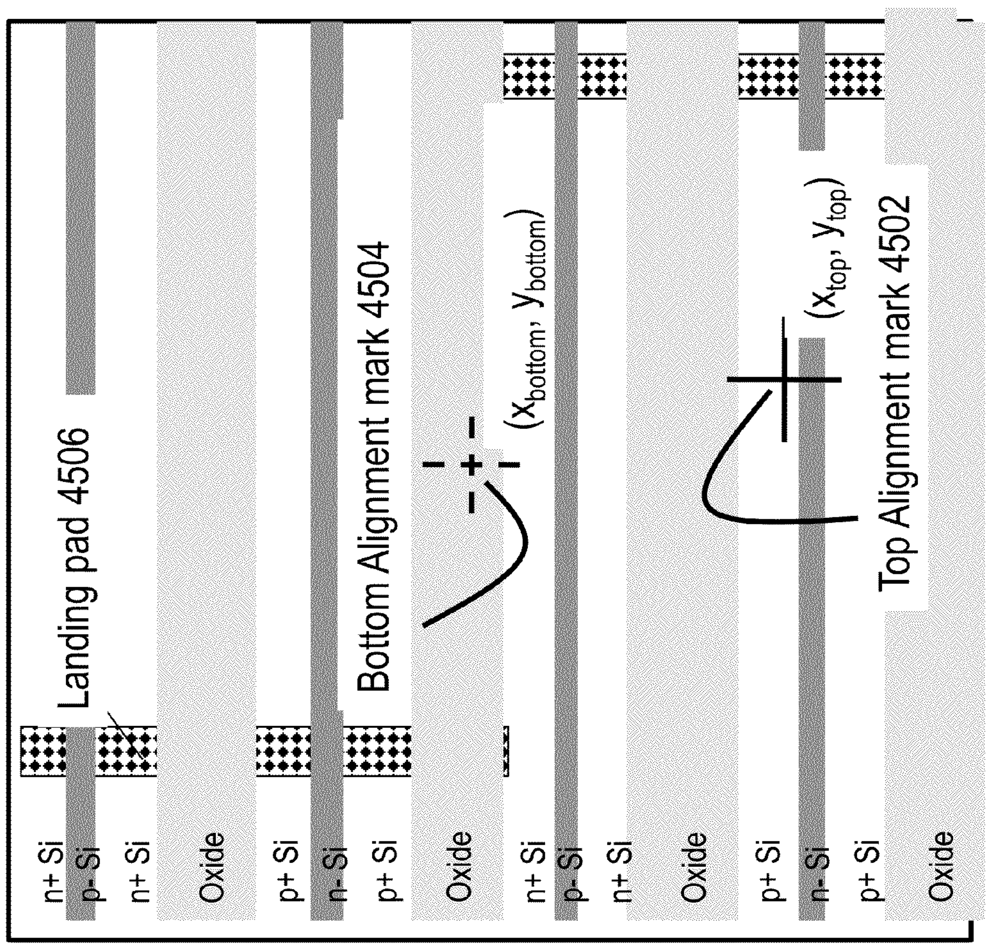

After bonding the top and bottom wafers atop each other as described in FIG. 44A-D, the wafers look as shown in FIG. 45C. It can be seen the top alignment mark 4502 and bottom alignment mark 4504 are misaligned to each other. As previously described in the description of FIG. 14B, angle alignment between the top and bottom wafers is small or negligible.

Figure 45D:
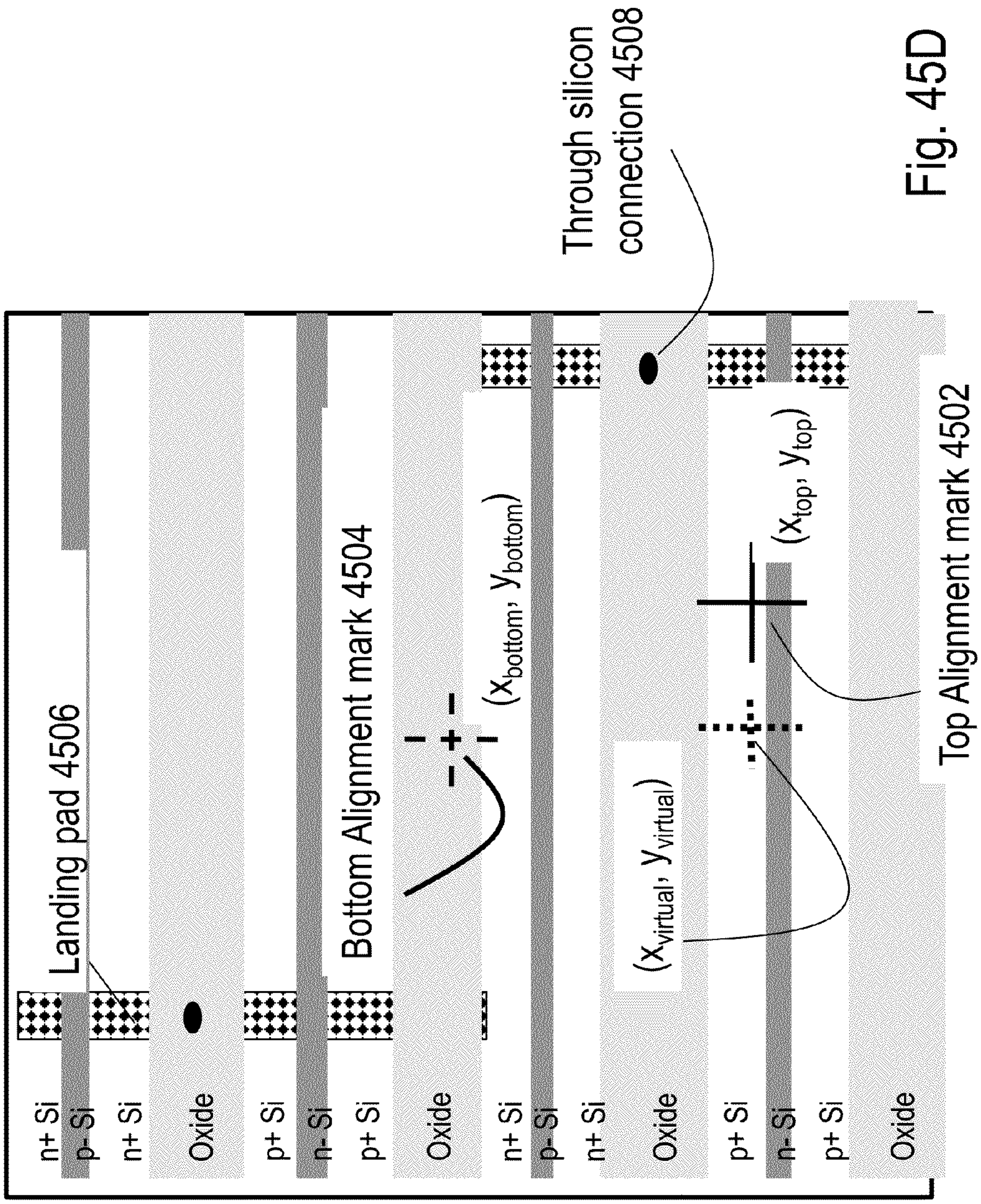

FIG. 45D illustrates the next step of the alignment procedure. A virtual alignment mark is created by the lithography tool. X co-ordinate of this virtual alignment mark is at the location ($x_{bottom}$). Y co-ordinate of this virtual alignment mark is at the location ($y_{top}$+(an integer h)*$W_y$). The integer h is chosen such that modulus or absolute value of ($y_{top}$+(integer*$W_y$−$y_{bottom}$)<=$W_y$/2. This guarantees that the Y co-ordinate of the virtual alignment mark is within a repeat distance of the Y alignment mark of the bottom wafer. Since silicon thickness of the top layer is thin, the lithography tool can observe the alignment mark of the bottom wafer. The virtual alignment mark is at the location ($x_{virtual}$, $y_{virtual}$) where $x_{virtual}$ and $y_{virtual}$ are obtained as described earlier in this paragraph.

FIG. 45E illustrates the next step of the alignment procedure. Though-silicon connections 4508 are now constructed with alignment mark of this mask aligned to ($x_{virtual}$, $y_{virtual}$). Since the X co-ordinate of the virtual alignment mark is perfectly aligned to the X co-ordinate of the bottom wafer alignment mark and since the Y co-ordinate of the virtual alignment mark is within the same section of the layout (of distance $W_y$) as the bottom wafer Y alignment mark, the through-silicon connection 4508 always falls on the bottom landing pad (the bottom landing pad dimension in the Y direction is $W_y$ added to delta ($W_y$)).

Figure 46A:
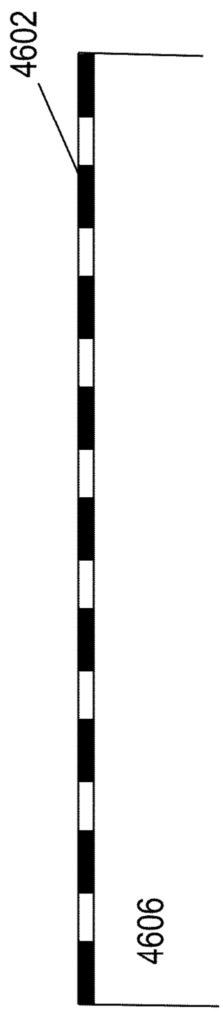
FIG. 46A-G illustrate using a carrier wafer for layer transfer.
Figure 46B:
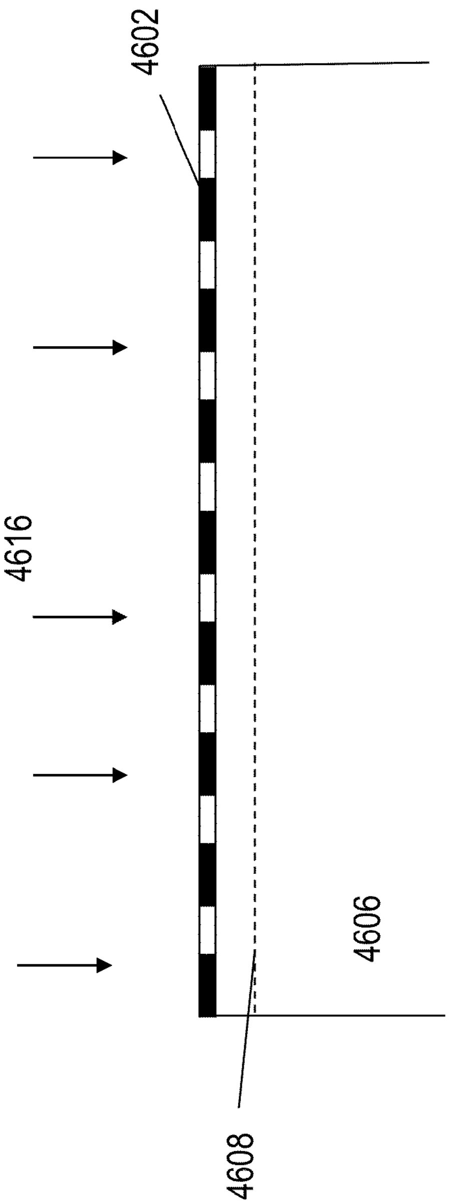
Figure 46C:
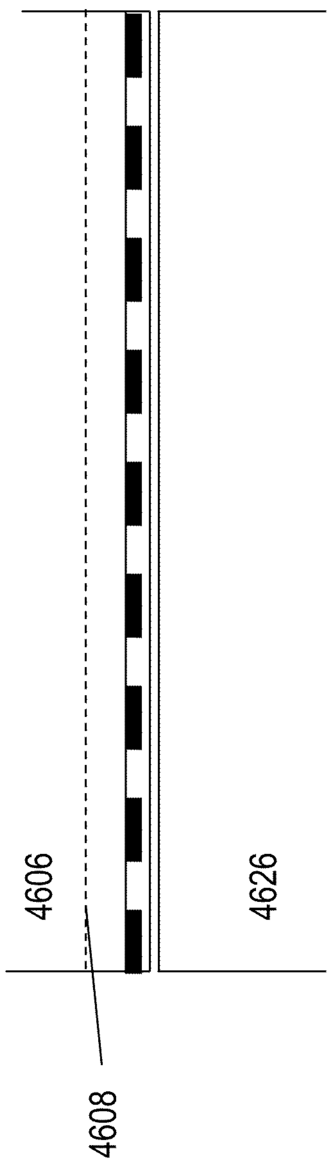
Figure 46D:
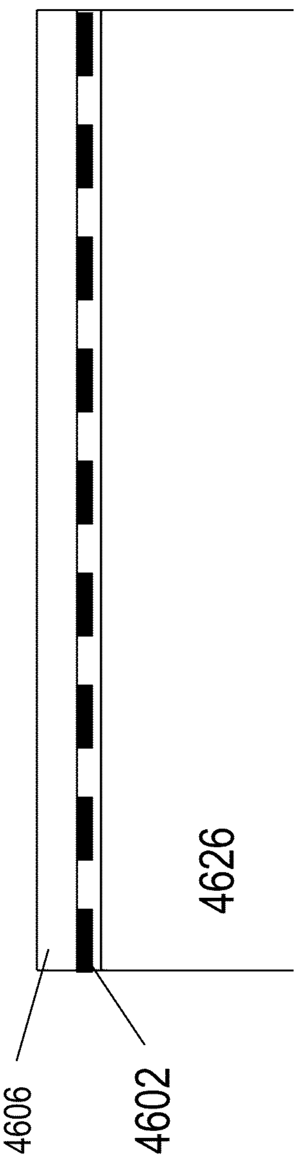
Figures 46E, 46F:
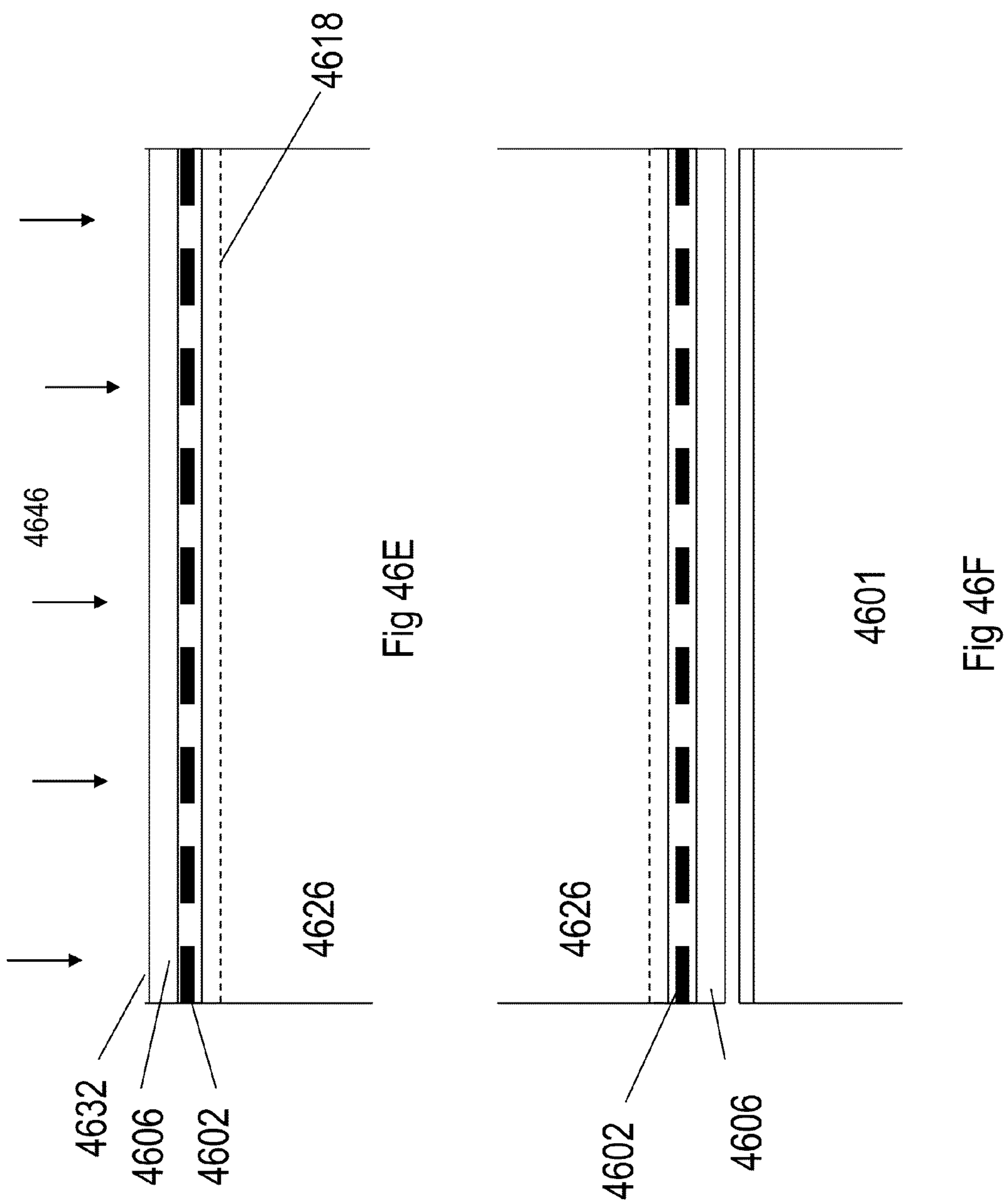
Figure 46G:
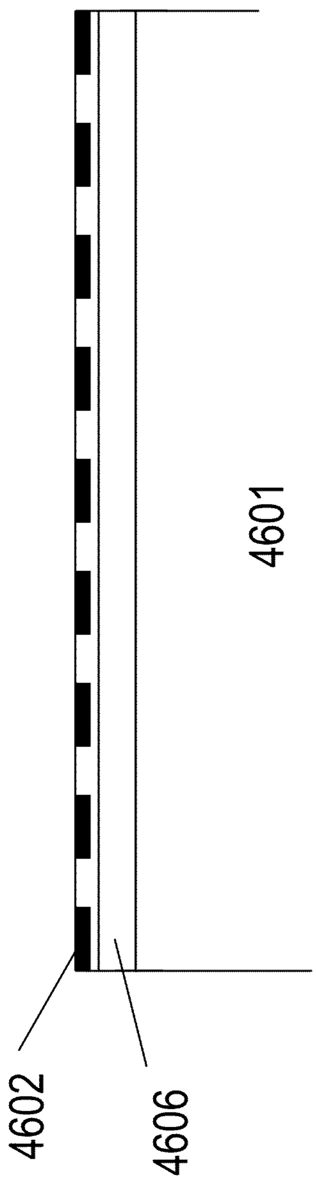

FIG. 46A-G illustrate using a carrier wafer for layer transfer. FIG. 46A illustrates the first step of preparing transistors with dummy gates 4602 on first donor wafer (or top wafer) 4606. This completes the first phase of transistor formation. FIG. 46B illustrates forming a cleave line 4608 by implant 4616 of atomic particles such as H+. FIG. 46C illustrates permanently bonding the first donor wafer 4606 to a second donor wafer 4626. The permanent bonding may be oxide to oxide wafer bonding as described previously. FIG. 46D illustrates the second donor wafer 4626 acting as a carrier wafer after cleaving the first donor wafer off; leaving a thin layer 4606 with the now buried dummy gate transistors 4602. FIG. 46E illustrates forming a second cleave line 4618 in the second donor wafer 4626 by implant 4646 of atomic species such as H+. FIG. 46F illustrates the second layer transfer step to bring the dummy gate transistors 4602 ready to be permanently bonded on top of the bottom layer of transistors and wires 4601. For the simplicity of the explanation we left out the now obvious steps of surface layer preparation done for each of these bonding steps. FIG. 46G illustrates the bottom layer of transistors and wires 4601 with the dummy gate transistor 4602 on top after cleaving off the second donor wafer and removing the layers on top of the dummy gate transistors. Now we can proceed and replace the dummy gates with the final gates, form the metal interconnection layers, and continue the 3D fabrication process.

Figure 47A:
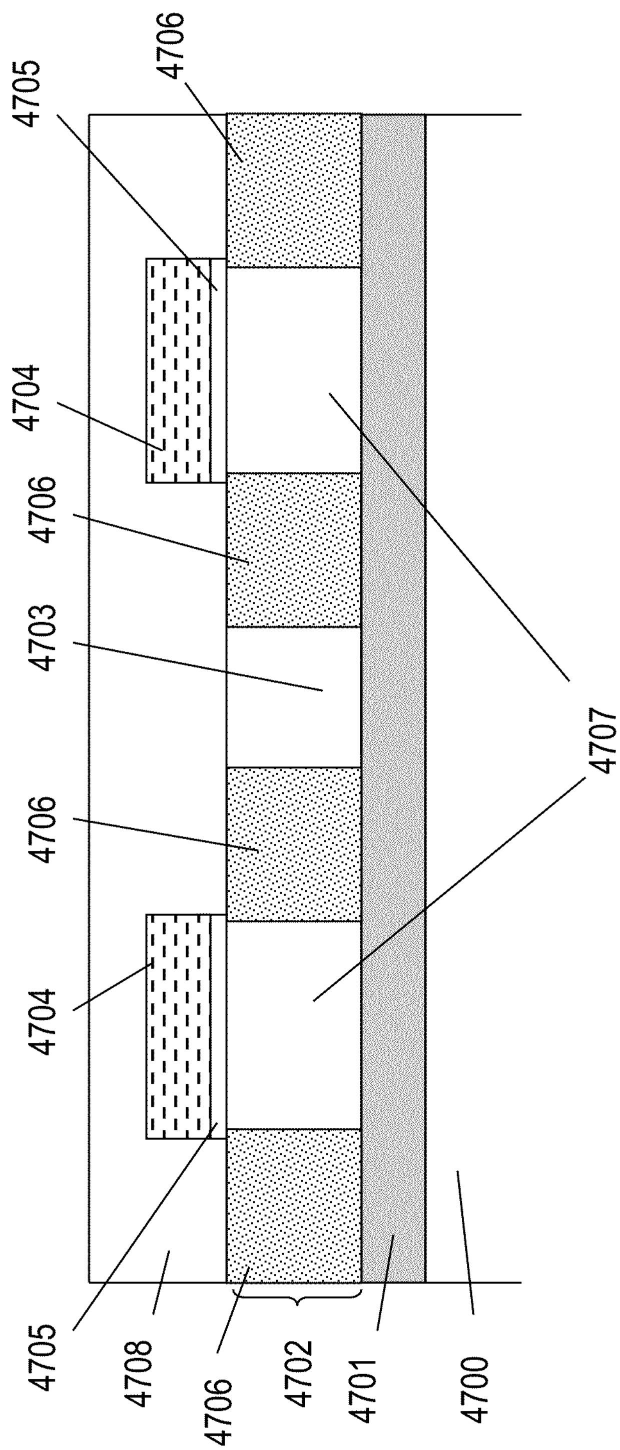
FIG. 47A-K illustrate constructing chips with nMOS and pMOS devices on either side of the wafer.
Figure 47B:
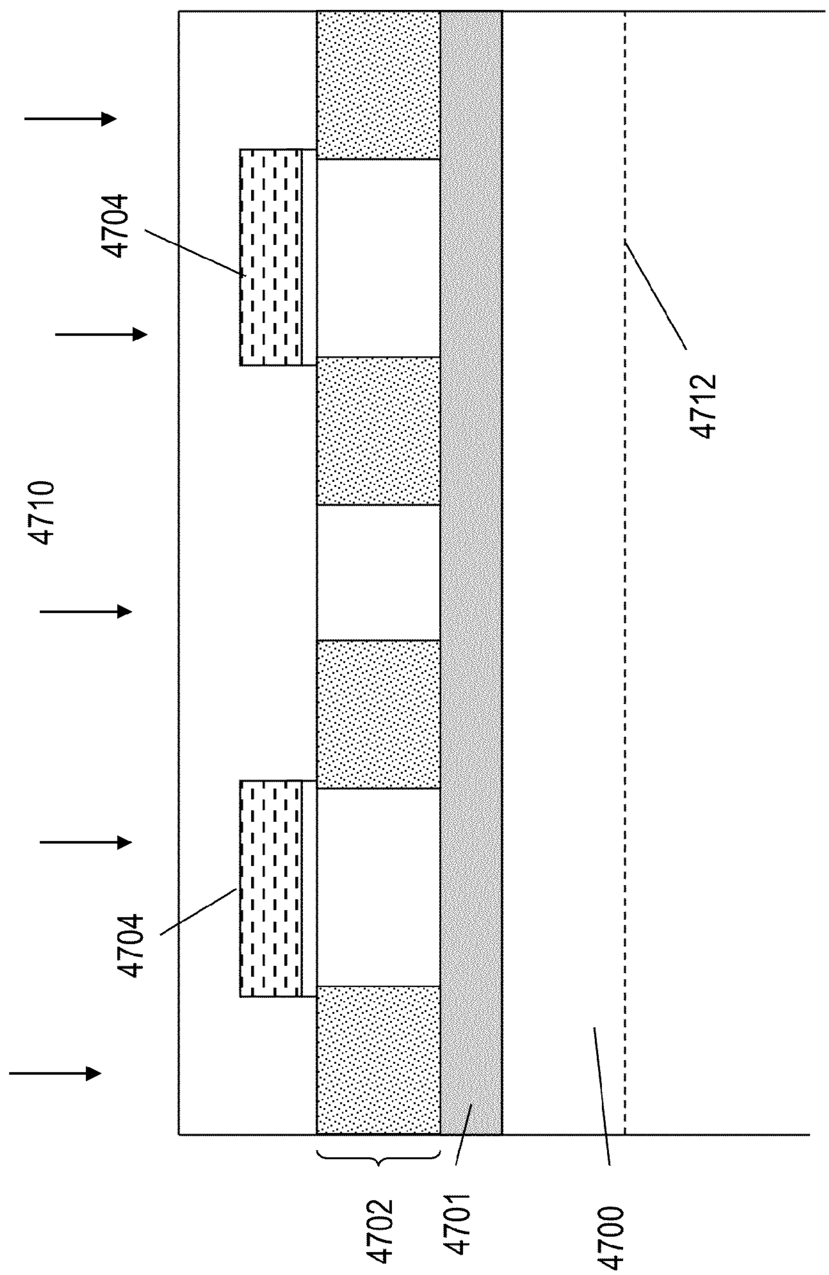
Figure 47C:
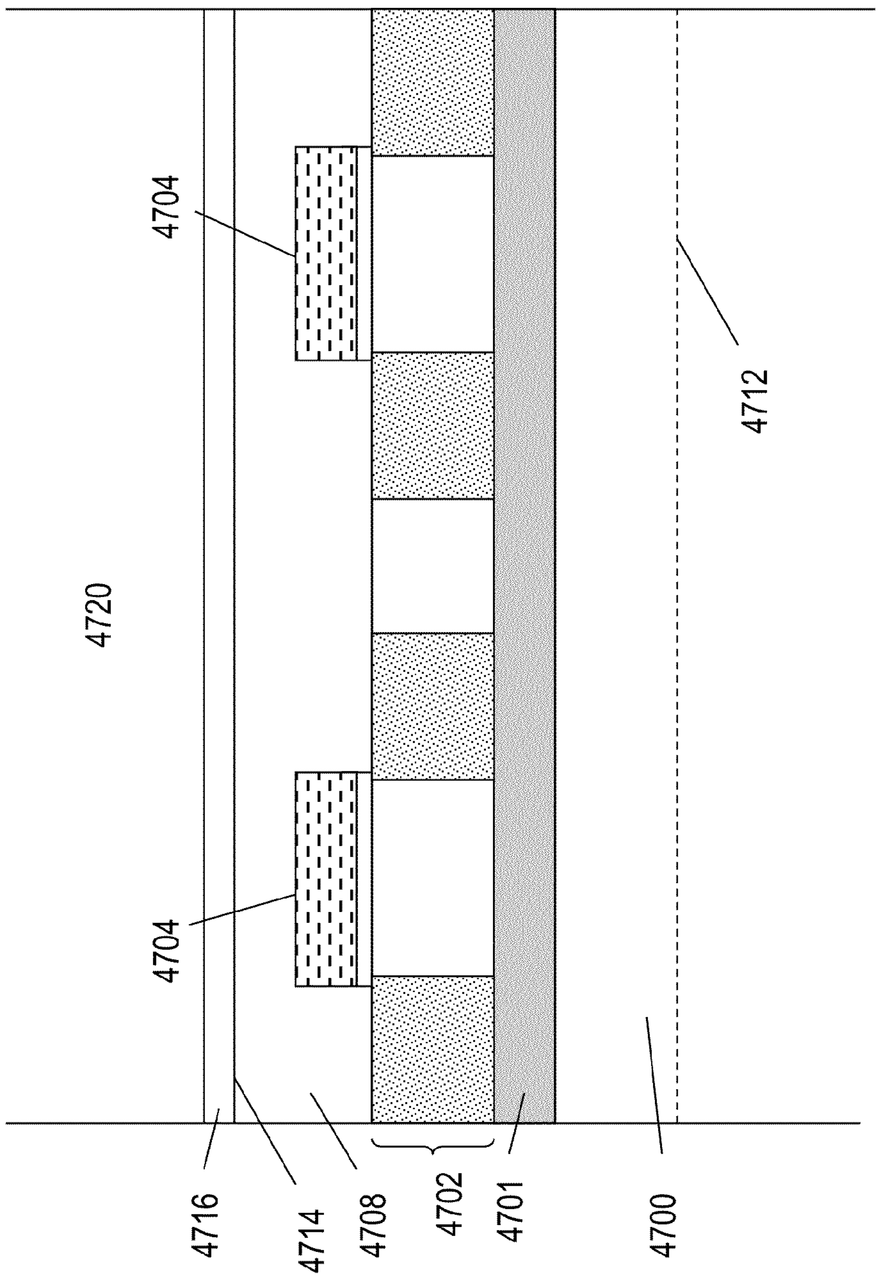
Figure 47D:
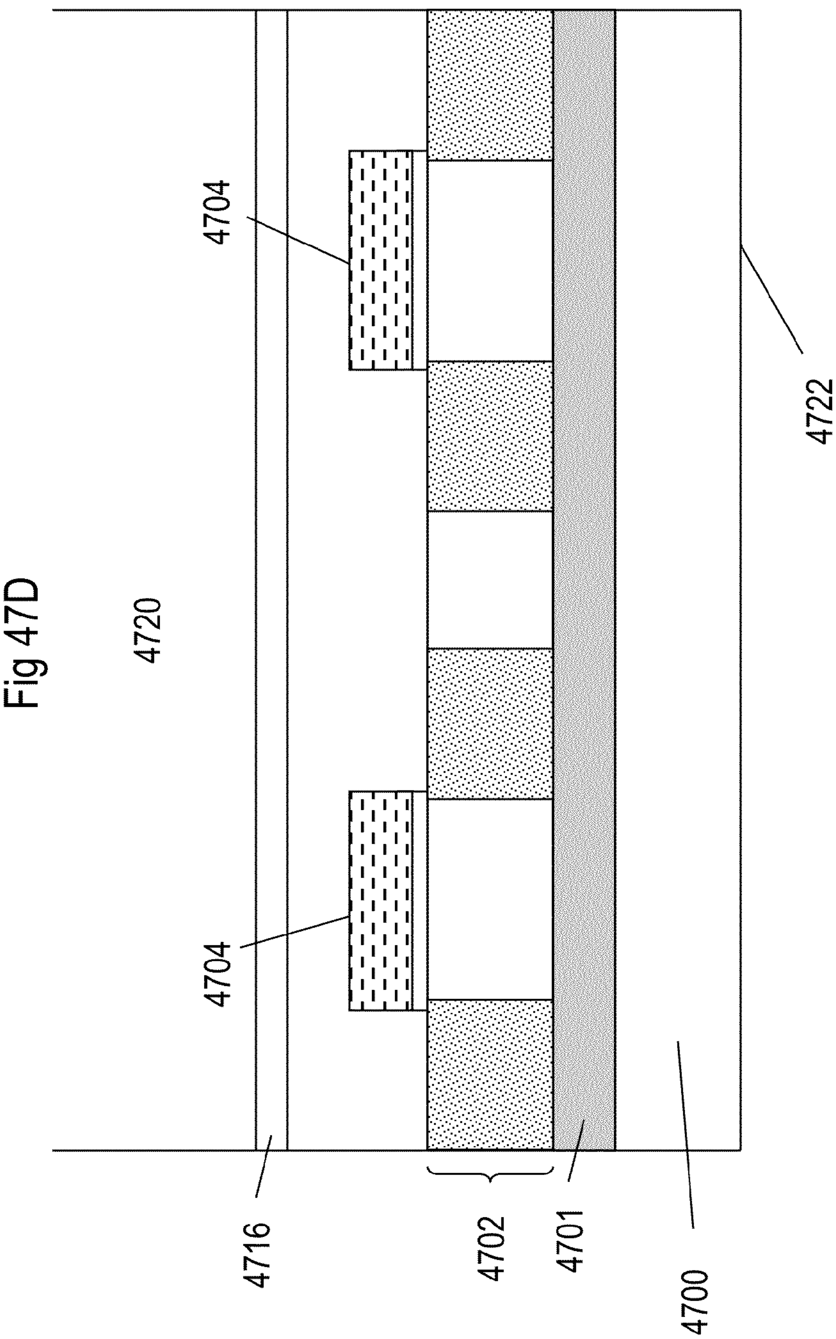
Figure 47E:
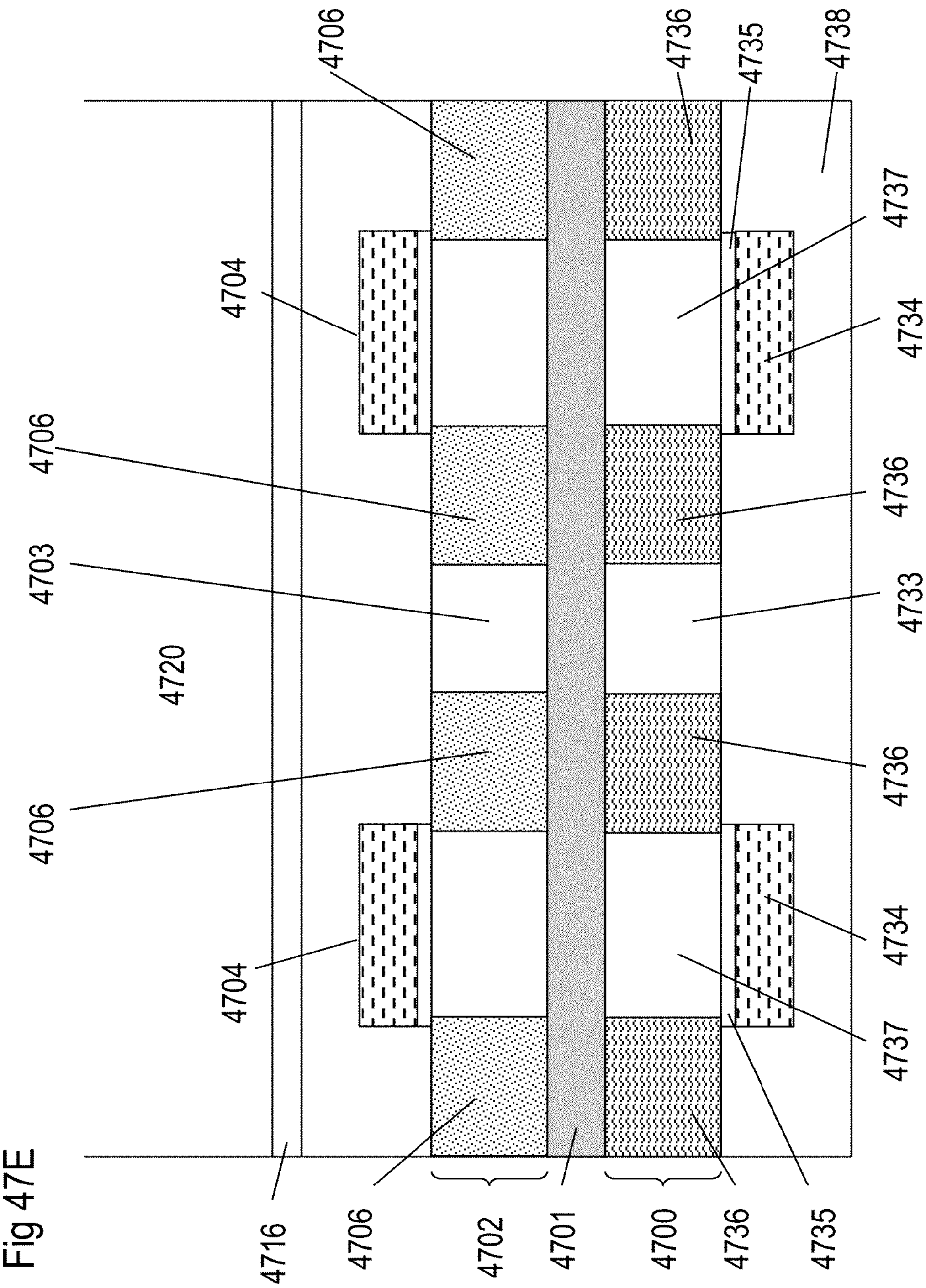
Figure 47F:
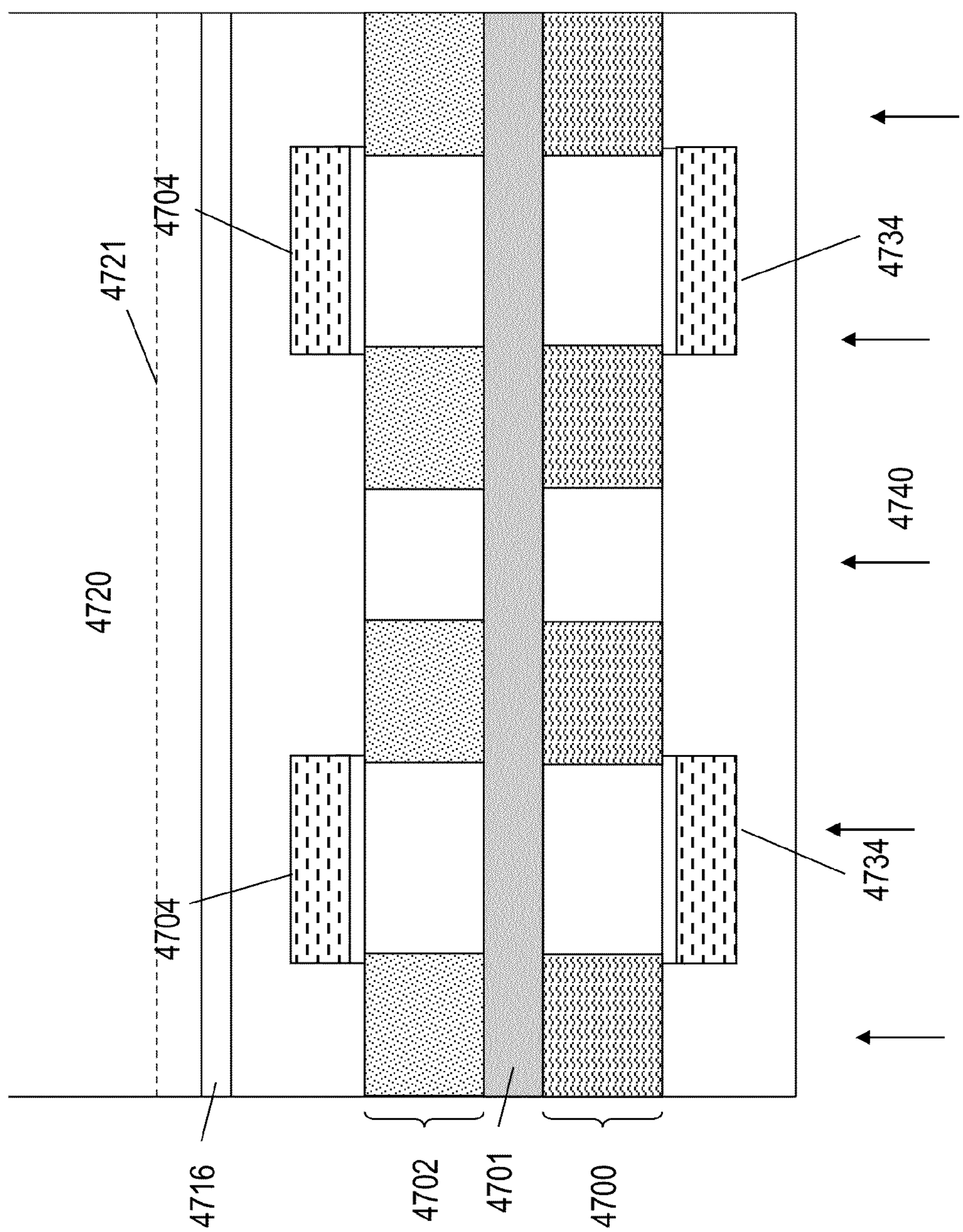
Figure 47G:
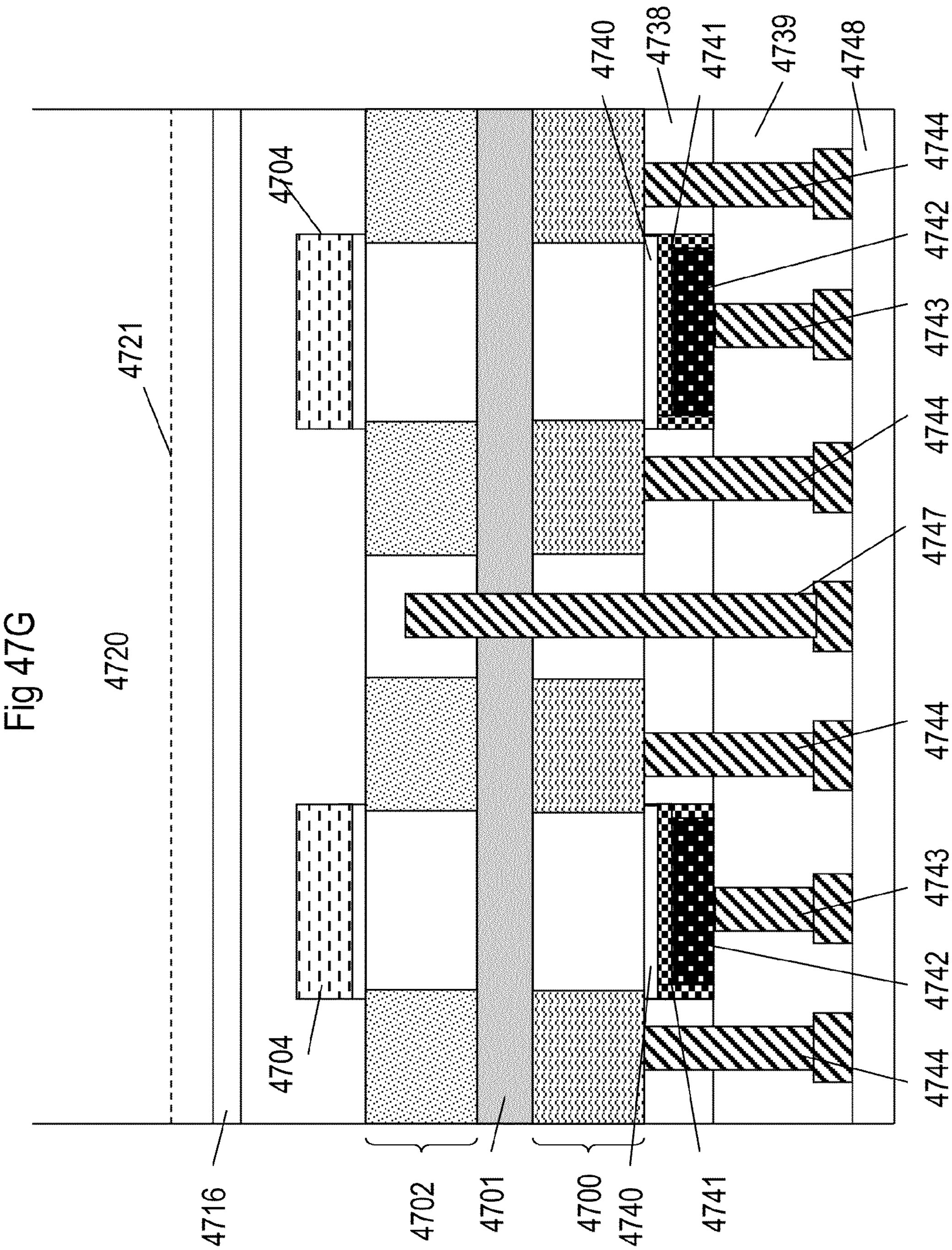
Figure 47H:
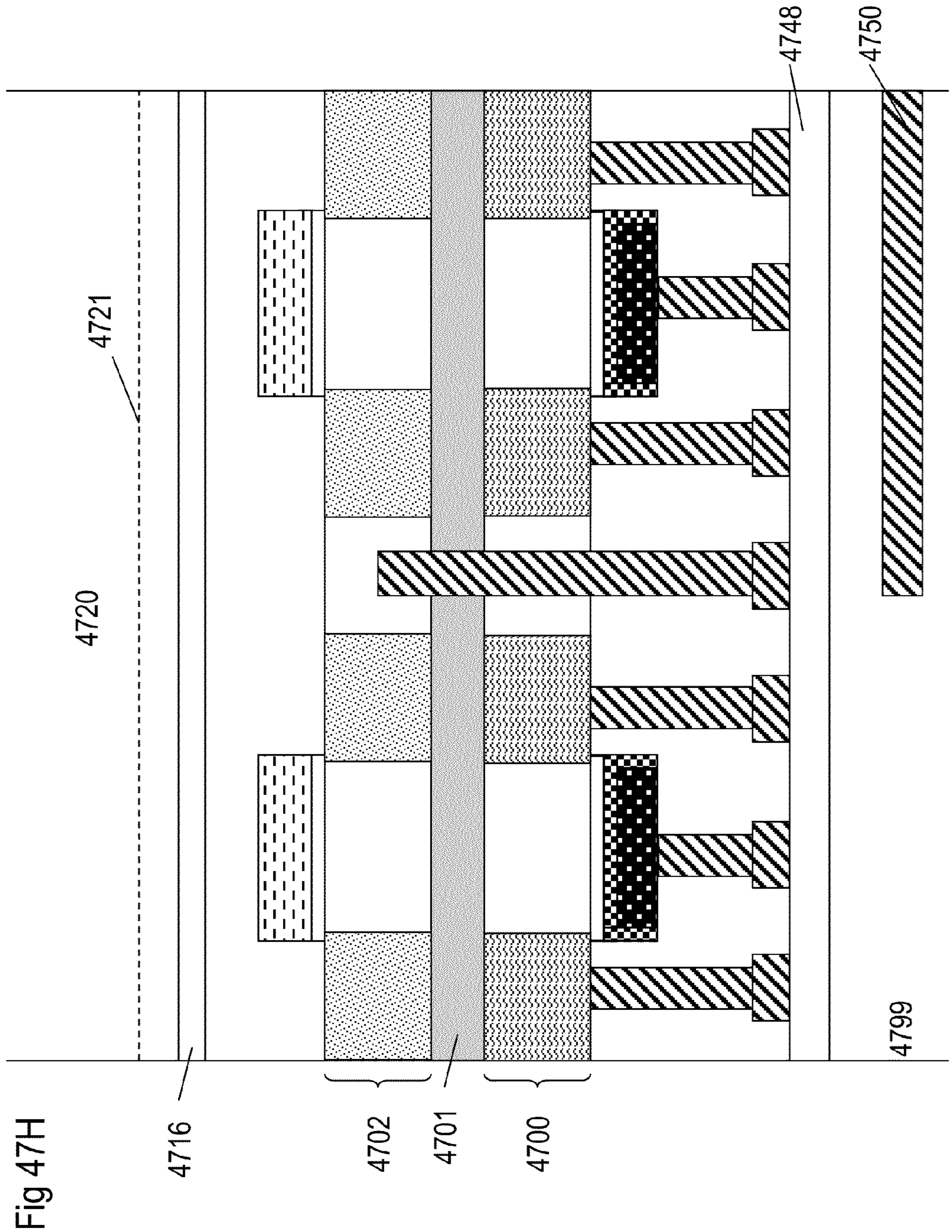
Figure 47I:
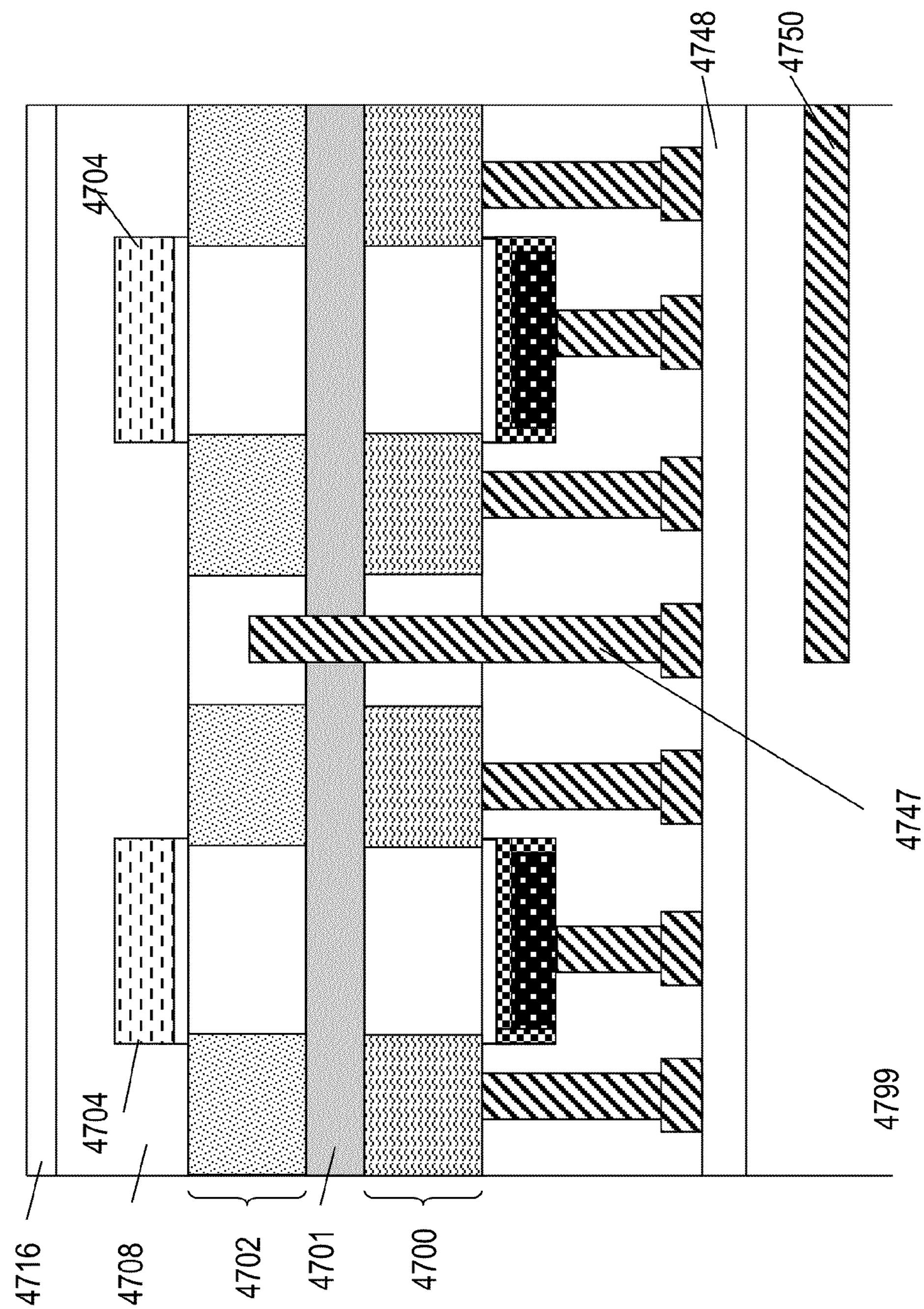
Figure 47J:
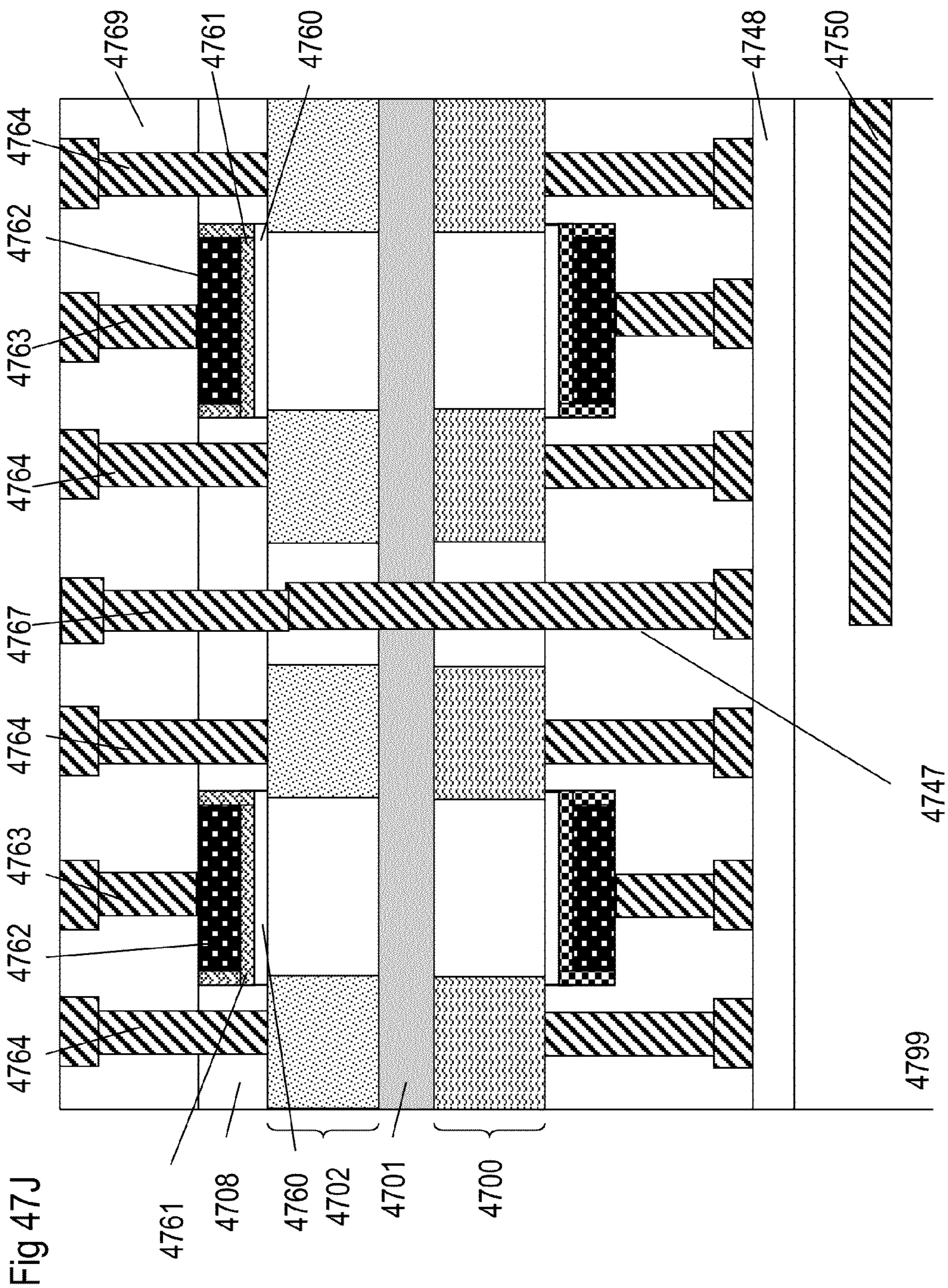
Figure 47K:
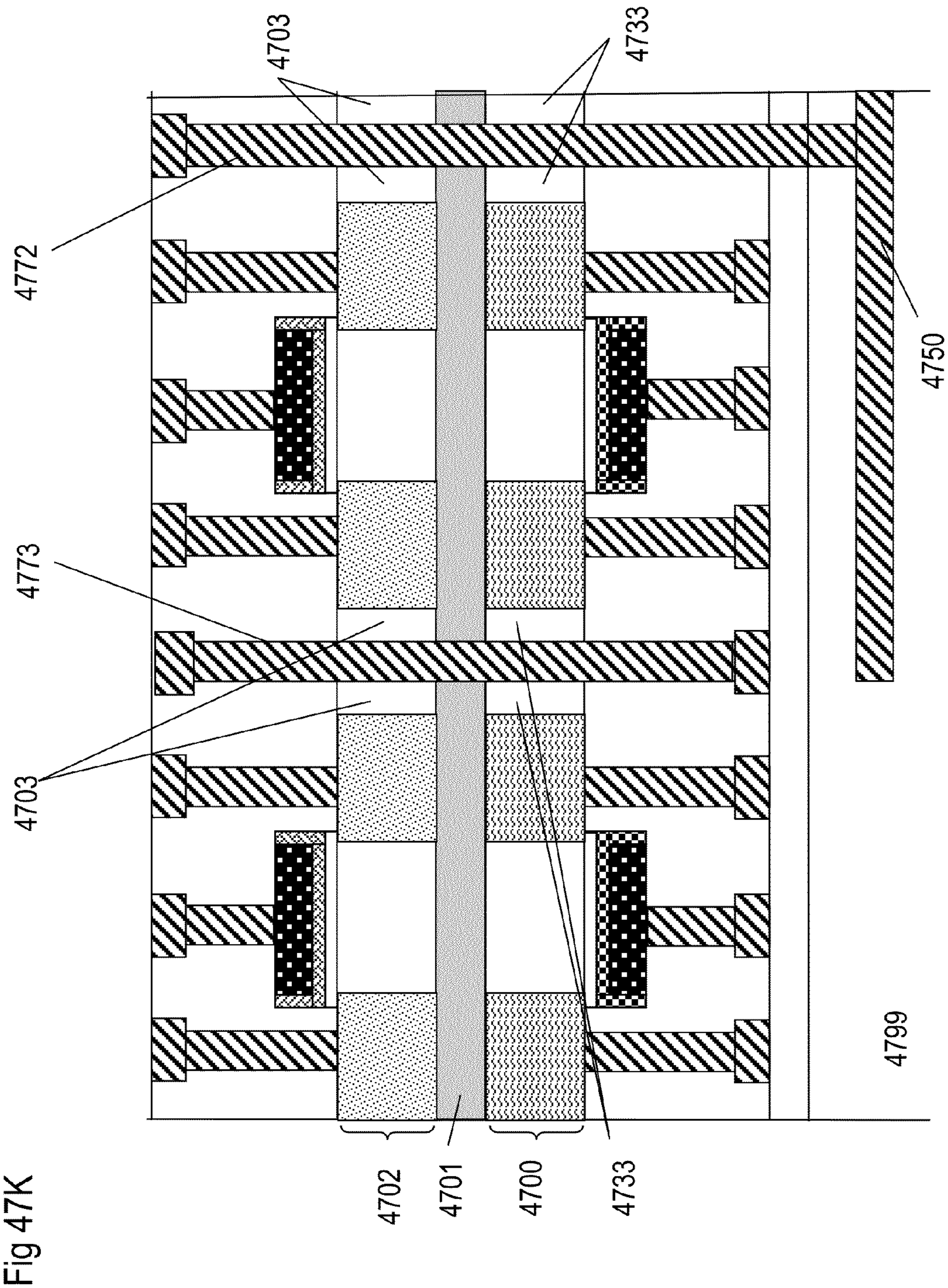

An interesting alternative is available when using the carrier wafer flow described in FIG. 46A-G. In this flow we can use the two sides of the transferred layer to build NMOS on one side and PMOS on the other side. Timing properly the replacement gate step such flow could enable full performance transistors properly aligned to each other. As illustrated in FIG. 47A, an SOI (Silicon On Insulator) donor (or top) wafer 4700 may be processed in the normal state of the art high k metal gate gate-last manner with adjusted thermal cycles to compensate for later thermal processing up to the step prior to where CMP exposure of the polysilicon dummy gates 4704 takes place. FIG. 47A illustrates a cross section of the SOI donor wafer substrate 4700, the buried oxide (BOX) 4701, the thin silicon layer 4702 of the SOI wafer, the isolation 4703 between transistors, the polysilicon 4704 and gate oxide 4705 of n-type CMOS transistors with dummy gates, their associated source and drains 4706 for NMOS, and the NMOS interlayer dielectric (ILD) 4708. Alternatively, the PMOS device may be constructed at this stage. This completes the first phase of transistor formation. At this step, or alternatively just after a CMP of layer 4708 to expose the polysilicon dummy gates 4704 or to planarize the oxide layer 4708 and not expose the dummy gates 4704, an implant of an atomic species 4710, such as H+, is done to prepare the cleaving plane 4712 in the bulk of the donor substrate, as illustrated in FIG. 47B. The SOI donor wafer 4700 is now permanently bonded to a carrier wafer 4720 that has been prepared with an oxide layer 4716 for oxide to oxide bonding to the donor wafer surface 4714 as illustrated in FIG. 47C. The details have been described previously. The donor wafer 4700 may then be cleaved at the cleaving plane 4712 and may be thinned by chemical mechanical polishing (CMP) and surface 4722 may be prepared for transistor formation. The donor wafer layer 4700 at surface 4722 may be processed in the normal state of the art gate last processing to form the PMOS transistors with dummy gates. During processing the wafer is flipped so that surface 4722 is on top, but for illustrative purposes this is not shown in the subsequent FIGS. 47E-G. FIG. 47E illustrates the cross section with the buried oxide (BOX) 4701, the now thin silicon layer 4700 of the SOI substrate, the isolation 4733 between transistors, the polysilicon 4734 and gate oxide 4735 of p-type CMOS dummy gates, their associated source and drains 4736 for PMOS, and the PMOS interlayer dielectric (ILD) 4738. The PMOS transistors may be precisely aligned at state of the art tolerances to the NMOS transistors due to the shared substrate 4700 possessing the same alignment marks. At this step, or alternatively just after a CMP of layer 4738 to expose the PMOS polysilicon dummy gates or to planarize the oxide layer 4738 and not expose the dummy gates, the wafer could be put into high temperature cycle to activate both the dopants in the NMOS and the PMOS source drain regions. Then an implant of an atomic species 4740, such as H+, may prepare the cleaving plane 4721 in the bulk of the carrier wafer substrate 4720 for layer transfer suitability, as illustrated in FIG. 47F. The PMOS transistors are now ready for normal state of the art gate-last transistor formation completion. As illustrated in FIG. 47G, the inter layer dielectric 4738 may be chemical mechanically polished to expose the top of the polysilicon dummy gates 4734. The dummy polysilicon gates 4734 may then be removed by etch and the PMOS hi-k gate dielectric 4740 and the PMOS specific work function metal gate 4741 may be deposited. An aluminum fill 4742 may be performed on the PMOS gates and the metal CMP'ed. A dielectric layer 4739 may be deposited and the normal gate 4743 and source/drain 4744 contact formation and metallization. The PMOS layer to NMOS layer via 4747 and metallization may be partially formed as illustrated in FIG. 47G and an oxide layer 4748 is deposited to prepare for bonding. The carrier wafer and two sided n/p layer is then permanently bonded to bottom wafer having transistors and wires 4799 with associated metal landing strip 4750 as illustrated in FIG. 47H. The carrier wafer 4720 may then be cleaved at the cleaving plane 4721 and may be thinned by chemical mechanical polishing (CMP) to oxide layer 4716 as illustrated in FIG. 47I. The NMOS transistors are now ready for normal state of the art gate-last transistor formation completion. As illustrated in FIG. 47J, the oxide layer 4716 and the NMOS inter layer dielectric 4708 may be chemical mechanically polished to expose the top of the NMOS polysilicon dummy gates 4704. The dummy polysilicon gates 4704 may then be removed by etch and the NMOS hi-k gate dielectric 4760 and the NMOS specific work function metal gate 4761 may be deposited. An aluminum fill 4762 may be performed on the NMOS gates and the metal CMP'ed. A dielectric layer 4769 may be deposited and the normal gate 4763 and source/drain 4764 contact formation and metallization. The NMOS layer to PMOS layer via 4767 to connect to 4747 and metallization may be formed. As illustrated in FIG. 47K, the layer-to-layer contacts 4772 to the landing pads in the base wafer are now made. This same contact etch could be used to make the connections 4773 between the NMOS and PMOS layer as well, instead of using the two step (4747 and 4767) method in FIG. 47H.

Figure 48:
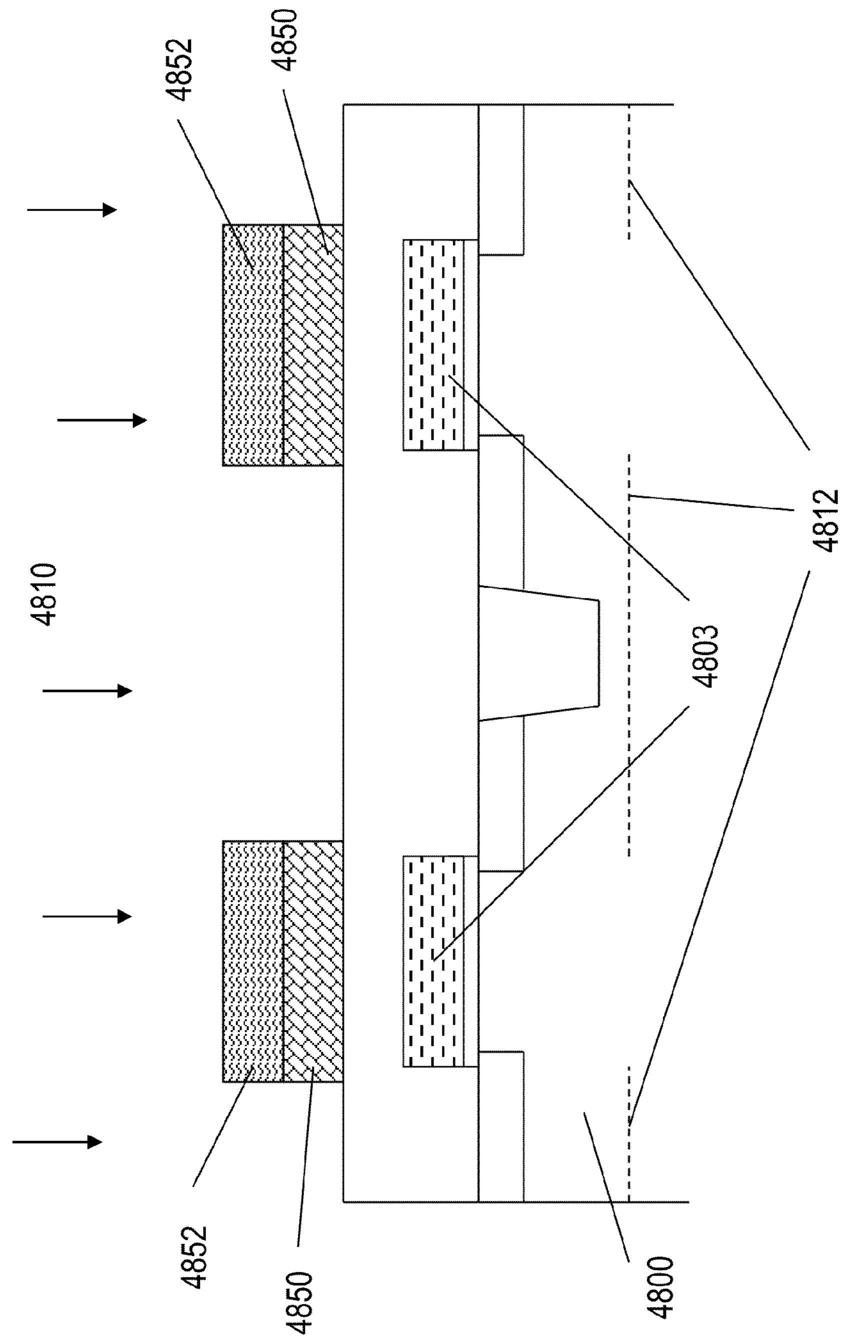
FIG. 48 illustrates using a shield for blocking Hydrogen implants from gate areas.
Figure 49:
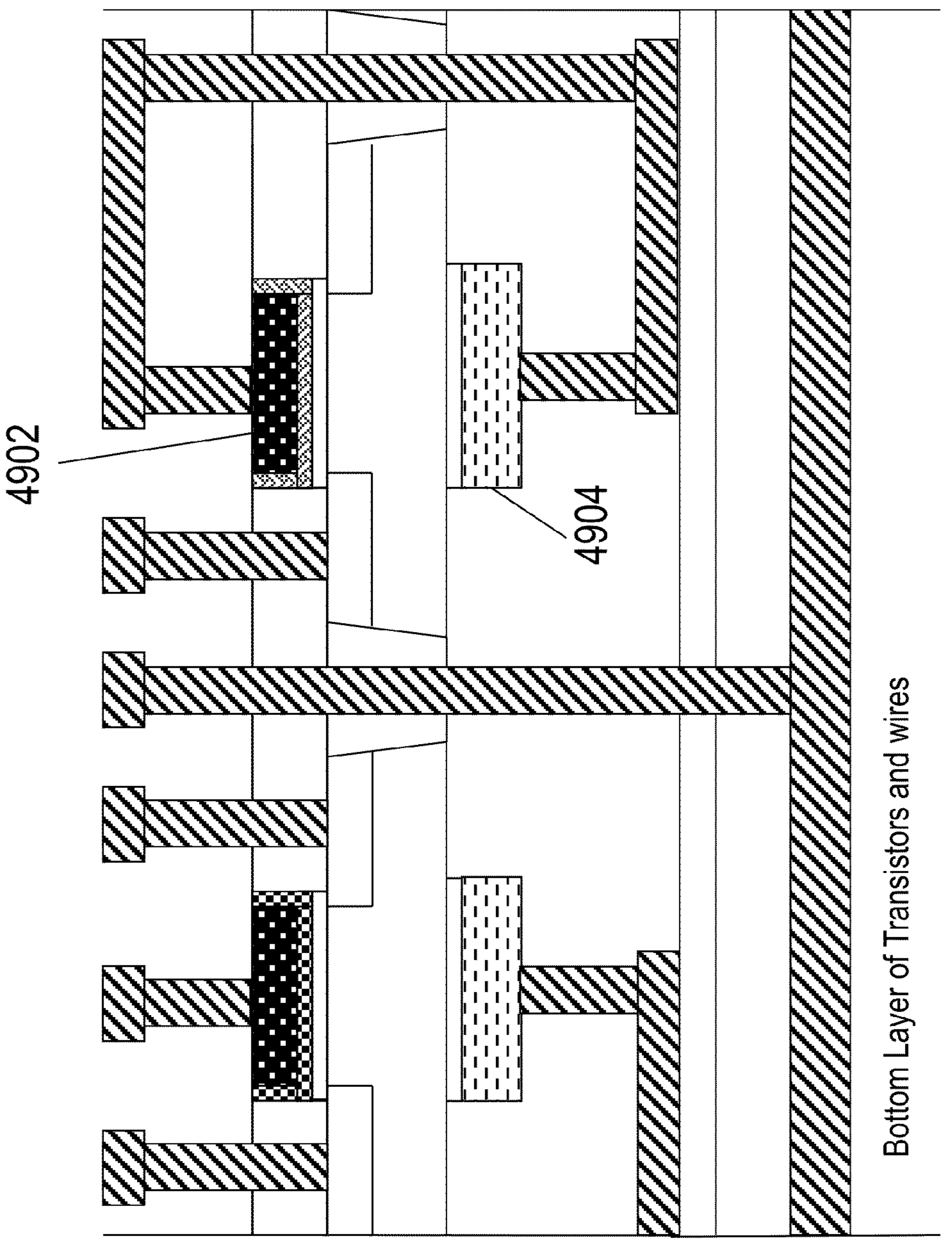
FIG. 49 illustrates constructing transistors with front gates and back gates on either side of the semiconductor layer.

Another alternative is illustrated in FIG. 48 whereby the implant of an atomic species 4810, such as H+, may be screened from the sensitive gate areas 4803 by first masking and etching a shield implant stopping layer of a dense material 4850, for example 5000 angstroms of Tantalum, and may be combined with 5,000 angstroms of photoresist 4852. This may create a segmented cleave plane 4812 in the bulk of the donor wafer silicon wafer and may require additional polishing to provide a smooth bonding surface for layer transfer suitability, Using procedures similar to FIG. 47A-K, it is possible to construct structures such as FIG. 49 where a transistor is constructed with front gate 4902 and back gate 4904. The back gate could be utilized for many purposes such as threshold voltage control, reduction of variability, increase of drive current and other purposes.

Various approaches described in Section 2 could be utilized for constructing a 3D stacked gate-array with a repeating layout, where the repeating component in the layout is a look-up table (LUT) implementation. For example, a 4 input look-up table could be utilized. This look-up table could be customized with a SRAM-based solution. Alternatively, a via-based solution could be used. Alternatively, a non-volatile memory based solution could be used. The approaches described in Section 1 could alternatively be utilized for constructing the 3D stacked gate array, where the repeating component is a look-up table implementation.

Figure 64:
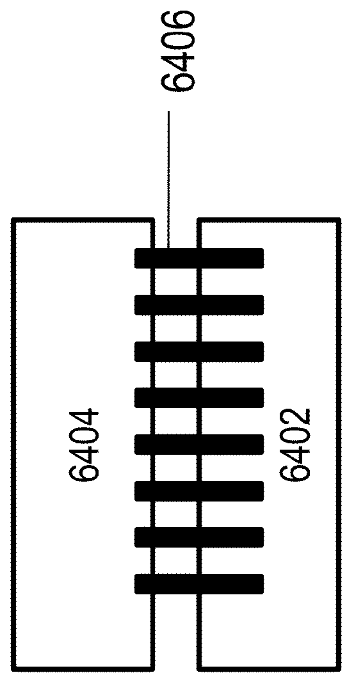
FIG. 64 illustrates 3D stacked peripheral transistors constructed above a memory layer.

FIG. 64 describes an embodiment of this invention, wherein a memory array 6402 may be constructed on a piece of silicon and peripheral transistors 6404 are stacked atop the memory array 6402. The peripheral transistors 6404 may be constructed well-aligned with the underlying memory array 6402 using any of the schemes described in Section 1 and Section 2. For example, the peripheral transistors may be junction-less transistors, recessed channel transistors or they could be formed with one of the repeating layout schemes described in Section 2. Through-silicon connections 6406 could connect the memory array 6402 to the peripheral transistors 6404. The memory array may consist of DRAM memory, SRAM memory, flash memory, some type of resistive memory or in general, could be any memory type that is commercially available.

Section 3: Monolithic 3D DRAM.

While Section 1 and Section 2 describe applications of monolithic 3D integration to logic circuits and chips, this Section describes novel monolithic 3D Dynamic Random Access Memories (DRAMs). Some embodiments of this invention may involve floating body DRAM. Background information on floating body DRAM and its operation is given in "Floating Body RAM Technology and its Scalability to 32 nm Node and Beyond," *Electron Devices Meeting,* 2006. *IEDM '06. International*, vol., no., pp. 1-4, 11-13 Dec. 2006 by T. Shino, N. Kusunoki, T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC '08, July 2009, Pages 676-683, ISSN 0038-1101, DOI: 10.1016/j.sse.2009.03.010 by Takeshi Hamamoto, Takashi Ohsawa, et al., "New Generation of Z-RAM," *Electron Devices Meeting,* 2007. *IEDM* 2007. *IEEE International*, vol., no., pp. 925-928, 10-12 Dec. 2007 by Okhonin, S.; Nagoga, M.; Carman, E, et al. The above publications are incorporated herein by reference.

FIG. 28 describes fundamental operation of a prior art floating body DRAM. For storing a '1' bit, holes 2802 are present in the floating body 2820 and change the threshold voltage of the cell, as shown in FIG. 28(*a*). The '0' bit corresponds to no charge being stored in the floating body, as shown in FIG. 28(*b*). The difference in threshold voltage between FIG. 28(*a*) and FIG. 28(*b*) may give rise to a change in drain current of the transistor at a particular gate voltage, as described in FIG. 28(*c*). This current differential can be sensed by a sense amplifier to differentiate between '0' and '1' states.

FIG. 29A-H describe a process flow to construct a horizontally-oriented monolithic 3D DRAM. Two masks are utilized on a "per-memory-layer" basis for the monolithic 3D DRAM concept shown in FIG. 29A-H, while other masks are shared between all constructed memory layers. The process flow may include several steps in the following sequence.

Figure 29A:
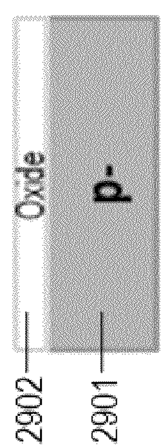
FIG. 29A-H show a two-mask per layer 3D floating body DRAM.

Step (A): A p− Silicon wafer 2901 is taken and an oxide layer 2902 is grown or deposited above it. FIG. 29A illustrates the structure after Step (A).

Figure 29B:
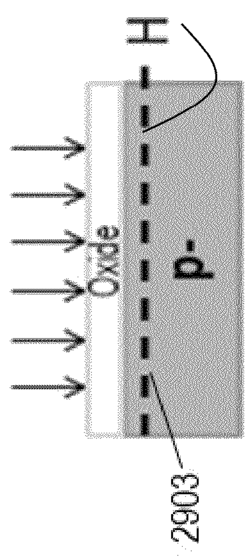

Step (B): Hydrogen is implanted into the p− wafer 2901 at a certain depth denoted by 2903. FIG. 29B illustrates the structure after Step (B).

Figure 29C:
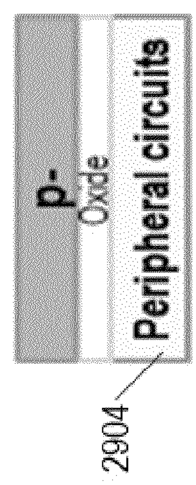

Step (C): The wafer after Step (B) is flipped and bonded onto a wafer having peripheral circuits 2904 covered with oxide. This bonding process occurs using oxide-to-oxide bonding. The stack is then cleaved at the hydrogen implant plane 2903 using either an anneal or a sideways mechanical force. A chemical mechanical polish (CMP) process is then conducted. Note that peripheral circuits 2904 are such that they can withstand an additional rapid-thermal-anneal (RTA) and still remain operational, and preferably retain good performance. For this purpose, the peripheral circuits 2904 may be such that they have not had their RTA for activating dopants or they have had a weak RTA for activating dopants. Also, peripheral circuits 2904 utilize a refractory metal such as tungsten that can withstand high temperatures greater than 400° C. FIG. 29C illustrates the structure after Step (C).

Figure 29D:
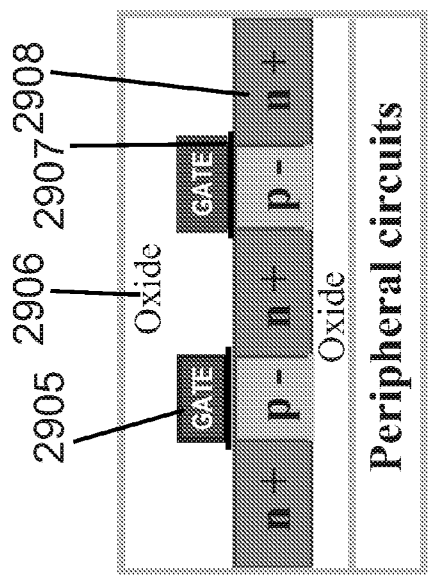

Step (D): The transferred layer of p− silicon after Step (C) is then processed to form isolation regions using a STI process. Following, gate regions 2905 are deposited and patterned, following which source-drain regions 2908 are implanted using a self-aligned process. An inter-level dielectric (ILD) constructed of oxide (silicon dioxide) 2906 is then constructed. Note that no RTA is done to activate dopants in this layer of partially-depleted SOI (PD-SOI) transistors. Alternatively, transistors could be of fully-depleted SOI type. FIG. 29D illustrates the structure after Step (D).

Figure 29E:
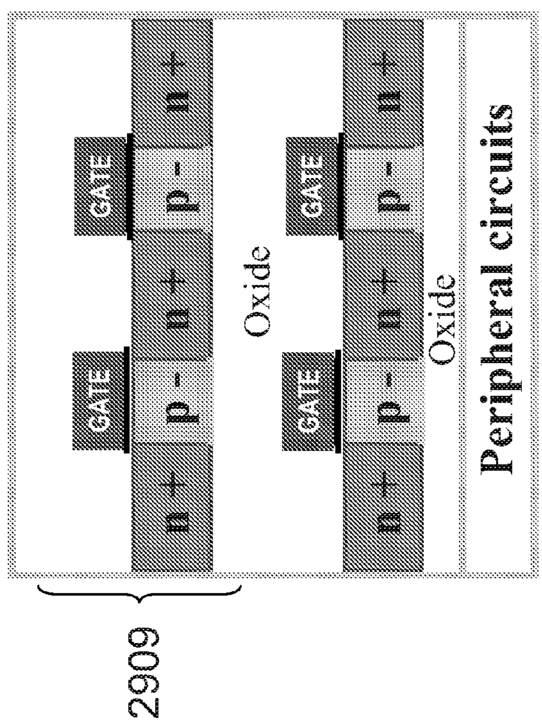

Step (E): Using steps similar to Step (A)-Step (D), another layer of memory 2909 is constructed. After all the desired memory layers are constructed, a RTA is conducted to activate dopants in all layers of memory (and potentially also the periphery). FIG. 29E illustrates the structure after Step (E).

Figure 29F:
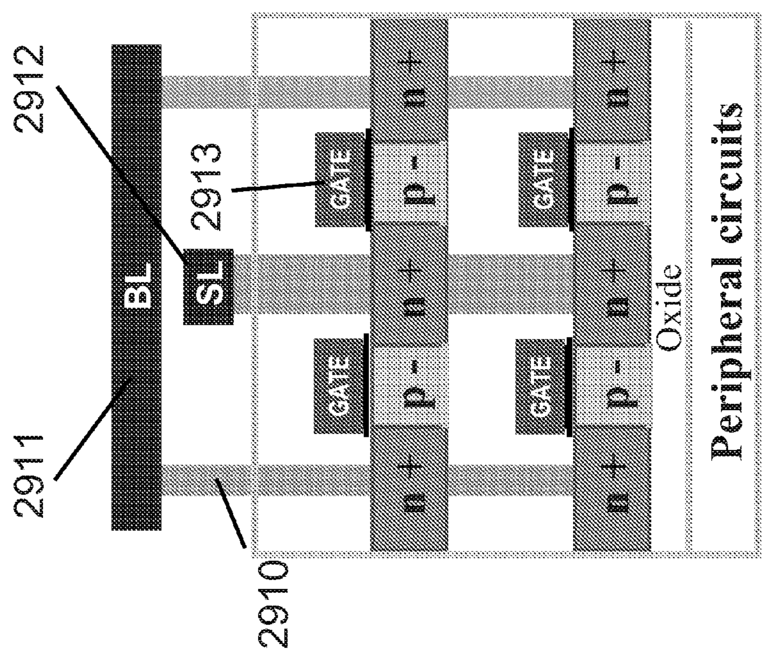

Step (F): Contact plugs 2910 are made to source and drain regions of different layers of memory. Bit-line (BL) wiring 2911 and Source-line (SL) wiring 2912 are connected to contact plugs 2910. Gate regions 2913 of memory layers are connected together to form word-line (WL) wiring. FIG. 29F illustrates the structure after Step (F).

Figure 29G:
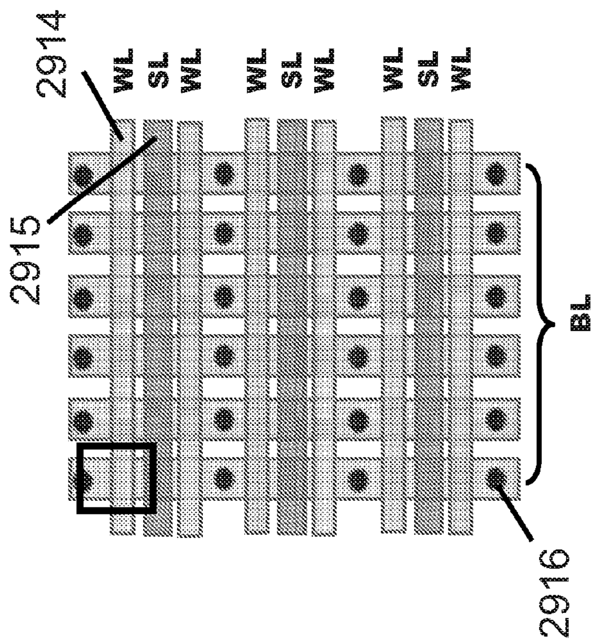
Figure 29H:
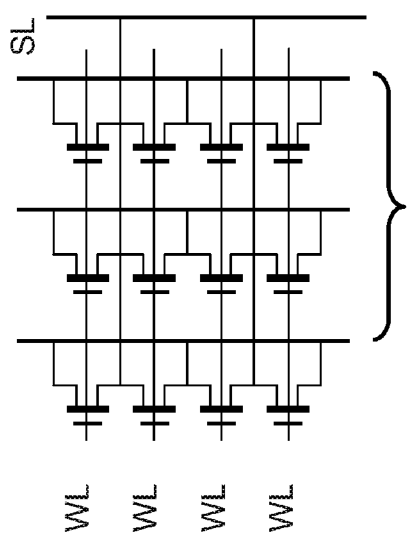

FIG. 29G and FIG. 29H describe array organization of the floating-body DRAM. BLs 2916 in a direction substantially perpendicular to the directions of SLs 2915 and WLs 2914.

FIG. 30A-M describe an alternative process flow to construct a horizontally-oriented monolithic 3D DRAM. This monolithic 3D DRAM utilizes the floating body effect and double-gate transistors. One mask is utilized on a "per-memory-layer" basis for the monolithic 3D DRAM concept shown in FIG. 30A-M, while other masks are shared between different layers. The process flow may include several steps that occur in the following sequence.

Figure 30A:
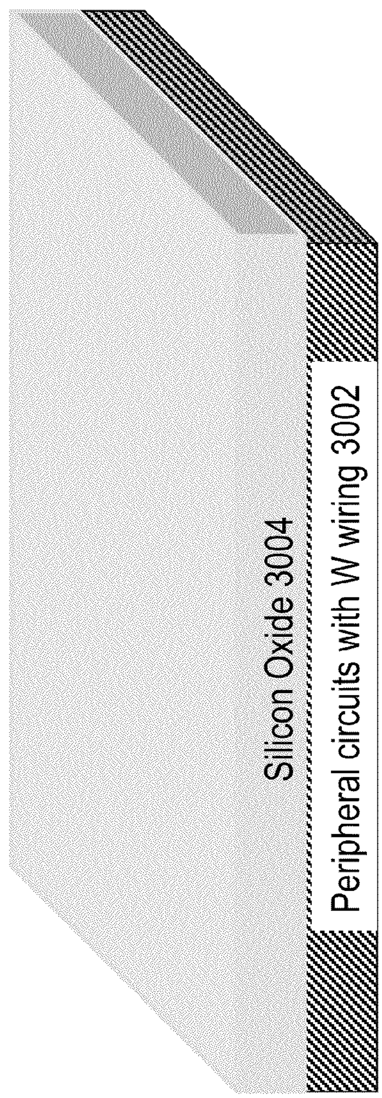
FIG. 30A-M show a one-mask per layer 3D floating body DRAM.

Step (A): Peripheral circuits with tungsten wiring 3002 are first constructed and above this a layer of silicon dioxide 3004 is deposited. FIG. 30A illustrates the structure after Step (A).

Figure 30B:
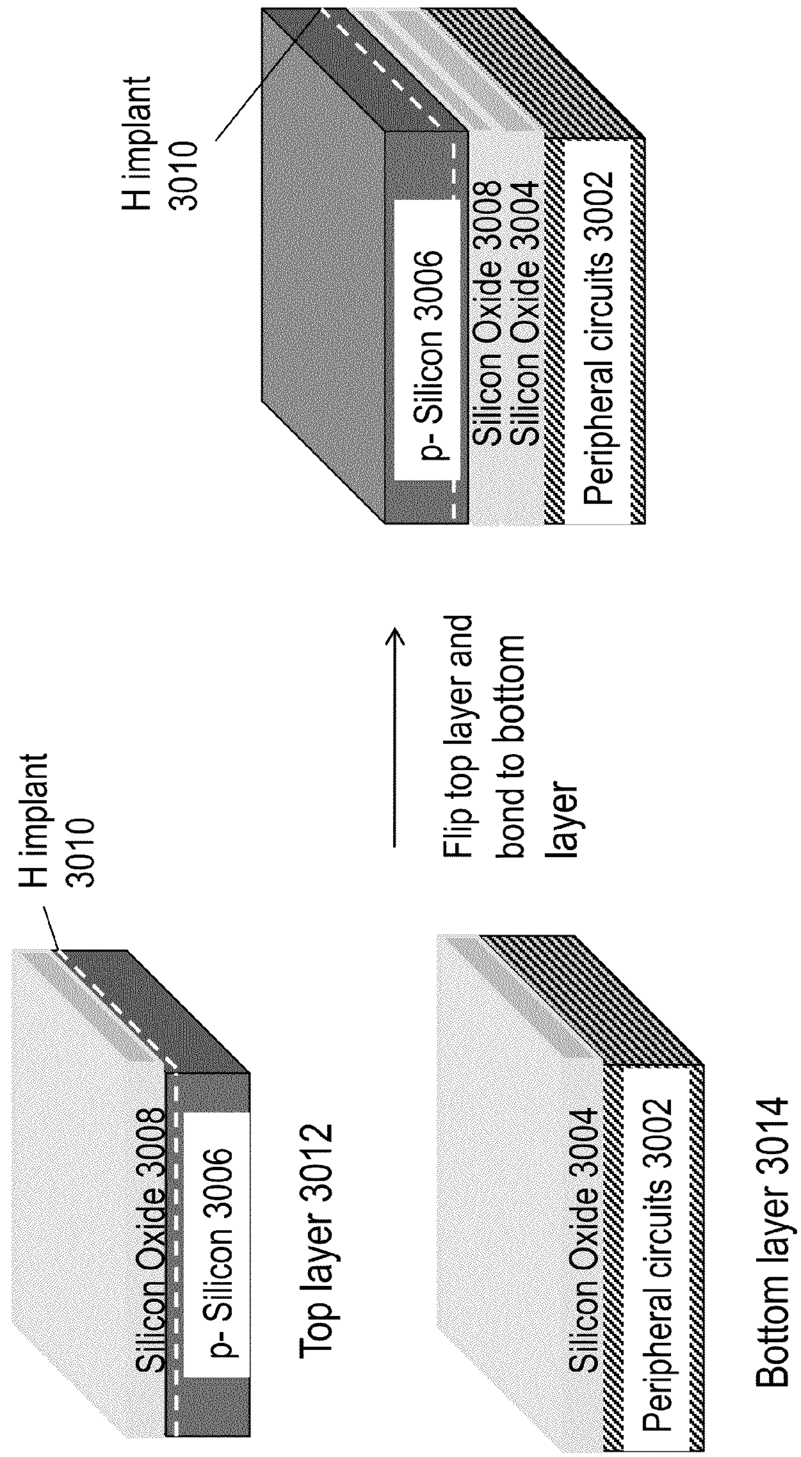

Step (B): FIG. 30B shows a drawing illustration after Step (B). A wafer of p− Silicon 3006 has an oxide layer 3008 grown or deposited above it. Following this, hydrogen is implanted into the p− Silicon wafer at a certain depth indicated by 3010. Alternatively, some other atomic species such as Helium could be (co-)implanted. This hydrogen implanted p− Silicon wafer 3006 forms the top layer 3012. The bottom layer 3014 may include the peripheral circuits 3002 with oxide layer 3004. The top layer 3012 is flipped and bonded to the bottom layer 3014 using oxide-to-oxide bonding.

Figure 30C:
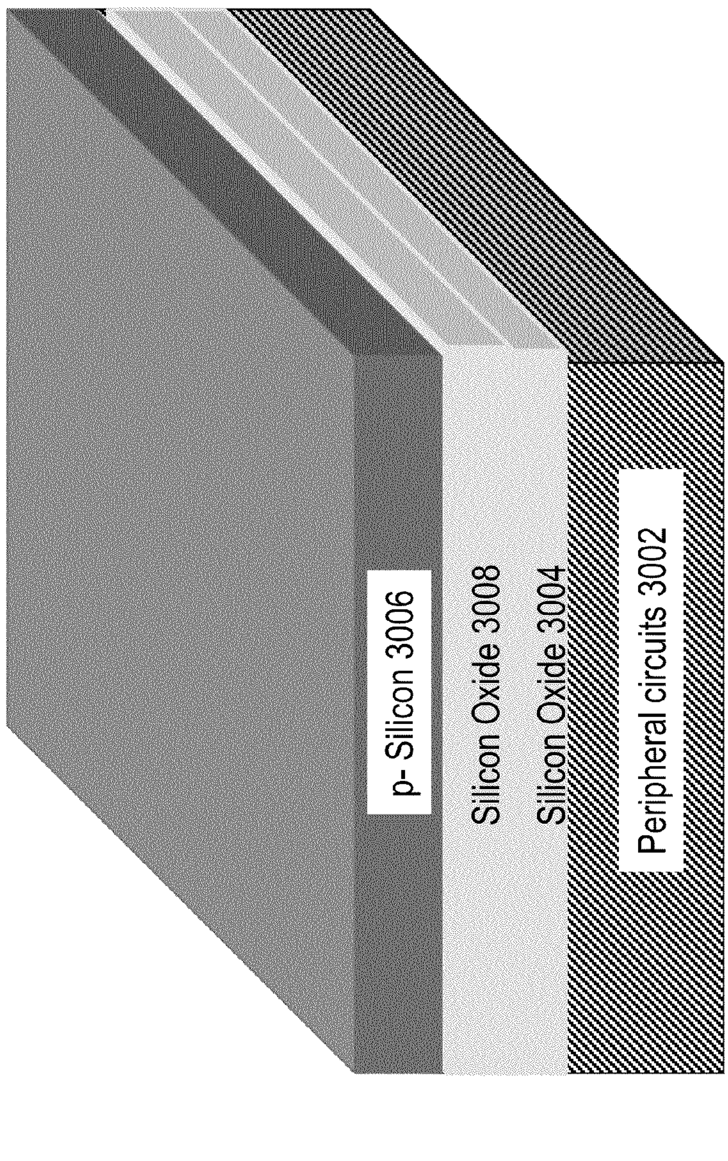

Step (C): FIG. 30C illustrates the structure after Step (C). The stack of top and bottom wafers after Step (B) is cleaved at the hydrogen plane 3010 using either a anneal or a sideways mechanical force or other means. A CMP process is then conducted. At the end of this step, a single-crystal p− Si layer exists atop the peripheral circuits, and this has been achieved using layer-transfer techniques.

Figure 30D:
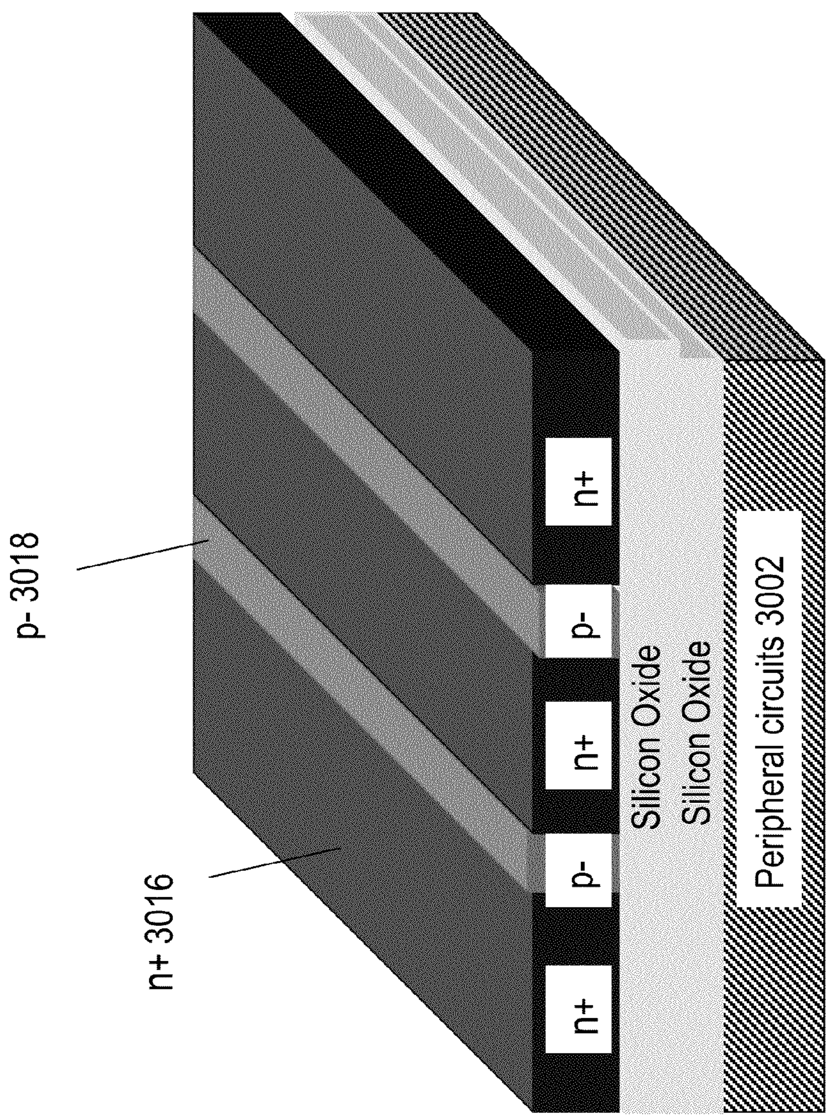

Step (D): FIG. 30D illustrates the structure after Step (D). Using lithography and then implantation, n+ regions 3016 and p− regions 3018 are formed on the transferred layer of p− Si after Step (C).

Figure 30E:
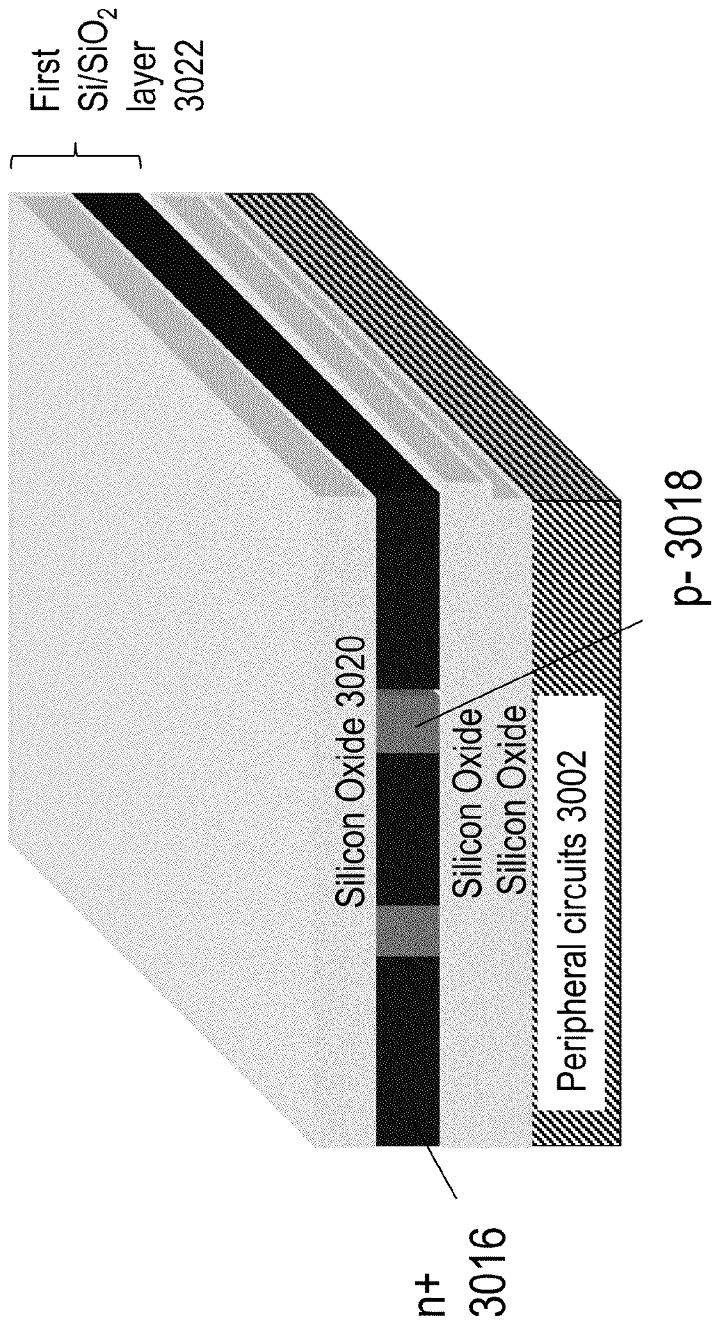

Step (E): FIG. 30E illustrates the structure after Step (E). An oxide layer 3020 is deposited atop the structure obtained after Step (D). A first layer of $Si/SiO_2$ 3022 is therefore formed atop the peripheral circuit layer 3002.

Figure 30F:
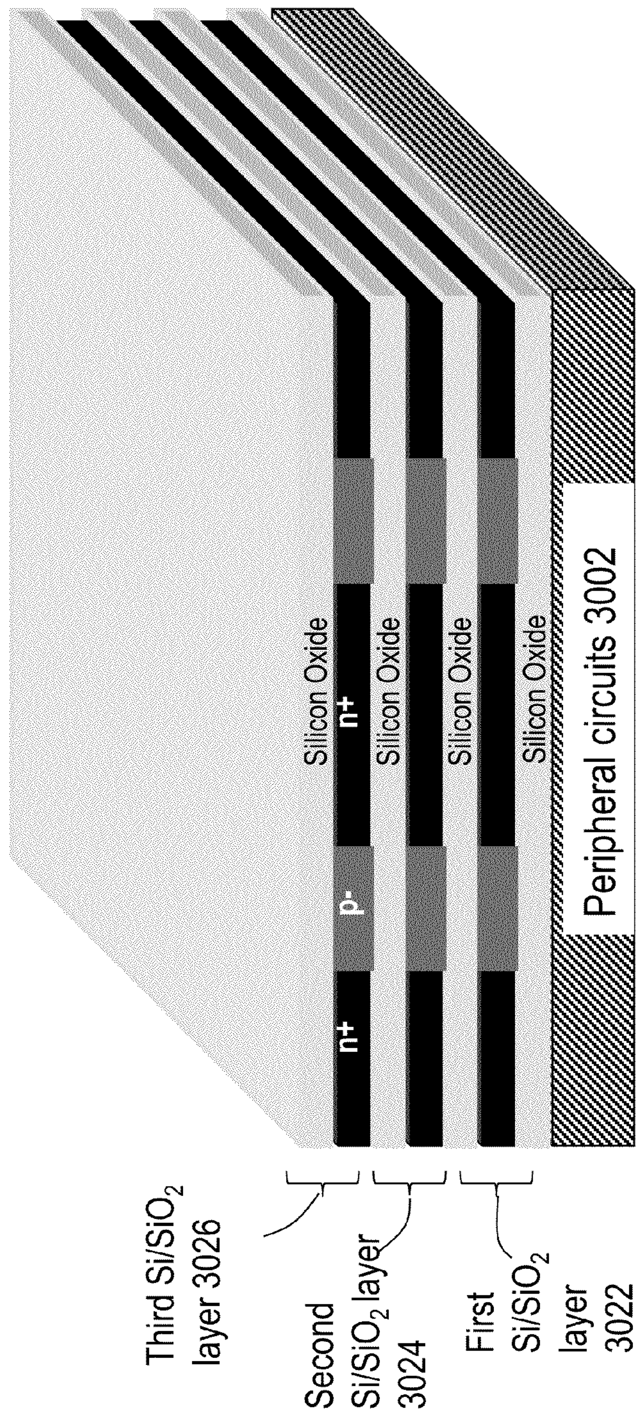

Step (F): FIG. 30F illustrates the structure after Step (F). Using procedures similar to Steps (B)-(E), additional $Si/SiO_2$ layers 3024 and 3026 are formed atop $Si/SiO_2$ layer 3022. A rapid thermal anneal (RTA) or spike anneal or flash anneal or laser anneal is then done to activate all implanted layers 3022, 3024 and 3026 (and possibly also the peripheral circuit layer 3002). Alternatively, the layers 3022, 3024 and 3026 are annealed layer-by-layer as soon as their implantations are done using a laser anneal system.

Figure 30G:
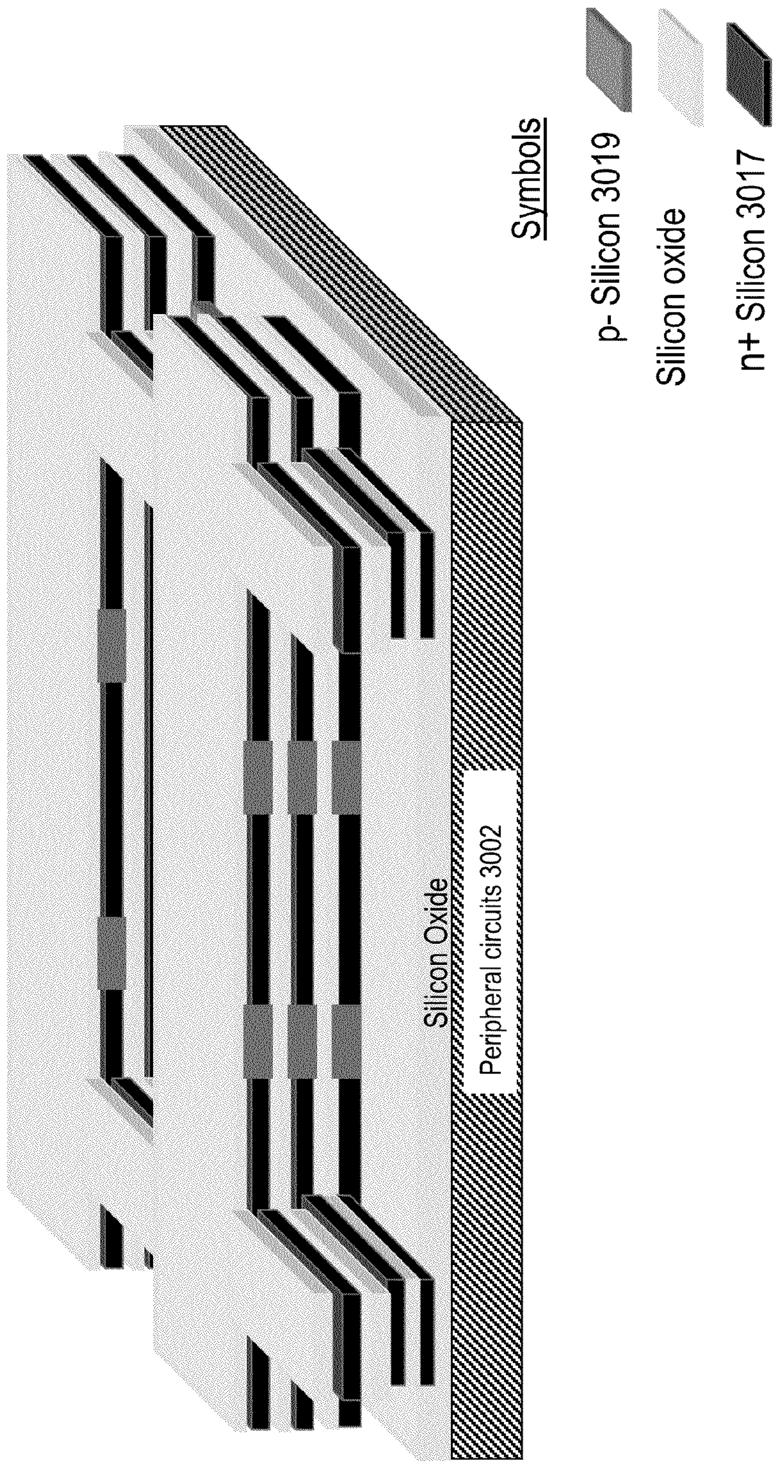

Step (G): FIG. 30G illustrates the structure after Step (G). Lithography and etch processes are then utilized to make a structure as shown in the figure.

Figure 30H:
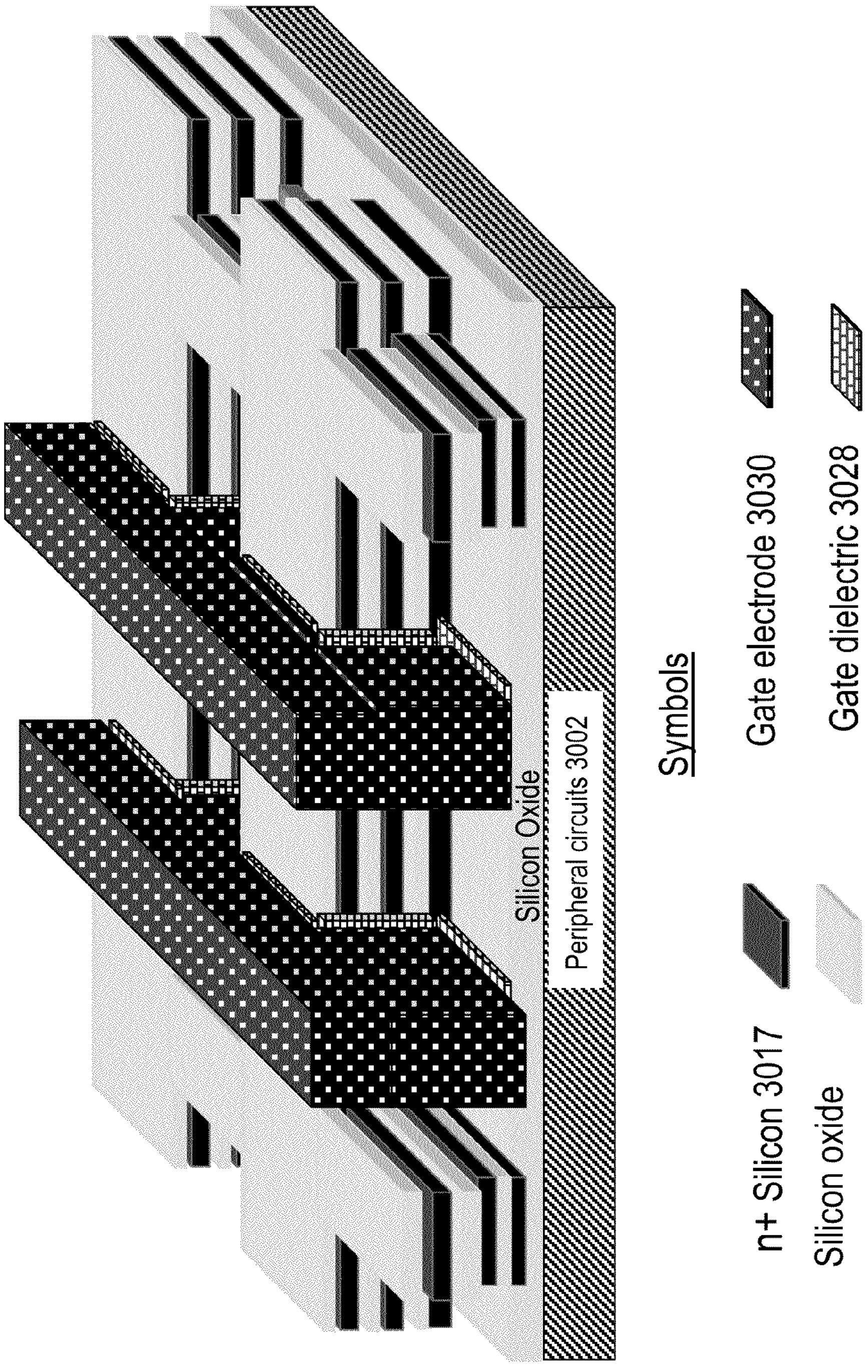

Step (H): FIG. 30H illustrates the structure after Step (H). Gate dielectric 3028 and gate electrode 3030 are then deposited following which a CMP is done to planarize the gate electrode 3030 regions. Lithography and etch are utilized to define gate regions over the p− silicon regions (eg. p− Si region after Step (D)). Note that gate width could be slightly larger than p− region width to compensate for overlay errors in lithography.

Figure 30I:
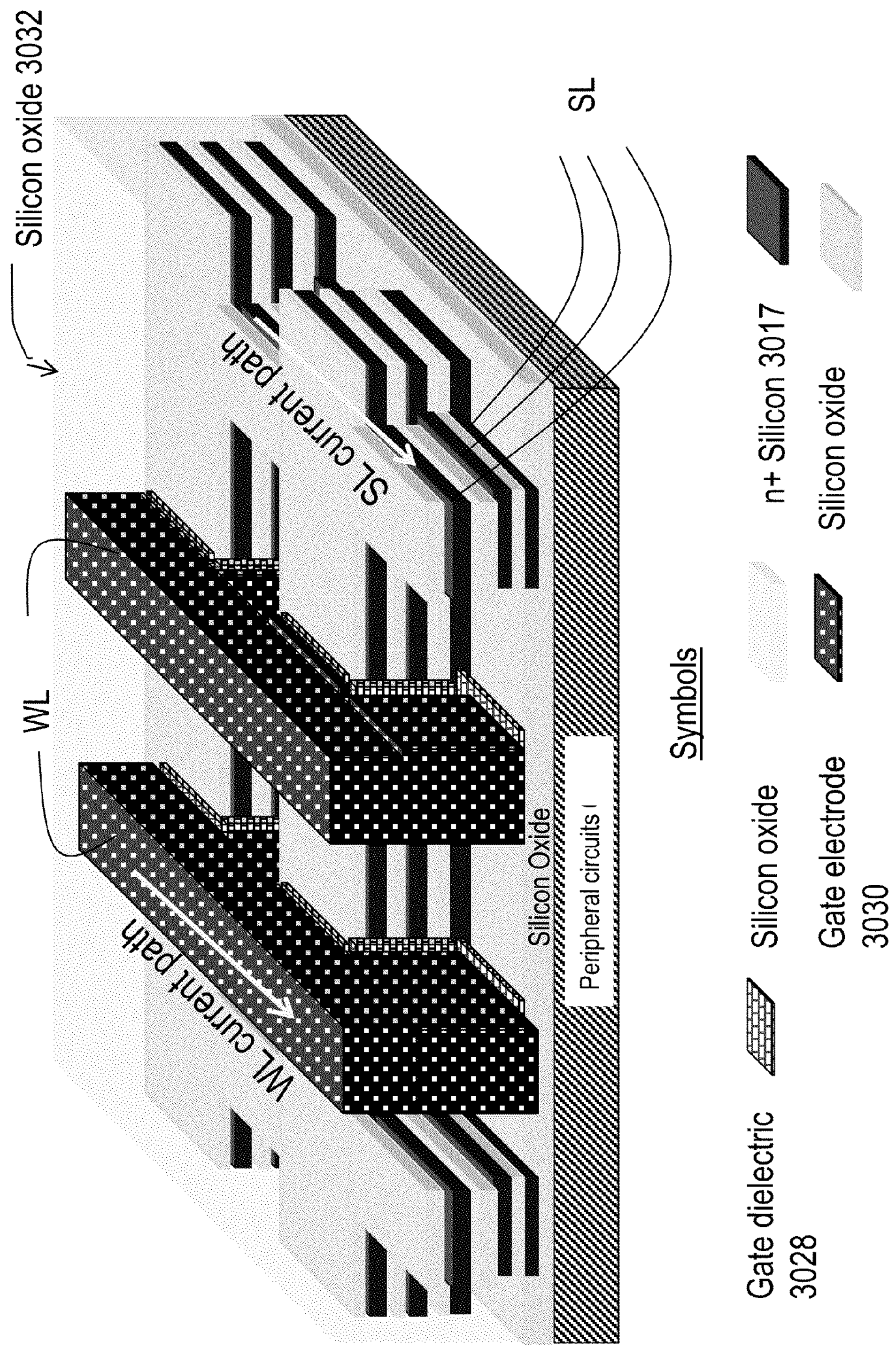

Step (I): FIG. 30I illustrates the structure after Step (I). A silicon oxide layer 3032 is then deposited and planarized. For clarity, the silicon oxide layer is shown transparent in the figure, along with word-line (WL) and source-line (SL) regions.

Figure 30J:
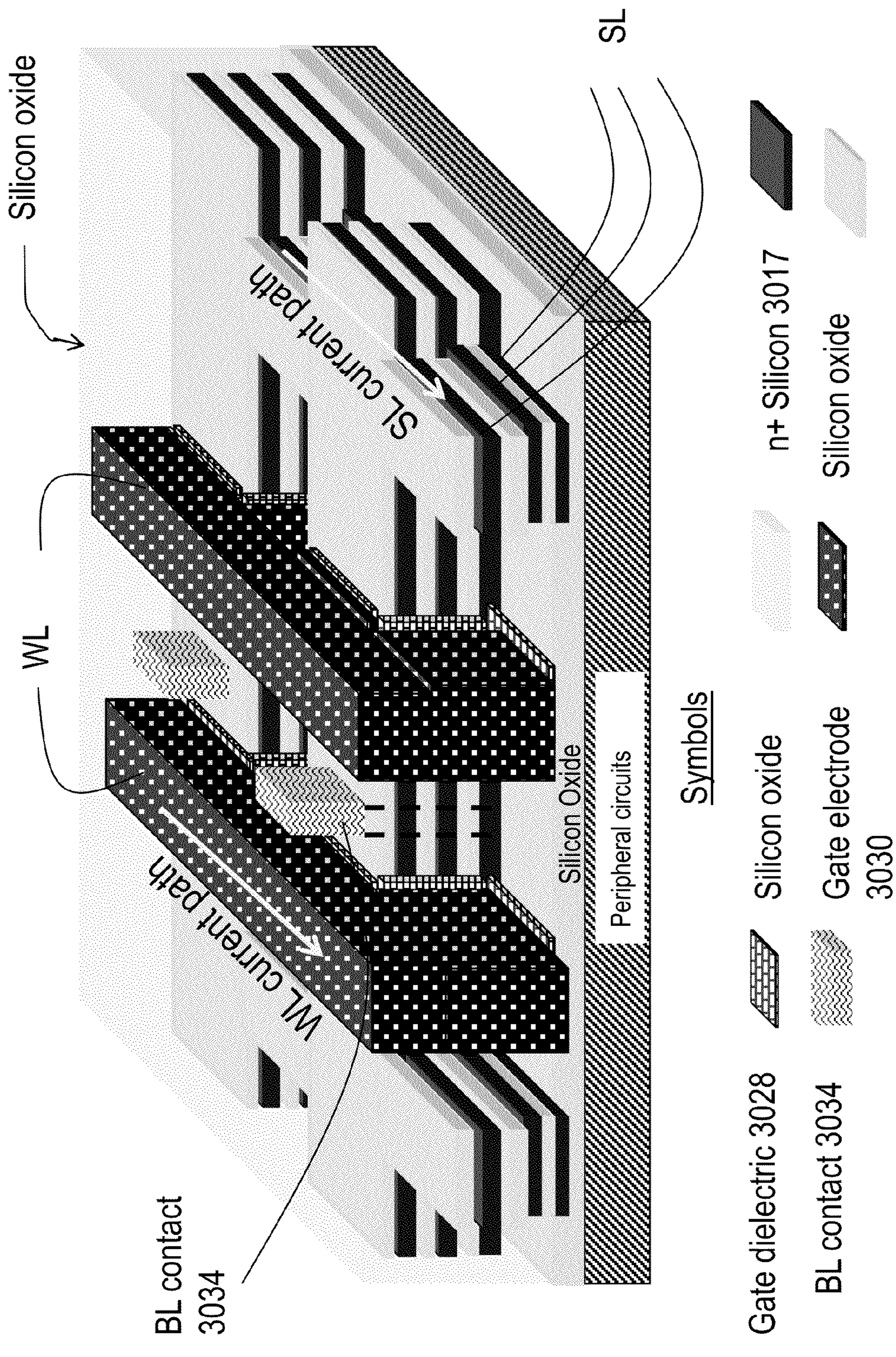

Step (J): FIG. 30J illustrates the structure after Step (J). Bit-line (BL) contacts 3034 are formed by etching and deposition. These BL contacts are shared among all layers of memory.

Figure 30K:
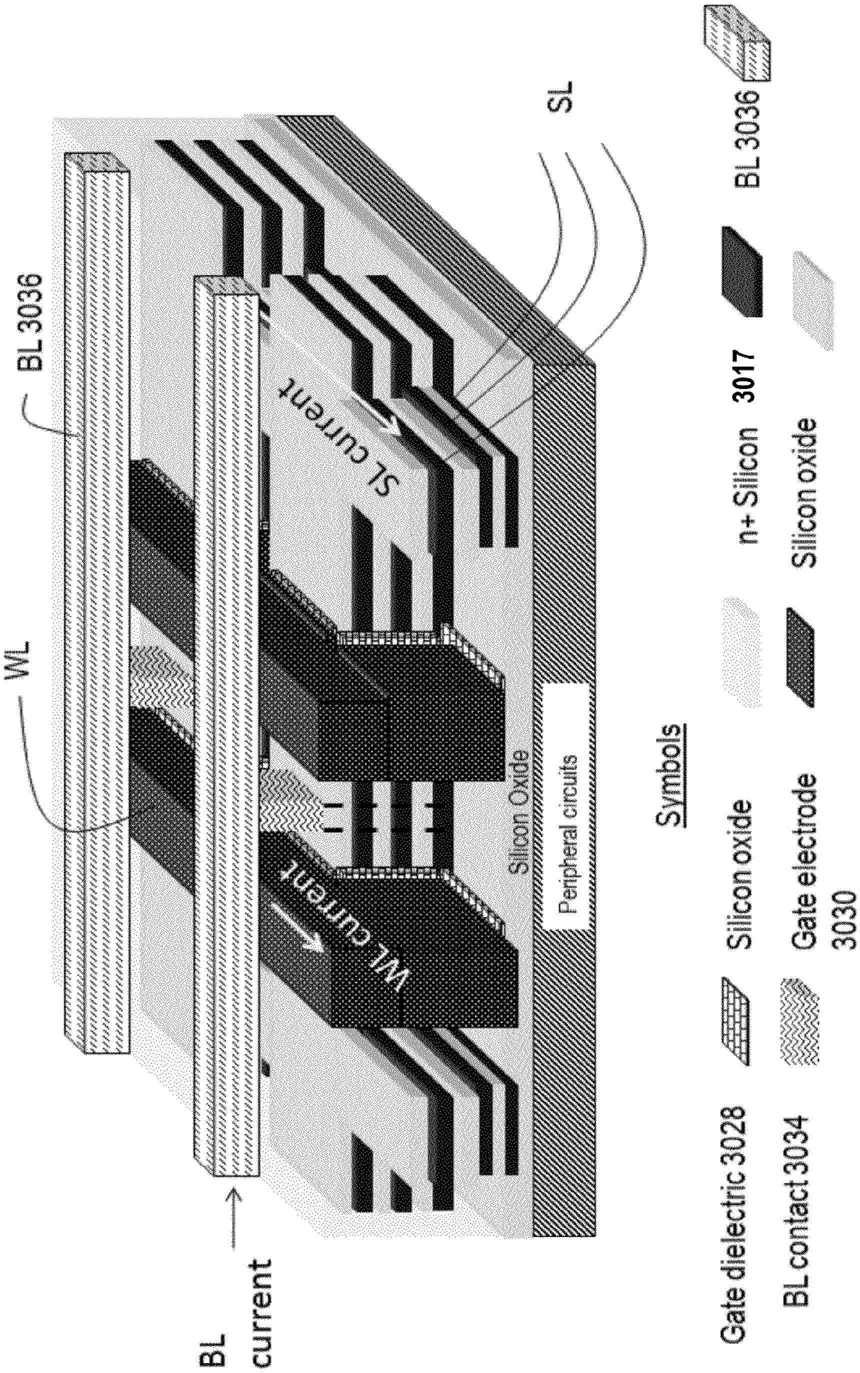

Step (K): FIG. 30K illustrates the structure after Step (K). BLs 3036 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (K) as well.

Figure 30L:
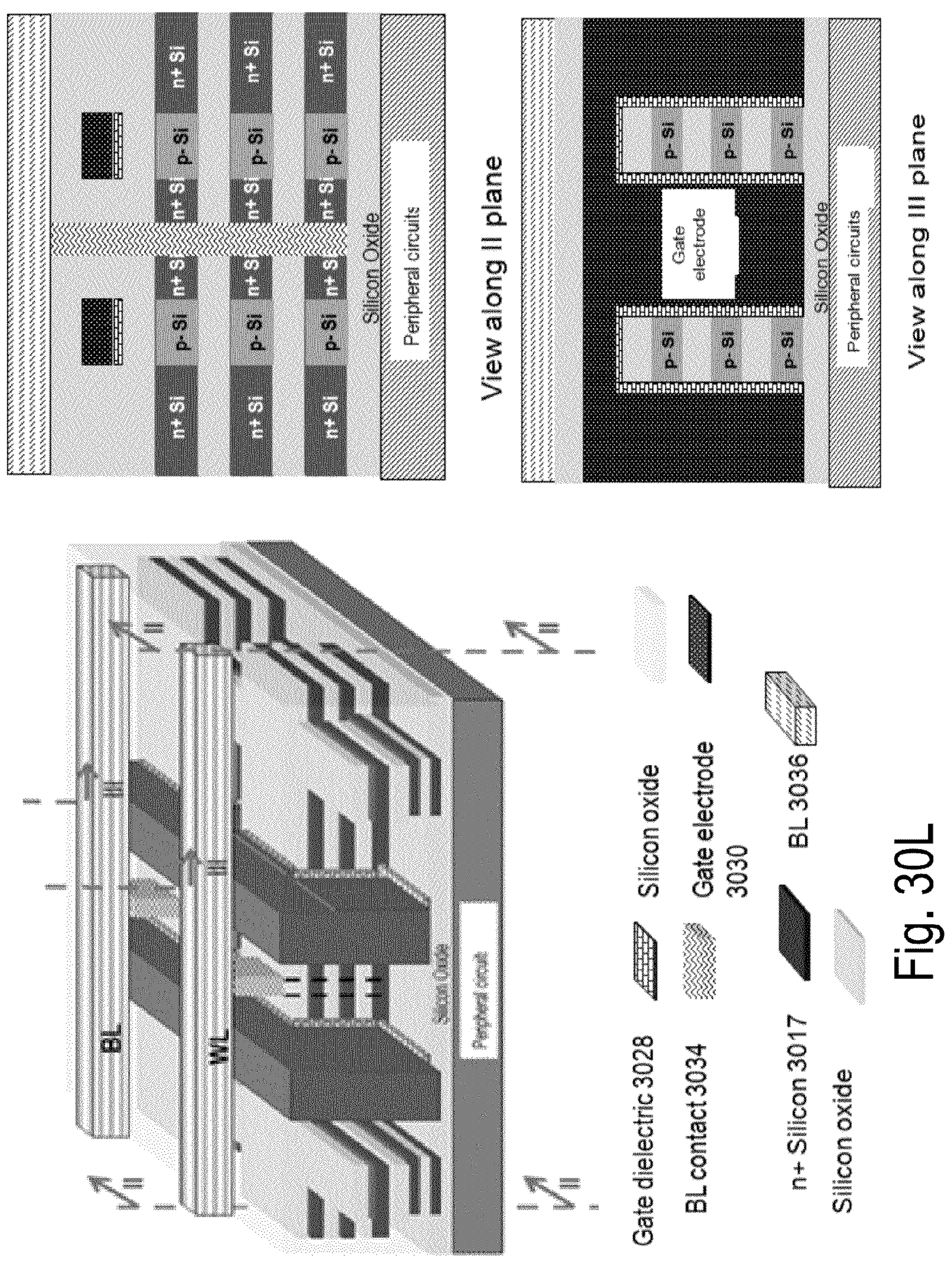

FIG. 30L shows cross-sectional views of the array for clarity. The double-gated transistors in FIG. 30 L can be utilized along with the floating body effect for storing information.

Figure 30M:
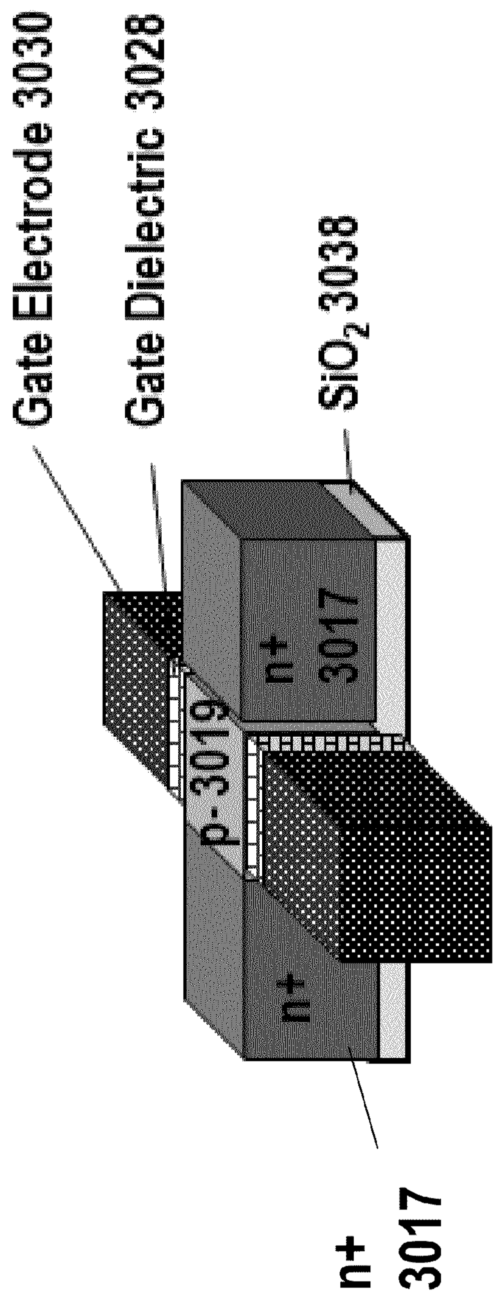

FIG. 30M shows a memory cell of the floating body RAM array with two gates on either side of the p− Si layer 3019.

A floating-body DRAM has thus been constructed, with (1) horizontally-oriented transistors—i.e., current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

FIG. 31A-K describe an alternative process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIG. 31A-K, and all other masks are shared between different layers. The process flow may include several steps in the following sequence.

Figure 31A:
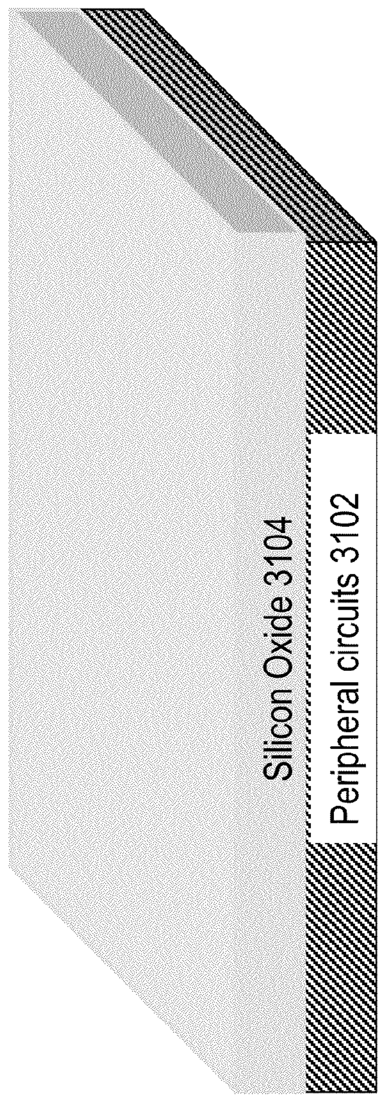
FIG. 31A-K show a zero-mask per layer 3D floating body DRAM.

Step (A): Peripheral circuits with tungsten wiring 3102 are first constructed and above this a layer of silicon dioxide 3104 is deposited. FIG. 31A shows a drawing illustration after Step (A).

Figure 31B:
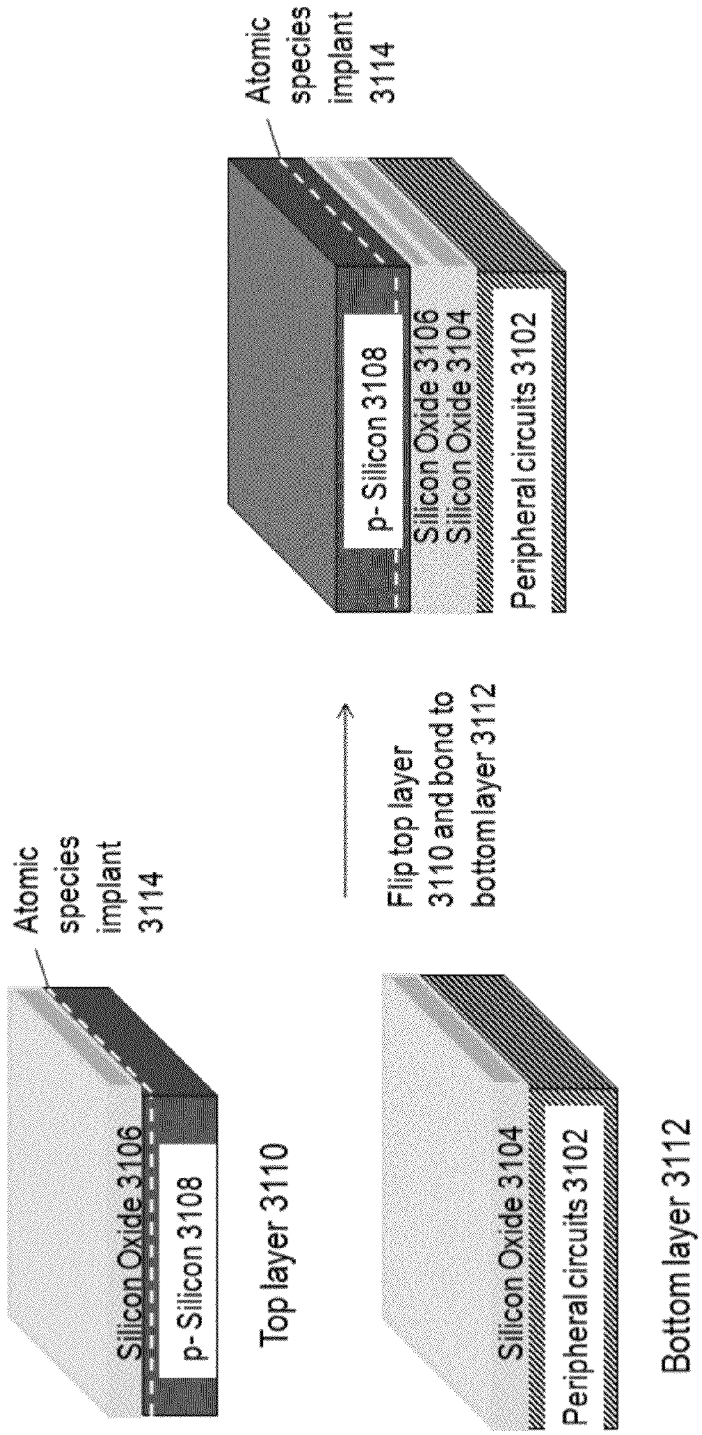

Step (B): FIG. 31B illustrates the structure after Step (B). A wafer of p− Silicon 3108 has an oxide layer 3106 grown or deposited above it. Following this, hydrogen is implanted into the p− Silicon wafer at a certain depth indicated by 3114. Alternatively, some other atomic species such as Helium could be (co-)implanted. This hydrogen implanted p− Silicon wafer 3108 forms the top layer 3110. The bottom layer 3112 may include the peripheral circuits 3102 with oxide layer 3104. The top layer 3110 is flipped and bonded to the bottom layer 3112 using oxide-to-oxide bonding.

Figure 31C:
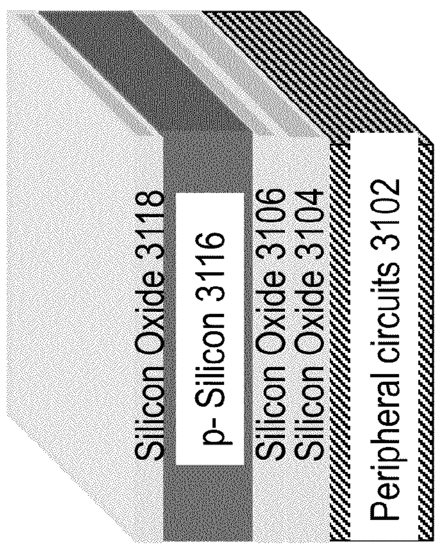

Step (C): FIG. 31C illustrates the structure after Step (C). The stack of top and bottom wafers after Step (B) is cleaved at the hydrogen plane 3014 using either a anneal or a sideways mechanical force or other means. A CMP process is then conducted. A layer of silicon oxide 3118 is then deposited atop the p− Silicon layer 3116. At the end of this step, a single-crystal p− Si layer 3116 exists atop the peripheral circuits, and this has been achieved using layer-transfer techniques.

Figure 31D:
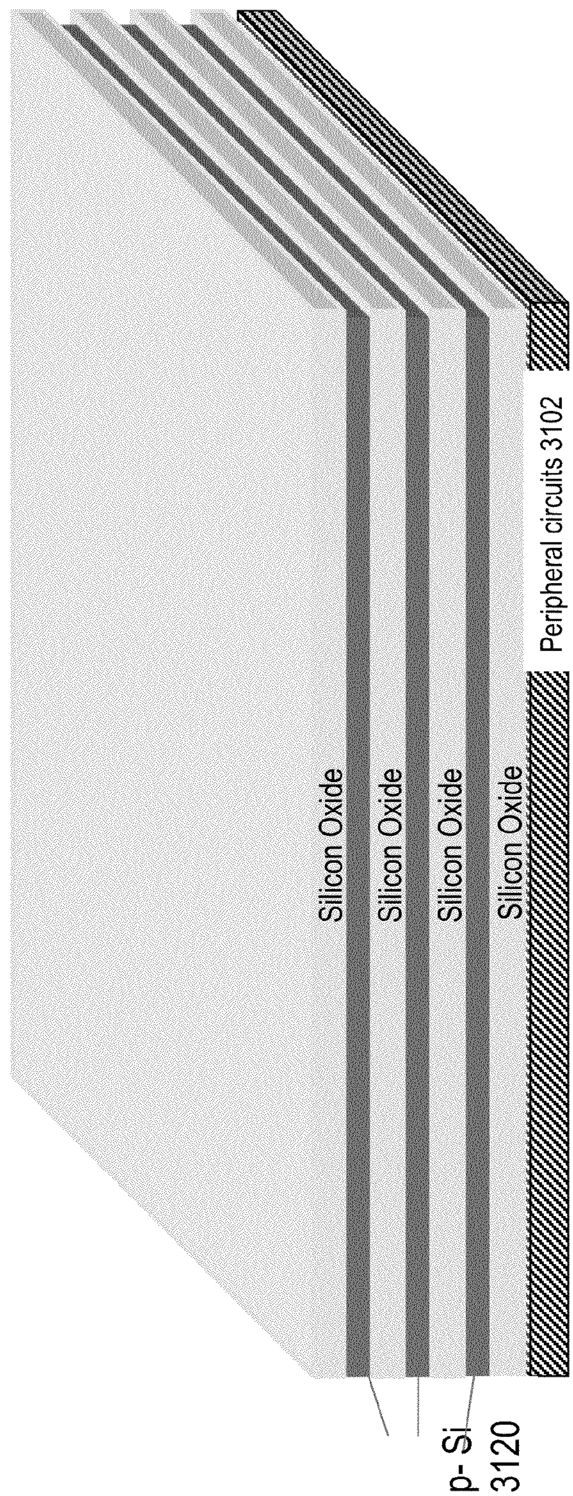

Step (D): FIG. 31D illustrates the structure after Step (D). Using methods similar to Step (B) and (C), multiple p− silicon layers 3120 are formed with silicon oxide layers in between.

Figure 31E:
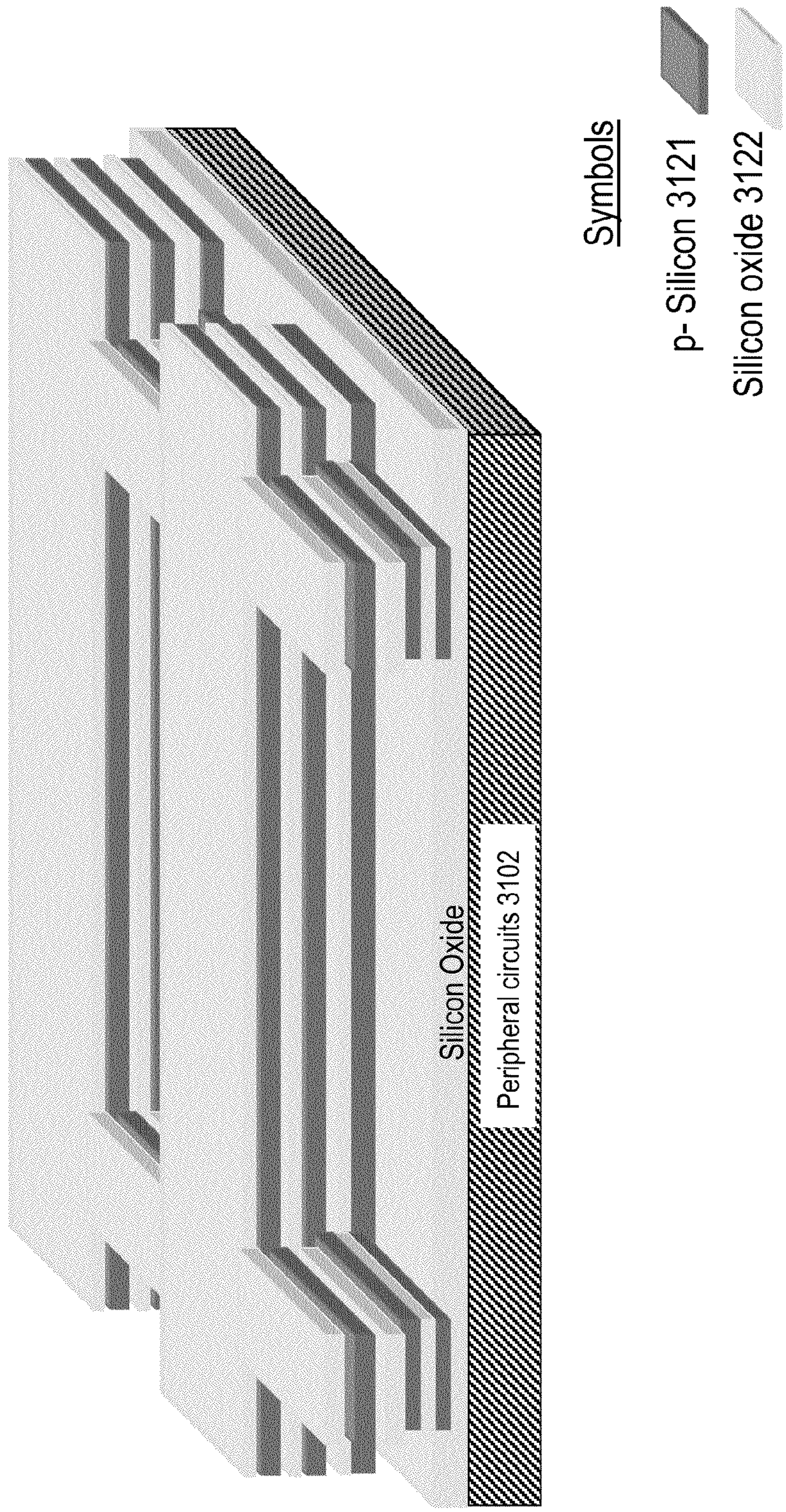

Step (E): FIG. 31E illustrates the structure after Step (E). Lithography and etch processes are then utilized to make a structure as shown in the figure.

Figure 31F:
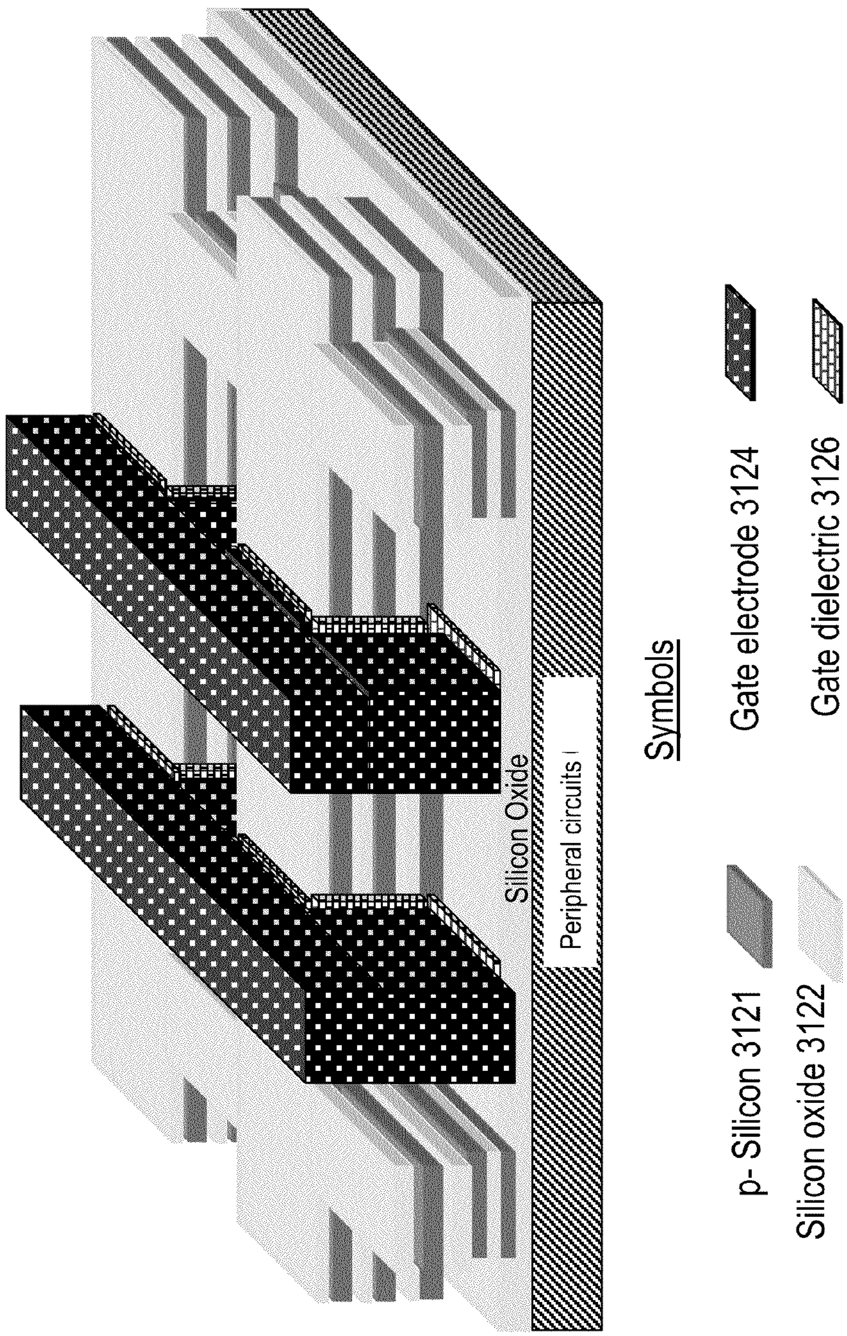

Step (F): FIG. 31F illustrates the structure after Step (F). Gate dielectric 3126 and gate electrode 3124 are then deposited following which a CMP is done to planarize the gate electrode 3124 regions. Lithography and etch are utilized to define gate regions.

Figure 31G:
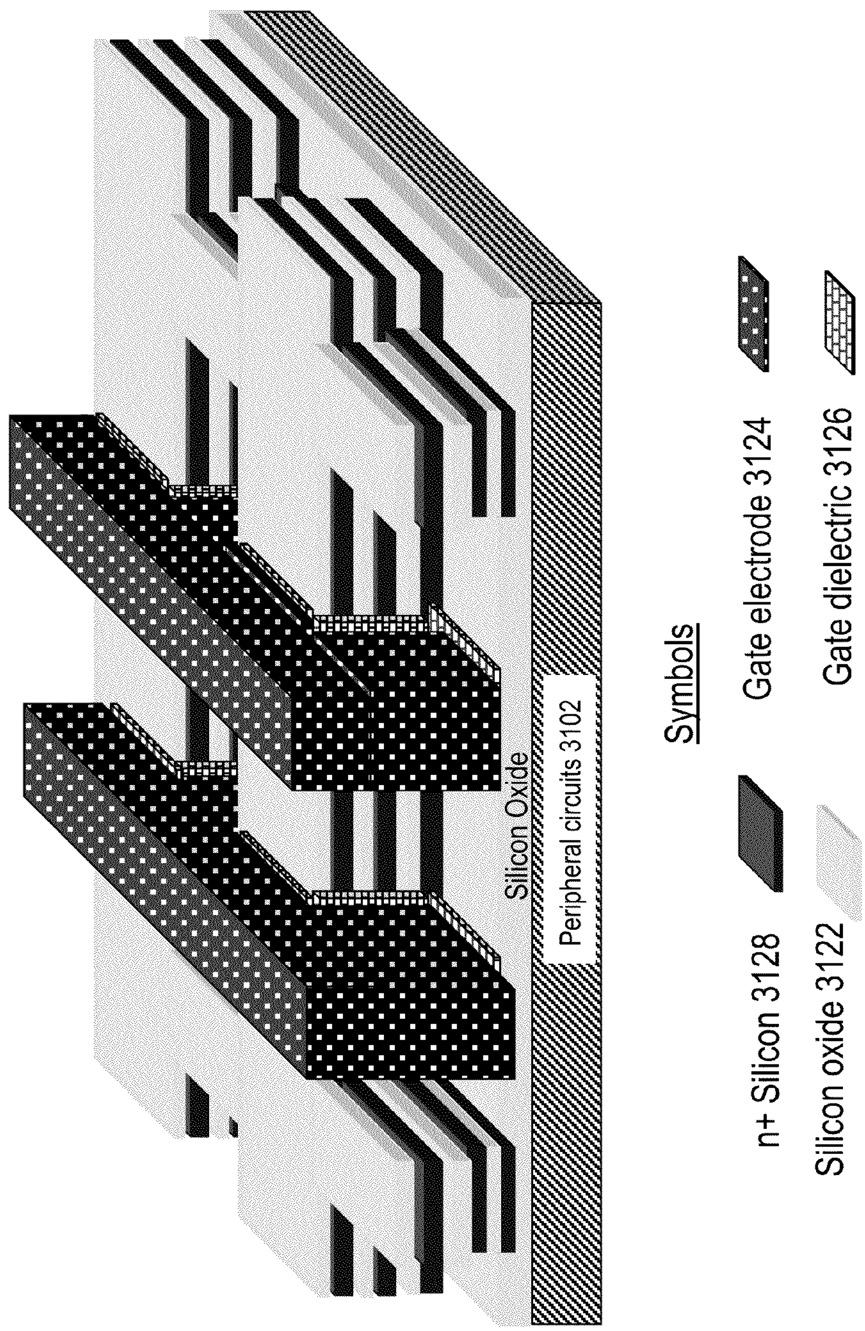

Step (G): FIG. 31G illustrates the structure after Step (G). Using the hard mask defined in Step (F), p− regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 31H:
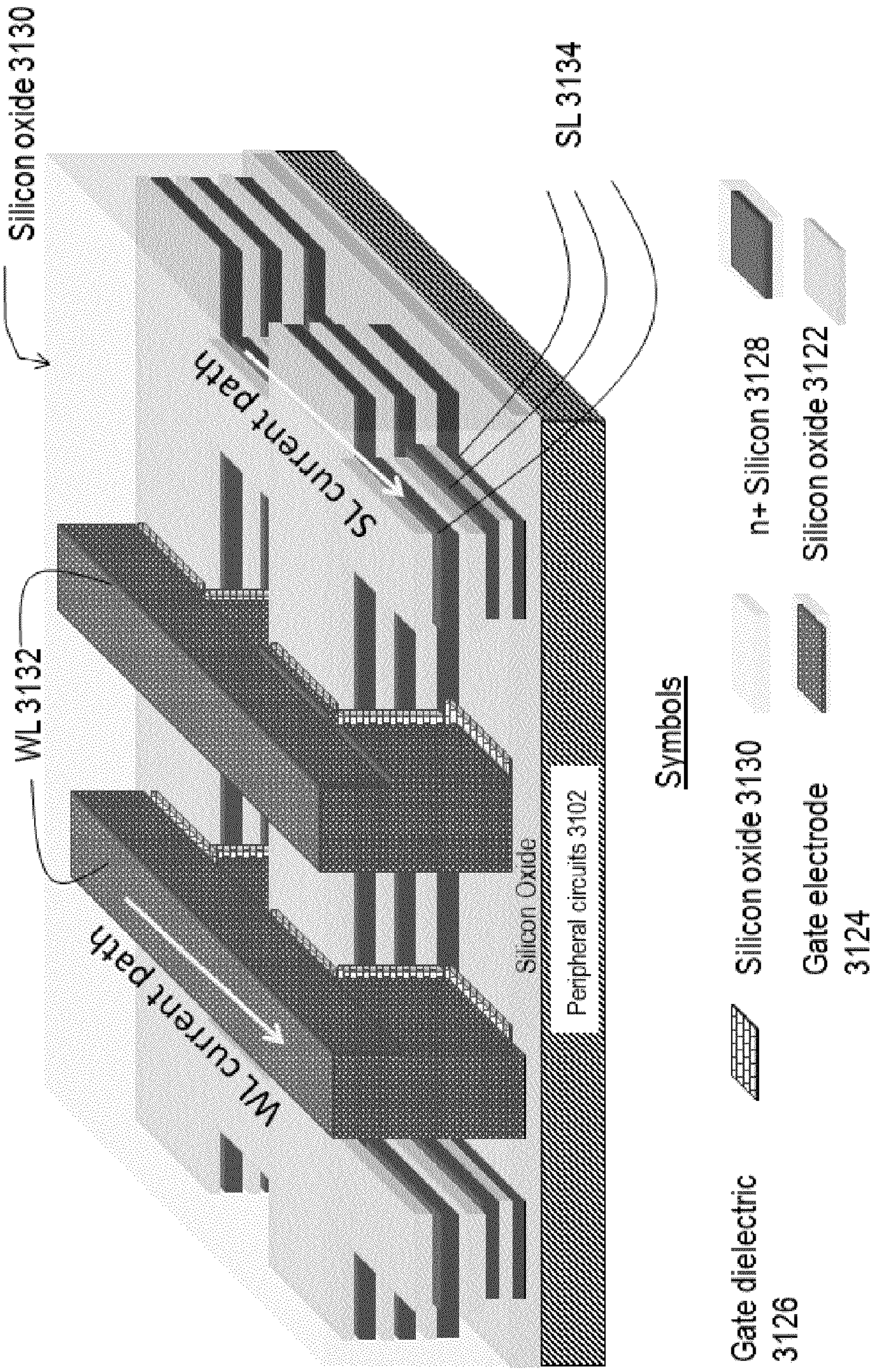

Step (H): FIG. 31H illustrates the structure after Step (H). A silicon oxide layer 3130 is then deposited and planarized. For clarity, the silicon oxide layer is shown transparent, along with word-line (WL) 3132 and source-line (SL) 3134 regions.

Figure 31I:
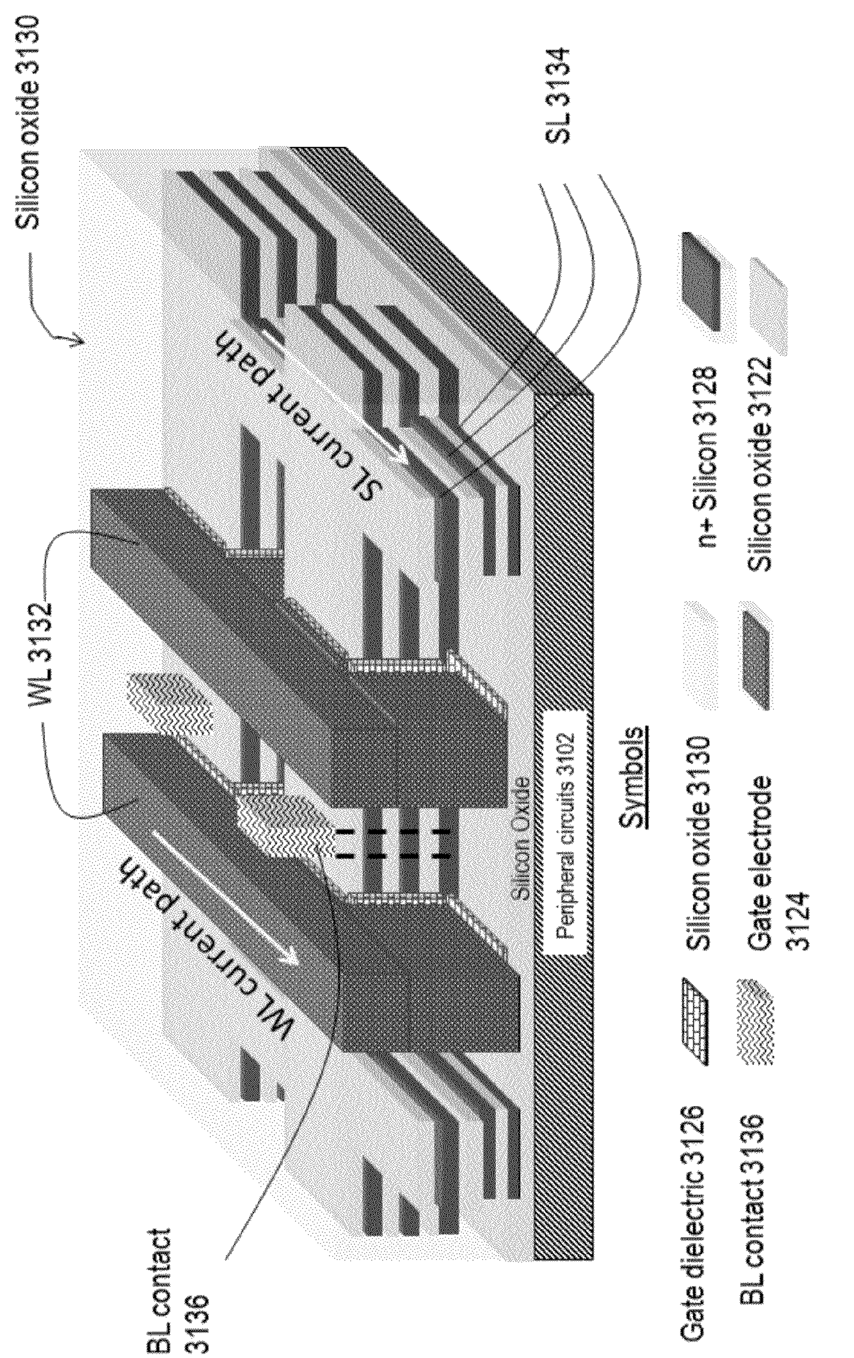

Step (I): FIG. 31I illustrates the structure after Step (I). Bit-line (BL) contacts 3136 are formed by etching and deposition. These BL contacts are shared among all layers of memory.

Figure 31J:
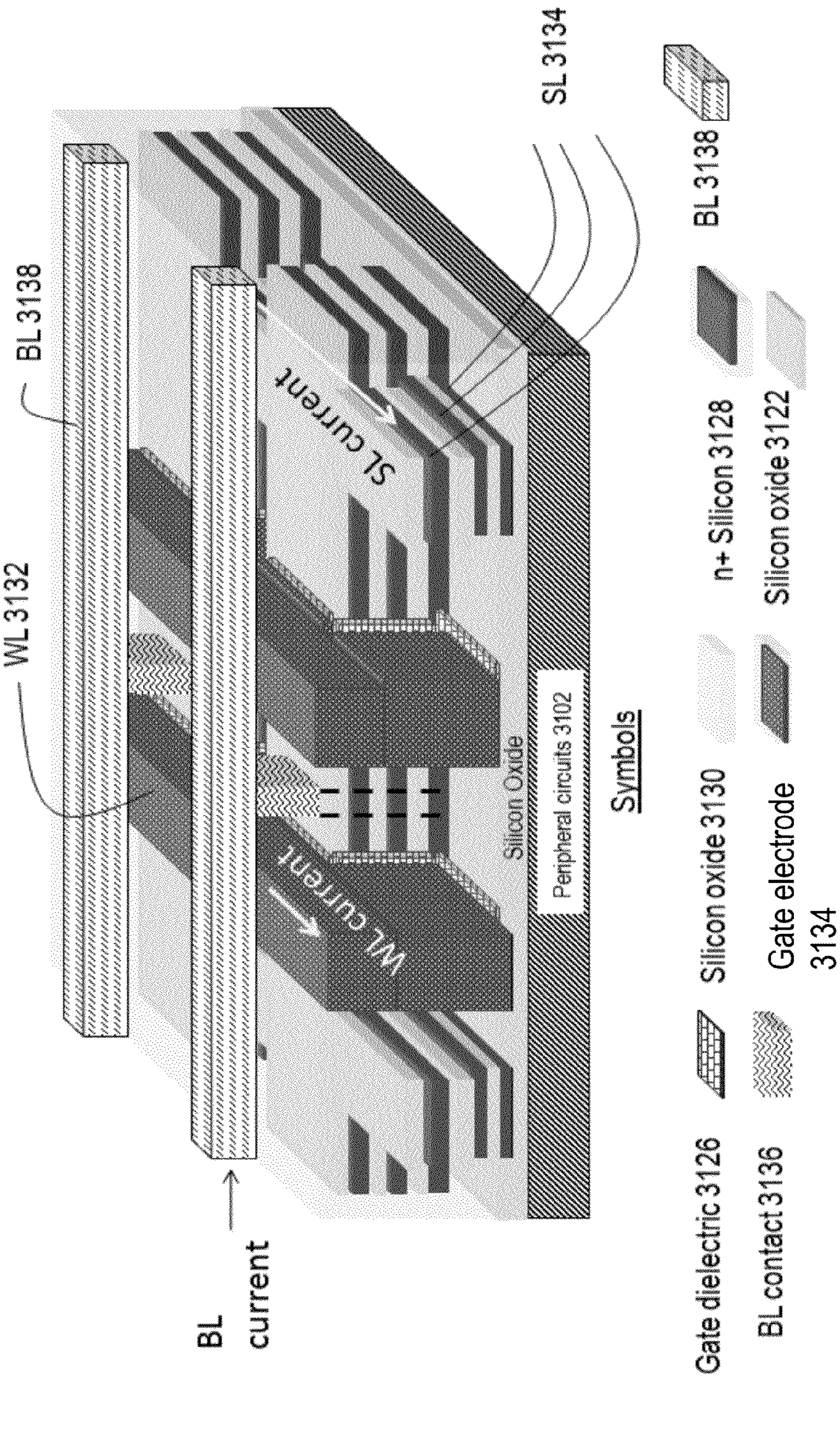

Step (J): FIG. 31J illustrates the structure after Step (J). BLs 3138 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

Figure 31K:
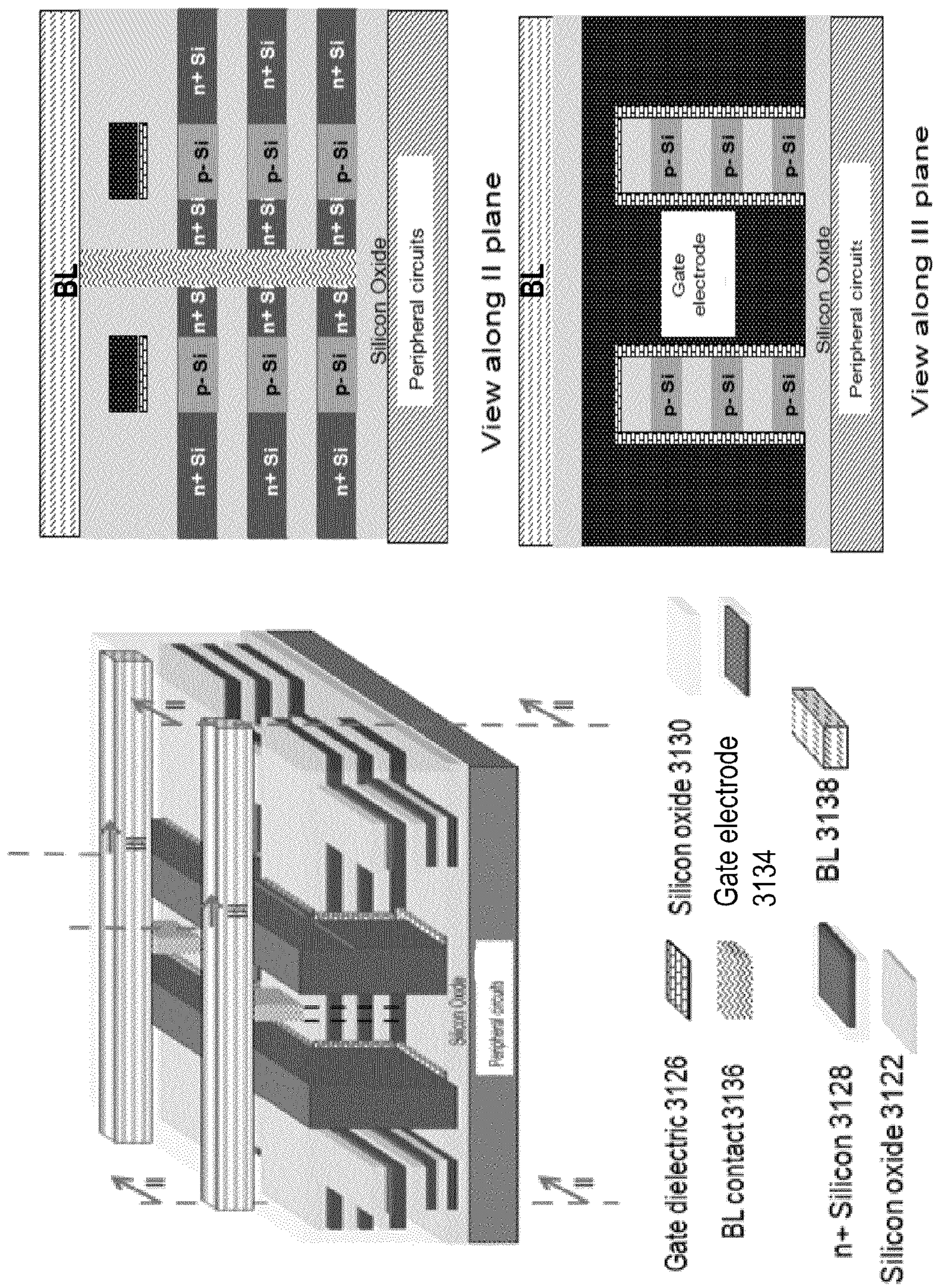

FIG. 31K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIG. 30A-M and 31 may be modified. Moreover, selective epi technology or laser recrystallization technology could be utilized for implementing structures shown in FIG. 30A-M and FIG. 31A-K. Various other types of layer transfer schemes that have been described in Section 1.3.4 can be utilized for construction of various 3D DRAM structures. Furthermore, buried wiring, i.e. where wiring for memory arrays is below the memory layers but above the periphery, may also be used. In addition, other variations of the monolithic 3D DRAM concepts are possible.

Section 4: Monolithic 3D Resistance-Based Memory

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIG. 32A-J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 32A-J, and all other masks are shared between different layers. The process flow may include several steps that occur in the following sequence.

Figure 32A:
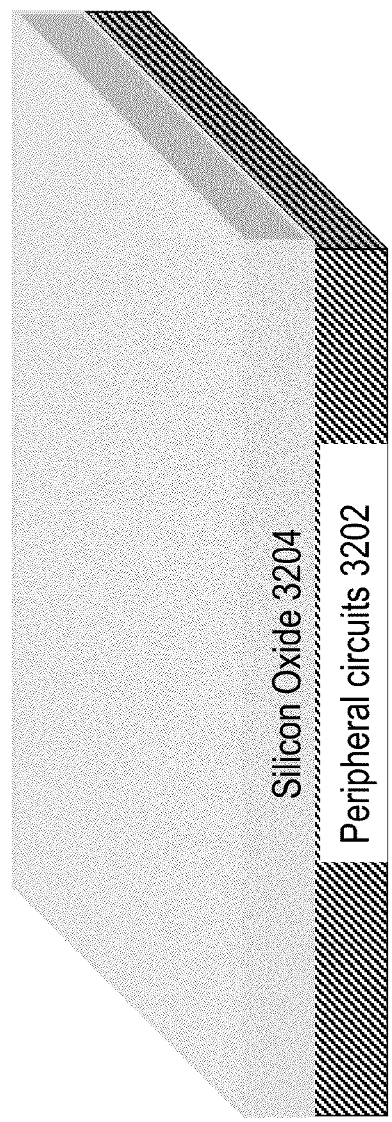
FIG. 32A-J show a zero-mask per layer 3D resistive memory with a junction-less transistor.

Step (A): Peripheral circuits 3202 are first constructed and above this a layer of silicon dioxide 3204 is deposited. FIG. 32A shows a drawing illustration after Step (A).

Figure 32B:
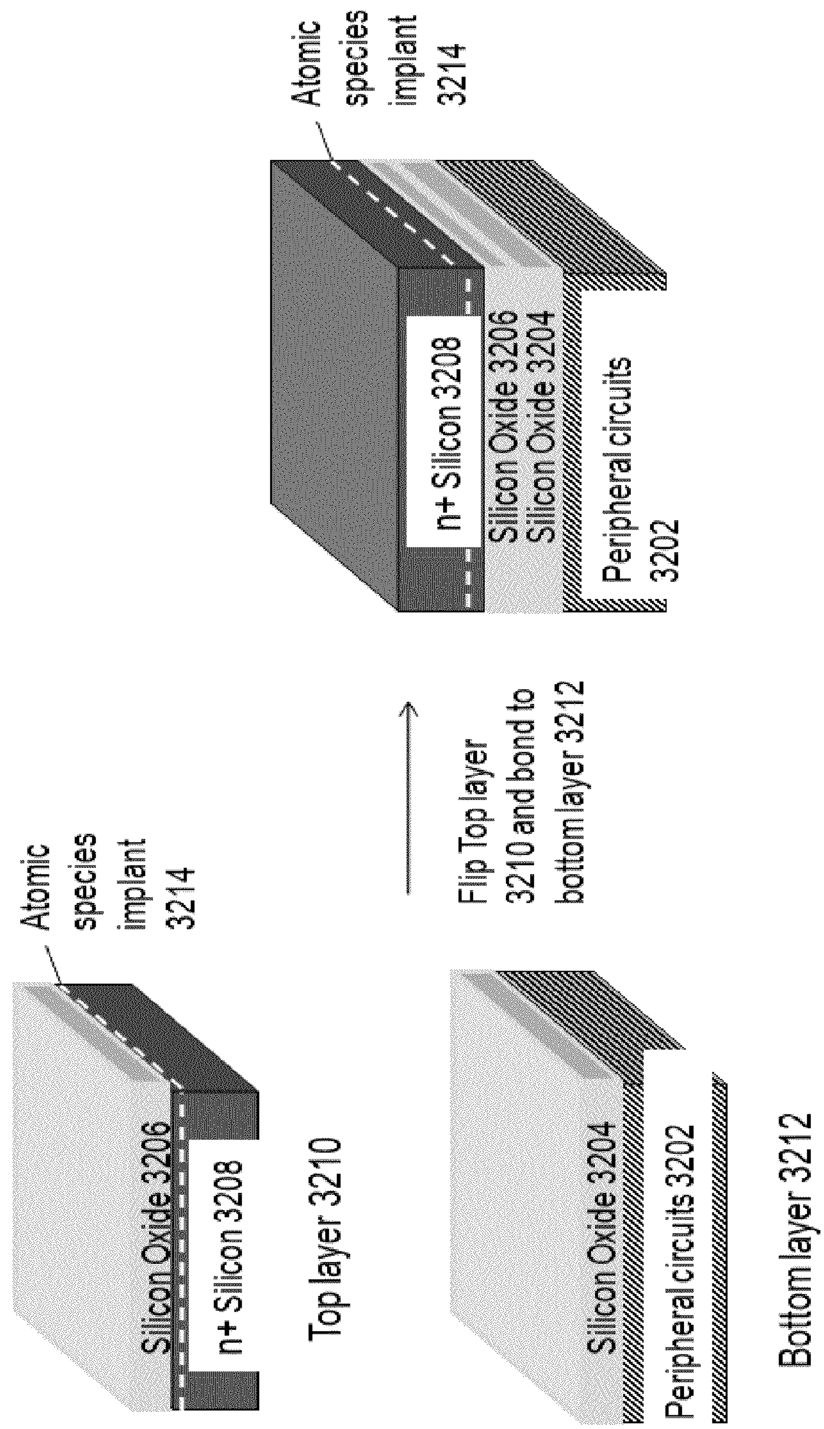

Step (B): FIG. 32B illustrates the structure after Step (B). A wafer of n+ Silicon 3208 has an oxide layer 3206 grown or deposited above it. Following this, hydrogen is implanted into the n+ Silicon wafer at a certain depth indicated by 3214. Alternatively, some other atomic species such as Helium could be (co-)implanted. This hydrogen implanted n+ Silicon wafer 3208 forms the top layer 3210. The bottom layer 3212 may include the peripheral circuits 3202 with oxide layer 3204. The top layer 3210 is flipped and bonded to the bottom layer 3212 using oxide-to-oxide bonding.

Figure 32C:
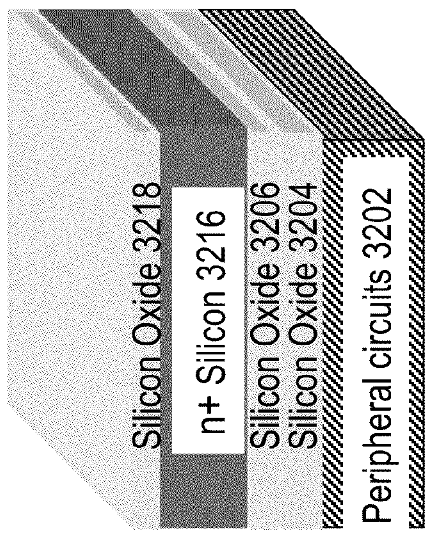

Step (C): FIG. 32C illustrates the structure after Step (C). The stack of top and bottom wafers after Step (B) is cleaved at the hydrogen plane 3214 using either a anneal or a sideways mechanical force or other means. A CMP process is then conducted. A layer of silicon oxide 3218 is then deposited atop the n+ Silicon layer 3216. At the end of this step, a single-crystal n+ Si layer 3216 exists atop the peripheral circuits, and this has been achieved using layer-transfer techniques.

Figure 32D:
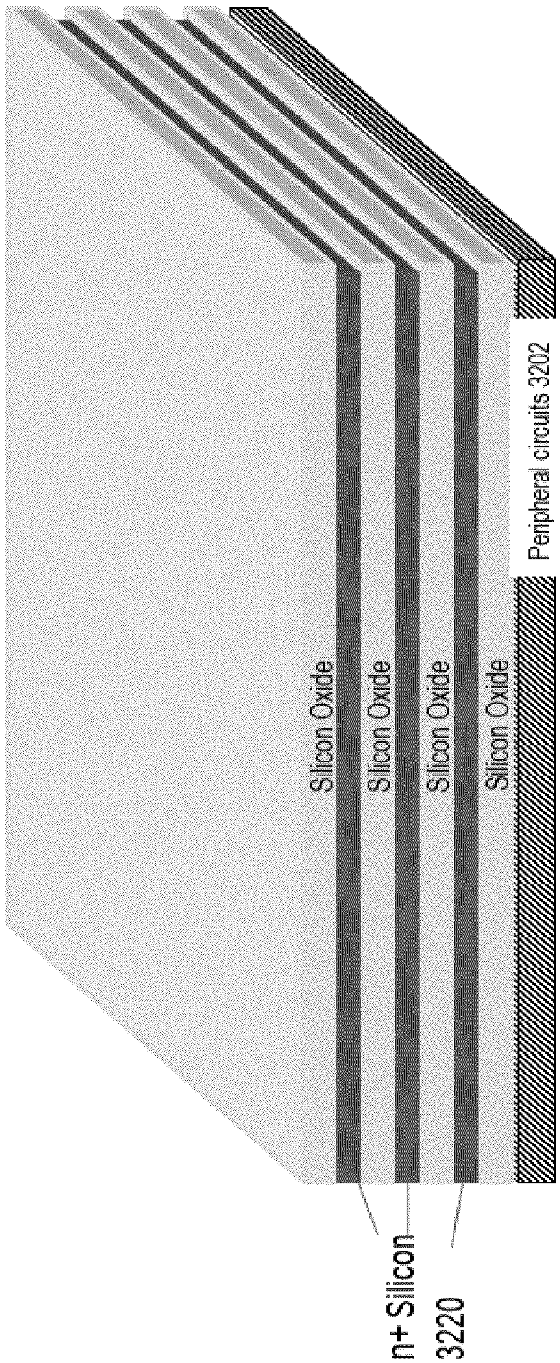

Step (D): FIG. 32D illustrates the structure after Step (D). Using methods similar to Step (B) and (C), multiple n+ silicon layers 3220 are formed with silicon oxide layers in between.

Figure 32E:
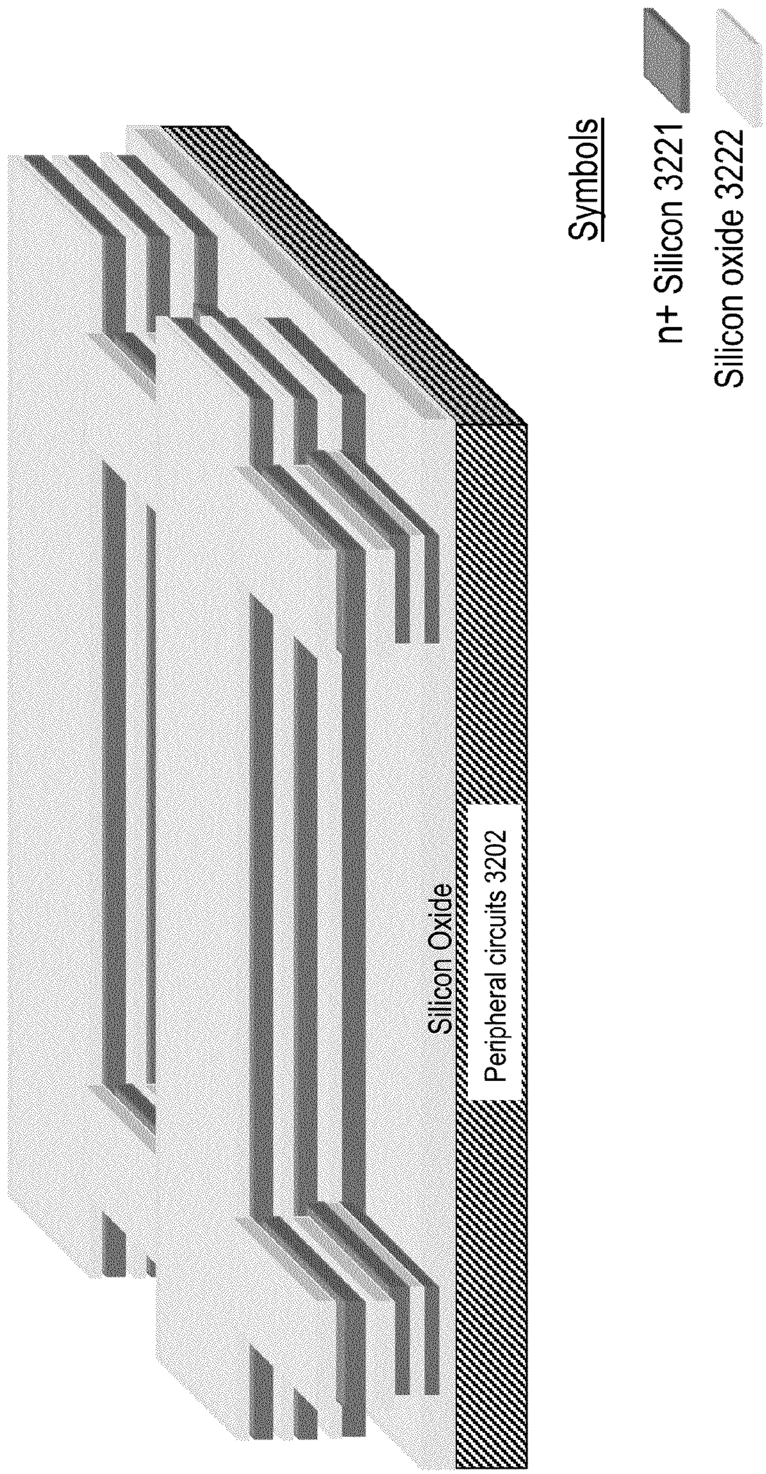

Step (E): FIG. 32E illustrates the structure after Step (E). Lithography and etch processes are then utilized to make a structure as shown in the figure.

Figure 32F:
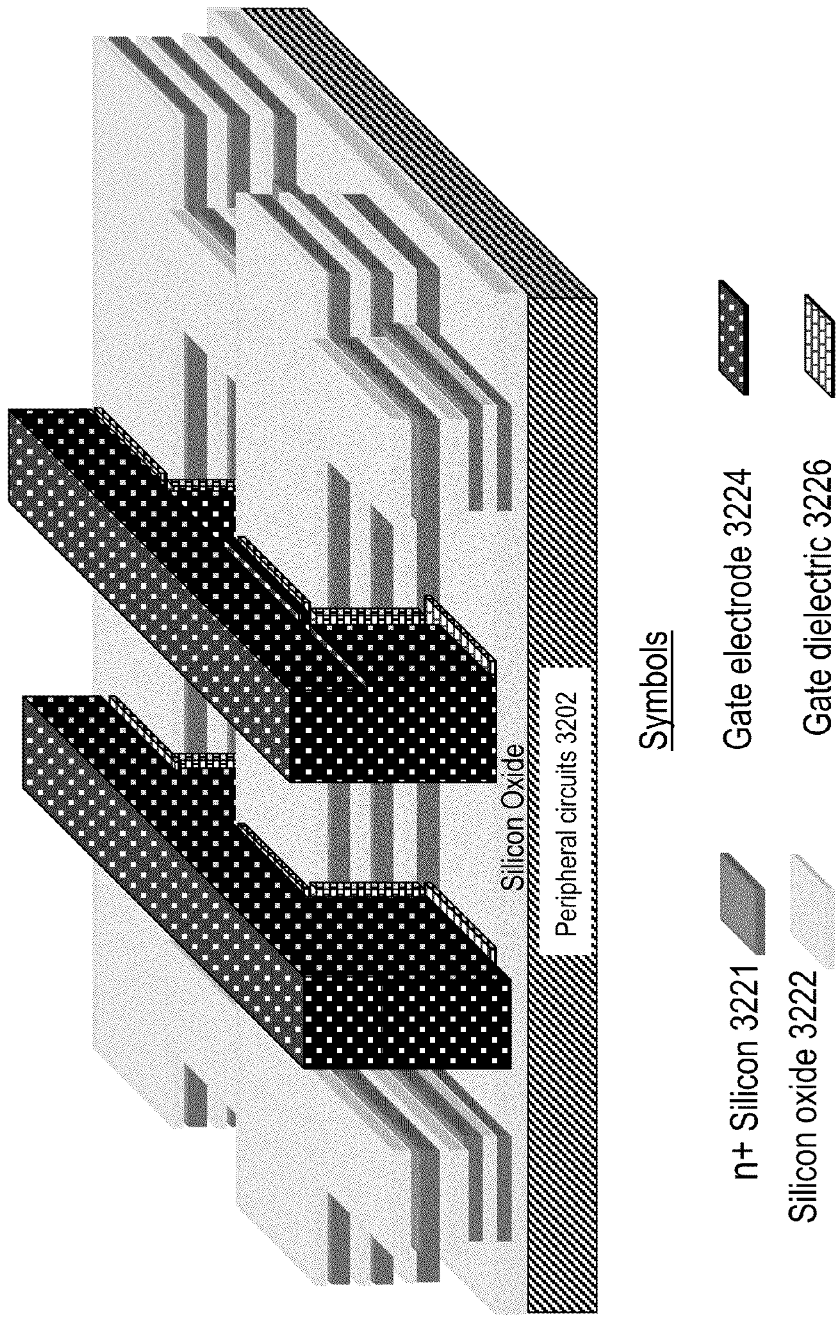

Step (F): FIG. 32F illustrates the structure after Step (F). Gate dielectric 3226 and gate electrode 3224 are then deposited following which a CMP is performed to planarize the gate electrode 3224 regions. Lithography and etch are utilized to define gate regions.

Figure 32G:
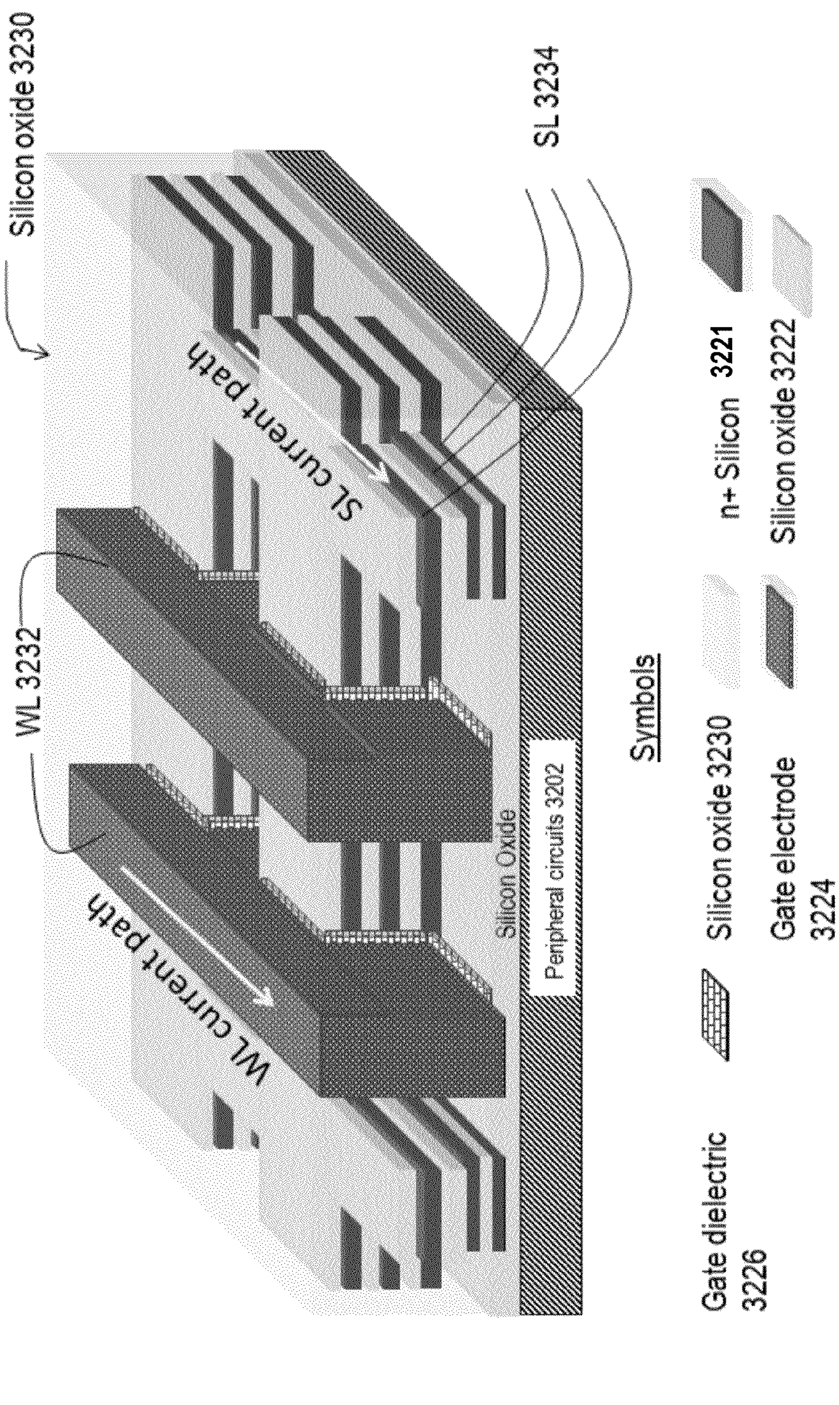

Step (G): FIG. 32G illustrates the structure after Step (G). A silicon oxide layer 3230 is then deposited and planarized. The silicon oxide layer is shown transparent in the figure for clarity, along with word-line (WL) 3232 and source-line (SL) 3234 regions.

Figure 32H:
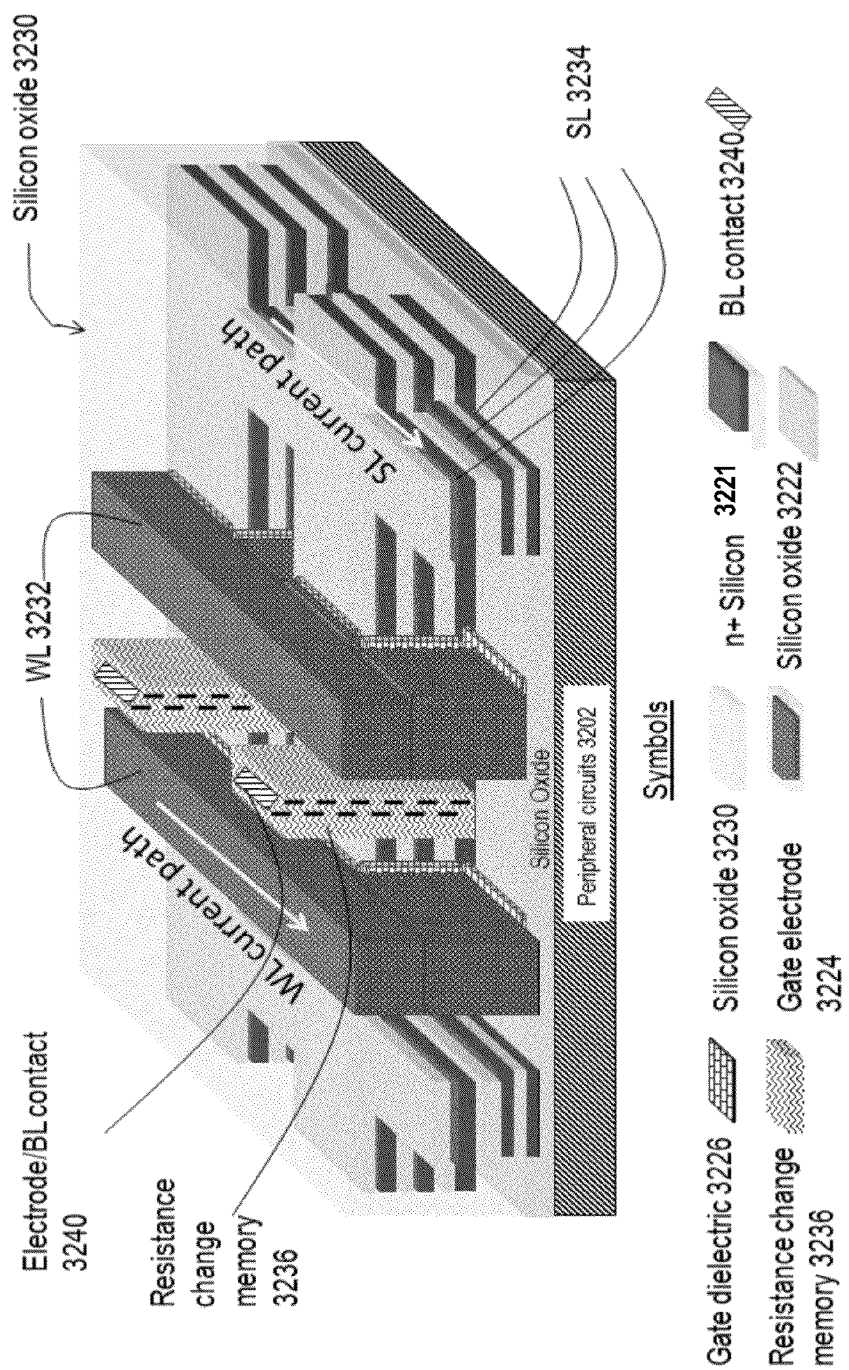

Step (H): FIG. 32H illustrates the structure after Step (H). Vias are etched through multiple layers of silicon and silicon dioxide as shown in the figure. A resistance change memory material 3236 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 3240. A CMP process is then conducted to planarize the surface. It can be observed that multiple resistance change memory elements in series with junctionless transistors are created after this step.

Figure 32I:
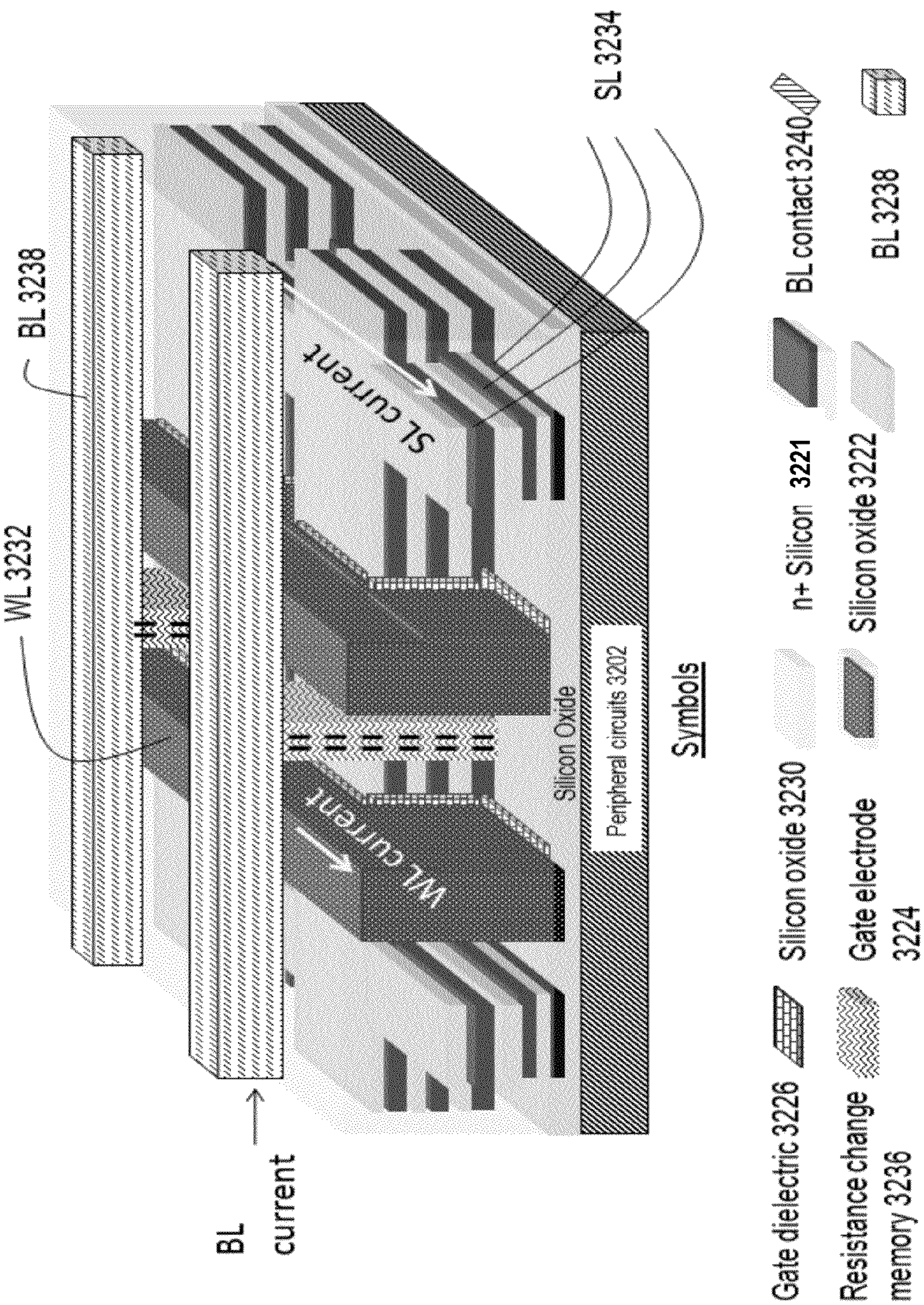

Step (I): FIG. 32I illustrates the structure after Step (I). BLs 3238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

Figure 32J:
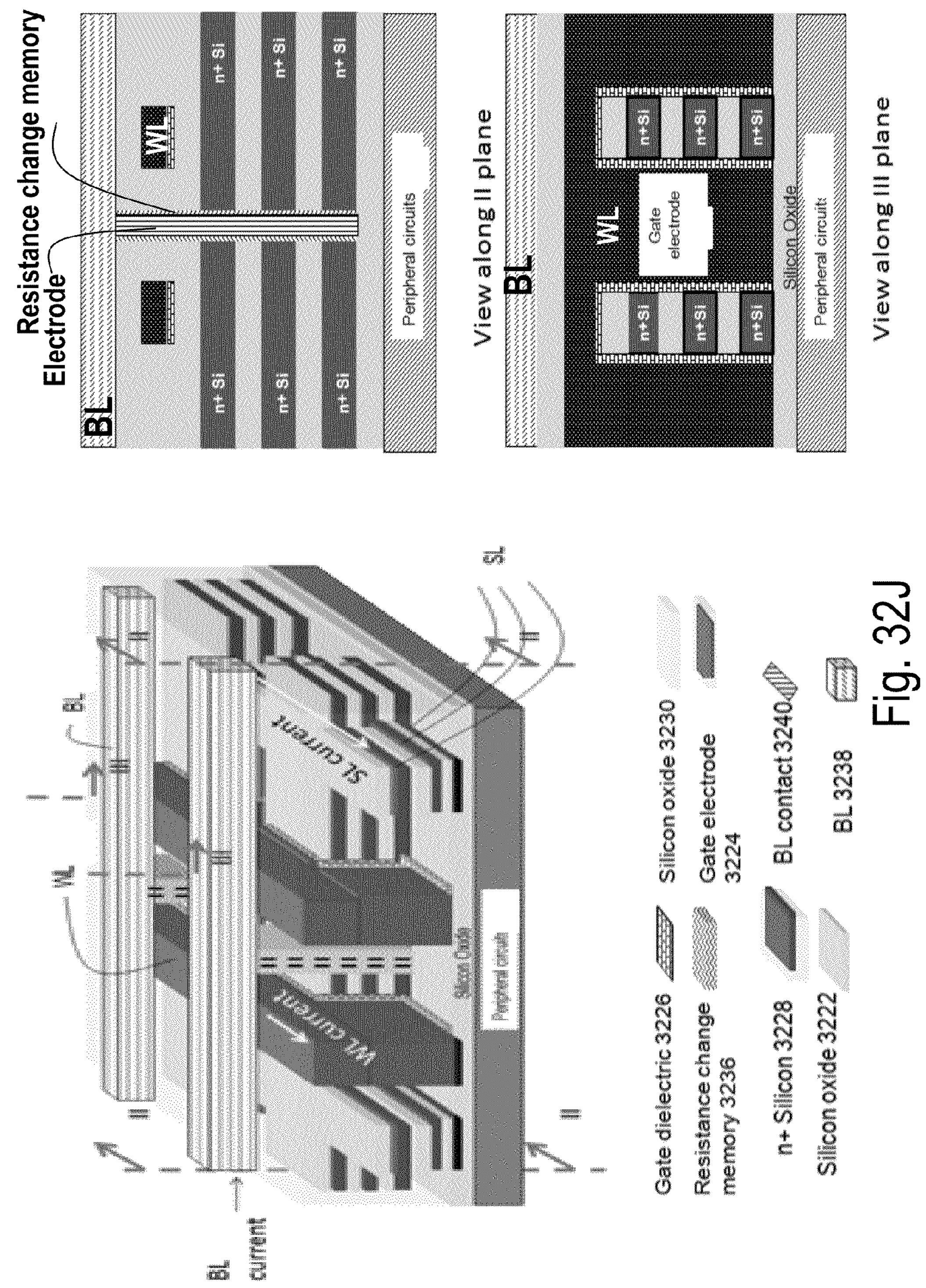

FIG. 32J shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIG. 33A-K describe an alternative process flow to construct a horizontally-oriented monolithic 3D resistive memory array. This embodiment has a resistance-based memory element in series with a transistor selector. No mask is utilized on a "per-memory-layer" basis for the monolithic 3D resistance change memory (or resistive memory) concept shown in FIG. 33A-K, and all other masks are shared between different layers. The process flow may include several steps as described in the following sequence.

Figure 33A:
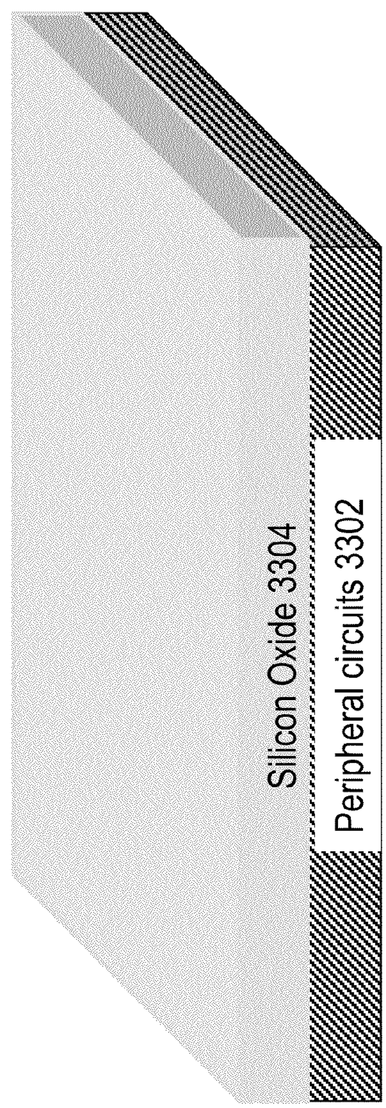
FIG. 33A-K show an alternative zero-mask per layer 3D resistive memory.

Step (A): Peripheral circuits with tungsten wiring 3302 are first constructed and above this a layer of silicon dioxide 3304 is deposited. FIG. 33A shows a drawing illustration after Step (A).

Figure 33B:
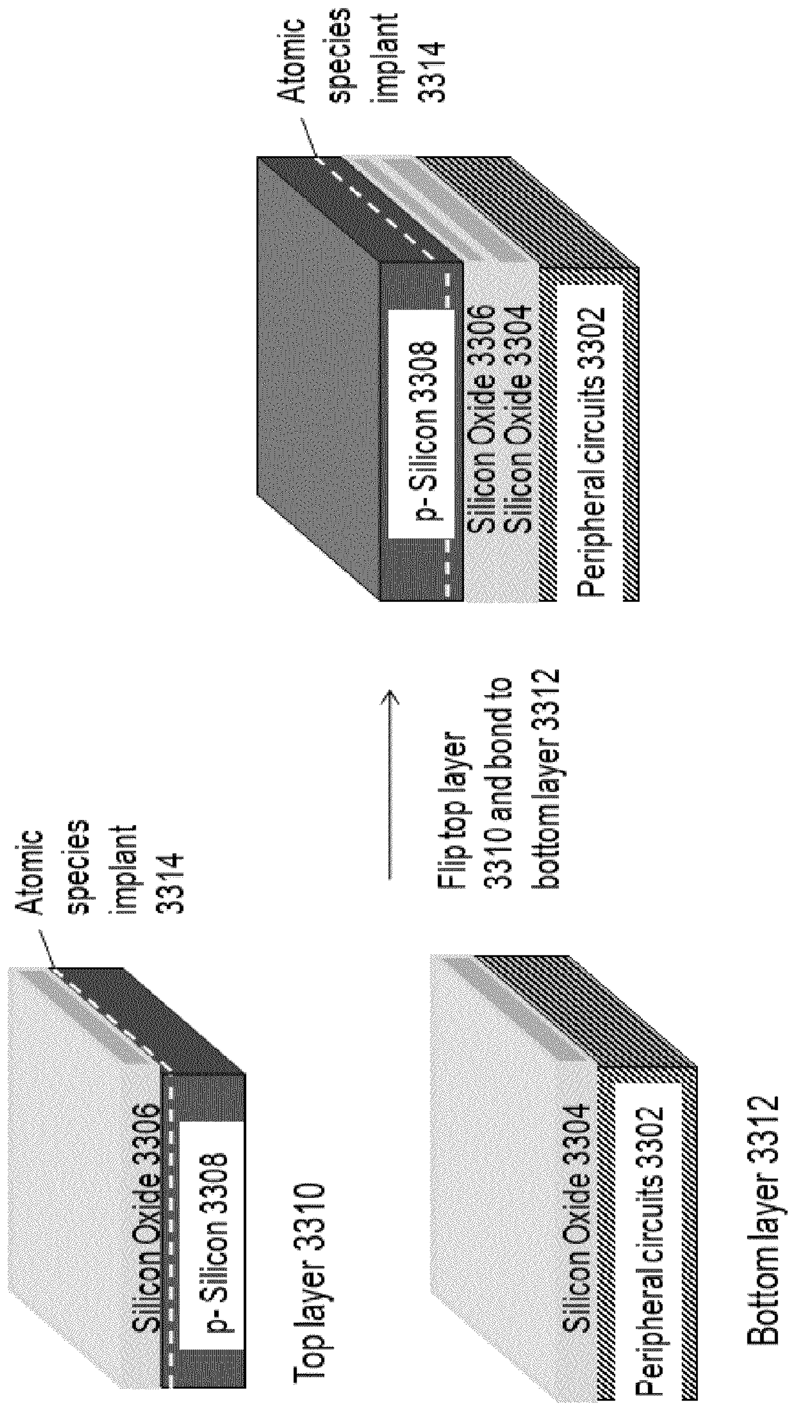

Step (B): FIG. 33B illustrates the structure after Step (B). A wafer of p− Silicon 3308 has an oxide layer 3306 grown or deposited above it. Following this, hydrogen is implanted into the p− Silicon wafer at a certain depth indicated by 3314. Alternatively, some other atomic species such as Helium could be (co-)implanted. This hydrogen implanted p− Silicon wafer 3308 forms the top layer 3310. The bottom layer 3312 may include the peripheral circuits 3302 with oxide layer 3304. The top layer 3310 is flipped and bonded to the bottom layer 3312 using oxide-to-oxide bonding.

Figure 33C:
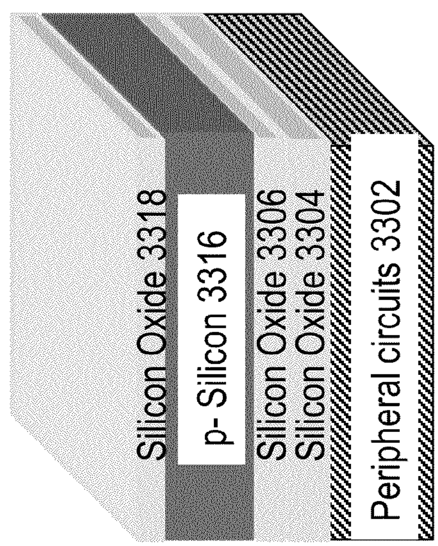

Step (C): FIG. 33C illustrates the structure after Step (C). The stack of top and bottom wafers after Step (B) is cleaved at the hydrogen plane 3314 using either a anneal or a sideways mechanical force or other means. A CMP process is then conducted. A layer of silicon oxide 3318 is then deposited atop the p− Silicon layer 3316. At the end of this step, a single-crystal p− Si layer 3316 exists atop the peripheral circuits, and this has been achieved using layer-transfer techniques.

Figure 33D:
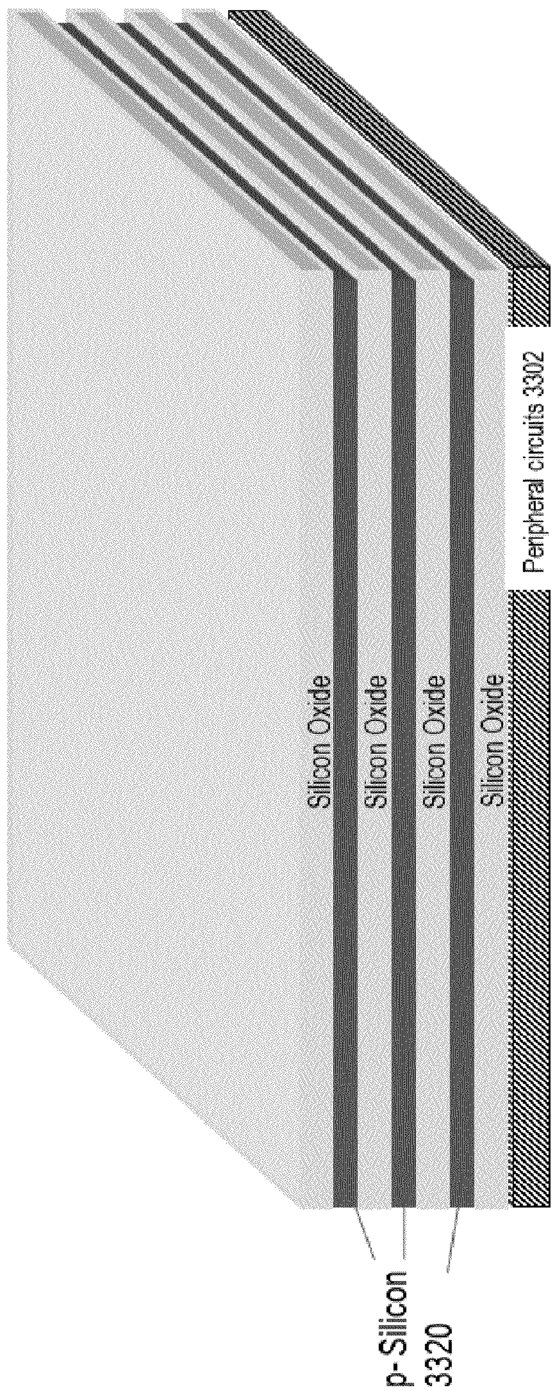

Step (D): FIG. 33D illustrates the structure after Step (D). Using methods similar to Step (B) and (C), multiple p− silicon layers 3320 are formed with silicon oxide layers in between.

Figure 33E:
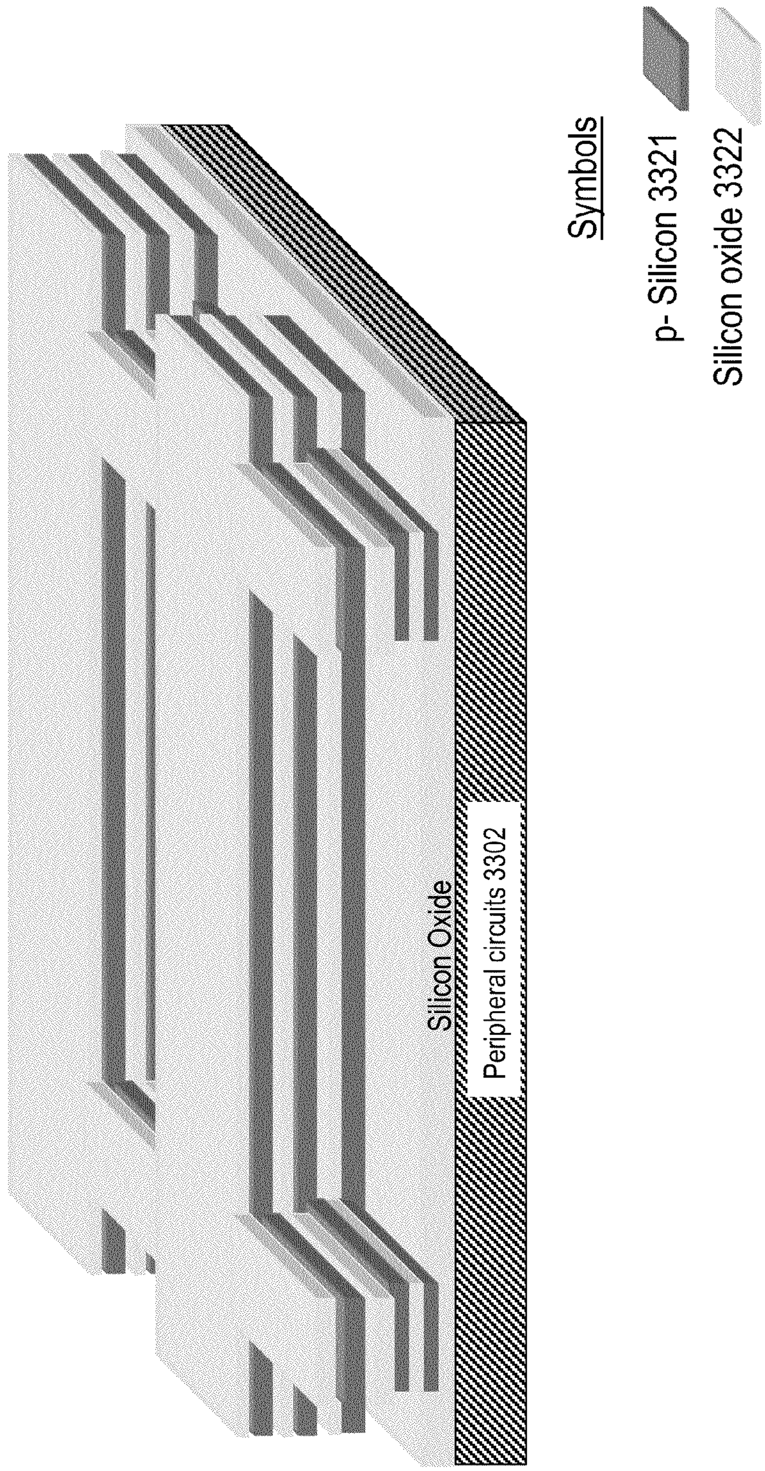

Step (E): FIG. 33E illustrates the structure after Step (E). Lithography and etch processes are then utilized to make a structure as shown in the figure.

Figure 33F:
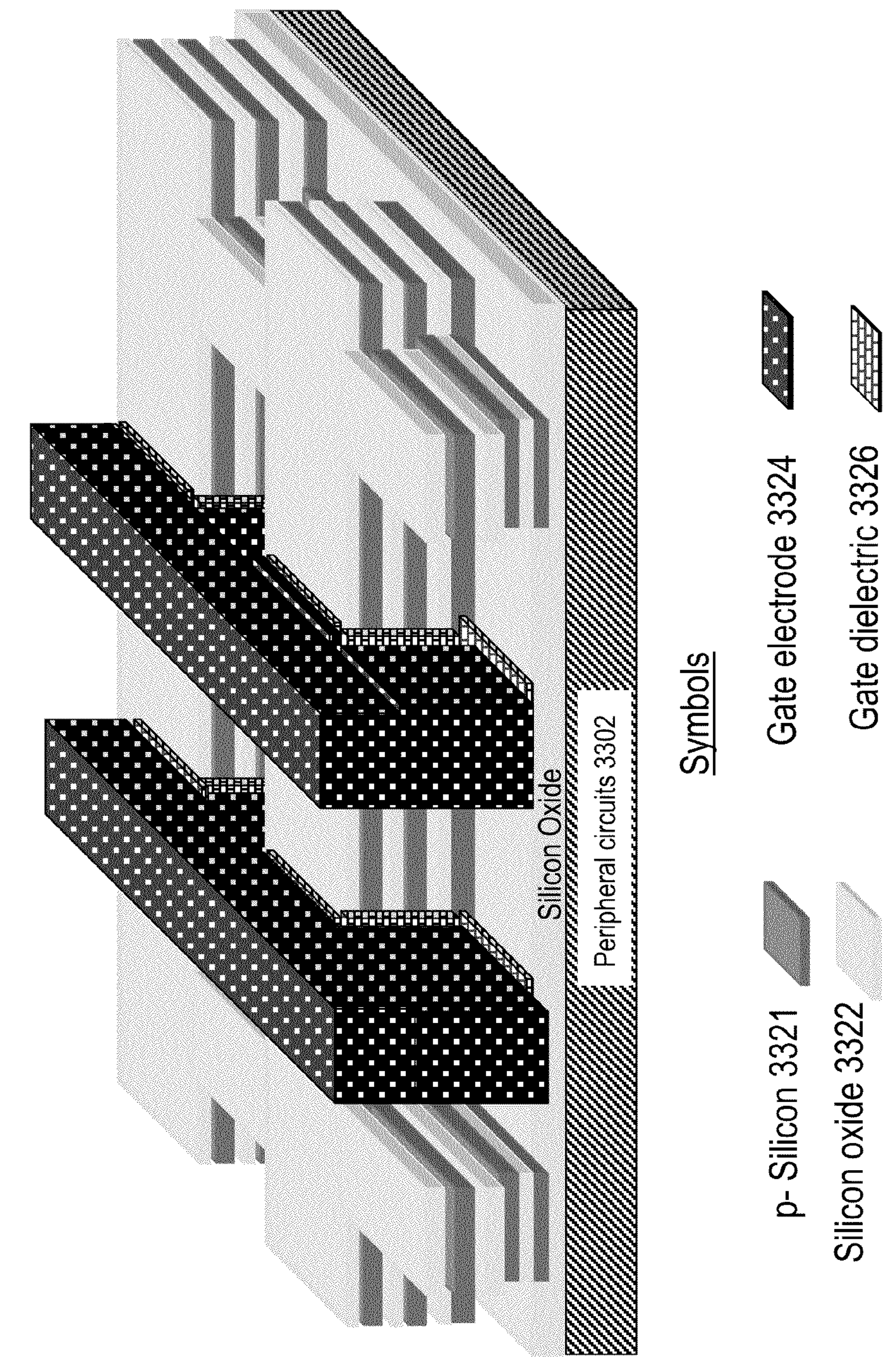

Step (F): FIG. 33F illustrates the structure on after Step (F). Gate dielectric 3326 and gate electrode 3324 are then deposited following which a CMP is done to planarize the gate electrode 3324 regions. Lithography and etch are utilized to define gate regions.

Figure 33G:
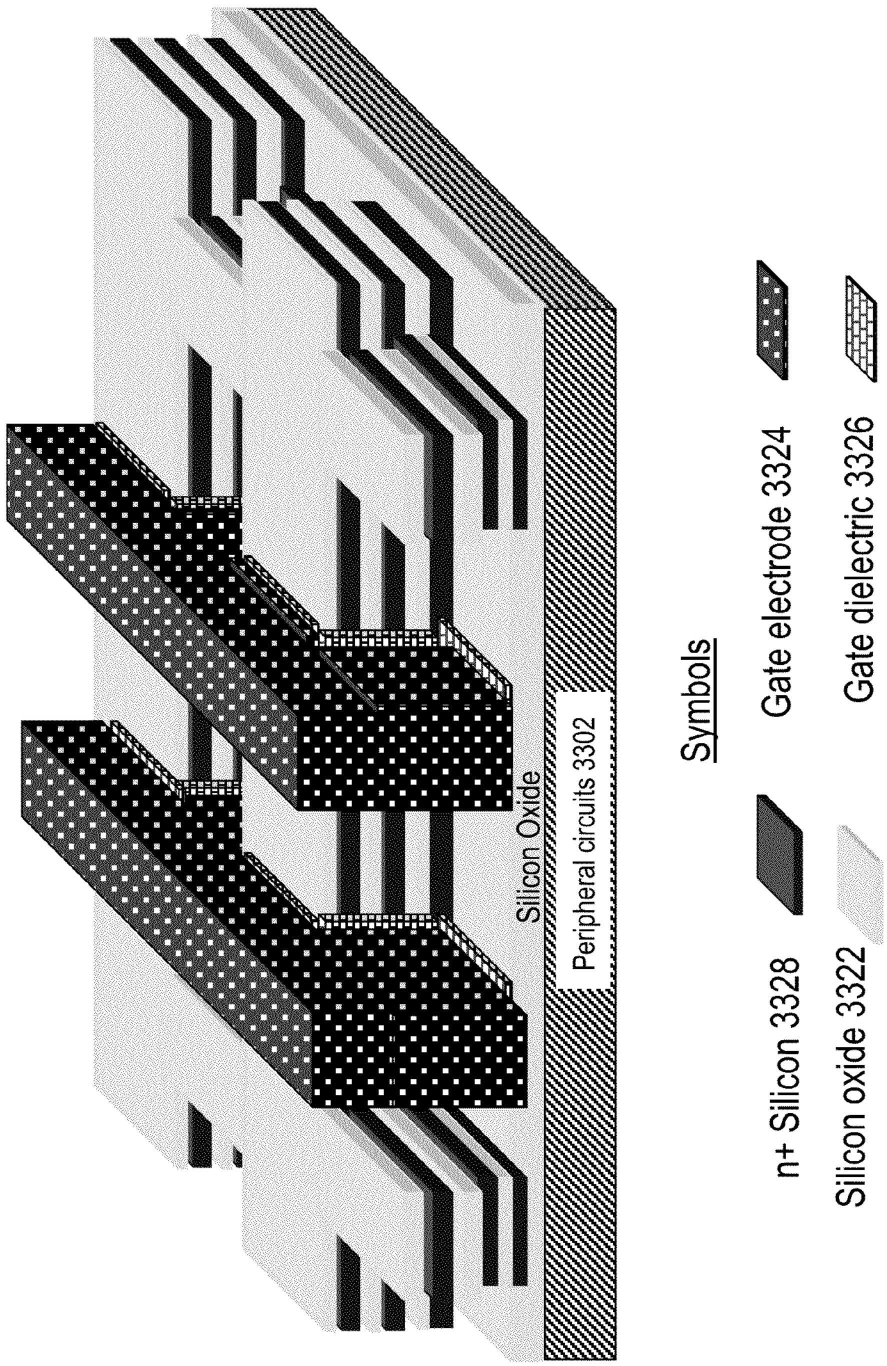

Step (G): FIG. 33G illustrates the structure after Step (G). Using the hard mask defined in Step (F), p− regions not covered by the gate are implanted to form n+ regions. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 33H:
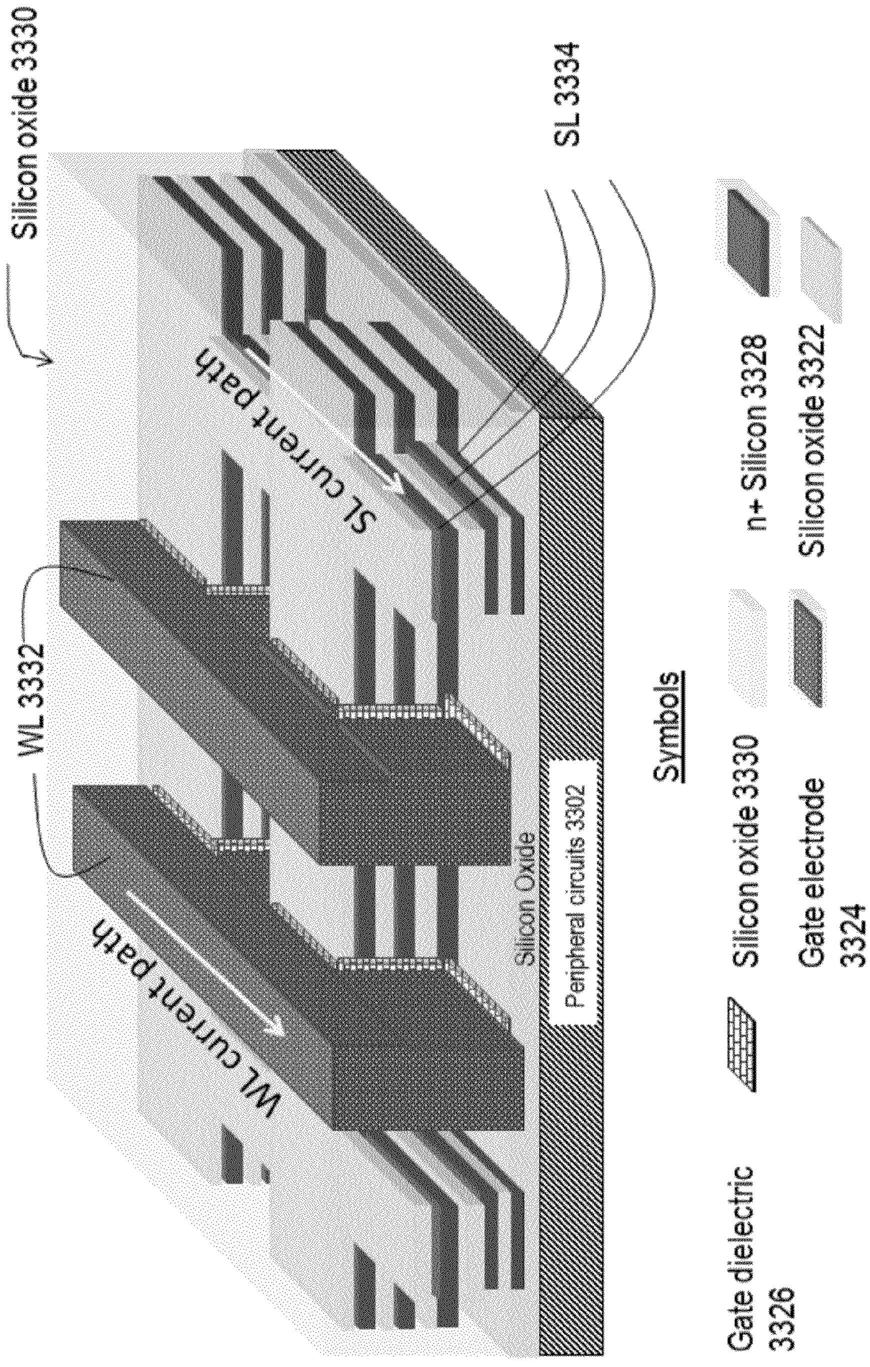

Step (H): FIG. 33H illustrates the structure after Step (H). A silicon oxide layer 3330 is then deposited and planarized. The silicon oxide layer is shown transparent in the figure for clarity, along with word-line (WL) 3332 and source-line (SL) 3334 regions.

Figure 33I:
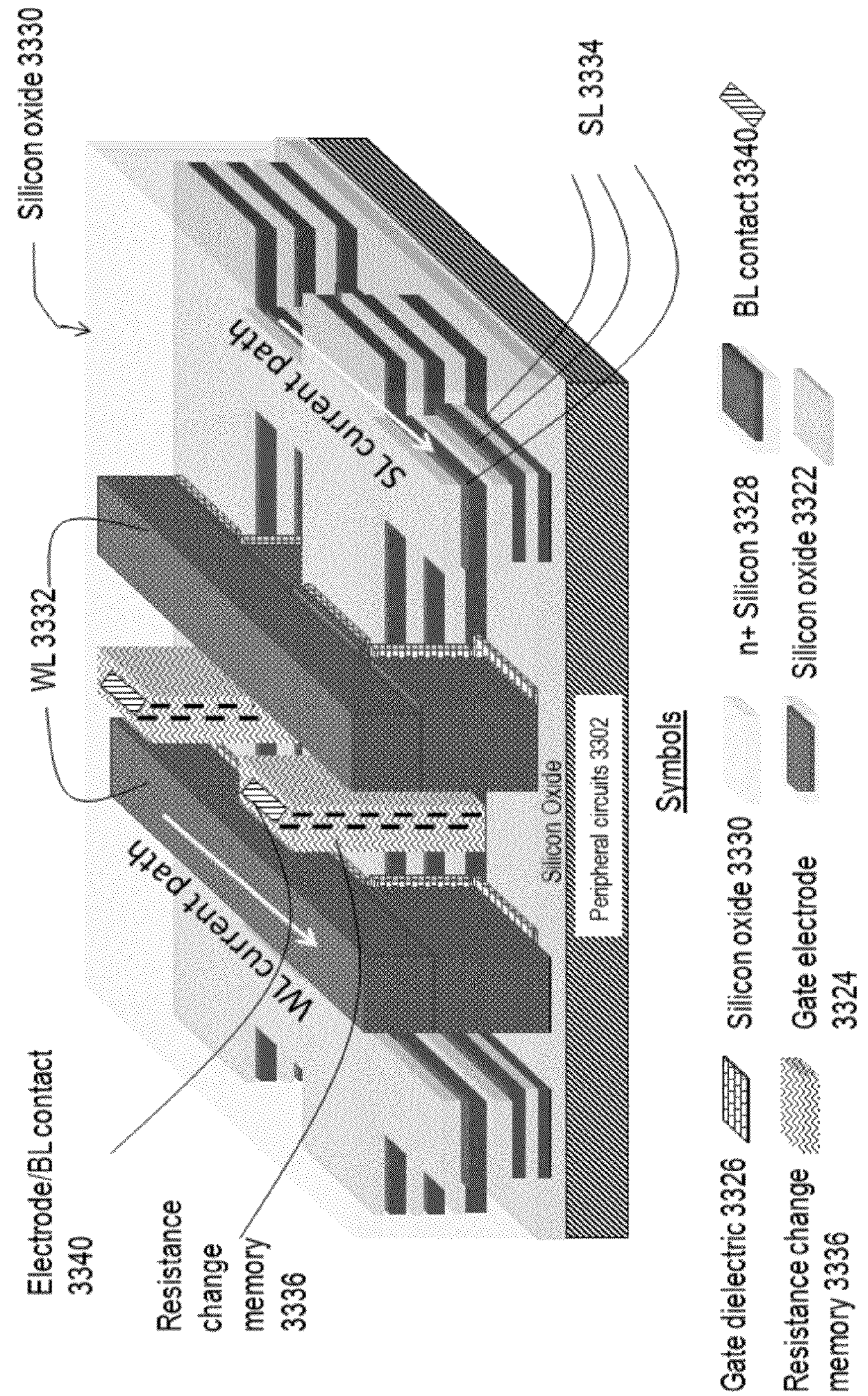

Step (I): FIG. 33I illustrates the structure after Step (I). Vias are etched through multiple layers of silicon and silicon dioxide as shown in the figure. A resistance change memory material 3336 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 3340. A CMP process is then conducted to planarize the surface. It can be observed that multiple resistance change memory elements in series with transistors are created after this step.

Figure 33J:
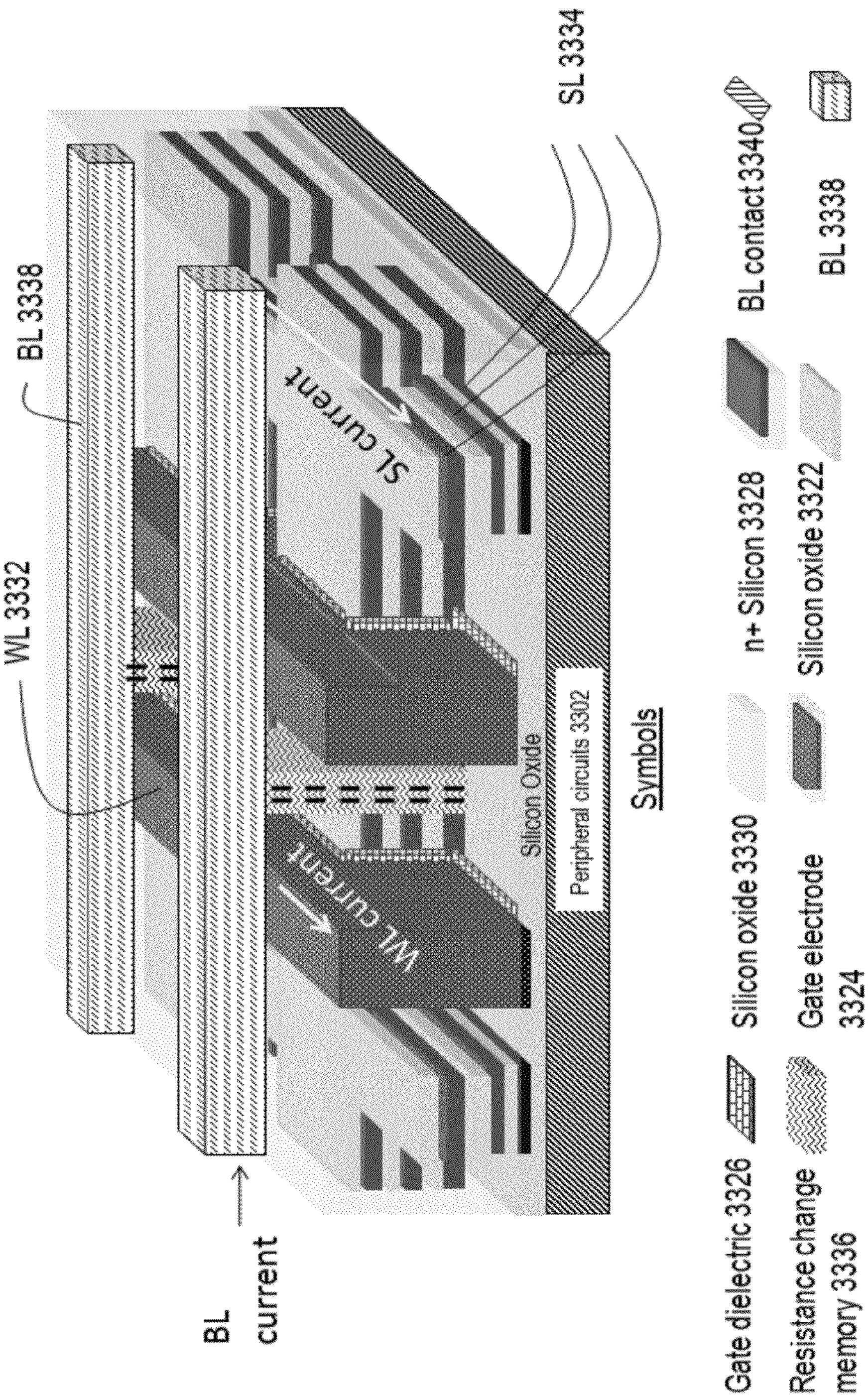

Step (J): FIG. 33J illustrates the structure after Step (J). BLs 3338 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (I) as well.

Figure 33K:
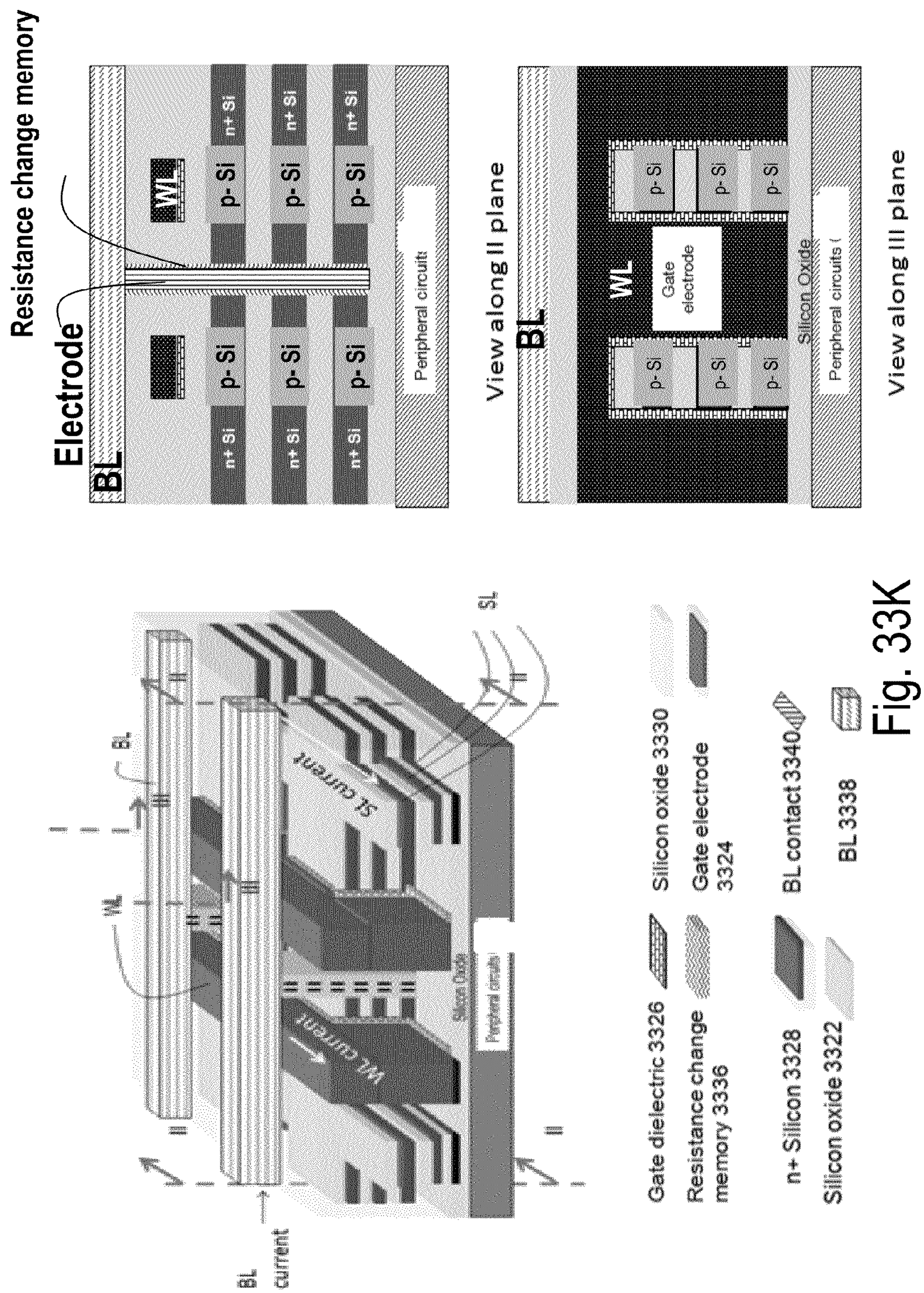

FIG. 33K shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

FIG. 34A-L describes an alternative process flow to construct a horizontally-oriented monolithic 3D resistive memory array. This embodiment has a resistance-based memory element in series with a transistor selector. One mask is utilized on a "per-memory-layer" basis for the monolithic 3D resistance change memory (or resistive memory) concept shown in FIG. 34A-L, and all other masks are shared between different layers. The process flow may include several steps as described in the following sequence.

Figure 34A:
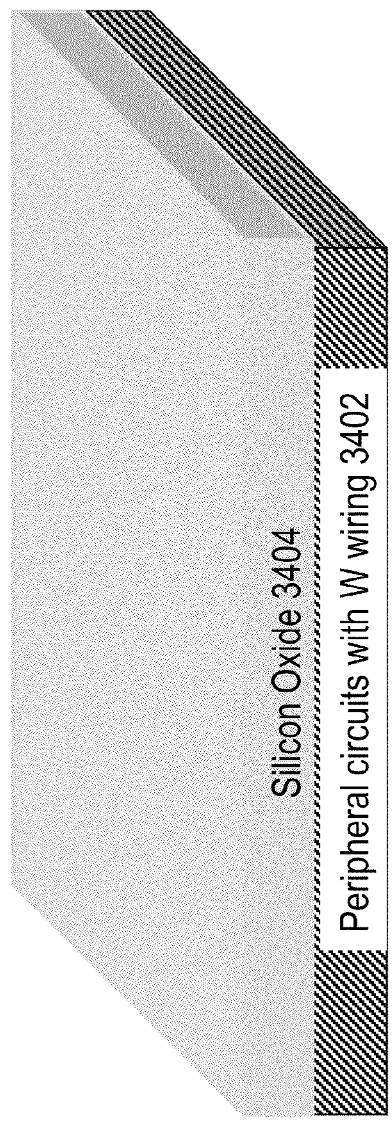
FIG. 34A-L show a one-mask per layer 3D resistive memory.

Step (A): Peripheral circuits with tungsten wiring 3402 are first constructed and above this a layer of silicon dioxide 3404 is deposited. FIG. 34A illustrates the structure after Step (A).

Figure 34B:
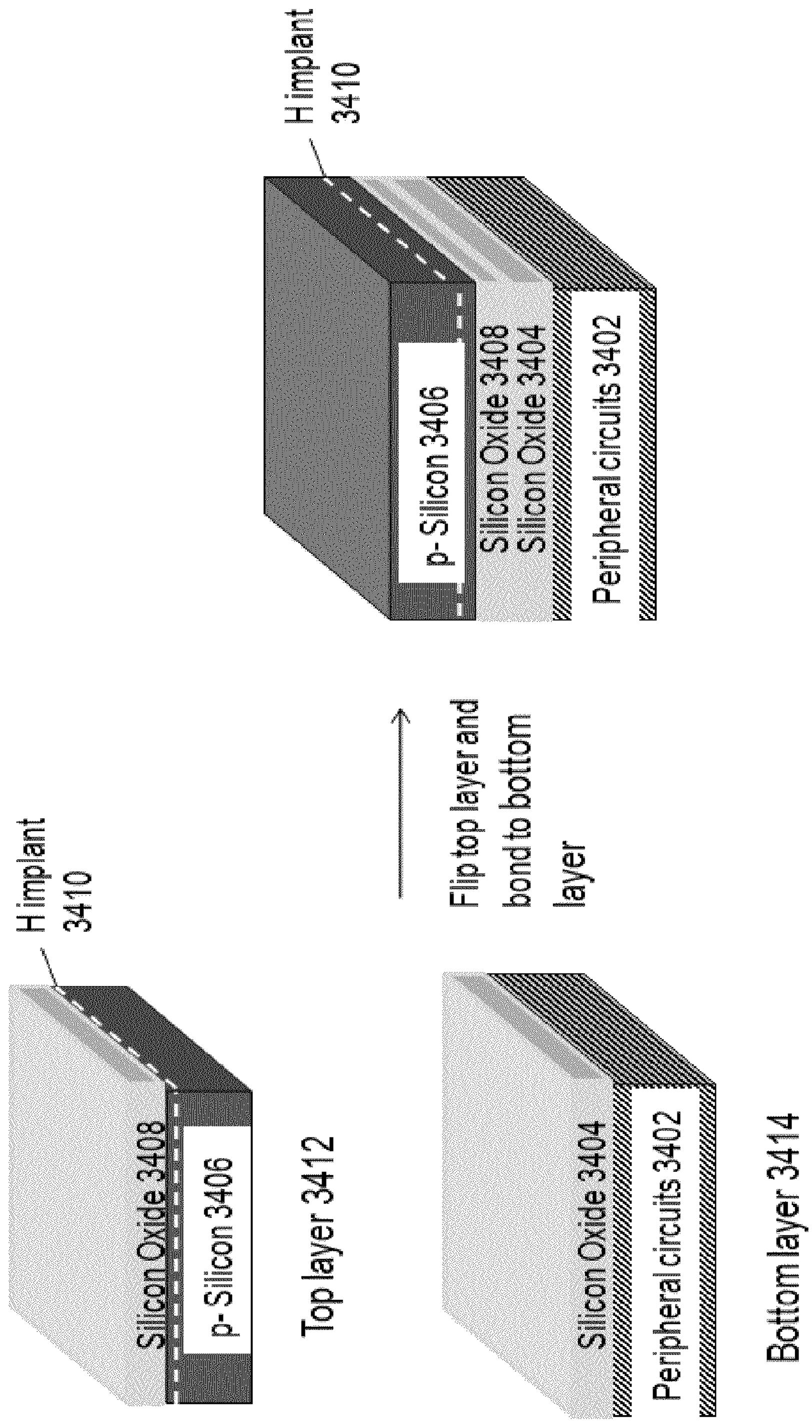

Step (B): FIG. 34B illustrates the structure after Step (B). A wafer of p− Silicon 3406 has an oxide layer 3408 grown or deposited above it. Following this, hydrogen is implanted into the p− Silicon wafer at a certain depth indicated by 3410. Alternatively, some other atomic species such as Helium could be (co-)implanted. This hydrogen implanted p− Silicon wafer 3406 forms the top layer 3412. The bottom layer 3414 may include the peripheral circuits 3402 with oxide layer 3404. The top layer 3412 is flipped and bonded to the bottom layer 3414 using oxide-to-oxide bonding.

Figure 34C:
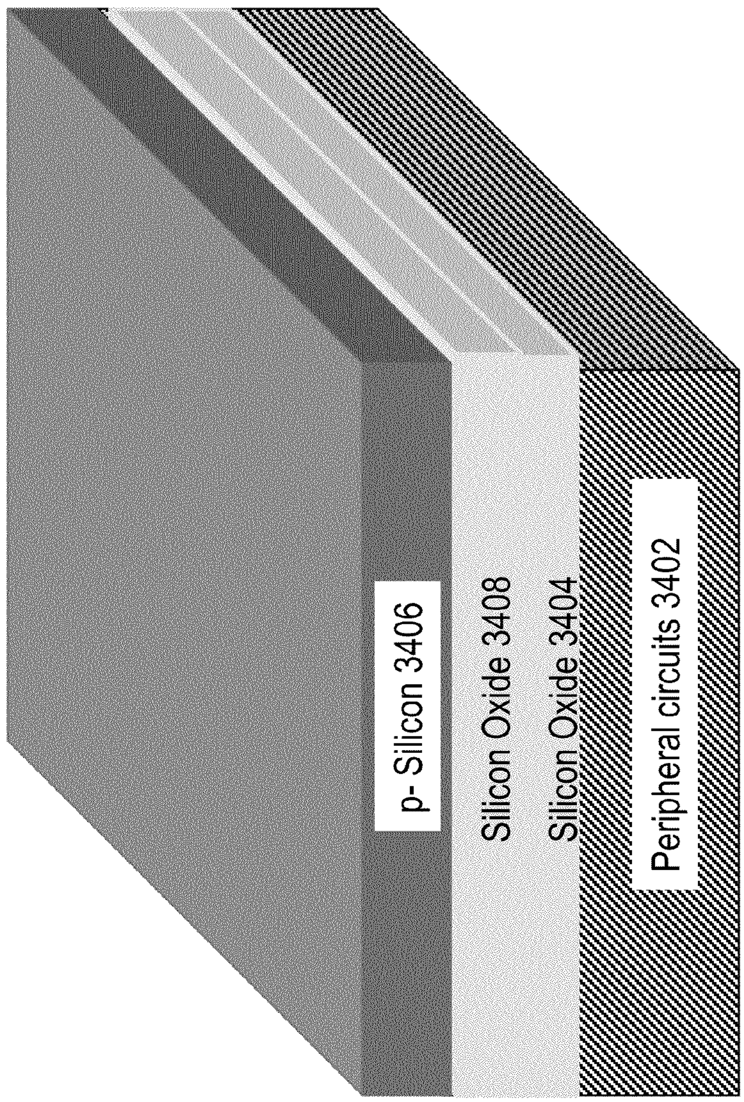

Step (C): FIG. 34C illustrates the structure after Step (C). The stack of top and bottom wafers after Step (B) is cleaved at the hydrogen plane 3410 using either a anneal or a sideways mechanical force or other means. A CMP process is then conducted. At the end of this step, a single-crystal p− Si layer exists atop the peripheral circuits, and this has been achieved using layer-transfer techniques.

Figure 34D:
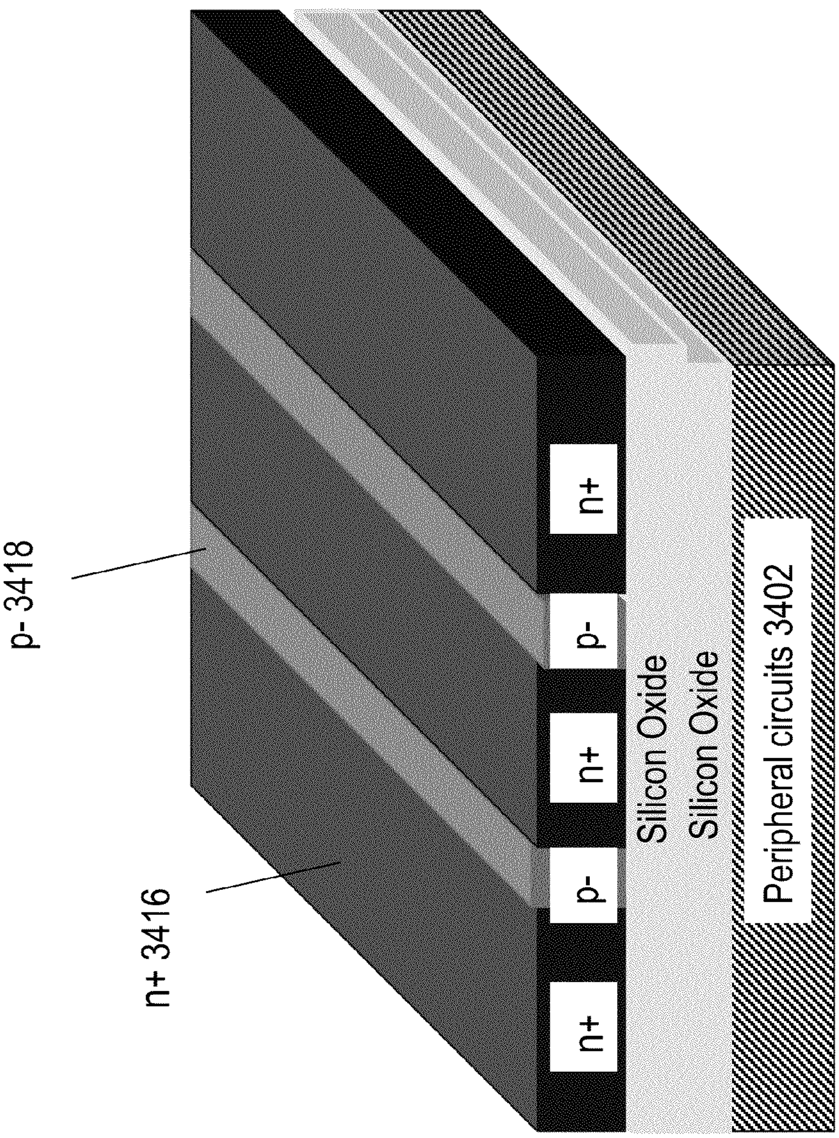

Step (D): FIG. 34D illustrates the structure after Step (D). Using lithography and then implantation, n+ regions 3416 and p− regions 3418 are formed on the transferred layer of p− Si after Step (C).

Figure 34E:
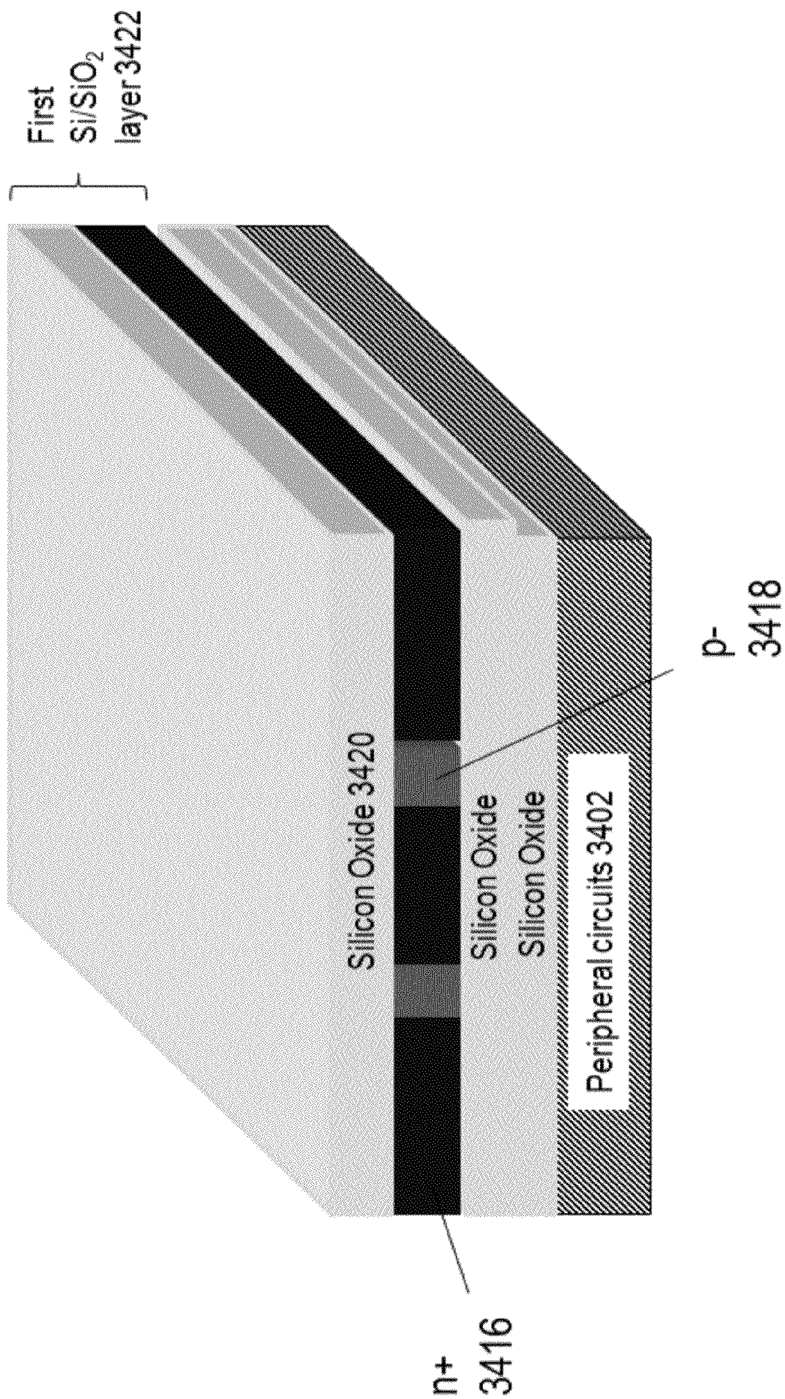

Step (E): FIG. 34E illustrates the structure after Step (E). An oxide layer 3420 is deposited atop the structure obtained after Step (D). A first layer of Si/$SiO_2$ 3422 is therefore formed atop the peripheral circuit layer 3402.

Figure 34F:
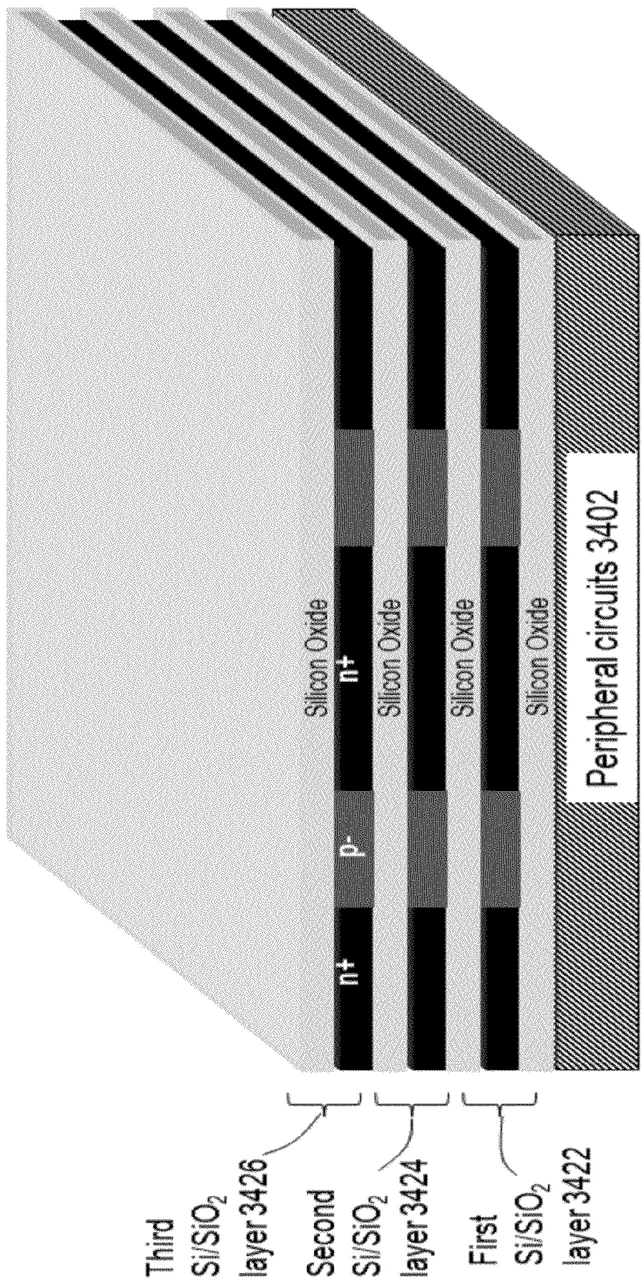

Step (F): FIG. 34F illustrates the structure after Step (F). Using procedures similar to Steps (B)-(E), additional Si/$SiO_2$ layers 3424 and 3426 are formed atop Si/$SiO_2$ layer 3422. A rapid thermal anneal (RTA) or spike anneal or flash anneal or laser anneal is then done to activate all implanted layers 3422, 3424 and 3426 (and possibly also the peripheral circuit layer 3402). Alternatively, the layers 3422, 3424 and 3426 are annealed layer-by-layer as soon as their implantations are done using a laser anneal system.

Figure 34G:
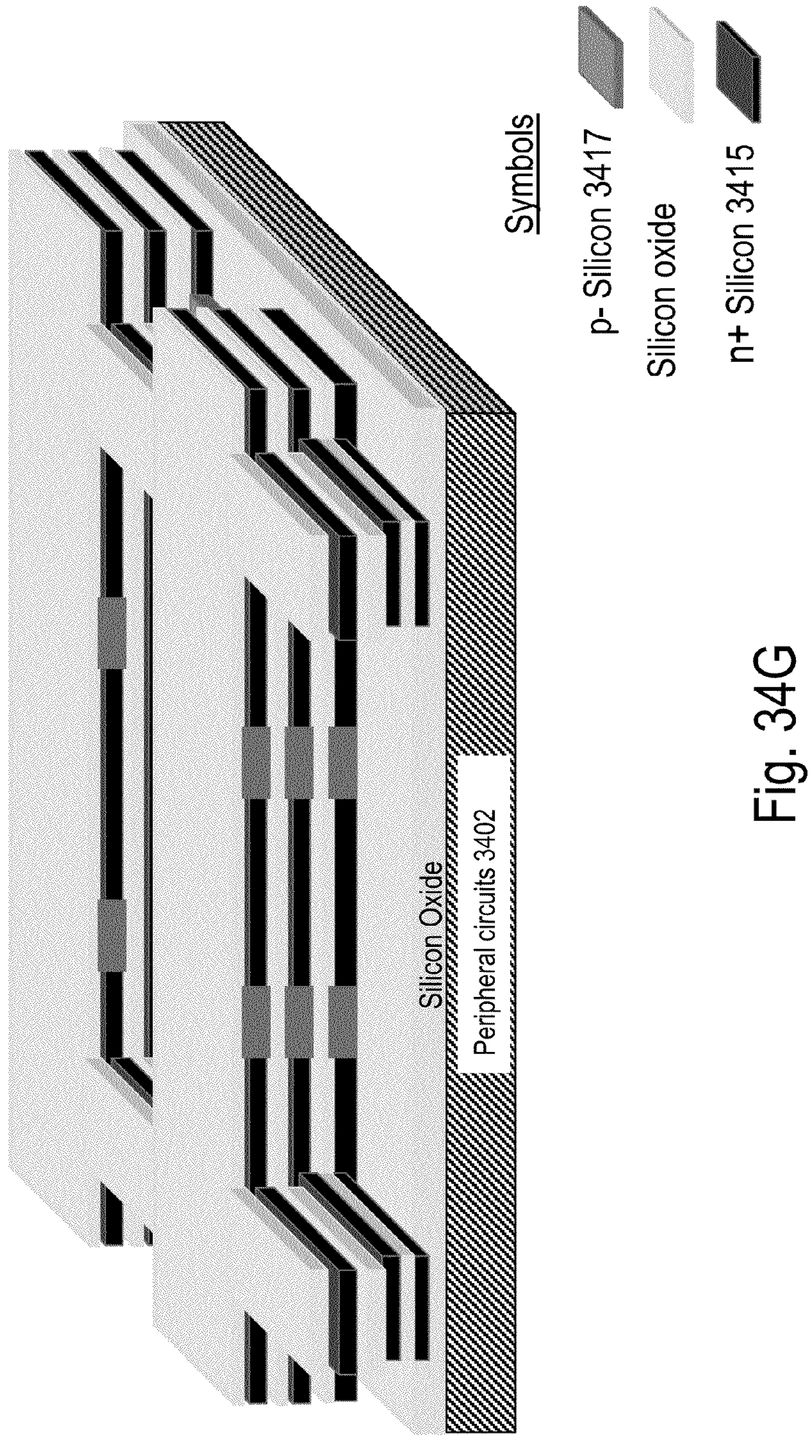

Step (G): FIG. 34G illustrates the structure after Step (G). Lithography and etch processes are then utilized to make a structure as shown in the figure.

Figure 34H:
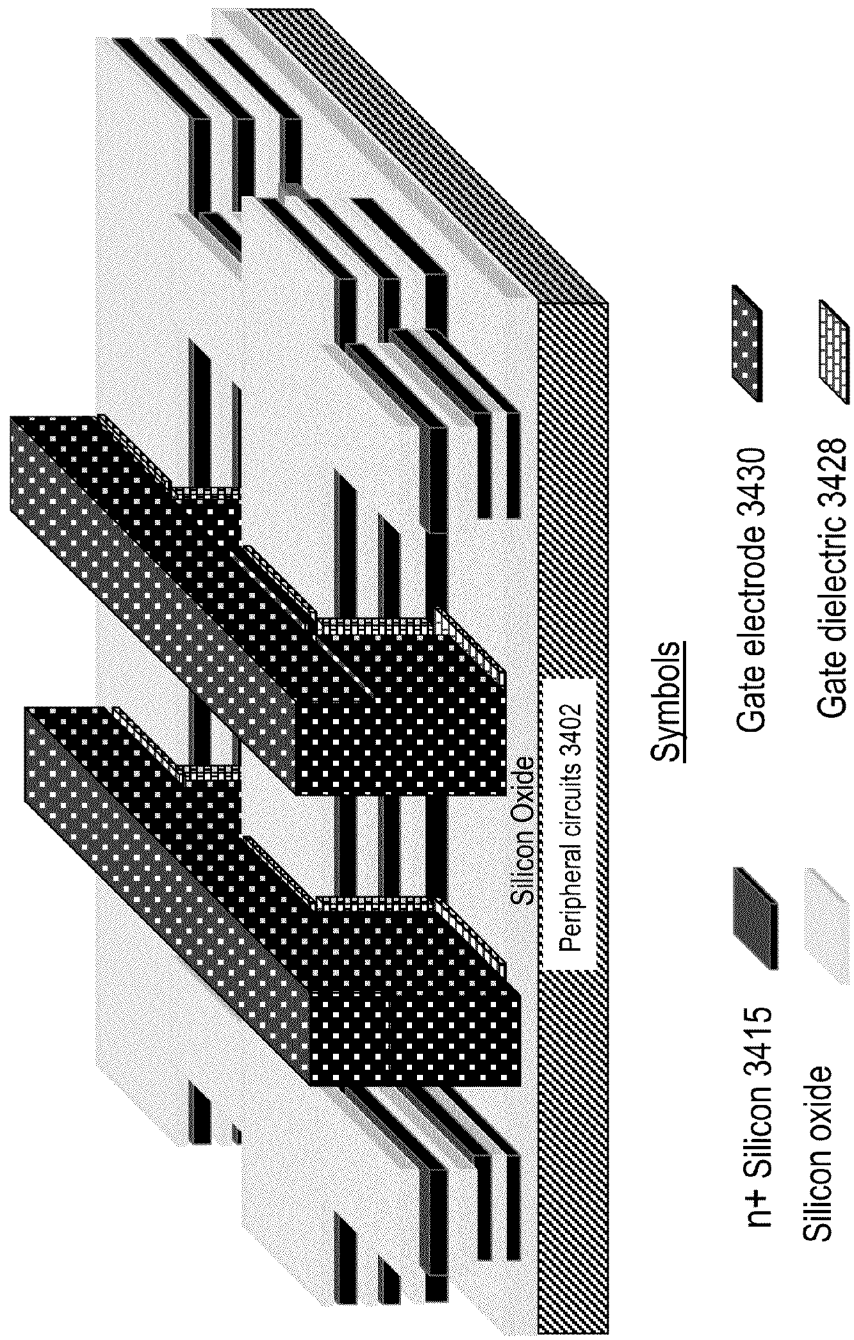

Step (H): FIG. 34H illustrates the structure after Step (H). Gate dielectric 3428 and gate electrode 3430 are then deposited following which a CMP is done to planarize the gate electrode 3430 regions. Lithography and etch are utilized to define gate regions over the p− silicon regions (eg. p− Si region 3418 after Step (D)). Note that gate width could be slightly larger than p− region width to compensate for overlay errors in lithography.

Figure 34I:
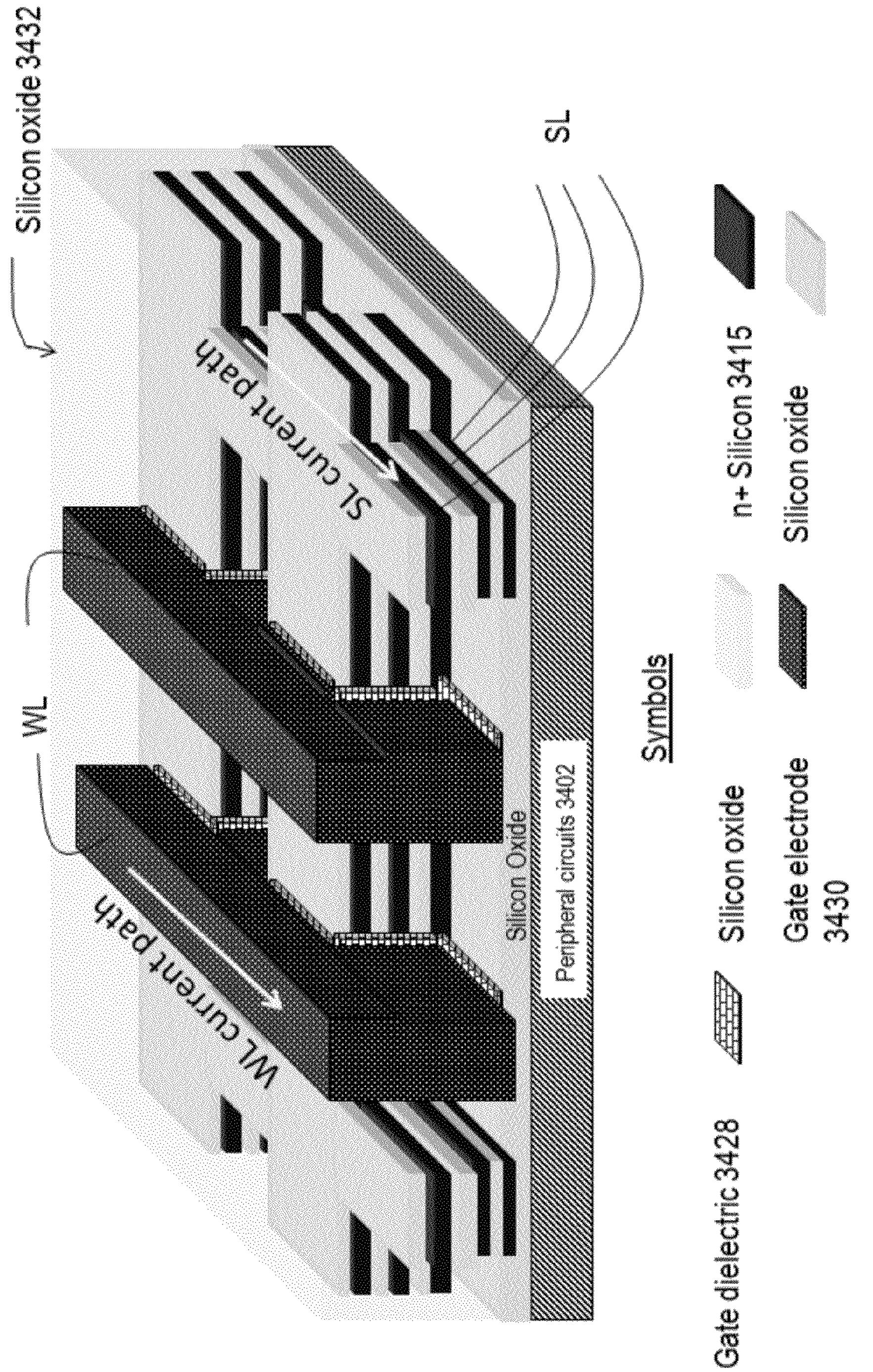

Step (I): FIG. 34I illustrates the structure after Step (I). A silicon oxide layer 3432 is then deposited and planarized. It is shown transparent in the figure for clarity. Word-line (WL) and Source-line (SL) regions are shown in the figure.

Figure 34J:
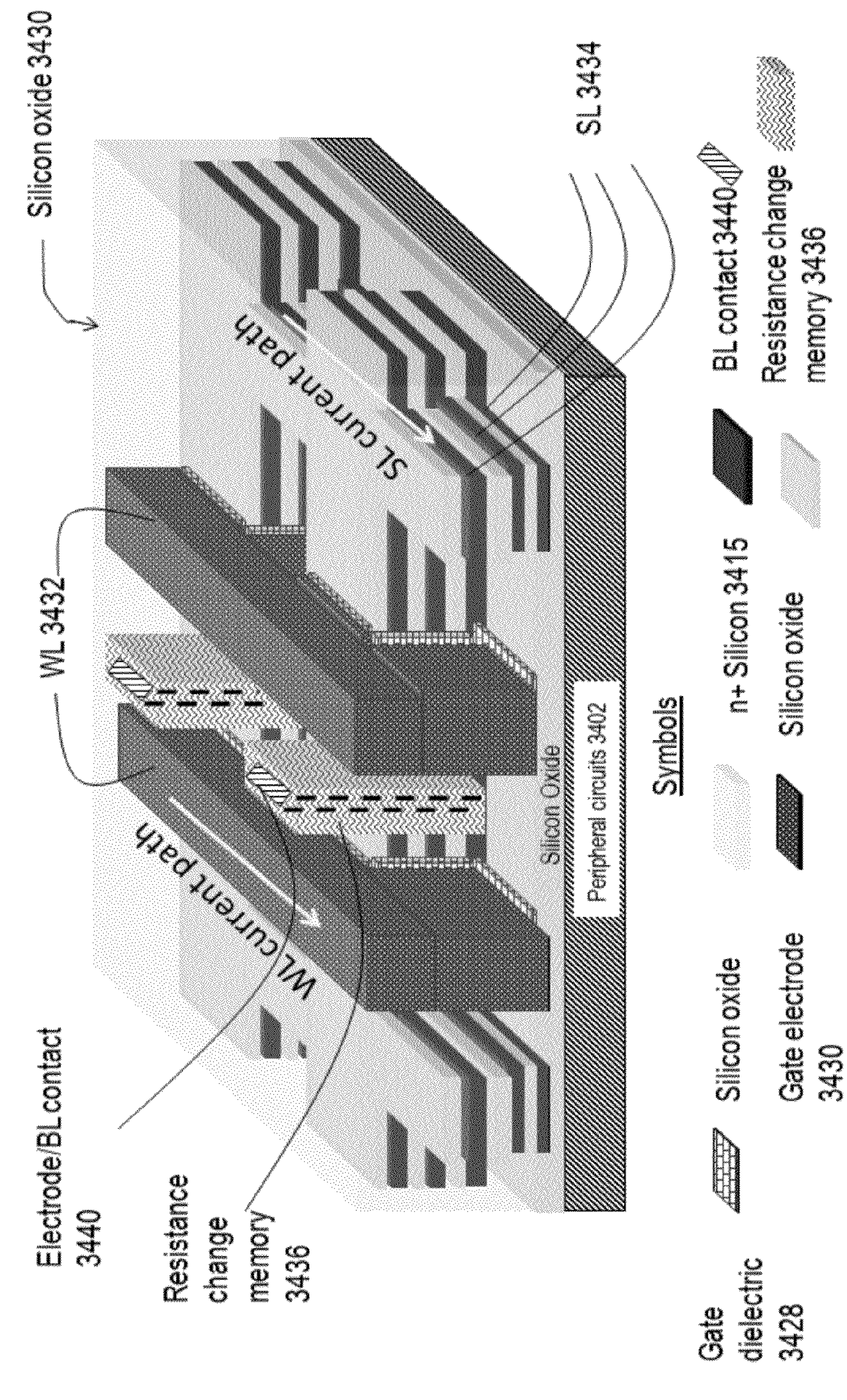

Step (J): FIG. 34J illustrates the structure after Step (J). Vias are etched through multiple layers of silicon and silicon dioxide as shown in the figure. A resistance change memory material 3436 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 3440. A CMP process is then conducted to planarize the surface. It can be observed that multiple resistance change memory elements in series with transistors are created after this step.

Figure 34K:
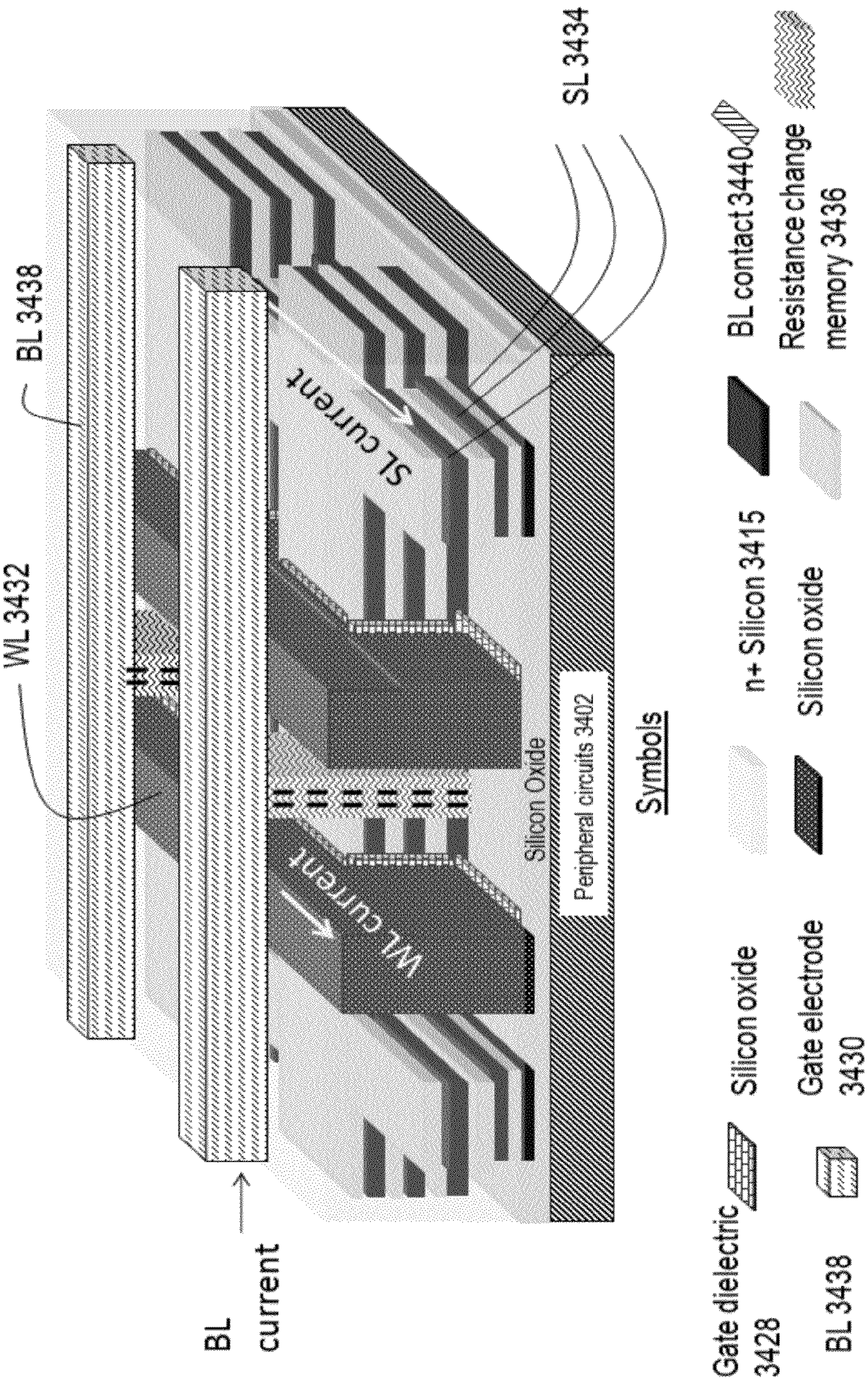

Step (K): FIG. 34K illustrates the structure after Step (K). BLs 3436 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (J) as well.

Figure 34L:
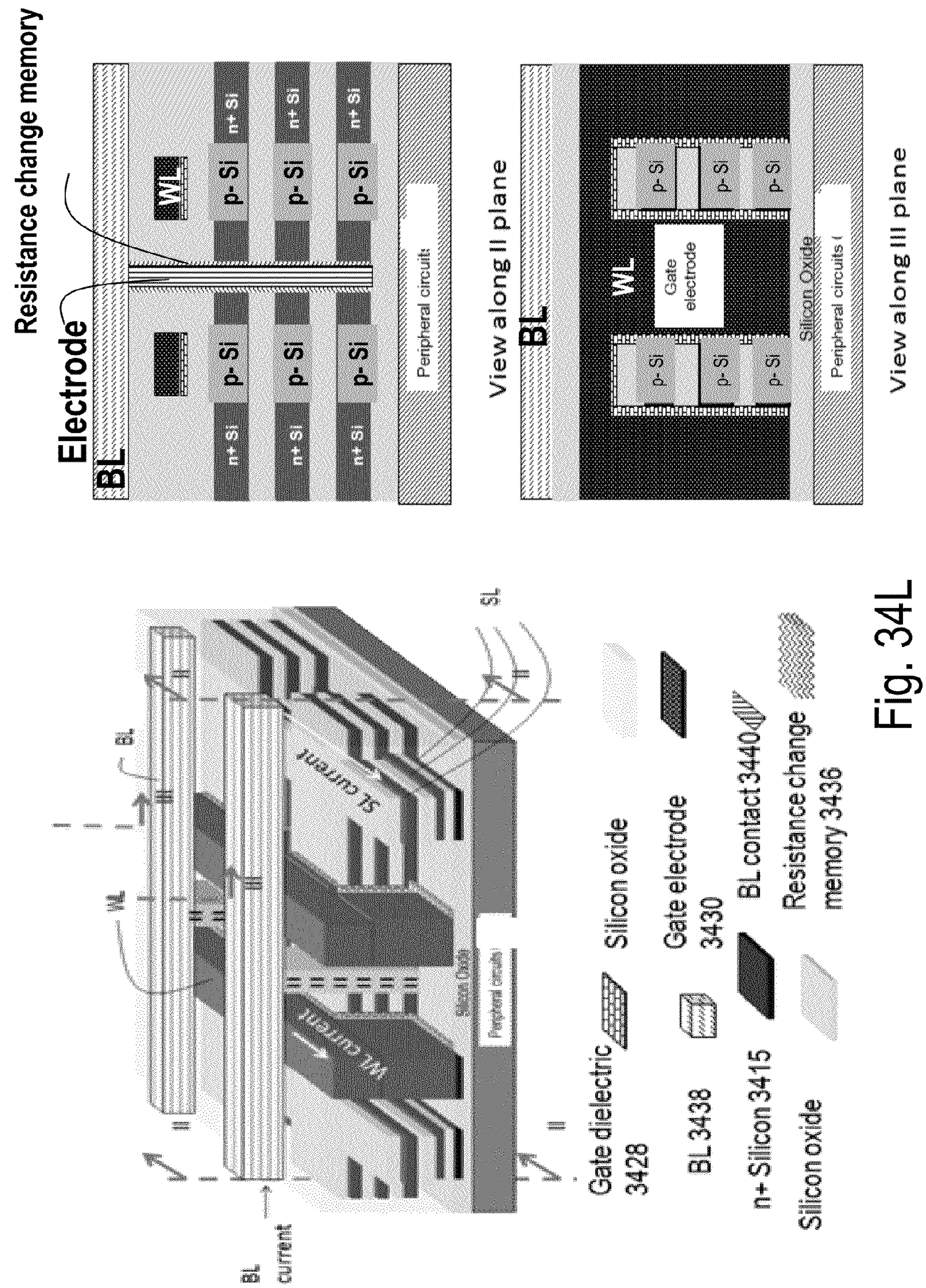

FIG. 34L shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

FIG. 35A-F describes an alternative process flow to construct a horizontally-oriented monolithic 3D resistive memory array. This embodiment has a resistance-based memory element in series with a transistor selector. Two masks are utilized on a "per-memory-layer" basis for the monolithic 3D resistance change memory (or resistive memory) concept shown in FIG. 35A-F, and all other masks are shared between different layers. The process flow may include several steps as described in the following sequence.

Figure 35A:
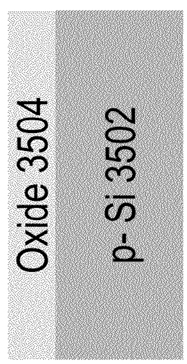
FIG. 35A-F show a two-mask per layer 3D resistive memory.

Step (A): The process flow starts with a p− silicon wafer 3502 with an oxide coating 3504. FIG. 35A illustrates the structure after Step (A).

Figure 35B:
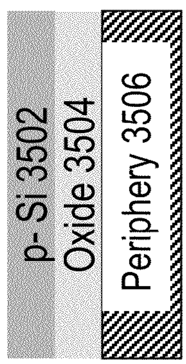

Step (B): FIG. 35B illustrates the structure after Step (B). Using a process flow similar to FIG. 2, a portion of the p− silicon layer 3502 is transferred atop a layer of peripheral circuits 3506. The peripheral circuits 3506 preferably use tungsten wiring.

Figure 35C:
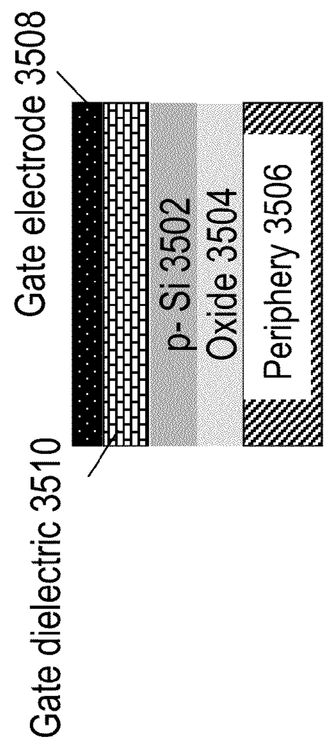

Step (C): FIG. 35C illustrates the structure after Step (C). Isolation regions for transistors are formed using a shallow-trench-isolation (STI) process. Following this, a gate dielectric 3510 and a gate electrode 3508 are deposited.

Figure 35D:
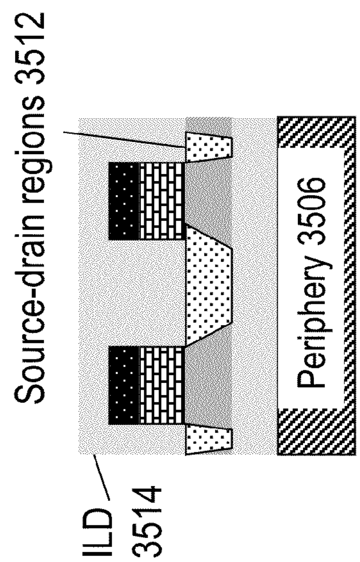

Step (D): FIG. 35D illustrates the structure after Step (D). The gate is patterned, and source-drain regions 3512 are formed by implantation. An inter-layer dielectric (ILD) 3514 is also formed.

Figure 35E:
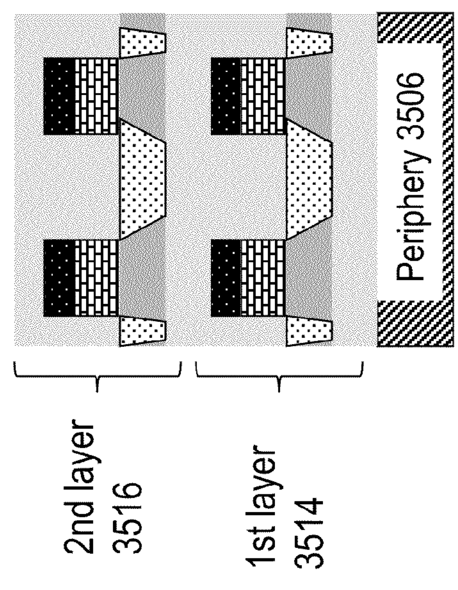

Step (E): FIG. 35E illustrates the structure after Step (E). Using steps similar to Step (A) to Step (D), a second layer of transistors 3516 is formed above the first layer of transistors 3514. A RTA or some other type of anneal is performed to activate dopants in the memory layers (and potentially also the peripheral transistors).

Figure 35F:
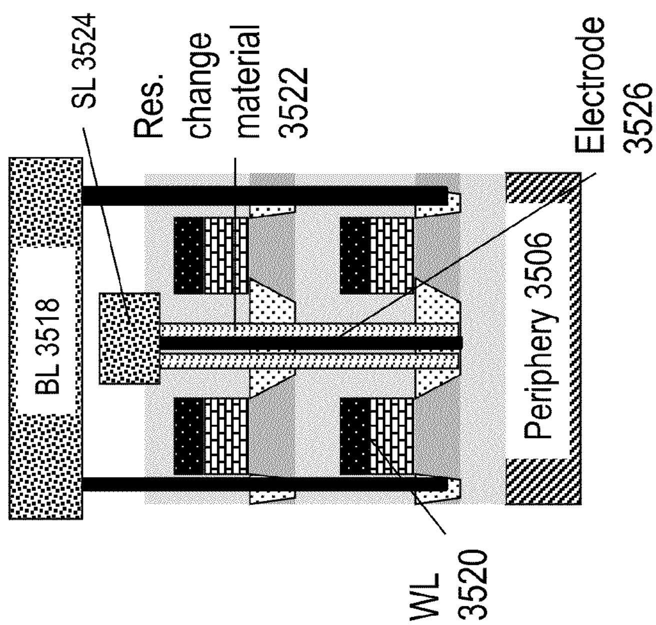

Step (F): FIG. 35F illustrates the structure after Step (F). Vias are etched through multiple layers of silicon and silicon dioxide as shown in the figure. A resistance change memory material 3522 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode 3526. A CMP process is then conducted to planarize the surface. Contacts are made to drain terminals of transistors in different memory layer as well. Note that gates of transistors in each memory layer are connected together perpendicular to the plane of the figure to form word-lines (WL). Wiring for bit-lines (BLs) and source-lines (SLs) is constructed. Contacts are made between BLs, WLs and SLs with the periphery at edges of the memory array. Multiple resistance change memory elements in series with transistors may be created after this step.

A 3D resistance change memory has thus been constructed, with (1) horizontally-oriented transistors—i.e. current flowing in substantially the horizontal direction in the transistor channels, and (2) monocrystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 32A-J, FIG. 33A-K, FIG. 34A-L and FIG. 35A-F. Various other types of layer transfer schemes that have been described in Section 1.3.4 can be utilized for construction of various 3D resistive memory structures. One could also use buried wiring, i.e. where wiring for memory arrays is below the memory layers but above the periphery. Other variations of the monolithic 3D resistive memory concepts are possible.

Section 5: Monolithic 3D Charge-Trap Memory

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 36A-F, FIG. 37A-G and FIG. 38A-D are relevant for any type of charge-trap memory.

FIG. 36A-F describes a process flow to construct a horizontally-oriented monolithic 3D charge trap memory. Two masks are utilized on a "per-memory-layer" basis for the monolithic 3D charge trap memory concept shown in FIG. 36A-F, while other masks are shared between all constructed memory layers. The process flow may include several steps, that occur in the following sequence.

Figure 36A:
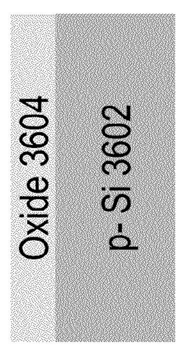
FIG. 36A-F show a two-mask per layer 3D charge-trap memory.

Step (A): A p− Silicon wafer 3602 is taken and an oxide layer 3604 is grown or deposited above it. FIG. 36A illustrates the structure after Step (A).

Figure 36B:
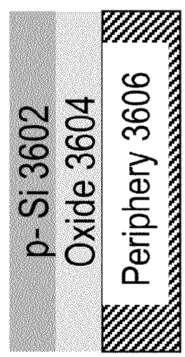

Step (B): FIG. 36B illustrates the structure after Step (B). Using a procedure similar to the one shown in FIG. 2, the p− Si wafer 3602 is transferred atop a peripheral circuit layer 3606. The periphery is designed such that it can withstand the RTA required for activating dopants in memory layers formed atop it.

Figure 36C:
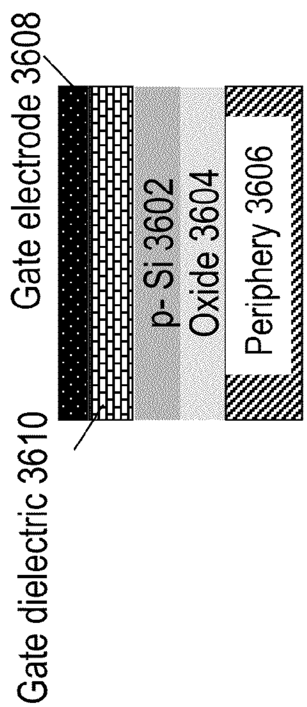

Step (C): FIG. 36C illustrates the structure after Step (C). Isolation regions are formed in the p− Si region 3602 atop the peripheral circuit layer 3606. This lithography step and all future lithography steps are formed with good alignment to features on the peripheral circuit layer 3606 since the p− Si region 3602 is thin and reasonably transparent to the lithography tool. A dielectric layer 3610 (e.g. Oxide-nitride-oxide ONO layer) is deposited following which a gate electrode layer 3608 (e.g. polysilicon) are then deposited.

Figure 36D:
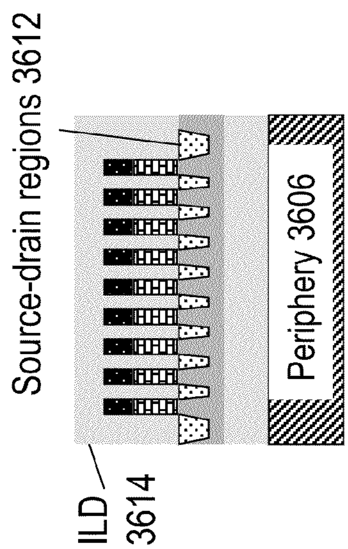

Step (D): FIG. 36D illustrates the structure after Step (D). The gate regions deposited in Step (C) are patterned and etched. Following this, source-drain regions 3612 are implanted. An inter-layer dielectric 3614 is then deposited and planarized.

Figure 36E:
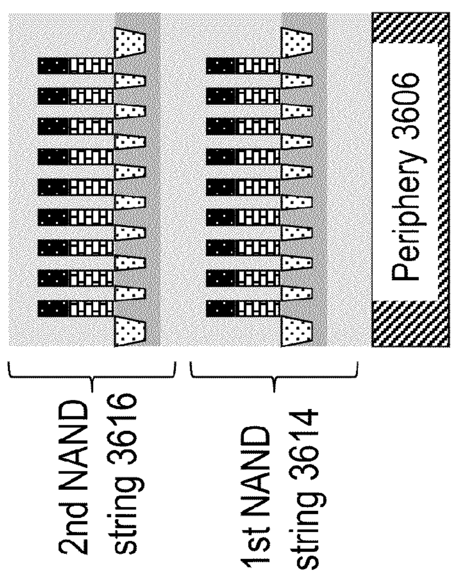

Step (E): FIG. 36E illustrates the structure after Step (E). Using procedures similar to Step (A) to Step (D), another layer of memory, a second NAND string 3616, is formed atop the first NAND string 3614.

Figure 36F:
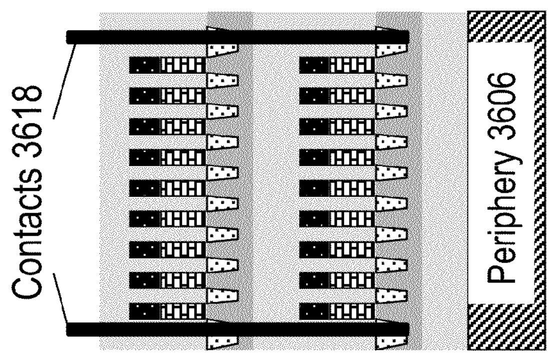

Step (F): FIG. 36F illustrates the structure after Step (F). Contacts are made to connect bit-lines (BL) and source-lines (SL) to the NAND string. Contacts to the well of the NAND string are also made. All these contacts could be constructed of heavily doped polysilicon or some other material. An anneal to activate dopants in source-drain regions of transistors in the NAND string (and potentially also the periphery) is conducted. Following this, wiring layers for the memory array is conducted.

A 3D charge-trap memory has thus been constructed, with (1) horizontally-oriented transistors—i.e. current flowing in substantially the horizontal direction in transistor channels, and (2) monocrystalline (or single-crystal) silicon layers obtained by layer transfer techniques such as ion-cut. This use of monocrystalline silicon (or single crystal silicon) using ion-cut can be a key differentiator for some embodiments of the current invention vis-à-vis prior work. Past work described by Bakir in his textbook used selective epi technology or laser recrystallization or polysilicon.

FIG. 37A-G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIG. 37A-G, and all other masks are shared between different layers. The process flow may include several steps as described in the following sequence.

Figure 37A:
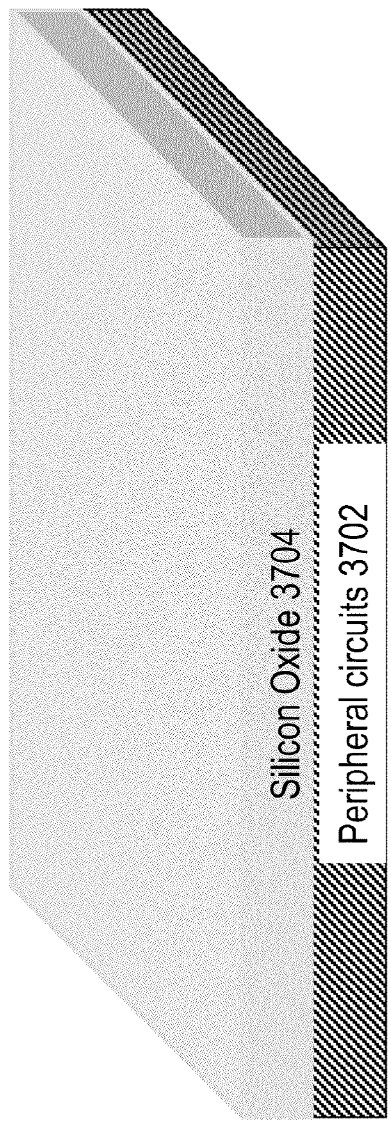
FIG. 37A-G show a zero-mask per layer 3D charge-trap memory.

Step (A): Peripheral circuits 3702 are first constructed and above this a layer of silicon dioxide 3704 is deposited. FIG. 37A shows a drawing illustration after Step (A).

Figure 37B:
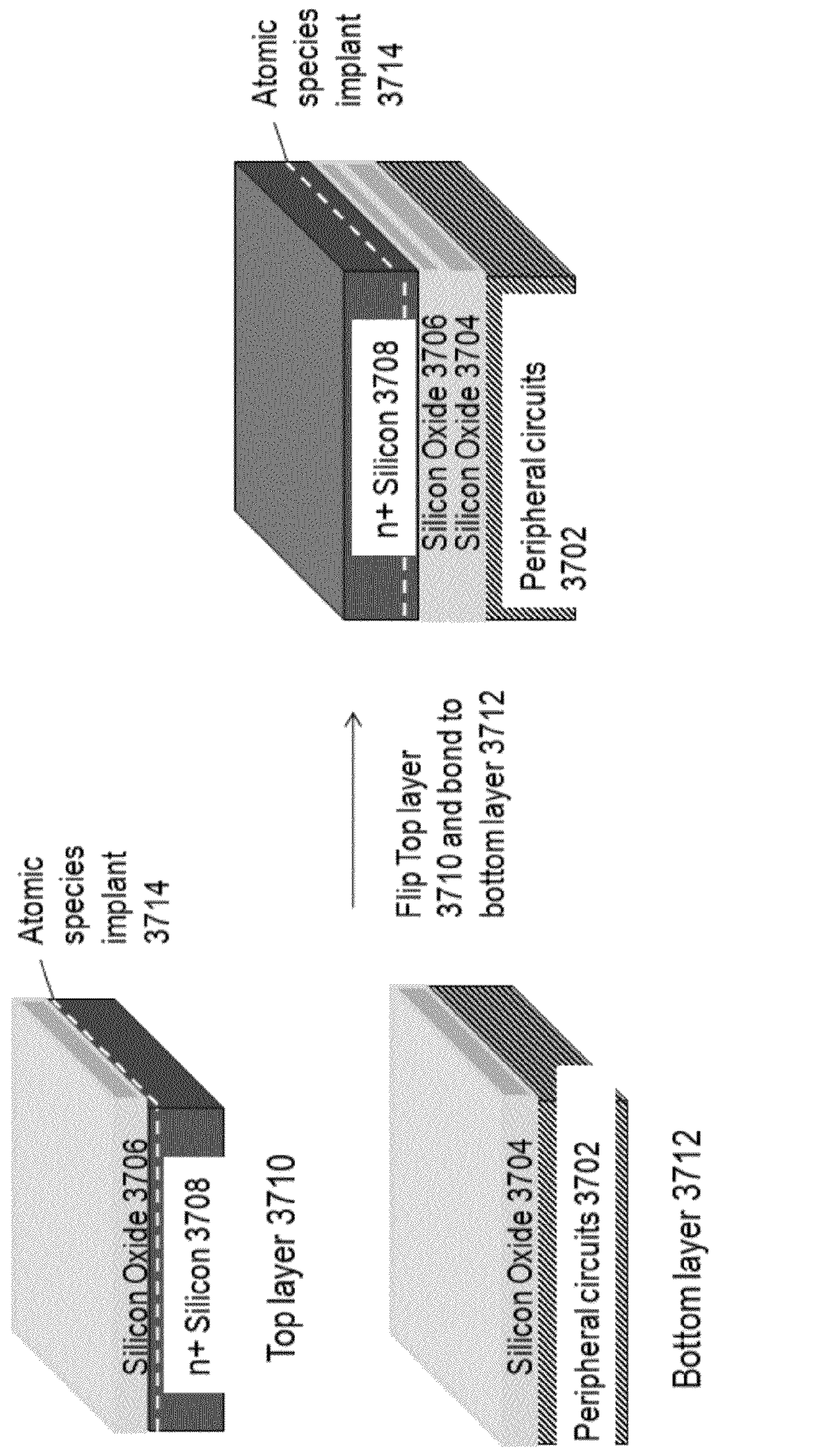

Step (B): FIG. 37B illustrates the structure after Step (B). A wafer of n+ Silicon 3708 has an oxide layer 3706 grown or deposited above it. Following this, hydrogen is implanted into the n+ Silicon wafer at a certain depth indicated by 3714. Alternatively, some other atomic species such as Helium could be implanted. This hydrogen implanted n+ Silicon wafer 3708 forms the top layer 3710. The bottom layer 3712 may include the peripheral circuits 3702 with oxide layer 3704. The top layer 3710 is flipped and bonded to the bottom layer 3712 using oxide-to-oxide bonding.

Figure 37C:
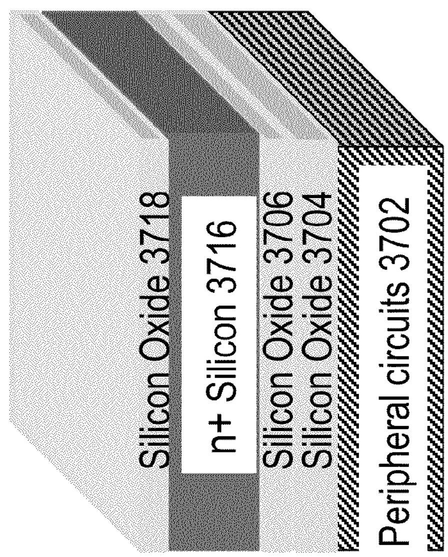

Step (C): FIG. 37C illustrates the structure after Step (C). The stack of top and bottom wafers after Step (B) is cleaved at the hydrogen plane 3714 using either a anneal or a sideways mechanical force or other means. A CMP process is then conducted. A layer of silicon oxide 3718 is then deposited atop the n+ Silicon layer 3716. At the end of this step, a single-crystal n+ Si layer 3716 exists atop the peripheral circuits, and this has been achieved using layer-transfer techniques.

Figure 37D:
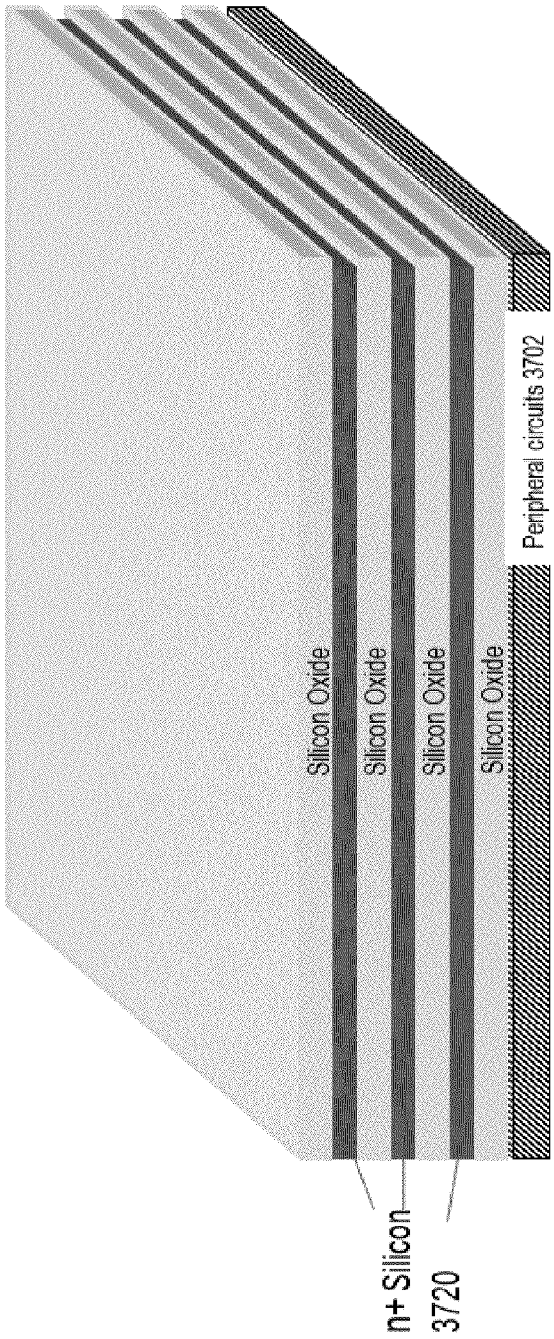

Step (D): FIG. 37D illustrates the structure after Step (D). Using methods similar to Step (B) and (C), multiple n+ silicon layers 3720 are formed with silicon oxide layers in between.

Figure 37E:
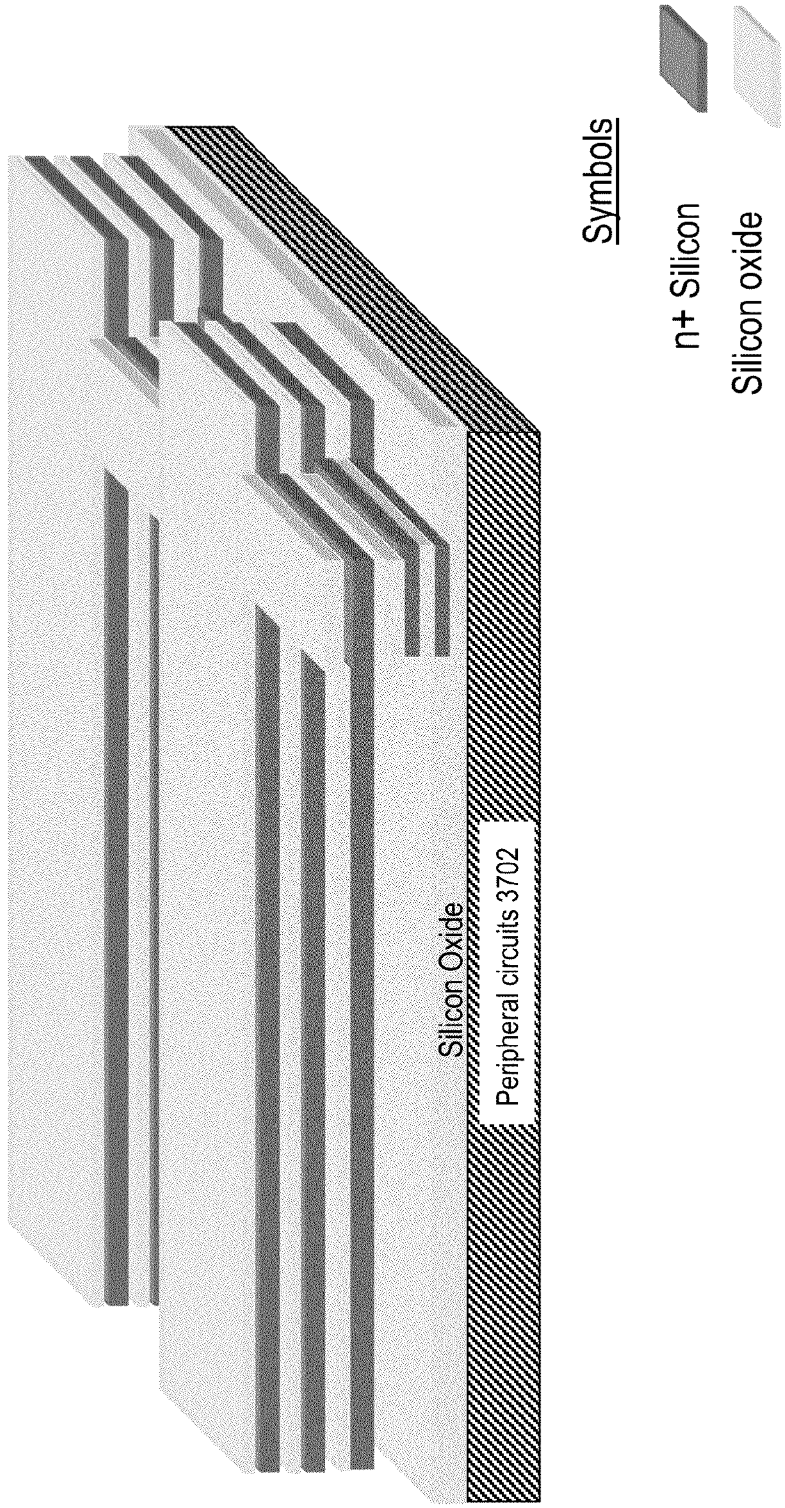

Step (E): FIG. 37E illustrates the structure after Step (E). Lithography and etch processes are then utilized to make a structure as shown in the figure.

Figure 37F:
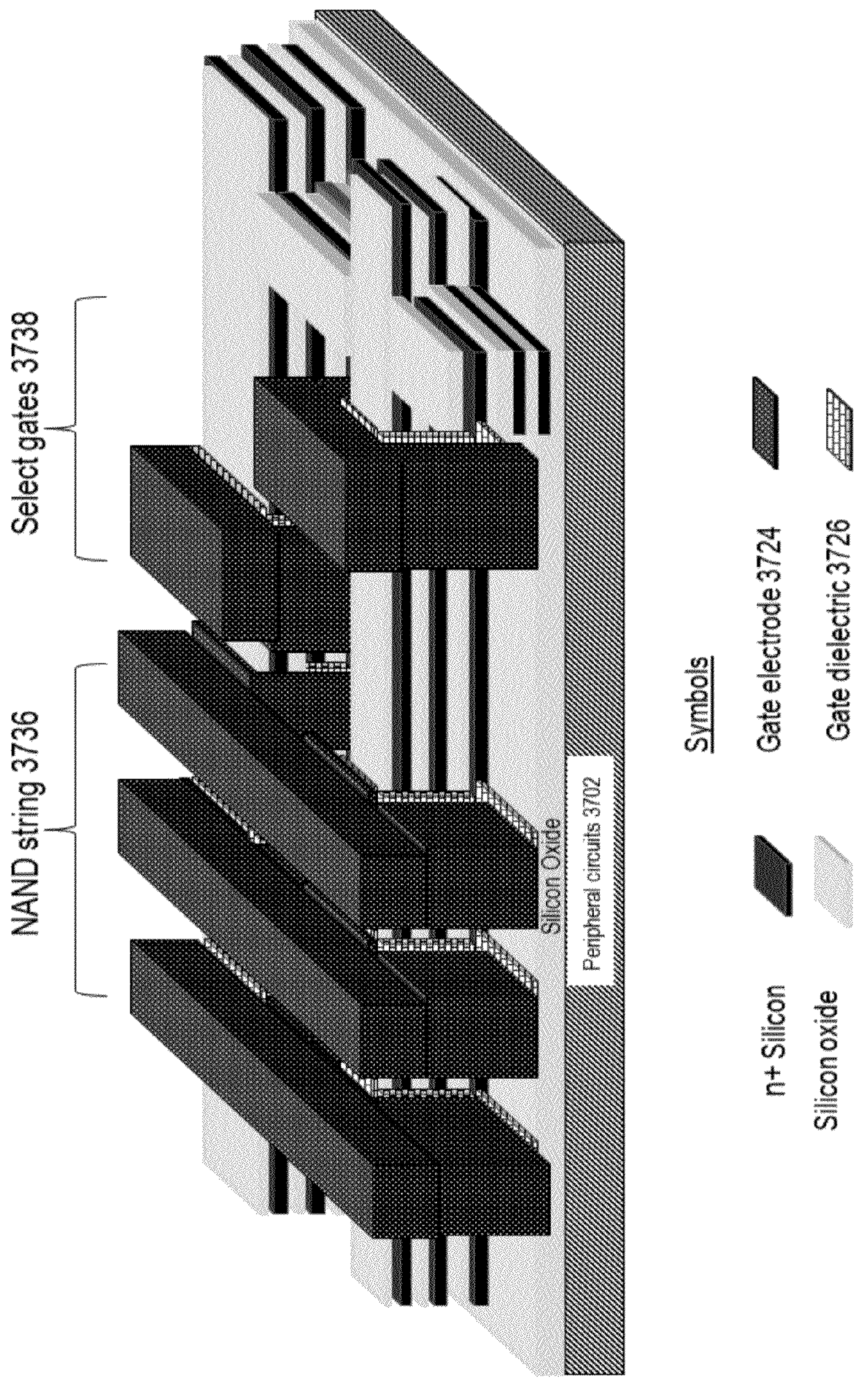

Step (F): FIG. 37F illustrates the structure after Step (F). Gate dielectric 3726 and gate electrode 3724 are then deposited following which a CMP is done to planarize the gate electrode 3724 regions. Lithography and etch are utilized to define gate regions. Gates of the NAND string 3736 as well gates of select gates of the NAND string 3738 are defined.

Figure 37G:
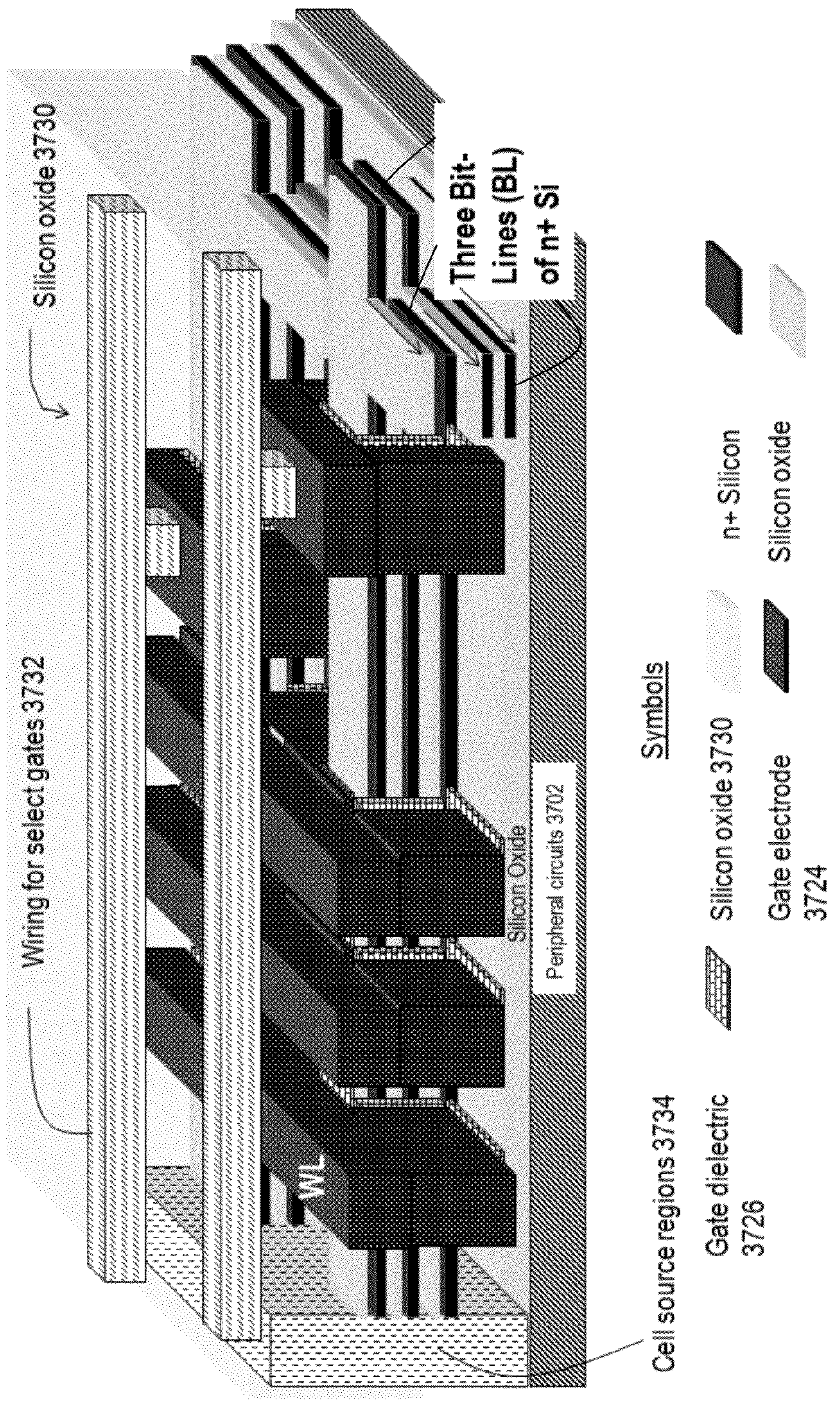

Step (G): FIG. 37G illustrates the structure after Step (G). A silicon oxide layer 3730 is then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

Figure 38A:
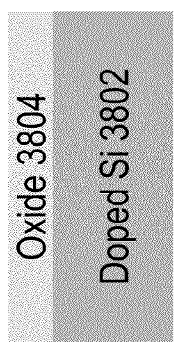
Figure 38B:
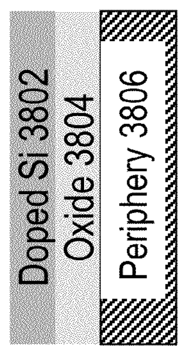
Figure 38C:
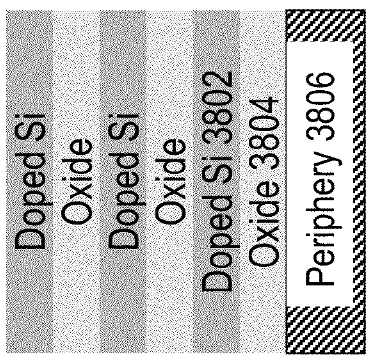

While FIG. 36A-F and FIG. 37A-G give two examples of how single-crystal silicon layers with ion-cut can be used to produce 3D charge-trap memories, the ion-cut technique for 3D charge-trap memory is fairly general. It could be utilized to produce any horizontally-oriented 3D monocrystalline-silicon charge-trap memory. FIG. 38A-D further illustrate how general the process can be. One or more doped silicon layers 3802 can be layer transferred atop any peripheral circuit layer 3806 using procedures shown in FIG. 2. These are indicated in FIG. 38A, FIG. 38B and FIG. 38C. Following this, different procedures can be utilized to form different types of 3D charge-trap memories. For example, procedures shown in "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. and "Multi-layered Vertical Gate NAND Flash overcoming stacking limit for terabit density storage", Symposium on VLSI Technology, 2009 by W. Kim, S. Choi, et al. can be used to produce the two different types of horizontally oriented single crystal silicon 3D charge trap memory shown in FIG. 38D.

Section 6: Monolithic 3D Floating-Gate Memory

While charge-trap memory forms one type of non-volatile memory, floating-gate memory is another type. Background information on floating-gate flash memory can be found in "Introduction to Flash memory", Proc. IEEE 91, 489-502 (2003) by R. Bez, et al. There are different types of floating-gate memory based on different materials and device structures. The architectures shown in FIG. 39A-F and FIG. 40A-H are relevant for any type of floating-gate memory.

FIG. 39A-F describe a process flow to construct a horizontally-oriented monolithic 3D floating-gate memory. Two masks are utilized on a "per-memory-layer" basis for the monolithic 3D floating-gate memory concept shown in FIG. 39A-F, while other masks are shared between all constructed memory layers. The process flow may include several steps as described in the following sequence.

Figure 39A:
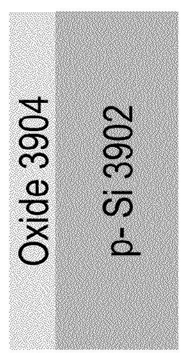
FIG. 39A-F show a two-mask per layer 3D horizontally-oriented floating-gate memory.

Step (A): A p− Silicon wafer 3902 is taken and an oxide layer 3904 is grown or deposited above it. FIG. 39A illustrates the structure after Step (A).

Figure 39B:
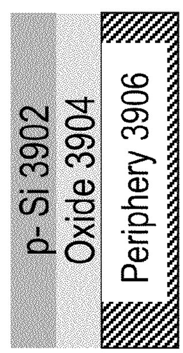

Step (B): FIG. 39B illustrates the structure after Step (B). Using a procedure similar to the one shown in FIG. 2, the p− Si wafer 3902 is transferred atop a peripheral circuit layer 3906. The periphery is designed such that it can withstand the RTA required for activating dopants in memory layers formed atop it.

Figure 39C:
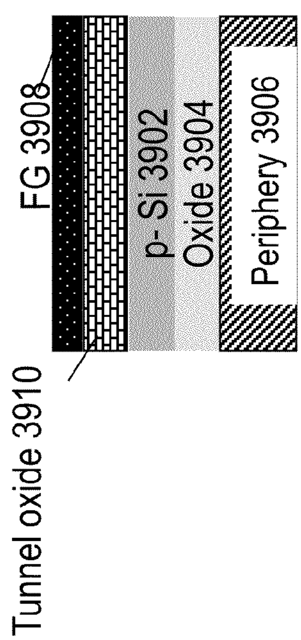

Step (C): FIG. 39C illustrates the structure after Step (C). After deposition of the tunnel oxide 3910 and floating gate 3908, isolation regions are formed in the p− Si region 3902 atop the peripheral circuit layer 3906. This lithography step and all future lithography steps are formed with good alignment to features on the peripheral circuit layer 3906 since the p− Si region 3902 is thin and reasonably transparent to the lithography tool.

Figure 39D:
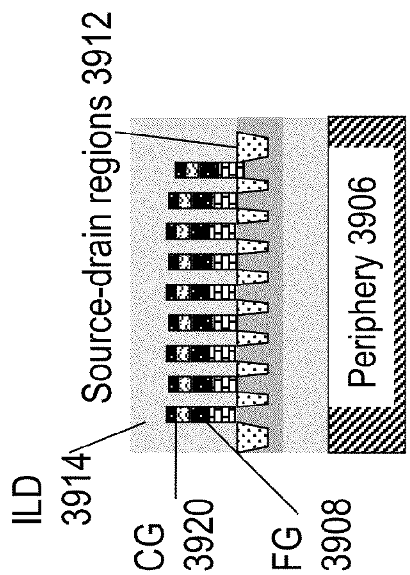

Step (D): FIG. 39D illustrates the structure after Step (D). A inter-poly-dielectric (IPD) layer (eg. Oxide-nitride-oxide ONO layer) is deposited following which a control gate electrode 3920 (eg. polysilicon) is then deposited. The gate regions deposited in Step (C) are patterned and etched. Following this, source-drain regions 3912 are implanted. An inter-layer dielectric 3914 is then deposited and planarized.

Figure 39E:
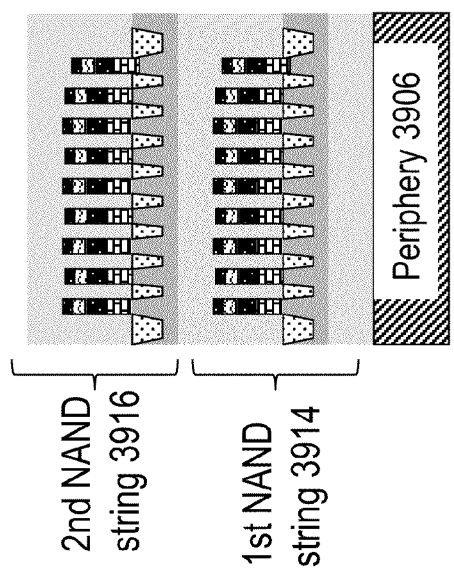

Step (E): FIG. 39E illustrates the structure after Step (E). Using procedures similar to Step (A) to Step (D), another layer of memory, a second NAND string 3916, is formed atop the first NAND string 3914.

Figure 39F:
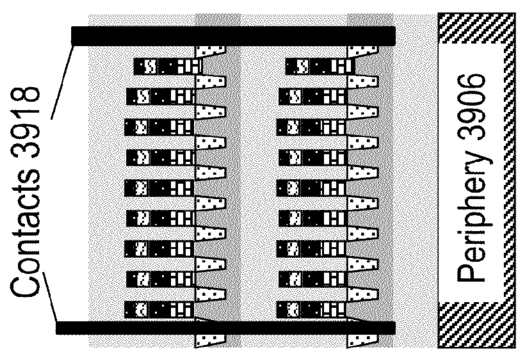

Step (F): FIG. 39F illustrates the structure after Step (F). Contacts are made to connect bit-lines (BL) and source-lines (SL) to the NAND string. Contacts to the well of the NAND string are also made. All these contacts could be constructed of heavily doped polysilicon or some other material. An anneal to activate dopants in source-drain regions of transistors in the NAND string (and potentially also the periphery) is conducted. Following this, wiring layers for the memory array is conducted.

A 3D floating-gate memory has thus been constructed, with (1) horizontally-oriented transistors—i.e. current flow in substantially the horizontal direction in transistor channels, (2) monocrystalline (or single-crystal) silicon layers obtained by layer transfer techniques such as ion-cut. This use of monocrystalline silicon (or single crystal silicon) using ion-cut is a key differentiator for some embodiments of the current invention vis-à-vis prior work. Past work used selective epi technology or laser recrystallization or polysilicon.

FIG. 40A-H show a novel memory architecture for 3D floating-gate memories, and a procedure for its construction. The memory architecture utilizes junction-less transistors. One mask is utilized on a "per-memory-layer" basis for the monolithic 3D floating-gate memory concept shown in FIG. 40A-H, and all other masks are shared between different layers. The process flow may include several steps that as described in the following sequence.

Figure 40A:
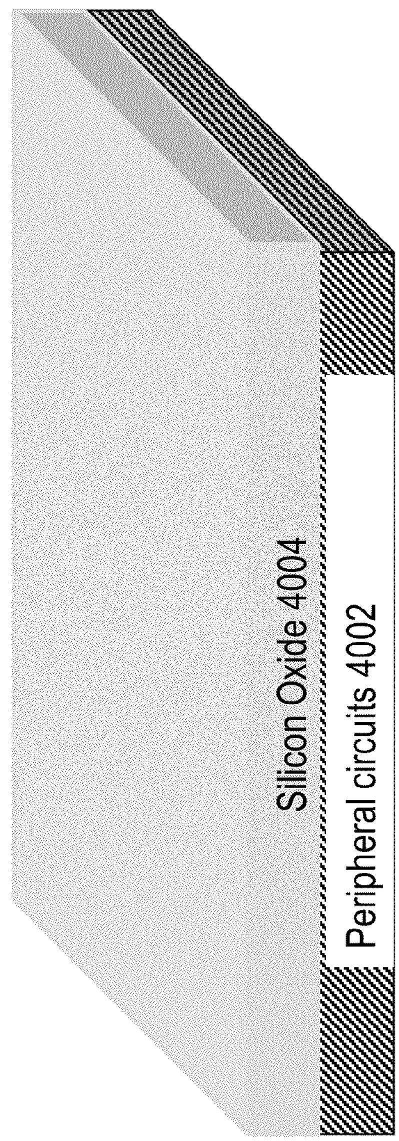
FIG. 40A-H show a one-mask per layer 3D horizontally-oriented floating-gate memory.

Step (A): Peripheral circuits 4002 are first constructed and above this a layer of silicon dioxide 4004 is deposited. FIG. 40A illustrates the structure after Step (A).

Figure 40B:
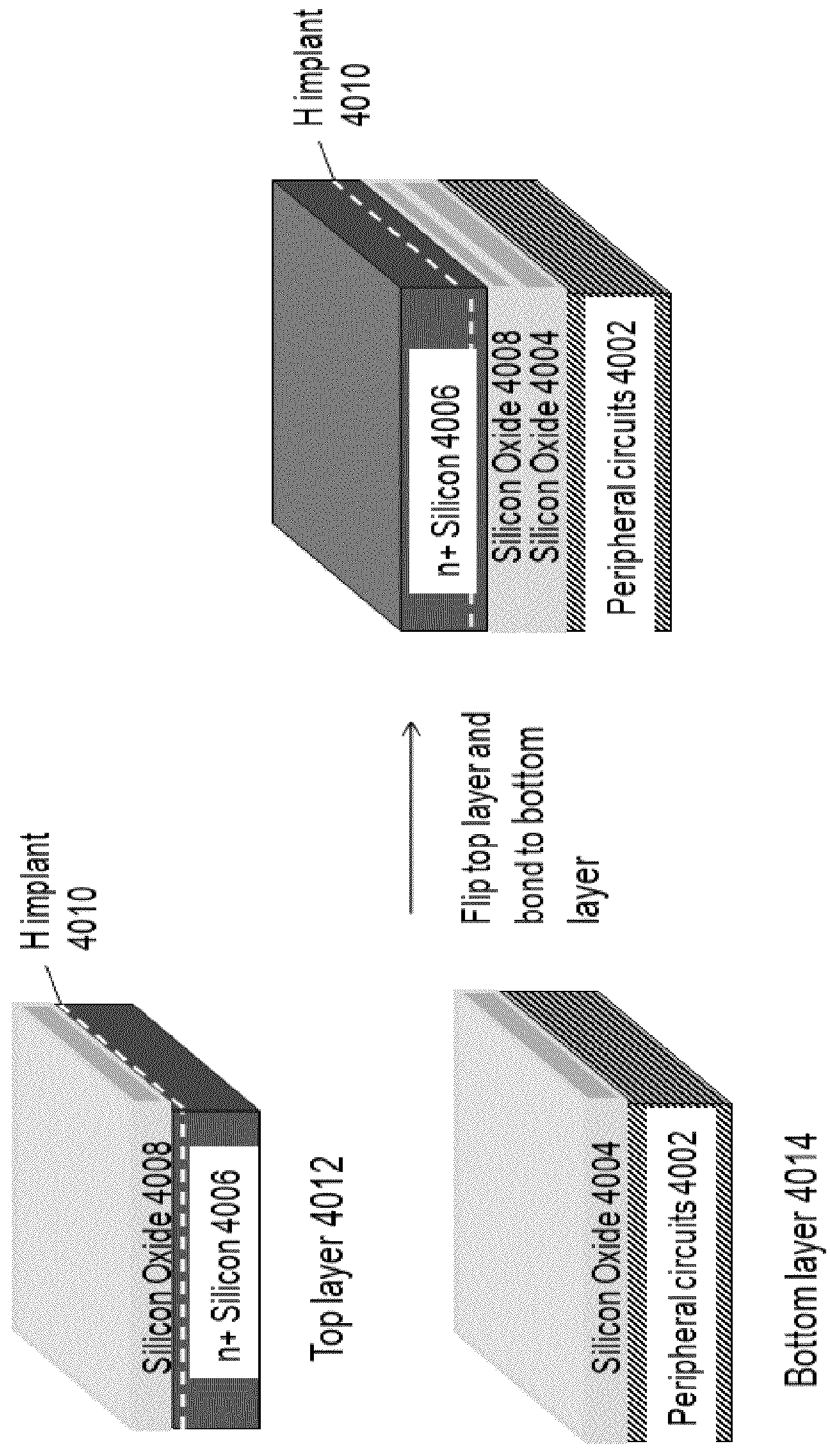

Step (B): FIG. 40B illustrates the structure after Step (B). A wafer of n+ Silicon 4008 has an oxide layer 4006 grown or deposited above it. Following this, hydrogen is implanted into the n+ Silicon wafer at a certain depth indicated by 4014. Alternatively, some other atomic species such as Helium could be implanted. This hydrogen implanted n+ Silicon wafer 4008 forms the top layer 4010. The bottom layer 4012 may include the peripheral circuits 4002 with oxide layer 4004. The top layer 4010 is flipped and bonded to the bottom layer 4012 using oxide-to-oxide bonding.

Figure 40C:
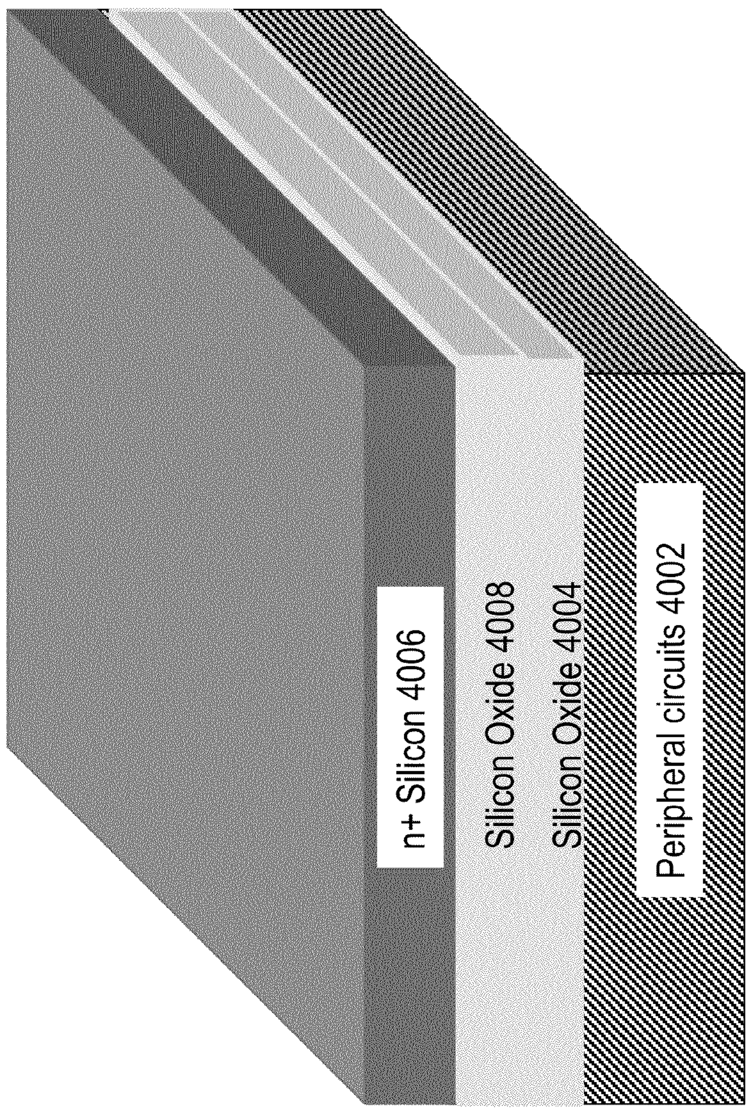

Step (C): FIG. 40C illustrates the structure after Step (C). The stack of top and bottom wafers after Step (B) is cleaved at the hydrogen plane 4014 using either a anneal or a sideways mechanical force or other means. A CMP process is then conducted. A layer of silicon oxide 4018 is then deposited atop the n+ Silicon layer 4016. At the end of this step, a single-crystal n+ Si layer 4016 exists atop the peripheral circuits, and this has been achieved using layer-transfer techniques.

Figure 40D:
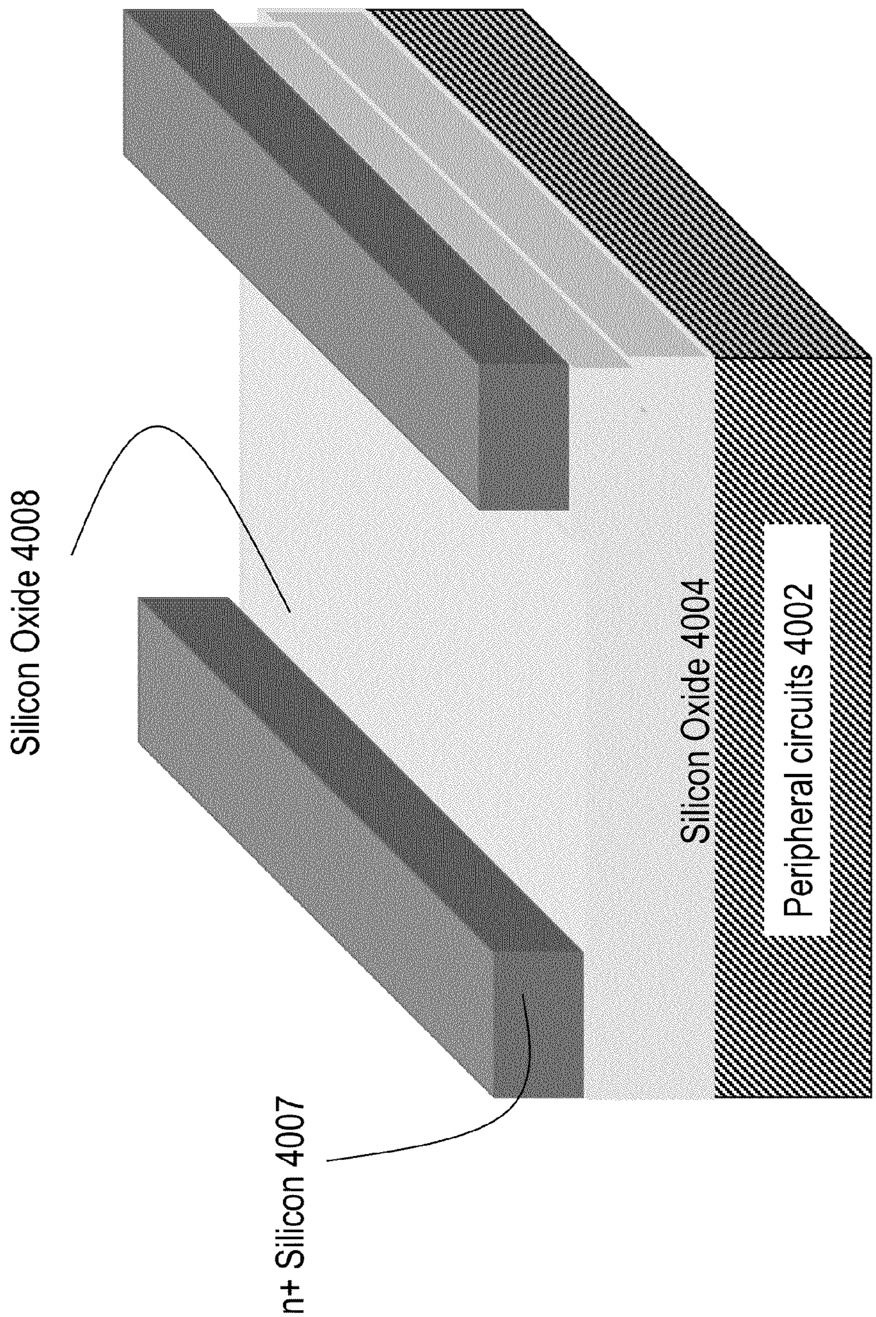

Step (D): FIG. 40D illustrates the structure after Step (D). Using lithography and etch, the n+ silicon layer 4007 is defined.

Figure 40E:
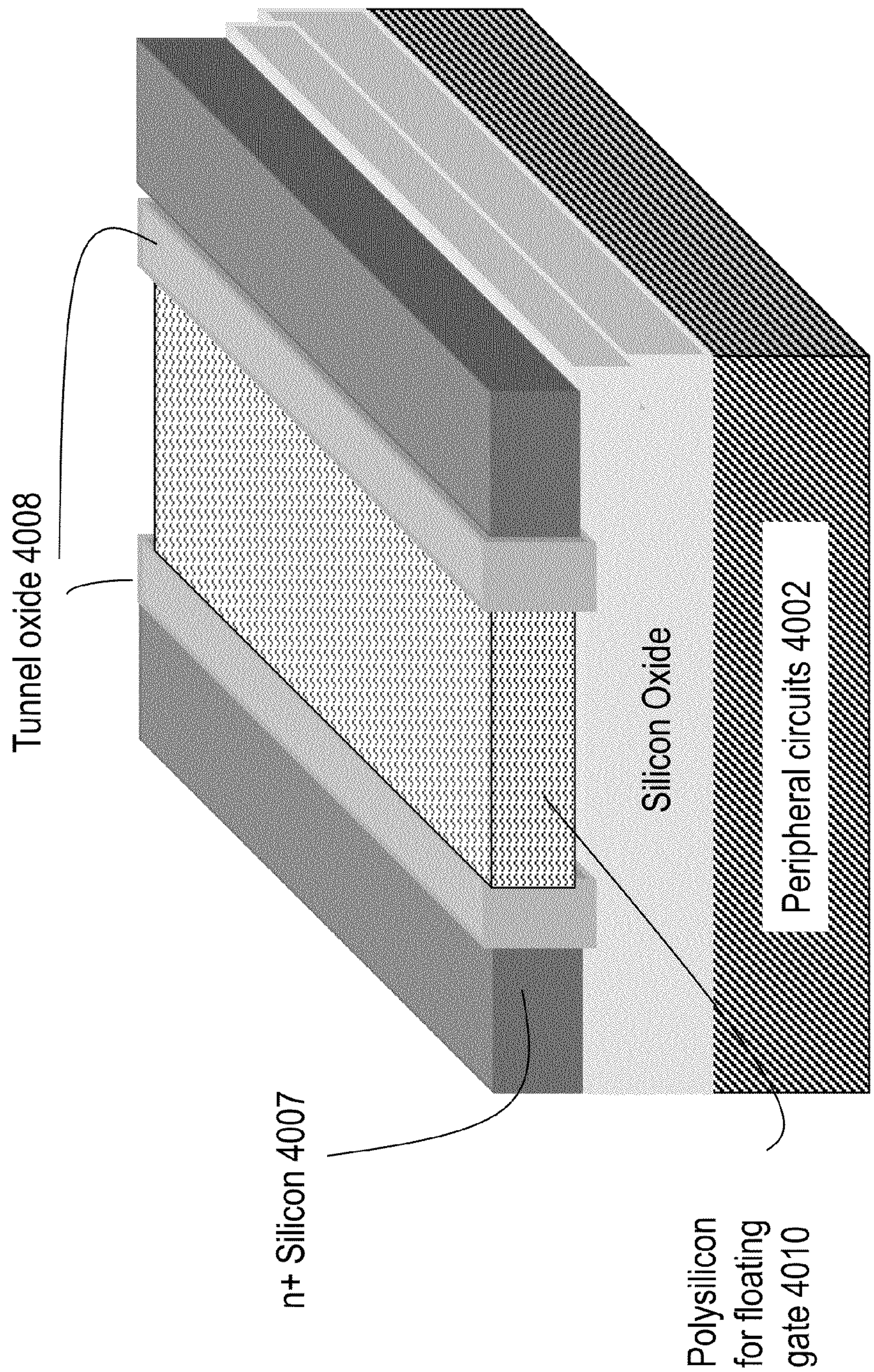

Step (E): FIG. 40E illustrates the structure after Step (E). A tunnel oxide layer 4008 is grown or deposited following which a polysilicon layer 4010 for forming future floating gates is deposited. A CMP process is conducted.

Figure 40F:
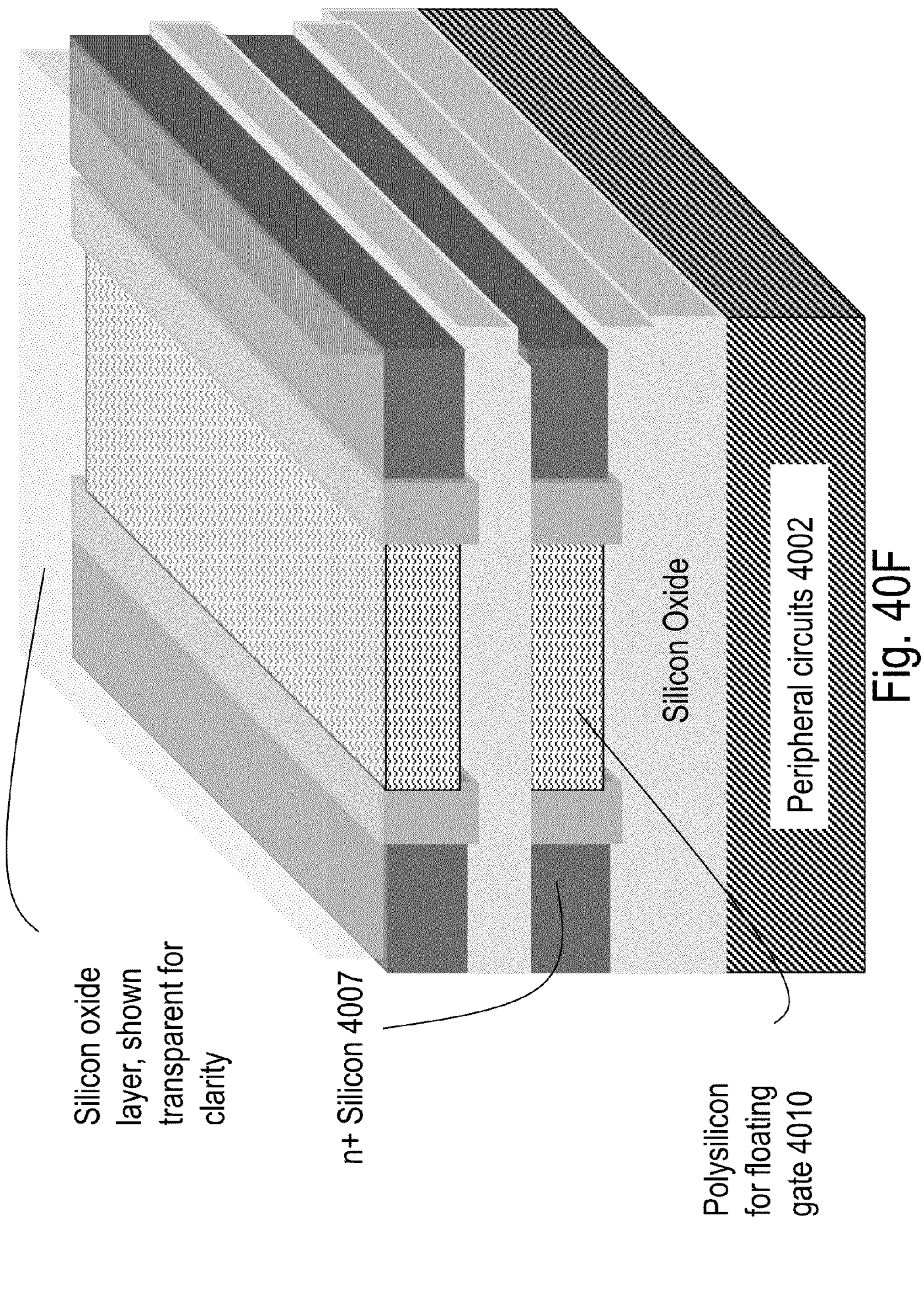

Step (F): FIG. 40F illustrates the structure after Step (F). Using similar procedures, multiple levels of memory are formed with oxide layers in between.

Figure 40G:
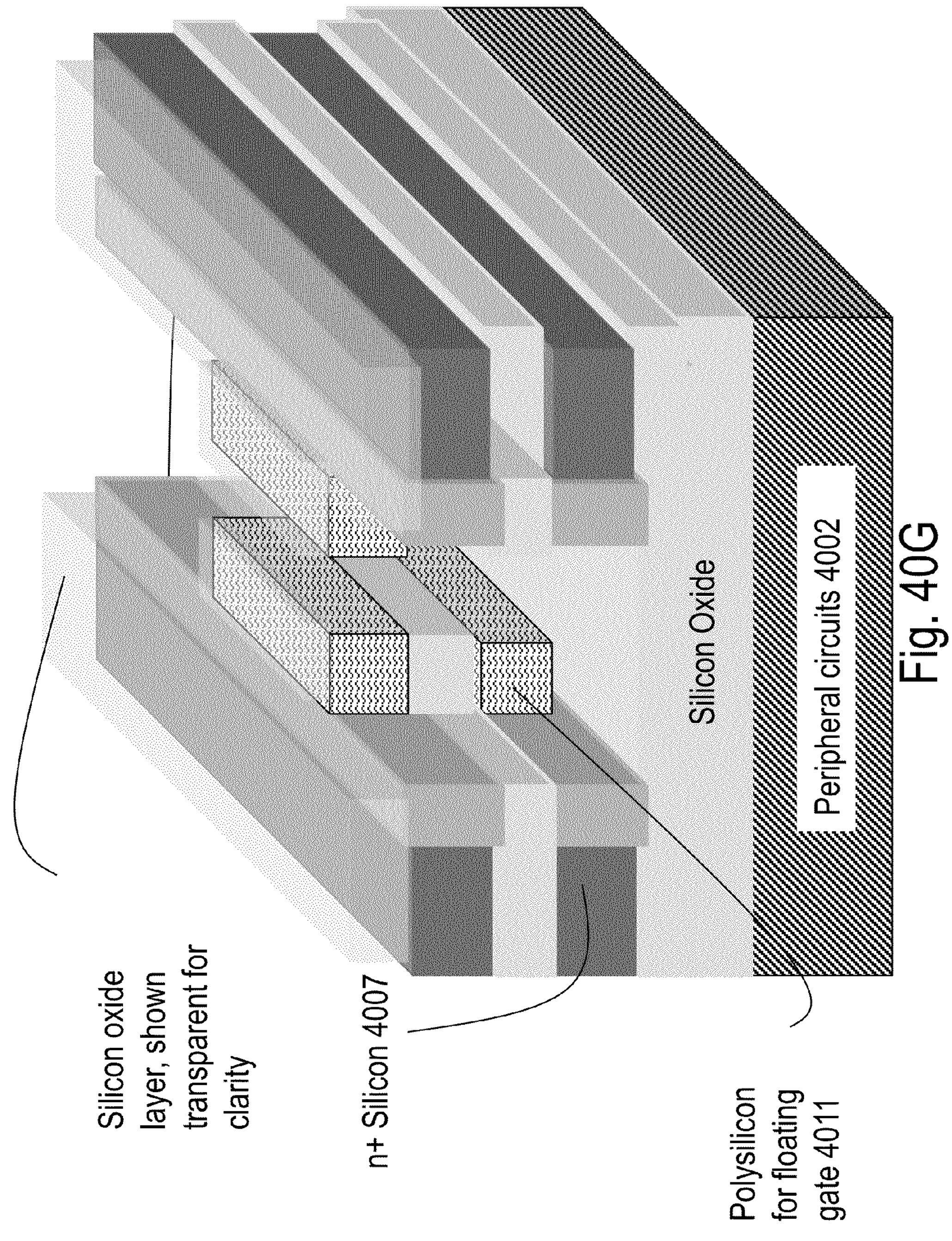

Step (G): FIG. 40G illustrates the structure after Step (G). The polysilicon region for floating gates 4010 is etched to form the polysilicon region 4011.

Figure 40H:
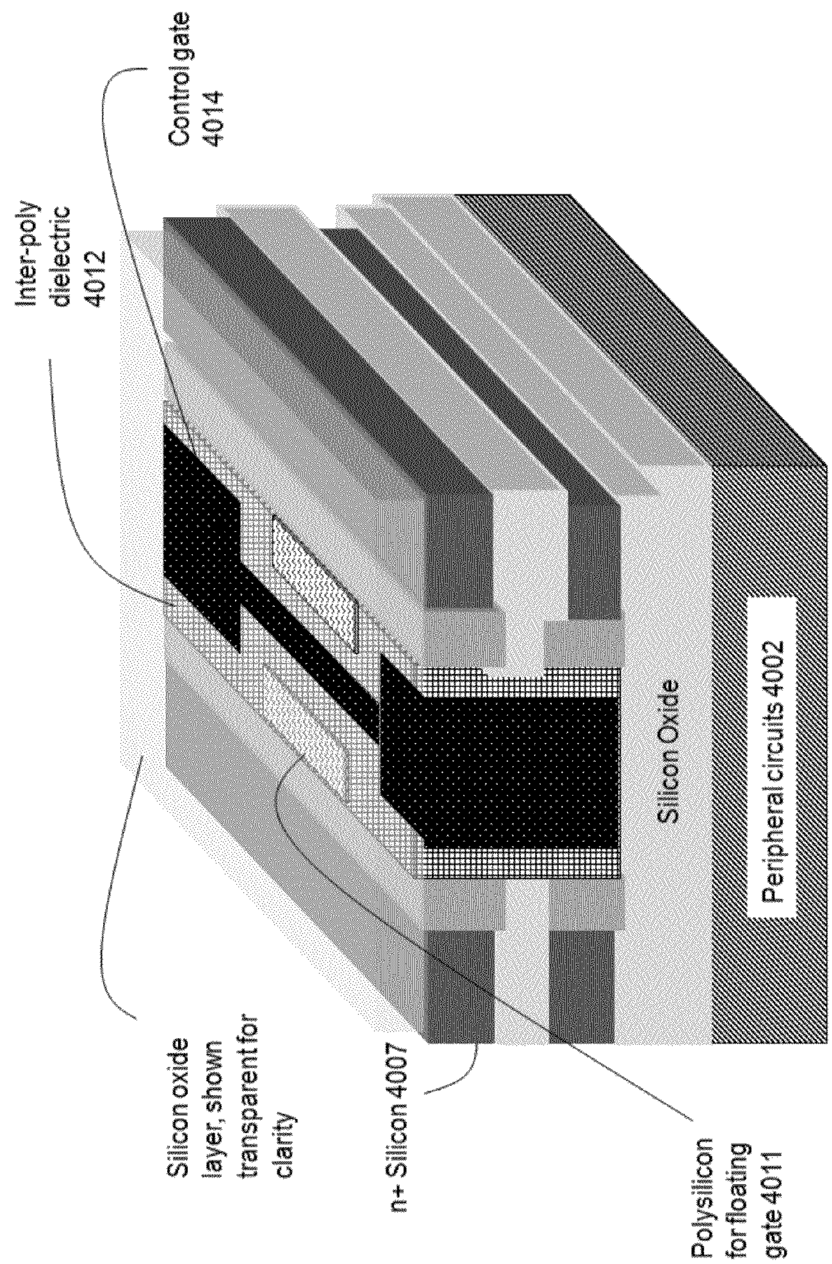

Step (H): FIG. 40H illustrates the structure after Step (H). Inter-poly dielectrics (IPD) 4012 and control gates 4014 are deposited and polished.

While the steps shown in FIG. 40A-H describe formation of a few floating gate transistors, it will be obvious to one skilled in the art that an array of floating-gate transistors can be constructed using similar techniques and well-known memory access/decoding schemes.

A 3D floating-gate memory has thus been constructed, with (1) horizontally-oriented transistors—i.e. current flowing in substantially the horizontal direction in transistor channels, (2) monocrystalline (or single-crystal) silicon layers obtained by layer transfer techniques such as ion-cut, (3) side gates that are simultaneously deposited over multiple memory layers for transistors, and (4) some of the memory cell control lines are in the same memory layer as the devices. The use of mono crystalline silicon (or single crystal silicon) layer obtained by ion-cut in (2) is a key differentiator for some embodiments of the current invention vis-à-vis prior work. Past work used selective epi technology or laser recrystallization or polysilicon.

Section 7: Alternative Implementations of various Monolithic 3D Memory Concepts

While the 3D DRAM and 3D resistive memory implementations in Section 3 and Section 4 have been described with single crystal silicon constructed with ion-cut technology, other options exist. One could construct them with selective epi technology. Procedures for doing these will be clear to those skilled in the art.

Various layer transfer schemes described in Section 1.3.4 can be utilized for constructing single-crystal silicon layers for memory architectures described in Section 3, Section 4, Section 5 and Section 6.

FIG. 41A-B show it is not the only option for the architecture, as depicted in FIG. 28-FIG. 40A-H, to have the peripheral transistors below the memory layers. Peripheral transistors could also be constructed above the memory layers, as shown in FIG. 41B. This periphery layer would utilize technologies described in Section 1 and Section 2, and could utilize junction-less transistors or recessed channel transistors.

The double gate devices shown in FIG. 28-FIG. 40A-H have both gates connected to each other. Each gate terminal may be controlled independently, which may lead to design advantages for memory chips.

One of the concerns with using n+ Silicon as a control line for 3D memory arrays is its high resistance. Using lithography and (single-step of multi-step) ion-implantation, one could dope heavily the n+ silicon control lines while not doping transistor gates, sources and drains in the 3D memory array. This preferential doping may mitigate the concern of high resistance.

Figure 42A:
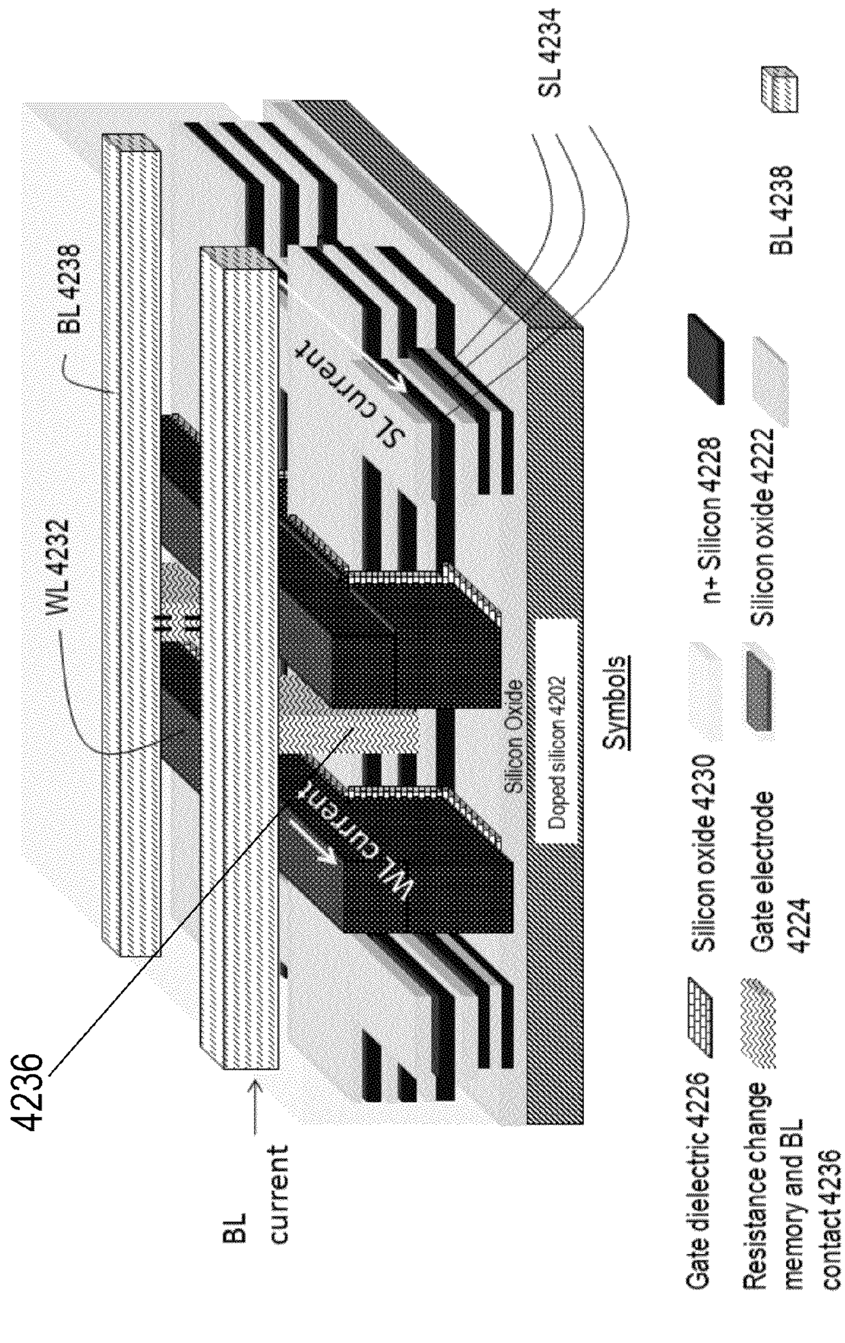
FIG. 42A-E show a method to make high-aspect ratio vias in 3D memory architectures.

In many of the described 3D memory approaches, etching and filling high aspect ratio vias forms a serious limitation. One way to circumvent this obstacle is by etching and filling vias from two sides of a wafer. A procedure for doing this is shown in FIG. 42A-E. Although FIG. 42A-E describe the process flow for a resistive memory implementation, similar processes can be used for DRAM, charge-trap memories and floating-gate memories as well. The process may include several steps that proceed in the following sequence:

Step (A): 3D resistive memories are constructed as shown in FIG. 34A-K but with a bare silicon wafer 4202 instead of a wafer with peripheral circuits on it. Due to aspect ratio limitations, the resistance change memory and BL contact 4236 can only be formed to the top layers of the memory, as illustrated in FIG. 42A.

Figure 42B:
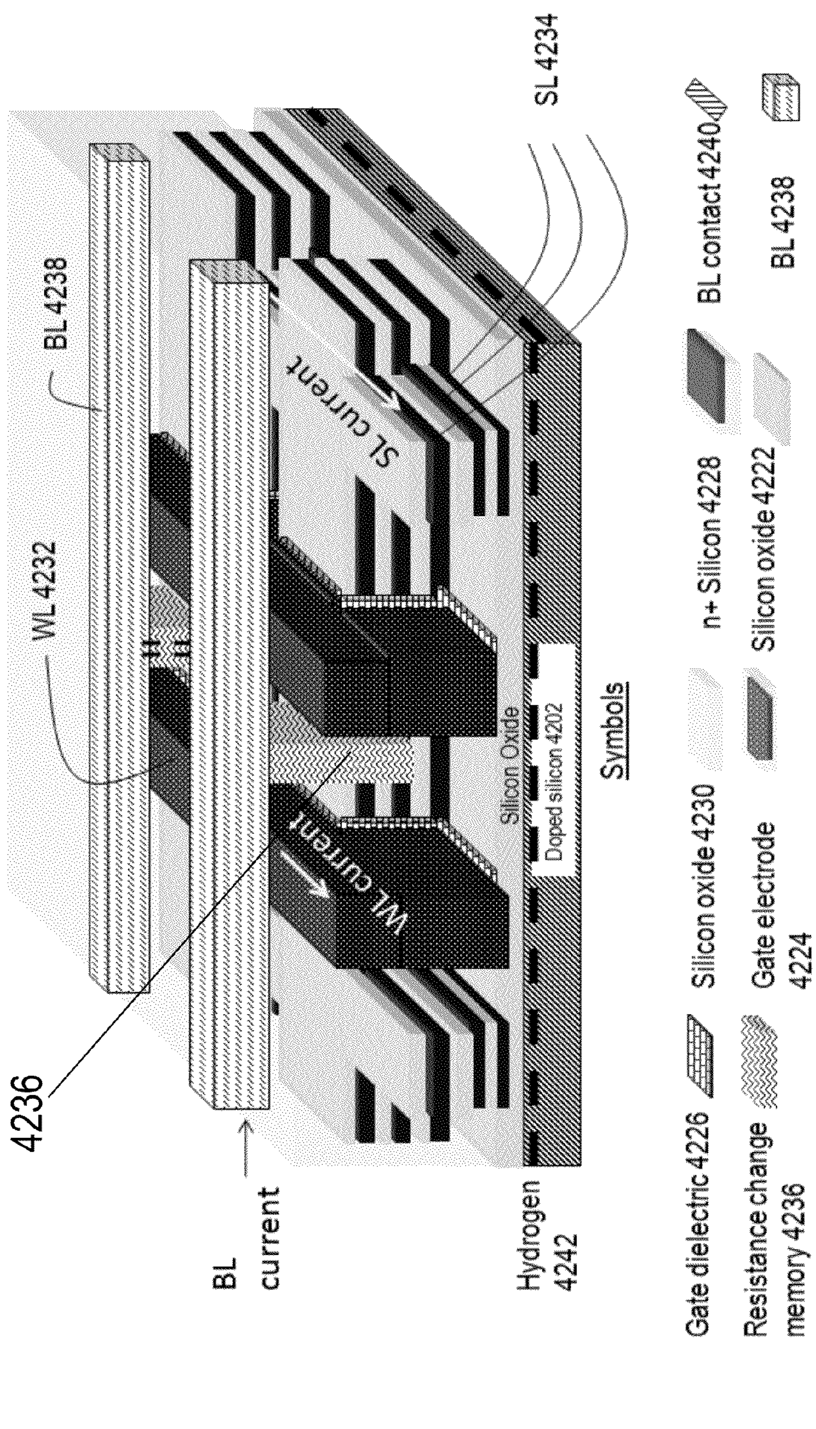

Step (B): Hydrogen is implanted into the wafer 4202 at a certain depth 4242. FIG. 42B illustrates the structure after Step B.

Figure 42C:
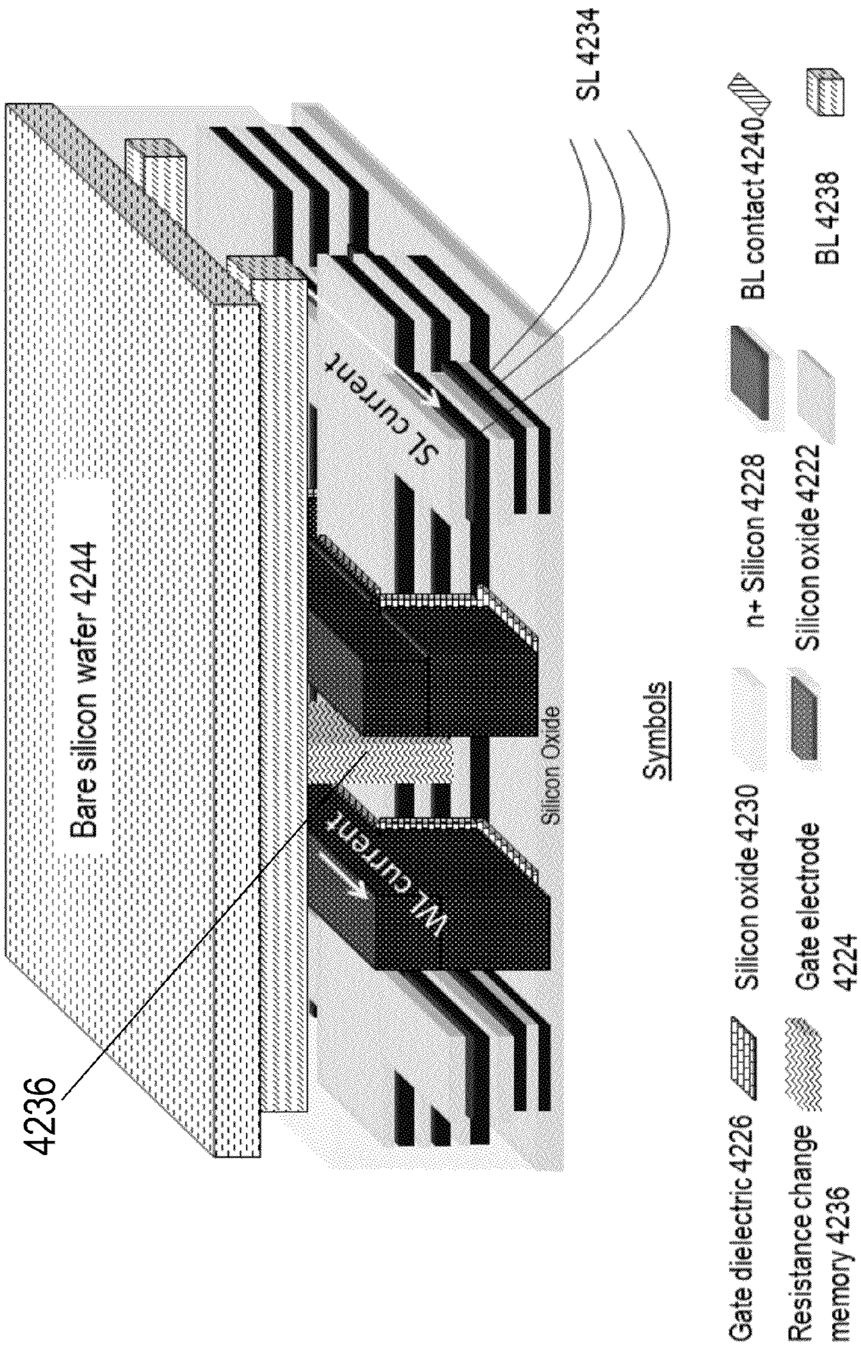

Step (C): The wafer with the structure after Step (B) is bonded to a bare silicon wafer 4244. Cleaving is then performed at the hydrogen implant plane 4242. A CMP process is conducted to polish off the silicon wafer. FIG. 42C illustrates the structure after Step C.

Figure 42D:
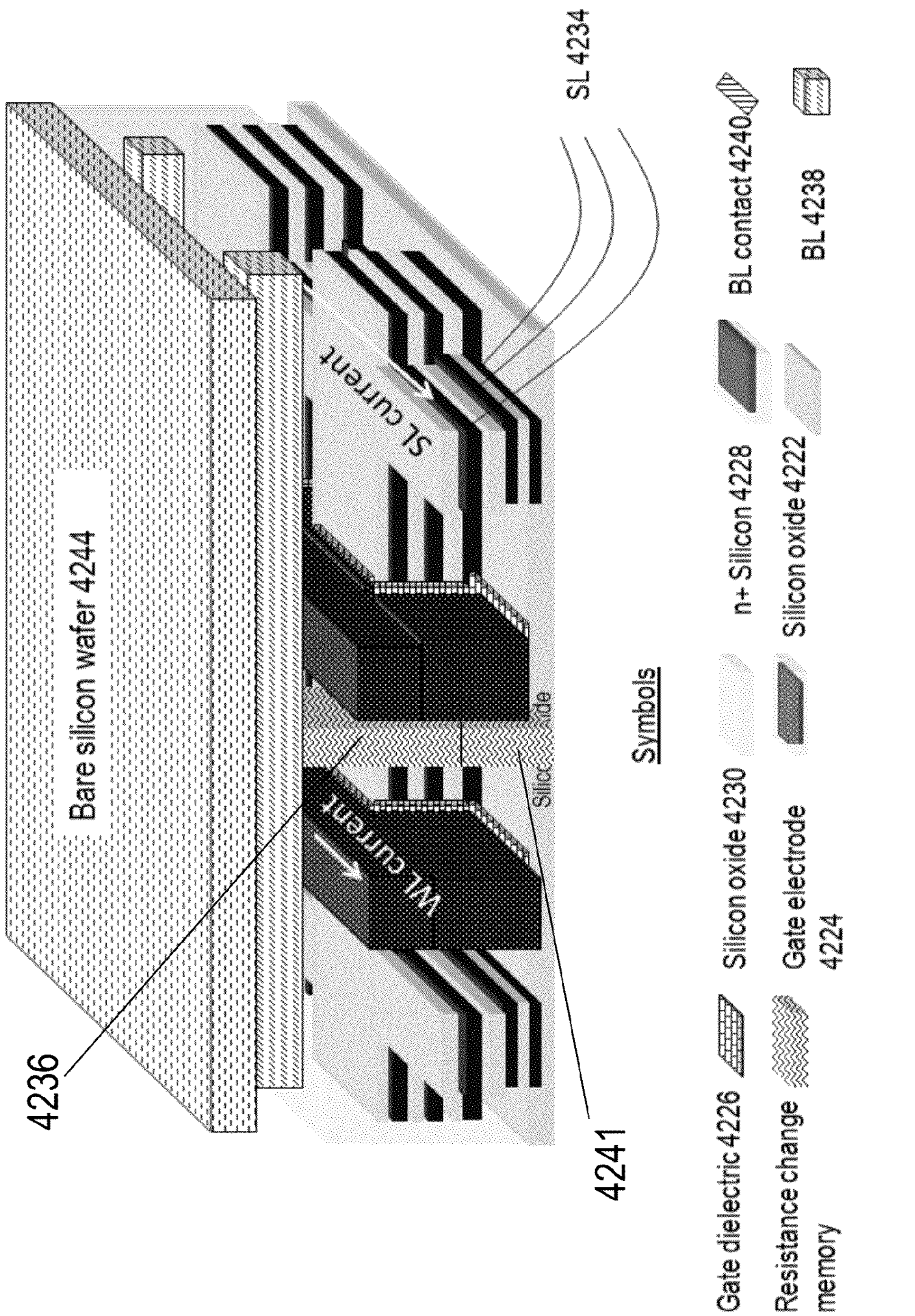

Step (D): Resistance change memory material and BL contact layers 4241 are constructed for the bottom memory layers. They connect to the partially made top BL contacts 4236 with state-of-the-art alignment. FIG. 42D illustrates the structure after Step D.

Figure 42E:
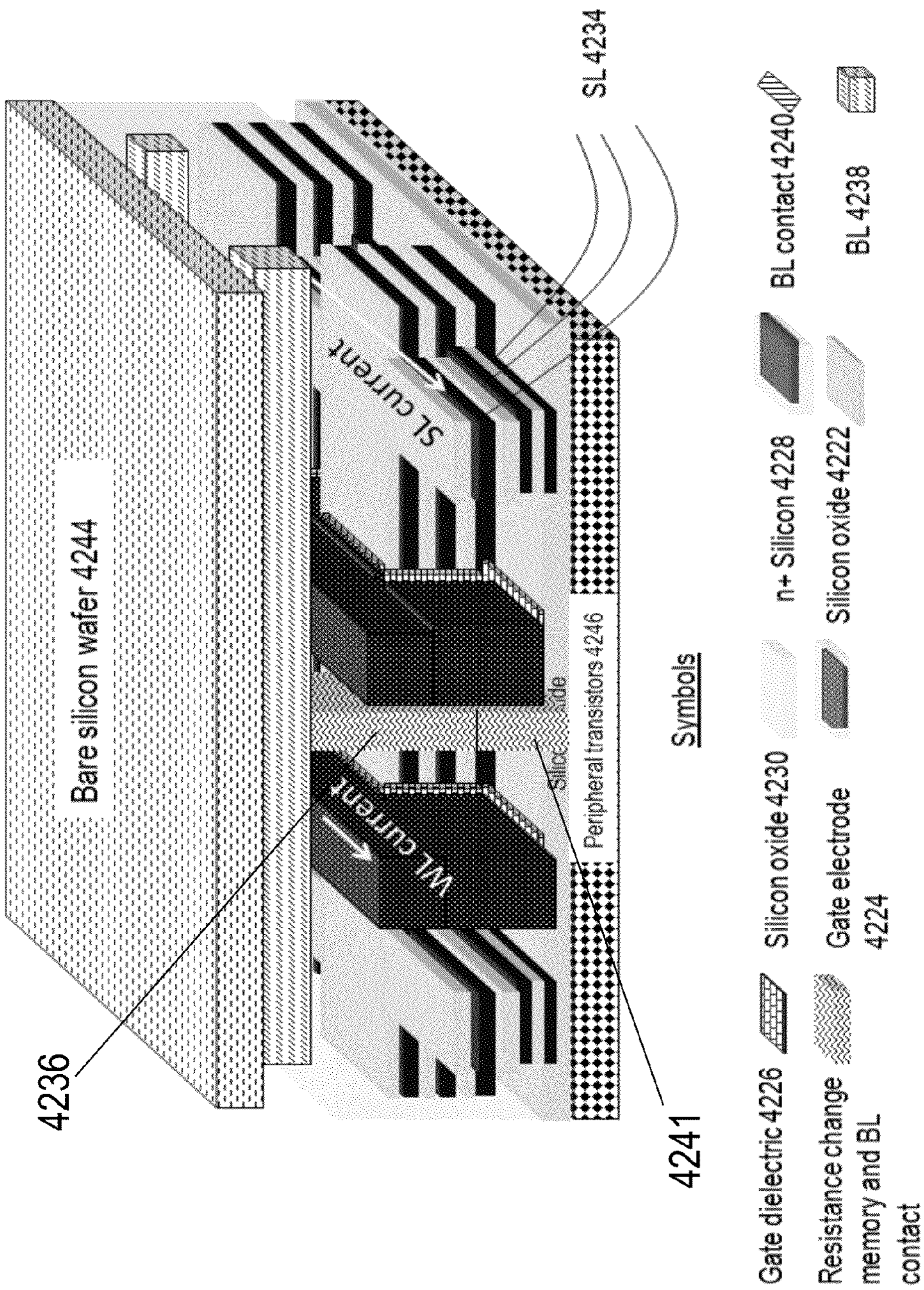

Step (E): Peripheral transistors 4246 are constructed using procedures shown previously in this document. FIG. 42E illustrates the structure after Step E. Connections are made to various wiring layers.

The charge-trap and floating-gate architectures shown in FIG. 36A-F-FIG. 40A-H are based on NAND flash memory. It will be obvious to one skilled in the art that these architectures can be modified into a NOR flash memory style as well.

Section 8: Poly-Silicon-Based Implementation of Various Memory Concepts

The monolithic 3D integration concepts described in this patent application can lead to novel embodiments of poly-silicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 50A:
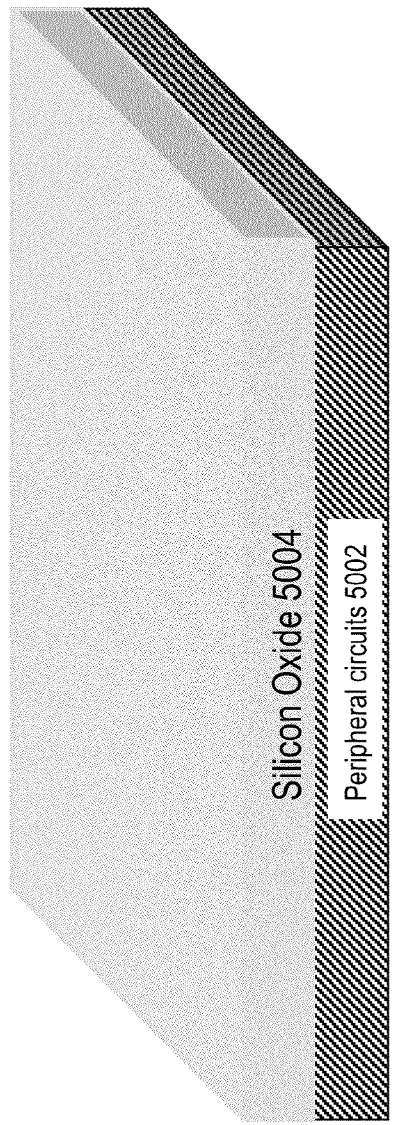
FIG. 50A-E show polysilicon select devices for 3D memory and peripheral circuits at the bottom according to some embodiments of the current invention.

FIG. 50A-E shows one embodiment of the current invention, where polysilicon junctionless transistors are used to form a 3D resistance-based memory. The utilized junction-less transistors can have either positive or negative threshold voltages. The process may include the following steps as described in the following sequence:

Step (A): As illustrated in FIG. 50A, peripheral circuits 5002 are constructed above which a layer of silicon dioxide 5004 is made.

Figure 50B:
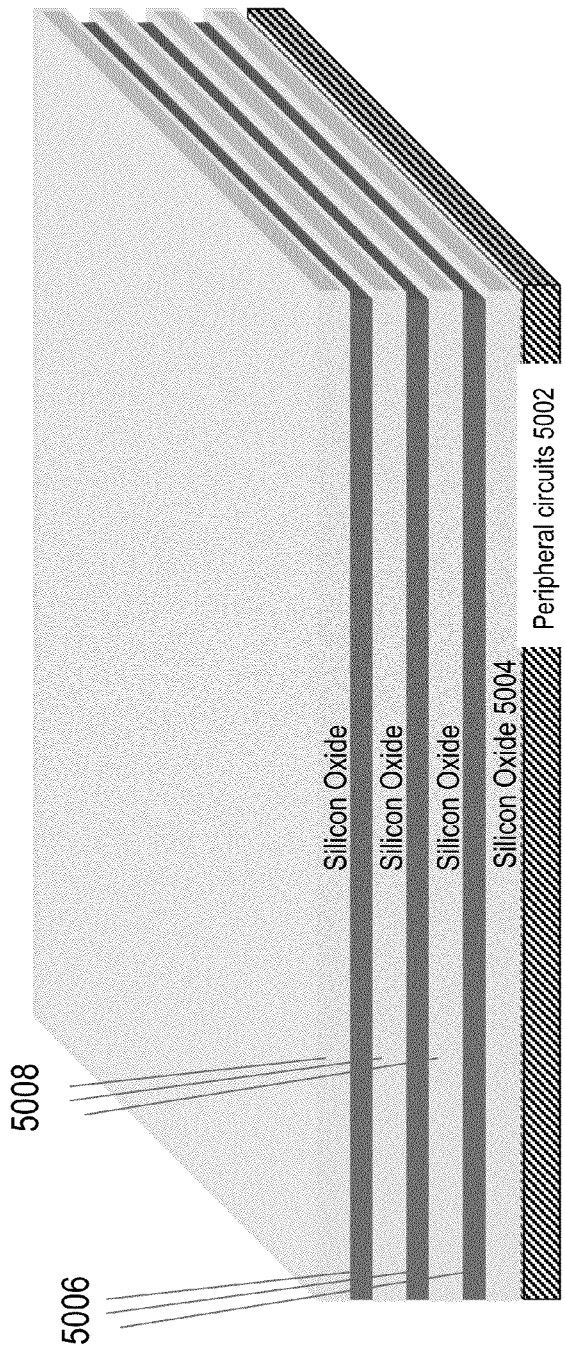

Step (B): As illustrated in FIG. 50B, multiple layers of n+ doped amorphous silicon or polysilicon 5006 are deposited with layers of silicon dioxide 5008 in between. The amorphous silicon or polysilicon layers 5006 could be deposited using a chemical vapor deposition process, such as LPCVD or PECVD.

Figure 50C:
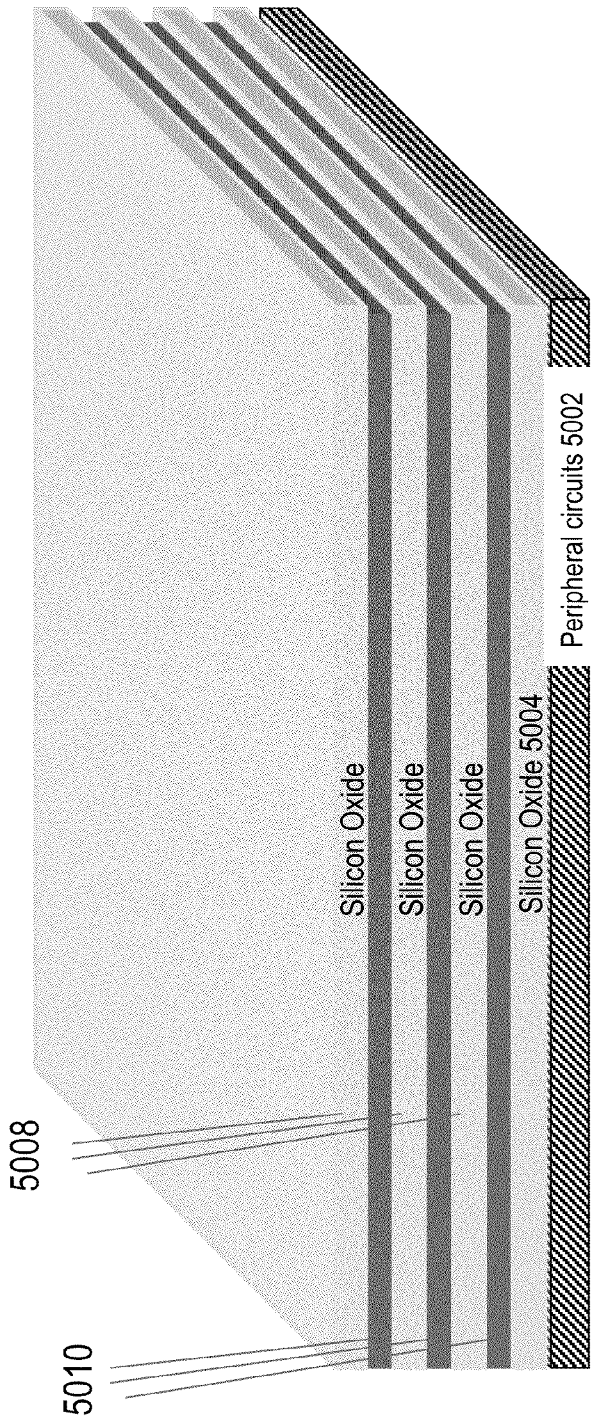

Step (C): As illustrated in FIG. 50C, a Rapid Thermal Anneal (RTA) is conducted to crystallize the layers of polysilicon or amorphous silicon deposited in Step (B). Temperatures during this RTA could be as high as 500° C. or more, and could even be as high as 800° C. The polysilicon region obtained after Step (C) is indicated as 5010. Alternatively, a laser anneal could be conducted, either for all layers 5006 at the same time or layer by layer. The thickness of the oxide 5004 would need to be optimized if that process were conducted.

Figure 50D:
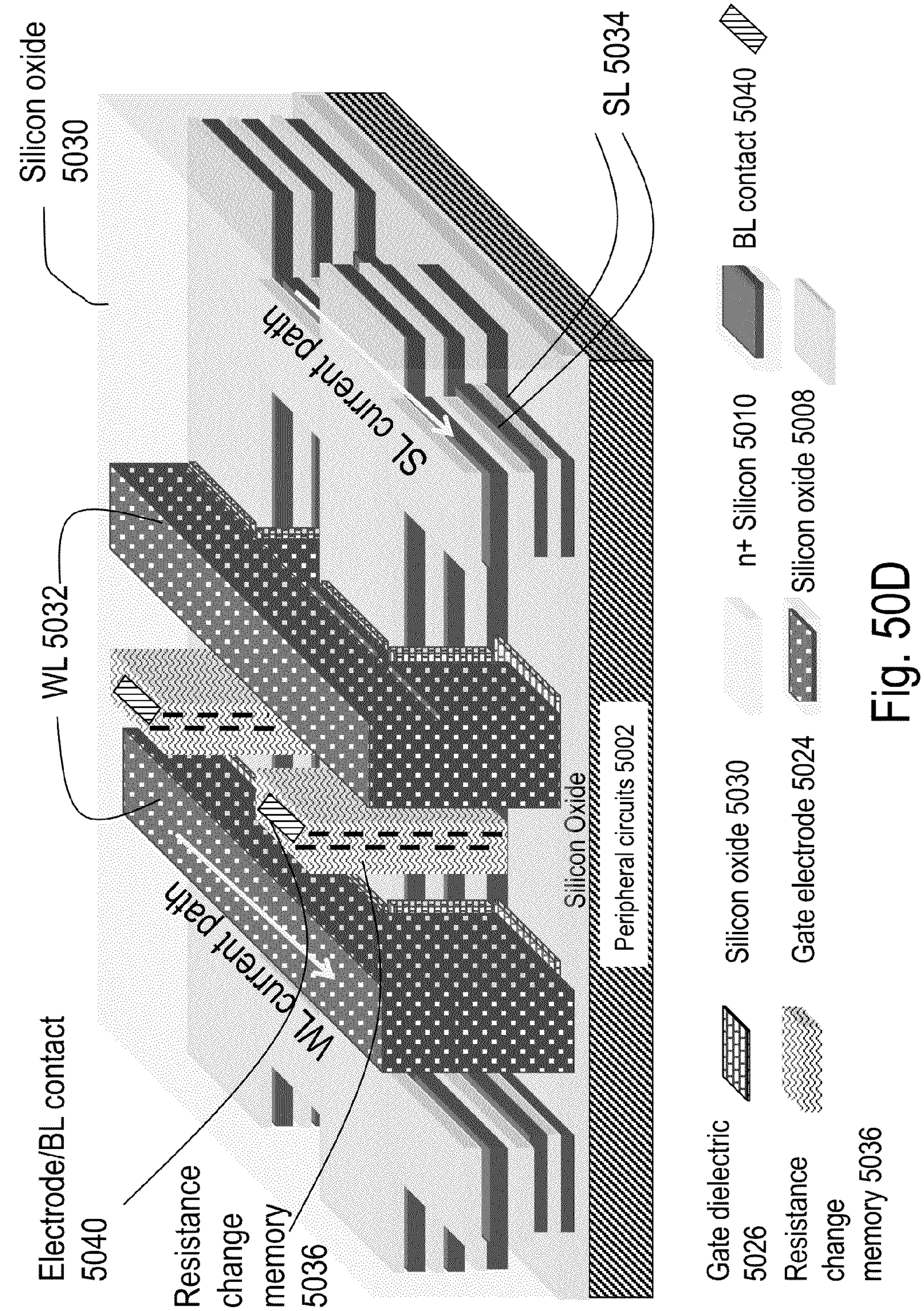

Step (D): As illustrated in FIG. 50D, procedures similar to those described in FIG. 32E-H are utilized to construct the structure shown. The structure in FIG. 50D has multiple levels of junction-less transistor selectors for resistive memory devices. The resistance change memory is indicated as 5036 while its electrode and contact to the BL is indicated as 5040. The WL is indicated as 5032, while the SL is indicated as 5034. Gate dielectric of the junction-less transistor is indicated as 5026 while the gate electrode of the junction-less transistor is indicated as 5024, this gate electrode also serves as part of the WL 5032.

Figure 50E:
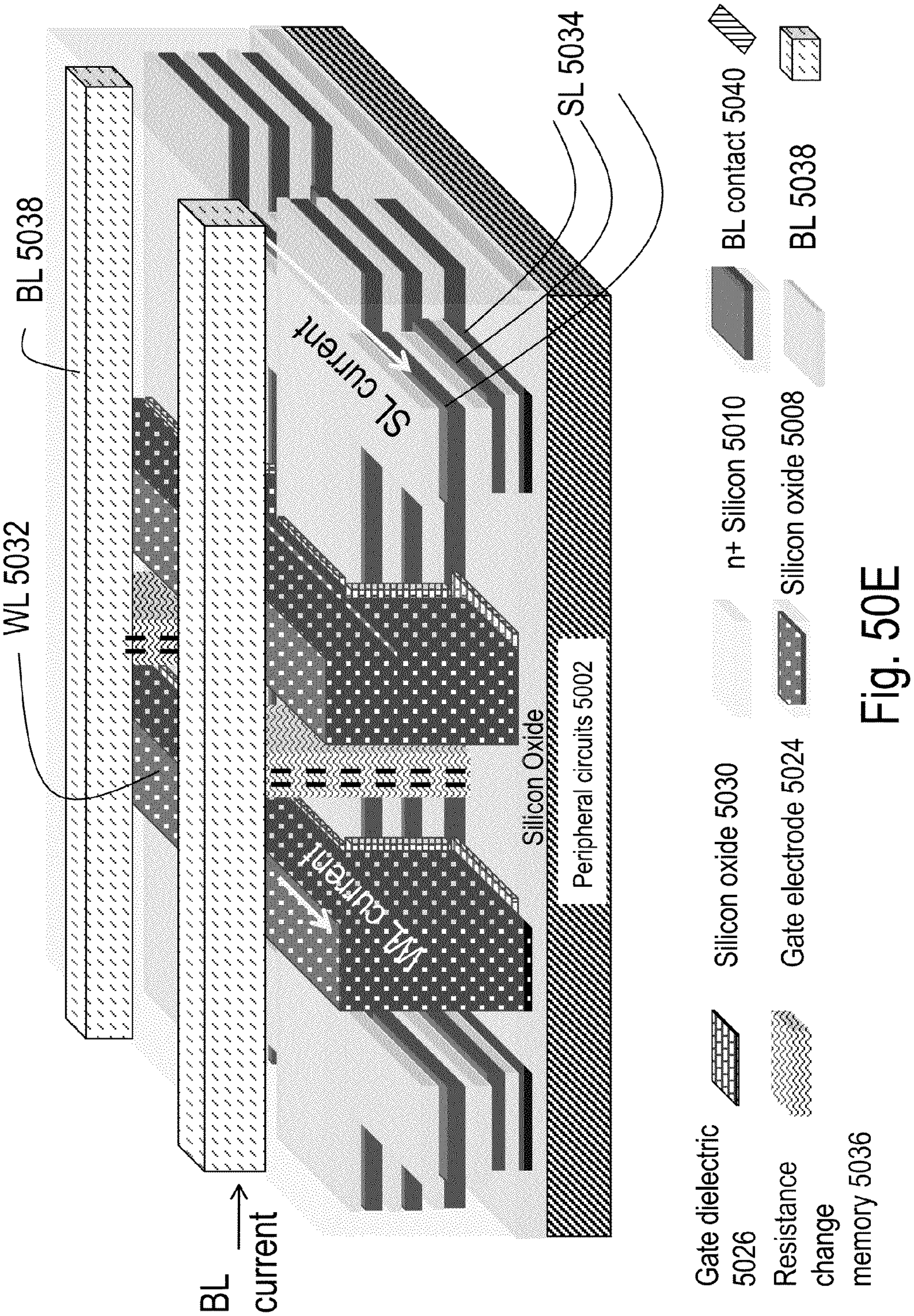

Step (E): As illustrated in FIG. 50E, bit lines (indicated as BL 5038) are constructed. Contacts are then made to peripheral circuits and various parts of the memory array as described in embodiments described previously.

Figure 51A:
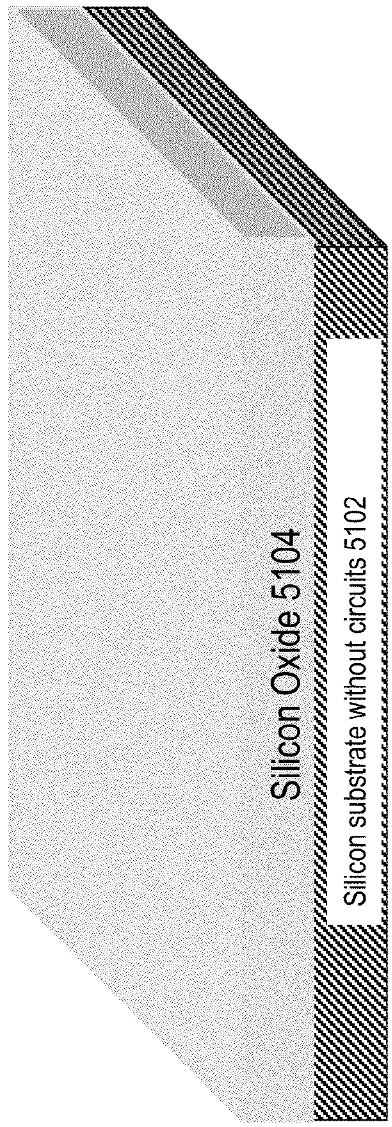
FIG. 51A-F show polysilicon select devices for 3D memory and peripheral circuits at the top according to some embodiments of the current invention.

FIG. 51A-F show another embodiment of the current invention, where polysilicon junction-less transistors are used to form a 3D resistance-based memory. The utilized junction-less transistors can have either positive or negative threshold voltages. The process may include the following steps occurring in sequence:

Step (A): As illustrated in FIG. 51A, a layer of silicon dioxide 5104 is deposited or grown above a silicon substrate without circuits 5102.

Figure 51B:
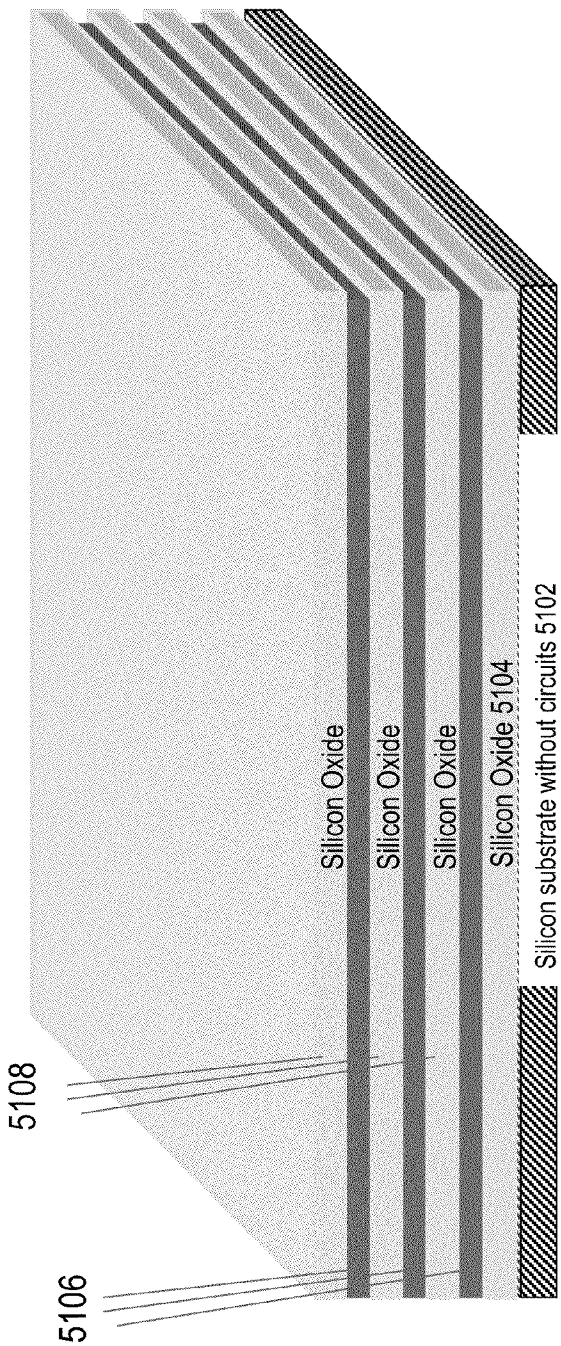

Step (B): As illustrated in FIG. 51B, multiple layers of n+ doped amorphous silicon or polysilicon 5106 are deposited with layers of silicon dioxide 5108 in between. The amorphous silicon or polysilicon layers 5106 could be deposited using a chemical vapor deposition process, such as LPCVD or PECVD abbreviated as above.

Figure 51C:
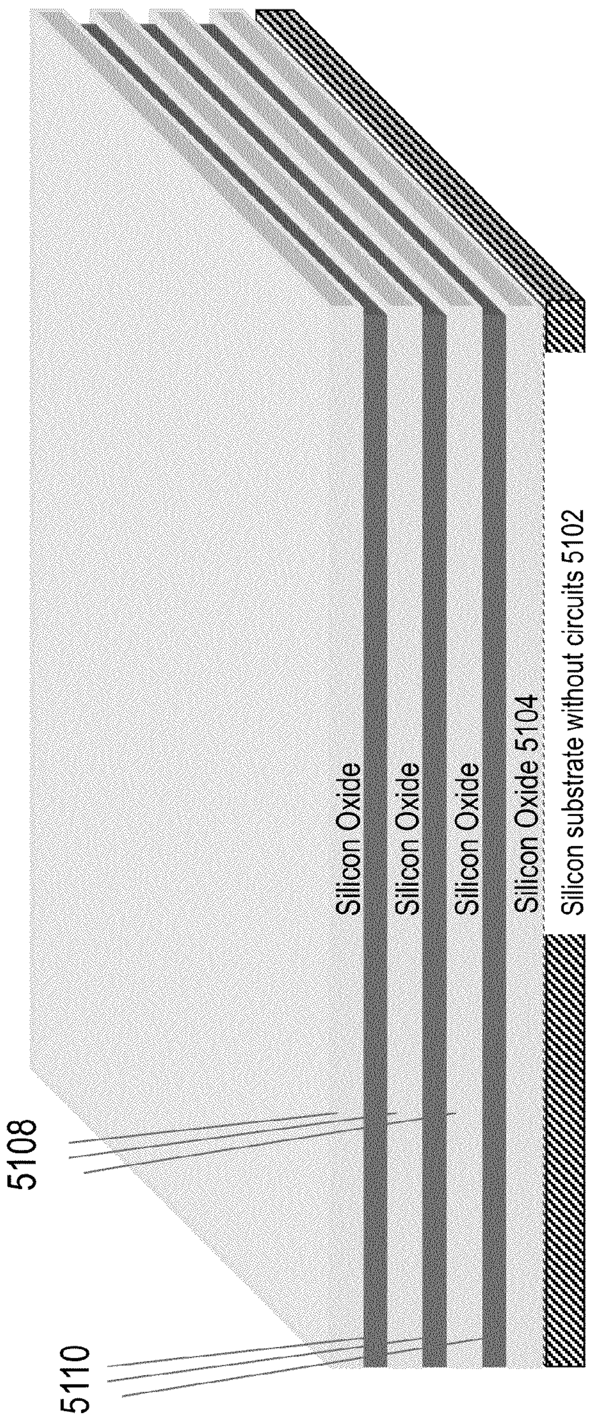

Step (C): As illustrated in FIG. 51C, a Rapid Thermal Anneal (RTA) or standard anneal is conducted to crystallize the layers of polysilicon or amorphous silicon deposited in Step (B). Temperatures during this RTA could be as high as 700° C. or more, and could even be as high as 1400° C. The polysilicon region obtained after Step (C) is indicated as 5110. Since there are no circuits under these layers of polysilicon, very high temperatures (such as 1400° C.) can be used for the anneal process, leading to very good quality polysilicon with few grain boundaries and very high mobilities approaching those of single crystal silicon. Alternatively, a laser anneal could be conducted, either for all layers 5106 at the same time or layer by layer at different times.

Figure 51D:
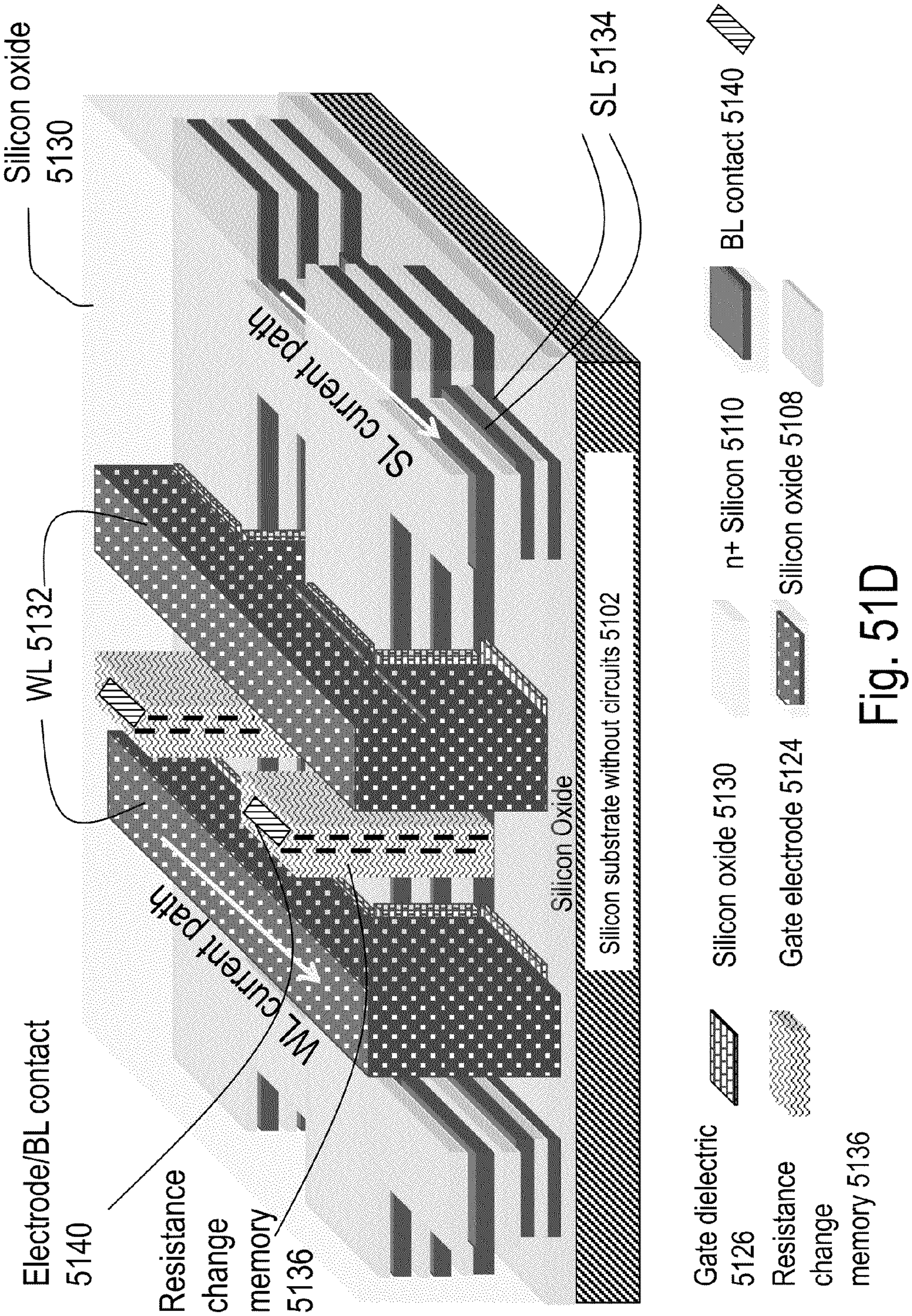

Step (D): This is illustrated in FIG. 51D. Procedures similar to those described in FIG. 32E-H are utilized to get the structure shown in FIG. 51D that has multiple levels of junctionless transistor selectors for resistive memory devices. The resistance change memory is indicated as 5136 while its electrode and contact to the BL is indicated as 5140. The WL is indicated as 5132, while the SL is indicated as 5134. Gate dielectric of the junction-less transistor is indicated as 5126 while the gate electrode of the junction-less transistor is indicated as 5124, this gate electrode also serves as part of the WL 5132.

Figure 51E:
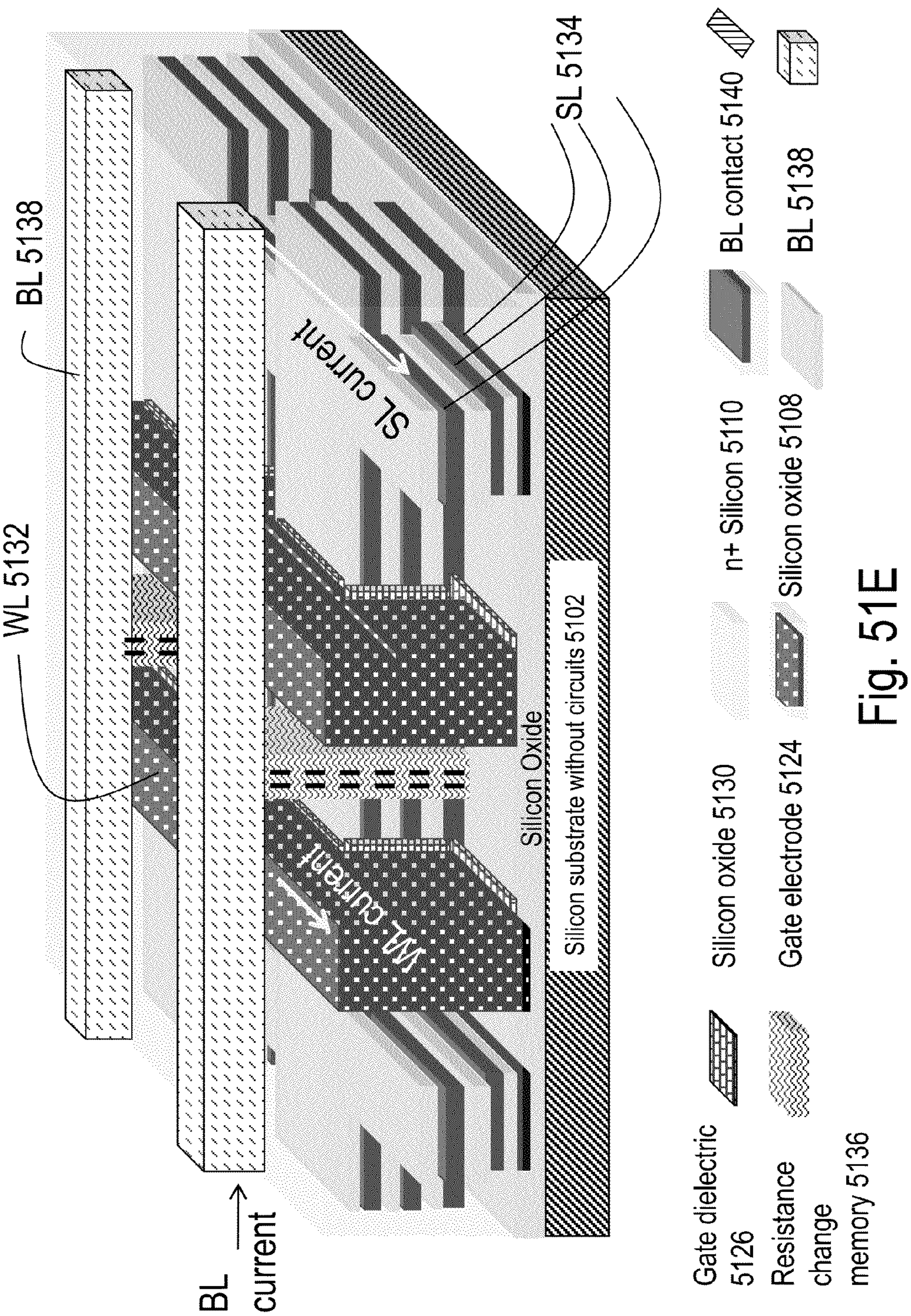
Figure 51F:
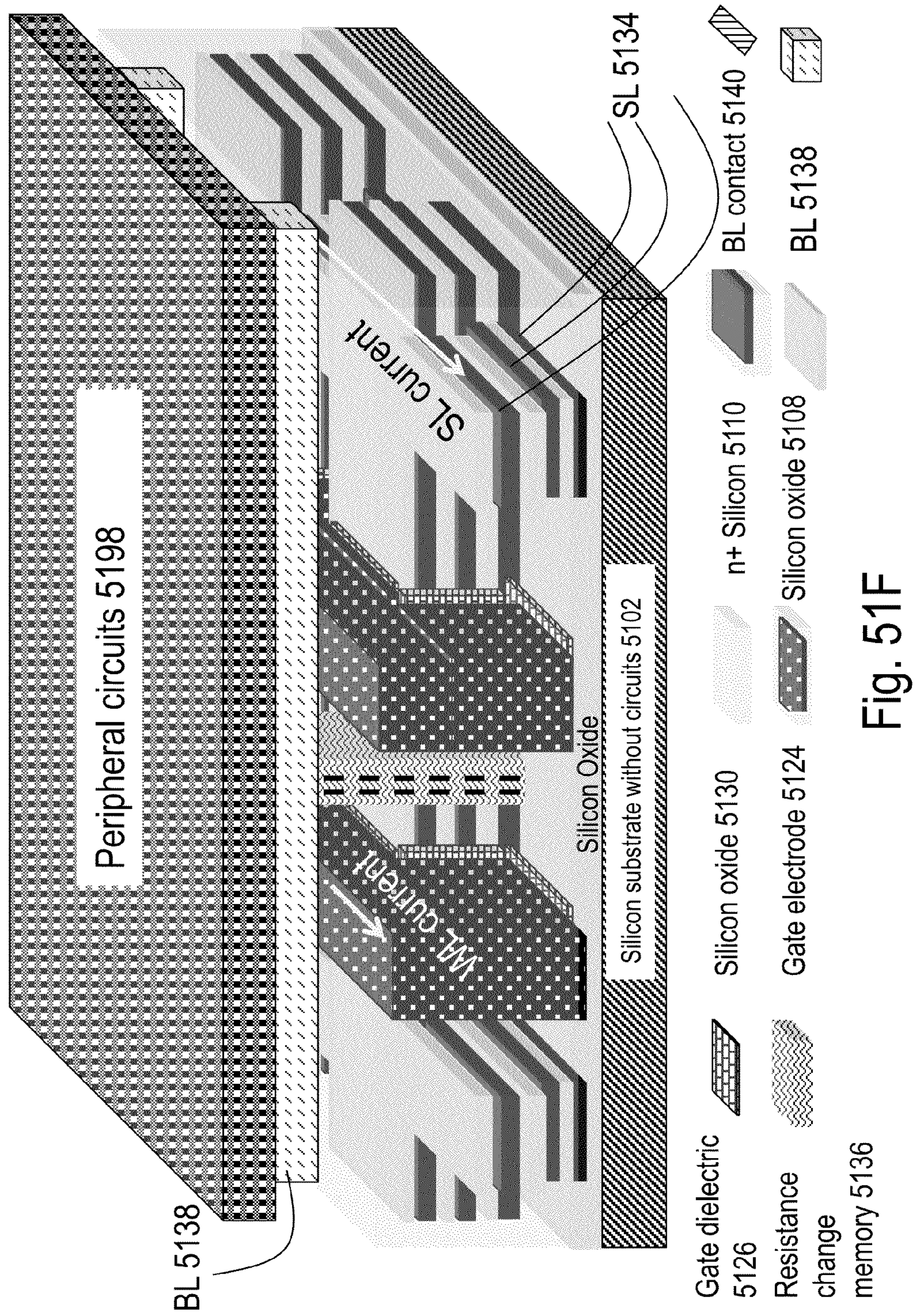

Step (E): This is illustrated in FIG. 51E. Bit lines (indicated as BL 5138) are constructed. Contacts are then made to peripheral circuits and various parts of the memory array as described in embodiments described previously.

Step (F): Using procedures described in Section 1 and Section 2 of this patent application, peripheral circuits 5198 (with transistors and wires) could be formed well aligned to the multiple memory layers shown in Step (E). For the periphery, one could use the process flow shown in Section 2 where replacement gate processing is used, or one could use sub-400° C. processed transistors such as junction-less transistors or recessed channel transistors. Alternatively, one could use laser anneals for peripheral transistors' source-drain processing. Various other procedures described in Section 1 and Section 2 could also be used. Connections can then be formed between the multiple memory layers and peripheral circuits. By proper choice of materials for memory layer transistors and memory layer wires (e.g., by using tungsten and other materials that withstand high temperature processing for wiring), even standard transistors processed at high temperatures (>1000° C.) for the periphery could be used.

Section 9: Monolithic 3D SRAM

The techniques described in this patent application can be used for constructing monolithic 3D SRAMs as well.

FIG. 52A-D represent SRAM embodiment of the current invention, where ion-cut is utilized for constructing a monolithic 3D SRAM. Peripheral circuits are first constructed on a silicon substrate, and above this, two layers of nMOS transistors and one layer of pMOS transistors are formed using ion-cut and procedures described earlier in this patent application. Implants for each of these layers are performed when the layers are being constructed, and finally, after all layers have been constructed, a RTA is conducted to activate dopants. If high k dielectrics are utilized for this process, a gate-first approach may be preferred.

Figure 52A:
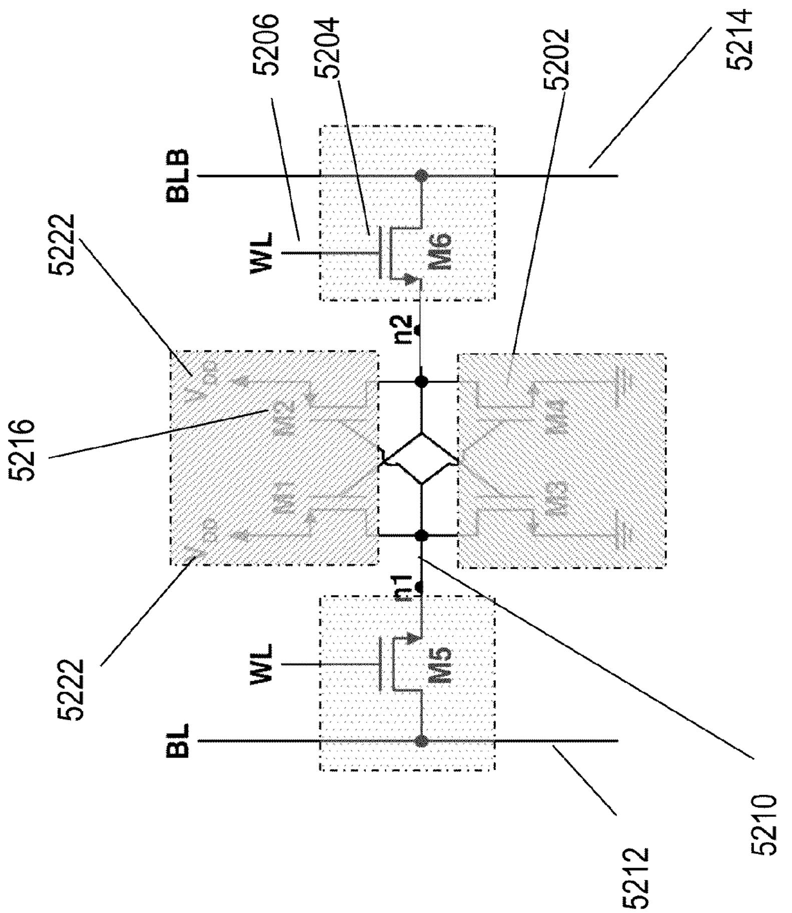
FIG. 52A-D show a monolithic 3D SRAM according to some embodiments of the current invention.

FIG. 52A shows a standard six-transistor SRAM cell according to one embodiment of the current invention. There are two pull-down nMOS transistors, and 5202 represents a pull-down nMOS transistor in FIG. 52A-D. There are also two pull-up pMOS transistors, each of which is represented by 5216. There are two nMOS pass transistors 5204 connecting bit-line wiring 5212 and bit line complement wiring 5214 to the pull-up transistors 5216 and pull-down transistors 5202, and these are represented by 5214. Gates of nMOS pass transistors 5214 are represented by 5206 and are connected to word-lines (WL) using WL contacts 5208. Supply voltage VDD is denoted as 5222 while ground voltage GND is denoted as 5224. Nodes n1 and n2 within the SRAM cell are represented as 5210.

Figure 52B:
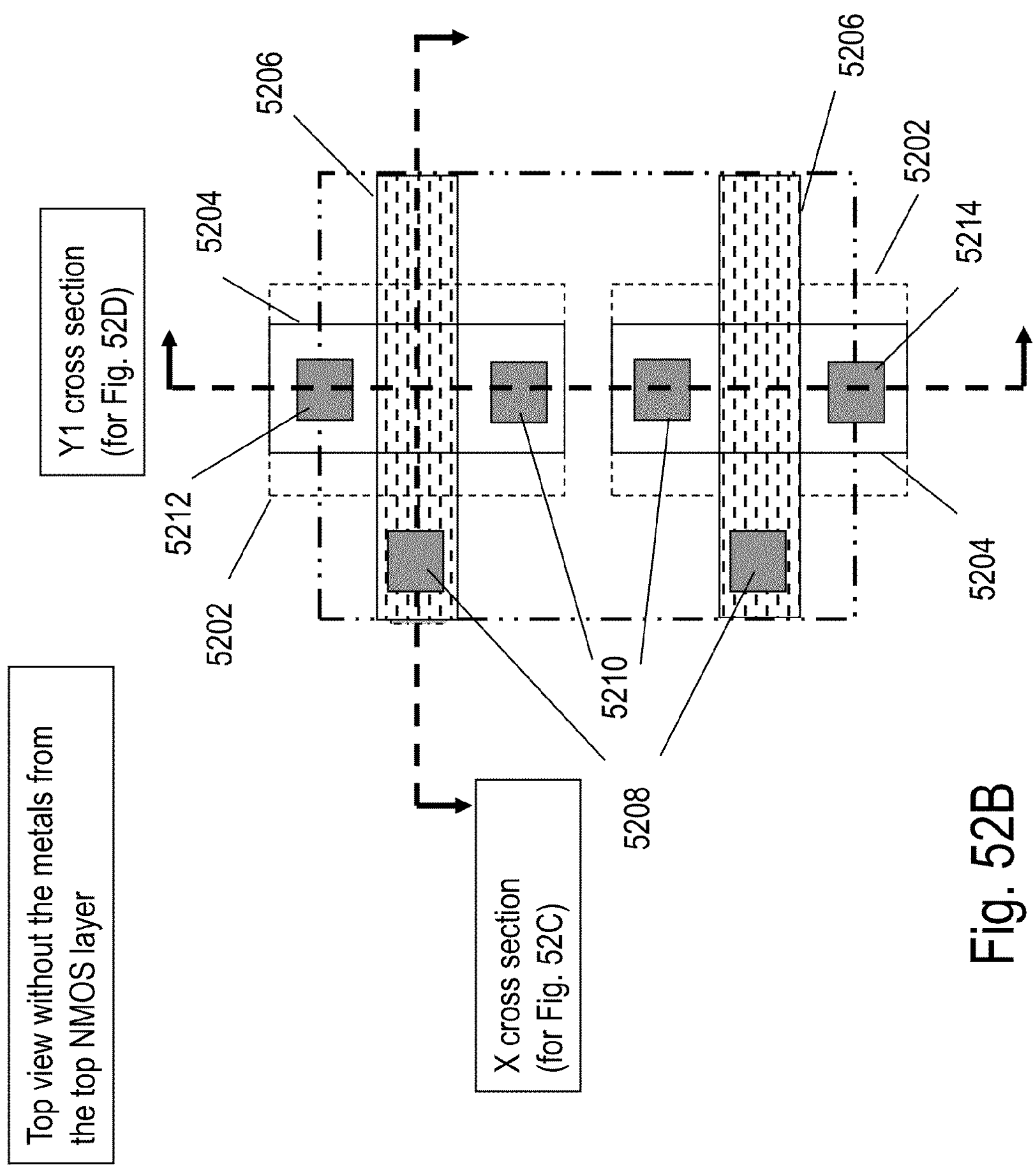

FIG. 52B shows a top view of the SRAM according to one embodiment of the current invention. For the SRAM described in FIG. 52A-D, the bottom layer is the periphery. The nMOS pull-down transistors are above the bottom layer. The pMOS pull-up transistors are above the nMOS pull-down transistors. The nMOS pass transistors are above the pMOS pull-up transistors. The nMOS pass transistors on the topmost layer 5204 are displayed in FIG. 52B. Gates 5206 for pass transistors 5204 are also shown in FIG. 52B. All other numerals have been described previously in respect of FIG. 52A.

Figure 52C:
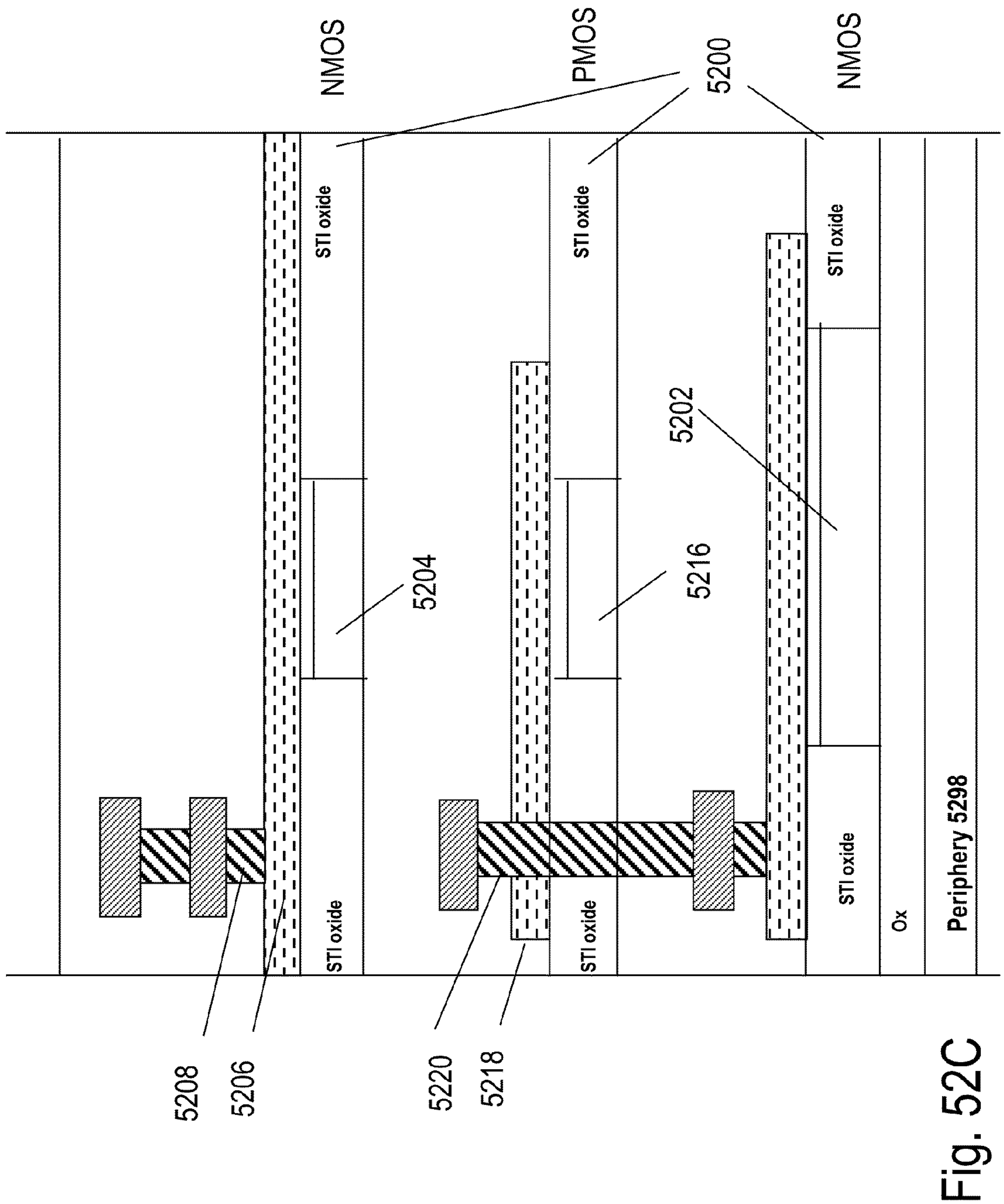

FIG. 52C shows a cross-sectional view of the SRAM according one embodiment of the current invention. Oxide isolation using a STI process is indicated as 5200. Gates for pull-up pMOS transistors are indicated as 5218 while the vertical contact to the gate of the pull-up pMOS and nMOS transistors is indicated as 5220. The periphery layer is indicated as 5298. All other numerals have been described in respect of FIG. 52A and FIG. 52B.

Figure 52D:
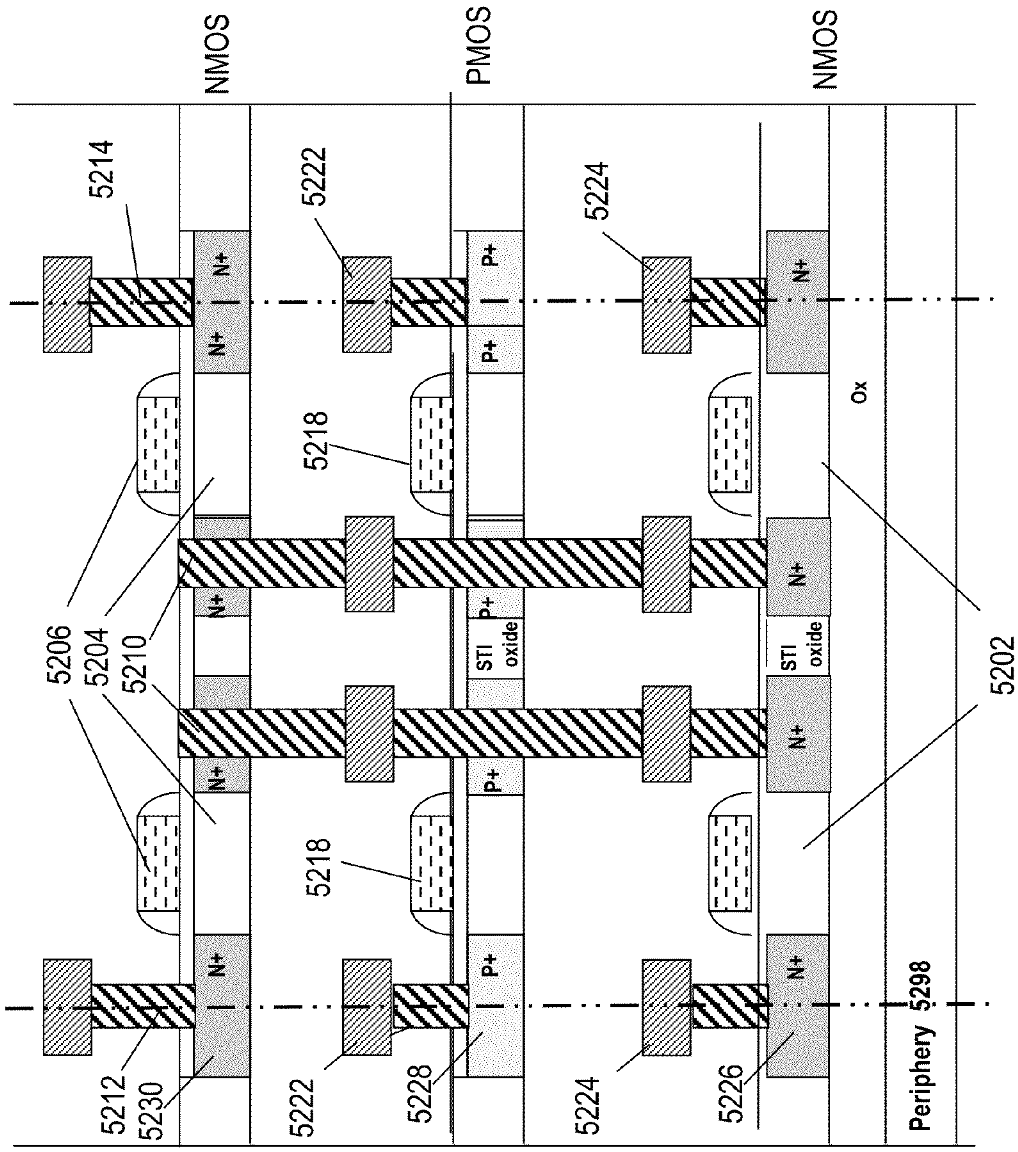

FIG. 52D shows another cross-sectional view of the SRAM according one embodiment of the current invention. The nodes n1 and n2 are connected to pull-up, pull-down and pass transistors by using a vertical via 5210. 5226 is a heavily doped n+ Si region of the pull-down transistor, 5228 is a heavily doped p+ Si region of the pull-up transistor and 5230 is a heavily doped n+ region of a pass transistor. All other symbols have been described previously in respect of FIG. 52A, FIG. 52B and FIG. 52C. Wiring connects together different elements of the SRAM as shown in FIG. 52A.

It can be seen that the SRAM cell shown in FIG. 52A-D is small in terms of footprint compared to a standard 6 transistor SRAM cell. Previous work has suggested building six-transistor SRAMs with nMOS and pMOS devices on different layers with layouts similar to the ones described in FIG. 52A-D. These are described in "The revolutionary and truly 3-dimensional 25F$^2$ SRAM technology with the smallest S$^3$ (stacked single-crystal Si) cell, 0.16 um$^2$, and SSTFT (stacked single-crystal thin film transistor) for ultra high density SRAM," VLSI Technology, 2004. Digest of Technical Papers. 2004 Symposium on, vol., no., pp. 228-229, 15-17 Jun. 2004 by Soon-Moon Jung; Jaehoon Jang; Wonseok Cho; Jaehwan Moon; Kunho Kwak; Bonghyun Choi; Byungjun Hwang; Hoon Lim; Jaehun Jeong; Jonghyuk Kim; Kinam Kim. However, these devices are constructed using selective epi technology, which suffers from defect issues. These defects severely impact SRAM operation. The embodiment of this invention described in FIG. 52A-D is constructed with ion-cut technology and is thus far less prone to defect issues compared to selective epi technology.

It is clear to one skilled in the art that other techniques described in this patent application, such as use of junction-less transistors or recessed channel transistors, could be utilized to form the structures shown in FIG. 52A-D. Alternative layouts for 3D stacked SRAM cells are possible as well, where heavily doped silicon regions could be utilized as GND, VDD, bit line wiring and bit line complement wiring. For example, the region 5226 (in FIG. 52D), instead of serving just as a source or drain of the pull-down transistor, could also run all along the length of the memory array and serve as a GND wiring line. Similarly, the region 5228 (in FIG. 52D), instead of serving just as a source or drain of the pull-up transistor, could run all along the length of the memory array and serve as a VDD wiring line. The region 5230 could run all along the length of the memory array and serve as a bit line.

Section 10: NuPackaging Technology

Figure 53A:
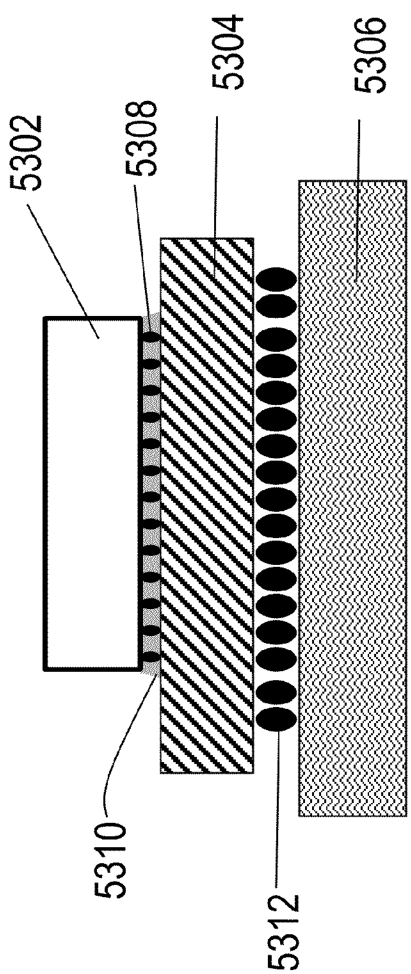
FIG. 53A-B show prior-art packaging schemes used in commercial products.
Figure 53B:
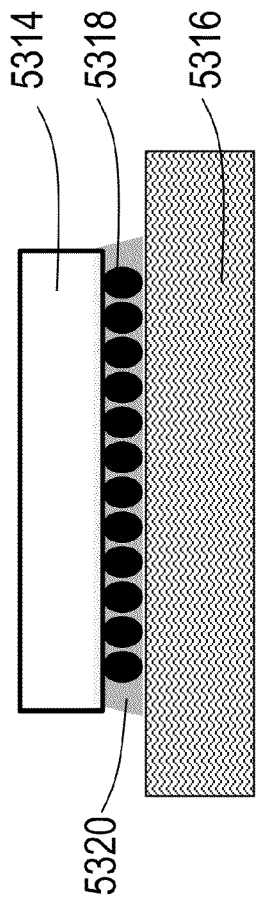

FIG. 53A illustrates a packaging scheme used for several high-performance microchips. A silicon chip 5302 is attached to an organic substrate 5304 using solder bumps 5308. The organic substrate 5304, in turn, is connected to an FR4 printed wiring board (also called board) 5306 using solder bumps 5312. The co-efficient of thermal expansion (CTE) of silicon is 3.2 ppm/K, the CTE of organic substrates is typically ~17 ppm/K and the CTE of FR4 material is typically ~17 ppm/K. Due to this large mismatch between CTE of the silicon chip 5302 and the organic substrate 5304, the solder bumps 5308 are subjected to stresses, which can cause defects and cracking in solder bumps 5308. To avoid this, underfill material 5310 is dispensed between solder bumps. While underfill material 5310 can prevent defects and cracking, it can cause other challenges. Firstly, when solder bump sizes are reduced or when high density of solder bumps is required, dispensing underfill material becomes difficult or even impossible, since underfill cannot flow in little spaces. Secondly, underfill is hard to remove once dispensed. Due to this, if a chip on a substrate is found to have defects and needs to be removed and replaced by another chip, it is difficult. This makes production of multi-chip substrates difficult. Thirdly, underfill can cause the stress due to the mismatch of CTE between the silicon chip 5302 and the substrate 5304 to be more efficiently communicated to the low k dielectric layers present between on-chip interconnects.

Figure 54A:
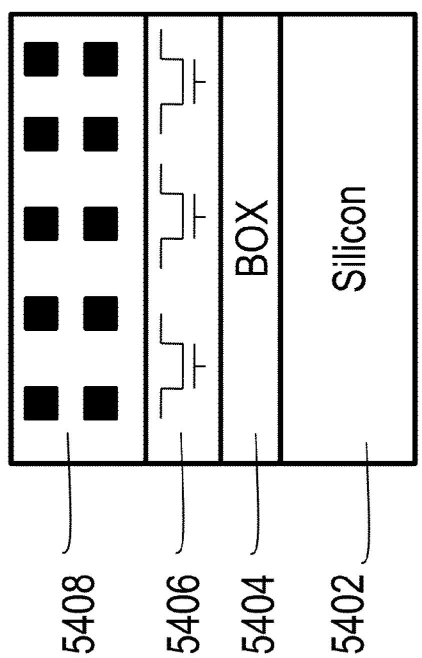
FIG. 54A-F illustrate a process flow to construct packages without underfill for Silicon-on-Insulator technologies.
Figure 54B:
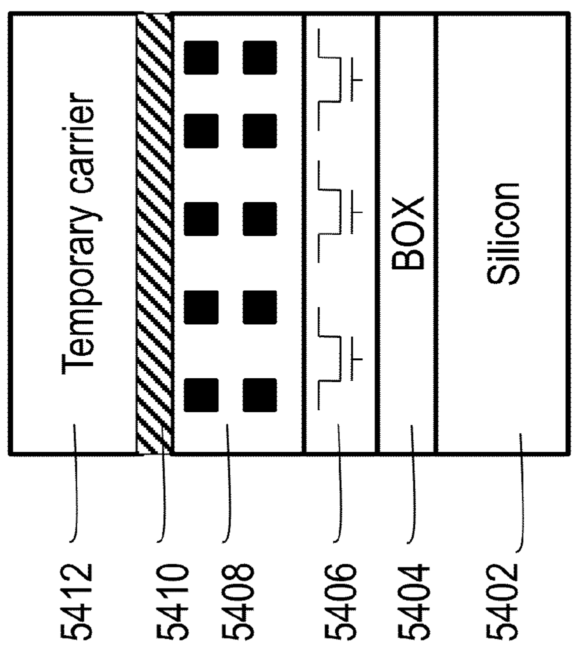

FIG. 54B illustrates a packaging scheme used for many low-power microchips. A silicon chip 5314 is directly connected to an FR4 substrate 5316 using solder bumps 5318. Due to the large difference in CTE between the silicon chip 5314 and the FR4 substrate 5316, underfill 5320 is dispensed many times between solder bumps. As mentioned previously, underfill brings with it challenges related to difficulty of removal and stress communicated to the chip low k dielectric layers.

In both of the packaging types described in FIG. 54A and FIG. 54B and also many other packaging methods available in the literature, the mismatch of co-efficient of thermal expansion (CTE) between a silicon chip and a substrate, or between a silicon chip and a printed wiring board, is a serious issue in the packaging industry. A technique to solve this problem without the use of underfill is advantageous.

FIG. 54A-F describes an embodiment of this invention, where use of underfill may be avoided in the packaging process of a chip constructed on a silicon-on-insulator (SOI) wafer. Although this invention is described with respect to one type of packaging scheme, it will be clear to one skilled in the art that the invention may be applied to other types of packaging. The process flow for the SOI chip could include the following steps that occur in sequence from Step (A) to Step (F). When the same reference numbers are used in different drawing figures (among FIG. 54A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) is illustrated in FIG. 54A. An SOI wafer with transistors constructed on silicon layer 5406 has a buried oxide 5404 atop silicon region 5402. Interconnect layers 5408, which may include metals such as aluminum or copper and insulators such as silicon oxide or low k dielectrics, are constructed as well.

Step (B) is illustrated in FIG. 54B. A temporary carrier wafer 5412 can be attached to the structure shown in FIG. 54A using a temporary bonding adhesive 5410. The temporary carrier wafer 5412 may be constructed with a material, such as, for example, glass or silicon. The temporary bonding adhesive 5410 may include, for example, a polyimide.

Figure 54C:
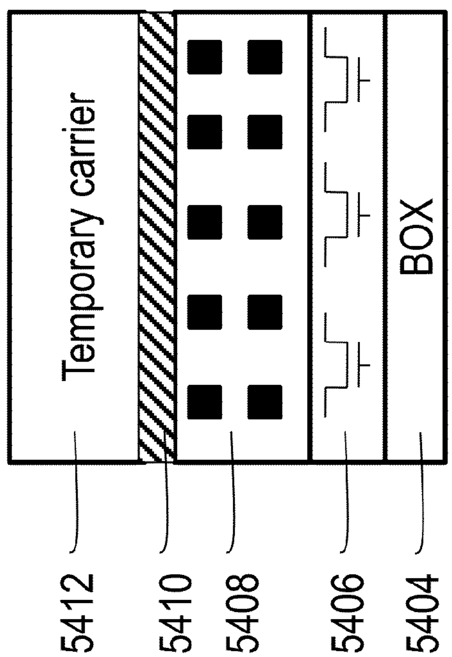

Step (C) is illustrated using FIG. 54C. The structure shown in FIG. 54B may be subjected to a selective etch process, such as, for example, a Potassium Hydroxide etch, (potentially combined with a back-grinding process) where silicon layer 5402 is removed using the buried oxide layer 5404 as an etch stop. Once the buried oxide layer 5404 is reached during the etch step, the etch process is stopped. The etch chemistry is selected such that it etches silicon but does not etch the buried oxide layer 5404 appreciably. The buried oxide layer 5404 may be polished with CMP to ensure a planar and smooth surface.

Figure 54D:
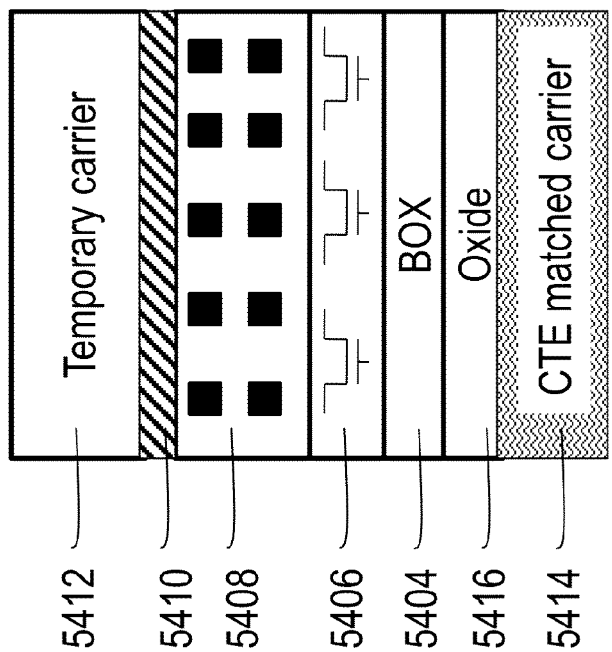

Step (D) is illustrated using FIG. 54D. The structure shown in FIG. 54C may be bonded to an oxide-coated carrier wafer having a co-efficient of thermal expansion (CTE) similar to that of the organic substrate used for packaging. The carrier wafer described in the previous sentence will be called a CTE matched carrier wafer henceforth in this document. The bonding step may be conducted using oxide-to-oxide bonding of buried oxide layer 5404 to the oxide coating 5416 of the CTE matched carrier wafer 5414. The CTE matched carrier wafer 5414 may include materials, such as, for example, copper, aluminum, organic materials, copper alloys and other materials.

Figure 54E:
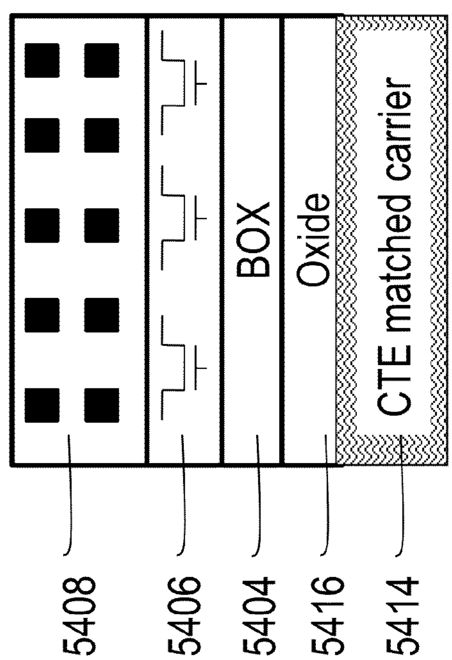

Step (E) is illustrated using FIG. 54E. The temporary carrier wafer 5412 may be detached from the structure at the surface of the interconnect layers 5408 by removing the temporary bonding adhesive 5410. This detachment may be done, for example, by shining laser light through the glass temporary carrier wafer 5412 to ablate or heat the temporary bonding adhesive 5410.

Figure 54F:
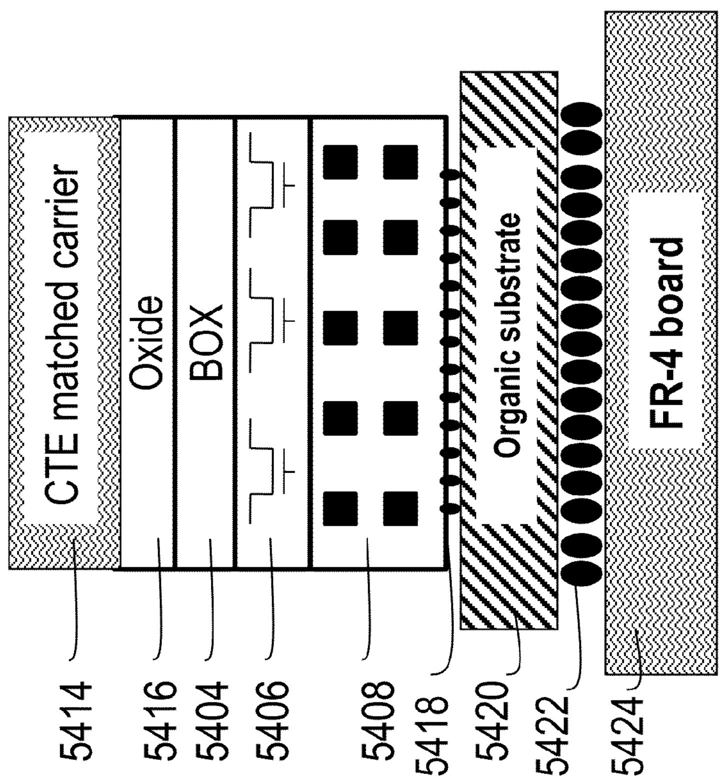

Step (F) is illustrated using FIG. 54F. Solder bumps 5418 may be constructed for the structure shown in FIG. 54E. After dicing, this structure may be attached to organic substrate 5420. This organic substrate may then be attached to a printed wiring board 5424, such as, for example, an FR4 substrate, using solder bumps 5422.

There are two key conditions while choosing the CTE matched carrier wafer 5414 for this embodiment of the invention. Firstly, the CTE matched carrier wafer 5414 should have a CTE close to that of the organic substrate 5420. Preferably, the CTE of the CTE matched carrier wafer 5414 should be within approximately 10 ppm/K of the CTE of the organic substrate 5420. Secondly, the volume of the CTE matched carrier wafer 5414 should be much higher than the silicon region 5406. Preferably, the volume of the CTE matched carrier wafer 5414 may be, for example, greater than approximately 5 times the volume of the silicon region 5406. When this happens, the CTE of the combination of the silicon region 5406 and the CTE matched carrier 5414 may be close to that of the CTE matched carrier 5414. If these two conditions are met, the issues of co-efficient of thermal expansion mismatch described previously are ameliorated, and a reliable packaging process may be obtained without underfill being used.

The organic substrate 5420 typically has a CTE of approximately 17 ppm/K and the printed wiring board 5424 typically is constructed of FR4 which has a CTE of approximately 18 ppm/K. If the CTE matched carrier wafer is constructed of an organic material having a CTE of approximately 17 ppm/K, it can be observed that issues of co-efficient of thermal expansion mismatch described previously are ameliorated, and a reliable packaging process may be obtained without underfill being used. If the CTE matched carrier wafer is constructed of a copper alloy having a CTE of approximately 17 ppm/K, it can be observed that issues of co-efficient of thermal expansion mismatch described previously are ameliorated, and a reliable packaging process may be obtained without underfill being used. If the CTE matched carrier wafer is constructed of an aluminum alloy material having a CTE of approximately 24 ppm/K, it can be observed that issues of co-efficient of thermal expansion mismatch described previously are ameliorated, and a reliable packaging process may be obtained without underfill being used.

FIG. 55A-F describes an embodiment of this invention, where use of underfill may be avoided in the packaging process of a chip constructed on a bulk-silicon wafer. Although this invention is described with respect to one type of packaging scheme, it will be clear to one skilled in the art that the invention may be applied to other types of packaging. The process flow for the silicon chip could include the following steps that occur in sequence from Step (A) to Step (F). When the same reference numbers are used in different drawing figures (among FIG. 55A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 55A:
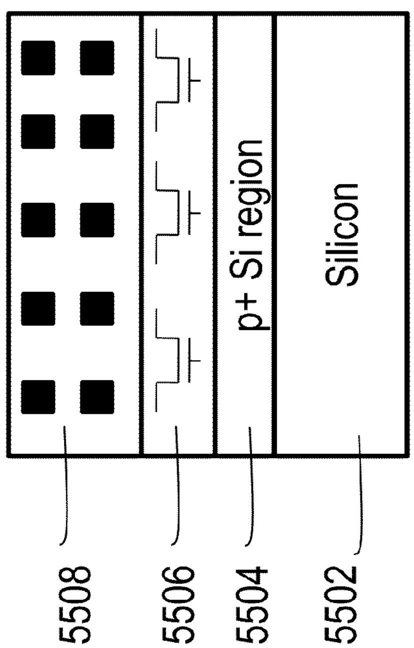
FIG. 55A-F illustrate a process flow to construct packages without underfill for bulk-silicon technologies.

Step (A) is illustrated in FIG. 55A. A bulk-silicon wafer with transistors constructed on a silicon layer 5506 may have a buried p+ silicon layer 5504 atop silicon region 5502. Interconnect layers 5508, which may include metals such as aluminum or copper and insulators such as silicon oxide or low k dielectrics, may be constructed. The buried p+ silicon layer 5504 may be constructed with a process, such as, for example, an ion-implantation and thermal anneal, or an epitaxial doped silicon deposition.

Figure 55B:
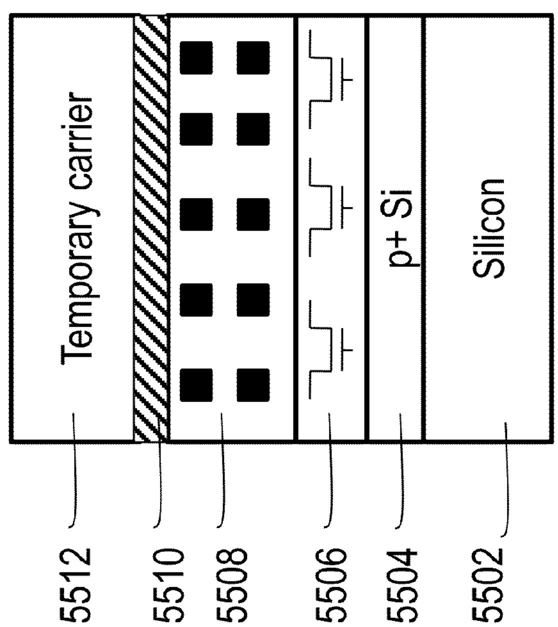

Step (B) is illustrated in FIG. 55B. A temporary carrier wafer 5512 may be attached to the structure shown in FIG. 55A using a temporary bonding adhesive 5510. The temporary carrier wafer 5512 may be constructed with a material, such as, for example, glass or silicon. The temporary bonding adhesive 5510 may include, for example, a polyimide.

Figure 55C:
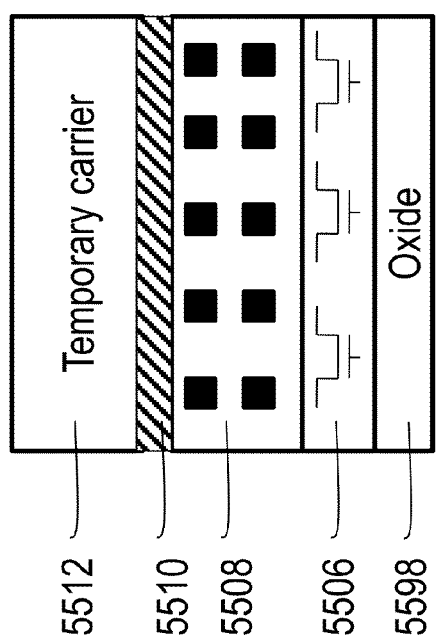

Step (C) is illustrated using FIG. 55C. The structure shown in FIG. 55B may be subjected to a selective etch process, such as, for example, ethylenediamine pyrocatechol (EDP) (potentially combined with a back-grinding process) where silicon layer 5502 is removed using the buried p+ silicon layer 5504 as an etch stop. Once the buried p+ silicon layer 5504 is reached during the etch step, the etch process is stopped. The etch chemistry is selected such that the etch process stops at the p+ silicon buried layer. The buried p+ silicon layer 5504 may then be polished away with CMP and planarized. Following this, an oxide layer 5598 may be deposited.

Figure 55D:
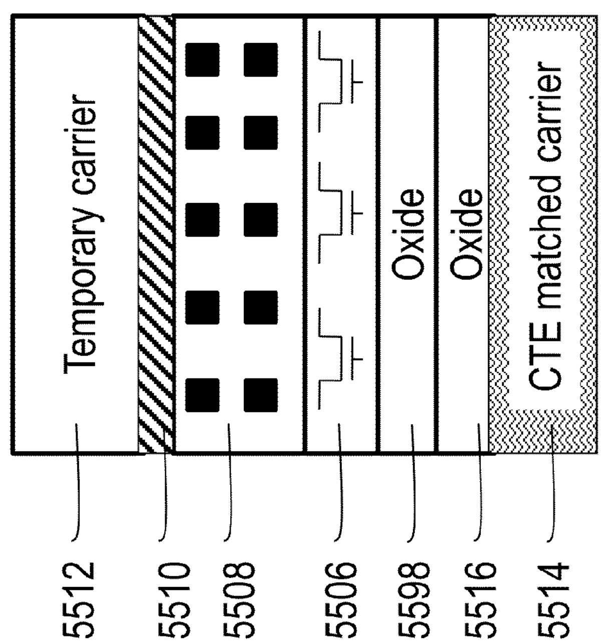

Step (D) is illustrated using FIG. 55D. The structure shown in FIG. 55C may be bonded to an oxide-coated carrier wafer having a co-efficient of thermal expansion (CTE) similar to that of the organic substrate used for packaging. The carrier wafer described in the previous sentence will be called a CTE matched carrier wafer henceforth in this document. The bonding step may be conducted using oxide-to-oxide bonding of oxide layer 5598 to the oxide coating 5516 of the CTE matched carrier wafer 5514. The CTE matched carrier wafer 5514 may include materials, such as, for example, copper, aluminum, organic materials, copper alloys and other materials.

Figure 55E:
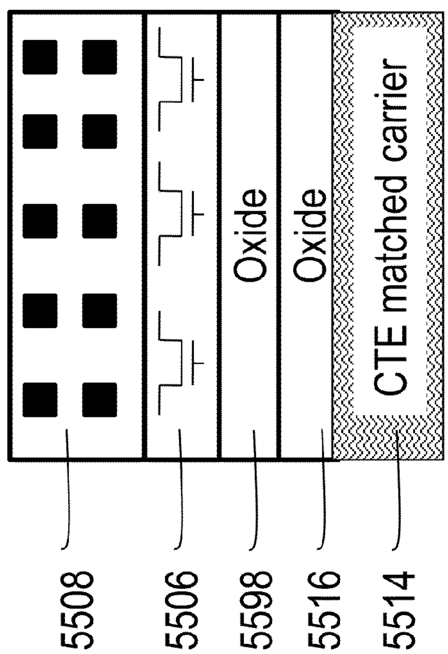

Step (E) is illustrated using FIG. 55E. The temporary carrier wafer 5512 may be detached from the structure at the surface of the interconnect layers 5508 by removing the temporary bonding adhesive 5510. This detachment may be done, for example, by shining laser light through the glass temporary carrier wafer 5512 to ablate or heat the temporary bonding adhesive 5510.

Figure 55F:
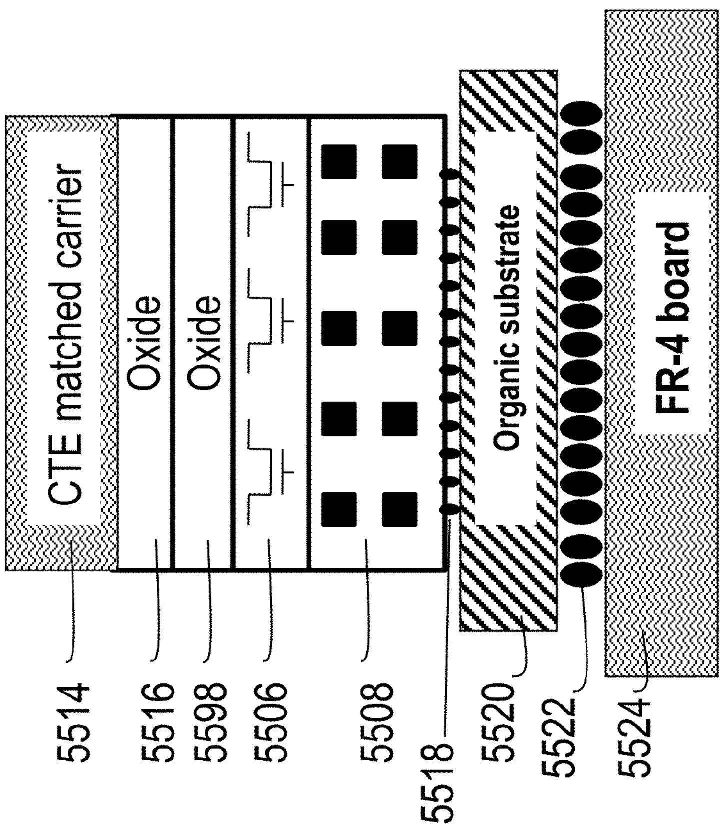

Step (F) is illustrated using FIG. 55F. Solder bumps 5518 may be constructed for the structure shown in FIG. 55E. After dicing, this structure may be attached to organic substrate 5520. This organic substrate may then be attached to a printed wiring board 5524, such as, for example, an FR4 substrate, using solder bumps 5522.

There are two key conditions while choosing the CTE matched carrier wafer 5514 for this embodiment of the invention. Firstly, the CTE matched carrier wafer 5514 should have a CTE close to that of the organic substrate 5520. Preferably, the CTE of the CTE matched carrier wafer 5514 should be within approximately 10 ppm/K of the CTE of the organic substrate 5520. Secondly, the volume of the CTE matched carrier wafer 5514 should be much higher than the silicon region 5506. Preferably, the volume of the CTE matched carrier wafer 5514 may be, for example, greater than approximately 5 times the volume of the silicon region 5506. When this happens, the CTE of the combination of the silicon region 5506 and the CTE matched carrier 5514 may be close to that of the CTE matched carrier 5514. If these two conditions are met, the issues of co-efficient of thermal expansion mismatch described previously are ameliorated, and a reliable packaging process may be obtained without underfill being used.

The organic substrate 5520 typically has a CTE of approximately 17 ppm/K and the printed wiring board 5524 typically is constructed of FR4 which has a CTE of approximately 18 ppm/K. If the CTE matched carrier wafer is constructed of an organic material having a CTE of 17 ppm/K, it can be observed that issues of co-efficient of thermal expansion mismatch described previously are ameliorated, and a reliable packaging process may be obtained without underfill being used. If the CTE matched carrier wafer is constructed of a copper alloy having a CTE of approximately 17 ppm/K, it can be observed that issues of co-efficient of thermal expansion mismatch described previously are ameliorated, and a reliable packaging process may be obtained without underfill being used. If the CTE matched carrier wafer is constructed of an aluminum alloy material having a CTE of approximately 24 ppm/K, it can be observed that issues of co-efficient of thermal expansion mismatch described previously are ameliorated, and a reliable packaging process may be obtained without underfill being used.

While FIG. 54A-F and FIG. 55A-F describe methods of obtaining thinned wafers using buried oxide and buried p+ silicon etch stop layers respectively, it will be clear to one skilled in the art that other methods of obtaining thinned wafers exist. Hydrogen may be implanted through the backside of a bulk-silicon wafer (attached to a temporary carrier wafer) at a certain depth and the wafer may be cleaved using a mechanical force. Alternatively, a thermal or optical anneal may be used for the cleave process. An ion-cut process through the back side of a bulk-silicon wafer could therefore be used to thin a wafer accurately, following which a CTE matched carrier wafer may be bonded to the original wafer.

It will be clear to one skilled in the art that other methods to thin a wafer and attach a CTE matched carrier wafer exist. Other methods to thin a wafer include, not are not limited to, CMP, plasma etch, wet chemical etch, or a combination of these processes. These processes may be supplemented with various metrology schemes to monitor wafer thickness during thinning Carefully timed thinning processes may also be used.

Figure 65:
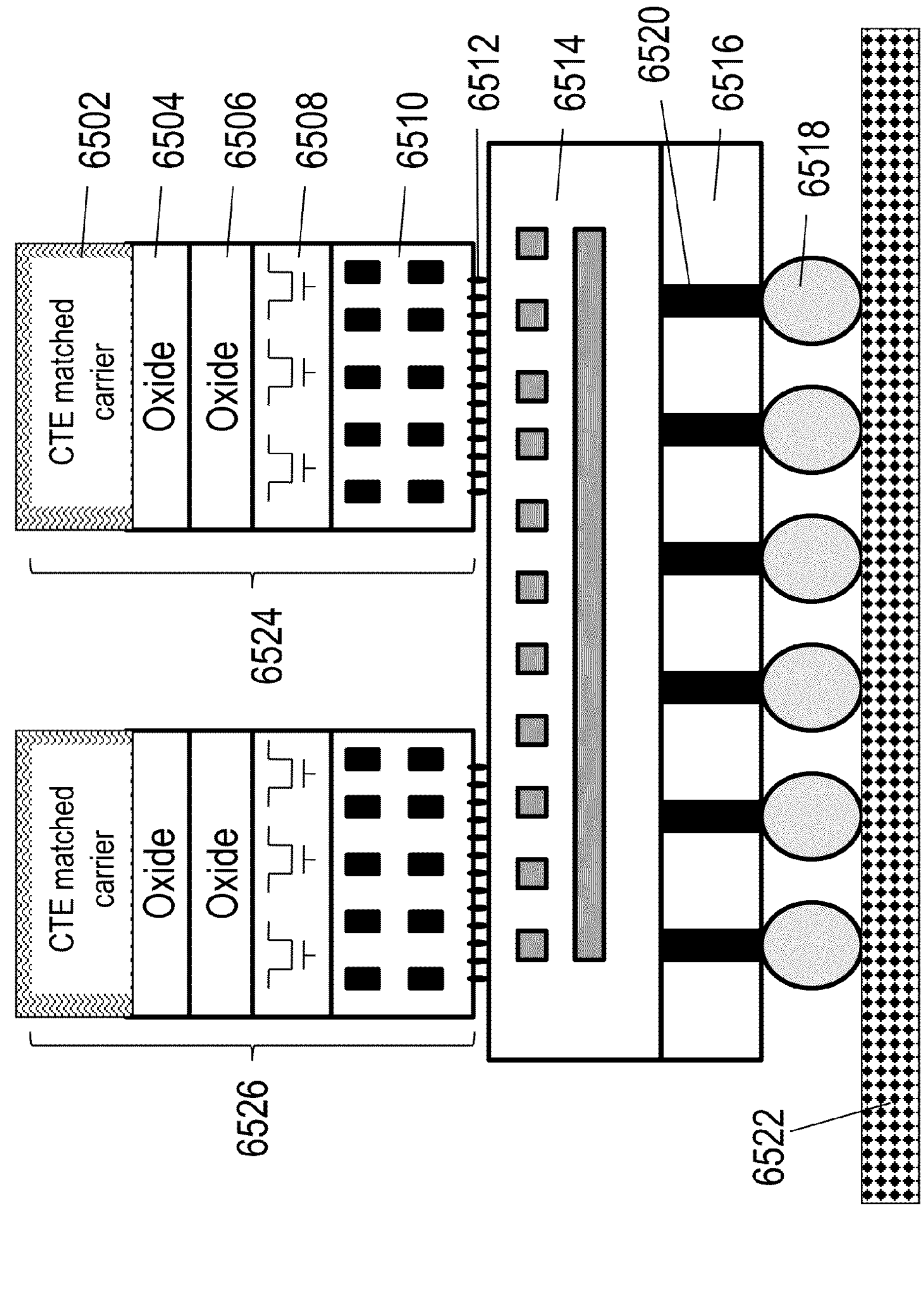
FIG. 65 illustrates a technique to provide high density of connections between different chips on the same packaging substrate.

FIG. 65 describes an embodiment of this invention, where multiple dice, such as, for example, dice 6524 and 6526 are placed and attached atop packaging substrate 6516. Packaging substrate 6516 may include packaging substrate high density wiring layers 6514, packaging substrate vias 6520, packaging substrate-to-printed-wiring-board connections 6518, and printed wiring board 6522. Die-to-substrate connections 6512 may be utilized to electrically couple dice 6524 and 6526 to the packaging substrate high density wiring levels 6514 of packaging substrate 6516. The dice 6524 and 6526 may be constructed using techniques described with FIG. 54A-F and FIG. 55A-F but are attached to packaging substrate 6516 rather than organic substrate 5422 or 5522. Due to the techniques of construction described in FIG. 54A-F and FIG. 55A-F being used, a high density of connections may be obtained from each die, such as 6524 and 6526, to the packaging substrate 6516. By using a packaging substrate 6516 with packaging substrate high density wiring levels 6514, a large density of connections between multiple dice 6524 and 6526 may be realized. This opens up several opportunities for system design. In one embodiment of this invention, unique circuit blocks may be placed on different dice assembled on the packaging substrate 6516. In another embodiment, contents of a large die may be split among many smaller dice to reduce yield issues. In yet another embodiment, analog and digital blocks could be placed on separate dice. It will be obvious to one skilled in the art that several variations of these concepts are possible. The key enabler for all these ideas is the fact that the CTEs of the dice are similar to the CTE of the packaging substrate, so that a high density of connections from the die to the packaging substrate may be obtained, and provide for a high density of connection between dice. 6502 denotes a CTE matched carrier wafer, 6504 and 6506 are oxide layers, 6508 represents transistor regions, 6510 represents a multilevel wiring stack, 6512 represents die-to-substrate connections, 6516 represents the packaging substrate, 6514 represents the packaging substrate high density wiring levels, 6520 represents vias on the packaging substrate, 6518 denotes packaging substrate-to-printed-wiring-board connections and 6522 denotes a printed wiring board.

Section 11: Process Modules for sub-400° C. Transistors and Contacts

Section 1 discussed various methods to create junctionless transistors and recessed channel transistors with temperatures of less than 400° C.-450° C. after stacking. For these transistor types and other technologies described in this disclosure, process modules such as bonding, cleave, planarization after cleave, isolation, contact formation and strain incorporation would benefit from being conducted at temperatures below 400° C. Techniques to conduct these process modules at less than about 400° C. are described in Section 11.

Section 11.1: Sub-400° C. Bonding Process Module

Bonding of layers for transfer (as shown, for example, in FIG. 11E which has been described previously in this disclosure) can be performed advantageously at less than 400° C. using an oxide-to-oxide bonding process with activated surface layers. This is described in FIG. 19. FIG. 19 shows various methods one can use to bond a top layer wafer 1908 to a bottom wafer 1902. Oxide-oxide bonding of a layer of silicon dioxide 1906 and a layer of silicon dioxide 1904 is used. Before bonding, various methods can be utilized to activate surfaces of the layer of silicon dioxide 1906 and the layer of silicon dioxide 1904. A plasma-activated bonding process such as the procedure described in US Patent 20090081848 or the procedure described in "Plasma-activated wafer bonding: the new low-temperature tool for MEMS fabrication", Proc. SPIE 6589, 65890T (2007), DOI: 10.1117/12.721937 by V. Dragoi, G. Mittendorfer, C. Thanner, and P. Lindner ("Dragoi") can be used. Alternatively, an ion implantation process such as the one described in US Patent 20090081848 or elsewhere can be used. Alternatively, a wet chemical treatment can be utilized for activation. Other methods to perform oxide-to-oxide bonding can also be utilized.

Section 11.2: Sub-400° C. Cleave Process Module

As described previously in this disclosure, a cleave process can be performed advantageously at less than 400° C. by implantation with hydrogen, helium or a combination of the two species followed by a sideways mechanical force. Alternatively, the cleave process can be performed advantageously at less than 400° C. by implantation with hydrogen, helium or a combination of the two species followed by an anneal. These approaches are described in detail in Section 1 through the description for FIG. 2A-E.

The temperature required for hydrogen implantation followed by an anneal-based cleave can be reduced substantially by implanting the hydrogen species in a buried p+ silicon layer where the dopant is boron. This approach has been described previously in this disclosure in Section 1.3.3 through the description of FIG. 17A-E.

Section 11.3: Planarization and Surface Smoothening after Cleave at Less than 400° C.

Figure 56A:
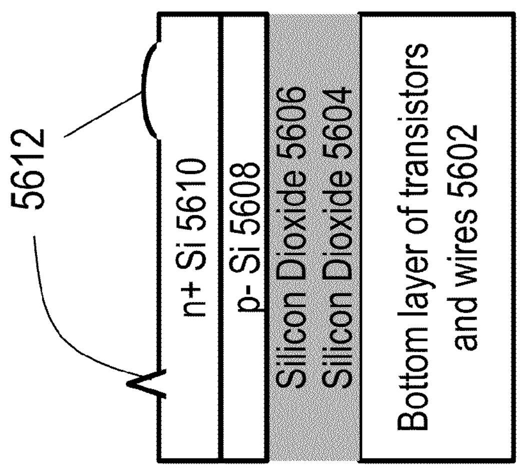
FIG. 56A-C illustrate a sub-400° C. process to reduce surface roughness after a hydrogen-implant based cleave.

FIG. 56A shows the surface of a wafer or substrate structure after a layer transfer and after a hydrogen, or other atomic species, implant plane has been cleaved. The wafer consists of a bottom layer of transistors and wires 5602 with an oxide layer 5604 atop it. These in turn have been bonded using oxide-to-oxide bonding and cleaved to a structure such that a silicon dioxide layer 5606, p− Silicon layer 5608 and n+ Silicon layer 5610 are formed atop the bottom layer of transistors and wires 5602 and the oxide layer 5604. The surface of the wafer or substrate structure shown in FIG. 56A can often be non-planar after cleaving along a hydrogen plane, with irregular features 5612 formed atop it.

The irregular features 5612 may be removed using a chemical mechanical polish (CMP) that planarizes the surface.

Figure 56B:
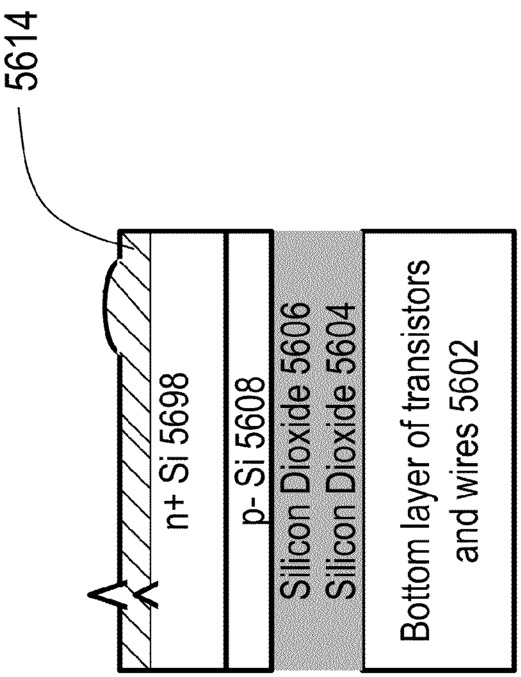
Figure 56C:
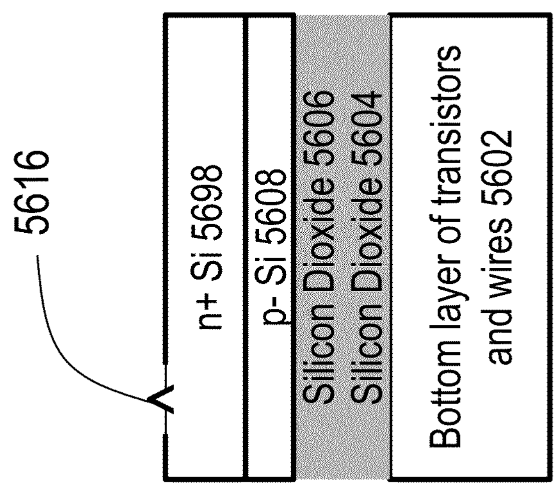

Alternatively, a process shown in FIG. 56B-C may be utilized to remove or reduce the extent of irregular features 5612 of FIG. 56A. Various elements in FIG. 56B such as 5602, 5604, 5606 and 5608 are as described in the description for FIG. 56A. The surface of n+ Silicon layer 5610 and the irregular features 5612 may be subjected to a radical oxidation process that produces thermal oxide layer 5614 at less than 400° C. by using a plasma. The thermal oxide layer 5614 consumes a portion of the n+ Silicon region 5610 shown in FIG. 56A to produce the n+ Si region 5698 of FIG. 56B. The thermal oxide layer 5614 may then be etched away, utilizing an etchant such as, for example, a dilute Hydrofluoric acid solution, to form the structure shown in FIG. 56C. Various elements in FIG. 56C such as 5602, 5604, 5606, 5608 and 5698 are as described with respect to FIG. 56B. It can be observed that the extent of non-planarities 5616 in FIG. 56C is less than in FIG. 56A. The radical oxidation and etch-back process essentially smoothens the surface and reduces non-planarities.

Alternatively, according to an embodiment of this invention, surface non-planarities may be removed or reduced by treating the cleaved surface of the wafer or substrate in a hydrogen plasma at less than approximately 400° C. The hydrogen plasma source gases may include, for example, hydrogen, argon, nitrogen, hydrogen chloride, water vapor, methane, and so on. Hydrogen anneals at 1100° C. are known to reduce surface roughness in silicon. By having a plasma, the temperature requirement can be reduced to less than approximately 400° C.

Alternatively, according to another embodiment of this invention, a thin film, such as, for example, a Silicon oxide or photosensitive resist may be deposited atop the cleaved surface of the wafer or substrate and etched back. The etchant required for this etch-back process is preferably one that has approximately equal etch rates for both silicon and the deposited thin film. This could reduce non-planarities on the wafer surface.

Alternatively, Gas Cluster Ion Beam technology may be utilized for smoothing surfaces after cleaving along an implanted plane of hydrogen or other atomic species.

A combination of various techniques described in Section 11.3 can also be used. The hydrogen implant plane may also be formed by co-implantation of multiple species, such as, for example, hydrogen and helium.

Section 11.4: Sub-400° C. Isolation Module

FIG. 57A-D shows a description of a prior art shallow trench isolation process. The process flow for the silicon chip could include the following steps that occur in sequence from Step (A) to Step (D). When the same reference numbers are used in different drawing figures (among FIG. 57A-D), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 57A:
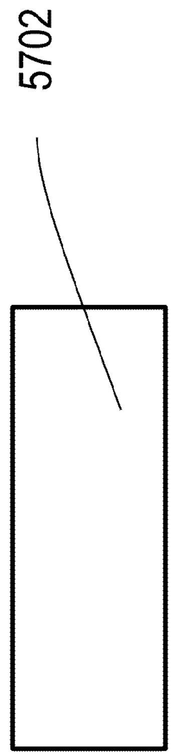
FIG. 57A-D illustrate a prior art process to construct shallow trench isolation regions.

Step (A) is illustrated using FIG. 57A. A silicon wafer 5702 may be constructed.

Figure 57B:
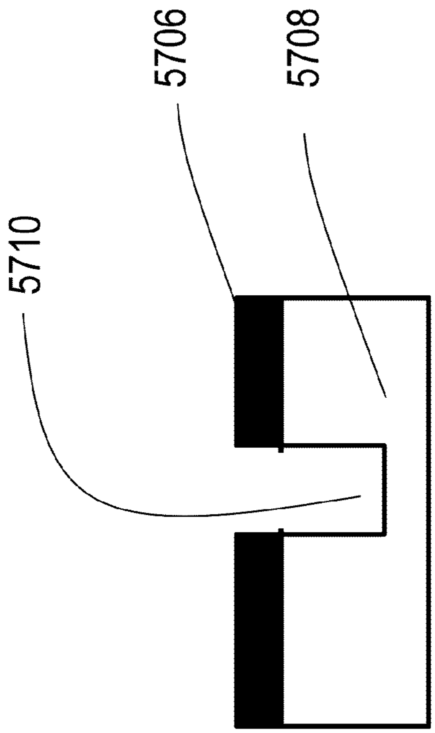

Step (B) is illustrated using FIG. 57B. A layer of silicon nitride 5706 may be formed using a process such as chemical vapor deposition (CVD) and may then be lithographically patterned. Following this, an etch process may be conducted to form trench 5710. The silicon region remaining after these process steps is indicated as 5708. A silicon oxide (not shown) may be utilized as a stress relief layer between the silicon nitride 5706 and silicon wafer 5702.

Figure 57C:
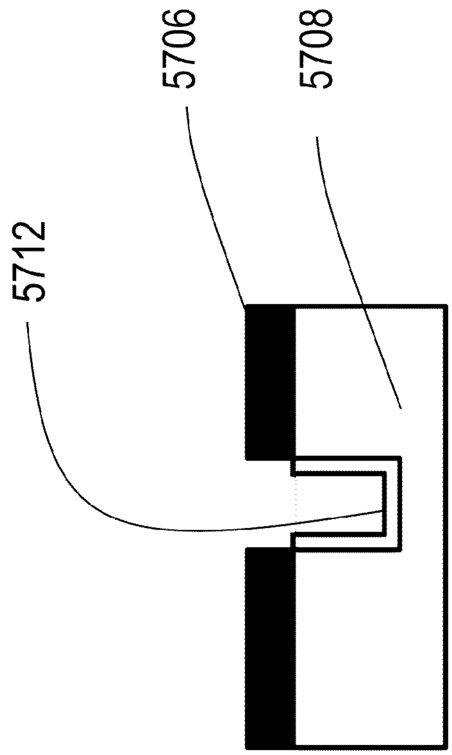

Step (C) is illustrated using FIG. 57C. A thermal oxidation process at >700° C. may be conducted to form oxide region 5712. The silicon nitride layer 5706 prevents the silicon nitride covered surfaces of silicon region 5708 from becoming oxidized during this process.

Figure 57D:
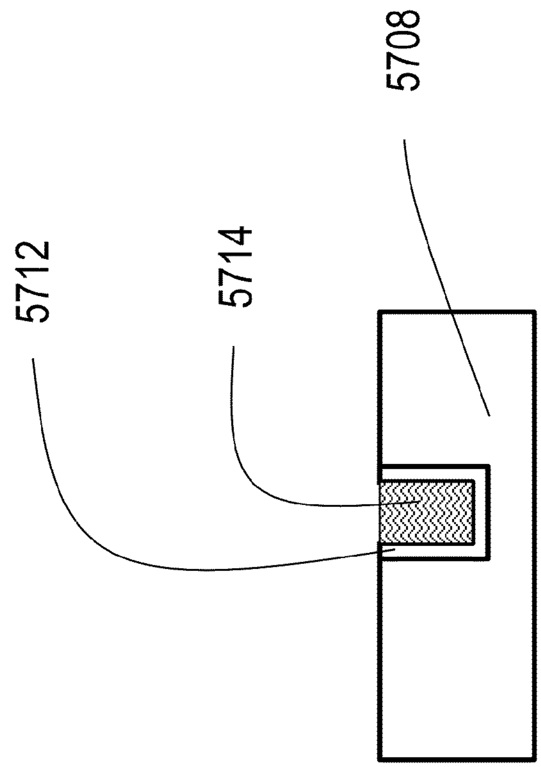

Step (D) is illustrated using FIG. 57D. An oxide fill may be deposited, following which an anneal may be preferably done to densify the deposited oxide. A chemical mechanical polish (CMP) may be conducted to planarize the surface. Silicon nitride layer 5706 may be removed either with a CMP process or with a selective etch, such as hot phosphoric acid. The oxide fill layer after the CMP process is indicated as 5714.

The prior art process described in FIG. 57A-D suffers from the use of high temperature (>400° C.) processing which is not suitable for some embodiments of this invention that involve 3D stacking of components such as junction-less transistors (JLT) and recessed channel transistors (RCAT). Steps that involve temperatures greater than 400° C. include the thermal oxidation conducted to form region 5712 and the densification anneal conducted in Step (D) above.

FIG. 58A-D describes an embodiment of this invention, where sub-400° C. process steps are utilized to form the shallow trench isolation regions. The process flow for the silicon chip may include the following steps that occur in sequence from Step (A) to Step (D). When the same reference numbers are used in different drawing figures (among FIG. 58A-D), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 58A:
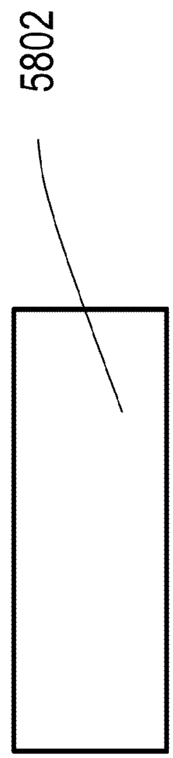
FIG. 58A-D illustrate a sub-400° C. process to construct shallow trench isolation regions for 3D stacked structures.

Step (A) is illustrated using FIG. 58A. A silicon wafer 5802 may be constructed.

Figure 58B:
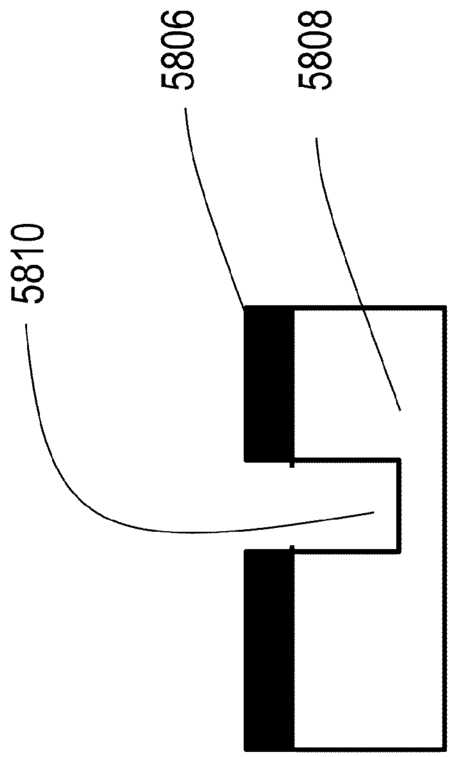

Step (B) is illustrated using FIG. 58B. A layer of silicon nitride 5806 may be formed using a process, such as, for example, plasma-enhanced chemical vapor deposition (PECVD) or physical vapor deposition (PVD), and may then be lithographically patterned. Following this, an etch process may be conducted to form trench 5810. The silicon region remaining after these process steps is indicated as 5808. A silicon oxide (not shown) may be utilized as a stress relief layer between the silicon nitride 5806 and silicon wafer 5802.

Figure 58C:
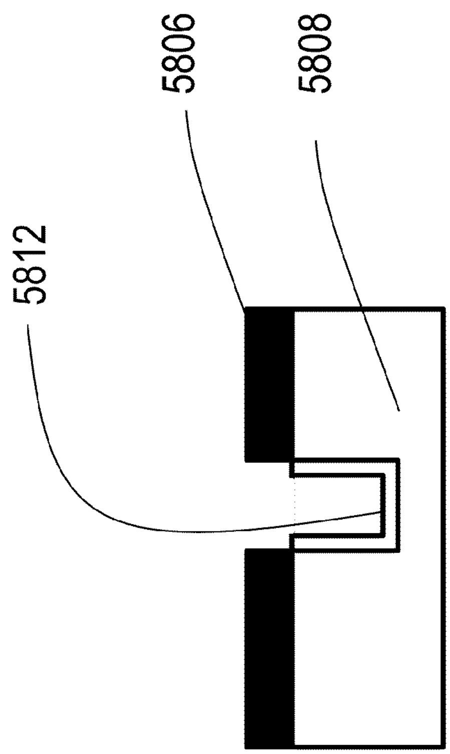

Step (C) is illustrated using FIG. 58C. A plasma-assisted radical thermal oxidation process, which has a process temperature typically less than approximately 400° C., may be conducted to form the oxide region 5812. The silicon nitride layer 5806 prevents the silicon nitride covered surfaces of silicon region 5708 from becoming oxidized during this process.

Figure 58D:
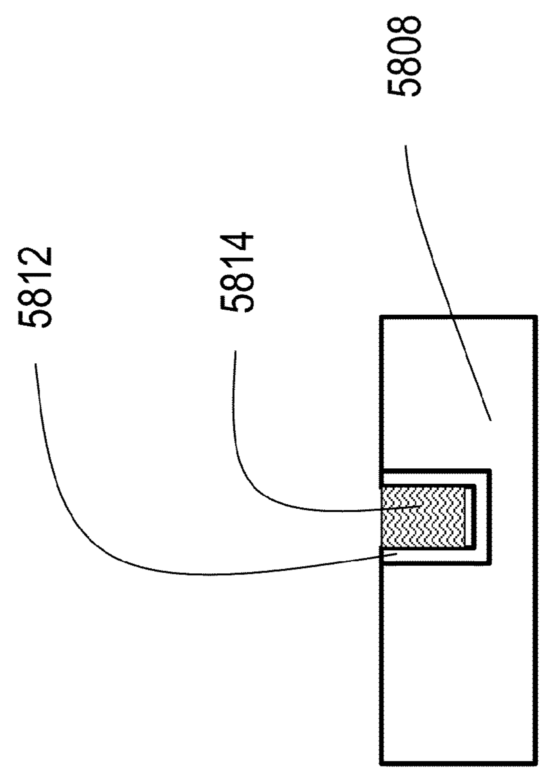

Step (D) is illustrated using FIG. 58D. An oxide fill may be deposited, preferably using a process such as, for example, a high-density plasma (HDP) process that produces dense oxide layers at low temperatures, less than approximately 400° C. Depositing a dense oxide avoids the requirement for a densification anneal that would need to be conducted at a temperature greater than 400° C. A chemical mechanical polish (CMP) may be conducted to planarize the surface. Silicon nitride layer 5806 may be removed either with a CMP process or with a selective etch, such as hot phosphoric acid. The oxide fill layer after the CMP process is indicated as 5814. The process described using FIG. 58A-D can be conducted at less than 400° C., and this is advantageous for many 3D stacked architectures.

Section 11.5: Sub-400° C. Silicide Contact Module

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr 024377. To achieve the lowest nickel silicide contact and source/drain resistances, the nickel on silicon could require heating to 450° C.

Thus it may be desirable to enable low resistances for process flows in this document where the post layer transfer temperature exposures must remain under approximately 400° C. due to metallization, such as, for example, copper and aluminum, and low-k dielectrics present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

Figure 59A:
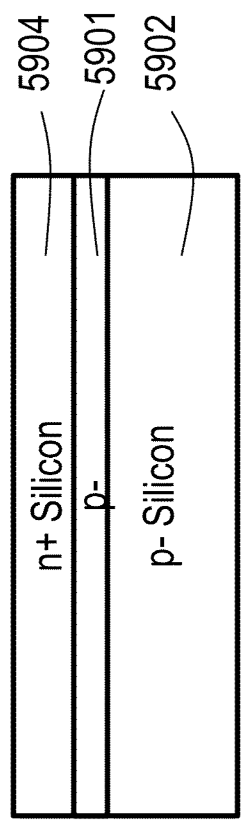
FIG. 59A-I illustrate a process flow that forms silicide regions before layer transfer.

A planar n-channel Recessed Channel Array Transistor (RCAT) with metal silicide source & drain contacts suitable for a 3D IC may be constructed. As illustrated in FIG. 59A, a P− substrate donor wafer 5902 may be processed to include wafer sized layers of N+ doping 5904, and P− doping 5901 across the wafer. The N+ doped layer 5904 may be formed by ion implantation and thermal anneal. In addition, P− doped layer 5901 may have additional ion implantation and anneal processing to provide a different dopant level than P− substrate 5902. P− doped layer 5901 may also have graded P− doping to mitigate transistor performance issues, such as, for example, short channel effects, after the RCAT is formed. The layer stack may alternatively be formed by successive epitaxially deposited doped silicon layers of P− doping 5901 and N+ doping 5904, or by a combination of epitaxy and implantation Annealing of implants and doping may utilize optical annealing techniques or types of Rapid Thermal Anneal (RTA or spike).

Figure 59B:
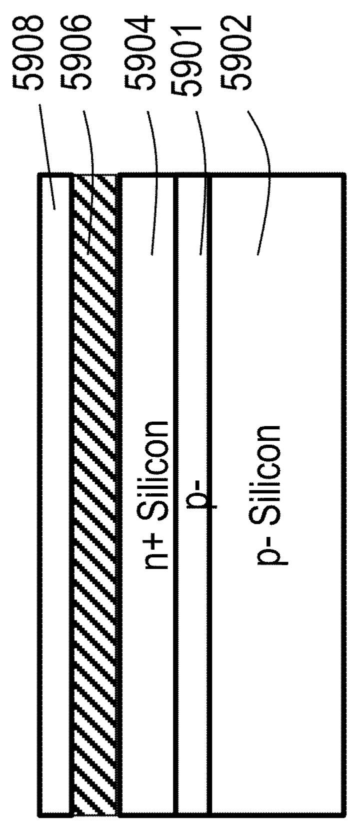

As illustrated in FIG. 59B, a silicon reactive metal, such as, for example, Nickel or Cobalt, may be deposited onto N+ doped layer 5904 and annealed, utilizing anneal techniques such as, for example, RTA, thermal, or optical, thus forming metal silicide layer 5906. The top surface of donor wafer 5901 may be prepared for oxide wafer bonding with a deposition of an oxide to form oxide layer 5908.

Figure 59C:
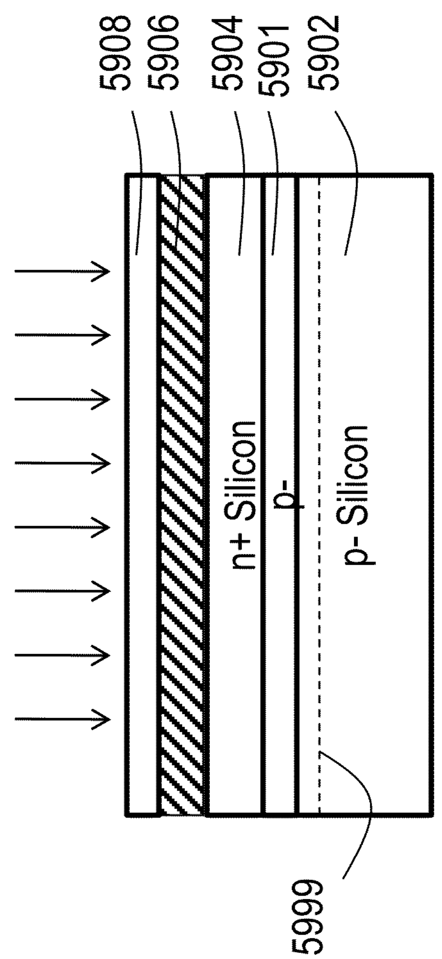

As illustrated in FIG. 59C, a layer transfer demarcation plane (shown as dashed line) 5999 may be formed by hydrogen implantation or other methods as previously described.

Figure 59D:
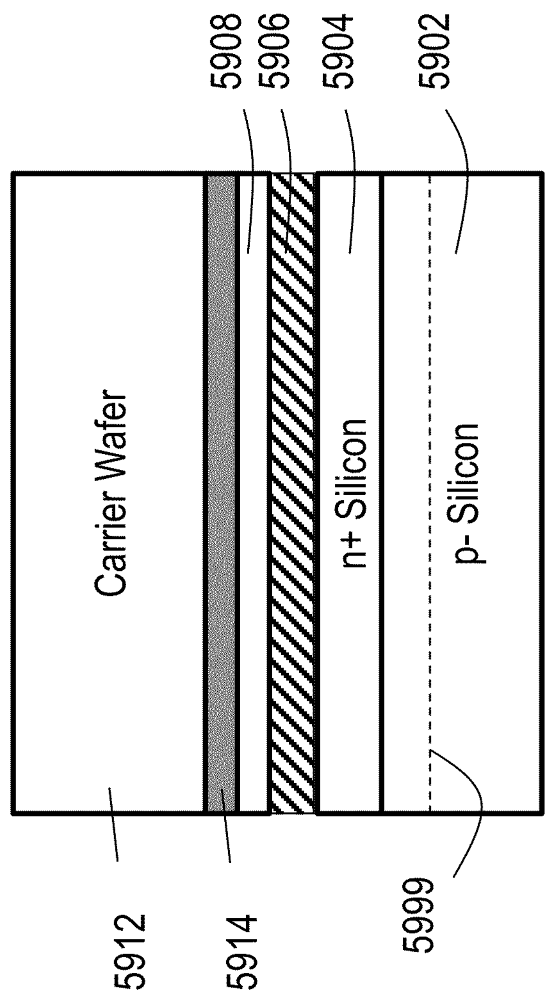

As illustrated in FIG. 59D donor wafer 5902 with layer transfer demarcation plane 5999, P− doped layer 5901, N+ doped layer 5904, metal silicide layer 5906, and oxide layer 5908 may be temporarily bonded to carrier or holder substrate 5912 with a low temperature process that may facilitate a low temperature release. The carrier or holder substrate 5912 may be a glass substrate to enable state of the art optical alignment with the acceptor wafer. A temporary bond between the carrier or holder substrate 5912 and the donor wafer 5902 may be made with a polymeric material, such as, for example, polyimide DuPont HD3007, which can be released at a later step by laser ablation, Ultra-Violet radiation exposure, or thermal decomposition, shown as adhesive layer 5914. Alternatively, a temporary bond may be made with uni-polar or bi-polar electrostatic technology such as, for example, the Apache tool from Beam Services Inc.

Figure 59E:
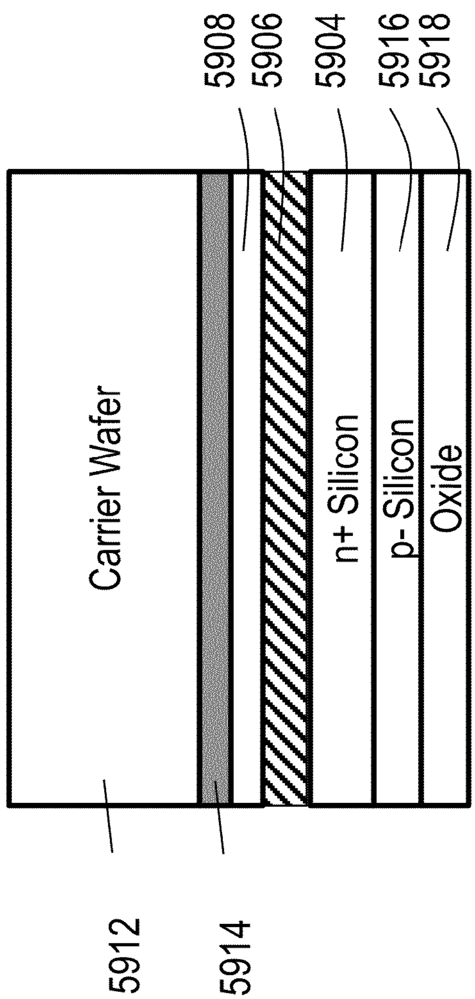

As illustrated in FIG. 59E, the portion of the donor wafer 5902 that is below the layer transfer demarcation plane 5999 may be removed by cleaving or other processes as previously described, such as, for example, ion-cut or other methods. The remaining donor wafer P− doped layer 5901 may be thinned by chemical mechanical polishing (CMP) so that the P− layer 5916 may be formed to the desired thickness. Oxide 5918 may be deposited on the exposed surface of P− layer 5916.

Figure 59F:
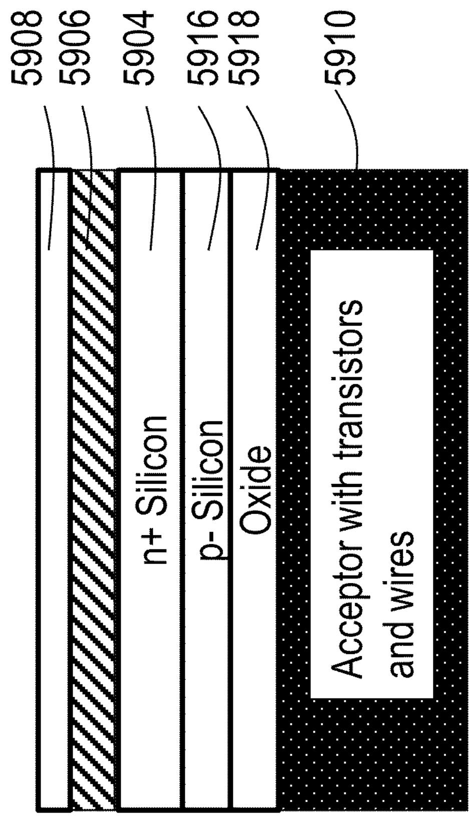

As illustrated in FIG. 59F, both the donor wafer 5902 and acceptor substrate or wafer 5910 may be prepared for wafer bonding as previously described and then low temperature (less than approximately 400° C.) aligned and oxide to oxide bonded. Acceptor substrate 5910, as described previously, may compromise, for example, transistors, circuitry, metal, such as, for example, aluminum or copper, interconnect wiring, and thru layer via metal interconnect strips or pads. The carrier or holder substrate 5912 may then be released using a low temperature process such as, for example, laser ablation. Oxide layer 5918, P− layer 5916, N+ doped layer 5904, metal silicide layer 5906, and oxide layer 5908 have been layer transferred to acceptor wafer 5910. The top surface of oxide 5908 may be chemically or mechanically polished. Now RCAT transistors are formed with low temperature (less than approximately 400° C.) processing and aligned to the acceptor wafer 5910 alignment marks (not shown).

Figure 59G:
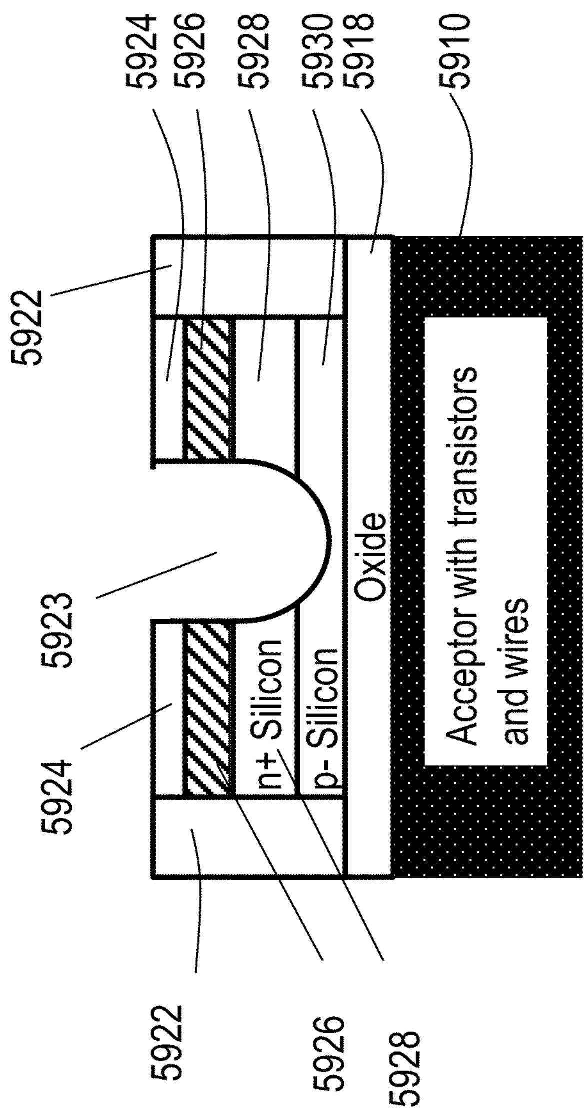

As illustrated in FIG. 59G, the transistor isolation regions 5922 may be formed by mask defining and then plasma/RIE etching oxide layer 5908, metal silicide layer 5906, N+ doped layer 5904, and P− layer 5916 to the top of oxide layer 5918. Then a low-temperature gap fill oxide may be deposited and chemically mechanically polished, with the oxide remaining in isolation regions 5922. Then the recessed channel 5923 may be mask defined and etched. The recessed channel surfaces and edges may be smoothed by wet chemical or plasma/RIE etching techniques to mitigate high field effects. These process steps form oxide regions 5924, metal silicide source and drain regions 5926, N+ source and drain regions 5928 and P−channel region 5930.

Figure 59H:
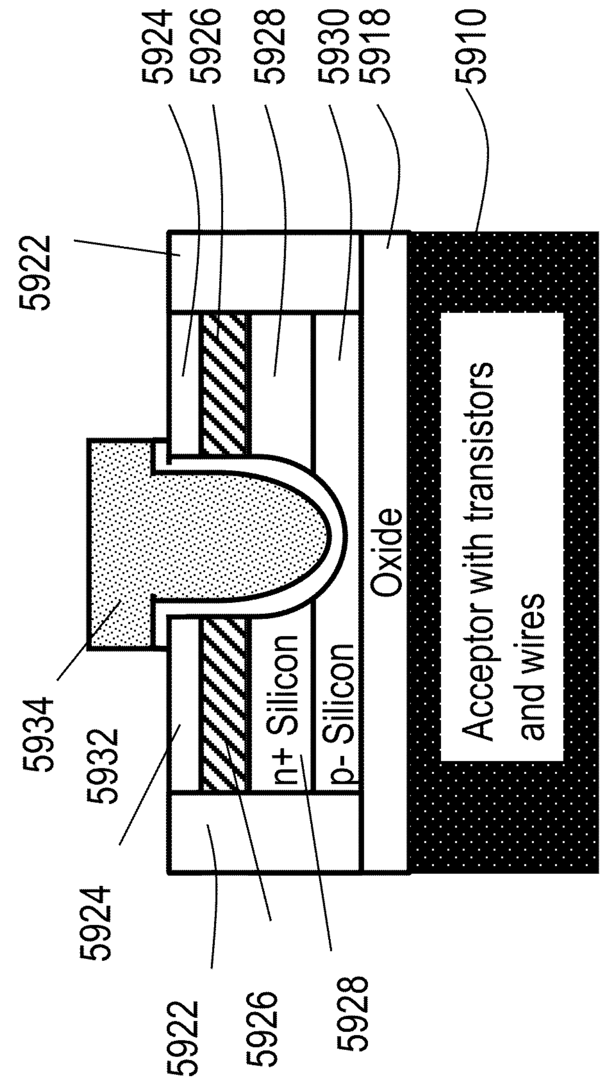

As illustrated in FIG. 59H, a gate dielectric 5932 may be formed and a gate metal material may be deposited. The gate dielectric 5932 may be an atomic layer deposited (ALD) gate dielectric that is paired with a work function specific gate metal in the industry standard high k metal gate process schemes described previously. Or the gate dielectric 5932 may be formed with a low temperature oxide deposition or low temperature microwave plasma oxidation of the silicon surfaces and then a gate material such as, for example, tungsten or aluminum may be deposited. Then the gate material may be chemically mechanically polished, and the gate area defined by masking and etching, thus forming gate electrode 5934.

Figure 59I:
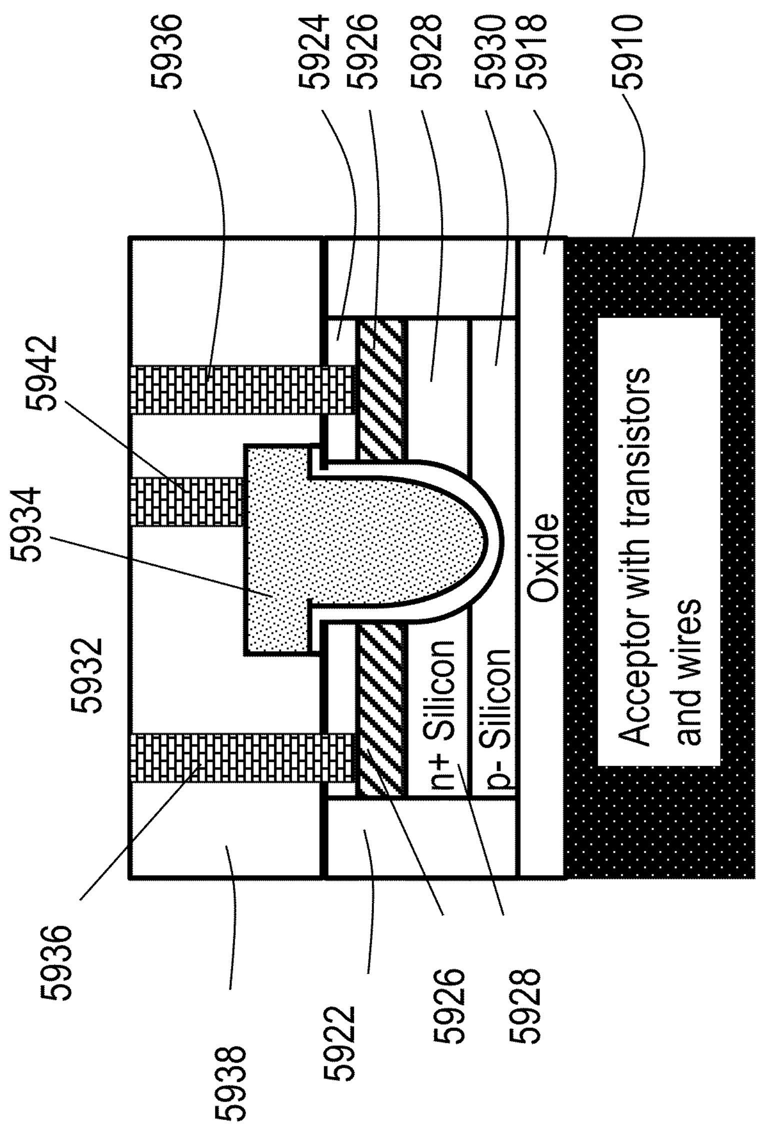

As illustrated in FIG. 59I, a low temperature thick oxide 5938 is deposited and source, gate, and drain contacts, and thru layer via (not shown) openings are masked and etched preparing the transistors to be connected via metallization. Thus gate contact 5942 connects to gate electrode 5934, and source & drain contacts 5936 connect to metal silicide source and drain regions 5926.

Persons of ordinary skill in the art will appreciate that the illustrations in FIGS. 59A through 59I are exemplary only and are not drawn to scale. Such skilled persons will further appreciate that many variations are possible such as, for example, the temporary carrier substrate may be replaced by a carrier wafer and a permanently bonded carrier wafer flow may be employed. Many other modifications within the scope of the invention will suggest themselves to such skilled persons after reading this specification. Thus the invention is to be limited only by the appended claims.

While the "silicide-before-layer-transfer" process flow described in FIG. 59A-I can be used for many sub-400° C. 3D stacking applications, alternative approaches exist. Silicon forms silicides with many materials such as nickel, cobalt, platinum, titanium, manganese, etc. By alloying two materials, one of which has a silicidation temperature greater than 400° C. and one of which has a silicidation temperature less than 400° C., in a certain ratio, the silicidation temperature of the alloy can be reduced to below 400° C. For example, nickel silicide has a silicidation temperature of 400-450° C., while platinum silicide has a silicidation temperature of 300° C. By depositing an alloy of Nickel and Platinum (in a certain ratio) on a silicon region and then annealing to form a silicide, one could lower the silicidation temperature to less than 400° C. Another example could be deposition of an alloy of Nickel and Palladium (in a certain ratio) on a silicon region and then annealing to form a silicide, one could lower the silicidation temperature to less than 400° C. As mentioned below, Nickel Silicide forms at 400-450° C., while Palladium Silicide forms at around 250° C. By forming a mixture of these two silicides, one can lower silicidation temperature to less than 400° C.

One can also create strained silicon regions at less than 400° C. by depositing dielectric strain-inducing layers around recessed channel devices and junctionless transistors in STI regions, in pre-metal dielectric regions, in contact etch stop layers and also in other regions around these transistors.

Section 12: a Logic Technology with Shared Lithography Steps

Lithography costs for semiconductor manufacturing today form a dominant percentage of the total cost of a processed wafer. In fact, some estimates describe lithography cost as being more than 50% of the total cost of a processed wafer. In this scenario, reduction of lithography cost is very important.

FIG. 60A-J describes an embodiment of this invention, where a process flow is described in which a single lithography step is shared among many wafers. Although the process flow is described with respect to a side gated monocrystalline junction-less transistor, it will be obvious to one with ordinary skill in the art that it can be modified and applied to other types of transistors, such as, for example, FINFETs and planar CMOS MOSFETs. The process flow for the silicon chip may include the following steps that occur in sequence from Step (A) to Step (I). When the same reference numbers are used in different drawing figures (among FIG. 60A-J), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 60A:
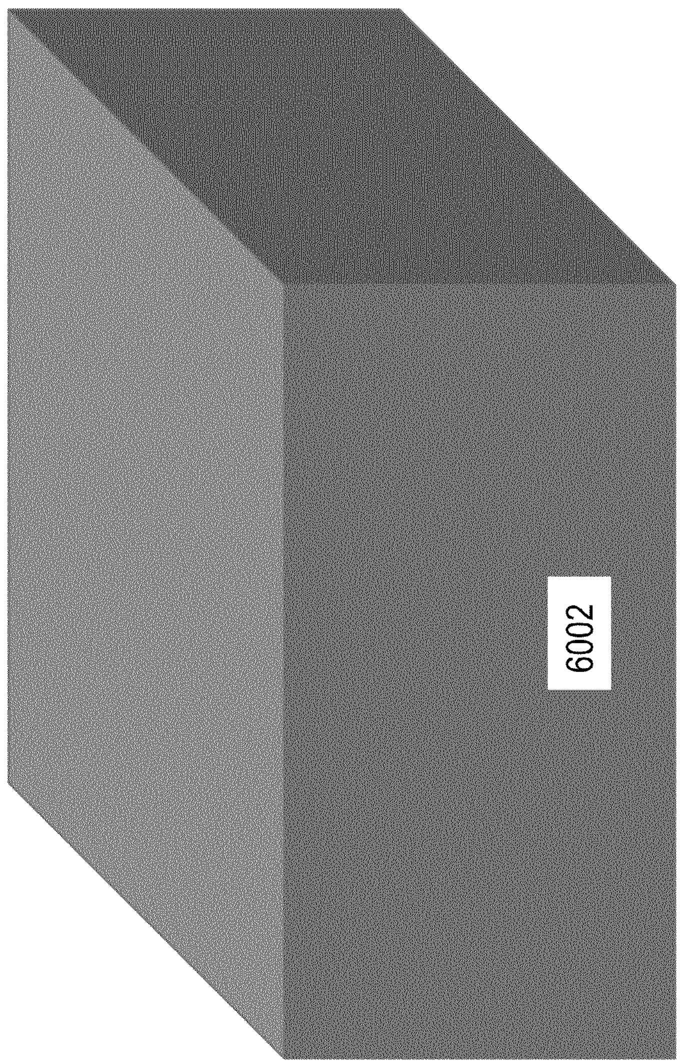
FIG. 60A-J illustrate a process flow for manufacturing junctionless transistors with reduced lithography steps.

Step (A) is illustrated with FIG. 60A. A p− Silicon wafer 6002 is taken.

Figure 60B:
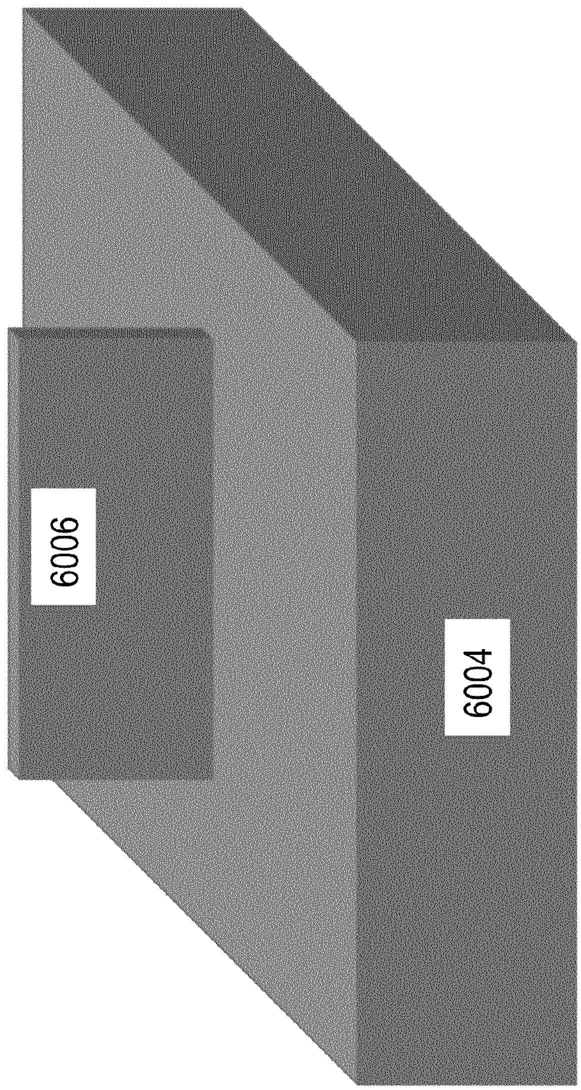

Step (B) is illustrated with FIG. 60B. N+ and p+ dopant regions may be implanted into the p− Silicon wafer 6002 of FIG. 60A. A thermal anneal, such as, for example, rapid, furnace, spike, or laser may then be done to activate dopants. Following this, a lithography and etch process may be conducted to define p− silicon region 6004 and n+ silicon region 6006. Regions with p+ silicon where p-JLTs are fabricated are not shown.

Figure 60C:
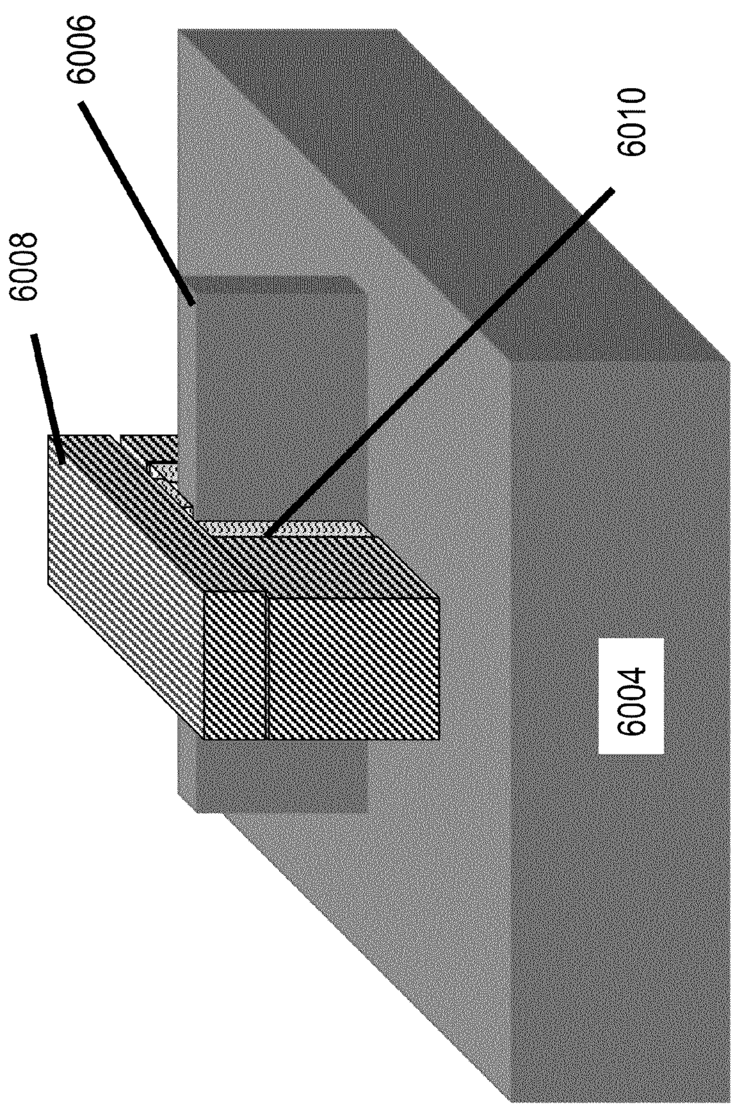

Step (C) is illustrated with FIG. 60C. Gate dielectric regions 6010 and gate electrode regions 6008 may be formed by oxidation or deposition of a gate dielectric, then deposition of a gate electrode, polishing with CMP and then lithography and etch. The gate electrode regions 6008 are preferably doped polysilicon. Alternatively, various hi-k metal gate (HKMG) materials could be utilized for gate dielectric and gate electrode as described previously.

Figure 60D:
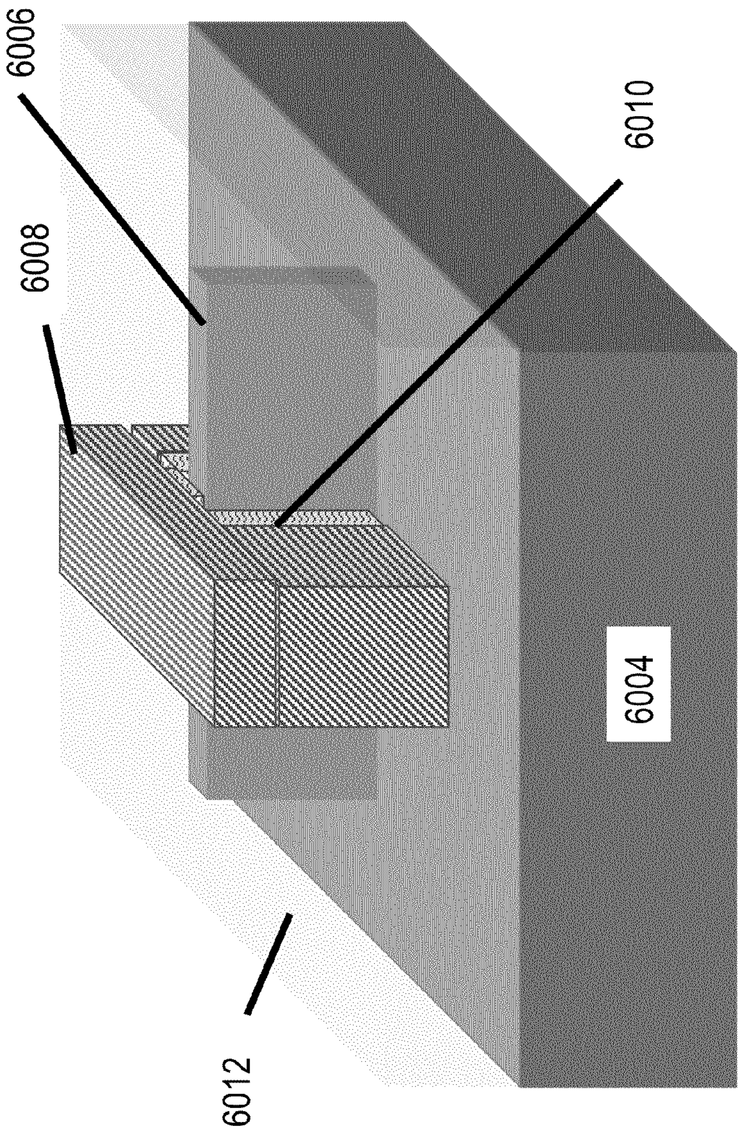

Step (D) is illustrated with FIG. 60D. Silicon dioxide regions 6012 may be formed by deposition and may then be planarized and polished with CMP such that the silicon dioxide regions 6012 cover p− silicon regions 6004, n+ silicon regions 6006, gate electrode regions 6008 and gate dielectric regions 6010.

Figure 60E:
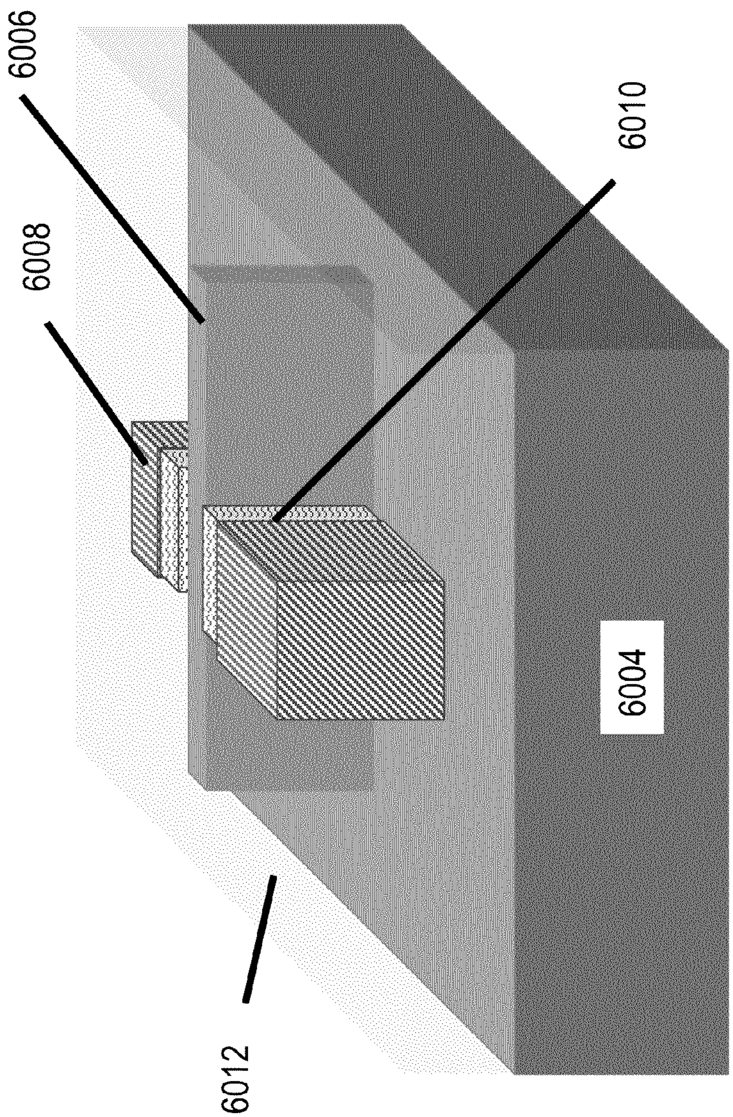

Step (E) is illustrated with FIG. 60E. The structure shown in FIG. 60D may be further polished with CMP such that portions of oxide regions 6012, gate electrode regions 6008, gate dielectric regions 6010 and n+ silicon regions 6006 are polished. Following this, a silicon dioxide layer may be deposited over the structure.

Figure 60F:
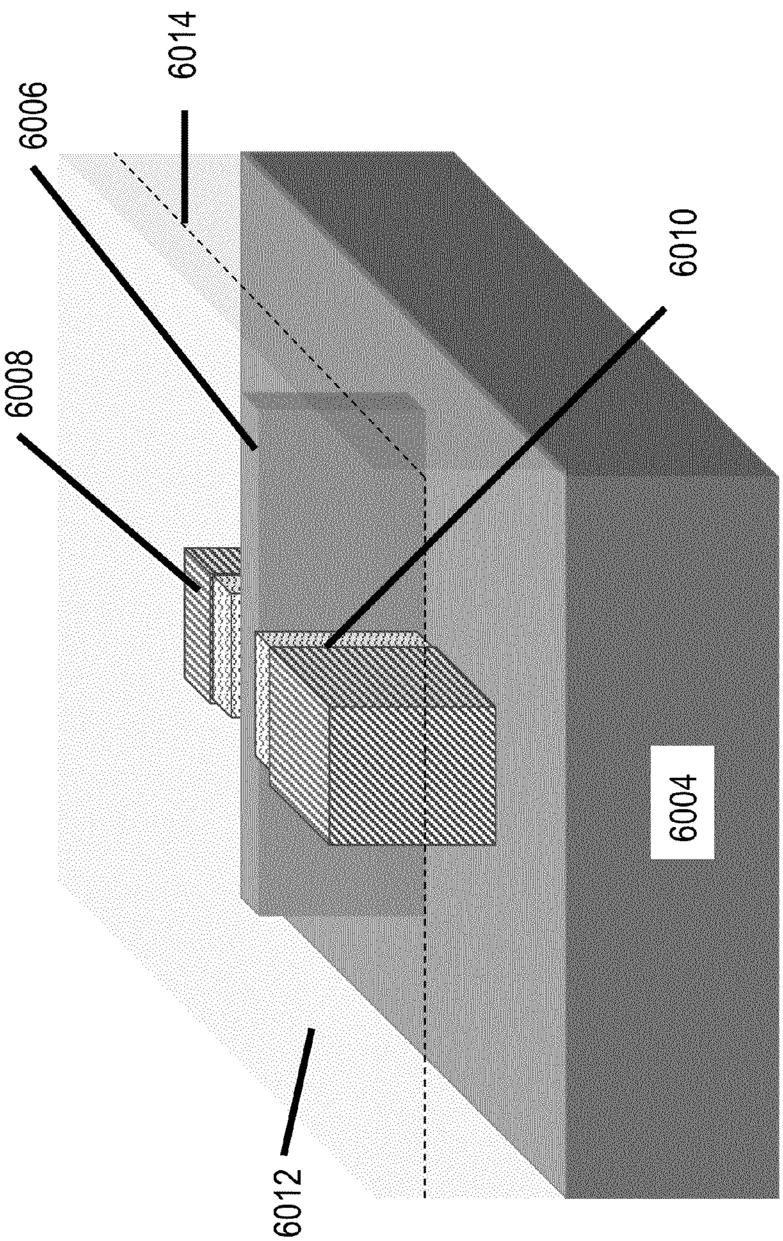

Step (F) is illustrated with FIG. 60F. Hydrogen H+ may be implanted into the structure at a certain depth creating hydrogen plane 6014 indicated by dotted lines.

Figure 60G:
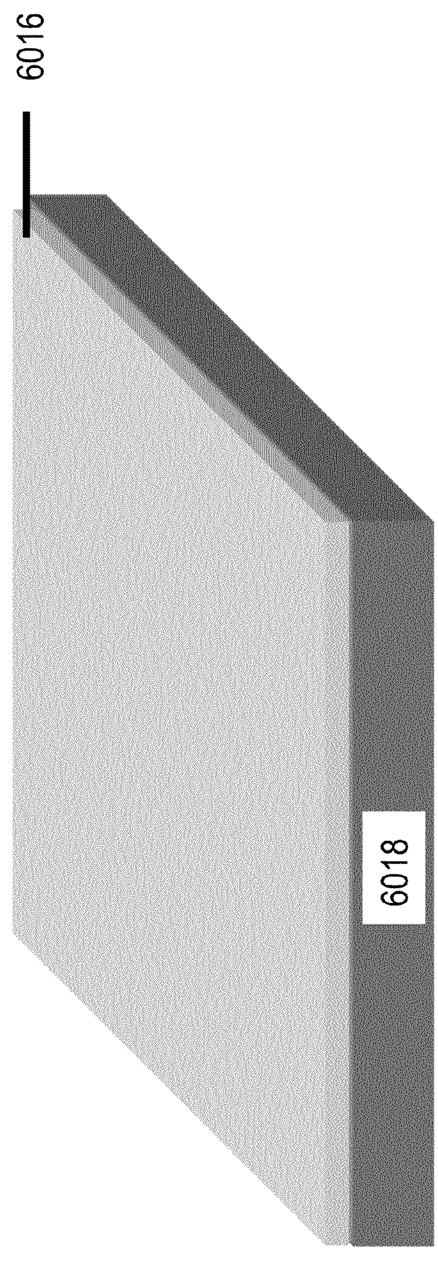
Figure 60H:
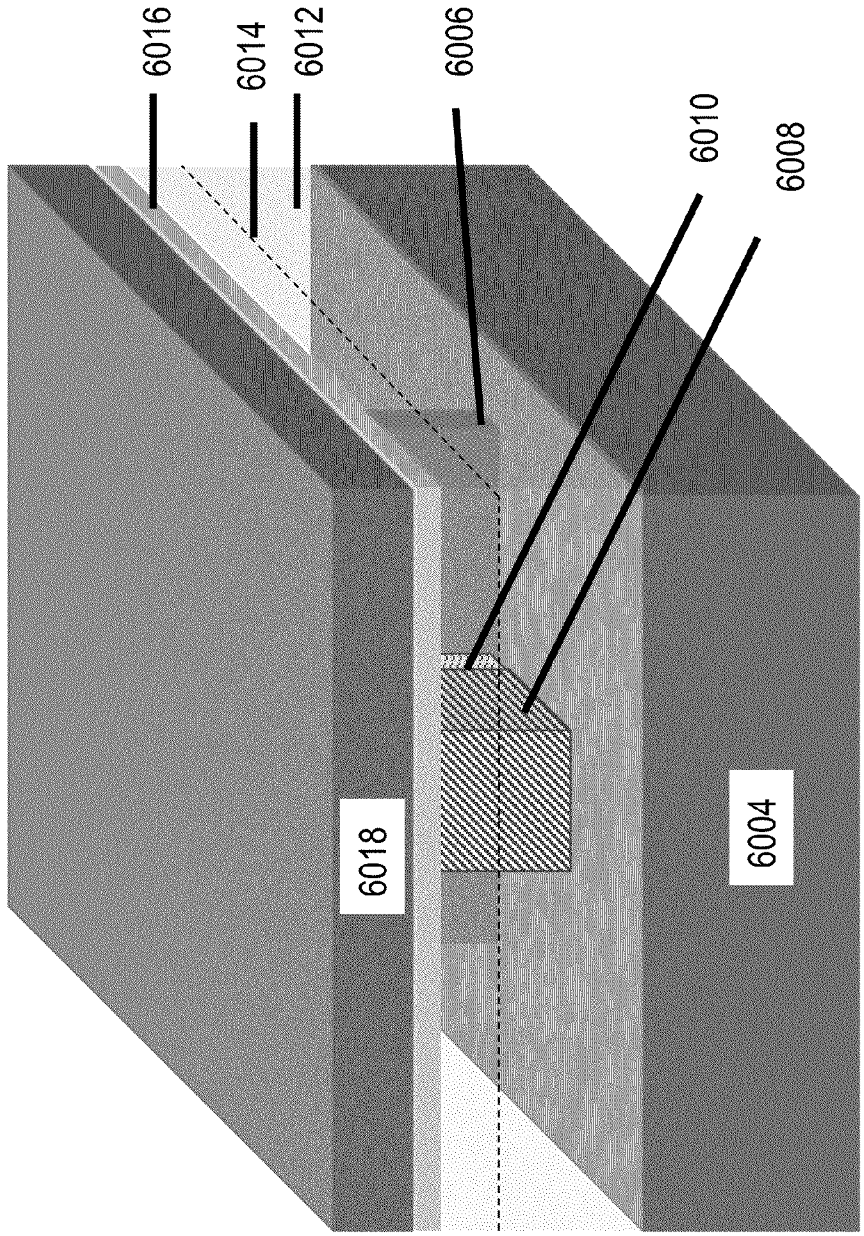

Step (G) is illustrated with FIG. 60G. A silicon wafer 6018 may have a silicon dioxide layer 6016 deposited atop it. Step (H) is illustrated with FIG. 60H. The structure shown in FIG. 60G may be flipped and bonded atop the structure shown in FIG. 60F using oxide-to-oxide bonding.

Figure 60I:
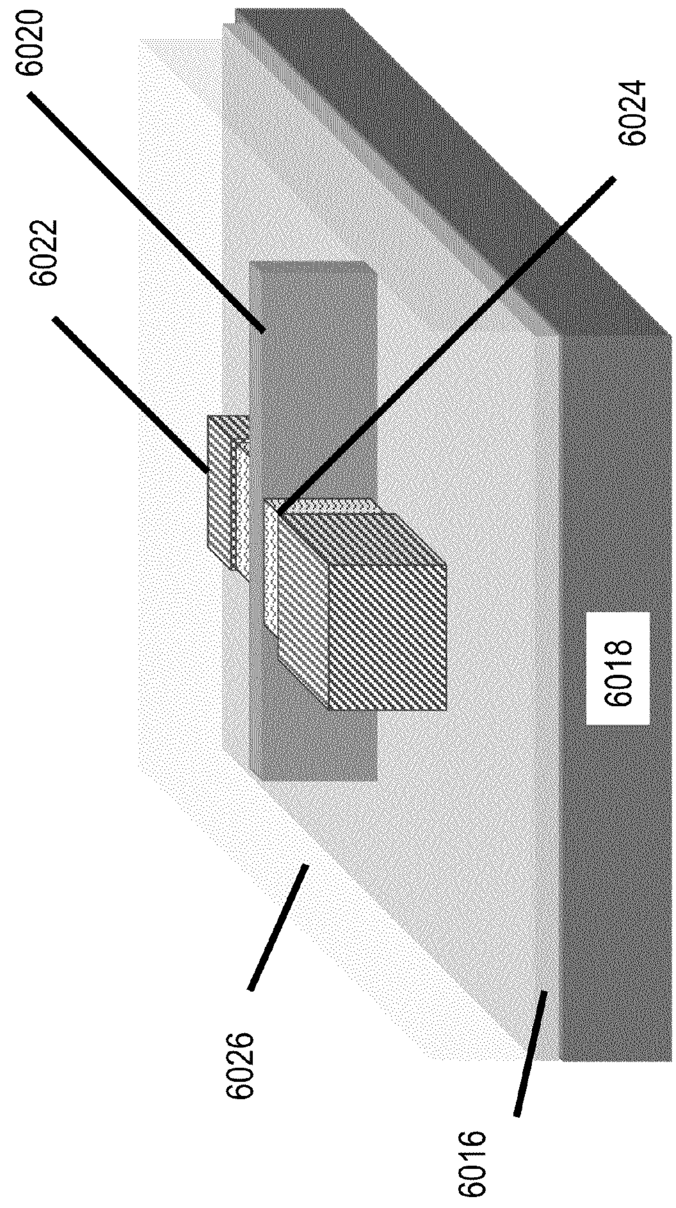
Figure 60J:
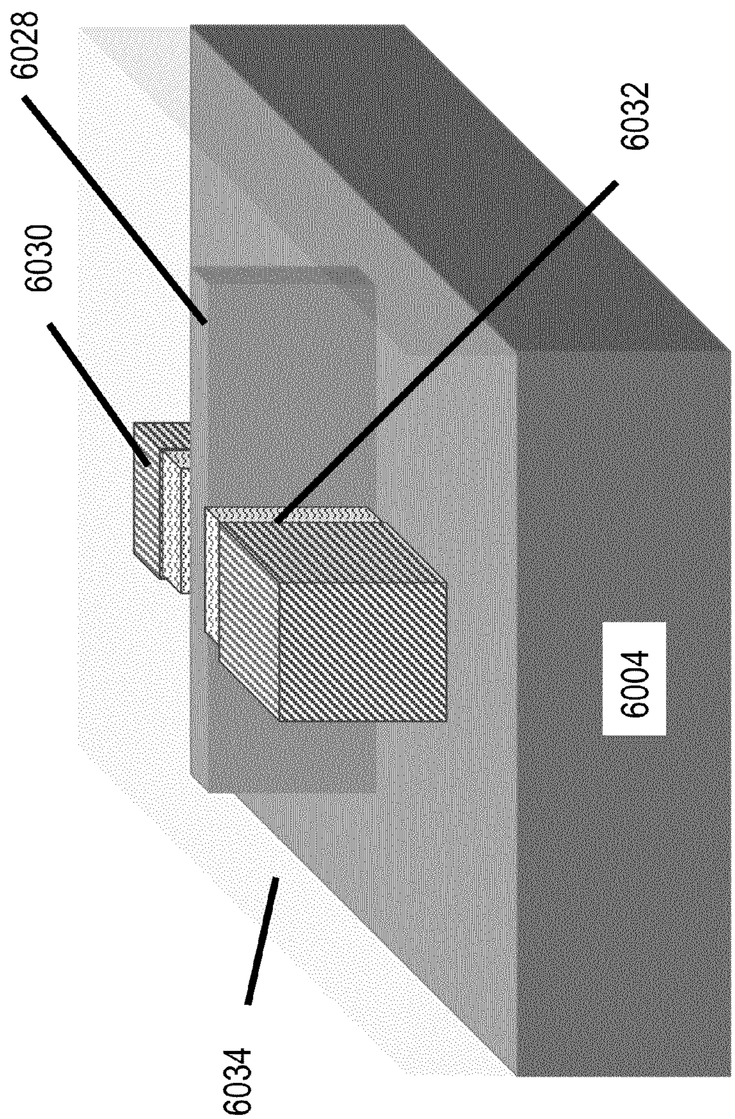

Step (I) is illustrated with FIG. 60I and FIG. 60J. The structure shown in FIG. 60H may be cleaved at hydrogen plane 6014 using a sideways mechanical force. Alternatively, a thermal anneal, such as, for example, furnace or spike, could be used for the cleave process. Following the cleave process, CMP steps may be done to planarize surfaces. FIG. 60I shows silicon wafer 6018 having an oxide layer 6016 and patterned features transferred atop it. These patterned features may include gate dielectric regions 6024, gate electrode regions 6022, n+ silicon channel 6020 and silicon dioxide regions 6026. These patterned features may be used for further fabrication, with contacts, interconnect levels and other steps of the fabrication flow being completed. FIG. 60J shows the substrate 6004 having patterned transistor layers. These patterned transistor layers include gate dielectric regions 6032, gate electrode regions 6030, n+ silicon regions 6028 and silicon dioxide regions 6034. The structure in FIG. 60J may be used for transferring patterned layers to other substrates similar to the one shown in FIG. 60G using processes similar to those described in FIG. 60E-J. Essentially, a set of patterned features created with lithography steps once (such as the one shown in FIG. 60E) may be layer transferred to many wafers, thereby removing the requirement for separate lithography steps for each wafer. Lithography cost can be reduced significantly using this approach.

Implanting hydrogen through the gate dielectric region 6010 in FIG. 60F may not degrade the dielectric quality, since the area exposed to implant species is small (a gate dielectric is typically 2 nm thick, and the channel length is typically <20 nm, so the exposed area to the implant species is just 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of this invention may involve forming a dummy gate transistor structure, as previously described for the replacement gate process, for the structure shown in FIG. 60I. Post cleave, the gate electrode material 6022 and the gate dielectric material 6024 may be etched away and then the trench may be filled with a replacement gate dielectric and a replacement gate electrode.

In an alternative embodiment of the invention described in FIG. 60A-J, the substrate 6018 in FIG. 60A-J may be a wafer with one or more pre-fabricated transistor and interconnect layers. Low temperature (less than approximately 400° C.) bonding and cleave techniques as previously described may be employed. In that scenario, 3D stacked logic chips may be formed with fewer lithography steps. Alignment schemes similar to those described in Section 2 may be used.

FIG. 61A-K describes an alternative embodiment of this invention, wherein a process flow is described in which a side gated monocrystalline Finfet is formed with lithography steps shared among many wafers. The process flow for the silicon chip may include the following steps that occur in sequence from Step (A) to Step (J). When the same reference numbers are used in different drawing figures (among FIG. 61A-K), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 61A:
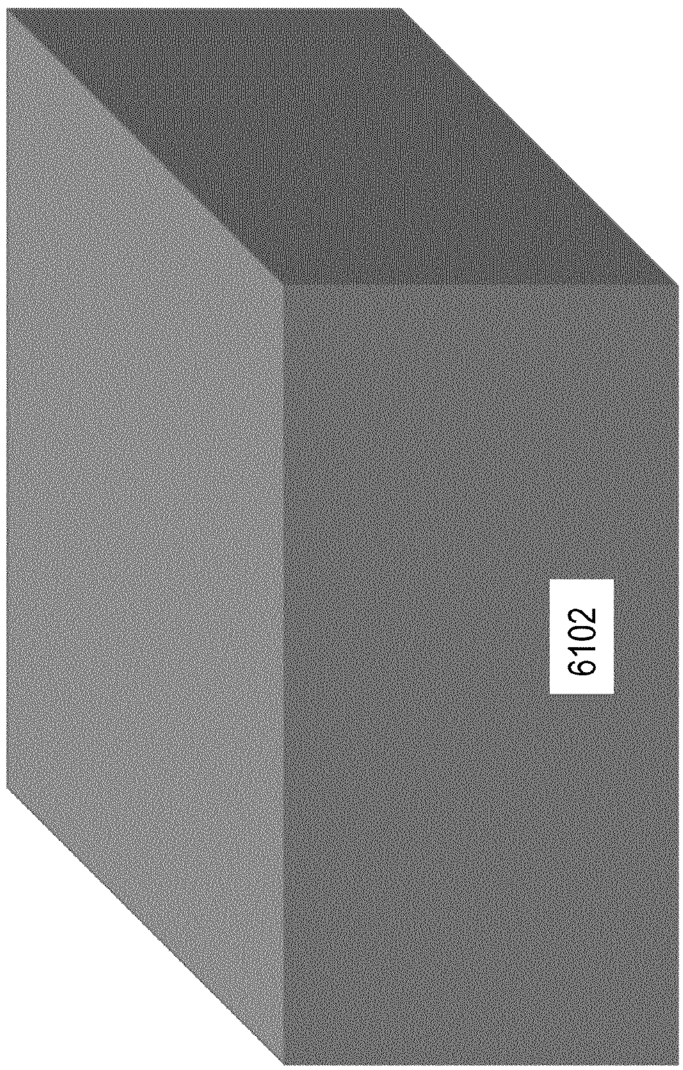
FIG. 61A-K illustrate a process flow for manufacturing Finfets with reduced lithography steps.

Step (A) is illustrated with FIG. 61A. An n− Silicon wafer 6102 is taken.

Figure 61B:
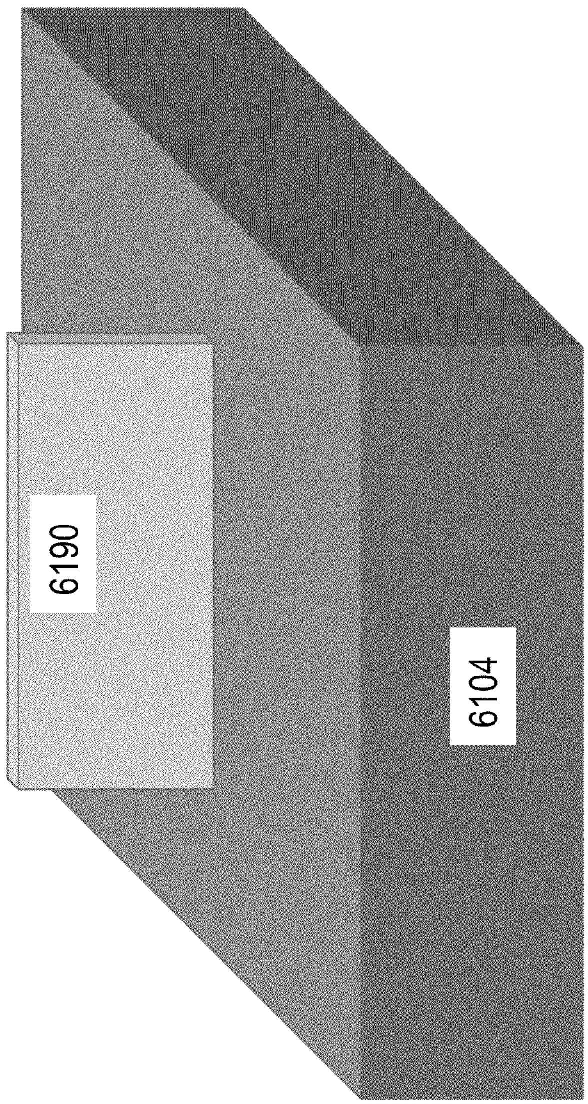

Step (B) is illustrated with FIG. 61B. P type dopant, such as, for example, Boron ions, may be implanted into the n− Silicon wafer 6102 of FIG. 61A. A thermal anneal, such as, for example, rapid, furnace, spike, or laser may then be done to activate dopants. Following this, a lithography and etch process may be conducted to define n− silicon region 6104 and p− silicon region 6190. Regions with n− silicon, similar in structure and formation to p− silicon region 6190, where p− finfets are fabricated, are not shown.

Figure 61C:
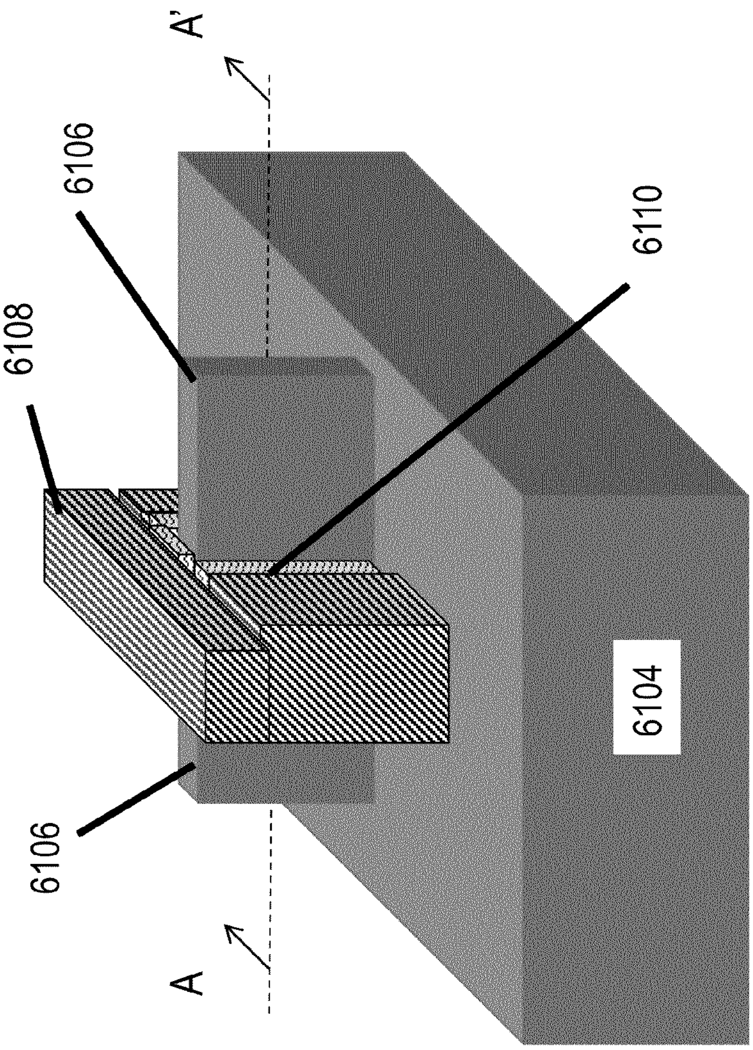
Figure 61D:
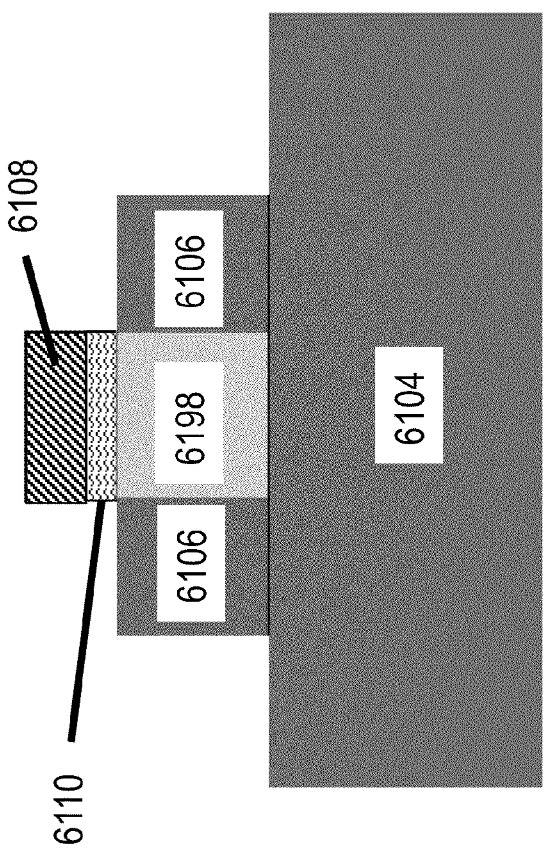

Step (C) is illustrated with FIG. 61C. Gate dielectric regions 6110 and gate electrode regions 6108 may be formed by oxidation or deposition of a gate dielectric, then deposition of a gate electrode, polishing with CMP, and then lithography and etch. The gate electrode regions 6108 are preferably doped polysilicon. Alternatively, various hi-k metal gate (HKMG) materials could be utilized for gate dielectric and gate electrode as described previously. N+ dopants, such as, for example, Arsenic, Antimony or Phosphorus, may then be implanted to form source and drain regions of the Finfet. The n+ doped source and drain regions are indicated as 6106. FIG. 61D shows a cross-section of FIG. 61C along the AA' direction. P− doped region 6198 can be observed, as well as n+ doped source and drain regions 6106, gate dielectric region 6110, gate electrode region 6108, and n− silicon region 6104.

Figure 61E:
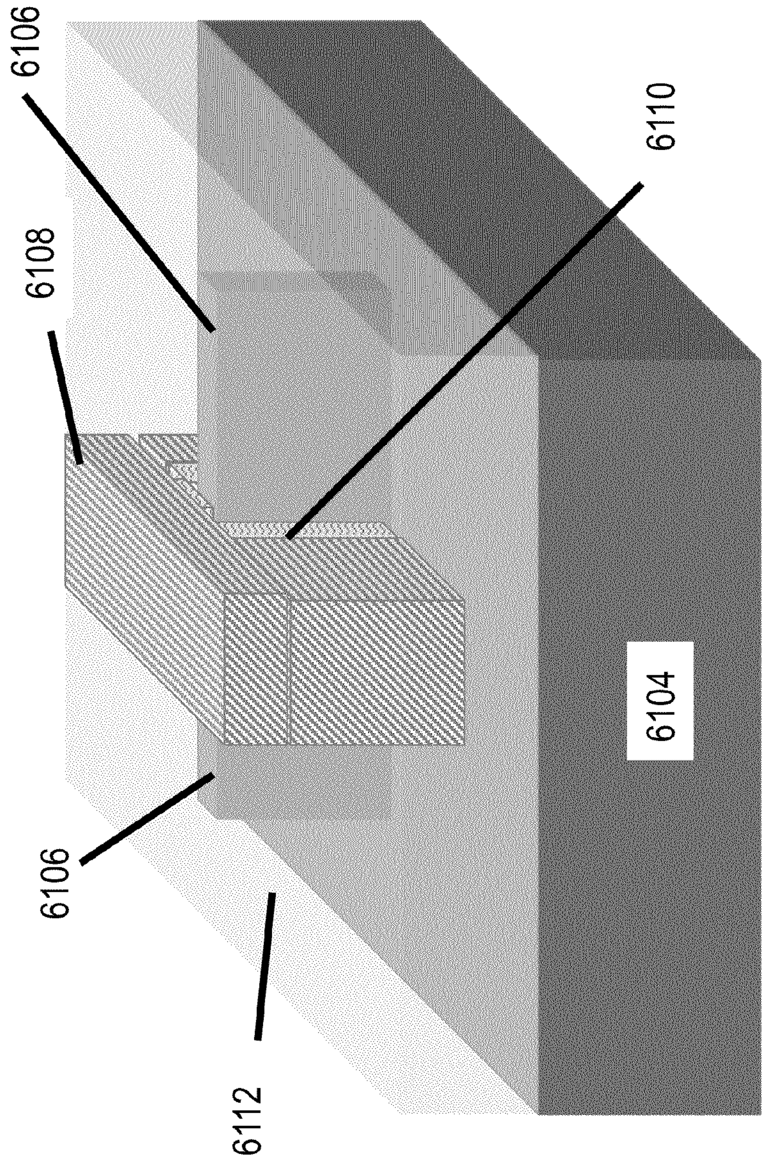

Step (D) is illustrated with FIG. 61E. Silicon dioxide regions 6112 may be formed by deposition and may then be planarized and polished with CMP such that the silicon dioxide regions 6112 cover n+ silicon regions 6104, n+ doped source and drain regions 6106, gate electrode region 6108, p− doped region 6198, and gate dielectric region 6110.

Figure 61F:
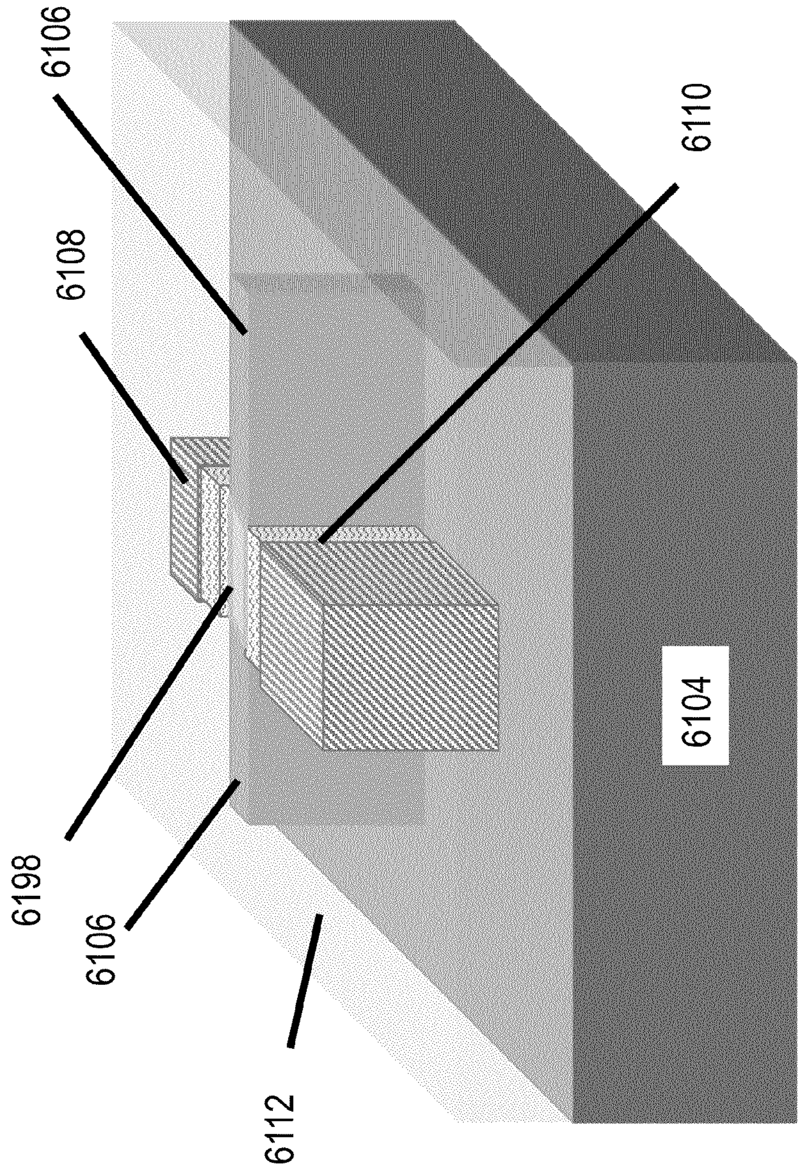

Step (E) is illustrated with FIG. 61F. The structure shown in FIG. 61E may be further polished with CMP such that portions of oxide regions 6112, gate electrode regions 6108, gate dielectric regions 6110, p− doped silicon regions 6198, and n+ doped source and drain regions 6106 are polished. Following this, a silicon dioxide layer may be deposited over the structure.

Figure 61G:
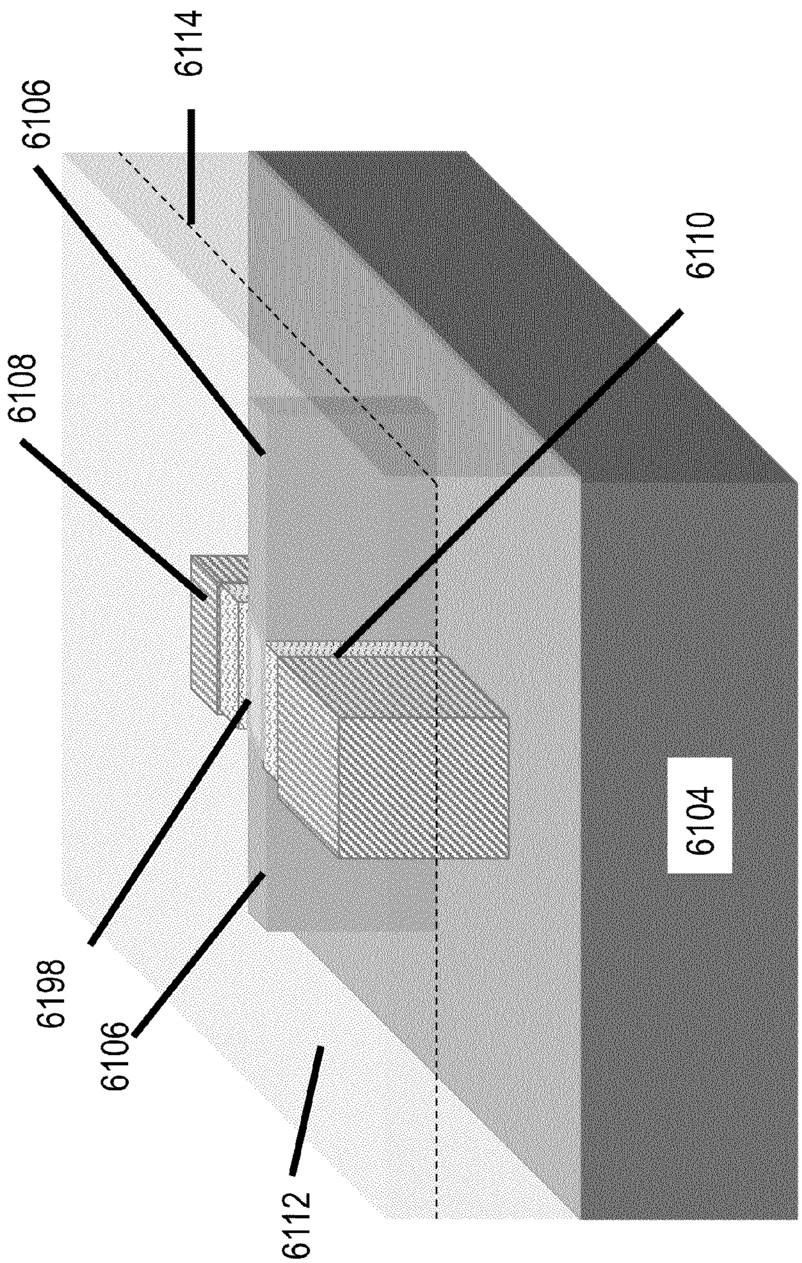

Step (F) is illustrated with FIG. 61G. Hydrogen H+ may be implanted into the structure at a certain depth creating hydrogen plane 6114 indicated by dotted lines.

Figure 61H:
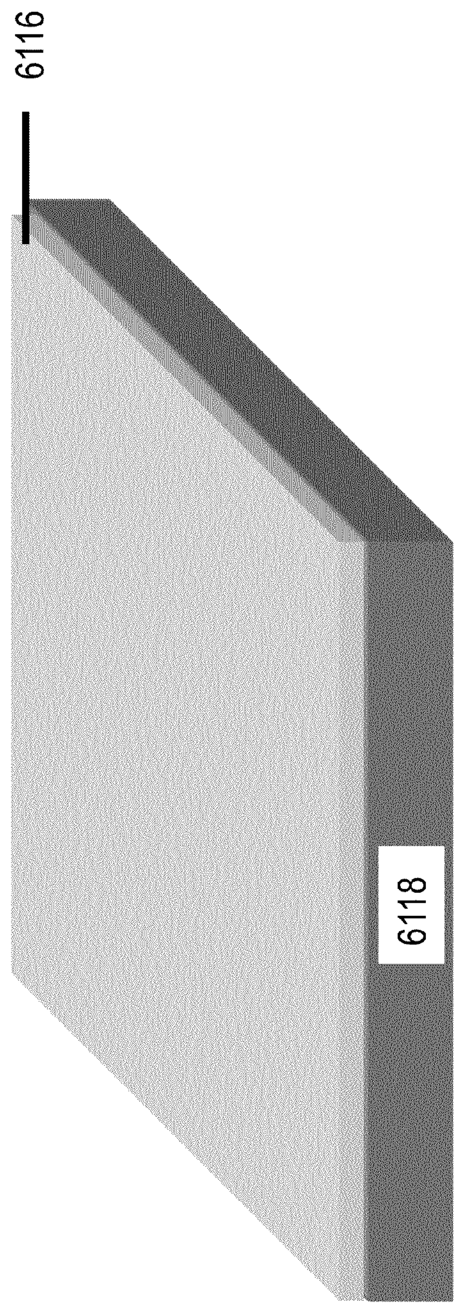

Step (G) is illustrated with FIG. 61H. A silicon wafer 6118 may have a silicon dioxide layer 6116 deposited atop it.

Figure 61I:
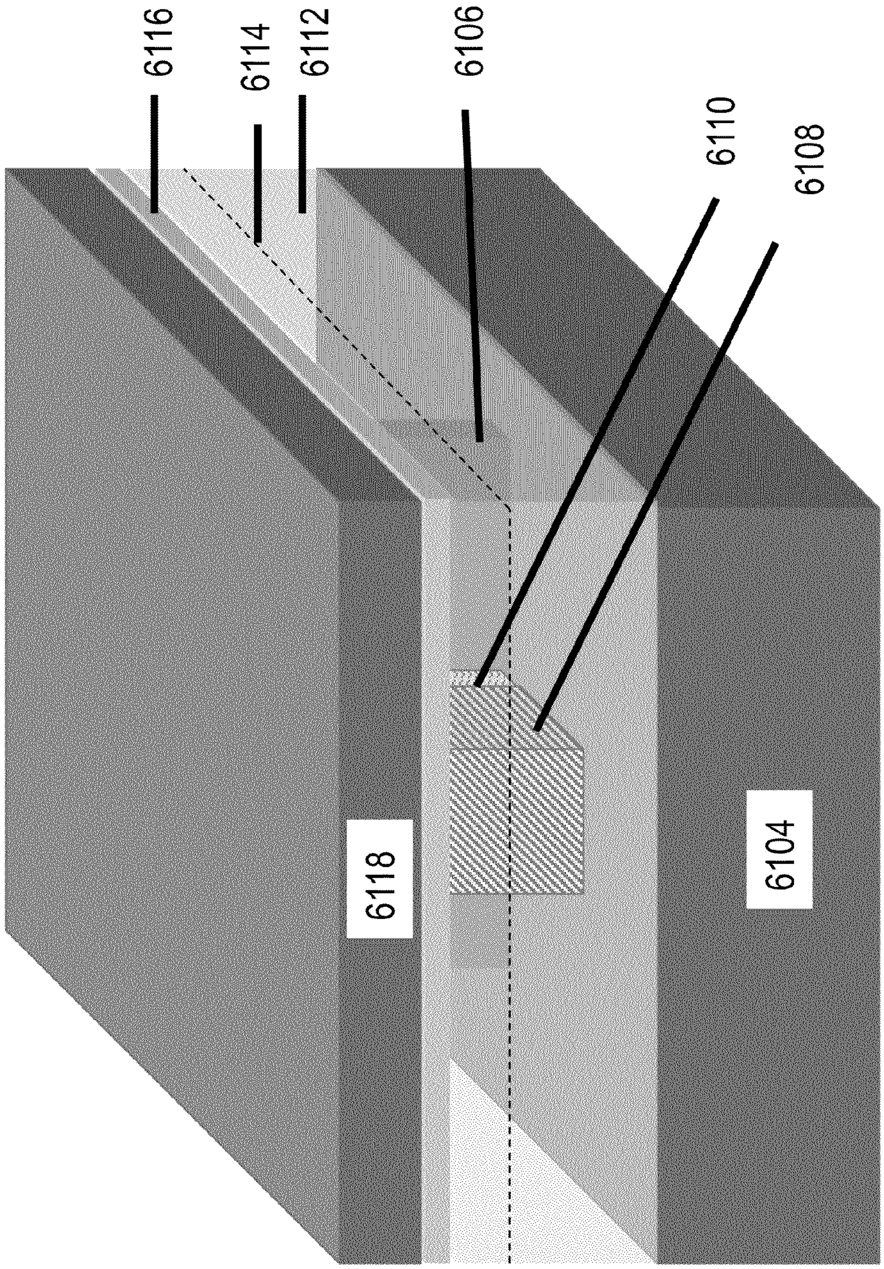

Step (H) is illustrated with FIG. 61I. The structure shown in FIG. 61H may be flipped and bonded atop the structure shown in FIG. 60G using oxide-to-oxide bonding.

Figure 61J:
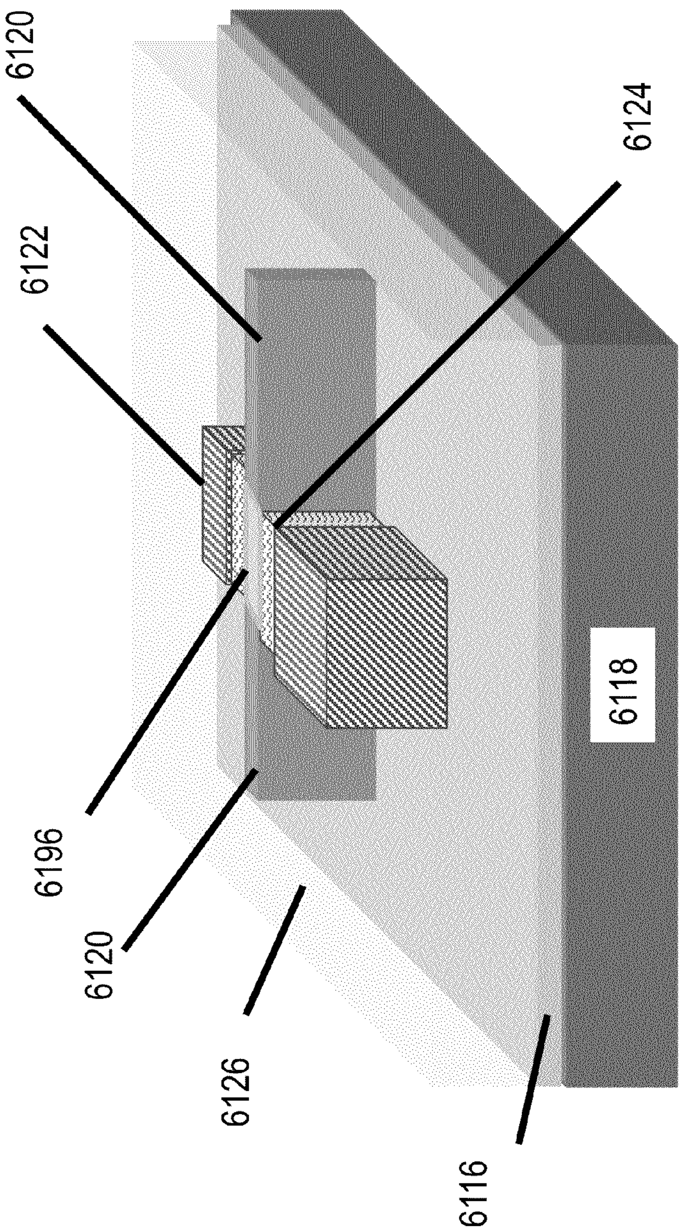
Figure 61K:
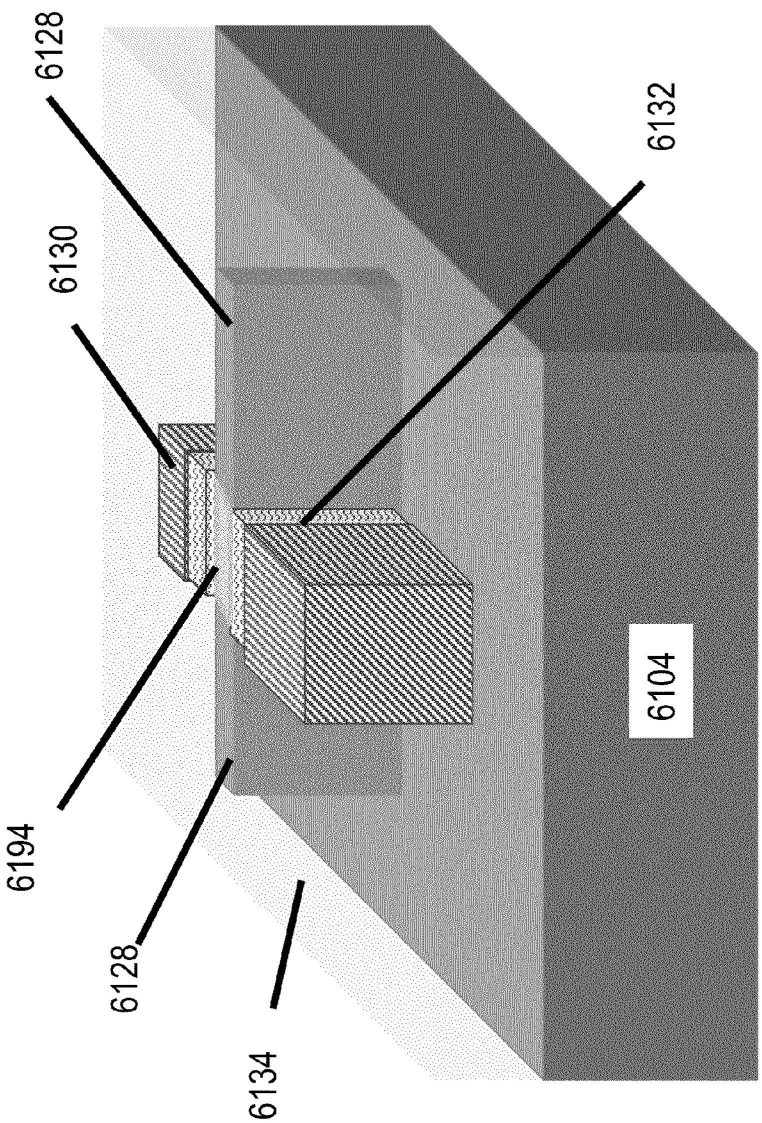

Step (I) is illustrated with FIG. 61J and FIG. 61K. The structure shown in FIG. 61J may be cleaved at hydrogen plane 6114 using a sideways mechanical force. Alternatively, a thermal anneal, such as, for example, furnace or spike, could be used for the cleave process. Following the cleave process, CMP processes may be done to planarize surfaces. FIG. 61J shows silicon wafer 6118 having an oxide layer 6116 and patterned features transferred atop it. These patterned features may include gate dielectric regions 6124, gate electrode regions 6122, n+ silicon region 6120, p− silicon region 6196 and silicon dioxide regions 6126. These patterned features may be used for further fabrication, with contacts, interconnect levels and other steps of the fabrication flow being completed. FIG. 61K shows the substrate 6104 having patterned transistor layers. These patterned transistor layers include gate dielectric regions 6132, gate electrode regions 6130, n+ silicon regions 6128 and silicon dioxide regions 6134. The structure in FIG. 61K may be used for transferring patterned layers to other substrates similar to the one shown in FIG. 61H using processes similar to those described in FIG. 61G-K. Essentially, a set of patterned features created with lithography steps once (such as the one shown in FIG. 61F) may be layer transferred to many wafers, thereby removing the requirement for separate lithography steps for each wafer. Lithography cost can be reduced significantly using this approach.

Implanting hydrogen through the gate dielectric region 6110 in FIG. 61G may not degrade the dielectric quality, since the area exposed to implant species is small (a gate dielectric is typically 2 nm thick, and the channel length is typically <20 nm, so the exposed area to the implant species is just 40 sq. nm). Additionally, a thermal anneal or oxidation after the cleave may repair the potential implant damage. Also, a post-cleave CMP polish to remove the hydrogen rich plane within the gate dielectric may be performed.

An alternative embodiment of this invention may involve forming a dummy gate transistor structure, as previously described for the replacement gate process, for the structure shown in FIG. 61J. Post cleave, the gate electrode material 6122 and the gate dielectric material 6124 may be etched away and then the trench may be filled with a replacement gate dielectric and a replacement gate electrode.

In an alternative embodiment of the invention described in FIG. 61A-K, the substrate 6118 in FIG. 61A-K may be a wafer with one or more pre-fabricated transistor and interconnect layers. Low temperature (less than approximately 400° C.) bonding and cleave techniques as previously described may be employed. In that scenario, 3D stacked logic chips may be formed with fewer lithography steps. Alignment schemes similar to those described in Section 2 may be used.

FIG. 62A-G describes another embodiment of this invention, wherein a process flow is described in which a planar monocrystalline transistor is formed with lithography steps shared among many wafers. The process flow for the silicon chip may include the following steps that occur in sequence from Step (A) to Step (F). When the same reference numbers are used in different drawing figures (among FIG. 62A-G), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 62A:
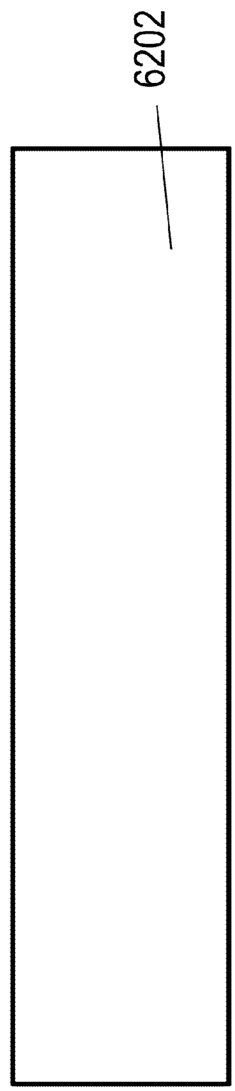
FIG. 62A-G illustrate a process flow for manufacturing planar transistors with reduced lithography steps.

Step (A) is illustrated using FIG. 62A. A p− silicon wafer 6202 is taken.

Figure 62B:
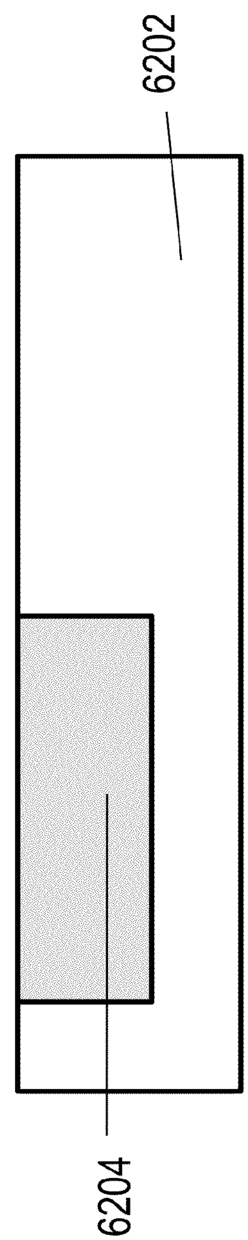

Step (B) is illustrated using FIG. 62B. An n well implant opening may be lithographically defined and n type dopants, such as, for example, Arsenic or Phosphorous, may be ion implanted into the p− silicon wafer 6202. A thermal anneal, such as, for example, rapid, furnace, spike, or laser may be done to activate the implanted dopants. Thus, n-well region 6204 may be formed.

Figure 62C:
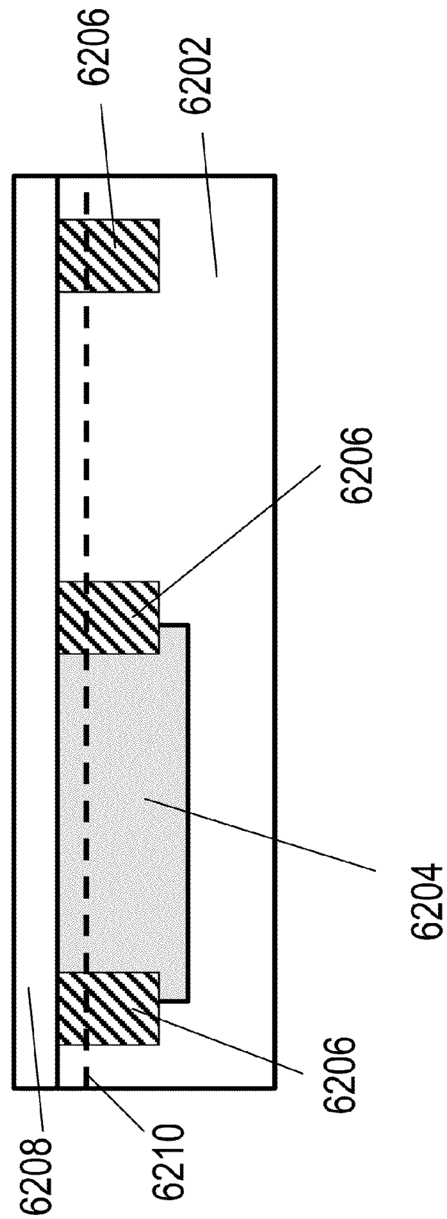

Step (C) is illustrated using FIG. 62C. Shallow trench isolation regions 6206 may be formed, after which an oxide layer 6208 may be grown or deposited. Following this, hydrogen H+ ions may be implanted into the wafer at a certain depth creating hydrogen plane 6210 indicated by dotted lines.

Figure 62D:
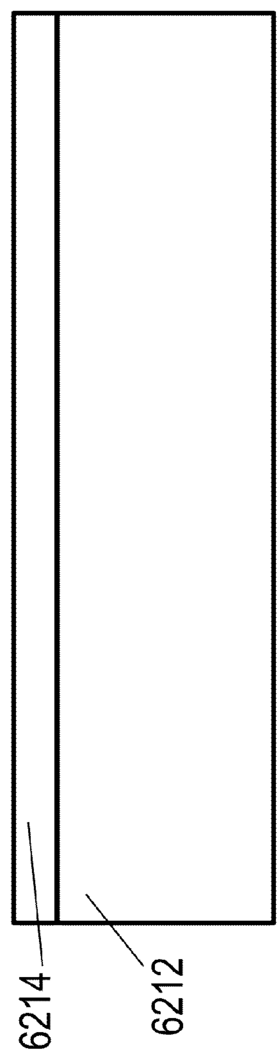

Step (D) is illustrated using FIG. 62D. A silicon wafer 6212 is taken and an oxide layer 6214 may be deposited or grown atop it.

Figure 62E:
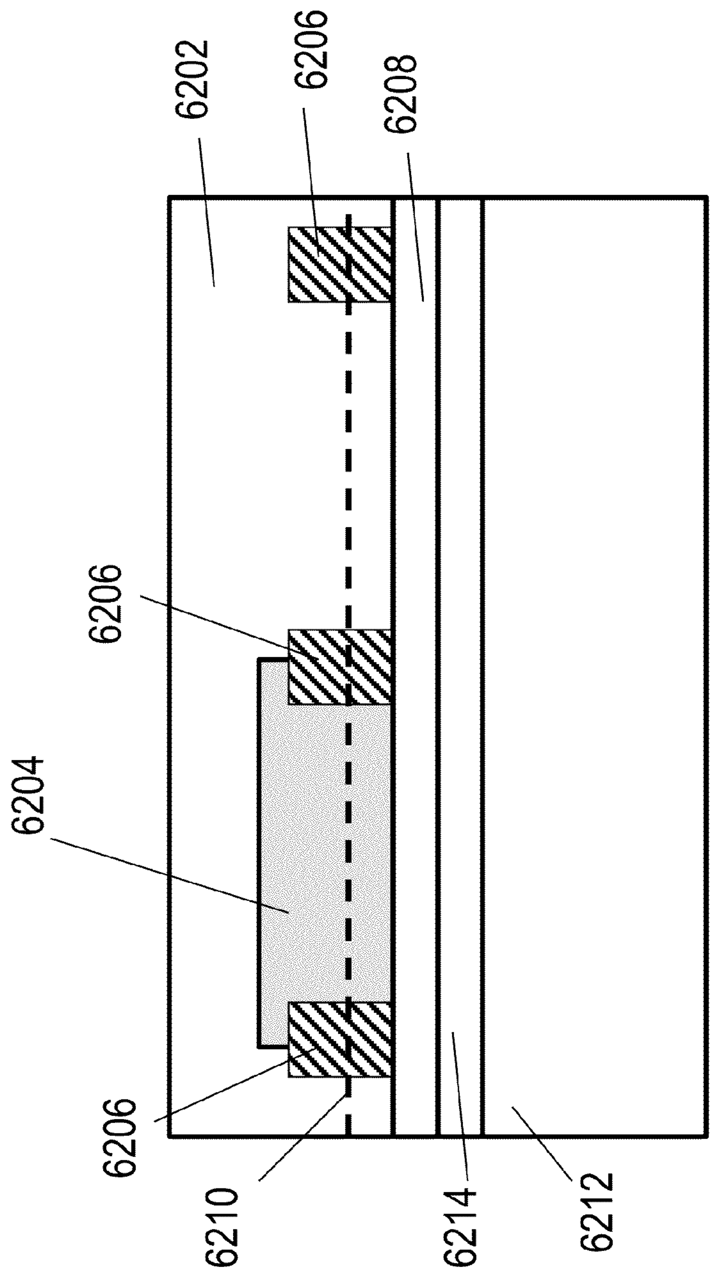

Step (E) is illustrated using FIG. 62E. The structure shown in FIG. 62C may be flipped and bonded atop the structure shown in FIG. 62D using oxide-to-oxide bonding of layers 6214 and 6208.

Figure 62F:
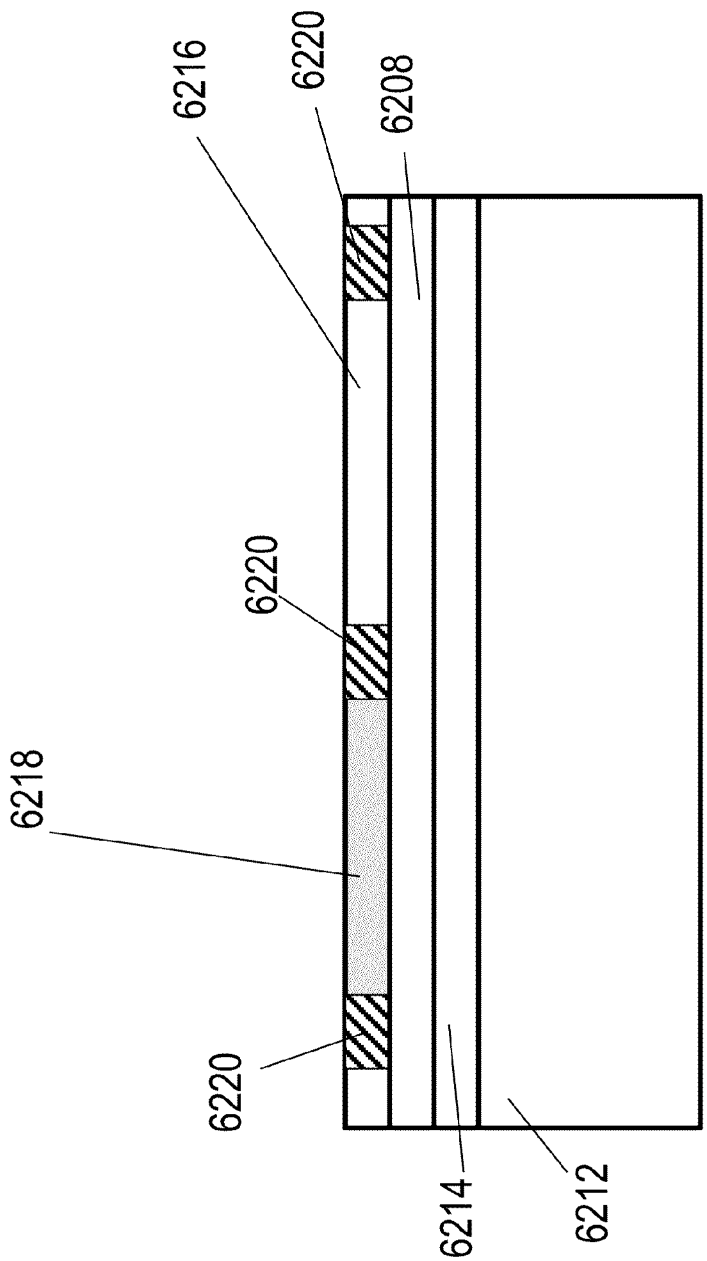
Figure 62G:
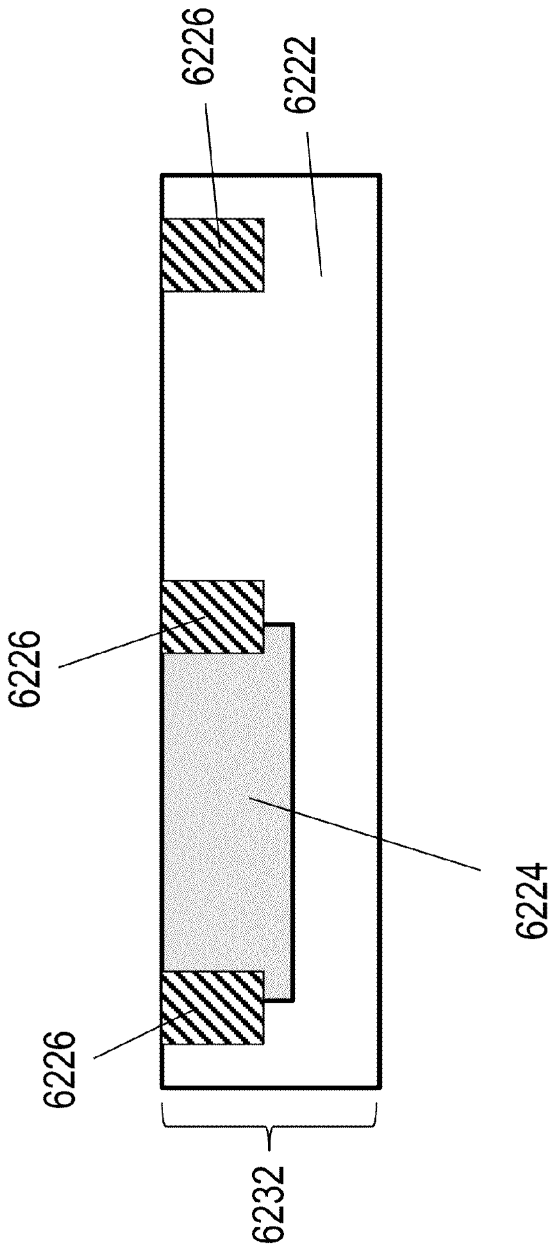

Step (F) is illustrated using FIG. 62F and FIG. 62G. The structure shown in FIG. 62E may be cleaved at hydrogen plane 6210 using a sideways mechanical force. Alternatively, a thermal anneal, such as, for example, furnace or spike, could be used for the cleave process. Following the cleave process, CMP processes may be used to planarize and polish surfaces of both silicon wafers 6212 and 6232. FIG. 62F shows a silicon-on-insulator wafer formed after the cleave and CMP process where p type regions 6216, n type regions 6218 and shallow trench isolation regions 6220 are formed atop oxide regions 6208 and 6214 and silicon wafer 6212. Transistor fabrication may then be completed on the structure shown in FIG. 62F, following which metal interconnects may be formed. FIG. 62G shows wafer 6232 formed after the cleave and CMP process which includes p− silicon regions 6222, n well region 6224 and shallow trench isolation regions 6226. These features may be layer transferred to other wafers similar to the one shown in FIG. 62D using processes similar to those shown in FIG. 62E-G. Essentially, a single set of patterned features created with lithography steps once may be layer transferred onto many wafers thereby saving lithography cost.

In an alternative embodiment of the invention described in FIG. 62A-G, the substrate 6212 in FIG. 62A-G may be a wafer with one or more pre-fabricated transistor and metal interconnect layers. Low temperature (less than approximately 400° C.) bonding and cleave techniques as previously described may be employed. In that scenario, 3D stacked logic chips may be formed with fewer lithography steps. Alignment schemes similar to those described in Section 2 may be used.

FIG. 63A-H describes another embodiment of this invention, wherein 3D integrated circuits are formed with fewer lithography steps. The process flow for the silicon chip may include the following steps that occur in sequence from Step (A) to Step (G). When the same reference numbers are used in different drawing figures (among FIG. 63A-H), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 63A:
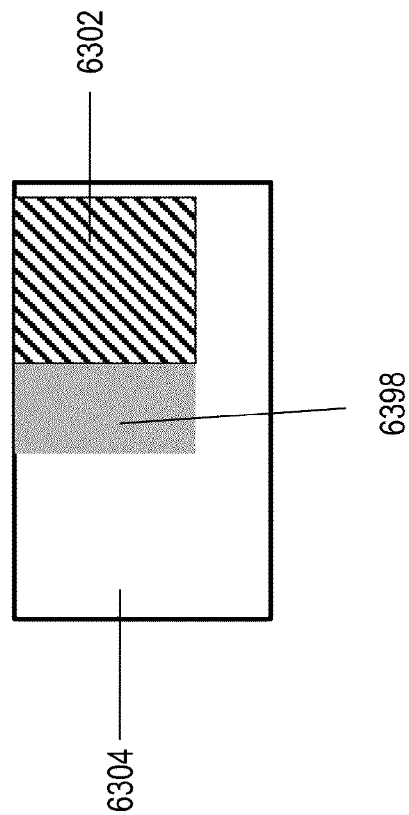
FIG. 63A-H illustrate a process flow for manufacturing 3D stacked planar transistors with reduced lithography steps.

Step (A) is illustrated with FIG. 63A. A p silicon wafer may have n type silicon wells formed in it using standard procedures following which a shallow trench isolation may be formed. 6304 denotes p silicon regions, 6302 denotes n silicon regions and 6398 denotes shallow trench isolation regions.

Figure 63B:
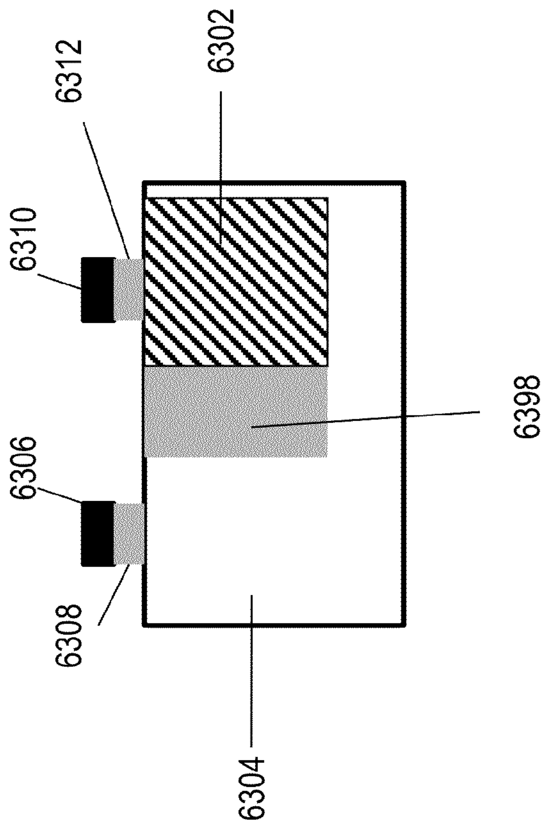

Step (B) is illustrated with FIG. 63B. Dummy gates may be constructed with silicon dioxide and polycrystalline silicon (polysilicon). The term "dummy gates" is used since these gates will be replaced by high k gate dielectrics and metal gates later in the process flow, according to the standard replacement gate (or gate-last) process. This replacement gate process may also be called a gate replacement process. Further details of replacement gate processes are described in "A 45 nm Logic Technology with High-k+Metal Gate Transistors, Strained Silicon, 9 Cu Interconnect Layers, 193 nm Dry Patterning, and 100% Pb-free Packaging," IEDM Tech. Dig., pp. 247-250, 2007 by K. Misty, et al. and "Ultralow-EOT (5 Å) Gate-First and Gate-Last High Performance CMOS Achieved by Gate-Electrode Optimization," IEDM Tech. Dig., pp. 663-666, 2009 by L. Ragnarsson, et al. 6306 and 6310 may be polysilicon gate electrodes while 6308 and 6312 may be silicon dioxide dielectric layers.

Figure 63C:
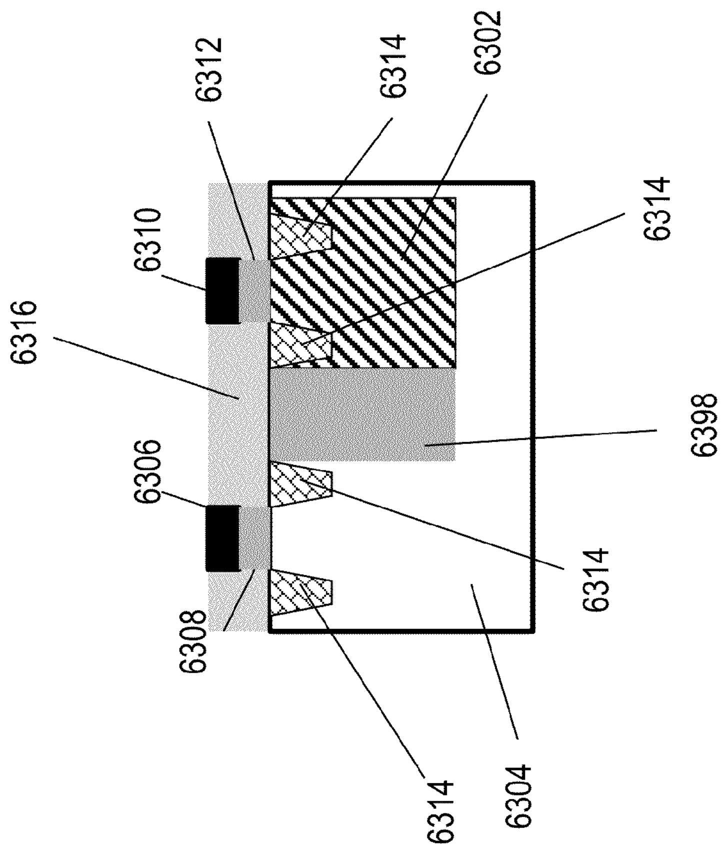

Step (C) is illustrated with FIG. 63C. The remainder of the gate-last transistor fabrication flow up to just prior to gate replacement may proceed with the formation of source-drain regions 6314, strain enhancement layers to improve mobility (not shown), high temperature anneal to activate source-drain regions 6314, formation of inter-layer dielectric (ILD) 6316, and so forth.

Figure 63D:
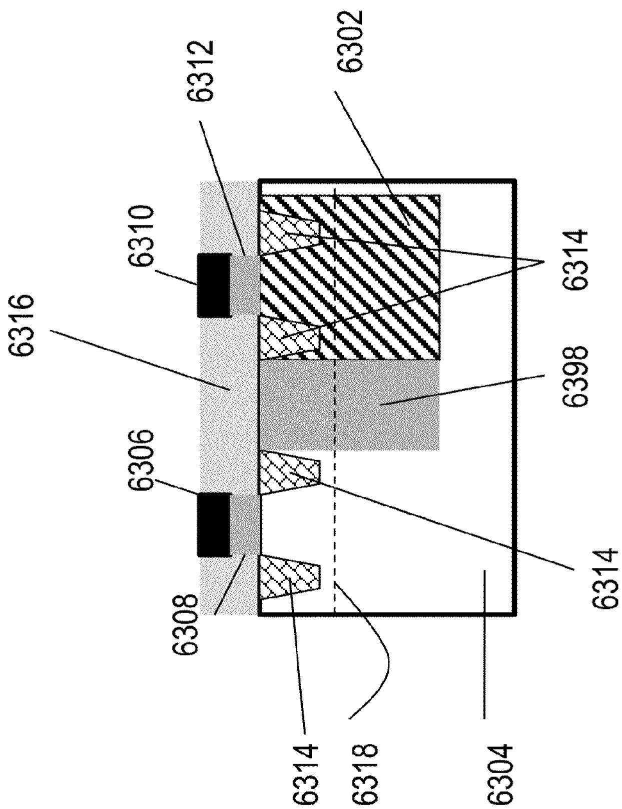

Step (D) is illustrated with FIG. 63D. Hydrogen may be implanted into the wafer creating hydrogen plane 6318 indicated by dotted lines.

Figure 63E:
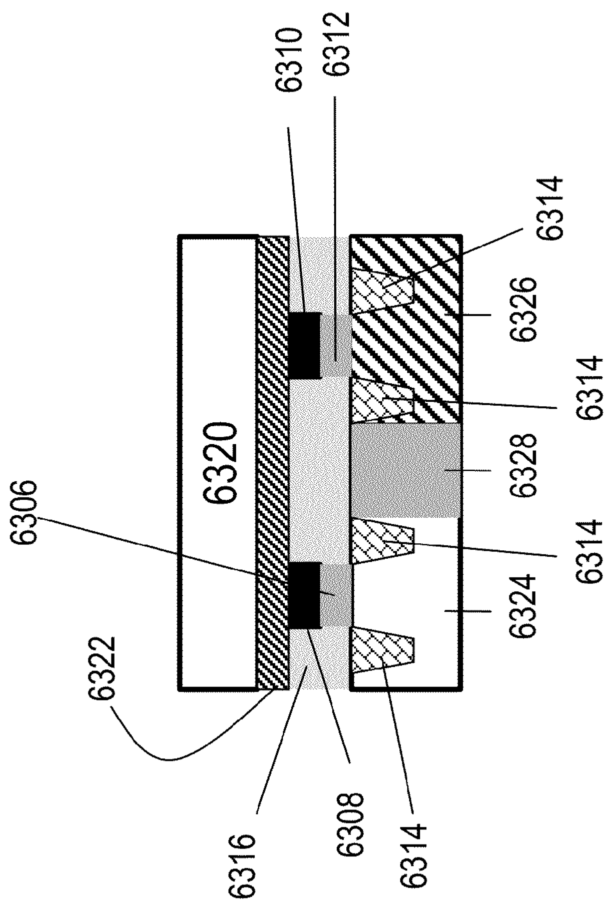

Step (E) is illustrated with FIG. 63E. The wafer after step (D) may be bonded to a temporary carrier wafer 6320 using a temporary bonding adhesive 6322. This temporary carrier wafer 6320 may be constructed of glass. Alternatively, it could be constructed of silicon. The temporary bonding adhesive 6322 may be a polymeric material, such as a polyimide. A thermal anneal or a sideways mechanical force may be utilized to cleave the wafer at the hydrogen plane 6318. A CMP process is then conducted beginning on the exposed surface of p silicon region 6304. 6324 indicates a p silicon region, 6328 indicates an oxide isolation region and 6326 indicates an n silicon region after this process.

Figure 63F:
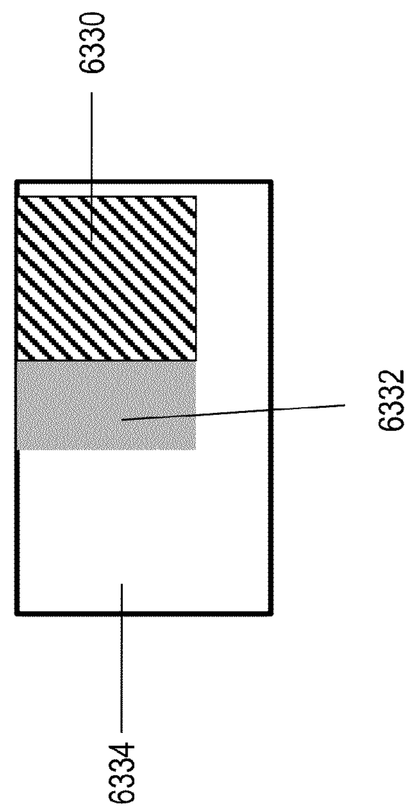

FIG. 63F shows the other portion of the cleaved structure after a CMP process. 6334 indicates a p silicon region, 6330 indicates an n silicon region and 6332 indicates an oxide isolation region. The structure shown in FIG. 63F may be reused to transfer layers using process steps similar to those described with FIG. 63A-E to form structures similar to FIG. 63E. This enables a significant reduction in lithography cost.

Figure 63G:
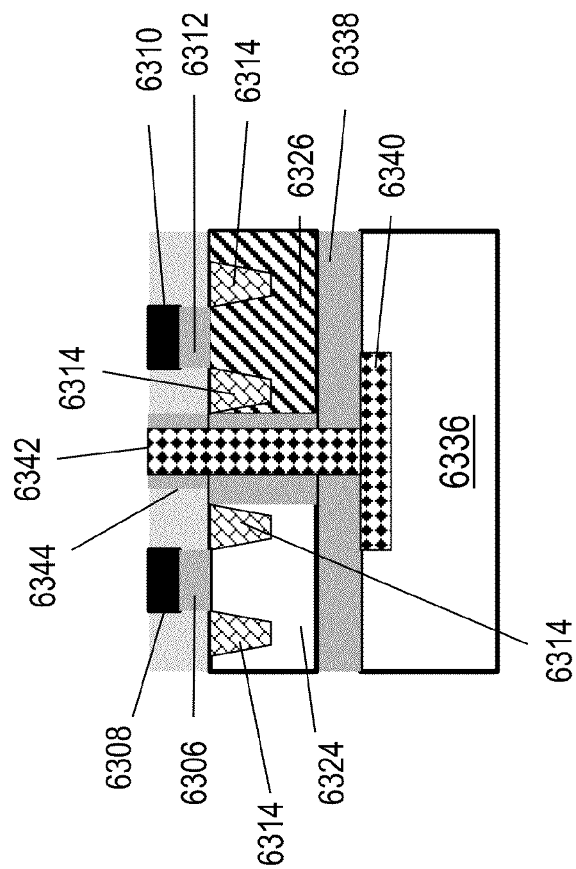

Step (F) is illustrated with FIG. 63G: An oxide layer 6338 may be deposited onto the bottom of the wafer shown in Step (E). The wafer may then be bonded to the top surface of bottom layer of wires and transistors 6336 using oxide-to-oxide bonding. The bottom layer of wires and transistors 6336 could also be called a base wafer. The temporary carrier wafer 6320 may then be removed by shining a laser onto the temporary bonding adhesive 6322 through the temporary carrier wafer 6320 (which could be constructed of glass). Alternatively, a thermal anneal could be used to remove the temporary bonding adhesive 6322. Through-silicon connections 6342 with a non-conducting (e.g. oxide) liner 6344 to the landing pads 6340 in the base wafer may be constructed at a very high density using special alignment methods to be described in FIG. 26A-D and FIG. 27A-F.

Figure 63H:
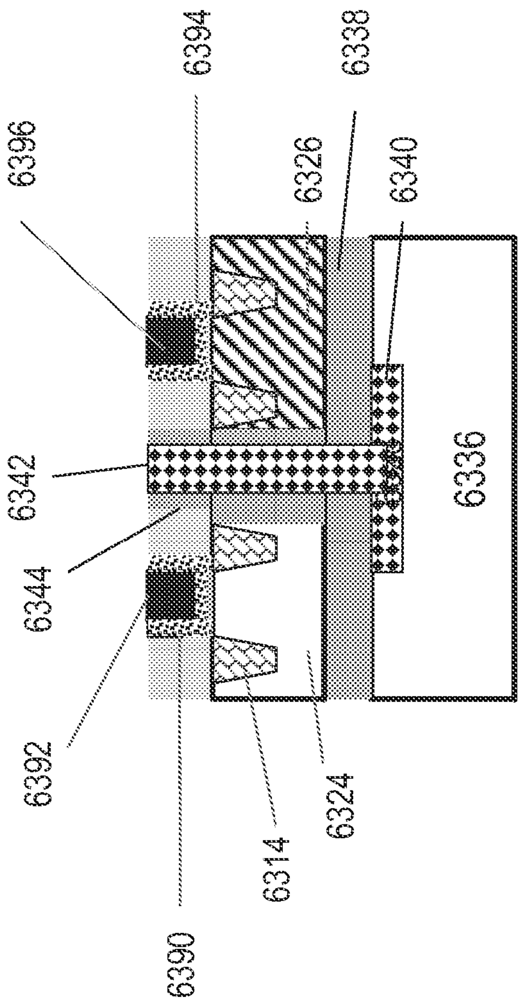

Step (G) is illustrated with FIG. 63H. Dummy gates consisting of gate electrodes 6308 and 6310 and gate dielectrics 6306 and 6312 may be etched away, followed by the construction of a replacement with high k gate dielectrics 6390 and 6394 and metal gates 6392 and 6396. Essentially, partially-formed high performance transistors are layer transferred atop the base wafer (may also be called target wafer) followed by the completion of the transistor processing with a low (sub 400° C.) process. The remainder of the transistor, contact, and wiring layers may then be constructed.

It will be obvious to someone skilled in the art that alternative versions of this flow are possible with various methods to attach temporary carriers and with various versions of the gate-last process flow. One alternative version of this flow is as follows. Multiple layers of transistors may be formed atop each other using layer transfer schemes. Each layer may have its own gate dielectric, gate electrode and source-drain implants. Process steps such as isolation may be shared between these multiple layers of transistors, and these steps could be performed once the multiple layers of transistors (with gate dielectrics, gate electrodes and source-drain implants) are formed atop each other. A shared rapid thermal anneal may be conducted to activate dopants in the multiple layers of transistors. The multilayer transistor stack may then be layer transferred onto a temporary carrier following which transistor layers may be transferred one at a time onto different substrates using multiple layer transfer steps. A replacement gate process may then be carried out once layer transfer steps are complete.

Section 13: a Memory Technology with Shared Lithography Steps

While Section 12 described a logic technology with shared lithography steps, similar techniques could be applied to memory as well. Lithography cost is a serious issue for the memory industry, and the memory industry could benefit significantly from reduction in lithography costs.

Figure 66A:
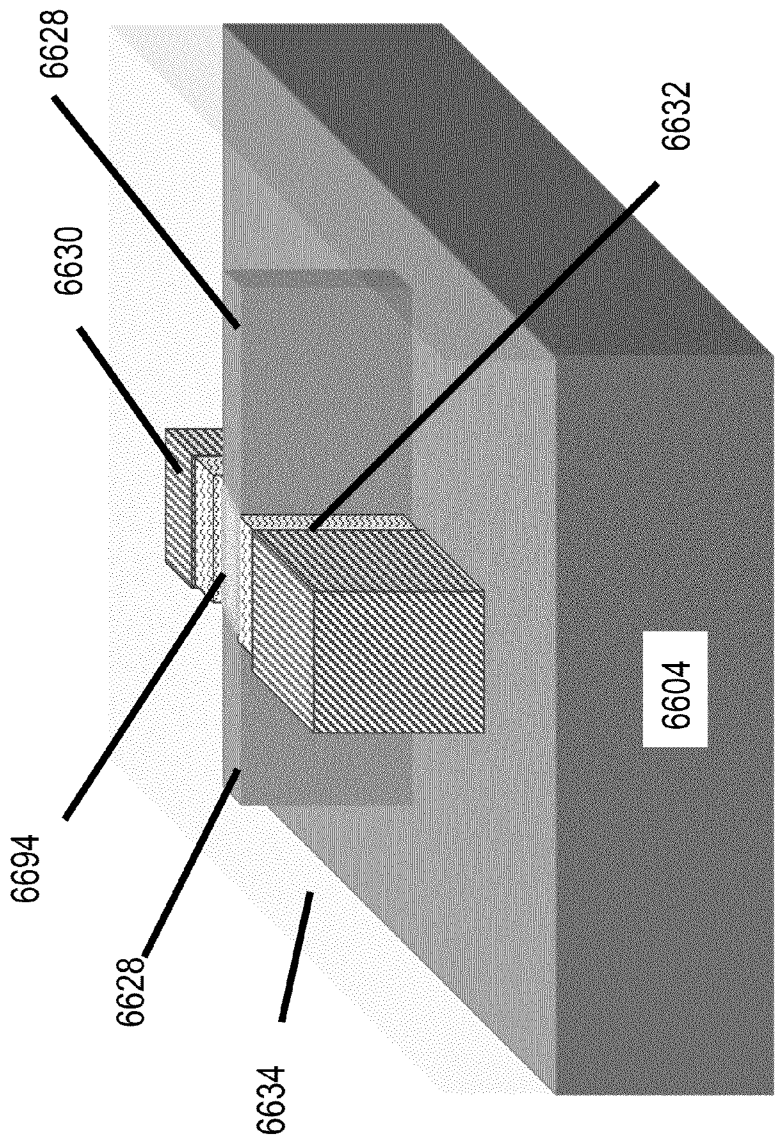
FIG. 66A-B illustrates a technique to construct DRAM with shared lithography steps.
Figure 66B:
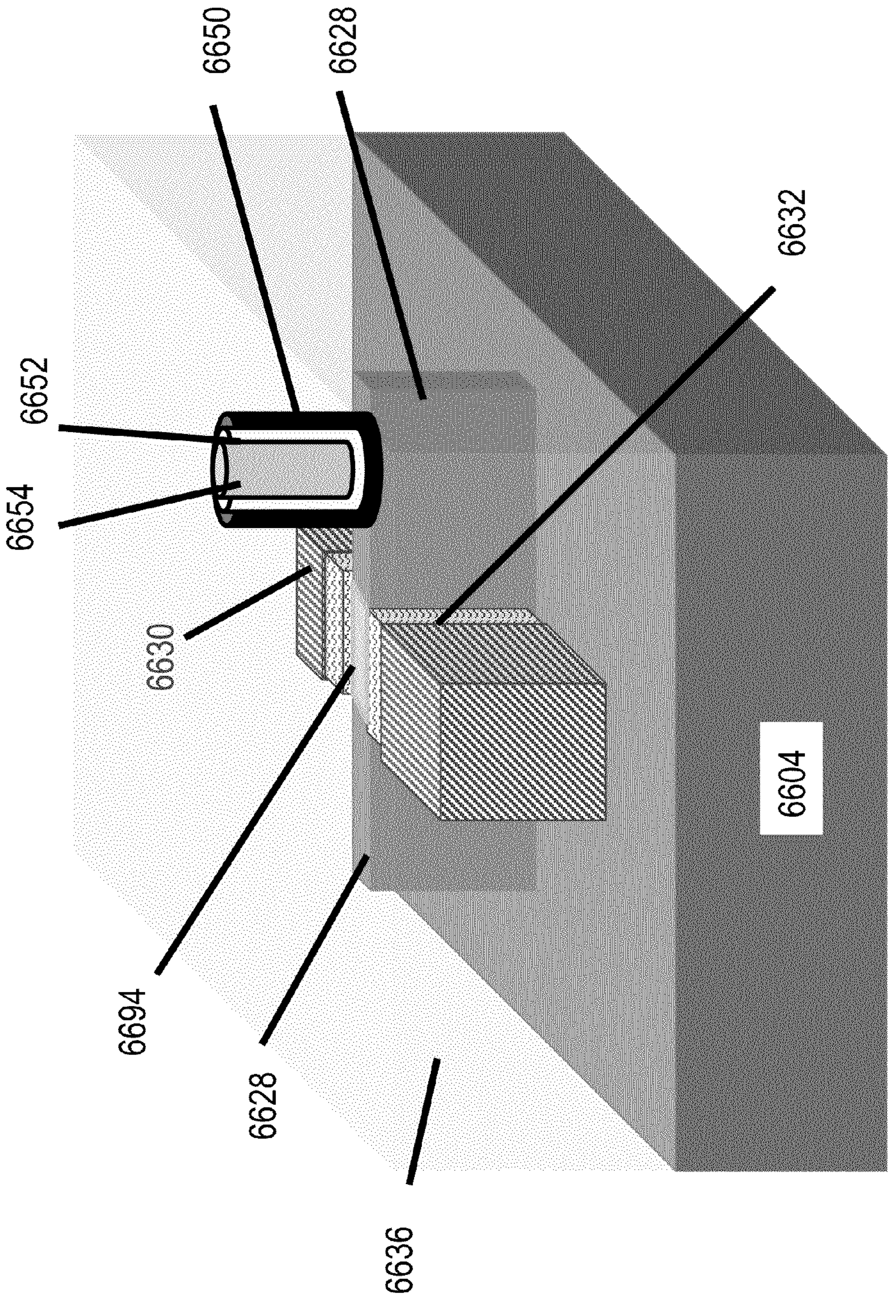

FIG. 66A-B illustrates an embodiment of this invention, where DRAM chips may be constructed with shared lithography steps. When the same reference numbers are used in different drawing figures (among FIG. 66A-B), they are used to indicate analogous, similar or identical structures to enhance the understanding of the present invention by clarifying the relationships between the structures and embodiments presented in the various diagrams—particularly in relating analogous, similar or identical functionality to different physical structures.

Step (A) of the process is illustrated with FIG. 66A. Using procedures similar to those described in FIG. 61A-K, Finfets may be formed on multiple wafers such that lithography steps for defining the Finfet may be shared among multiple wafers. One of the fabricated wafers is shown in FIG. 66A with a Finfet constructed on it. In FIG. 66A, 6604 represents a silicon substrate that may, for example, include peripheral circuits for the DRAM. 6630 represents a gate electrode, 6632 represents a gate dielectric, 6628 represents a source or a drain region (for example, of n+ silicon), 6694 represents the channel region of the Finfet (for example, of p− silicon) and 6634 represents an oxide region.

Step (B) of the process is illustrated with FIG. 66B. A stacked capacitor may be constructed in series with the Finfet shown in FIG. 66A. The stacked capacitor consists of an electrode 6650, a dielectric 6652 and another electrode 6654. 6636 is an oxide layer.

Following these steps, the rest of the DRAM fabrication flow can proceed, with contacts and wiring layers being constructed. It will be obvious to one skilled in the art that various process flows and device structures can be used for the DRAM and combined with the inventive concept of sharing lithography steps among multiple wafers.

Figure 67:
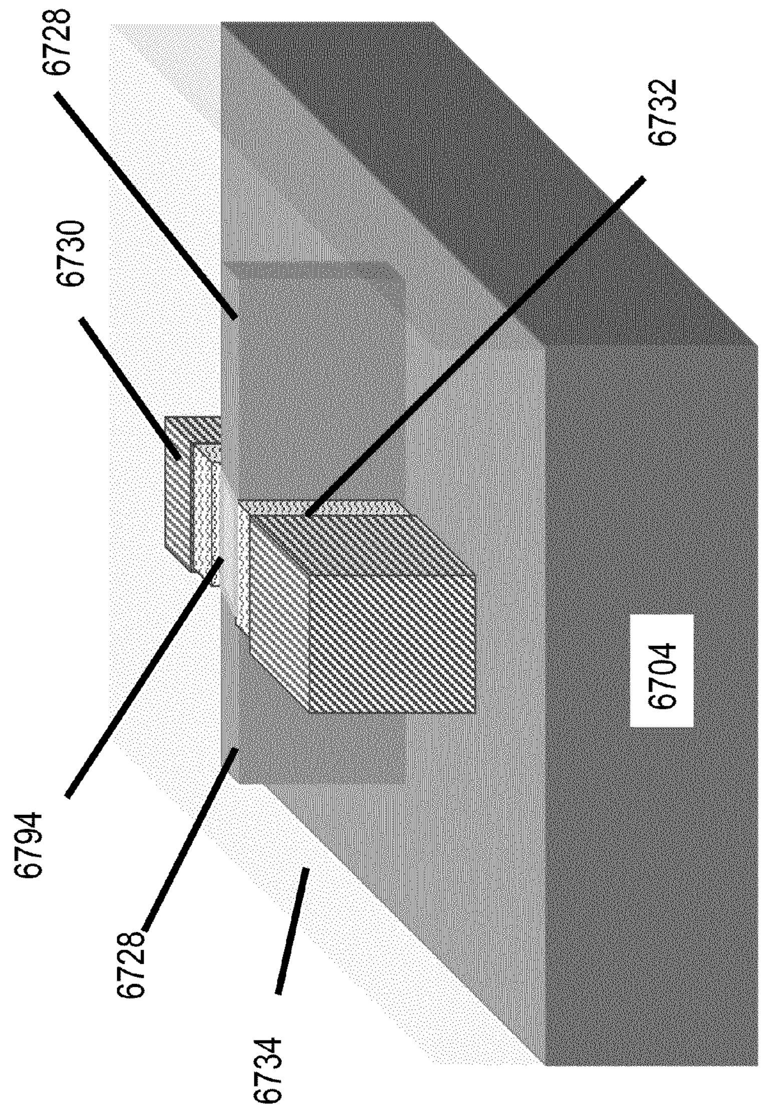
FIG. 67 illustrates a technique to construct flash memory with shared lithography steps.

FIG. 67 shows an embodiment of this invention, where charge-trap flash memory devices may be constructed with shared lithography steps. Procedures similar to those described in FIG. 61A-K may be used such that lithography steps for constructing the device in FIG. 67 are shared among multiple wafers. In FIG. 67, 6704 represents a silicon substrate and may include peripheral circuits for controlling memory elements. 6730 represents a gate electrode, 6732 is a charge trap layer (e.g. an oxide-nitride-oxide layer), 6794 is the channel region of the flash memory device (e.g. a p− Si region) and 6728 represents a source or drain region of the flash memory device. 6734 is an oxide region. For constructing a commercial flash memory chip, multiple flash memory devices could be arranged together in a NAND flash configuration or a NOR flash configuration. It will be obvious to one skilled in the art that various process flows and device structures can be used for the flash memory and combined with the inventive concept of sharing lithography steps among multiple wafers.

Section 14: Construction of Sub-400° C. Transistors Using Sub-400° C. Activation Anneals As described in FIG. 1, activating dopants in standard CMOS transistors shown in FIG. 1 at less than 400° C.-450° C. is a serious challenge. Due to this, forming 3D stacked circuits and chips is challenging, unless techniques to activate dopants of source-drain regions at less than 400° C.-450° C. can be obtained. For some compound semiconductors, dopants can be activated at less than 400° C. An embodiment of this invention involves using such compound semiconductors, such as antimonides (e.g. InGaSb), for constructing 3D integrated circuits and chips.

The process flow shown in FIG. 69A-F describes an embodiment of this invention, where techniques may be used that may lower activation temperature for dopants in silicon to less than 450° C., and potentially even lower than 400° C. The process flow could include the following steps that occur in sequence from Step (A) to Step (F). When the same reference numbers are used in different drawing figures (among FIG. 69A-F), they are used to indicate analogous, similar or identical structures to enhance the understanding of the present invention by clarifying the relationships between the structures and embodiments presented in the various diagrams—particularly in relating analogous, similar or identical functionality to different physical structures.

Figure 69A:
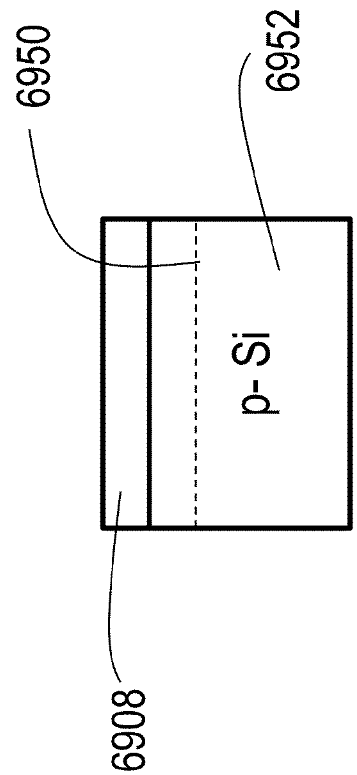
FIG. 69A-F illustrates a technique to construct sub-400° C. 3D stacked transistors by reducing temperatures needed for Source and drain anneals.

Step (A) is illustrated using FIG. 69A. A p− Silicon wafer 6952 with activated dopants may have an oxide layer 6908 deposited atop it. Hydrogen could be implanted into the wafer at a certain depth indicated by dotted lines 6950. Alternatively, helium could be used.

Figure 69B:
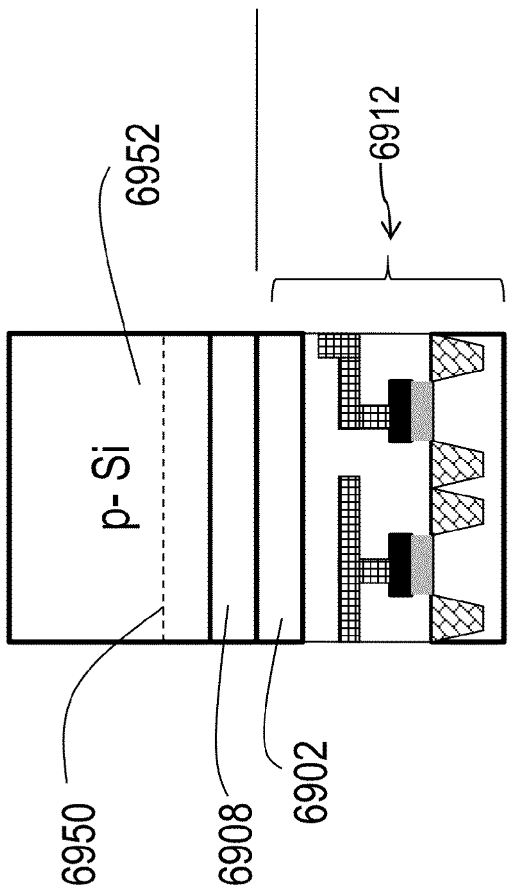

Step (B) is illustrated using FIG. 69B. A wafer with transistors and wires may have an oxide layer 6902 deposited atop it to form the structure 6912. The structure shown in FIG. 69A could be flipped and bonded to the structure 6912 using oxide-to-oxide bonding of layers 6902 and 6908.

Figure 69C:
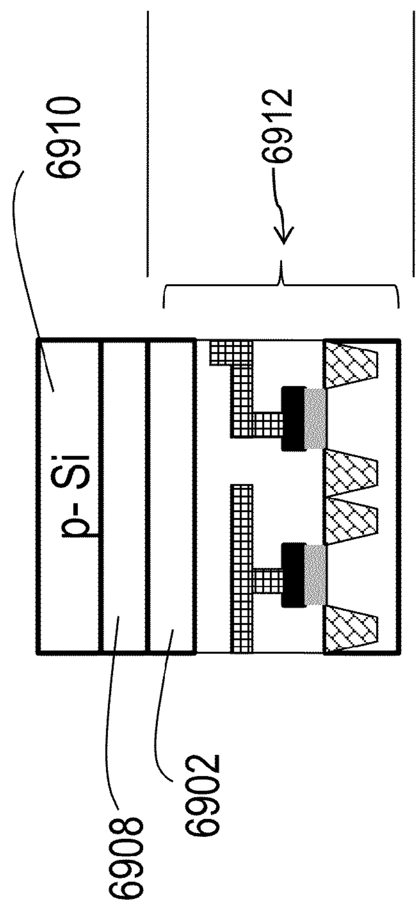

Step (C) is illustrated using FIG. 69C. The structure shown in FIG. 69B could be cleaved at its hydrogen plane 6950 using a mechanical force. Alternatively, an anneal could be used. Following this, a CMP could be conducted to planarize the surface.

Figure 69D:
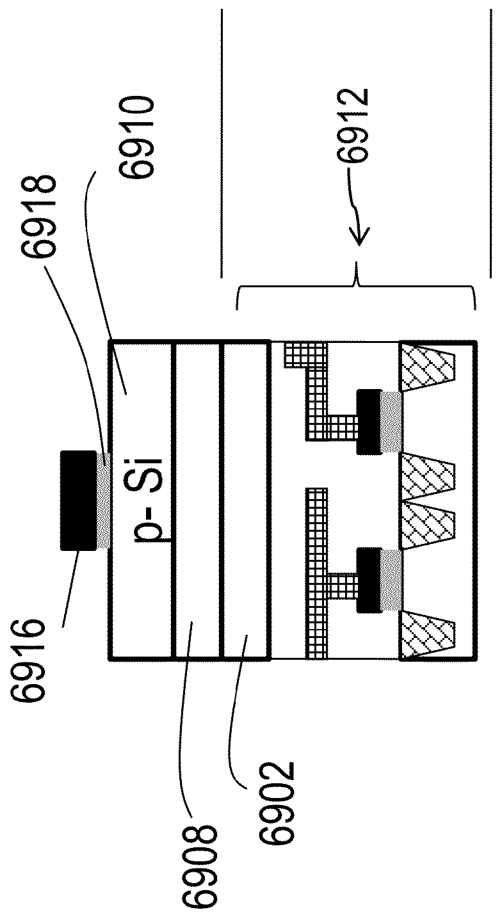

Step (D) is illustrated using FIG. 69D. Isolation regions can be formed using a shallow trench isolation (STI) process. Following this, a gate dielectric 6918 and a gate electrode 6916 could be formed using deposition or growth, followed by a patterning and etch.

Figure 69E:
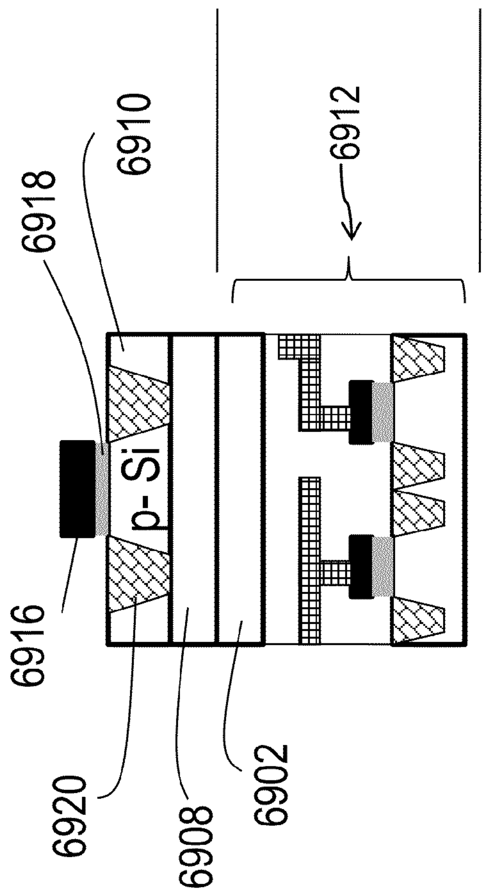

Step (E) is illustrated using FIG. 69E, and involves forming and activating source-drain regions. One or more of the following processes can be used for this step.

(i) A hydrogen plasma treatment can be conducted, following which dopants for source and drain regions 6920 can be implanted. Following the implantation, an activation anneal can be performed using a rapid thermal anneal (RTA). Alternatively, a laser anneal could be used. Alternatively, a spike anneal could be used. Alternatively, a furnace anneal could be used. Hydrogen plasma treatment before source-drain dopant implantation is known to reduce temperatures for source-drain activation to be less than 450° C. or even less that 400° C. Further details of this process for forming and activating source-drain regions are described in "Mechanism of Dopant Activation Enhancement in Shallow Junctions by Hydrogen", Proceedings of the Materials Research Society, Spring 2005 by A. Vengurlekar, S. Ashok, Christine E. Kalnas, Win Ye. This embodiment of the invention advantageously uses this low-temperature source-drain formation technique and layer transfer techniques and produces 3D integrated circuits and chips.

(ii) Alternatively, another process can be used for forming activated source-drain regions. Dopants for source and drain regions 6920 can be implanted, following which a hydrogen implantation can be conducted. Alternatively, some other atomic species can be used. An activation anneal can then be conducted using a RTA. Alternatively, a furnace anneal or spike anneal or laser anneal can be used. Hydrogen implantation is known to reduce temperatures required for the activation anneal. Further details of this process are described in U.S. Pat. No. 4,522,657. This embodiment of the invention advantageously uses this low-temperature source-drain formation technique and layer transfer techniques and produces 3D integrated circuits and chips.

While (i) and (ii) described two techniques of using hydrogen to lower anneal temperature requirements, various other methods of incorporating hydrogen to lower anneal temperatures could be used.

(iii) Alternatively, another process can be used for forming activated source-drain regions. The wafer could be heated up when implantation for source-drain regions 6920 is carried out. Due to this, the energetic implanted species is subjected to higher temperatures and can be activated at the same time as it is implanted. Further details of this process can be seen in U.S. Pat. No. 6,111,260. This embodiment of the invention advantageously uses this low-temperature source-drain formation technique and layer transfer techniques and produces 3D integrated circuits and chips.

Figure 69F:
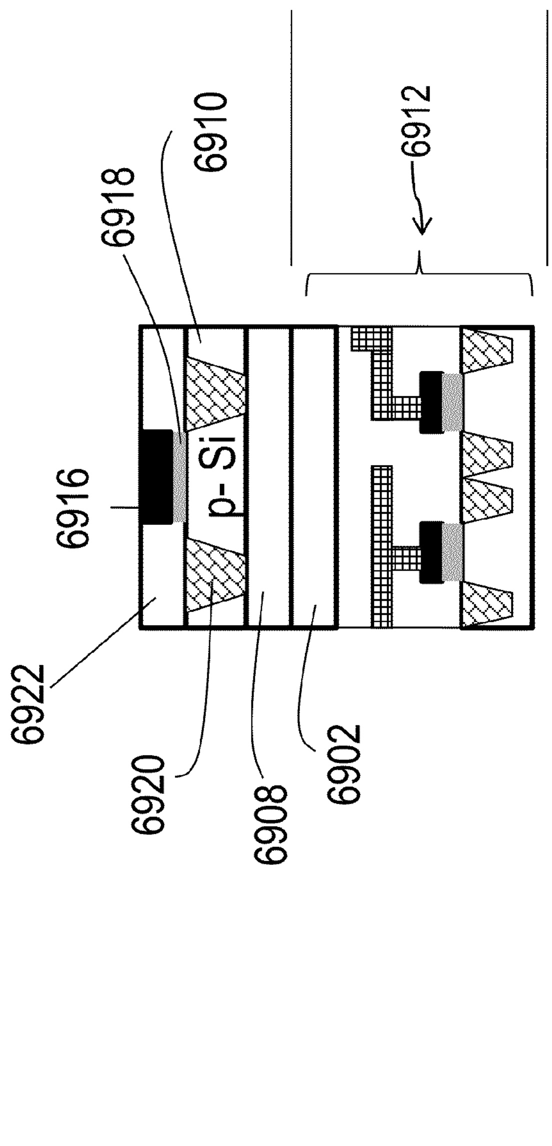

Step (F) is illustrated using FIG. 69F. An oxide layer 6922 may be deposited and polished with CMP. Following this, contacts, multiple levels of metal and other structures can be formed to obtain a 3D integrated circuit or chip. If desired, the original materials for the gate electrode 6916 and gate dielectric 6918 can be removed and replaced with a deposited gate dielectric and deposited gate electrode using a replacement gate process similar to the one described previously.

It will also be appreciated by persons of ordinary skill in the art that the present invention is not limited to what has been particularly shown and described hereinabove. Rather, the scope of the present invention includes both combinations and sub-combinations of the various features described hereinabove as well as modifications and variations which would occur to such skilled persons upon reading the foregoing description. Thus the invention is to be limited only by the appended claims.

What is claimed is:

1. A method of manufacturing semiconductor wafers, the method comprising:

providing a donor wafer comprising a semiconductor substrate;

performing a lithography step and processing the donor wafer; and performing at least two subsequent steps of layer transfer out of said donor wafer, each said step producing a transferred layer, wherein each of said transferred layer had been affected by said lithography step, and wherein each of said transferred layer comprises a plurality of transistors with side gates, and wherein said layer transfer comprises an ion-cut, said ion-cut comprising an ion implant thru said transistors.

2. A method according to claim 1, comprising a follow on processing to finish processing at least two acceptor wafers wherein each of said at least two acceptor wafers comprise one of said transferred layer.

3. A method according to claim 1, comprising a follow on processing to finish processing one wafer comprising at least two of said transferred layer.

4. A method according to claim 1, wherein said plurality of transistors comprise junctionless transistors.

5. A method according to claim 1, wherein said plurality of transistors comprise Finfet transistors.

6. A method according to claim 1, wherein said plurality of transistors comprise transistors constructed with replacement gate processes.

7. A method according to claim 1, wherein each of said transferred layer are used to form logic circuits.

8. A method according to claim 1, wherein each of said transferred layer are used to form memory circuits.

9. A method according to claim 1, wherein each of said transferred layer are constructed from a mono-crystallized layer.

10. A method of manufacturing semiconductor wafers, the method comprising:

providing a first wafer comprising a semiconductor substrate;

performing a lithography step and processing said first wafer accordingly; and then completing the subsequent fabrication of at least a second wafer and a third wafer with distinct steps, wherein each of said at least a second wafer and a third wafer utilized said lithography step, and wherein each of said at least a second wafer and a third wafer comprises a plurality of transistors with side gates, and wherein said distinct steps comprise an ion-cut, said ion-cut comprising an ion implant thru said transistors.

11. A method according to claim 10, comprising a layer transfer from said wafer to each of said at least a second wafer and a third wafer.

12. A method according to claim 10, comprising a follow on processing to finish processing of the interconnection of said transistors of said at least a second wafer and a third wafer wherein each of said at least a second wafer and a third wafer comprise material from said first wafer.

13. A method according to claim 10, wherein said plurality of transistors comprise junction-less-transistors.

14. A method according to claim 10, wherein said plurality of transistors comprise Finfet transistors.

15. A method according to claim 10, wherein said plurality of transistors comprise transistors constructed with replacement gate processes.

16. A method according to claim 10, wherein said at least a second wafer and a third wafer comprise logic circuits.

17. A method according to claim 10, wherein said at least a second wafer and a third wafer comprise memory circuits.

18. A method according to claim 10, wherein said at least a second wafer and a third wafer are constructed from mono-crystallized layers.

19. A method of manufacturing semiconductor wafers, the method comprising:

providing a first wafer comprising a semiconductor substrate;

performing a lithography step and processing said first wafer accordingly; and then completing subsequently a wafer fabrication providing at least a first layer and a second layer, wherein each of said first layer and said second layer comprises a portion of said first wafer, and wherein each of said first layer and said second layer comprises transistors of mono-crystallized material, said transistors with side gates, and wherein each of said first layer and said second layer had been affected by said lithography step, and wherein said wafer fabrication comprises an ion-cut, said ion-cut comprising an ion implant thru said transistors.

20. A method according to claim 19, comprising a follow on processing to finish processing at least a second wafer and a third wafer, wherein each of said second wafer and third wafer comprise one of said first layer or said second layer.

21. A method according to claim 19, comprising a follow on processing to finish processing a fourth wafer comprising said first layer and said second layer.

22. A method according to claim 19, wherein said transistors comprise junction-less-transistors.

23. A method according to claim 19, wherein said transistors comprise Finfet transistors.

24. A method according to claim 19, wherein said transistors comprise transistors constructed with replacement gate processes.

25. A method according to claim 19, wherein said first layer and said second layer are used to form logic circuits.

26. A method according to claim 19, wherein said first layer and said second layer are used to form memory circuits.

27. A method according to claim 19, wherein said first layer and said second layer had been processed with a layer transfer process.

28. A method of manufacturing semiconductor wafers, the method comprising:

providing a base wafer;

performing a first and then subsequently a second layer transfer of a first layer and a second layer onto said base wafer; and then performing a lithography step and processing said first layer and said second layer according to said lithography step; and then performing a third layer transfer of said first layer and said second layer, wherein said first layer and said second layer comprise substantially the same material, and wherein each of said first layer and said second layer comprises a plurality of transistors with side gates, and wherein said third layer transfer comprises an ion-cut, said ion-cut comprising an ion implant thru said transistors.

29. A method according to claim 28 wherein said transistors comprise mono-crystallized material.

30. A method according to claim 28, comprising a follow on processing to finish processing at least a first wafer and a second wafer wherein said first wafer comprises said first layer and said second wafer comprises said second layer.

31. A method according to claim 28, comprising a follow on processing to finish processing a first wafer comprising said first layer and said second layer.

32. A method according to claim 28, wherein said transistors comprise junction-less-transistors.

33. A method according to claim 28, wherein said transistors comprise Finfet transistors.

34. A method according to claim 28, wherein said transistors comprise transistors constructed with replacement gate processes.

35. A method according to claim 28, wherein said first layer and said second layer are used to form logic circuits.

36. A method according to claim 28, wherein said first layer and said second layer are used to form memory circuits.

37. A method according to claim 28, wherein said first layer transfer and said second layer transfer each comprise an ion implant step.

38. A method of manufacturing semiconductor wafers, the method comprising:

providing a donor wafer comprising a semiconductor substrate;

performing a lithography step and processing said donor wafer accordingly; and then performing a first layer transfer to a carrier wafer and subsequently performing at least a second step and a third step of layer transfer out of said carrier wafer forming at least two transferred layers, wherein each of said at least two transferred layers had been affected by said lithography step, and wherein each of said at least two transferred layers comprise a plurality of transistors with side gates, and wherein said second step and said third step of layer transfer each comprise an ion-cut, said ion-cut comprising an ion implant thru said transistors.

39. A method according to claim 38, comprising a follow on processing to finish processing at least a first wafer and a second wafer wherein each of said first wafer and said second wafer comprise one of said at least two transferred layers.

40. A method according to claim 38, comprising a follow on processing to finish processing a first wafer comprising two of said at least two transferred layers.

41. A method according to claim 38, wherein said two transferred layers comprise junction-less-transistors.

42. A method according to claim 38, wherein said two transferred layers comprise Finfet transistors.

43. A method according to claim 38, wherein said two transferred layers comprise transistors constructed with replacement gate processes.

44. A method according to claim 38, wherein said two transferred layers are used to form logic circuits.

45. A method according to claim 38, wherein said two transferred layers are used to form memory circuits.

46. A method according to claim 38, wherein said two transferred layers are constructed from a mono-crystallized layer.

47. A method according to claim 38, wherein said first layer transfer comprises an ion implant step.

48. A method according to claim 38, wherein each of said at least two transferred layers had been affected by said processing.

* * * * *